US010312449B2

(12) United States Patent
Kim et al.

(10) Patent No.: US 10,312,449 B2
(45) Date of Patent: Jun. 4, 2019

(54) ORGANIC LIGHT-EMITTING DEVICE

(71) Applicant: SAMSUNG DISPLAY CO., LTD., Yongin-si, Gyeonggi-do (KR)

(72) Inventors: Seulong Kim, Yongin-si (KR); Naoyuki Ito, Yongin-si (KR); Younsun Kim, Yongin-si (KR); Dongwoo Shin, Yongin-si (KR); Jungsub Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/154,622

(22) Filed: May 13, 2016

(65) Prior Publication Data

US 2016/0351816 A1 Dec. 1, 2016

(30) Foreign Application Priority Data

May 27, 2015 (KR) ........................ 10-2015-0073933
Jan. 27, 2016 (KR) ........................ 10-2016-0010083

(51) Int. Cl.

| | |
|---|---|
| ***H01L 51/00*** | (2006.01) |
| ***H01L 51/50*** | (2006.01) |
| ***C09K 11/06*** | (2006.01) |
| ***C09K 11/02*** | (2006.01) |

(52) U.S. Cl.

CPC .......... *H01L 51/0052* (2013.01); *C09K 11/02* (2013.01); *C09K 11/06* (2013.01); *H01L 51/0058* (2013.01); *H01L 51/0071* (2013.01); *H01L 51/0072* (2013.01); *H01L 51/0073* (2013.01); *H01L 51/0074* (2013.01); *H01L 51/504* (2013.01); *H01L 51/5004* (2013.01); *C09K 2211/1007* (2013.01); *C09K 2211/1011* (2013.01); *C09K 2211/1014* (2013.01); *C09K 2211/1022* (2013.01); *C09K 2211/1029* (2013.01); *C09K 2211/1088* (2013.01); *C09K 2211/1092* (2013.01); *H01L 51/506* (2013.01); *H01L 51/5012* (2013.01); *H01L 51/5072* (2013.01); *H01L 51/5092* (2013.01); *H01L 2251/301* (2013.01); *H01L 2251/552* (2013.01)

(58) Field of Classification Search

CPC .......... C09K 221/1011; H01L 51/0052; H01L 51/0073; H01L 51/0074; H01L 51/0058; H01L 51/006; H01L 51/0061; H01L 51/0094; H01L 51/0056; H01L 51/0072

See application file for complete search history.

(56) References Cited

U.S. PATENT DOCUMENTS

| | | | |
|---|---|---|---|
| 7,839,074 | B2 | 11/2010 | Ikeda et al. |
| 8,999,525 | B2 | 4/2015 | Lee et al. |
| 9,012,042 | B2 | 4/2015 | Kim et al. |
| 9,520,568 | B2 | 12/2016 | Kim et al. |
| 2003/0143422 | A1 | 7/2003 | Chen |
| 2004/0065544 | A1 | 4/2004 | Igarashi et al. |
| 2006/0043858 | A1 | 3/2006 | Ikeda et al. |
| 2008/0160347 | A1 | 7/2008 | Wang et al. |
| 2008/0160348 | A1 | 7/2008 | Smith |
| 2008/0315754 | A1 | 12/2008 | Kawamura et al. |
| 2009/0267491 | A1 | 10/2009 | Takashima et al. |

(Continued)

FOREIGN PATENT DOCUMENTS

| | | | |
|---|---|---|---|
| CN | 102448945 | A | 5/2012 |
| EP | 3144302 | A1 | 3/2017 |

(Continued)

OTHER PUBLICATIONS

Jeon, et al., "Deep-blue OLEDs using novel efficient spiro-type dopant materials," Organic Electronics, 11 (2010), pp. 1844-1852.

(Continued)

*Primary Examiner* — Jeffrey C Mullis

(74) *Attorney, Agent, or Firm* — Lewis Roca Rothgerber Christie LLP

(57) ABSTRACT

An organic light-emitting device including a first electrode, a second electrode, and an organic layer between the first electrode and the second electrode and including an emission layer; wherein the organic layer includes a host first compound represented by Formula 1 and a fluorescent dopant second compound represented by Formula 2:

Formula 1

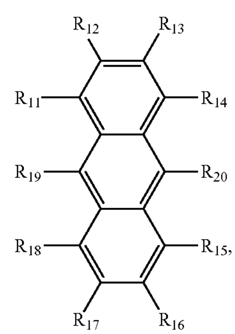

Formula 2

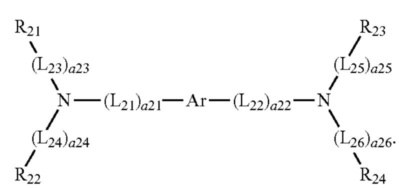

When the compound represented by Formula 1 includes a condensed cyclic substituent and the compound represented by Formula 2 includes a condensed cyclic core, the organic light-emitting device may have improved thermal stability, a lower driving voltage, and higher efficiency.

20 Claims, 2 Drawing Sheets

(56) References Cited

U.S. PATENT DOCUMENTS

| | | | |
|---|---|---|---|
| 2010/0032658 A1 | 2/2010 | Lee et al. | |
| 2010/0219400 A1 | 9/2010 | Arakane et al. | |
| 2011/0220886 A1 | 9/2011 | Takeshima et al. | |
| 2012/0104940 A1 | 5/2012 | Shin et al. | |
| 2012/0138914 A1 | 6/2012 | Kawamura et al. | |
| 2012/0181520 A1 | 7/2012 | Kim et al. | |
| 2014/0027723 A1 | 1/2014 | Kim et al. | |
| 2014/0183500 A1 | 7/2014 | Ikeda et al. | |
| 2014/0319510 A1 | 10/2014 | Kageyama | |
| 2014/0326961 A1 | 11/2014 | Han et al. | |
| 2015/0325800 A1 | 11/2015 | Ito et al. | |
| 2016/0141515 A1 | 5/2016 | Hayama et al. | |
| 2016/0149139 A1* | 5/2016 | Xia | H01L 51/0054 257/40 |
| 2016/0181542 A1 | 6/2016 | Kawamura et al. | |
| 2016/0181543 A1 | 6/2016 | Ito et al. | |
| 2016/0254450 A1 | 9/2016 | Herron et al. | |
| 2016/0351816 A1 | 12/2016 | Kim et al. | |
| 2016/0351818 A1 | 12/2016 | Kim et al. | |
| 2017/0062729 A1 | 3/2017 | Cha et al. | |
| 2017/0117469 A1 | 4/2017 | Ito et al. | |
| 2017/0179401 A1 | 6/2017 | Kim et al. | |
| 2017/0200899 A1 | 7/2017 | Kim et al. | |

FOREIGN PATENT DOCUMENTS

| | | |
|---|---|---|
| JP | 2011-37838 A | 2/2011 |
| JP | 2015-18883 A | 1/2015 |
| KR | 10-2010-0007780 A | 1/2010 |
| KR | 10-2010-0108903 A | 10/2010 |
| KR | 10-2012-0038402 A | 4/2012 |
| KR | 10-2012-0066390 A | 6/2012 |
| KR | 10-2012-0135501 A | 12/2012 |
| KR | 10-2014-0049186 A | 4/2014 |
| KR | 10-2014-0078096 A | 6/2014 |
| KR | 10-2014-0115636 A | 10/2014 |
| KR | 10-2014-0128879 A | 11/2014 |
| WO | WO 2010/032447 A1 | 3/2010 |
| WO | WO 2010/062107 A1 | 6/2010 |
| WO | WO 2014/058232 A2 | 4/2014 |
| WO | WO 2014/061963 A1 | 4/2014 |
| WO | WO 2014/104144 A1 | 7/2014 |
| WO | WO 2014/141725 A1 | 9/2014 |
| WO | WO 2014/199637 A1 | 12/2014 |
| WO | WO 2015/033559 A1 | 3/2015 |
| WO | WO 2015/041358 A1 | 3/2015 |
| WO | WO 2015/151965 A1 | 10/2015 |
| WO | WO 2015/174682 A1 | 11/2015 |
| WO | WO 2016/013184 A1 | 1/2016 |
| WO | WO 2016/017919 A2 | 2/2016 |
| WO | WO 2016/042781 A1 | 3/2016 |
| WO | WO 2016/079944 A1 | 5/2016 |
| WO | WO 2016/088759 A1 | 6/2016 |
| WO | WO 2016/104289 A1 | 6/2016 |
| WO | WO 2016/108419 A1 | 7/2016 |
| WO | WO 2016/125706 A1 | 8/2016 |
| WO | WO 2016/126022 A1 | 8/2016 |
| WO | WO 2016/152544 A1 | 9/2016 |

OTHER PUBLICATIONS

U.S. Notice of Allowance dated Jun. 9, 2017, issued in cross-reference U.S. Appl. No. 15/158,479 (8 pages).

U.S. Office Action dated Sep. 6, 2017, issued in cross-reference U.S. Appl. No. 15/157,140 (30 pages).

EPO Office Action dated Sep. 28, 2017, corresponding to European Patent Application No. 16171798.8 (5 pages).

U.S. Office Action dated Oct. 2, 2018, issued in U.S. Appl. No. 15/157,140 (45 pages).

U.S. Advisory Action dated Apr. 16, 2018, issued in U.S. Appl. No. 15/157,140 (5 pages).

U.S. Final Office Action dated Jan. 28, 2019, issued in U.S. Appl. No. 15/157,140 (22 pages).

* cited by examiner

ORGANIC LIGHT-EMITTING DEVICE

CROSS-REFERENCE TO RELATED APPLICATIONS

This application claims priority to and the benefit of Korean Patent Application Nos. 10-2015-0073933, filed on May 27, 2015, and 10-2016-0010083, filed on Jan. 27, 2016 in the Korean Intellectual Property Office, the entire content of each of which is incorporated herein by reference.

BACKGROUND

1. Field

One or more aspects of example embodiments of the present disclosure are related to an organic light-emitting device.

2. Description of the Related Art

Organic light emitting devices are self-emission devices that have wide viewing angles, high contrast ratios, short response times, and/or excellent luminance, driving voltage, and/or response speed characteristics, and may produce full-color images.

An example organic light-emitting device may include a first electrode on a substrate, and a hole transport region, an emission layer, an electron transport region, and a second electrode sequentially positioned on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may transition (e.g., radiatively decay) from an excited state to a ground state to thereby generate light.

SUMMARY

One or more aspects of example embodiments of the present disclosure are directed toward an organic light-emitting device.

Additional aspects will be set forth in part in the description which follows and, in part, will be apparent from the description, or may be learned by practice of the presented embodiments.

One or more aspects of example embodiments of the present disclosure provide an organic light-emitting device including a first electrode, a second electrode, and an organic layer between the first electrode and the second electrode and including an emission layer;

wherein the organic layer includes a first compound represented by Formula 1 and a second compound represented by Formula 2:

Formula 1

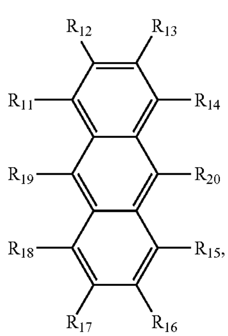

-continued

Formula 2

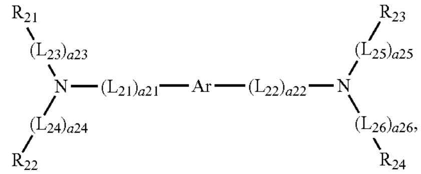

Formula 1A

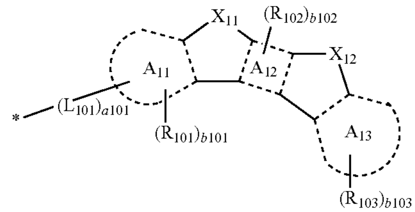

Formula 1B

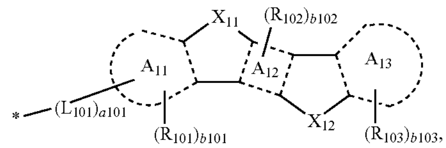

Formula 1C

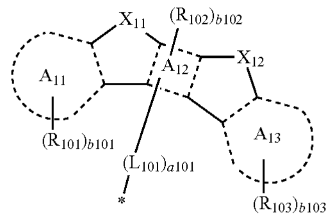

Formula 1D

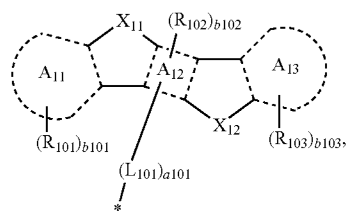

Formula 1E $$*-(L_{102})_{a102}-R_{108},$$

Formula 2A

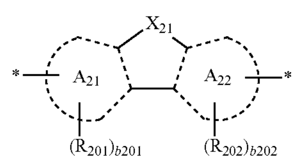

Formula 2B

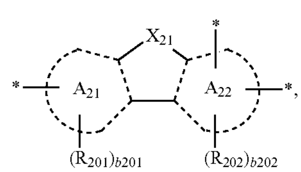

Formula 2C

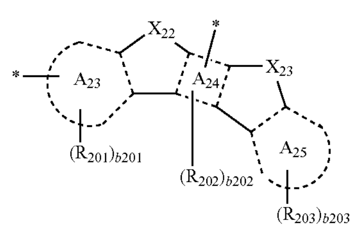

-continued

Formula 2D

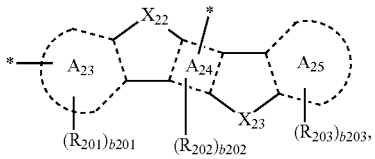

Formula 2E

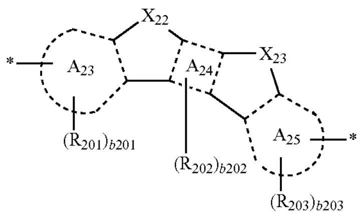

Formula 2F

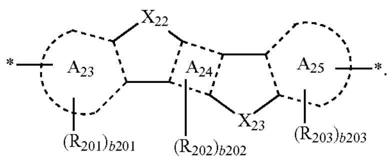

In Formulae 1, 2, 1A to 1E, and 2A to 2F, $R_{11}$ to $R_{20}$ may each independently be selected from hydrogen, deuterium, —F, —Cl, —Br, —I, a group represented by one selected from Formulae 1A to 1E, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, provided that at least one selected from $R_{11}$ to $R_{20}$ may be selected from groups represented by Formulae 1A to 1D;

$X_{11}$ may be selected from oxygen (O), sulfur (S), $N(R_{104})$, and $C(R_{104})(R_{105})$, $X_{12}$ may be selected from oxygen, sulfur, $N(R_{106})$, and $C(R_{106})(R_{107})$, $A_{11}$ to $A_{13}$ may each independently be selected from a $C_5$-$C_{20}$ carbocyclic group and a $C_1$-$C_{20}$ heterocyclic group;

$L_{101}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a101 may be selected from 0, 1, 2, and 3;

$R_{101}$ to $R_{108}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, $R_{104}$ and $R_{105}$ may optionally be linked to form a saturated or unsaturated ring, and $R_{106}$ and $R_{107}$ may optionally be linked to form a saturated or unsaturated ring;

b101 to b103 may each independently be selected from 1, 2, 3, 4, 5, 6, 7, 8, 9, and 10;

Ar may be selected from groups represented by Formulae 2A to 2F;

$X_{21}$ may be selected from oxygen and sulfur;

$X_{22}$ may be selected from oxygen, sulfur, $N(R_{204})$, and $C(R_{204})(R_{205})$, $X_{23}$ may be selected from oxygen, sulfur, $N(R_{206})$, and $C(R_{206})(R_{207})$, $A_{21}$ and $A_{22}$ may each independently be selected from a $C_6$-$C_{20}$ arene group and a $C_1$-$C_{20}$ heteroarene group, provided that $A_{21}$ and $A_{22}$ are not both (e.g., concurrently) benzenes;

$A_{23}$ to $A_{25}$ may each independently be selected from a $C_5$-$C_{20}$ carbocyclic group and a $C_1$-$C_{20}$ heterocyclic group;

$L_{21}$ to $L_{26}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 to a26 may each independently be selected from 0, 1, 2, and 3;

$R_{21}$ to $R_{24}$ may each independently be selected from a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{21}$ and $R_{22}$ may optionally be linked to form a saturated or unsaturated ring, and $R_{23}$ and $R_{24}$ may optionally be linked to form a saturated or unsaturated ring;

$R_{201}$ to $R_{207}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), wherein $R_{204}$ and $R_{205}$ may optionally be linked to form a saturated or unsaturated ring, and $R_{206}$ and $R_{207}$ may optionally be linked to form a saturated or unsaturated ring;

b201 to b203 may each independently be selected from 1, 2, 3, 4, 5, 6, 7, 8, 9, and 10;

$Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and

* may indicate a binding site to a neighboring atom.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
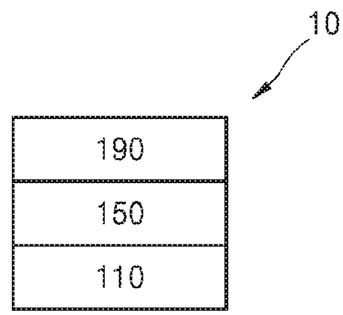
FIG. 1 is a schematic cross-sectional view of an organic light-emitting device according to an embodiment of the present disclosure.

The present disclosure will now be described more fully with reference to example embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and methods of achievement of the present disclosure will become apparent by reference to the described embodiments, together with the accompanying drawings. This present disclosure may, however, be embodied in many different forms and should not be limited to the example embodiments.

Hereinafter, embodiments of the present disclosure will be described in more detail by referring to the attached drawings. In the drawings, like reference numerals denote like elements, and duplicative explanations thereof will not be provided.

As used herein, the singular forms "a", "an", and "the" are intended to include the plural forms as well, unless the context clearly indicates otherwise.

It will be further understood that the terms "comprises" and/or "comprising" as used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layer(s), region(s), and/or component(s) may be present.

The sizes of components in the drawings may be exaggerated for convenience of explanation. In other words, since sizes and thicknesses of components in the drawings are arbitrarily illustrated for convenience of explanation, the following embodiments of the present disclosure are not limited thereto.

The expression "an (organic layer) includes a first compound" includes a case in which the (organic layer) includes a first compound represented by Formula 1 and a case in which the (organic layer) includes two or more different first compounds represented by Formula 1.

The term "organic layer" as used herein refers to a single and/or a plurality of layers between a first electrode and a second electrode in an organic light-emitting device. The material included in the "organic layer" is not limited to being an organic material.

According to one or more example embodiments of the present disclosure, an organic light-emitting device includes a first electrode, a second electrode, and an organic layer between the first electrode and the second electrode and including an emission layer, wherein the organic layer may include a first compound represented by Formula 1 and a second compound represented by Formula 2:

Formula 1

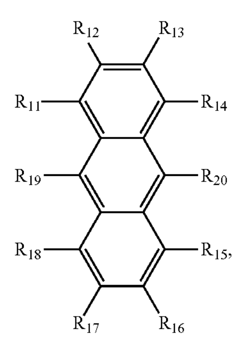

Formula 2

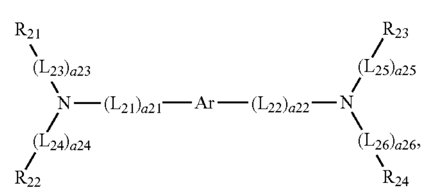

-continued

Formula 1A

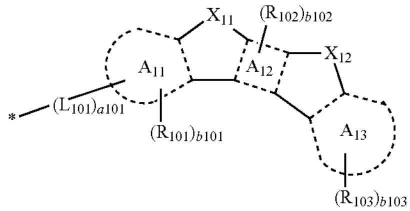

Formula 1B

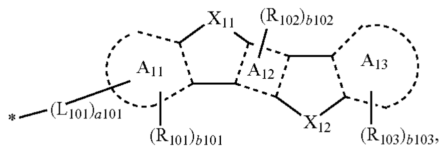

Formula 1C

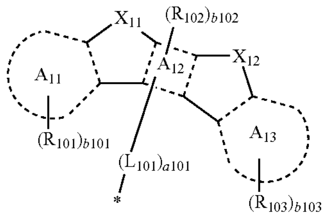

Formula 1D

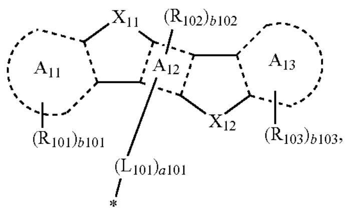

Formula 1E $*-(L_{102})_{a102}-R_{108}$,

Formula 2A

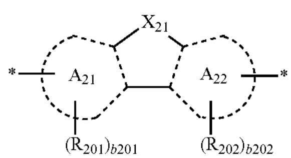

Formula 2B

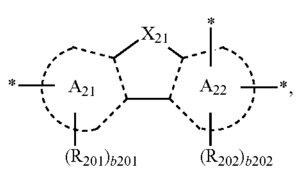

Formula 2C

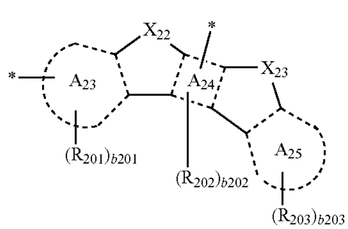

Formula 2D

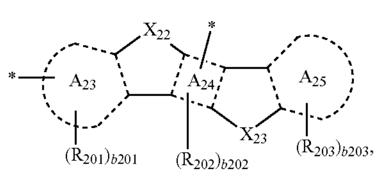

-continued

Formula 2E

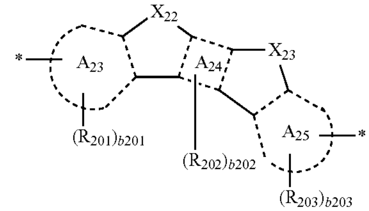

Formula 2F

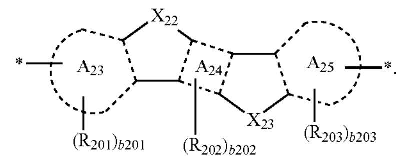

In Formula 1, $R_{11}$ to $R_{20}$ may each independently be selected from hydrogen, deuterium, —F, —Cl, —Br, —I, a group represented by one selected from Formulae 1A to 1E, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, and $-P(=O)(Q_1)(Q_2)$, provided that at least one selected from $R_{11}$ to $R_{20}$ may be selected from groups represented by Formulae 1A to 1D;

wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

For example, at least one selected from $R_{19}$ and $R_{20}$ in Formula 1 may be selected from groups represented by Formulae 1A to 1D, but embodiments of the present disclosure are not limited thereto.

In one or more embodiments, in Formula 1, $R_{19}$ may be a group represented by Formula 1E, and $R_{20}$ may be selected from groups represented by Formulae 1A to 1D, but embodiments of the present disclosure not limited thereto.

In one or more embodiments, $R_{11}$ to $R_{20}$ in Formula 1 may each independently be selected from hydrogen, deuterium, —F, —Cl, —Br, —I, a group represented by one selected from Formulae 1A to 1E, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$), wherein $Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments of the present disclosure are not limited thereto.

In one or more embodiments, in Formula 1, $R_{11}$ to $R_{20}$ may each independently be selected from the group consisting of:

hydrogen, deuterium, —F, —Cl, —Br, —I, a group represented by one selected from Formulae 1A to 1E, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_1$)($Q_2$), and —Si($Q_1$)($Q_2$)($Q_3$); and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group;

wherein $Q_1$ to $Q_3$ may each independently be selected from a $C_1$-$C_{60}$ alkyl group, a $C_6$-$C_{60}$ aryl group, a biphenyl group, and a terphenyl group, but embodiments of the present disclosure are not limited thereto.

In one or more embodiments, in Formula 1, $R_{11}$ to $R_{20}$ may each independently be selected from the group consisting of:

hydrogen, deuterium, —F, —Cl, —Br, —I, a group represented by one selected from Formulae 1A to 1E, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —N($Q_1$)($Q_2$), and —Si($Q_1$)($Q_2$)($Q_3$); and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group;

wherein $Q_1$ to $Q_3$ may each independently be selected from a methyl group, an ethyl group, an n-propyl group, an iso-propyl group, and a phenyl group, but embodiments of the present disclosure are not limited thereto.

$X_{11}$ in Formulae 1A to 1D may be selected from oxygen (O), sulfur (S), N($R_{104}$), and C($R_{104}$)($R_{105}$), and $R_{104}$ and $R_{105}$ may each independently be the same as described below.

$X_{12}$ in Formulae 1A to 1D may be selected from oxygen, sulfur, N($R_{106}$), and C($R_{106}$)($R_{107}$), and $R_{106}$ and $R_{107}$ may each independently be the same as described below.

In one or more embodiments, in Formulae 1A to 1D, $X_{11}$ may be O, and $X_{12}$ may be selected from O, S, N($R_{106}$), and C($R_{106}$)($R_{107}$), $X_{11}$ may be S, and $X_{12}$ may be selected from oxygen, sulfur, N($R_{106}$), and C($R_{106}$)($R_{107}$), $X_{11}$ may be N($R_{104}$), and $X_{12}$ may be selected from oxygen, sulfur, N($R_{106}$), and C($R_{106}$)($R_{107}$), $X_{11}$ may be C($R_{104}$)($R_{104}$), and $X_{12}$ may be selected from oxygen, sulfur, N($R_{106}$), and C($R_{106}$)($R_{107}$), but embodiments of the present disclosure are not limited thereto.

In one or more embodiments, in Formulae 1A to 1D, $X_{11}$ may be O, and $X_{12}$ may be O;

$X_{11}$ may be S, and $X_{12}$ may be S;

$X_{11}$ may be N($R_{104}$), and $X_{12}$ may be N($R_{106}$), or $X_{11}$ may be C($R_{104}$)($R_{104}$), and $X_{12}$ may be C($R_{106}$)($R_{107}$), but embodiments of the present disclosure are not limited thereto.

$A_{11}$ to $A_{13}$ in Formulae 1A to 1D may each independently be selected from a $C_5$-$C_{20}$ carbocyclic group and a $C_1$-$C_{20}$ heterocyclic group.

In one or more embodiments, $A_{11}$ to $A_{13}$ in Formulae 1A to 1D may each independently be selected from a benzene group, a naphthalene group, a phenanthrene group, an anthracene group, a triphenylene group, a pyrene group, a chrysene group, a furan group, a thiophene group, a pyrrole group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, a phenanthroline group, a benzofuran group, a benzothiophene group, an indene group, an indole group, a furopyridine group, a thienopyridine group, a cyclopentapyridine group, a pyrrolopyridine group, a dibenzofuran group, a dibenzothiophene group, a fluorene group, a carbazole group, a benzofuropyrrole group, a benzothienopyrrole group, an indenopyrrole group, an indolopyrrole group, a benzofurothiophene group, a benzothienothiophene group, an indenothiophene group, an indolothiophene group, a benzofurofuran group, a benzothienofuran group, an indenofuran group, an indolofuran group, a benzofurothiophene group, a benzothienothiophene group, an indenothiophene group, an indolothiophene group, a benzofuropyridine group, a benzothienopyridine group, an indenopyridine group, an indolopyridine group, a benzofuropyrimidine group, a benzothienopyrimidine group, an indenopyrimidine group, an indolopyrimidine group, a benzofuroindole group, a benzothienoindole group, an indenoindole group, an indoloindole group, a benzofurobenzofuran group, a benzothienobenzofuran group, an indenobenzofuran group, an indolobenzofuran group, a benzofurobenzothiophene group, a benzothienobenzothiophene group, an indenobenzothiophene group, an indolobenzothiophene group, a benzofuroquinoline group, a benzothienoquinoline group, an indenoquinoline group, an indoloquinoline group, a benzonaphthofuran group, a benzonaphthothiophene group, a benzofluorene group, a benzocarbazole group, a dinaphthofuran group, a dinaphthothiophene group, a dibenzofluorene group, a dibenzocarbazole group, a benzoxazole group, a benzothiazole group, a benzimidazole group, a naphthofuran, a naphthothiophene, a cyclopentanaphthalene group, a spiro-bifluorene group, and a spiro-fluorene-indene group, but embodiments of the present disclosure are not limited thereto.

In one or more embodiments, $A_{11}$ to $A_{13}$ in Formulae 1A to 1D may each independently be selected from a benzene group, a naphthalene group, a phenanthrene group, a pyridine group, a pyrazine group, a pyrimidine group, a quinoline group, an isoquinoline group, a benzoquinoline group, a benzoisoquinoline group, a dibenzofuran group, a dibenzothiophene group, a fluorene group, a carbazole group, and an indolopyridine group, but embodiments of the present disclosure are not limited thereto.

In one or more embodiments, $A_{11}$ to $A_{13}$ in Formulae 1A to 1D may each independently be selected from a benzene group, a naphthalene group, a phenanthrene group, a pyridine group, a quinoline group, an isoquinoline group, a benzoquinoline group, a benzoisoquinoline group, a dibenzofuran group, a dibenzothiophene group, a fluorene group, a carbazole group, and an indolopyridine group, but embodiments of the present disclosure are not limited thereto.

In one or more embodiments, $A_{11}$ to $A_{13}$ in Formulae 1A to 1D may each independently be selected from a benzene group, a naphthalene group, a pyridine group, a quinoline group, and an isoquinoline group, but embodiments of the present disclosure are not limited thereto.

$L_{101}$ and $L_{102}$ in Formulae 1A to 1E may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In one or more embodiments, $L_{101}$ and $L_{102}$ in Formulae 1A to 1E may each independently be selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group, each substituted with at least one selected from deuterium, —F, —Cl, —Br, —I, a cyano group, a $C_1$-$C_{20}$ alkyl group, a $C_1$-$C_{20}$ alkoxy group, a cyclopropyl group, a cyclobutyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a hydrogen, $C_1$-$C_{20}$ alkyl group, a phenyl group, a naphthyl group, a biphenyl group, and a terphenyl group, but embodiments of the present disclosure are not limited thereto.

In one or more embodiments, $L_{101}$ and $L_{102}$ in Formulae 1A to 1E may each independently be selected from the group consisting of:

a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group and a dibenzothiophenylene group; and a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group, and a dibenzothiophenylene group, each substituted with at least one selected from deuterium, —F, —Cl, —Br, —I, a cyano group, a methyl group, an ethyl group, an n-propyl group, an iso-propyl group, a tert-butyl group, a methoxy group, an ethoxy group, n-propoxy group, iso-propoxy group, ter-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from hydrogen, a methyl group, an ethyl group, an n-propyl group, an iso-propyl group, a tert-butyl group, a phenyl group, a naphthyl group, a biphenyl group, and a terphenyl group, but embodiments of the present disclosure are not limited thereto.

In one or more embodiments, $L_{101}$ and $L_{102}$ in Formulae 1A to 1E may each independently be selected from groups represented by Formulae 3-1 to 3-179, but embodiments of the present disclosure are not limited thereto:

3-1

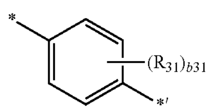

3-2

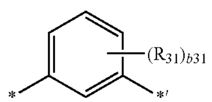

3-3

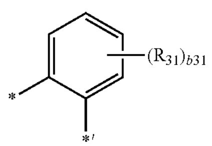

3-4

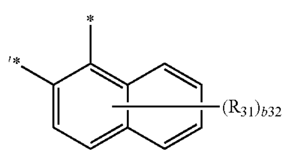

3-5

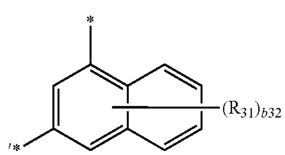

3-6

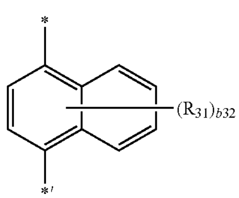

3-7

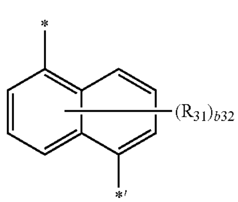

3-8

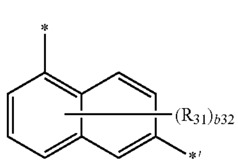

-continued 3-9

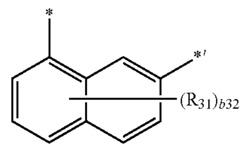

3-10

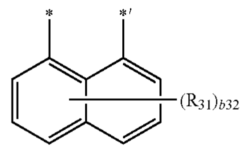

3-11

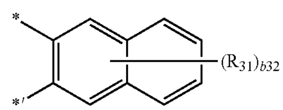

3-12

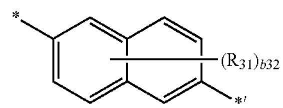

3-13

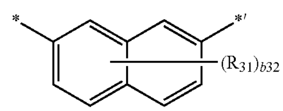

3-14

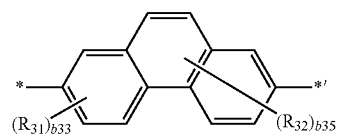

3-15

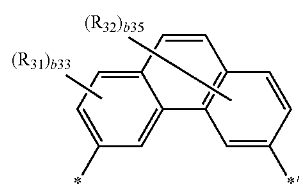

3-16

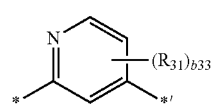

3-17

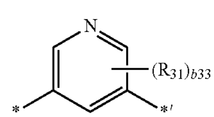

3-18

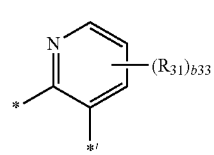

3-19

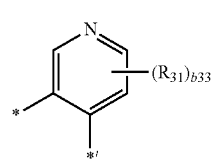

-continued
3-20
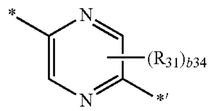
3-21
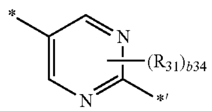
3-22
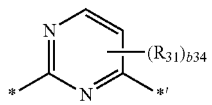
3-23
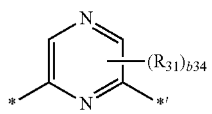
3-24
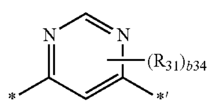
3-25
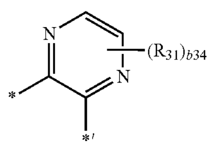
3-26
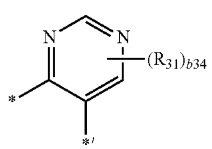
3-27
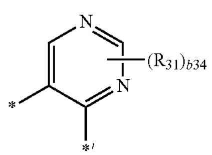
3-28
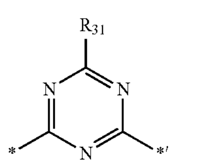
3-29
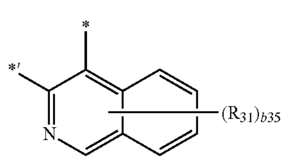
3-30
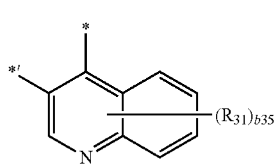
-continued
3-31
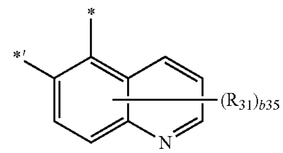
3-32
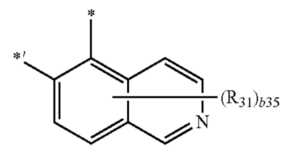
3-33
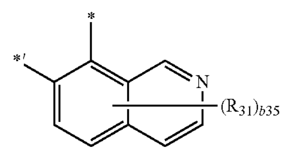
3-34
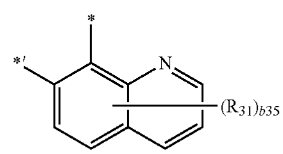
3-35
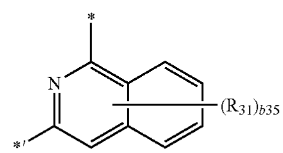
3-36
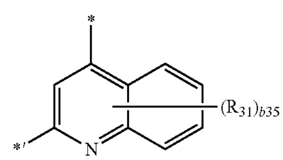
3-37
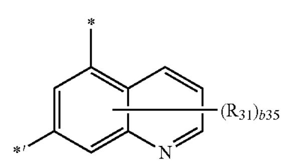
3-38
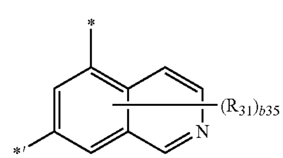
3-39
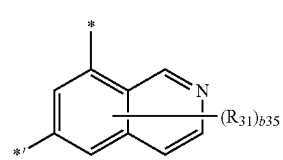
3-40
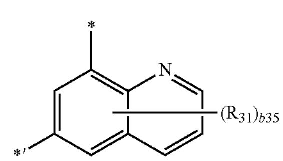

-continued
3-41
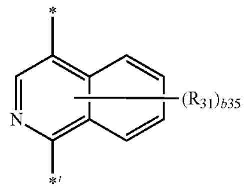
3-42
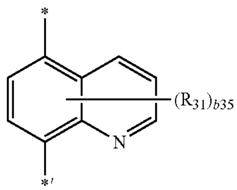
3-43
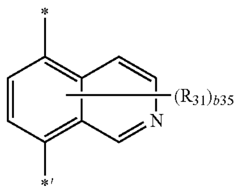
3-44
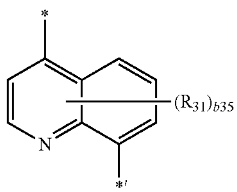
3-45
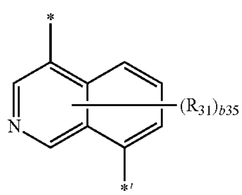
3-46
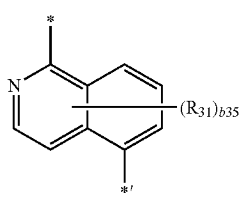
3-47
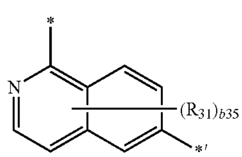
3-48
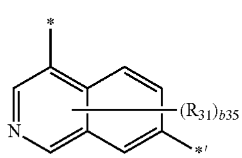
-continued
3-49
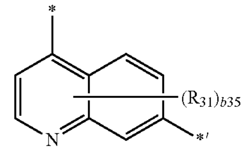
3-50
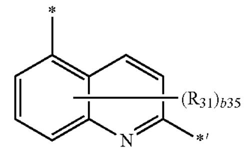
3-51
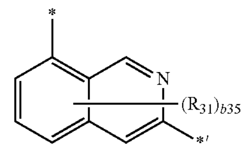
3-52
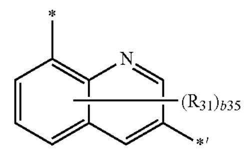
3-53
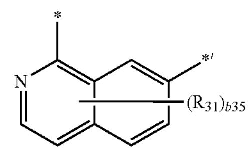
3-54
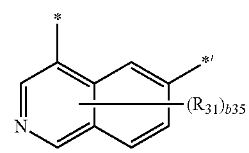
3-55
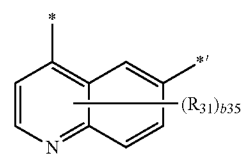
3-56
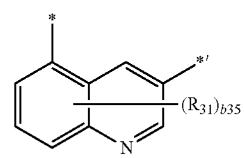
3-57
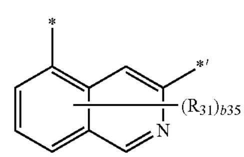
3-58
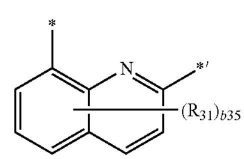

-continued
3-59
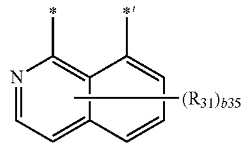
3-60
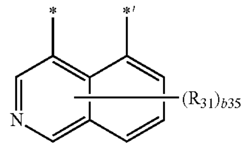
3-61
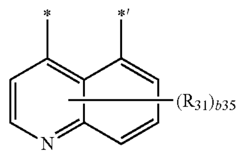
3-62
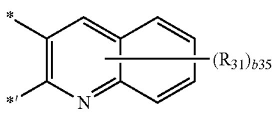
3-63
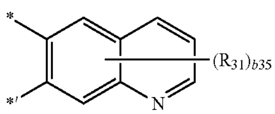
3-64
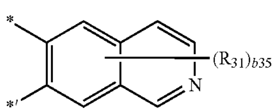
3-65
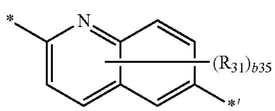
3-66
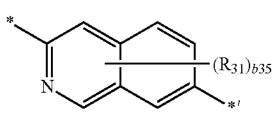
3-67
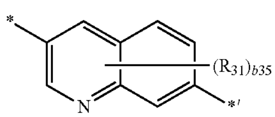
3-68
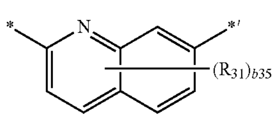
3-69
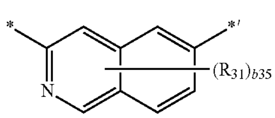
3-70
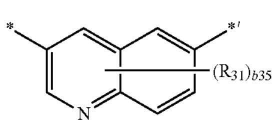
-continued
3-71
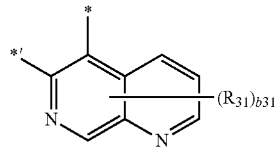
3-72
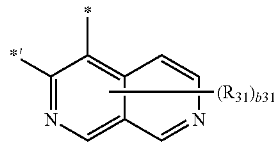
3-73
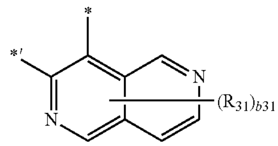
3-74
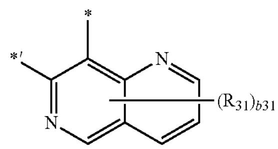
3-75
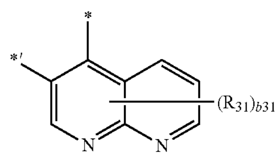
3-76
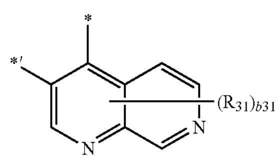
3-77
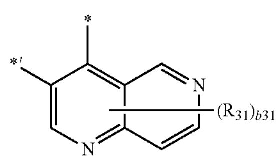
3-78
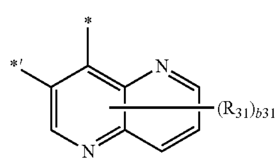
3-79
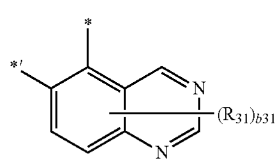
3-80
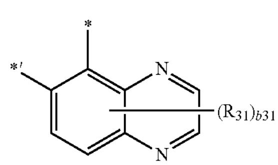

-continued
3-81
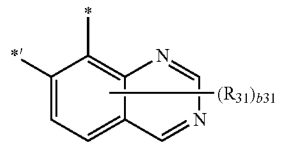
3-82
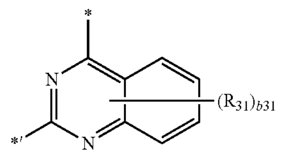
3-83
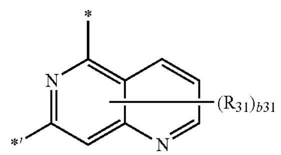
3-84
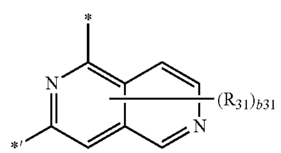
3-85
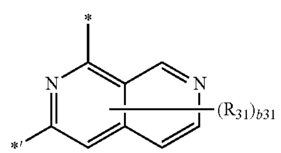
3-86
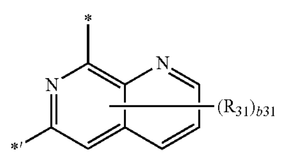
3-87
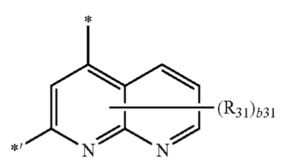
3-88
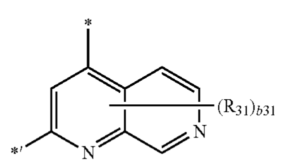
3-89
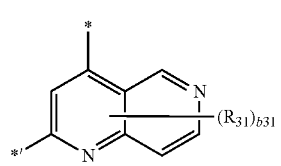
3-90
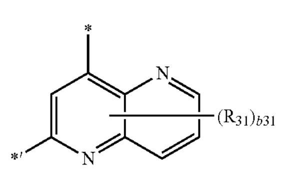
-continued
3-91
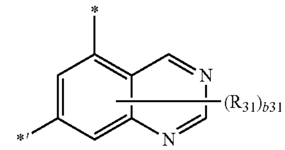
3-92
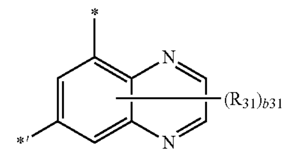
3-93
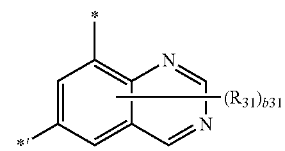
3-94
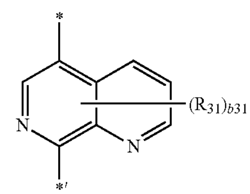
3-95
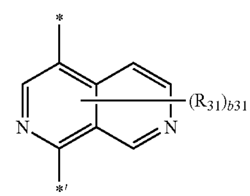
3-96
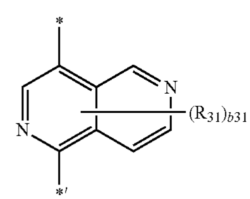
3-97
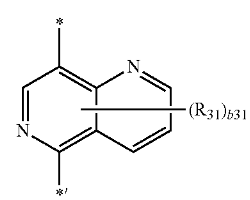
3-98
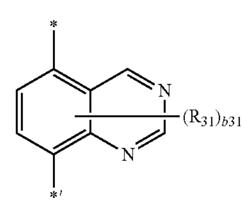

3-99
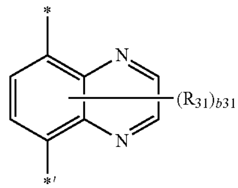
3-100
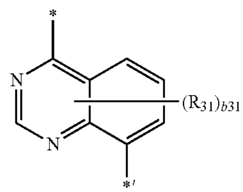
3-101
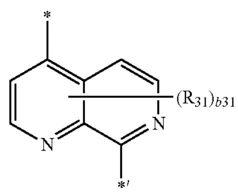
3-102
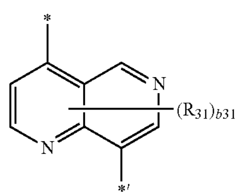
3-103
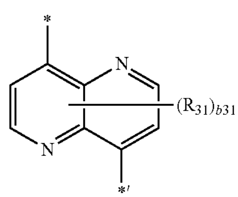
3-104
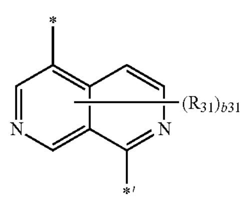
3-105
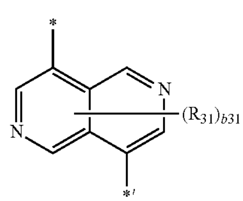
3-106
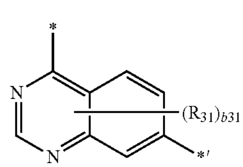
3-107
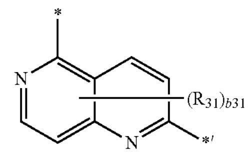
3-108
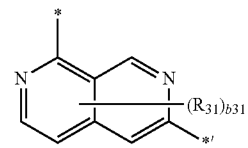
3-109
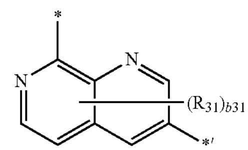
3-110
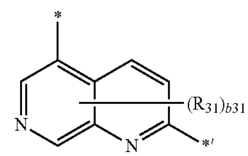
3-111
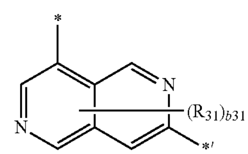
3-112
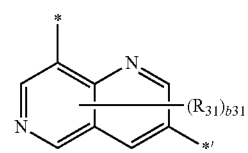
3-113
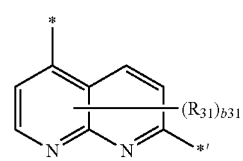
3-114
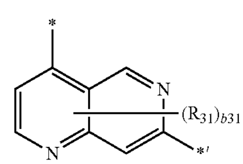
3-115
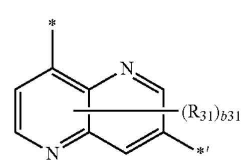
3-116
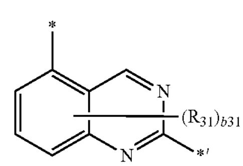

3-117
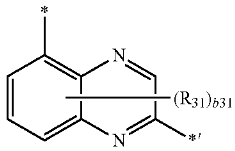
3-118
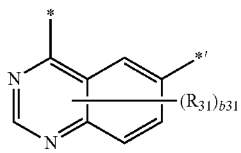
3-119
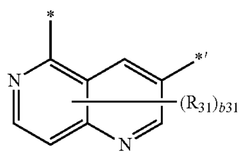
3-120
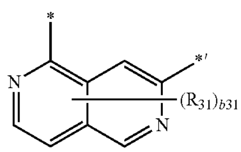
3-121
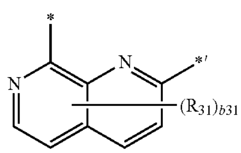
3-122
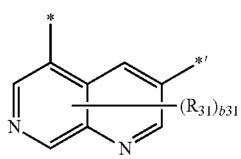
3-123
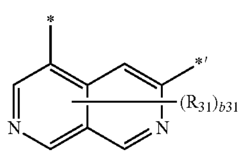
3-124
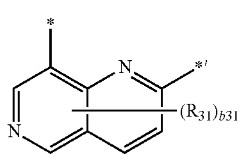
3-125
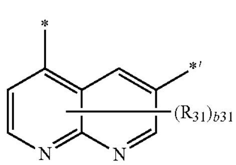
3-126
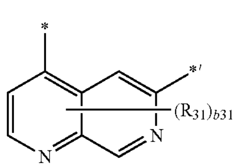
3-127
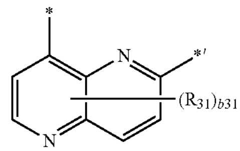
3-128
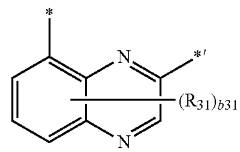
3-129
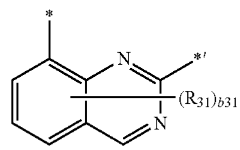
3-130
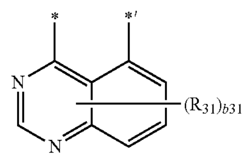
3-131
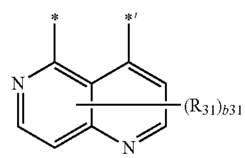
3-132
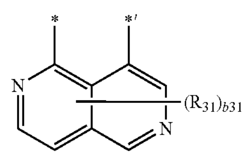
3-133
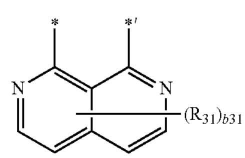
3-134
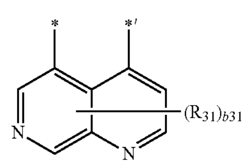
3-135
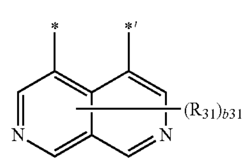
3-136
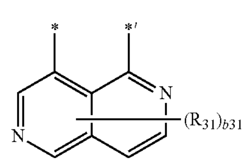

-continued
3-137
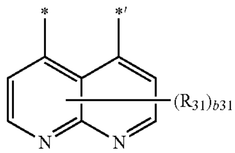
3-138
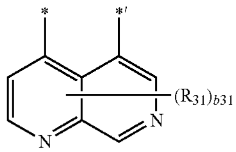
3-139
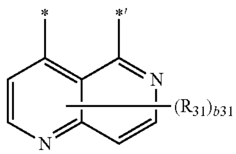
3-140
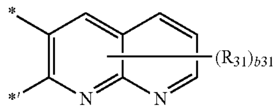
3-141
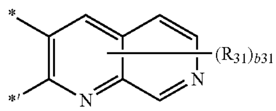
3-142
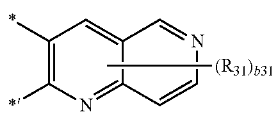
3-143
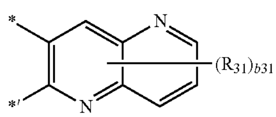
3-144
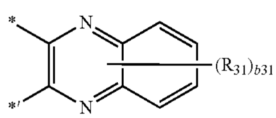
3-145
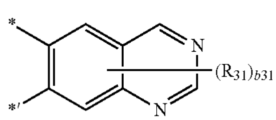
3-146
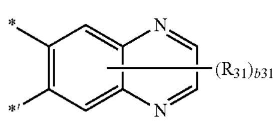
3-147
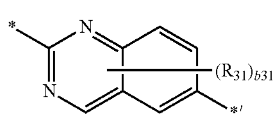
3-148
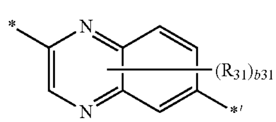
-continued
3-149
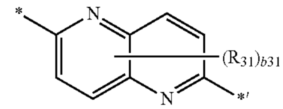
3-150
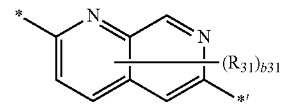
3-151
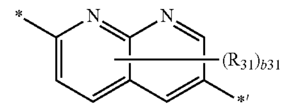
3-152
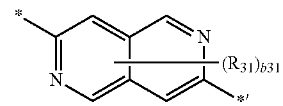
3-153
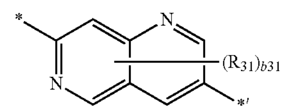
3-154
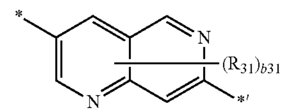
3-155
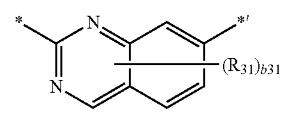
3-156
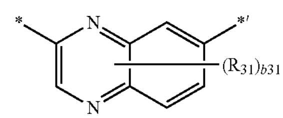
3-157
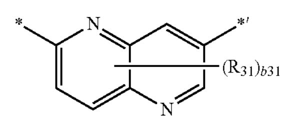
3-158
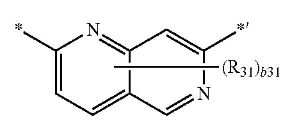
3-159
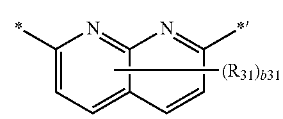
3-160
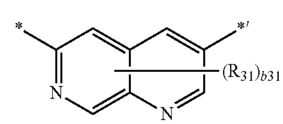
3-161
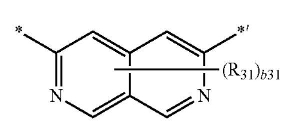

-continued
3-162
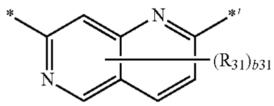
3-163
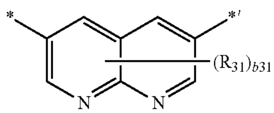
3-164
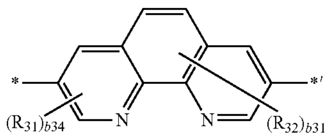
3-165
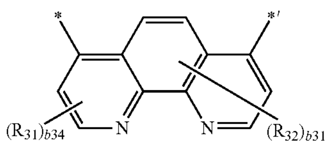
3-166
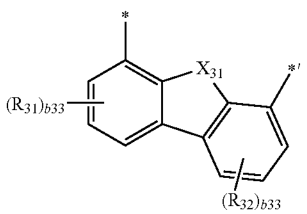
3-167
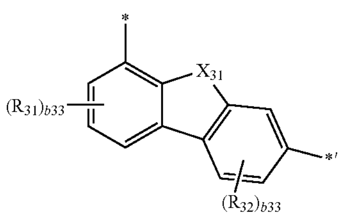
3-168
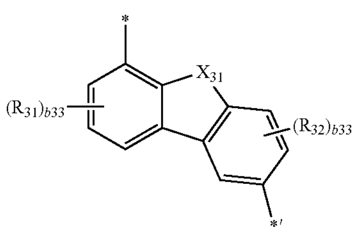
3-169
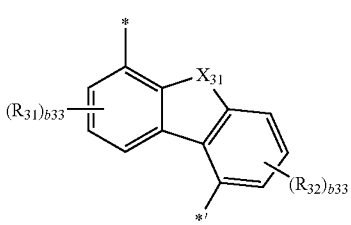
3-170
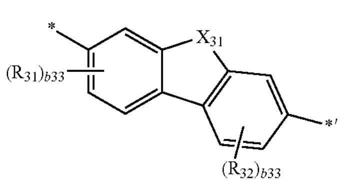
-continued
3-171
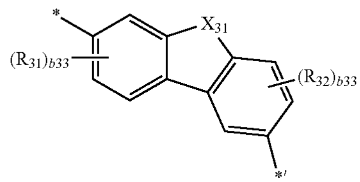
3-172
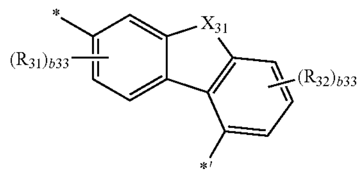
3-173
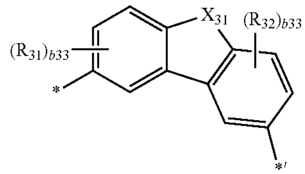
3-174
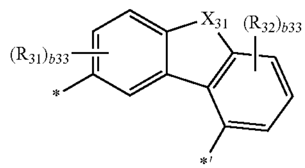
3-175
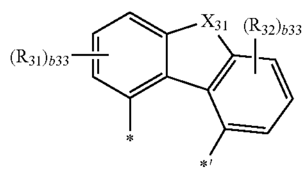
3-176
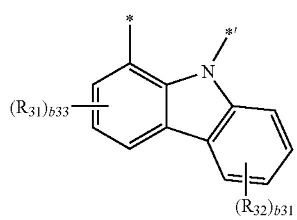
3-177
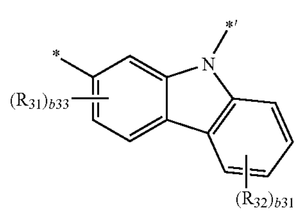
3-178
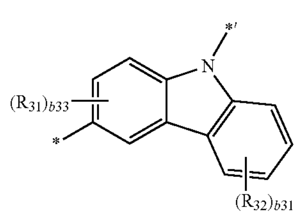

-continued

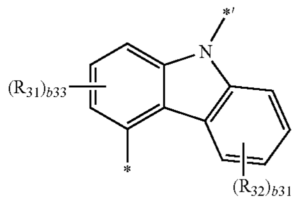
3-179

In Formulae 3-1 to 3-179, $X_{31}$ may be selected from O, S, N($R_{33}$), and C($R_{33}$)($R_{34}$);

$R_{31}$ to $R_{34}$ may each independently be selected from hydrogen, deuterium, —F, —Cl, —Br, —I, a cyano group, a methyl group, an ethyl group, an n-propyl group, an iso-propyl group, a tert-butyl group, a methoxy group, an ethoxy group, an n-propoxy group, an iso-propoxy group, a tert-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ may each independently be selected from hydrogen, a methyl group, an ethyl group, an n-propyl group, an iso-propyl group, a tert-butyl group, a phenyl group, a naphthyl group, a biphenyl group, and a terphenyl group;

b31 may be selected from 1, 2, 3, and 4;

b32 may be selected from 1, 2, 3, 4, 5, and 6;

b33 may be selected from 1, 2, and 3;

b34 may be selected from 1 and 2;

b35 may be selected from 1, 2, 3, 4, and 5; and

* and *' may each indicate a binding site to a neighboring atom.

a101 in Formulae 1A to 1D indicates the number of $L_{101}$(s), and a101 may be selected from 0, 1, 2, and 3. When a101 is 0, $(L_{101})_{a101}$ indicates a single bond, and when a101 is two or more, a plurality of $L_{101}$(s) may be identical to or different from each other.

In one or more embodiments, a101 in Formulae 1A to 1D may be selected from 0 and 1, but embodiments of the present disclosure are not limited thereto.

a102 in Formula 1E indicates the number of $L_{102}$(s), and a102 may be selected from 0, 1, 2, and 3. When a102 is 0, $(L_{102})_{a102}$ indicates a single bond, and when a102 is two or more, a plurality of $L_{102}$(s) may be identical to or different from each other.

In one or more embodiments, a102 in Formula 1E may be selected from 0 and 1, but embodiments of the present disclosure are not limited thereto.

$R_{101}$ to $R_{108}$ in Formulae 1A to 1D may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$);

wherein $R_{104}$ and $R_{105}$ may optionally be linked to form a saturated or unsaturated ring, and $R_{106}$ and $R_{107}$ may optionally be linked to form a saturated or unsaturated ring, and $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In one or more embodiments, $R_{101}$ to $R_{107}$ in Formulae 1A to 1D may each independently be selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$);

$Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group;

$R_{104}$ and $R_{105}$ may optionally be linked (e.g., coupled) to form a saturated or unsaturated ring, and $R_{106}$ and $R_{107}$ may optionally be linked (e.g., coupled) to form a saturated or unsaturated ring, but embodiments of the present disclosure are not limited thereto.

In one or more embodiments, $R_{101}$ to $R_{107}$ in Formulae 1A to 1D may each independently be selected from the group consisting of:

hydrogen, deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_1$)($Q_2$), and —Si($Q_1$)($Q_2$)($Q_3$); and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group;

wherein $Q_1$ to $Q_3$ may each independently be selected from a $C_1$-$C_{60}$ alkyl group, a $C_6$-$C_{60}$ aryl group, a biphenyl group, and a terphenyl group; and $R_{104}$ and $R_{105}$ may optionally be linked (e.g., coupled) to form a saturated or unsaturated ring, and $R_{106}$ and $R_{107}$ may optionally be linked (e.g., coupled) to form a saturated or unsaturated ring, but embodiments of the present disclosure are not limited thereto.

In one or more embodiments, $R_{101}$ to $R_{107}$ in Formulae 1A to 1D may each independently be selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —$N(Q_1)(Q_2)$, and —$Si(Q_1)(Q_2)(Q_3)$, and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group;

wherein $Q_1$ to $Q_3$ may each independently be selected from a methyl group, an ethyl group, an n-propyl group, an iso-propyl group, and a phenyl group; and $R_{104}$ and $R_{105}$ may optionally be linked (e.g., coupled) to form a saturated or unsaturated ring, and $R_{106}$ and $R_{107}$ may optionally be linked (e.g., coupled) to form a saturated or unsaturated ring, but embodiments of the present disclosure are not limited thereto.

In one or more embodiments, $R_{108}$ in Formula 1E may be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments of the present disclosure are not limited thereto.

In one or more embodiments, $R_{108}$ in Formula 1E may be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyridinyl group substituted with deuterium, a pyridinyl group substituted with a methyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ may each independently be selected from a $C_1$-$C_{20}$ alkyl group, a $C_6$-$C_{60}$ aryl group, a biphenyl group, and a terphenyl group, but embodiments of the present disclosure are not limited thereto.

In one or more embodiments, $R_{108}$ in Formula 1E may be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, $—CDH_2$, $—CD_2H$, $—CD_3$, $—CFH_2$, $—CF_2H$, $—CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_5$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, $—N(Q_{31})(Q_{32})$, and $—Si(Q_{31})(Q_{32})(Q_{33})$; and $—N(Q_1)(Q_2)$ and $—Si(Q_1)(Q_2)(Q_3)$, wherein $Q_1$ to $Q_3$ and $Q_{31}$ to $Q_{33}$ may each independently be selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group, and a naphthyl group, but embodiments of the present disclosure are not limited thereto.

In one or more embodiments, $R_{108}$ in Formula 1E may be selected from groups represented by Formulae 5-1 to 5-128, but embodiments of the present disclosure are not limited thereto:

5-1

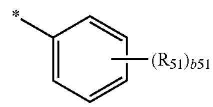

5-2

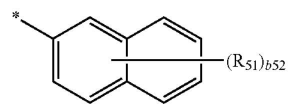

5-3

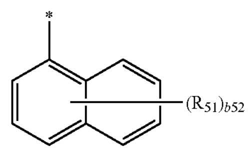

5-4

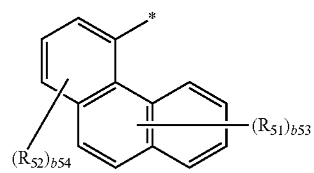

5-5

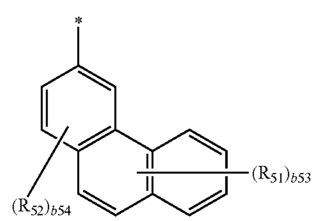

5-6

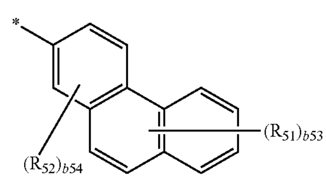

5-7

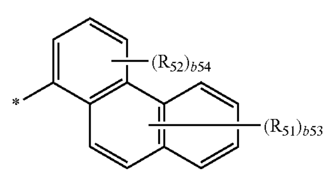

5-8

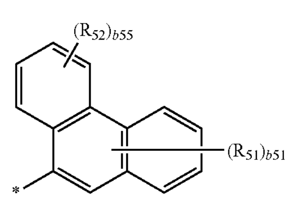

-continued
5-9
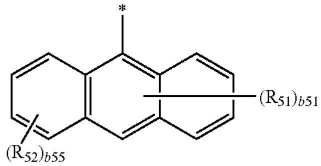
5-10
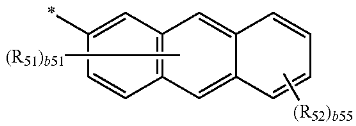
5-11
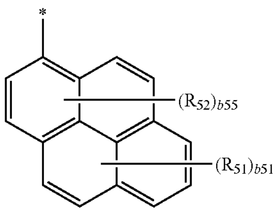
5-12
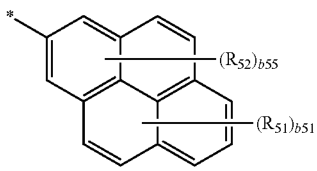
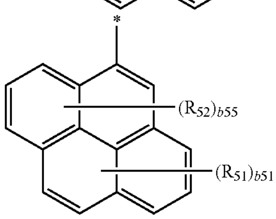
5-14
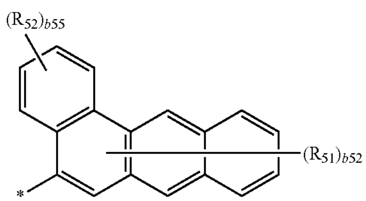
5-15
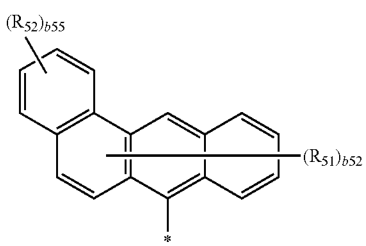
5-16
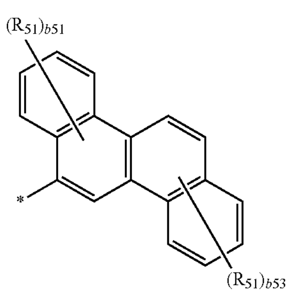
-continued
5-17
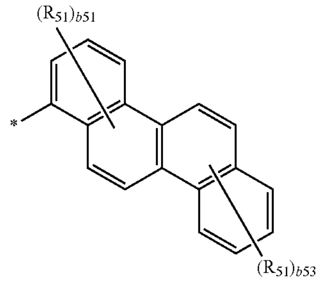
5-18
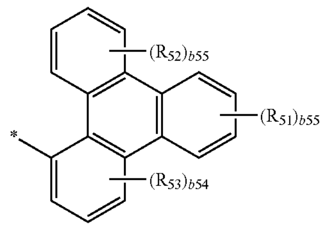
5-19
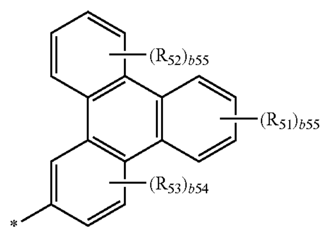
5-20
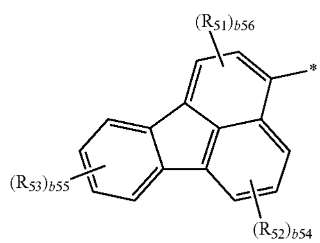
5-21
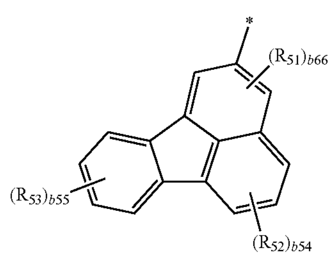
5-22
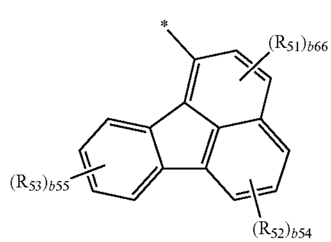

-continued
5-23
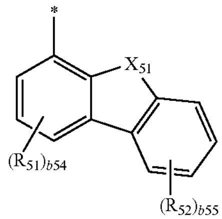
5-24
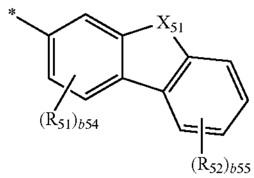
5-25
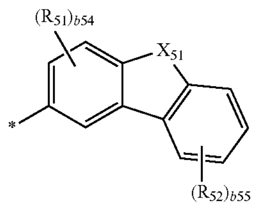
5-26
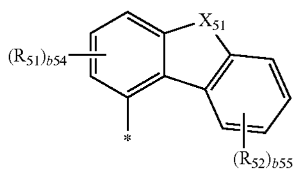
5-27
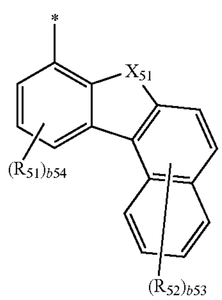
5-28
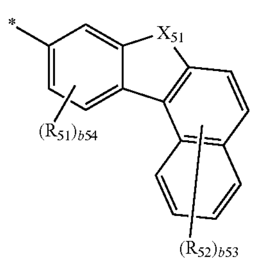
5-29
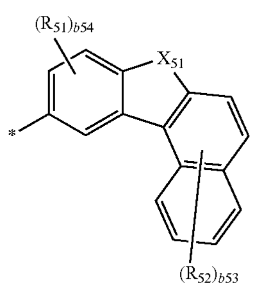
-continued
5-30
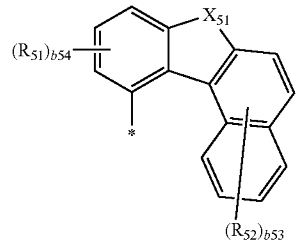
5-31
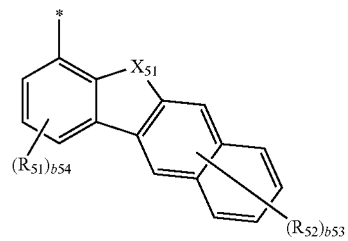
5-32
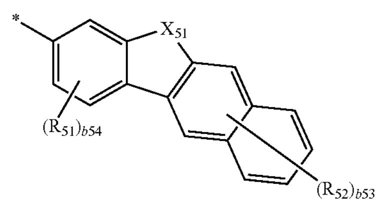
5-33
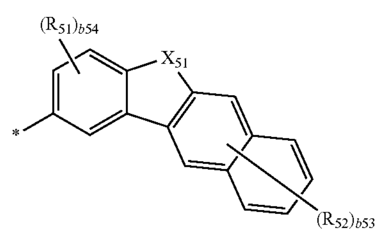
5-34
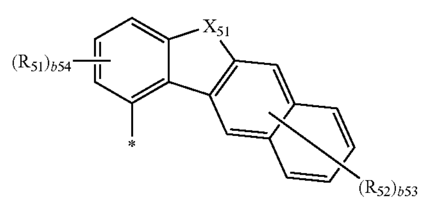
5-35
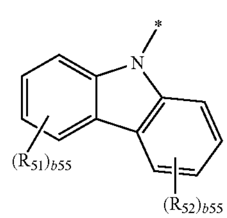
5-36
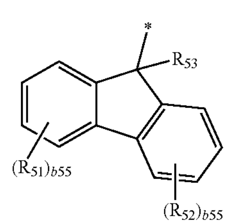

-continued
5-37
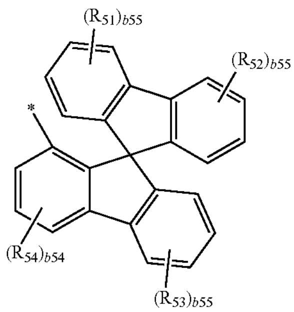
5-38
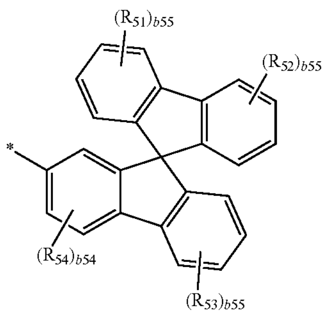
5-39
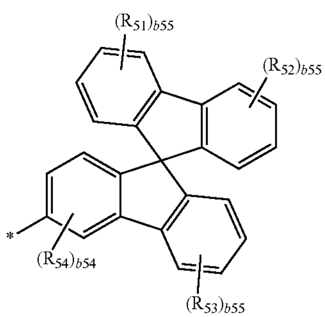
5-40
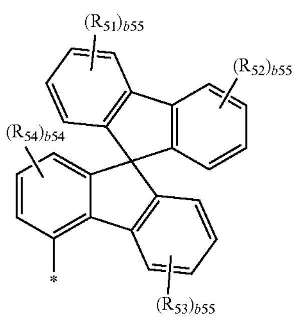
5-41
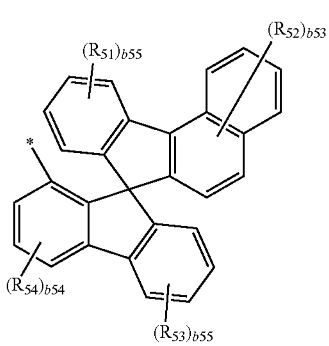
-continued
5-42
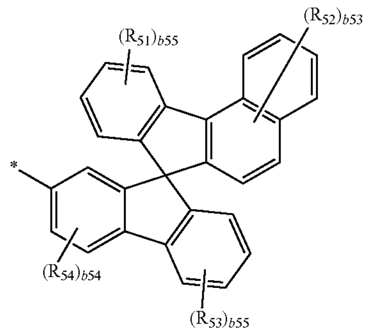
5-43
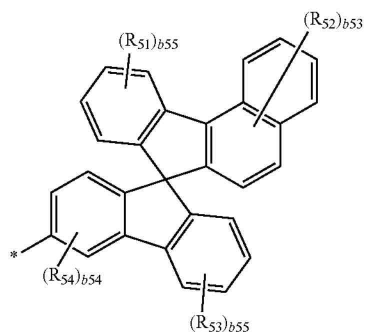
5-44
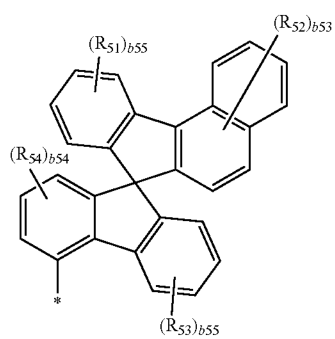
5-45
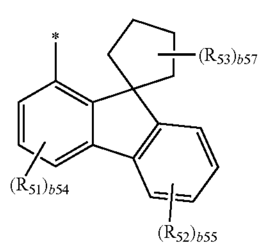
5-46
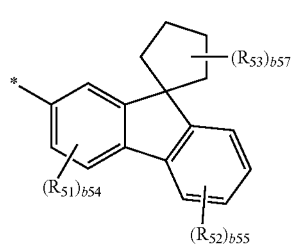

-continued
5-47
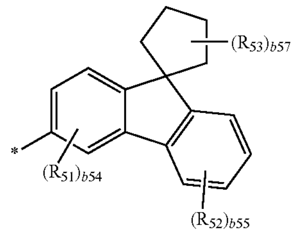
5-48
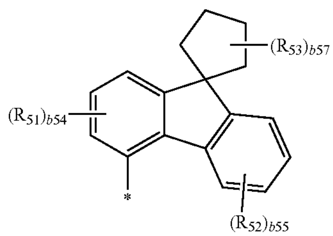
5-49
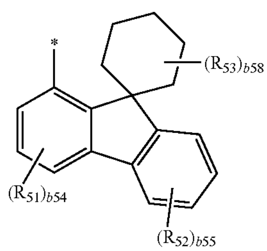
5-50
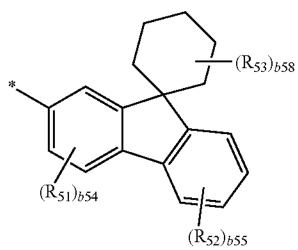
5-51
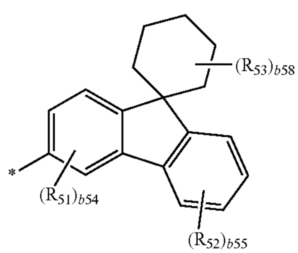
5-52
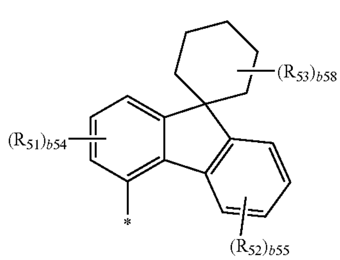
5-53
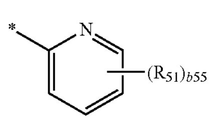
-continued
5-54
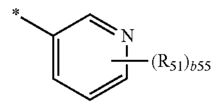
5-55
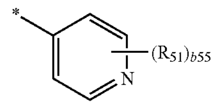
5-56
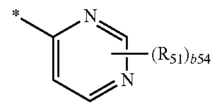
5-57
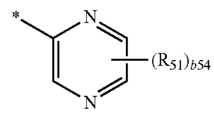
5-58
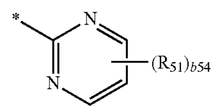
5-59
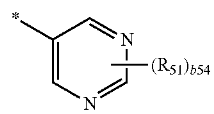
5-60
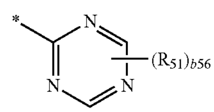
5-61
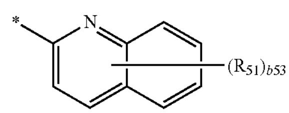
5-62
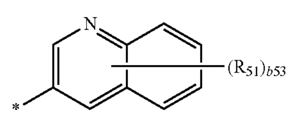
5-63
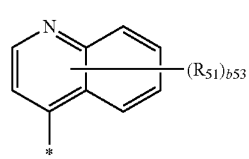
5-64
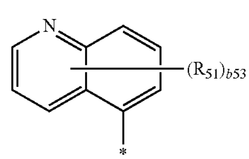
5-65
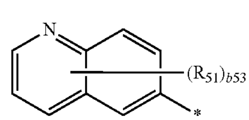
5-66
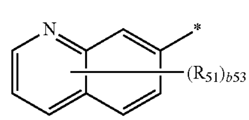

-continued
5-67
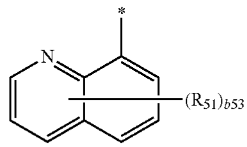
5-68
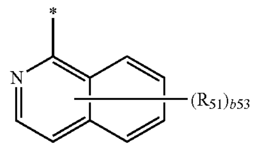
5-69
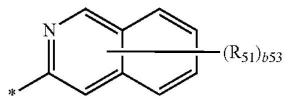
5-70
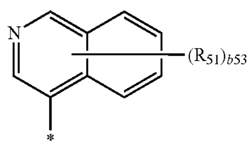
5-71
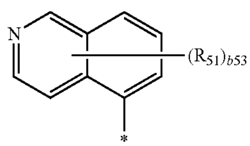
5-72
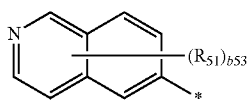
5-73
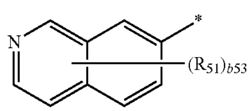
5-74
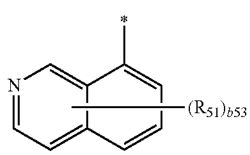
5-75
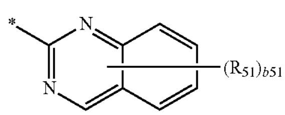
5-76
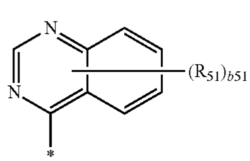
5-77
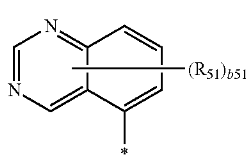
-continued
5-78
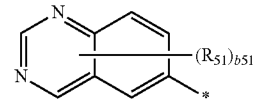
5-79
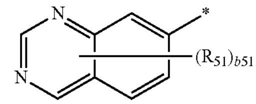
5-80
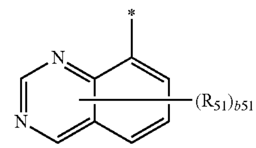
5-81
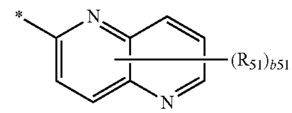
5-82
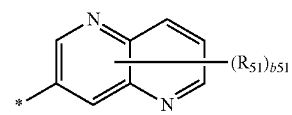
5-83
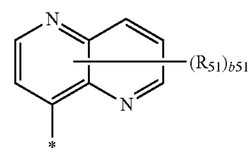
5-84
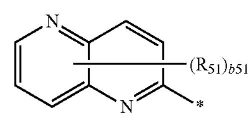
5-85
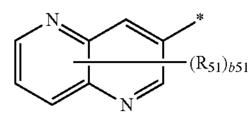
5-86
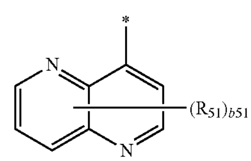
5-87
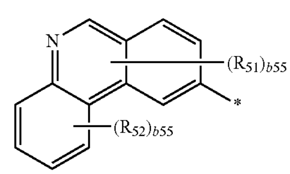
5-88
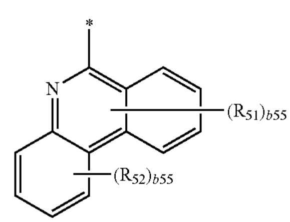

-continued
5-89
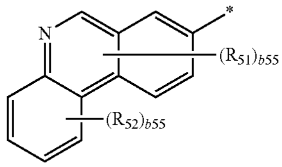
5-90
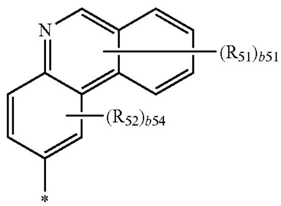
5-91
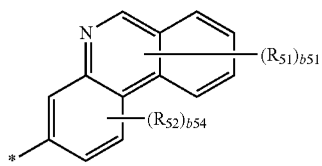
5-92
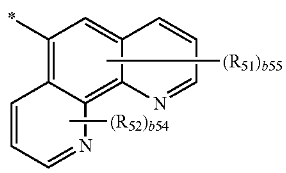
5-93
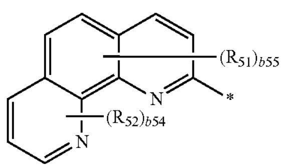
5-94
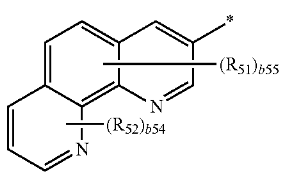
5-95
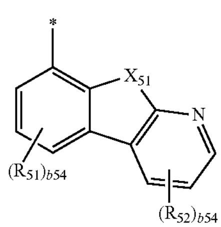
5-96
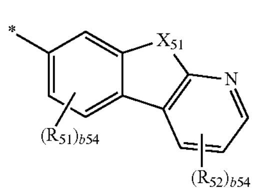
-continued
5-97
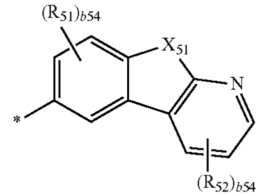
5-98
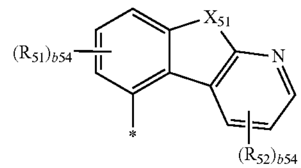
5-99
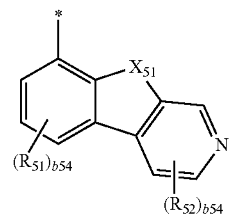
5-100
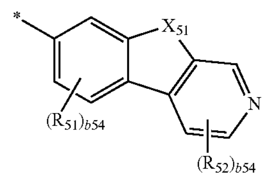
5-101
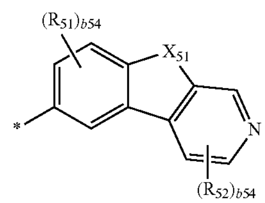
5-102
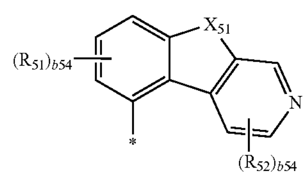
5-103
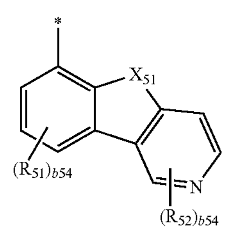
5-104
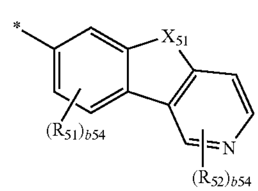

-continued
5-105
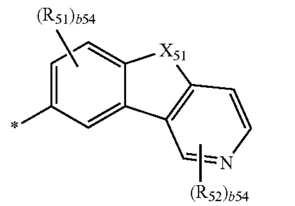
5-106
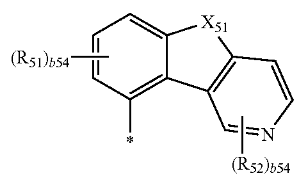
5-107
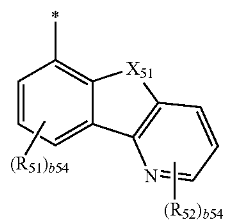
5-108
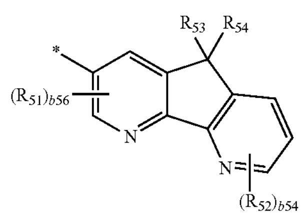
5-109
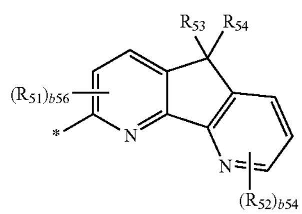
5-110
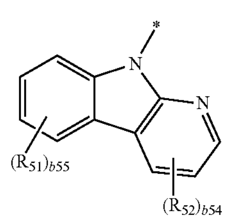
5-111
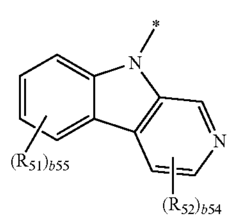
-continued
5-112
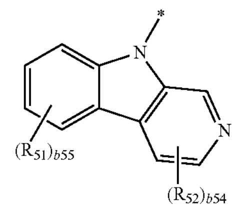
5-113
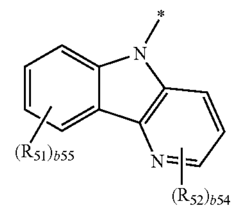
5-114
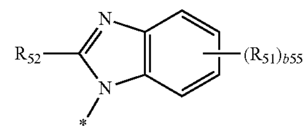
5-115
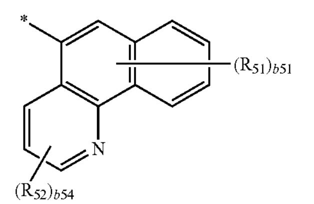
5-116
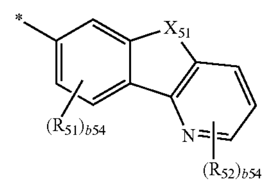
5-117
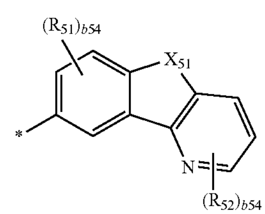
5-118
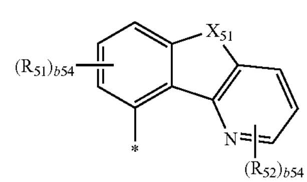
5-119
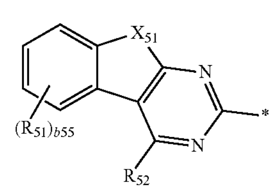

-continued 5-120

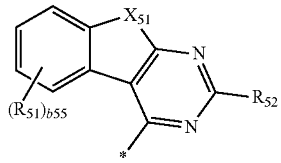

5-121

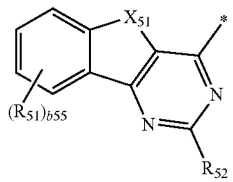

5-122

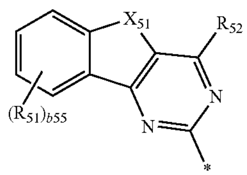

5-123

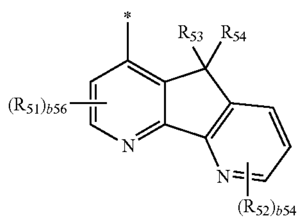

5-124

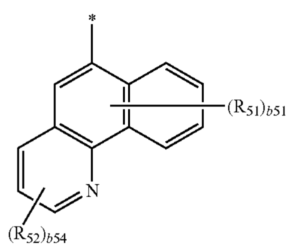

5-125

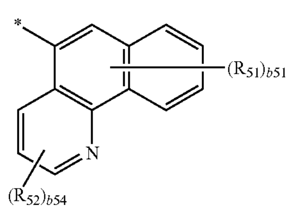

5-126

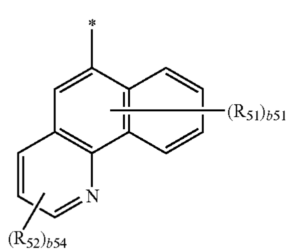

5-127

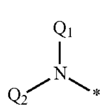

-continued 5-128

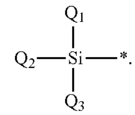

In Formulae 5-1 to 5-128, $X_{51}$ may be selected from O, S, $N(R_{53})$, and $C(R_{53})(R_{54})$;

$R_{51}$ to $R_{54}$ may each independently be selected from hydrogen, deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, $—CDH_2$, $—CD_2H$, $—CD_3$, $—CFH_2$, $—CF_2H$, $—CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_5$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, $—N(Q_{31})(Q_{32})$, and $—Si(Q_{31})(Q_{32})(Q_{33})$;

$Q_1$ to $Q_3$ and $Q_{31}$ to $Q_{33}$ may each independently be selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group, and a naphthyl group;

b51 may be selected from 1, 2, 3, 4, and 5;

b52 may be selected from 1, 2, 3, 4, 5, 6, and 7;

b53 may be selected from 1, 2, 3, 4, 5, and 6;

b54 may be selected from 1, 2, and 3;

b55 may be selected from 1, 2, 3, and 4;

b56 may be selected from 1 and 2;

b57 may be selected from 1, 2, 3, 4, 5, 6, 7, and 8;

b58 may be selected from 1, 2, 3, 4, 5, 6, 7, 8, 9, and 10; and

* may indicate a binding site to a neighboring atom.

In one or more embodiments, when $X_{11}$ in Formulae 1A to 1D is $C(R_{104})(R_{105})$, $R_{104}$ and $R_{105}$ may optionally be linked (e.g., coupled) to form a group represented by one selected from Formulae 9-1 and 9-2; and when $X_{12}$ is $C(R_{106})(R_{107})$, $R_{106}$ and $R_{107}$ may optionally be linked (e.g., coupled) to form a group represented by one selected from Formulae 9-1 and 9-2, but embodiments of the present disclosure are not limited thereto:

Formula 9-1

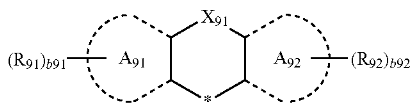

Formula 9-2

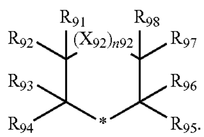

In Formulae 9-1 and 9-2, $X_{91}$ may be selected from a single bond, O, S, selenium (Se), $C(R_{93})(R_{94})$, $Si(R_{93})(R_{94})$, and $Ge(R_{93})(R_{94})$;

$X_{92}$ may be $C(R_{99})(R_{100})$;

n92 may be selected from 0, 1, and 2;

$A_{91}$ and $A_{92}$ may each independently be selected from a $C_6$-$C_{20}$ arene group and a $C_1$-$C_{20}$ heteroarene group;

$R_{91}$ to $R_{100}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group;

b91 and b92 may each independently be selected from 1, 2, 3, 4, 5, 6, 7, 8, 9, and 10; and

* may indicate a carbon atom in Formulae 1A to 1D.

In one or more embodiments, n92 in Formulae 9-1 and 9-2 may be selected from 0 and 1, but embodiments of the present disclosure are not limited thereto. Herein, n92 indicates the number of $X_{92}$(s), and when n92 is 0, $(X_{92})_{n92}$ indicates a single bond.

In one or more embodiments, $A_{91}$ and $A_{92}$ in Formulae 9-1 and 9-2 may each independently be selected from a benzene group, a naphthalene group, a pyridine group, a quinoline group, and an isoquinoline group, but embodiments of the present disclosure are not limited thereto.

In one or more embodiments, $A_{91}$ and $A_{92}$ in Formulae 9-1 and 9-2 may each independently be selected from a benzene group, a naphthalene group, and a pyridine group, but embodiments of the present disclosure are not limited thereto.

In one or more embodiments, $R_{91}$ to $R_{100}$ in Formulae 9-1 and 9-2 may each independently be selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, and $—Si(Q_1)(Q_2)(Q_3)$, wherein $Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments of the present disclosure are not limited thereto.

In one or more embodiments, $R_{91}$ to $R_{100}$ in Formulae 9-1 and 9-2 may each independently be selected from the group consisting of:

hydrogen, deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $—N(Q_1)(Q_2)$, and $—Si(Q_1)(Q_2)(Q_3)$; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group, wherein $Q_1$ to $Q_3$ may each independently be selected from a $C_1$-$C_{60}$ alkyl group, a $C_6$-$C_{60}$ aryl group, a biphenyl group, and a terphenyl group, but embodiments of the present disclosure are not limited thereto.

In one or more embodiments, $R_{91}$ to $R_{100}$ in Formulae 9-1 and 9-2 may each independently be selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, $—N(Q_1)(Q_2)$, and $—Si(Q_1)(Q_2)(Q_3)$; and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group, wherein $Q_1$ to $Q_3$ may each independently be selected from a methyl group, an ethyl group, an n-propyl group, an iso-propyl group, and a phenyl group, but embodiments of the present disclosure are not limited thereto.

b101 in Formulae 1A to 1D indicates the number of $R_{101}$(s), and b101 may be selected from 1, 2, 3, 4, 5, 6, 7, 8, 9, and 10. When b101 is two or more, a plurality of $R_{101}$(s) may be identical to or different from each other. b102 and b103 in Formulae 1A to 1D may each independently be the same as described herein in connection with b101, and b102 and b103 may each independently be selected from 1, 2, 3, 4, 5, 6, 7, 8, 9, and 10.

Ar in Formula 2 may be selected from groups represented by Formulae 2A to 2F.

$X_{21}$ in Formulae 2A and 2B may be selected from oxygen and sulfur.

$X_{22}$ in Formulae 2C to 2F may be selected from oxygen, sulfur, $N(R_{204})$, and $C(R_{204})(R_{205})$, wherein $R_{204}$ and $R_{205}$ are described below.

$X_{23}$ in Formulae 2C to 2F may be selected from oxygen, sulfur, $N(R_{206})$, and $C(R_{206})(R_{207})$, wherein $R_{206}$ and $R_{207}$ are described below.

$A_{21}$ and $A_{22}$ in Formulae 2A and 2B may each independently be selected from a $C_6$-$C_{20}$ arene group and a $C_1$-$C_{20}$ heteroarene group, provided that $A_{21}$ and $A_{22}$ are not both (e.g., concurrently) benzenes. For example, the case in which the chemical structures represented by Formula 2A and 2B are substituted or unsubstituted fluorenes is excluded.

In one or more embodiments, $A_{21}$ and $A_{22}$ in Formulae 2A and 2B may each independently be selected from a benzene group, a naphthalene group, a phenanthrene group, an anthracene group, a triphenylene group, a pyrene group, a chrysene group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, and a phenanthroline group, but embodiments of the present disclosure are not limited thereto.

In one or more embodiments, $A_{21}$ in Formulae 2A and 2B may be selected from a benzene group, a naphthalene group, a phenanthrene group, an anthracene group, a triphenylene group, a pyrene group, a chrysene group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, and a phenanthroline group;

$A_{22}$ may be selected from a naphthalene group, a phenanthrene group, an anthracene group, a triphenylene group, a pyrene group, a chrysene group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, and a phenanthroline group, but embodiments of the present disclosure are not limited thereto.

In one or more embodiments, $A_{21}$ and $A_{22}$ in Formulae 2A and 2B may each independently be selected from a benzene group, a naphthalene group, a phenanthrene group, a pyridine group, a quinoline group, an isoquinoline group, a benzoquinoline group, a benzoisoquinoline group, a quinoxaline group, and a phenanthroline group, but embodiments of the present disclosure are not limited thereto.

In one or more embodiments, $A_{21}$ in Formulae 2A and 2B may be selected from a benzene group, a naphthalene group, a phenanthrene group, a pyridine group, a quinoline group, an isoquinoline group, a benzoquinoline group, a benzoisoquinoline group, a quinoxaline group, and a phenanthroline group;

$A_{22}$ may be selected from a naphthalene group, a phenanthrene group, a pyridine group, a quinoline group, an isoquinoline group, a benzoquinoline group, a benzoisoquinoline group, a quinoxaline group, and a phenanthroline group, but embodiments of the present disclosure are not limited thereto.

$A_{23}$ to $A_{25}$ in Formulae 2C to 2F may each independently be selected from a $C_5$-$C_{20}$ carbocyclic group and a $C_1$-$C_{20}$ heterocyclic group.

In one or more embodiments, $A_{23}$ to $A_{25}$ in Formulae 2C to 2F may each independently be selected from a benzene group, a naphthalene group, a phenanthrene group, an anthracene group, a triphenylene group, a pyrene group, a chrysene group, a furan group, a thiophene group, a pyrrole group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, a phenanthroline group, a benzofuran group, a benzothiophene group, an indene group, an indole group, a furopyridine group, a thienopyridine group, a cyclopentapyridine group, a pyrrolopyridine group, a dibenzofuran group, a dibenzothiophene group, a fluorene group, a carbazole group, a benzofuropyrrole group, a benzothienopyrrole group, an indenopyrrole group, an indolopyrrole group, a benzofurothiophene group, a benzothienothiophene group, an indenothiophene group, an indolothiophene group, a benzofurofuran group, a benzothienofuran group, an indenofuran group, an indolofuran group, a benzofurothiophene group, a benzothienothiophene group, an indenothiophene group, an indolothiophene group, a benzofuropyridine group, a benzothienopyridine group, an indenopyridine group, an indolopyridine group, a benzofuropyrimidine group, a benzothienopyrimidine group, an indenopyrimidine group, an indolopyrimidine group, a benzofuroindole group, a benzothienoindole group, an indenoindole group, an indoloindole group, a benzofurobenzofuran group, a benzothienobenzofuran group, an indenobenzofuran group, an indolobenzofuran group, a benzofurobenzothiophene group, a benzothienobenzothiophene group, an indenobenzothiophene group, an indolobenzothiophene group, a benzofuroquinoline group, a benzothienoquinoline group, an indenoquinoline group, an indoloquinoline group, a benzonaphthofuran group, a benzonaphthothiophene group, a benzofluorene group, a benzocarbazole group, a dinaphthofuran group, a dinaphthothiophene group, a dibenzofluorene group, a dibenzocarbazole group, a benzoxazole group, a benzothiazole group, a benzimidazole group, a naphthofuran, a naphthothiophene, a cyclopentanaphthalene group, a spiro-bifluorene group, and a spiro-fluorene-indene, but embodiments of the present disclosure are not limited thereto.

In one or more embodiments, $A_{23}$ to $A_{25}$ in Formulae 2C to 2F may each independently be selected from a benzene group, a naphthalene group, a phenanthrene group, a pyridine group, a pyrazine group, a pyrimidine group, a quinoline group, an isoquinoline group, a benzoquinoline group, a benzoisoquinoline group, a dibenzofuran group, a dibenzothiophene group, a fluorene group, a carbazole group, and an indolopyridine group, but embodiments of the present disclosure not limited thereto.

In one or more embodiments, $A_{23}$ to $A_{25}$ in Formulae 2C to 2F may each independently be selected from a benzene group, a naphthalene group, a phenanthrene group, a pyridine group, a quinoline group, an isoquinoline group, a benzoquinoline group, a benzoisoquinoline group, a dibenzofuran group, a dibenzothiophene group, a fluorene group, a carbazole group, and an indolopyridine group, but embodiments of the present disclosure are not limited thereto.

$L_{21}$ to $L_{26}$ in Formula 2 may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In one or more embodiments, $L_{21}$ to $L_{26}$ in Formula 2 may each independently be selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group, each substituted with at least one selected from deuterium, —F, —Cl, —Br, —I, a cyano group, a $C_1$-$C_{20}$ alkyl group, a $C_1$-$C_{20}$ alkoxy group, a cyclopropyl group, a cyclobutyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from hydrogen, a $C_1$-$C_{20}$ alkyl group, a phenyl group, a naphthyl group, a biphenyl group, and a terphenyl group, but embodiments of the present disclosure are not limited thereto.

In one or more embodiments, $L_{21}$ to $L_{26}$ in Formula 2 may each independently be selected from the group consisting of:

a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group, and a dibenzothiophenylene group; and a phenylene group, a naphthylene group, a fluorenylene group, a phenanthrenylene group, a pyridinylene group, a pyrazinylene group, a pyrimidinylene group, a quinolinylene group, an isoquinolinylene group, a benzoquinolinylene group, a benzoisoquinolinylene group, a naphthyridinylene group, a quinoxalinylene group, a quinazolinylene group, a phenanthridinylene group, a phenanthrolinylene group, a carbazolylene group, a triazinylene group, a dibenzofuranylene group, and a dibenzothiophenylene group, each substituted with at least one selected from deuterium, —F, —Cl, —Br, —I, a cyano group, a methyl group, an ethyl group, an n-propyl group, an iso-propyl group, a tert-butyl group, a methoxy group, an ethoxy group, n-propoxy group, iso-propoxy group, tert-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a hydrogen, a methyl group, an ethyl group, an n-propyl group, an iso-propyl group, a tert-butyl group, a phenyl group, a naphthyl group, a biphenyl group, and a terphenyl group, but embodiments of the present disclosure are not limited thereto.
In one or more embodiments, $L_{21}$ to $L_{26}$ in Formula 2 may each independently be selected from groups represented by Formulae 3-1 to 3-179, but embodiments of the present disclosure are not limited thereto:
3-1
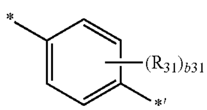
3-2
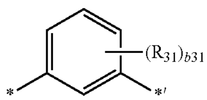
3-3
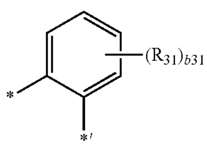
3-4
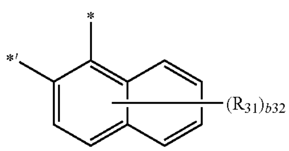
3-5
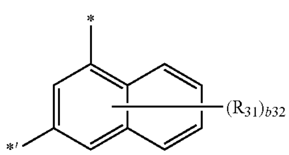
3-6
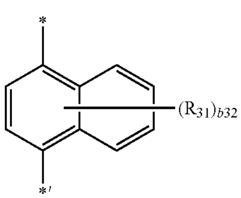
3-7
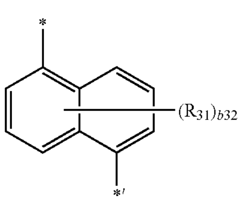
3-8
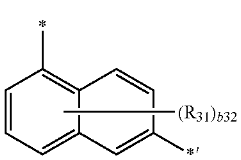
3-9
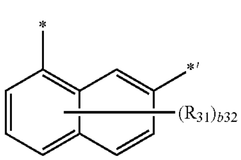
-continued
3-10
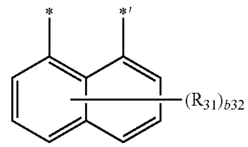
3-11
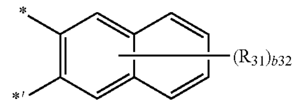
3-12
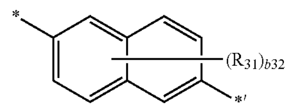
3-13
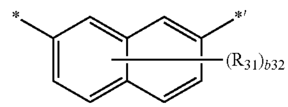
3-14
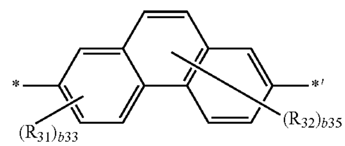
3-15
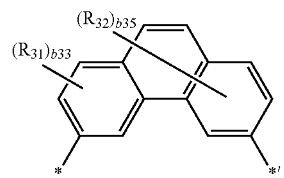
3-16
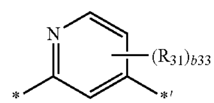
3-17
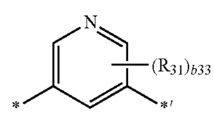
3-18
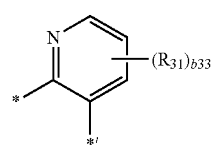
3-19
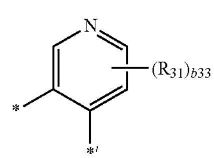
3-20
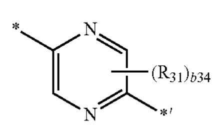
3-21
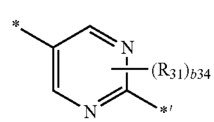

-continued
3-22
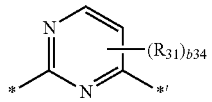
3-23
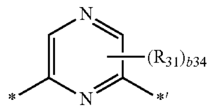
3-24
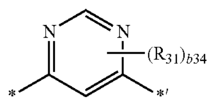
3-25
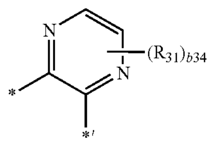
3-26
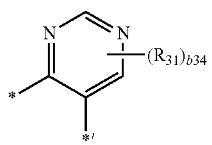
3-27
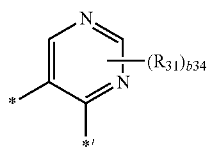
3-28
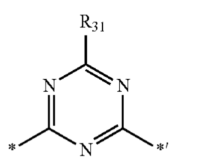
3-29
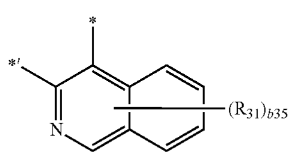
3-30
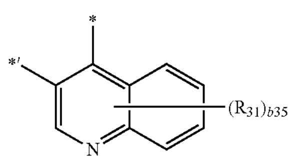
3-31
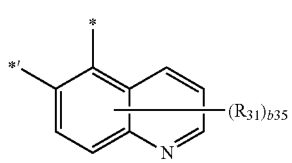
3-32
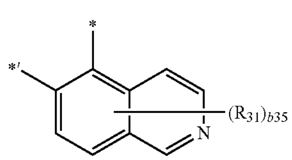
-continued
3-33
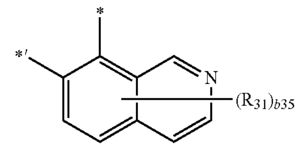
3-34
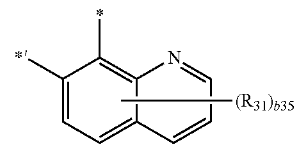
3-35
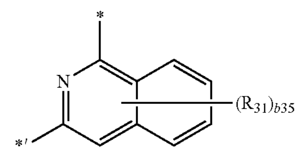
3-36
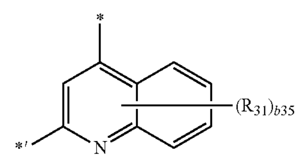
3-37
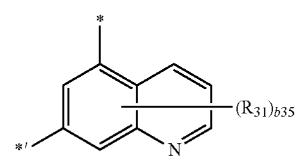
3-38
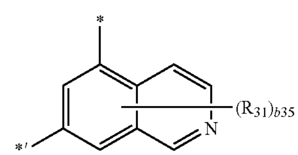
3-39
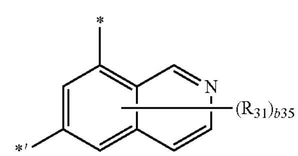
3-40
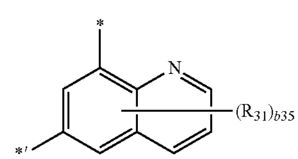
3-41
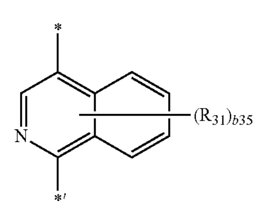

-continued
3-42
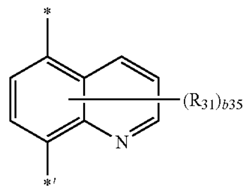
3-43
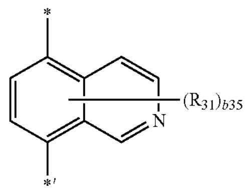
3-44
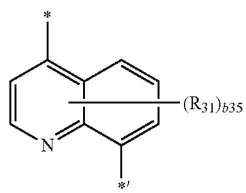
3-45
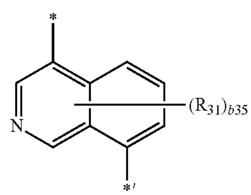
3-46
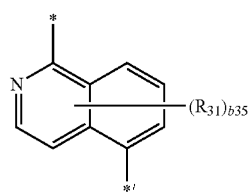
3-47
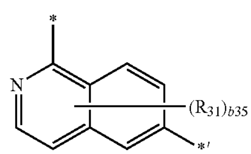
3-48
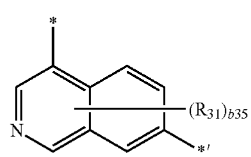
3-49
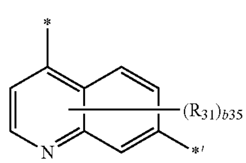
3-50
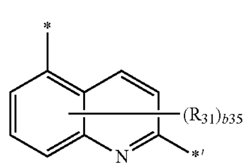
-continued
3-51
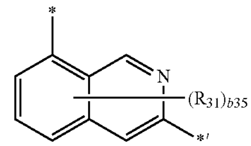
3-52
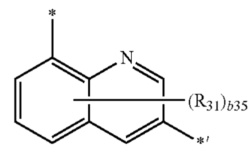
3-53
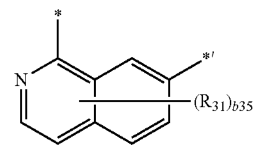
3-54
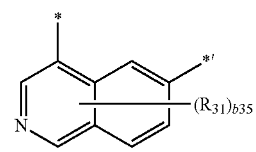
3-55
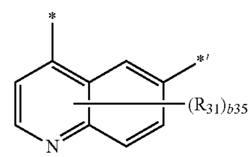
3-56
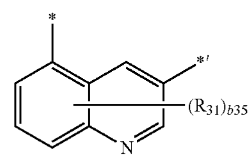
3-57
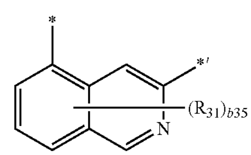
3-58
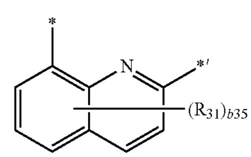
3-59
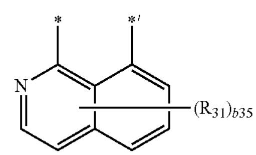
3-60
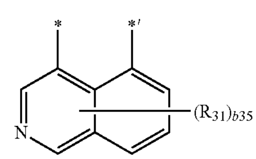

-continued
3-61
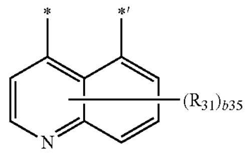
3-62
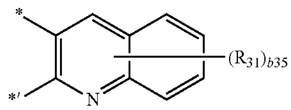
3-63
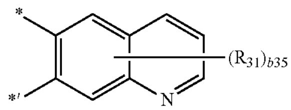
3-64
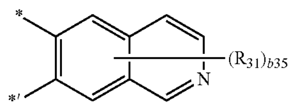
3-65
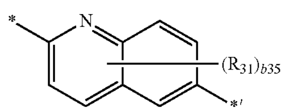
3-66
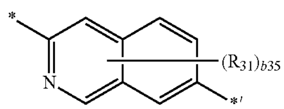
3-67
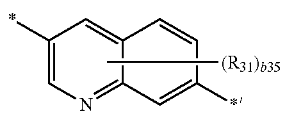
3-68
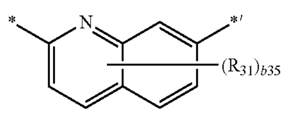
3-69
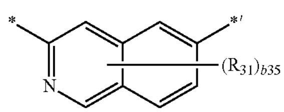
3-70
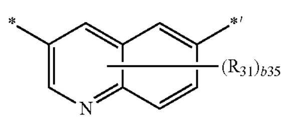
3-71
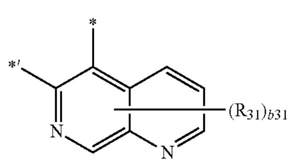
3-72
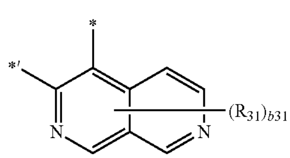
-continued
3-73
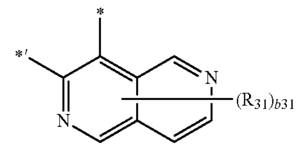
3-74
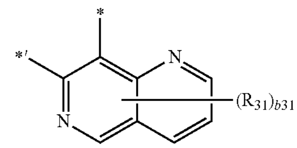
3-75
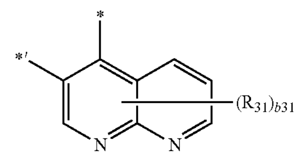
3-76
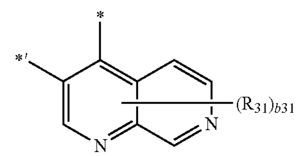
3-77
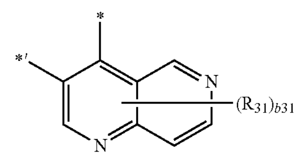
3-78
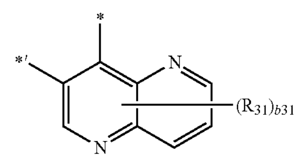
3-79
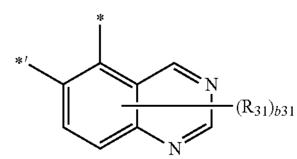
3-80
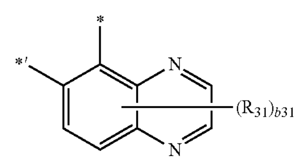
3-81
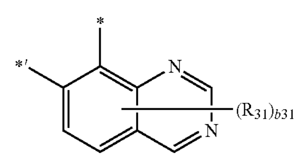
3-82
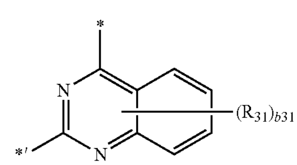

-continued
3-83
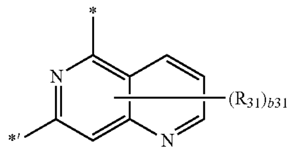
3-84
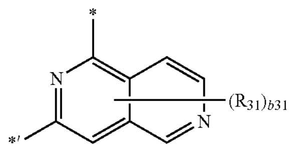
3-85
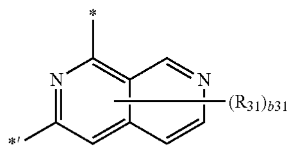
3-86
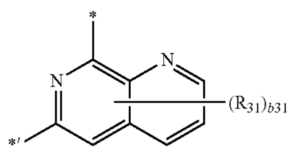
3-87
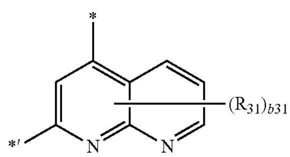
3-88
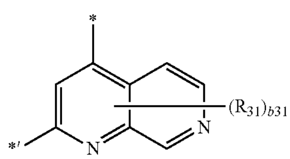
3-89
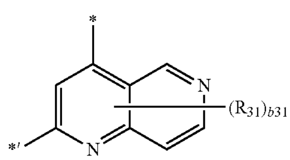
3-90
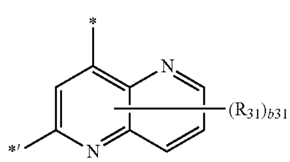
3-91
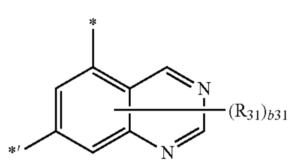
3-92
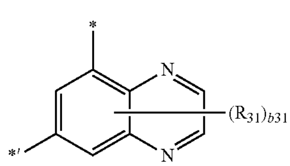
-continued
3-93
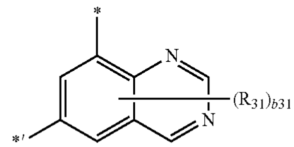
3-94
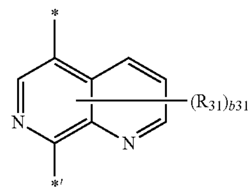
3-95
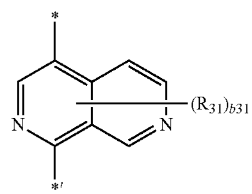
3-96
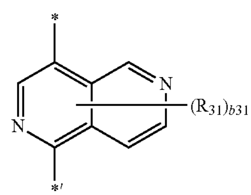
3-97
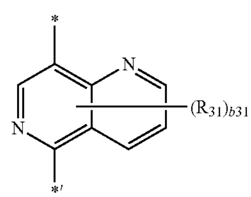
3-98
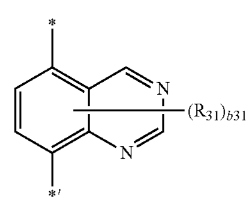
3-99
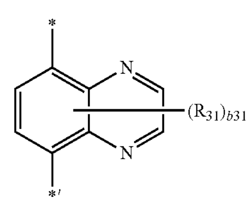
3-100
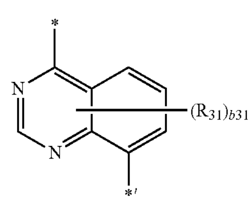

-continued
3-101
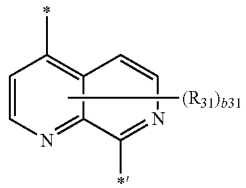
3-102
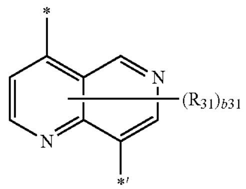
3-103
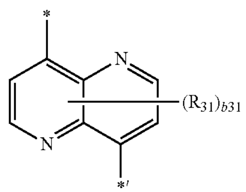
3-104
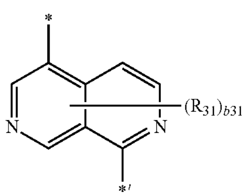
3-105
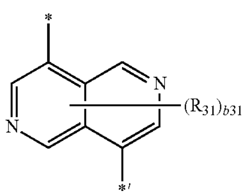
3-106
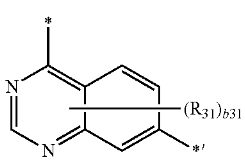
3-107
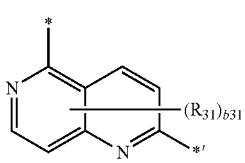
3-108
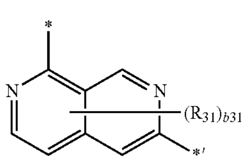
3-109
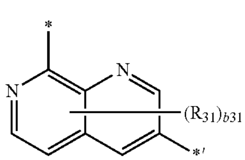
-continued
3-110
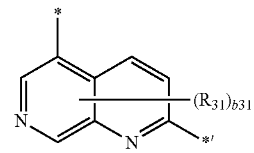
3-111
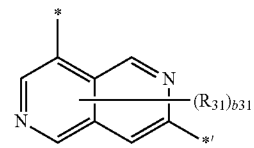
3-112
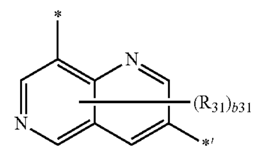
3-113
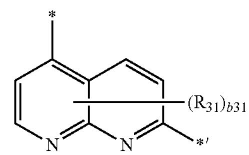
3-114
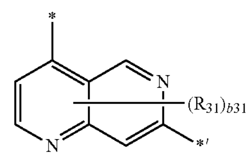
3-115
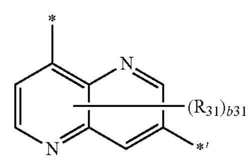
3-116
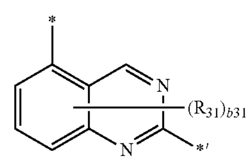
3-117
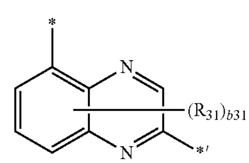
3-118
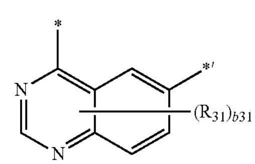
3-119
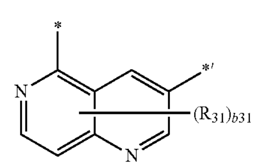

-continued
3-120
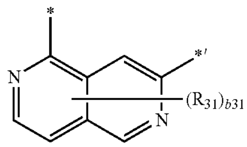
3-121
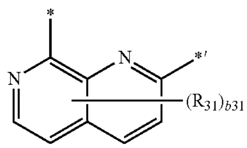
3-122
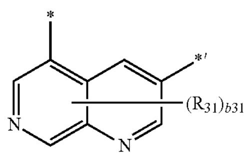
3-123
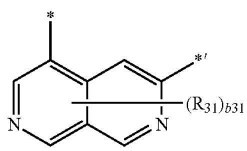
3-124
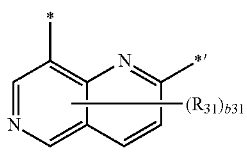
3-125
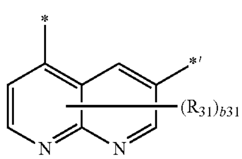
3-126
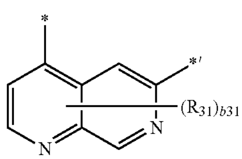
3-127
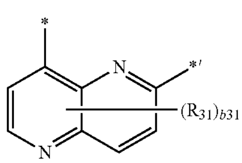
3-128
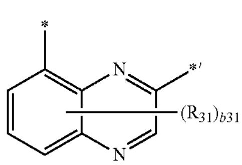
3-129
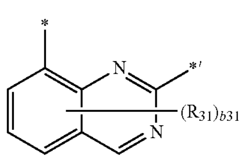
-continued
3-130
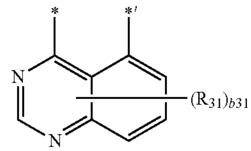
3-131
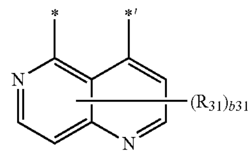
3-132
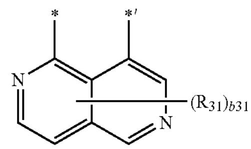
3-133
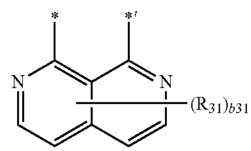
3-134
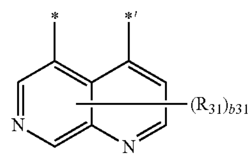
3-135
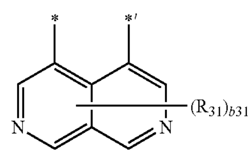
3-136
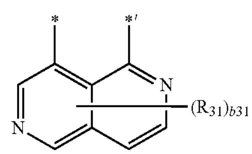
3-137
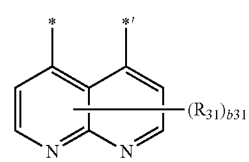
3-138
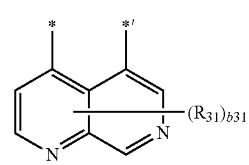
3-139
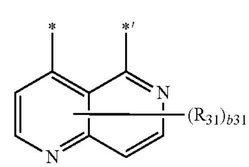

-continued
3-140
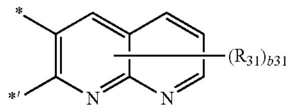
3-141
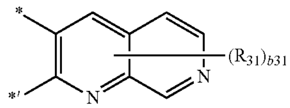
3-142
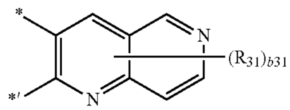
3-143
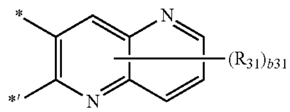
3-144
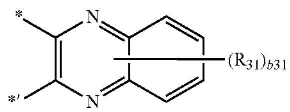
3-145
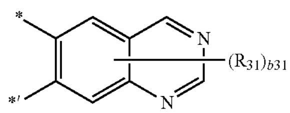
3-146
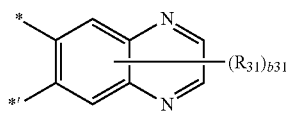
3-147
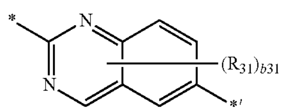
3-148
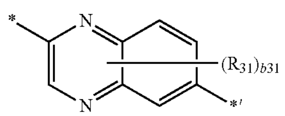
3-149
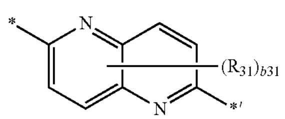
3-150
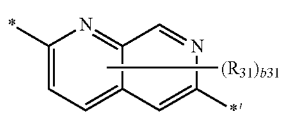
3-151
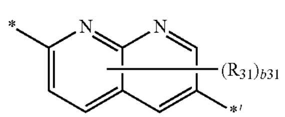
3-152
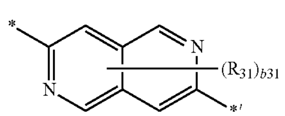
-continued
3-153
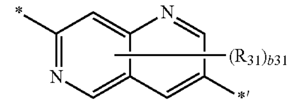
3-154
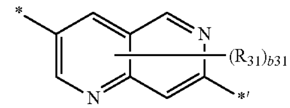
3-155
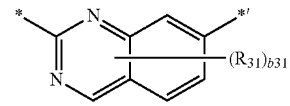
3-156
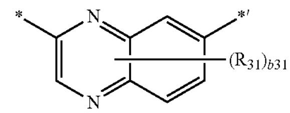
3-157
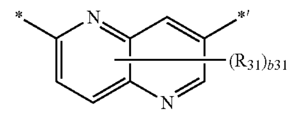
3-158
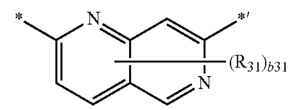
3-159
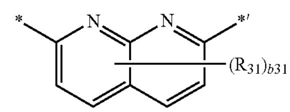
3-160
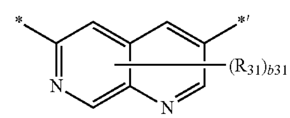
3-161
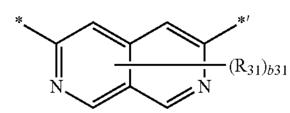
3-162
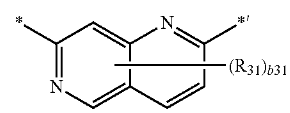
3-163
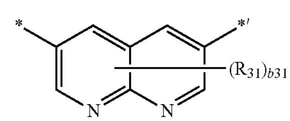
3-164
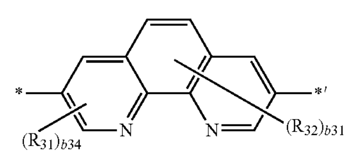
3-165
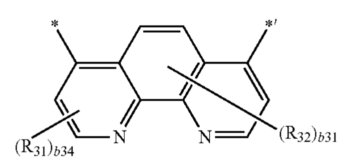

-continued 3-166

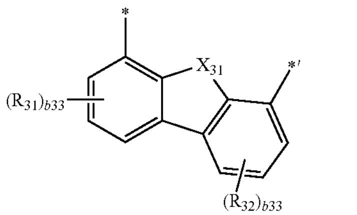

3-167

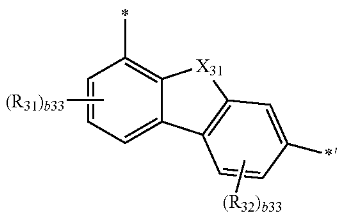

3-168

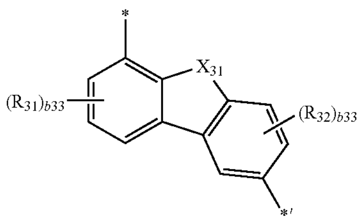

3-169

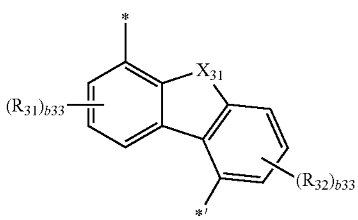

3-170

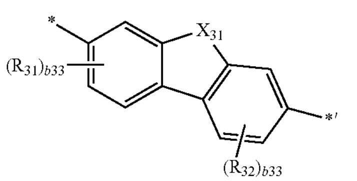

3-171

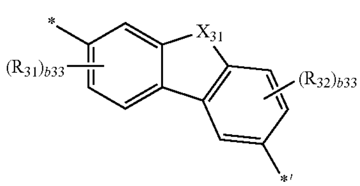

3-172

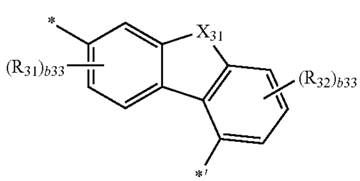

3-173

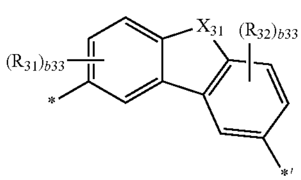

-continued 3-174

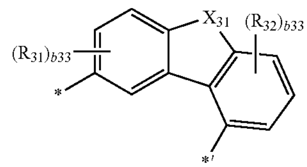

3-175

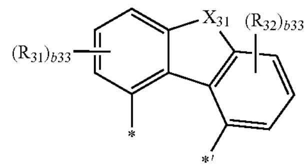

3-176

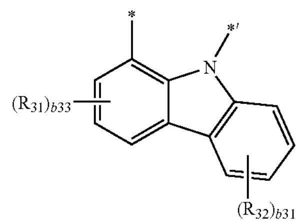

3-177

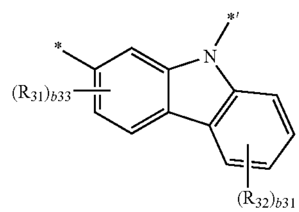

3-178

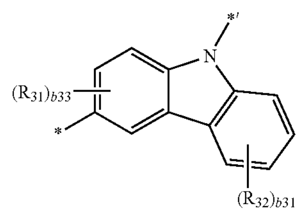

3-179

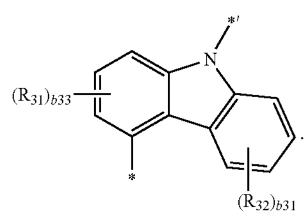

In Formulae 3-1 to 3-179, $X_{31}$ may be selected from O, S, $N(R_{33})$, and $C(R_{33})(R_{34})$;

$R_{31}$ to $R_{34}$ may each independently be selected from hydrogen, deuterium, —F, —Cl, —Br, —I, a cyano group, a methyl group, an ethyl group, an n-propyl group, an iso-propyl group, a tert-butyl group, a methoxy group, an ethoxy group, n-propoxy group, iso-propoxy group, tert-butoxy group, a cyclopropyl group, a cyclobutyl group, a cyclopentyl group, a cyclohexyl group, a phenyl group, a biphenyl group, a terphenyl group, a naphthyl group, a pyridinyl group, a pyrazinyl group, a pyrimidinyl group, a pyridazinyl group, a quinolinyl group, an isoquinolinyl group, a triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$;

$Q_{31}$ to $Q_{33}$ may each independently be selected from a hydrogen, a methyl group, an ethyl group, an n-propyl group, an iso-propyl group, a tert-butyl group, a phenyl group, a naphthyl group, a biphenyl group, and a terphenyl group;

b31 may be selected from 1, 2, 3, and 4;

b32 may be selected from 1, 2, 3, 4, 5, and 6;

b33 may be selected from 1, 2, and 3;

b34 may be selected from 1 and 2;

b35 may be selected from 1, 2, 3, 4, and 5; and

* and *' may each indicate a binding site to a neighboring atom.

a21 in Formula 2 indicates the number of $L_{21}$(s), and a21 may be selected from 0, 1, 2, and 3. When a21 is 0, $(L_{21})_{a21}$ indicates' a single bond. When a21 is two or more, a plurality of $L_{21}$(s) may be identical to or different from each other. a22 to a26 in Formula 2 may each independently be the same as described herein in connection with a21, and a22 to a26 may each independently be selected from 0, 1, 2, and 3.

In one or more embodiments, a21 to a26 in Formula 2 may each independently be selected from 0 and 1, but embodiments of the present disclosure are not limited thereto.

In one or more embodiments, $L_{23}$ to $L_{26}$ in Formula 2 may each independently be selected from groups represented by Formulae 3-1 to 3-15, and a23 to a26 may each independently be selected from 0 and 1, but embodiments of the present disclosure are not limited thereto.

$R_{21}$ to $R_{24}$ in Formula 2 may each independently be selected from a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

wherein $R_{21}$ and $R_{22}$ may optionally be linked (e.g., coupled) to form a saturated or unsaturated ring, and $R_{23}$ and $R_{24}$ may optionally be linked (e.g., coupled) to form a saturated or unsaturated ring.

In one or more embodiments, $R_{21}$ to $R_{24}$ in Formula 2 may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and —Si($Q_{31}$)($Q_{32}$)($Q_{33}$); and —N($Q_1$)($Q_2$) and —Si($Q_1$)($Q_2$)($Q_3$), wherein $Q_1$ to $Q_3$ and $Q_{31}$ to $Q_{33}$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments of the present disclosure are not limited thereto.

In one or more embodiments, $R_{21}$ to $R_{24}$ in Formula 2 may each independently be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a triphenylenyl group, a pyrenyl group, a tetraphenyl group, a chrysenyl group, a pyrrolyl group, a thiophenyl group, a furanyl group, a pyridinyl group, a pyridinyl group substituted with deuterium, a pyridinyl group substituted with a methyl group, a pyrazinyl group, a pyrimidinyl group, a quinolinyl group, an isoquinolinyl group, a benzoquinolinyl group, a benzoisoquinolinyl group, a carbazolyl group, a carbolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazinyl group, a dibenzofuranyl group, a dibenzothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and —Si($Q_{31}$)($Q_{32}$)($Q_{33}$); and —N($Q_1$)($Q_2$) and —Si($Q_1$)($Q_2$)($Q_3$), wherein $Q_1$ to $Q_3$ and $Q_{31}$ to $Q_{33}$ may each independently be selected from a $C_1$-$C_{20}$ alkyl group, a $C_6$-$C_{60}$ aryl group, a biphenyl group, and a terphenyl group, but embodiments of the present disclosure are not limited thereto.

In one or more embodiments, $R_{21}$ to $R_{24}$ in Formula 2 may each independently be selected from the group consisting of:

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, $—CDH_2$, $—CD_2H$, $—CD_3$, $—CFH_2$, $—CF_2H$, $—CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_5$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, $—N(Q_{31})(Q_{32})$, and $—Si(Q_{31})(Q_{32})(Q_{33})$; and $—N(Q_1)(Q_2)$ and $—Si(Q_1)(Q_2)(Q_3)$, wherein $Q_1$ to $Q_3$ and $Q_{31}$ to $Q_{33}$ may each independently be selected from a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neo-pentyl group, a phenyl group, a biphenyl group, a terphenyl group, and a naphthyl group, but embodiments of the present disclosure are not limited thereto.

In one or more embodiments, $R_{21}$ to $R_{24}$ in Formula 2 may each independently be selected from groups represented by Formulae 5-1 to 5-128, but embodiments of the present disclosure are not limited thereto.

$R_{201}$ to $R_{207}$ in Formulae 2A to 2F may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$;

wherein $R_{204}$ and $R_{205}$ may optionally be linked (e.g., coupled) to form a saturated or unsaturated ring, and $R_{206}$ and $R_{207}$ may optionally be linked (e.g., coupled) to form a saturated or unsaturated ring, and $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In one or more embodiments, $R_{201}$ to $R_{207}$ in Formulae 2A to 2F may each independently be selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$);

$Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and $R_{204}$ and $R_{205}$ may optionally be linked (e.g., coupled) to form a saturated or unsaturated ring, and $R_{206}$ and $R_{207}$ may optionally be linked (e.g., coupled) to form a saturated or unsaturated ring, but embodiments of the present disclosure are not limited thereto.

In one or more embodiments, $R_{201}$ to $R_{207}$ in Formulae 2A to 2F may each independently be selected from the group consisting of:

hydrogen, deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_1$)($Q_2$), and —Si($Q_1$)($Q_2$)($Q_3$), and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group;

wherein $Q_1$ to $Q_3$ may each independently be selected from a $C_1$-$C_{60}$ alkyl group, a $C_6$-$C_{60}$ aryl group, a biphenyl group, and a terphenyl group; and $R_{204}$ and $R_{205}$ may optionally be linked (e.g., coupled) to form a saturated or unsaturated ring, and $R_{206}$ and $R_{207}$ may optionally be linked (e.g., coupled) to form a saturated or unsaturated ring, but embodiments of the present disclosure are not limited thereto.

In one or more embodiments, $R_{201}$ to $R_{207}$ in Formulae 2A to 2F may each independently be selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —N($Q_1$)($Q_2$), and —Si($Q_1$)($Q_2$)($Q_3$), and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group;

wherein $Q_1$ to $Q_3$ may each independently be selected from a methyl group, an ethyl group, an n-propyl group, an iso-propyl group, and a phenyl group; and $R_{204}$ and $R_{205}$ may optionally be linked (e.g., coupled) to form a saturated or unsaturated ring, and $R_{206}$ and $R_{207}$ may optionally be linked (e.g., coupled) to form a saturated or unsaturated ring, but embodiments of the present disclosure are not limited thereto.

In one or more embodiments, when $X_{22}$ in Formulae 2A to 2F is C($R_{204}$)($R_{205}$), $R_{204}$ and $R_{205}$ may optionally be linked (e.g., coupled) to form a group represented by one selected from Formulae 9-1 and 9-2; and when $X_{23}$ is C($R_{206}$)($R_{207}$), $R_{206}$ and $R_{207}$ may optionally be linked (e.g., coupled) to form a group represented by one selected from Formulae 9-1 and 9-2, but embodiments of the present disclosure are not limited thereto:

Formula 9-1

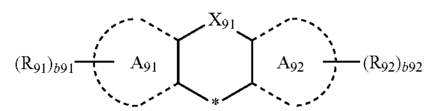

Formula 9-2

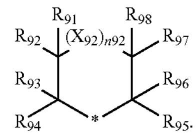

In Formulae 9-1 and 9-2, $X_{91}$ may be selected from a single bond, O, S, Se, C($R_{93}$)($R_{94}$), Si($R_{93}$)($R_{94}$), and Ge($R_{93}$)($R_{94}$);

$X_{92}$ may be C($R_{99}$)($R_{100}$);

n92 may be selected from 0, 1, and 2;

$A_{91}$ and $A_{92}$ may each independently be selected from a $C_6$-$C_{20}$ arene group and a $C_1$-$C_{20}$ hetero arene group;

$R_{91}$ to $R_{100}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$);

$Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group;

b91 and b92 may each independently be selected from 1, 2, 3, 4, 5, 6, 7, 8, 9, and 10; and

* may indicate a carbon atom in Formulae 2A to 2F.

In one or more embodiments, n92 in Formulae 9-1 and 9-2 may be selected from 0 and 1, but embodiments of the present disclosure are not limited thereto. When n92 is 0, $(X_{92})_{n92}$ indicates a single bond.

In one or more embodiments, $A_{91}$ and $A_{92}$ in Formulae 9-1 and 9-2 may each independently be selected from a benzene group, a naphthalene group, a pyridine group, a quinoline group, and an isoquinoline group, but embodiments of the present disclosure are not limited thereto.

In one or more embodiments, $A_{91}$ and $A_{92}$ in Formulae 9-1 and 9-2 may each independently be selected from a benzene group, a naphthalene group, and a pyridine group, but embodiments of the present disclosure are not limited thereto.

In one or more embodiments, $R_{91}$ to $R_{100}$ in Formulae 9-1 and 9-2 may each independently be selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$), wherein $Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments of the present disclosure are not limited thereto.

In one or more embodiments, $R_{91}$ to $R_{100}$ in Formulae 9-1 and 9-2 may each independently be selected from the group consisting of:

hydrogen, deuterium, —F, —Cl, —Br, —I, a cyano group, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_1$)($Q_2$), and —Si($Q_1$)($Q_2$)($Q_3$); and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_1$-$C_{20}$ alkyl group, a phenyl group, a biphenyl group, a terphenyl group, a naphthyl group, a pyridinyl group, a pyrimidinyl group, a pyridazinyl group, and a triazinyl group, wherein $Q_1$ to $Q_3$ may each independently be selected from a $C_1$-$C_{60}$ alkyl group, a $C_6$-$C_{60}$ aryl group, a biphenyl group, and a terphenyl group, but embodiments of the present disclosure are not limited thereto.

In one or more embodiments, $R_{91}$ to $R_{100}$ in Formulae 9-1 and 9-2 may each independently be selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —N($Q_1$)($Q_2$), and —Si($Q_1$)($Q_2$)($Q_3$), and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group, wherein $Q_1$ to $Q_3$ may each independently be selected from a methyl group, an ethyl group, an n-propyl group, an iso-propyl group, and a phenyl group, but embodiments of the present disclosure are not limited thereto.

b201 in Formulae 2A to 2F indicates the number of $R_{201}$ (s), and b201 may be selected from 1, 2, 3, 4, 5, 6, 7, 8, 9, and 10. When b201 is 2 or more, a plurality of $R_{201}$(s) may be identical to or different from each other. b202 and b203 in Formulae 2A to 2F may each independently be the same as described herein in connection with b201, and b202 and b203 may each independently be selected from 1, 2, 3, 4, 5, 6, 7, 8, 9, and 10.

In one or more embodiments, the group represented by Formula 2C may be represented by one selected from Formulae 2C-1 to 2C-5, the group represented by Formula 2D may be represented by one selected from Formulae 2D-1 to 2D-3, the group represented by Formula 2E may be represented by one selected from Formulae 2E-1 to 2E-5, and the group represented by Formula 2F may be represented by one selected from Formulae 2F-1 to 2F-3, but embodiments of these groups are not limited thereto:

2C-1

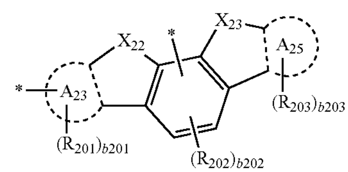

2C-2

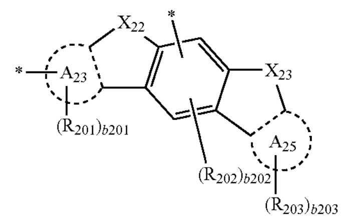

2C-3

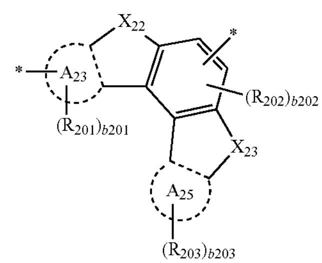

2C-4

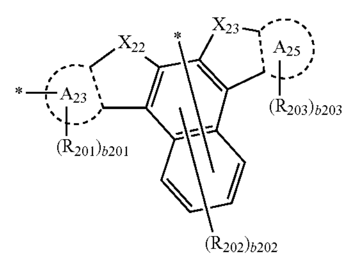

2C-5

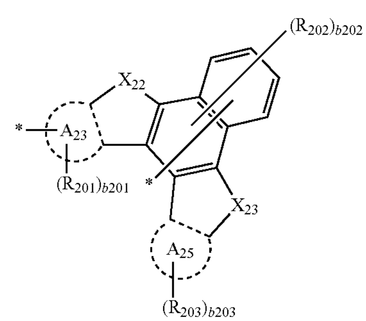

-continued 2D-1

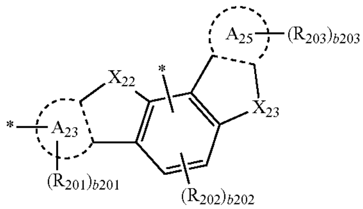

2D-2

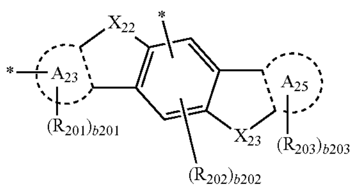

2D-3

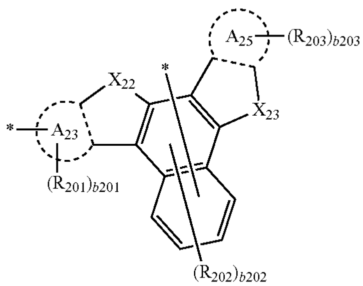

2E-1

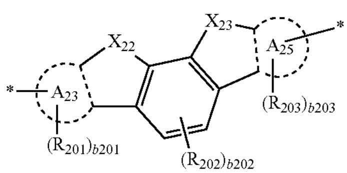

2E-2

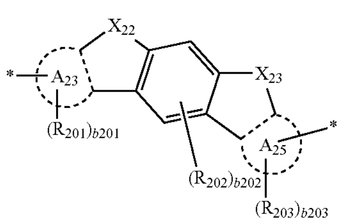

2E-3

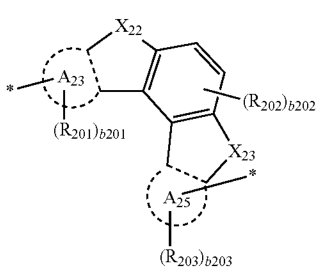

-continued 2E-4

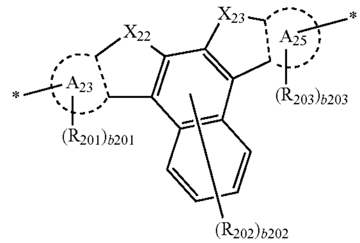

2E-5

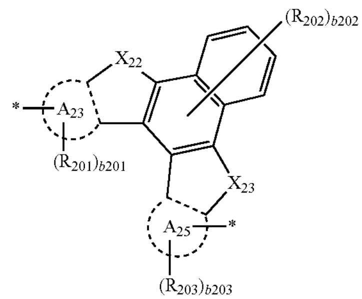

2F-1

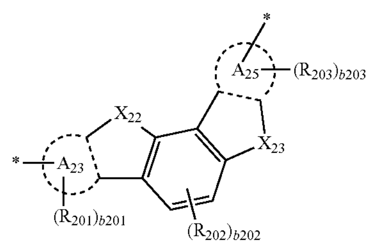

2F-2

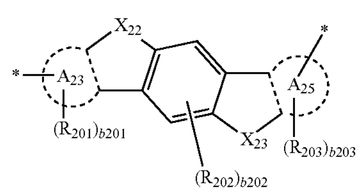

2F-3

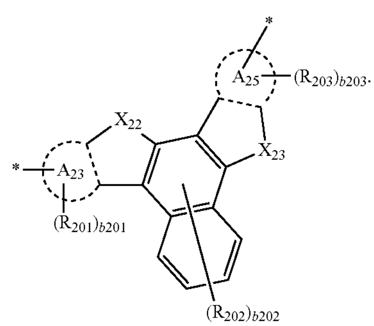

In Formulae 2C-1 to 2C-5, 2D-1 to 2D-3, 2E-1 to 2E-5, and 2F-1 to 2F-3, $X_{22}$, $X_{23}$, $A_{23}$, $A_{25}$, $R_{201}$ to $R_{203}$, and b201 to b203 may each independently be the same as described herein in connection with Formulae 2C to 2F; and

* may indicate a binding site to a neighboring atom.

In one embodiment, the first compound represented by Formula 1 may be selected from Compounds H1 to H185, but embodiments of the present disclosure are not limited thereto:

H1
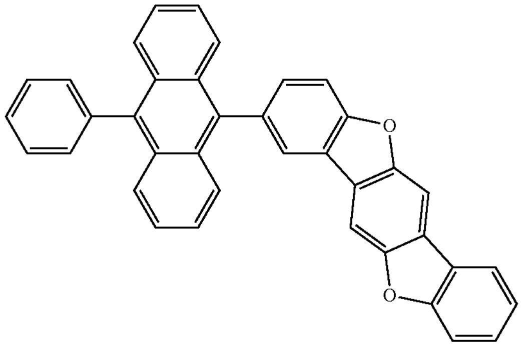
H2
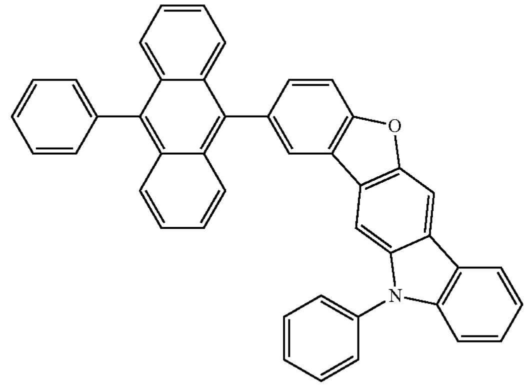
H3
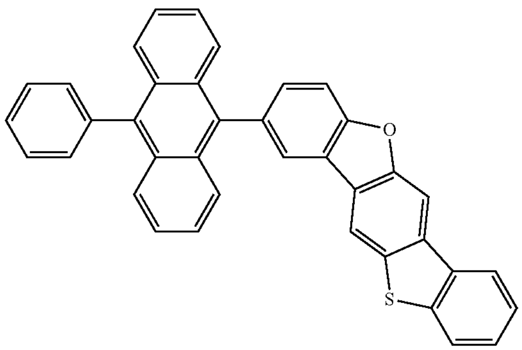
H4
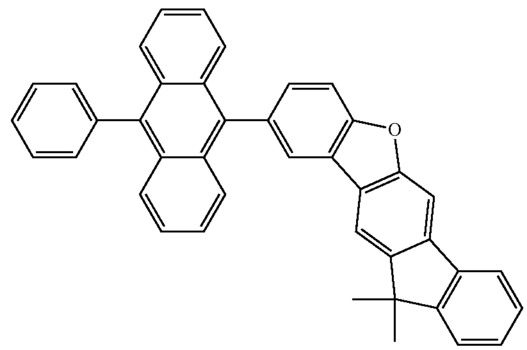
H5
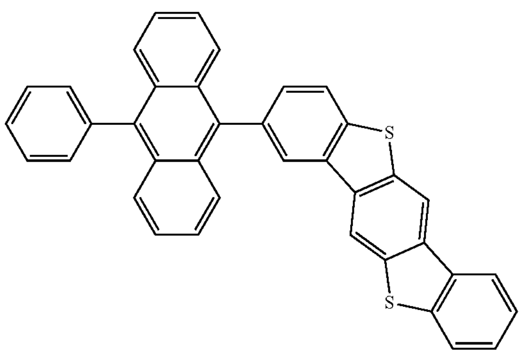
H6
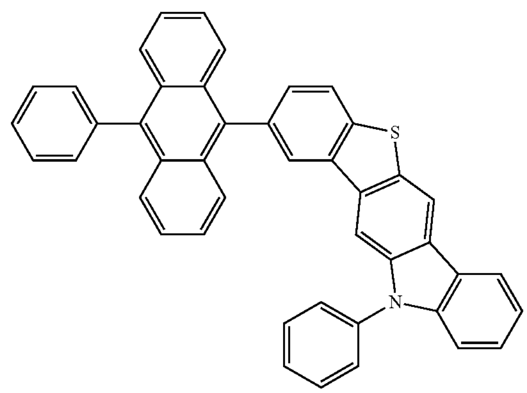
H7
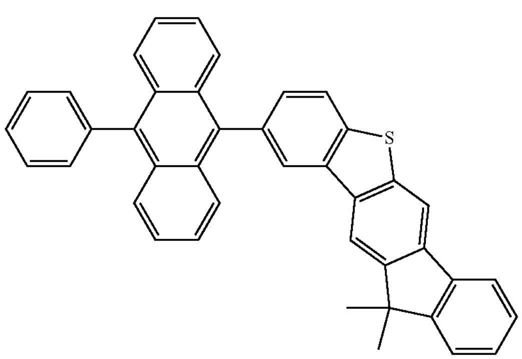
H8
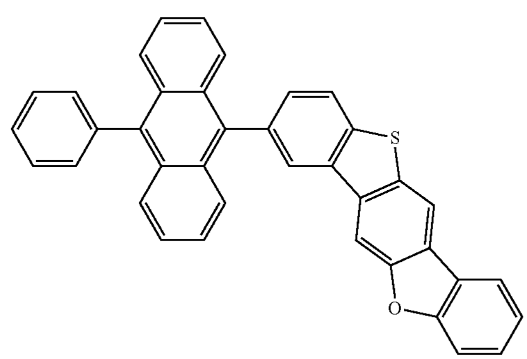

-continued
H9
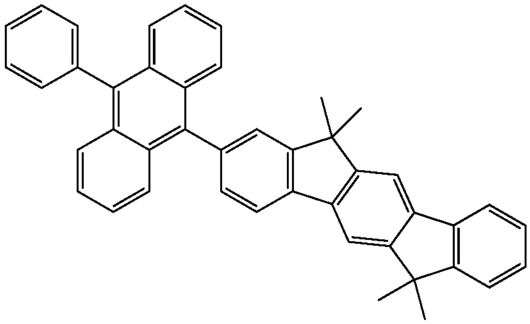
H10
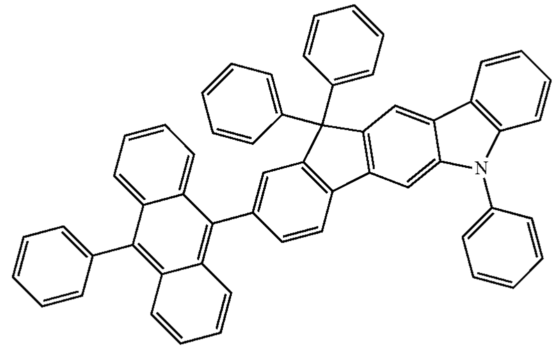
H11
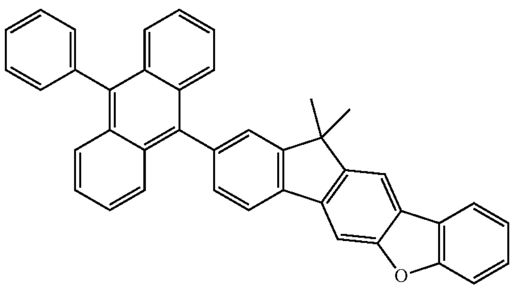
H12
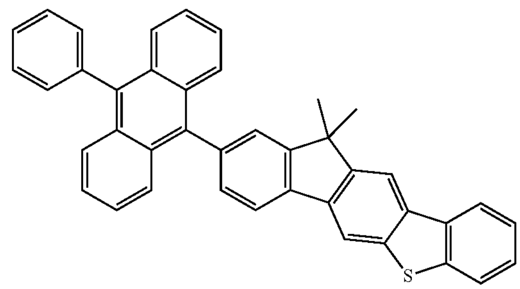
H13
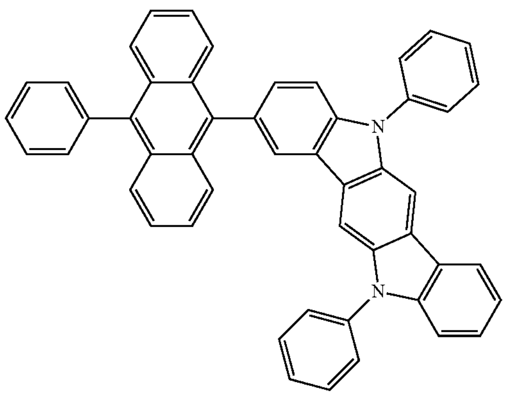
H14
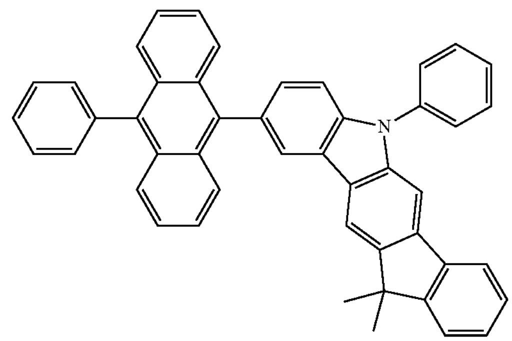
H15
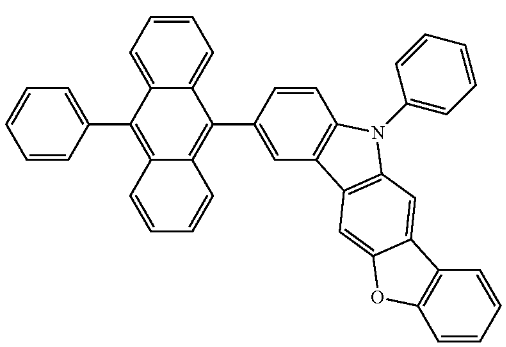
H16
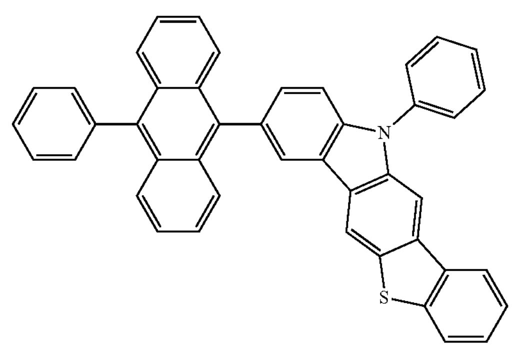

-continued
H17
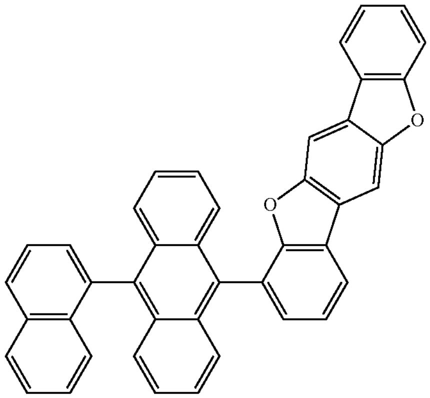
H18
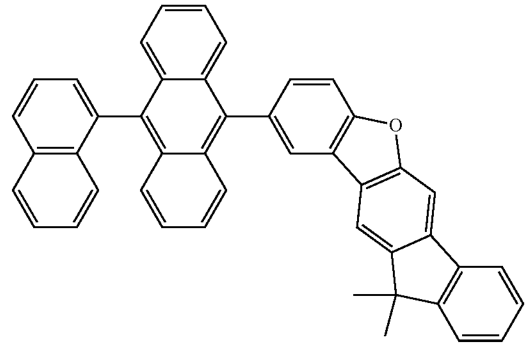
H19
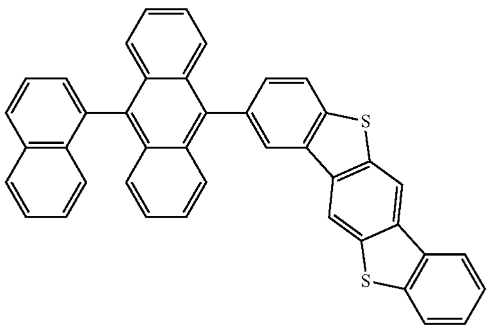
H20
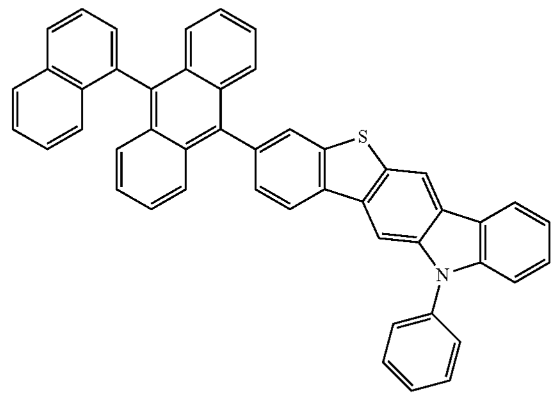
H21
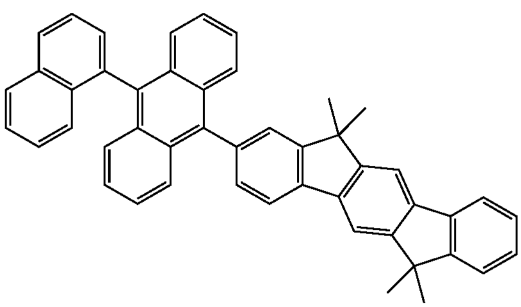
H22
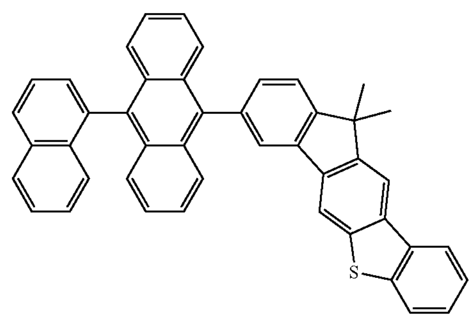
H23
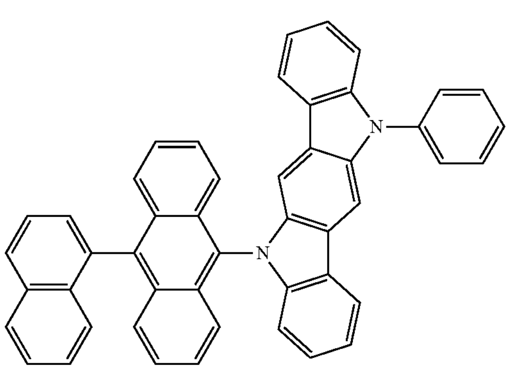
H24
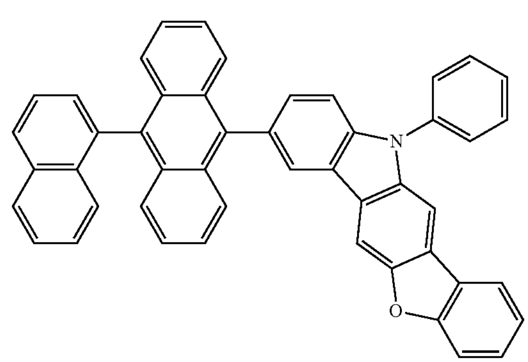

-continued
H25
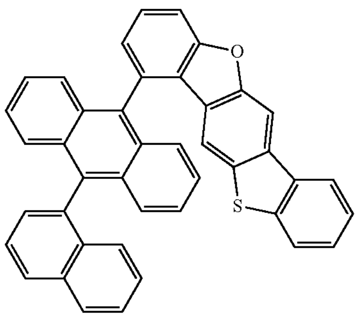
H26
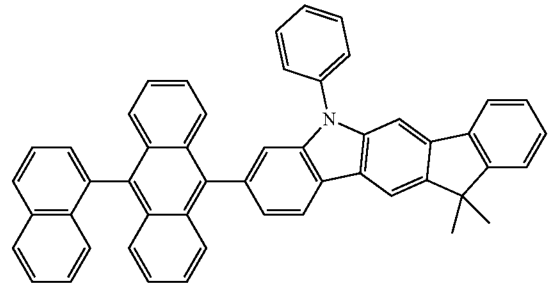
H27
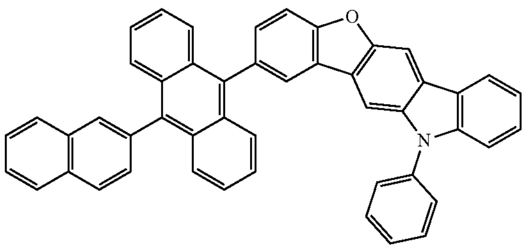
H28
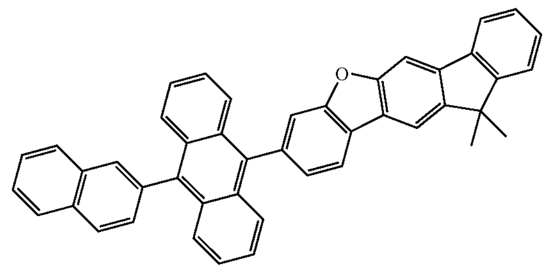
H29
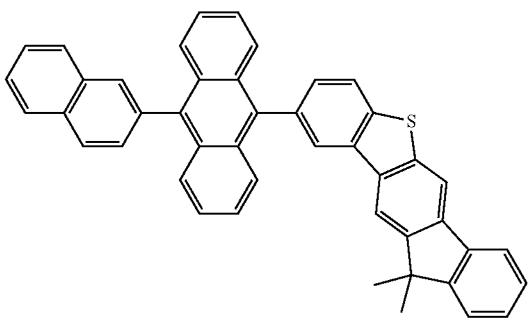
H30
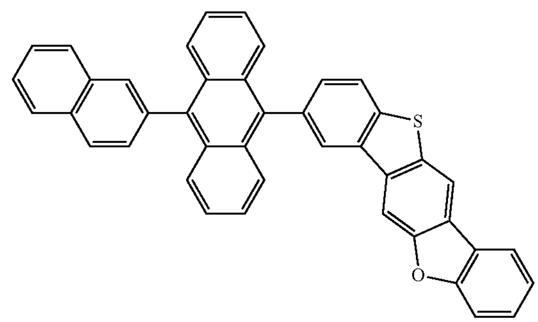
H31
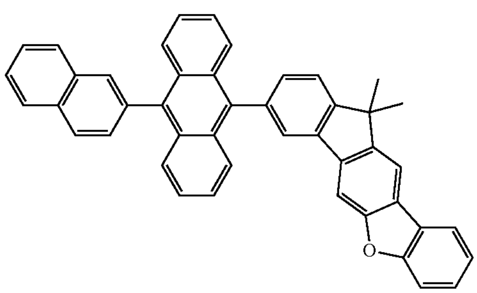
H32
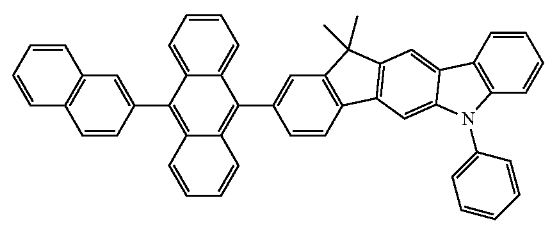
H33
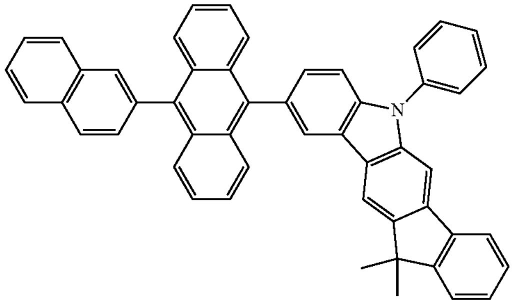
H34
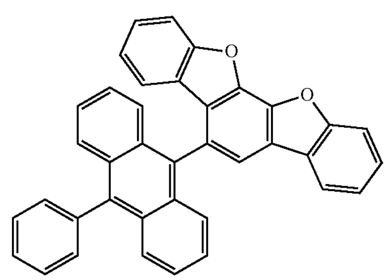

-continued
H35
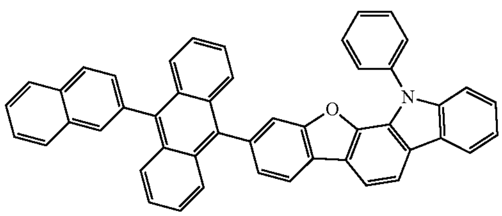
H36
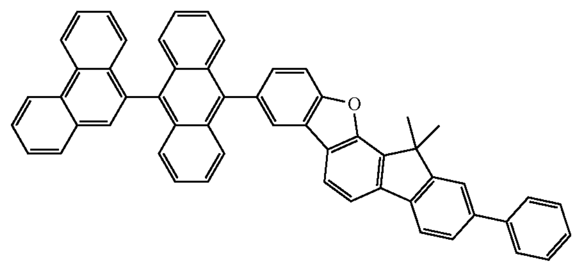
H37
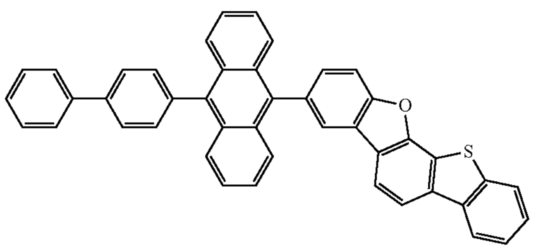
H38
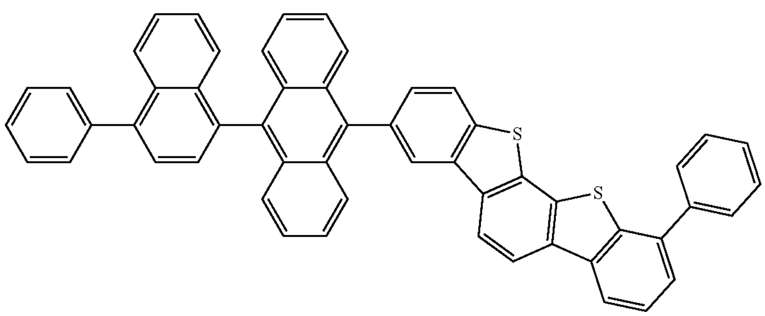
H39
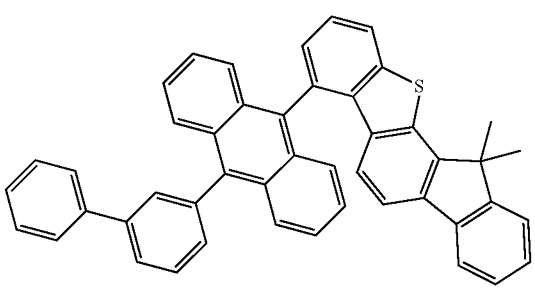
H40
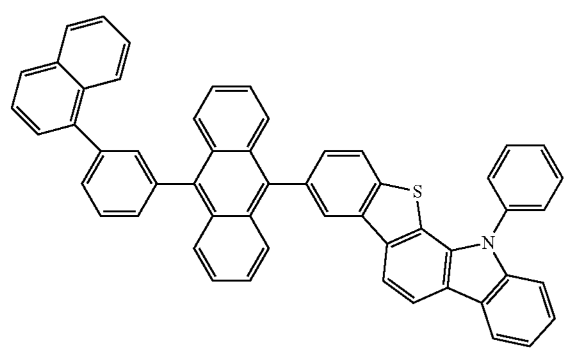
H41
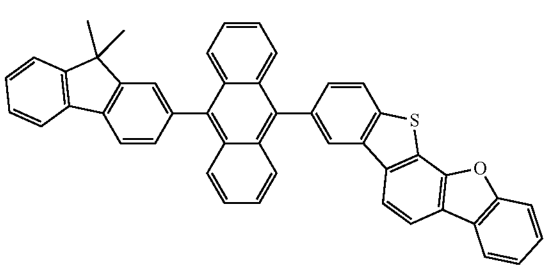
H42
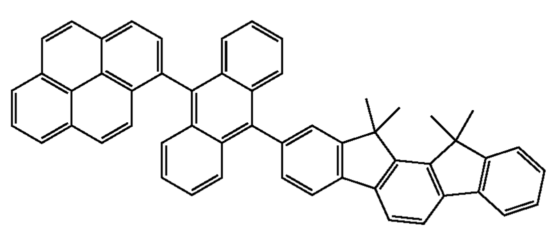

-continued
H43
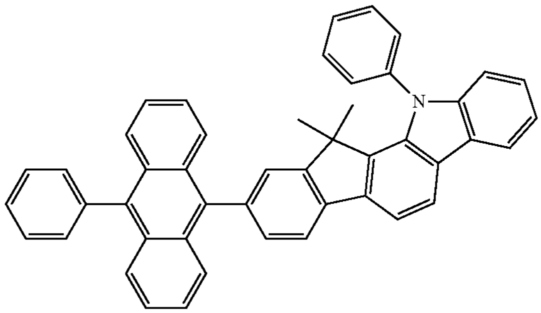
H44
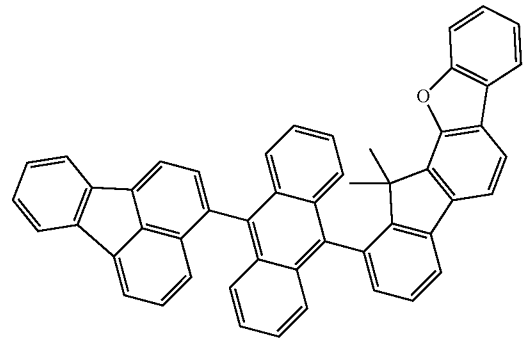
H45
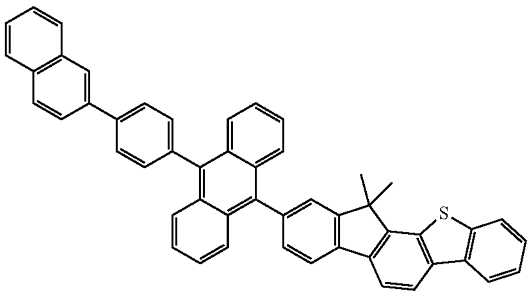
H46
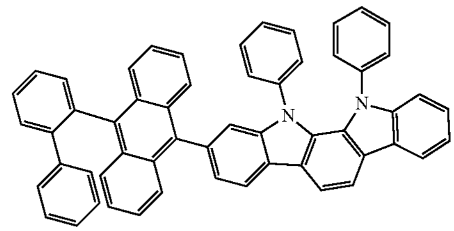
H47
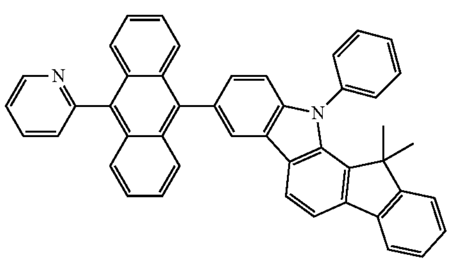
H48
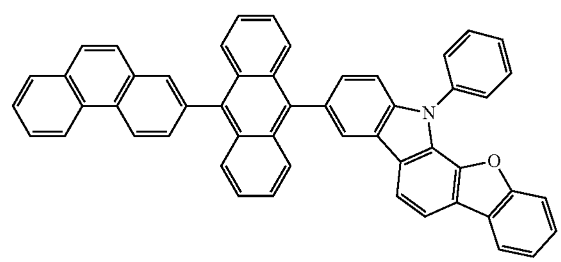
H49
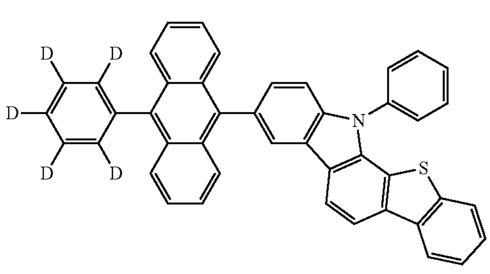
H50
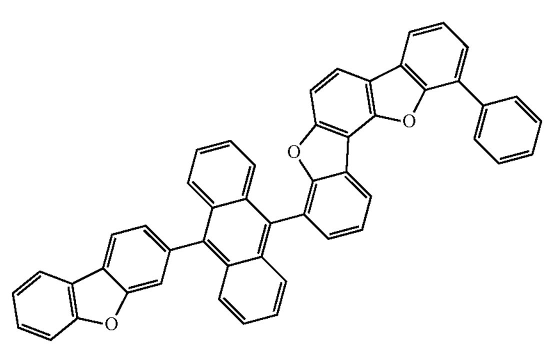

-continued
H51
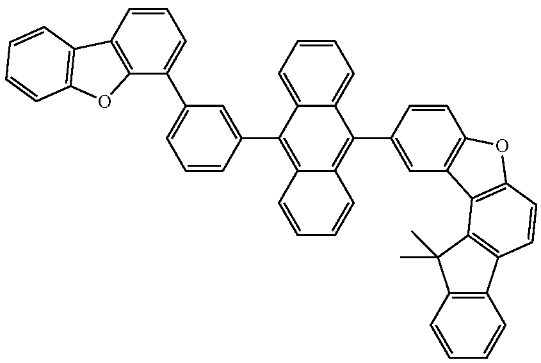
H52
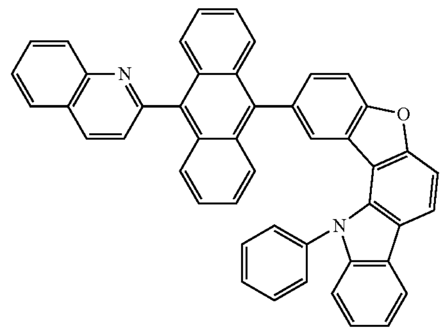
H53
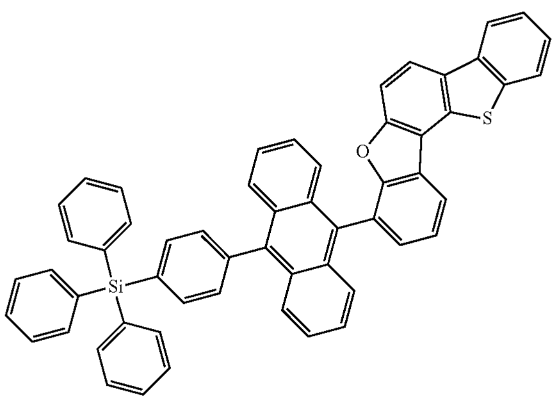
H54
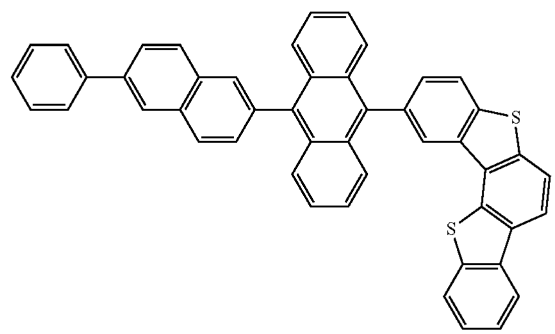
H55
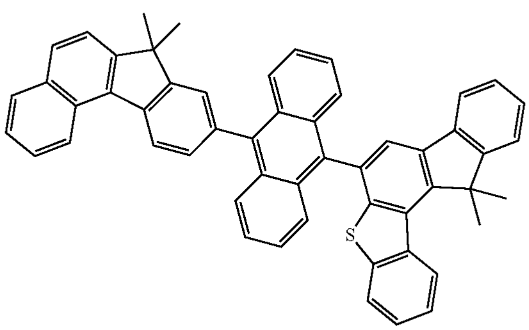
H56
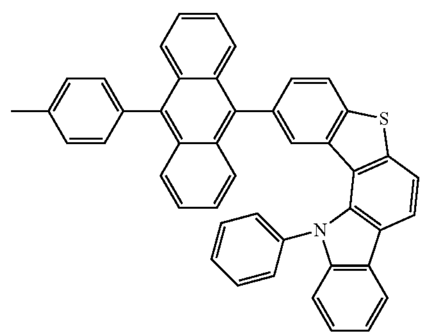
H57
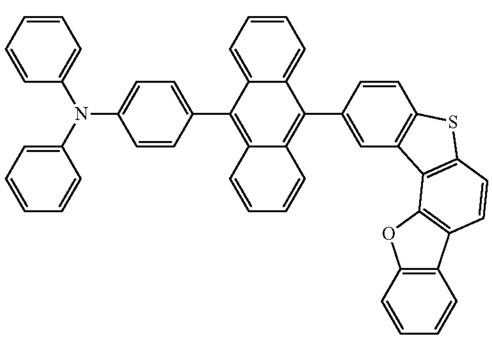
H58
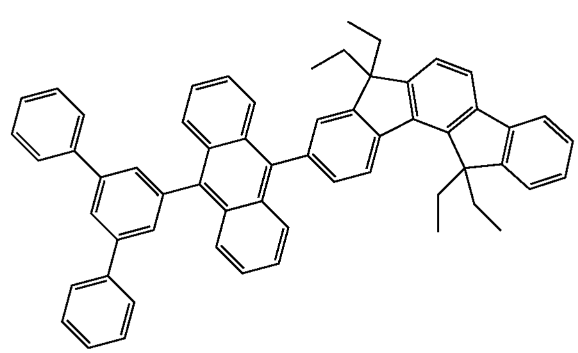

-continued
H59
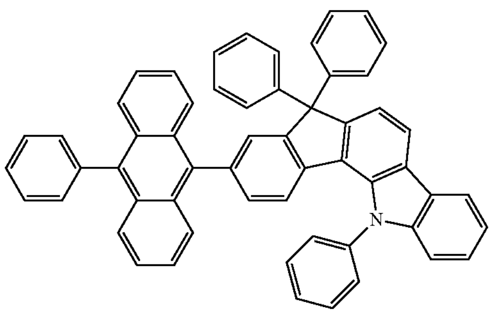
H60
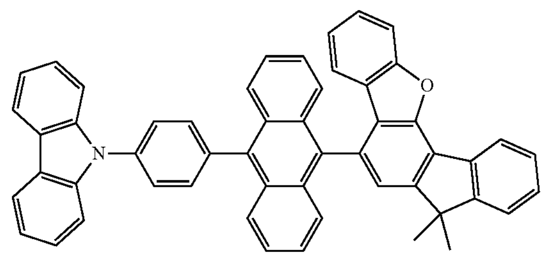
H61
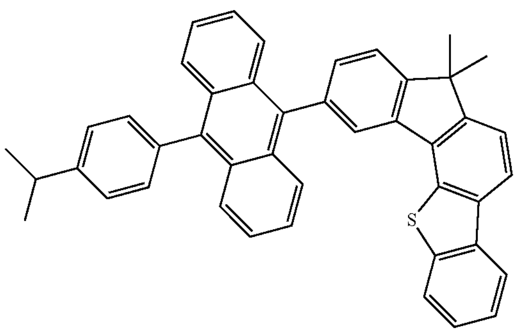
H62
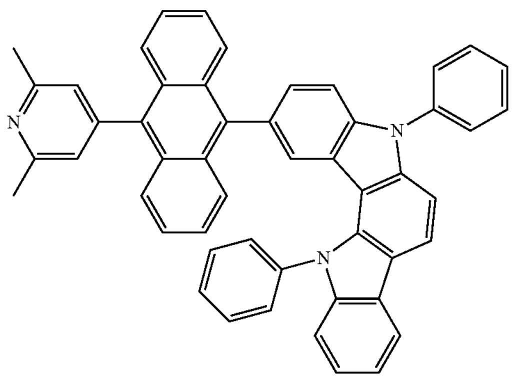
H63
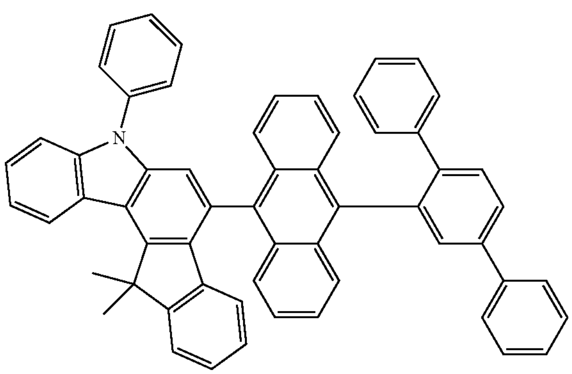
H64
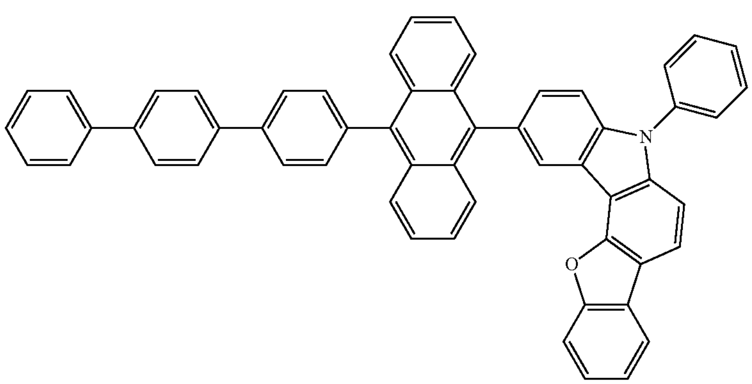

-continued
H65
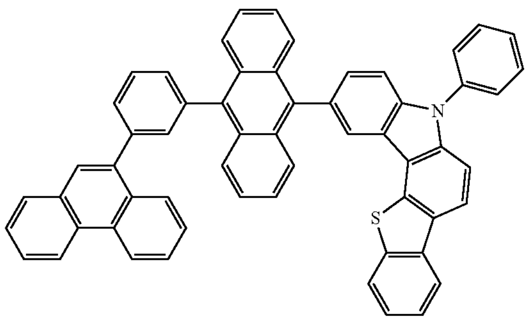
H66
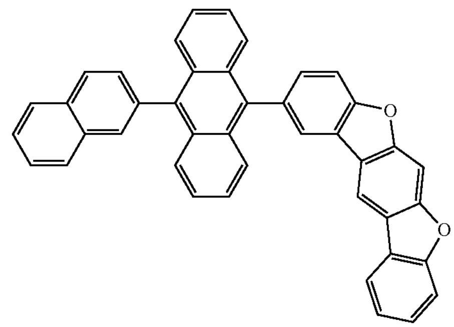
H67
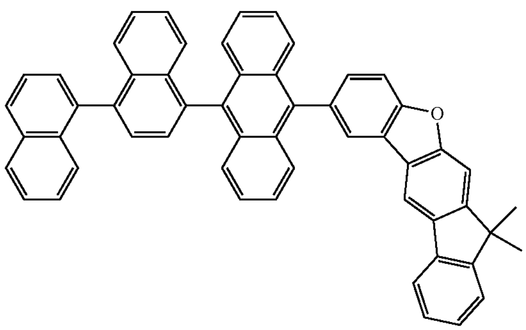
H68
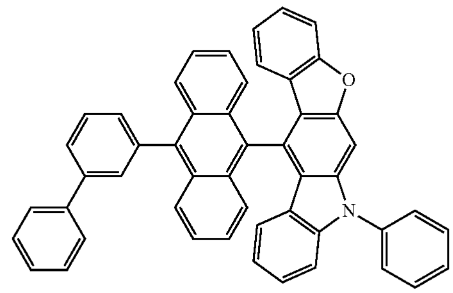
H69
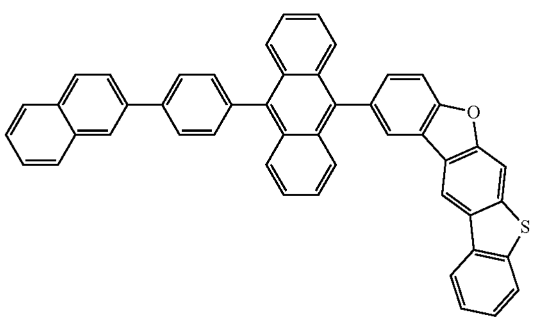
H70
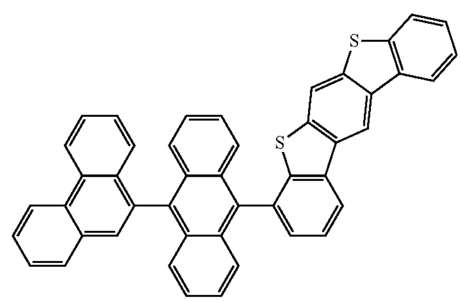
H71
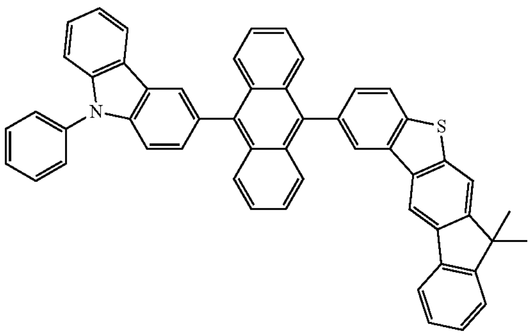
H72
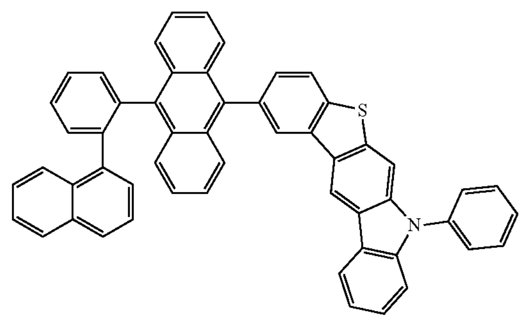

-continued
H73
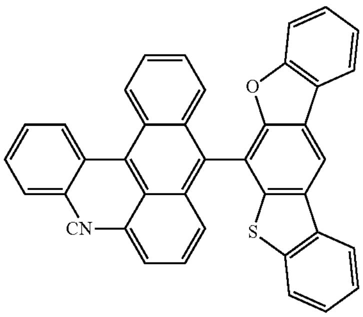
H74
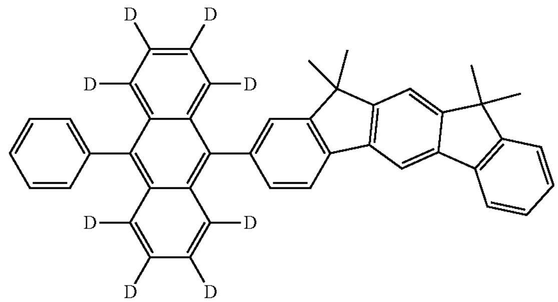
H75
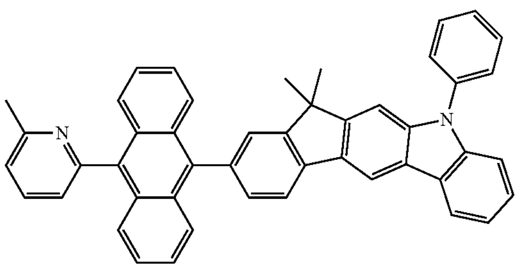
H76
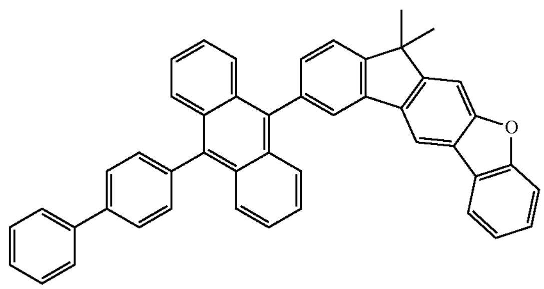
H77
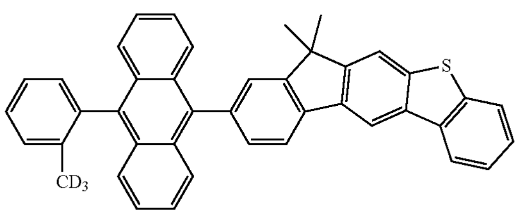
H78
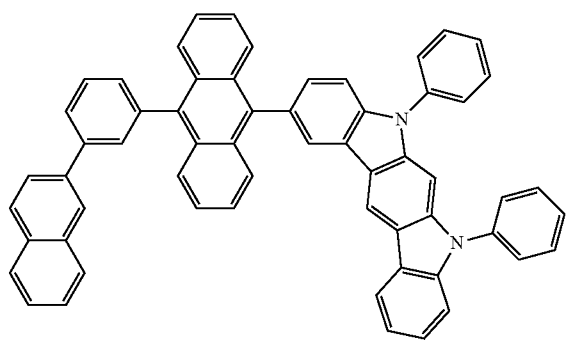
H79
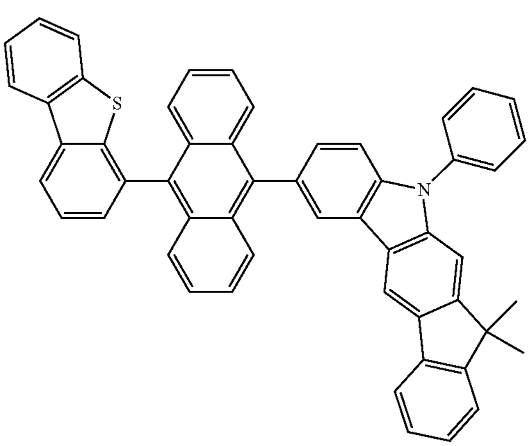
H80
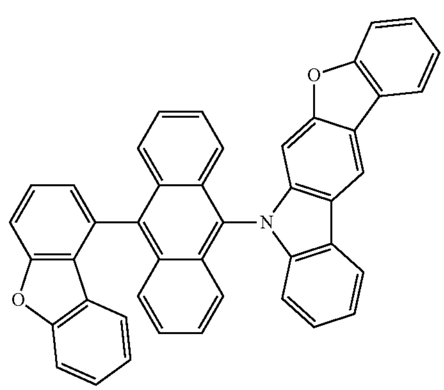

-continued
H81
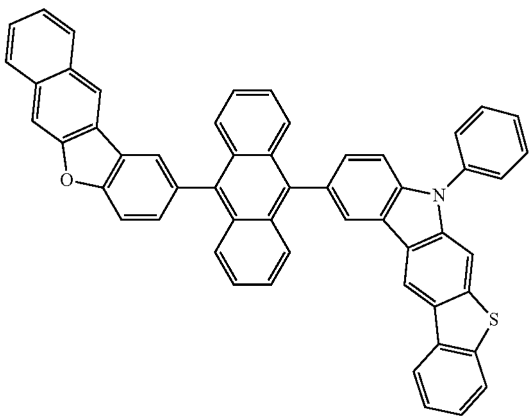
H82
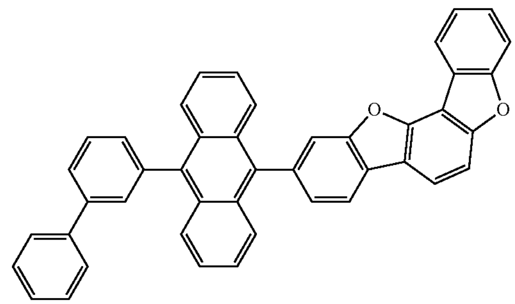
H83
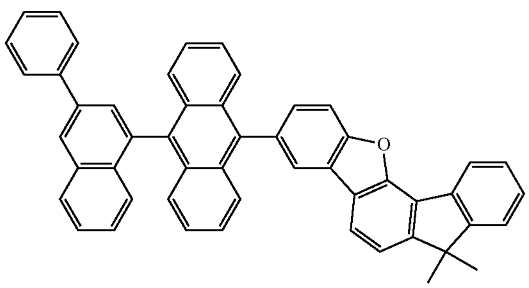
H84
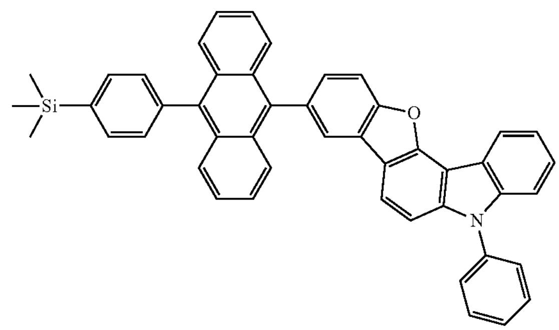
H85
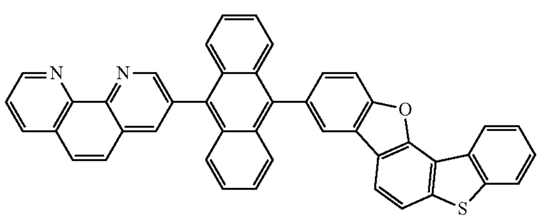
H86
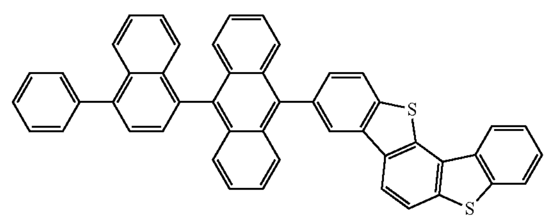
H87
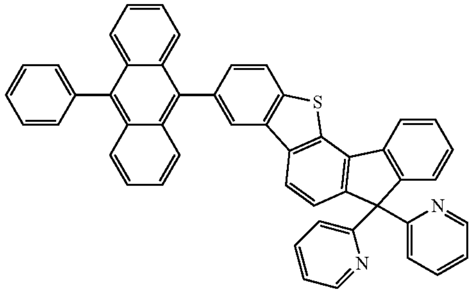
H88
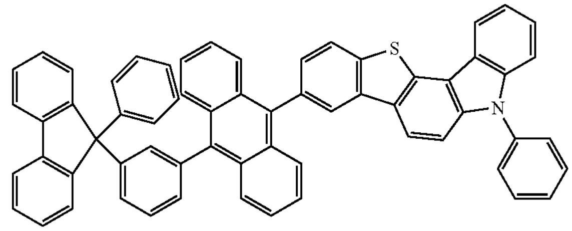

-continued
H89
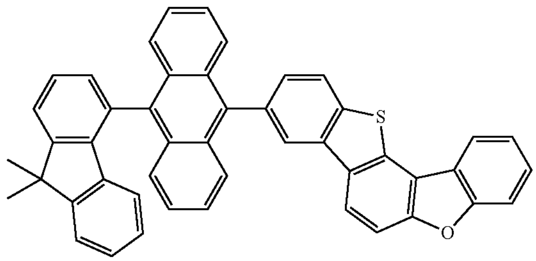
H90
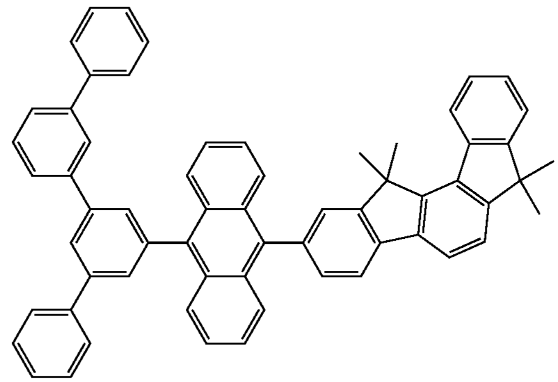
H91
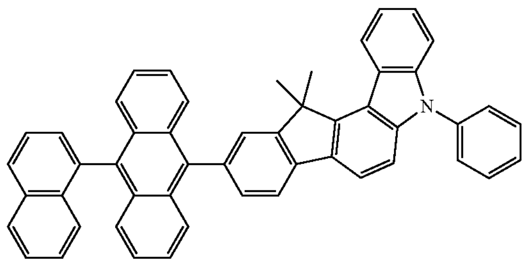
H92
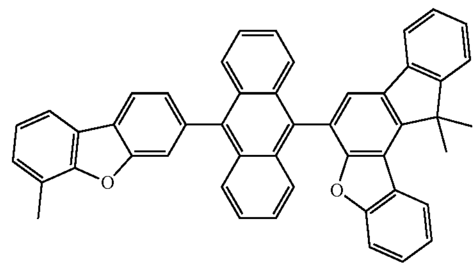
H93
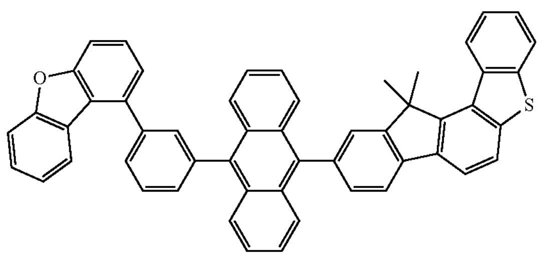
H94
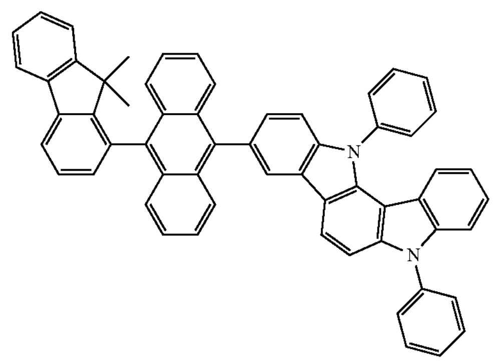
H95
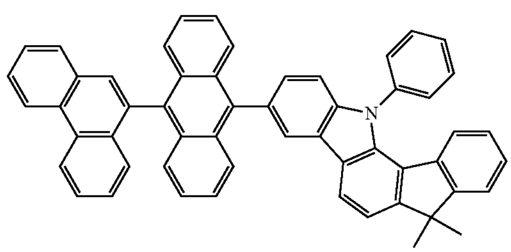
H96
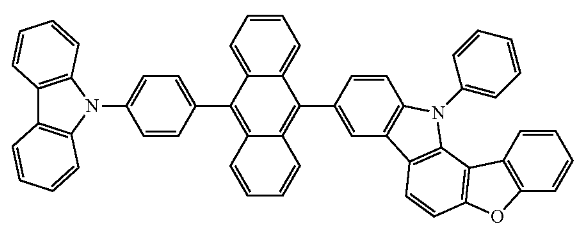
H97
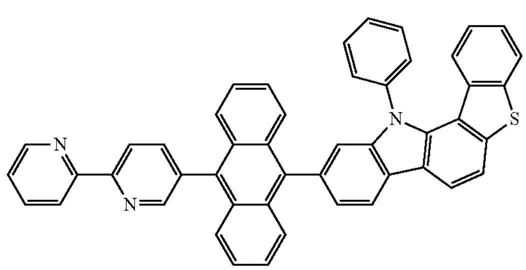
H98
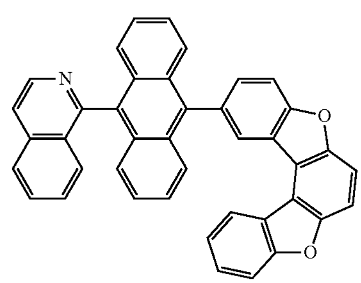

-continued
H99
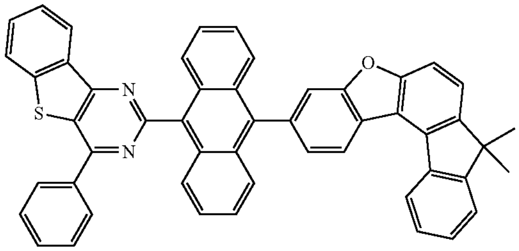
H100
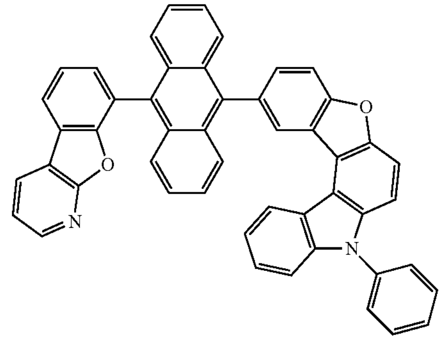
H101
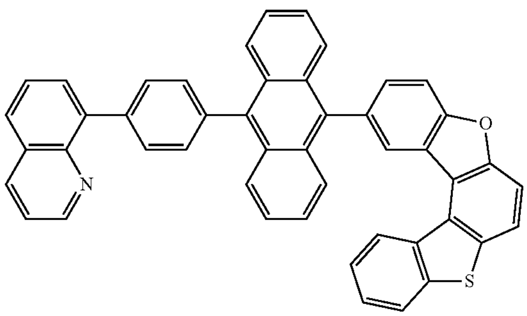
H102
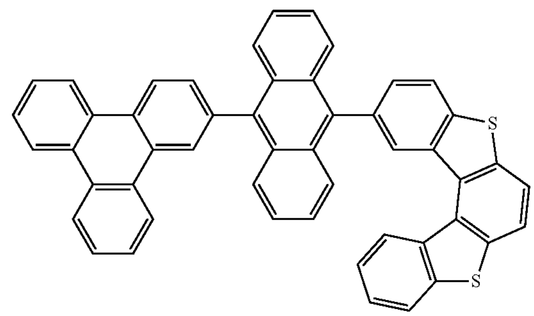
H103
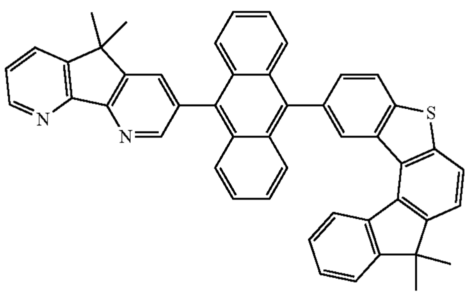
H104
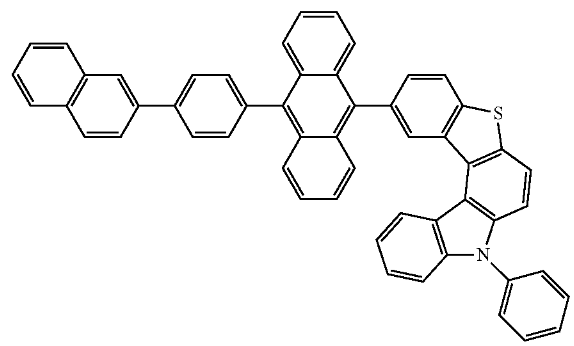
H105
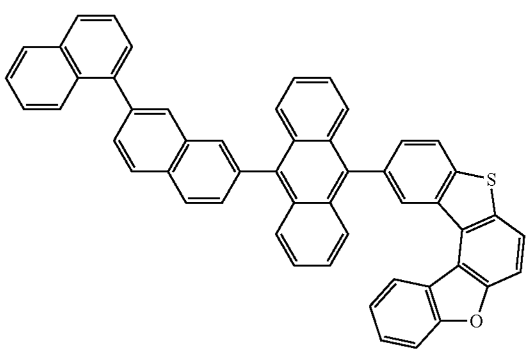
H106
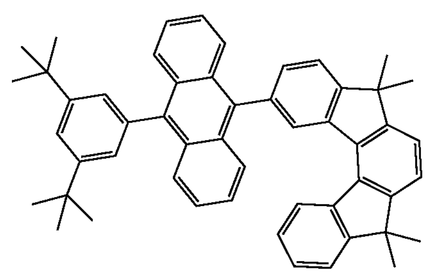
H017
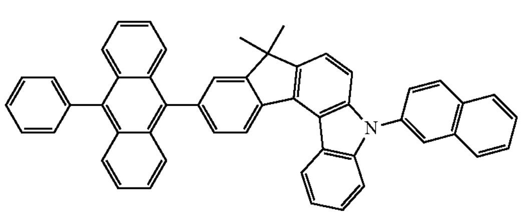
H108
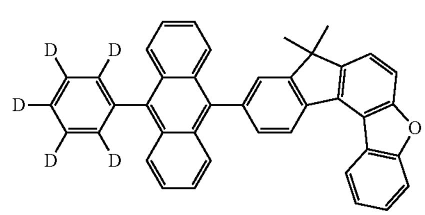

-continued
H109
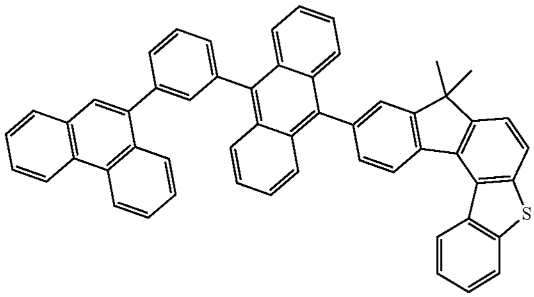
H110
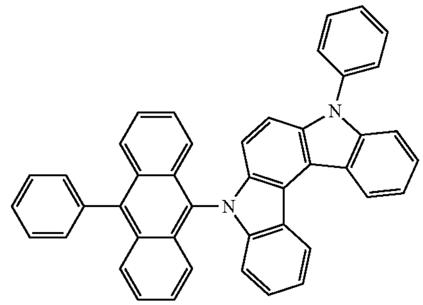
H111
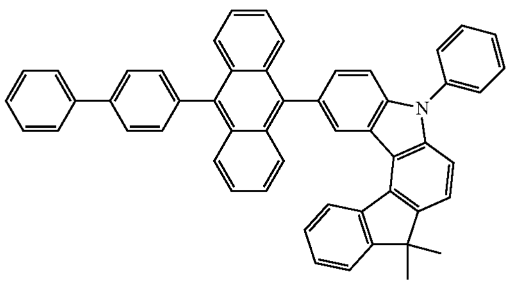
H112
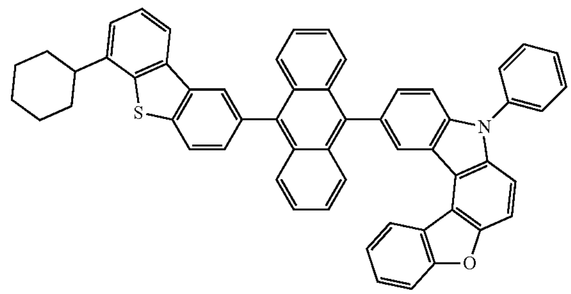
H113
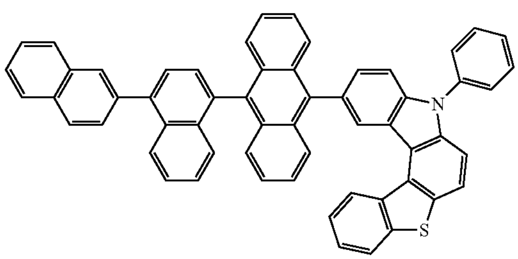
H114
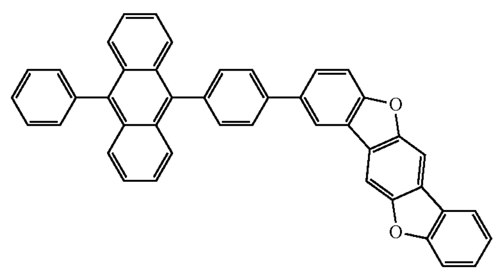
H115
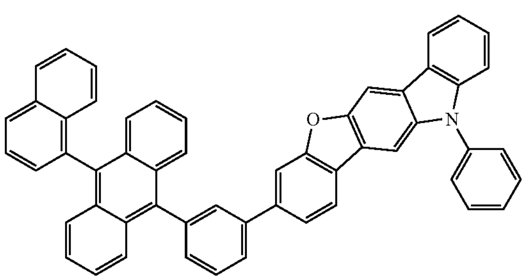
H116
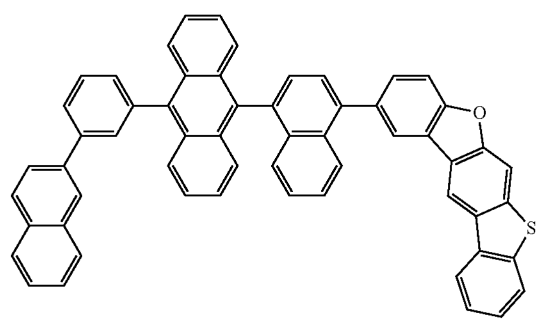
H117
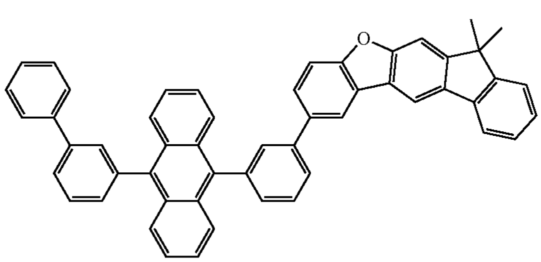
H118
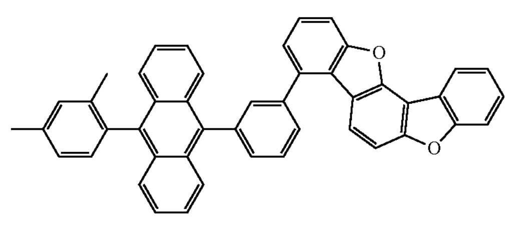

-continued
H119
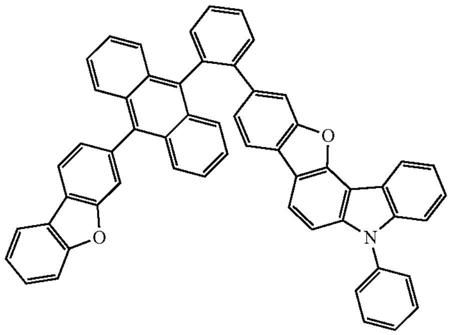
H120
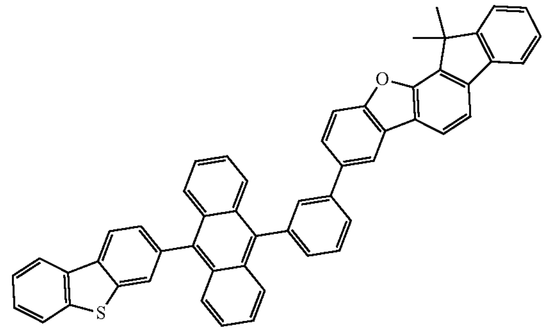
H121
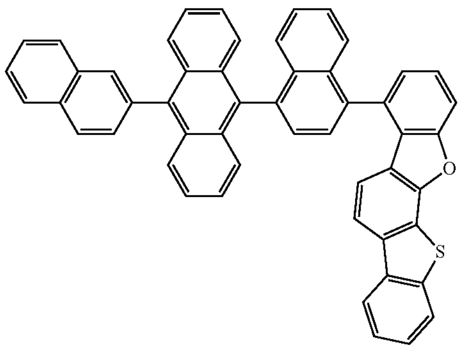
H122
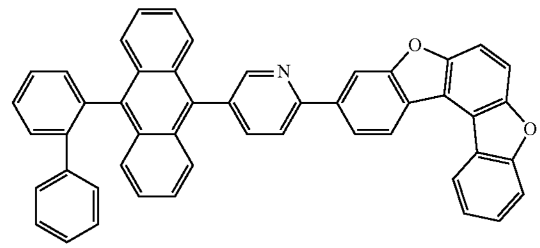
H123
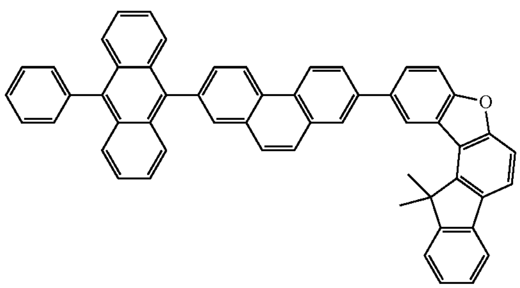
H124
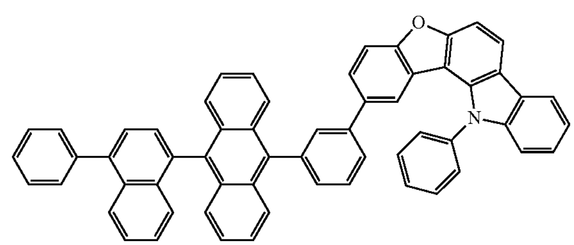
H125
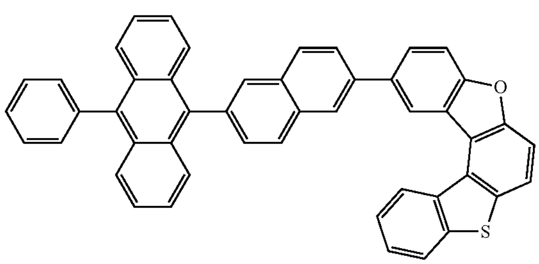
H126
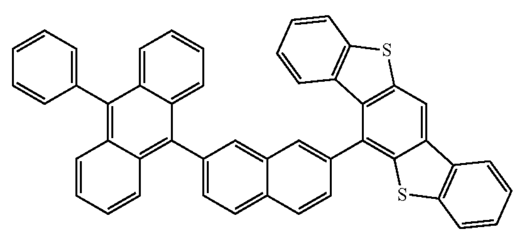
H127
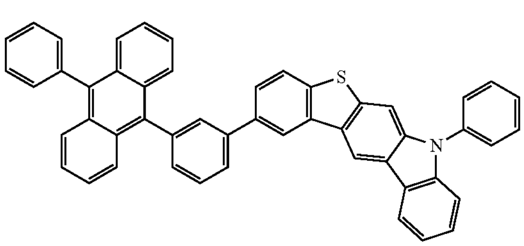
H128
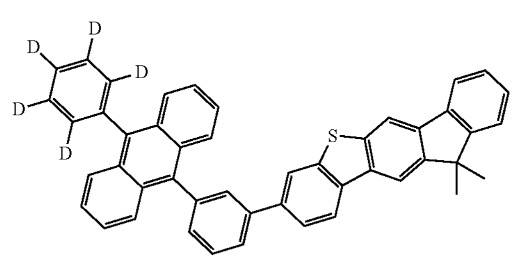

-continued
H129
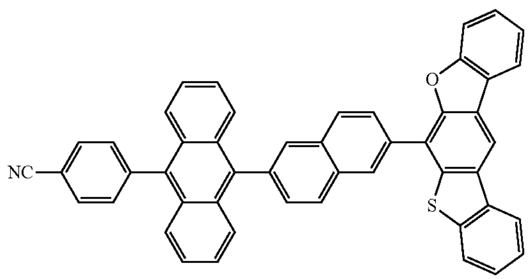
H130
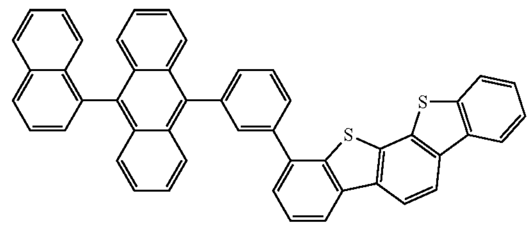
H131
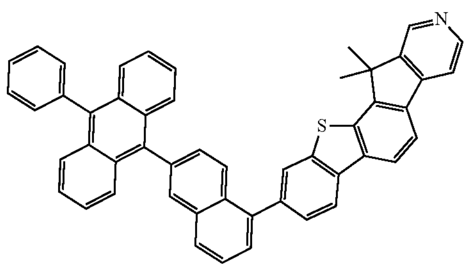
H132
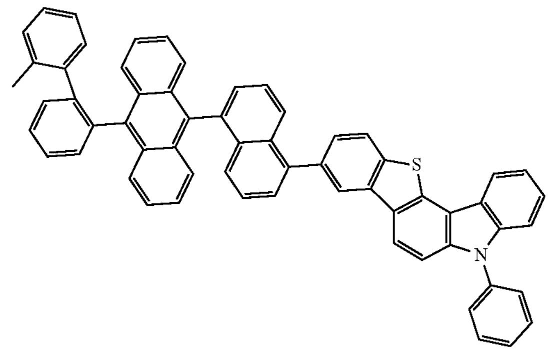
H133
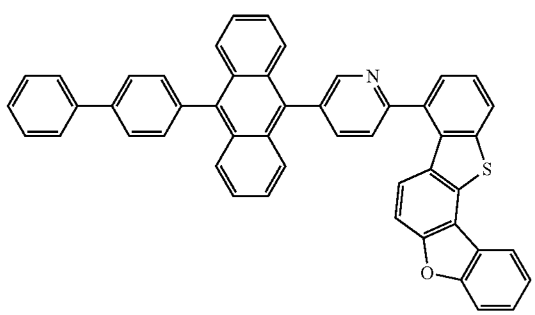
H134
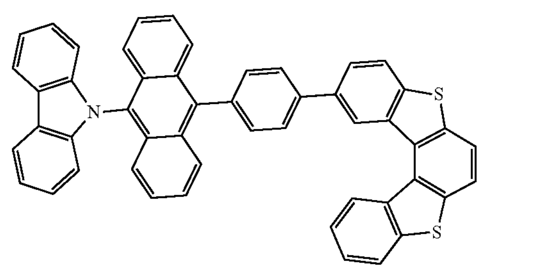
H135
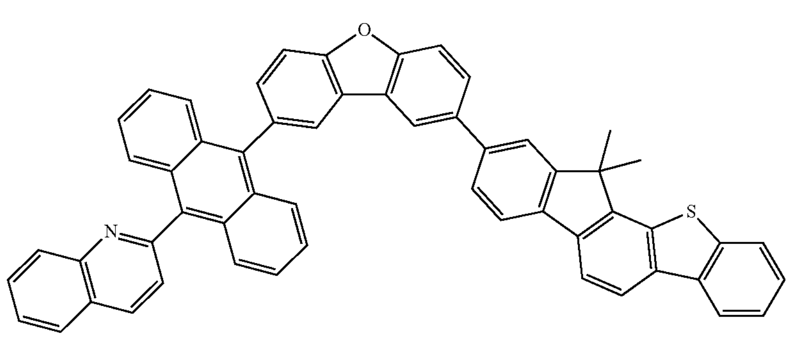

-continued
H136
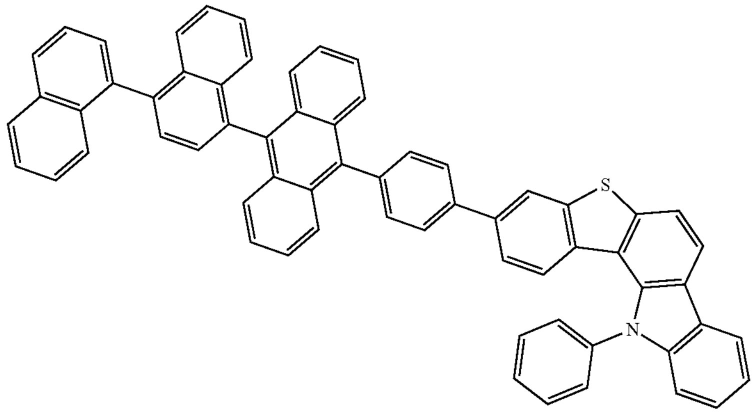
H137
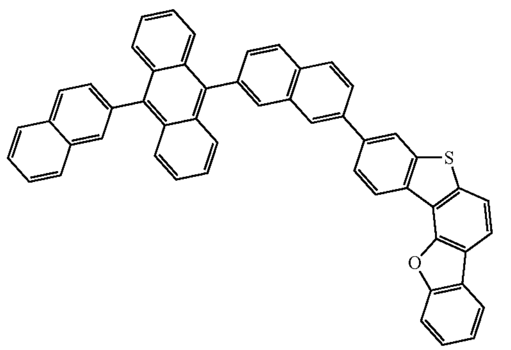
H138
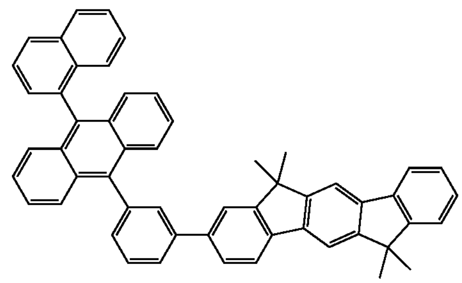
H139
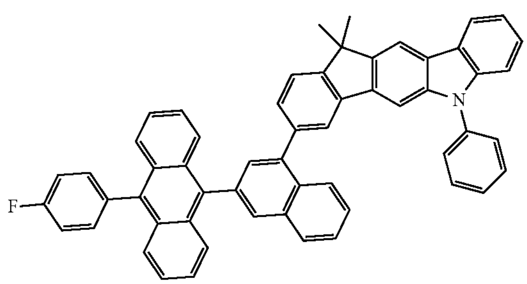
H140
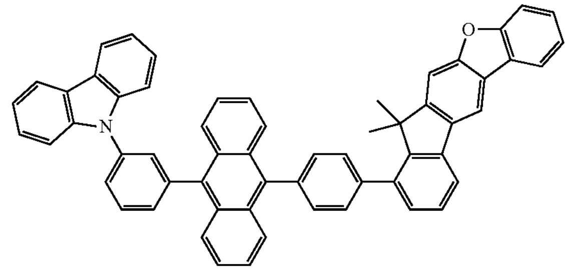
H141
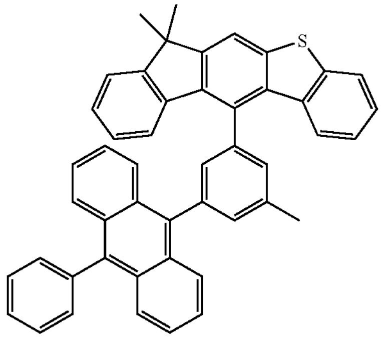
H142
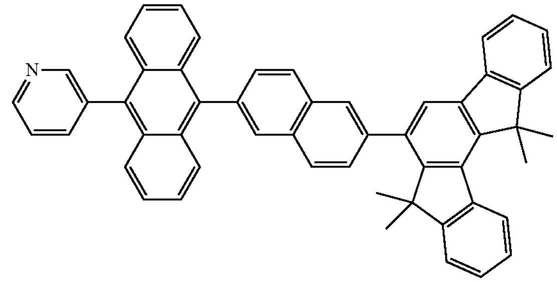

-continued
H143
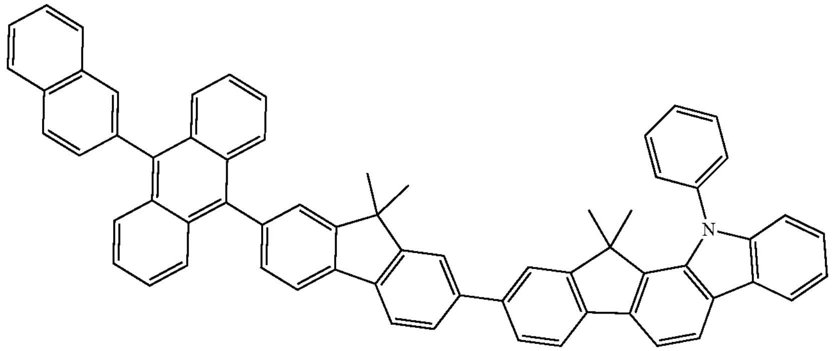
H144
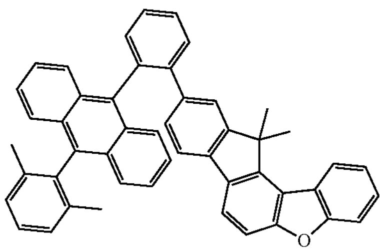
H145
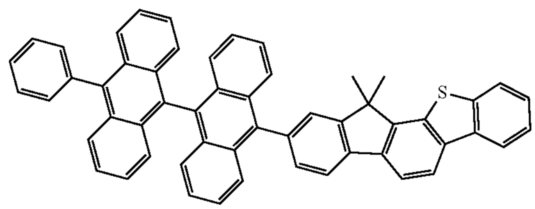
H146
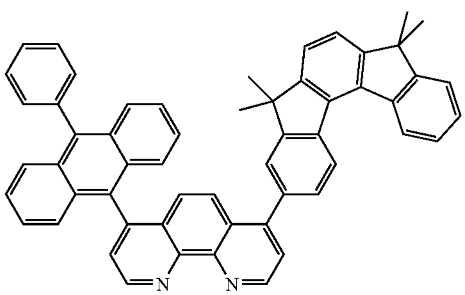
H147
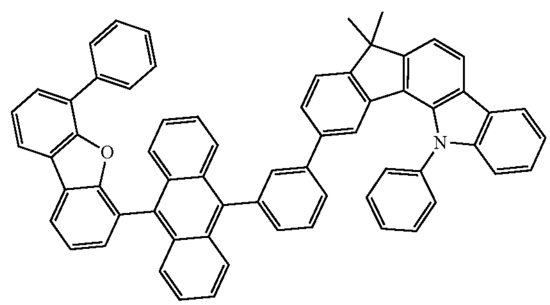
H148
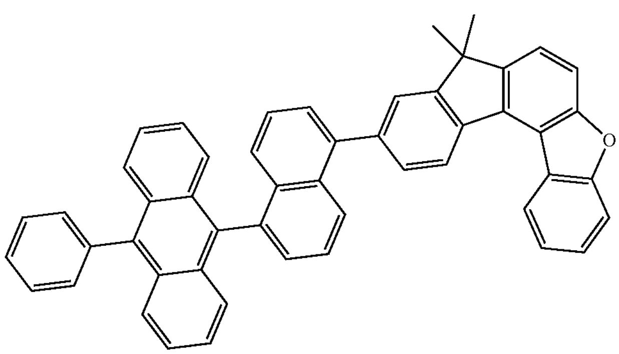
H149
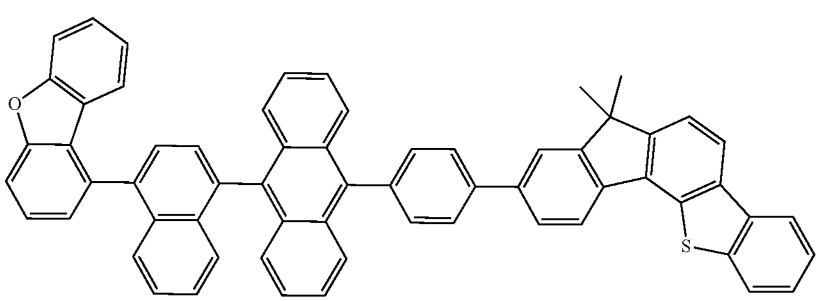

-continued
H150
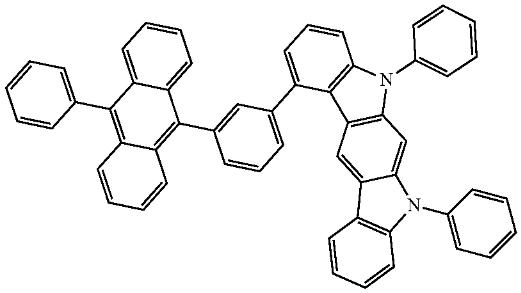
H151
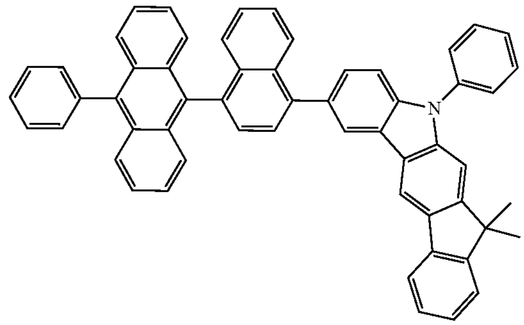
H152
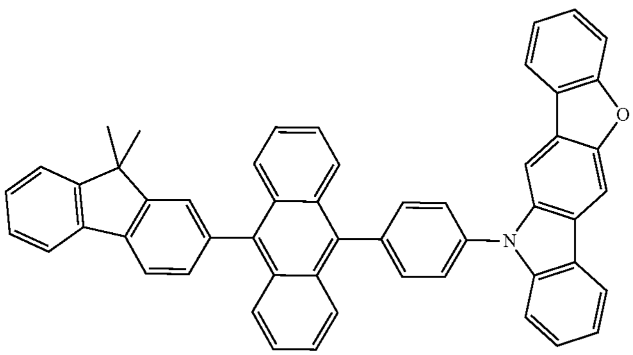
H153
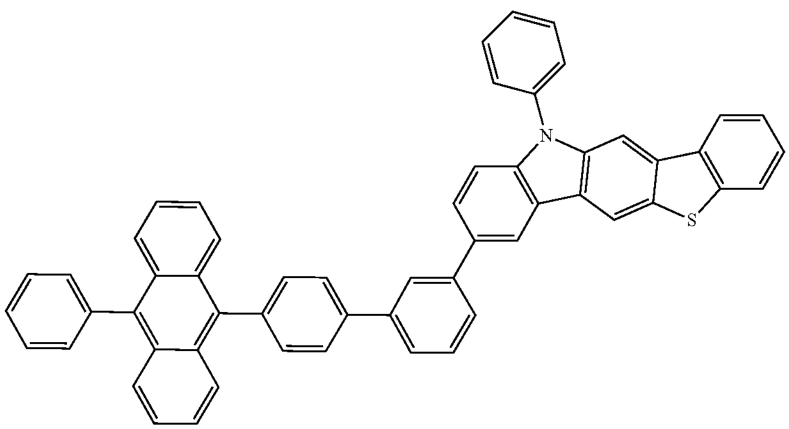
H154
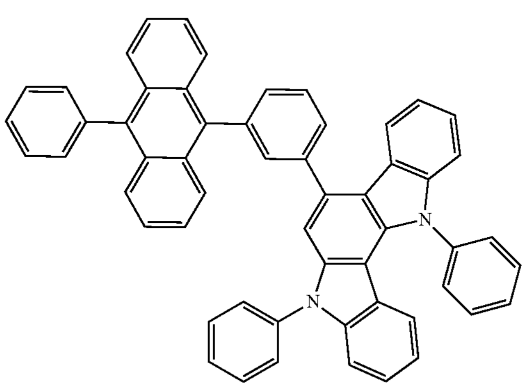

-continued
H155
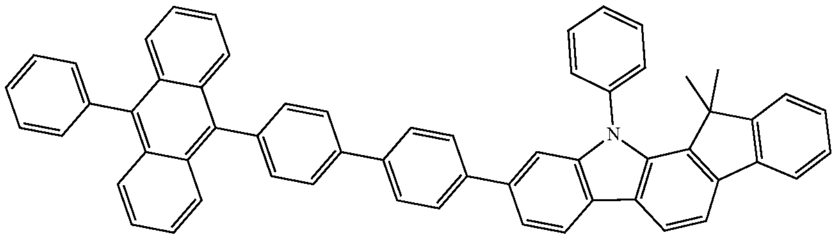
H156
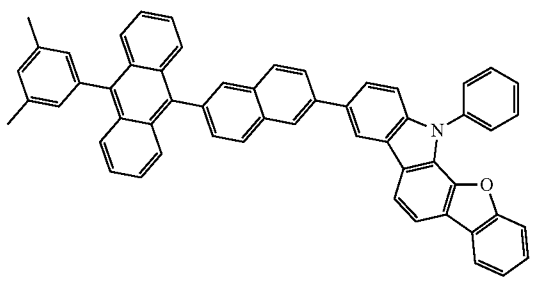
H157
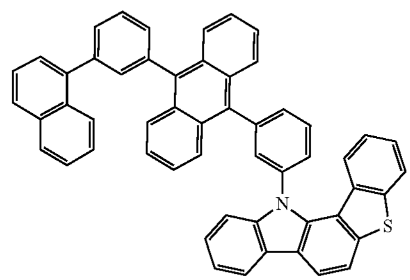
H158
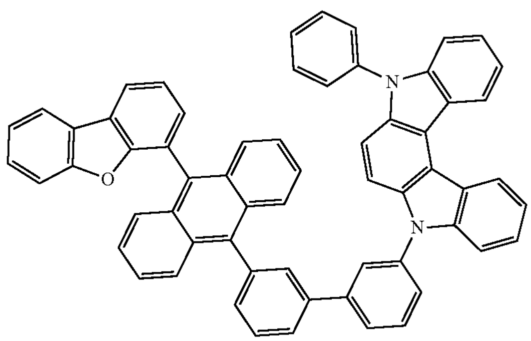
H159
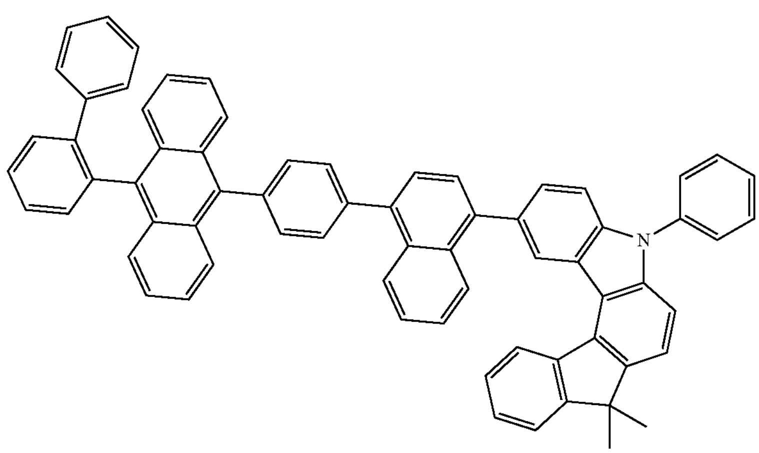

-continued
H160
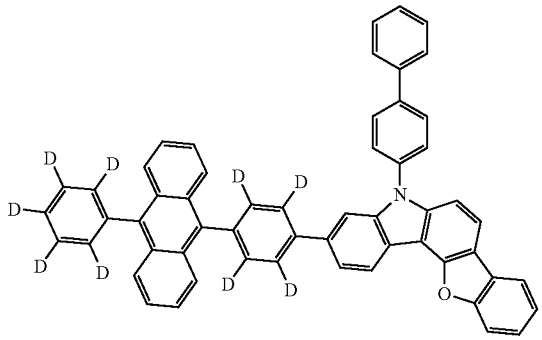
H161
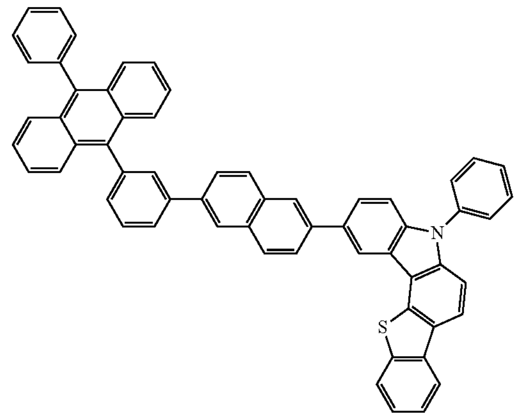
H162
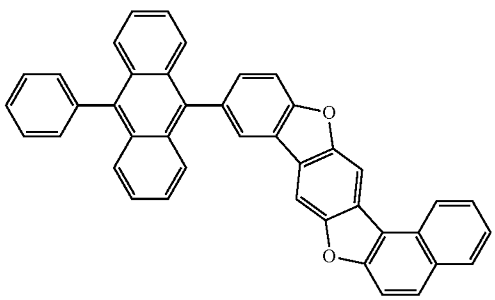
H163
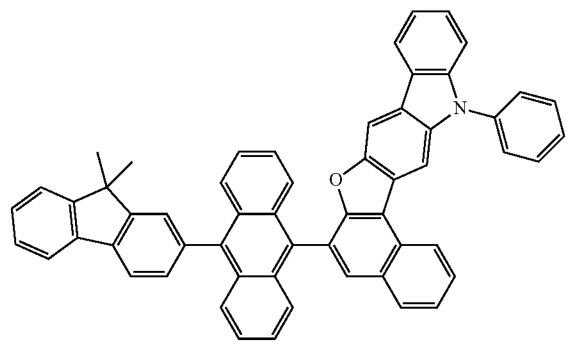
H164
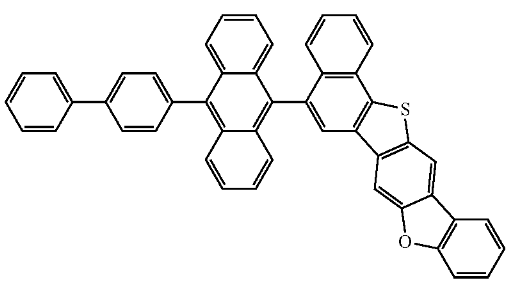
H165
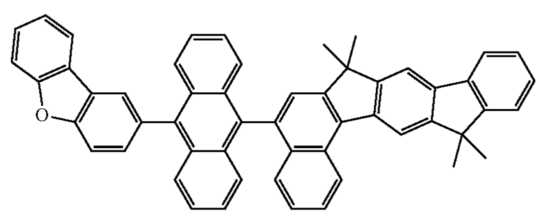
H166
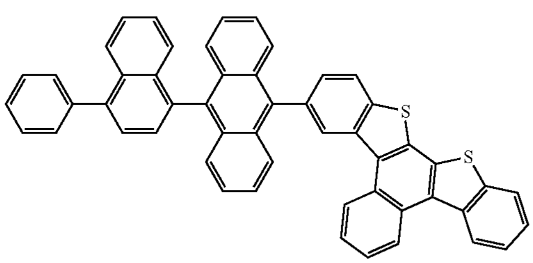
H167
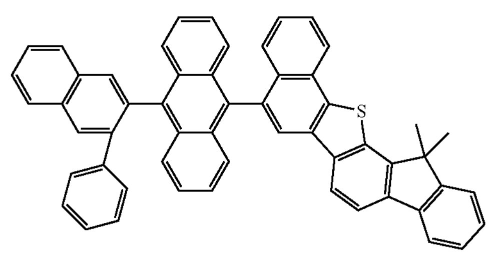

-continued
H168
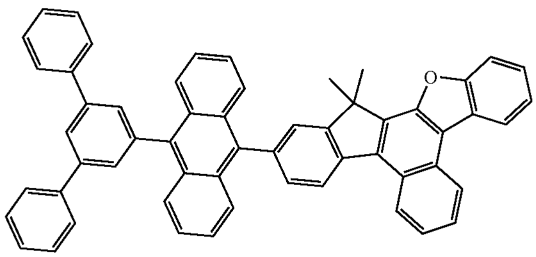
H169
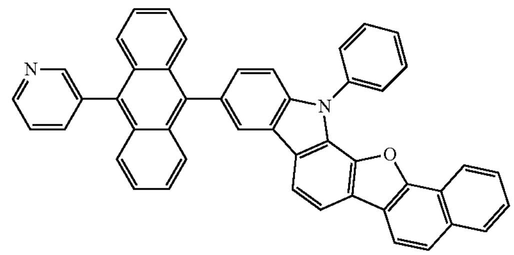
H170
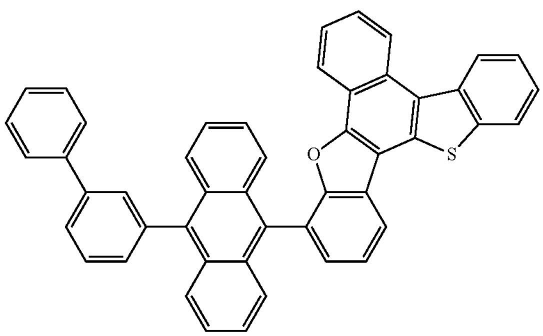
H171
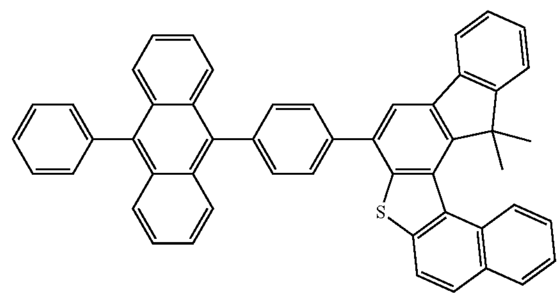
H172
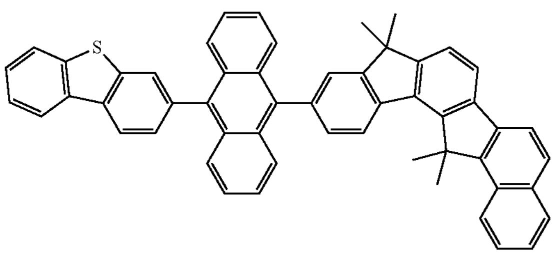
H173
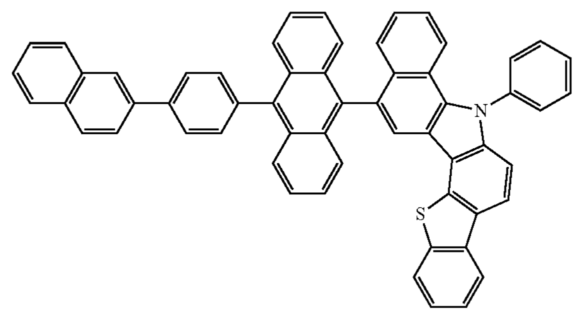
H174
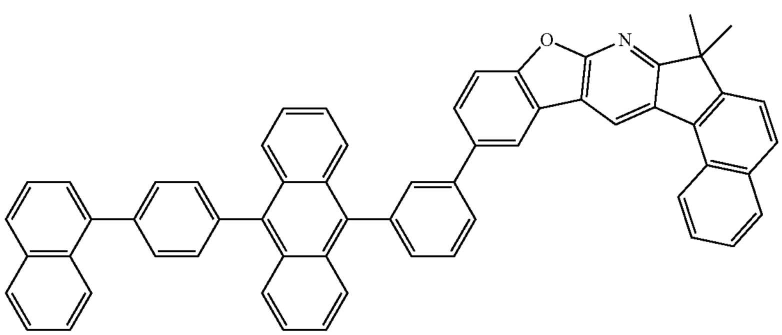
H175
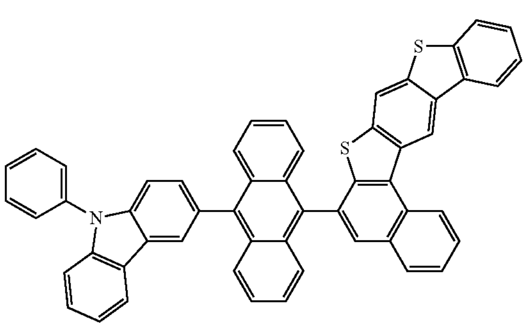
H176
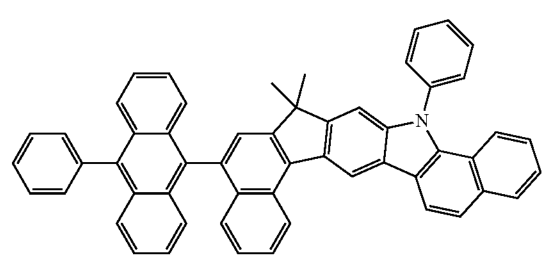

-continued
H177
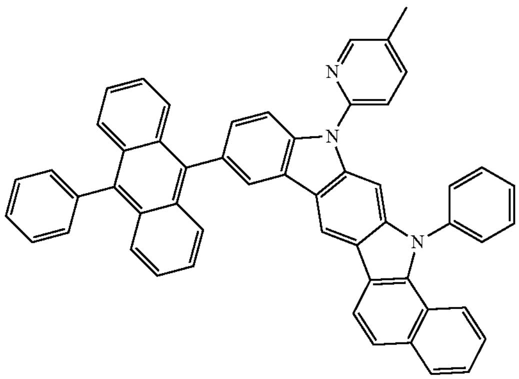
H178
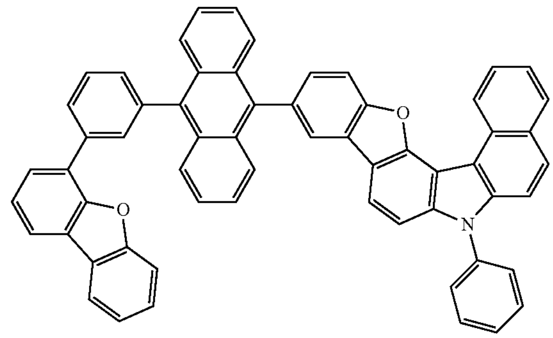
H179
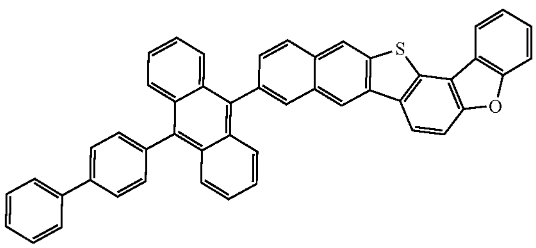
H180
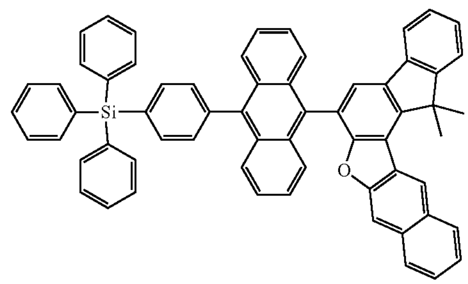
H181
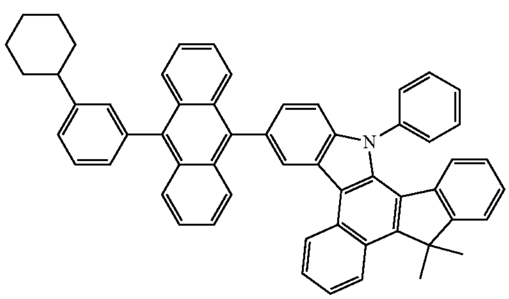
H182
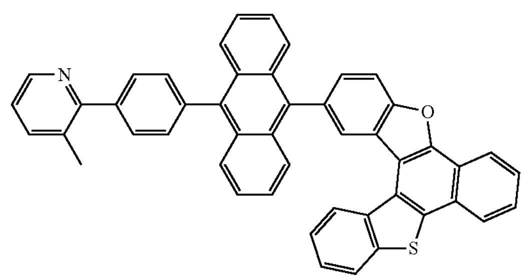
H183
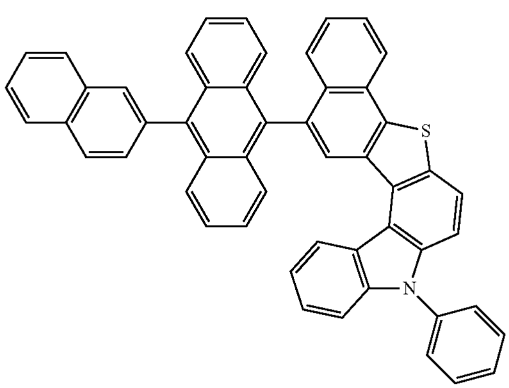
H184
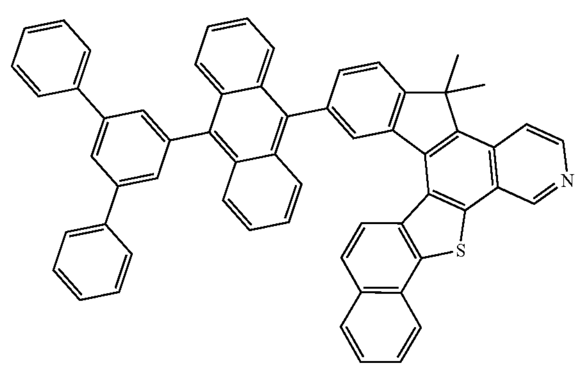

-continued
H185
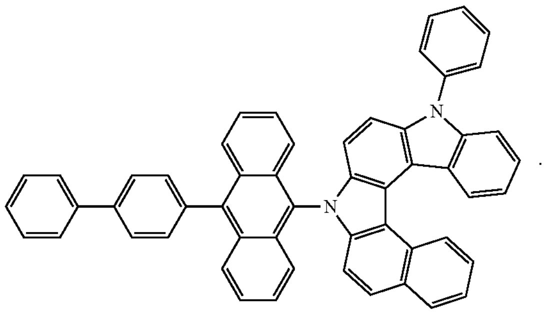
In one embodiment, the second compound represented by Formula 2 may be selected from Compounds D1-1 to D1-74 and D2-1 to D2-212, but embodiments of the present disclosure are not limited thereto:
D1-1
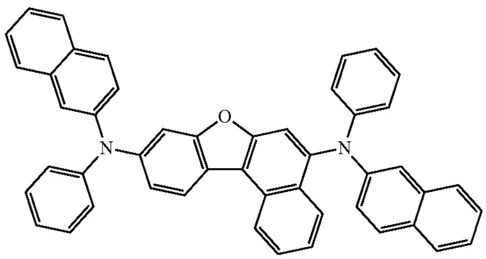
D1-2
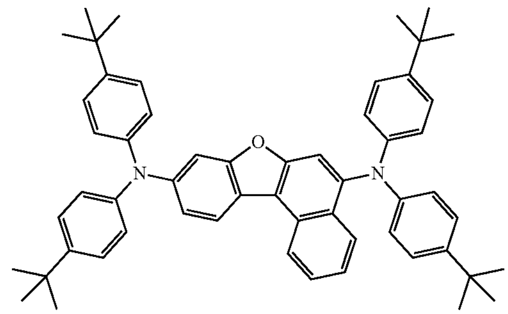
D1-3
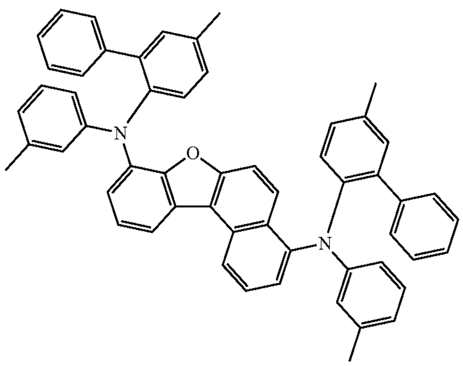
D1-4
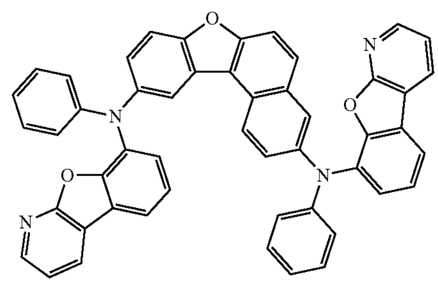
D1-5
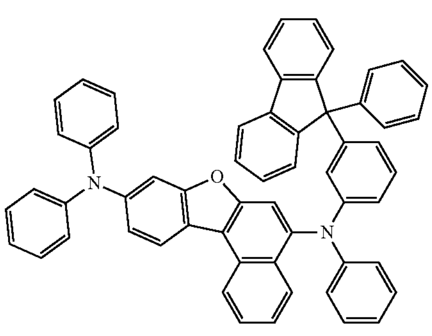
D1-6
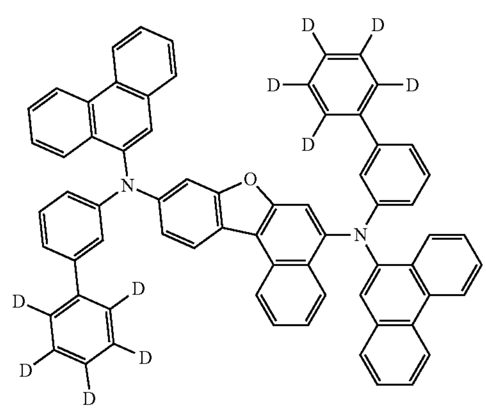

-continued
D1-7
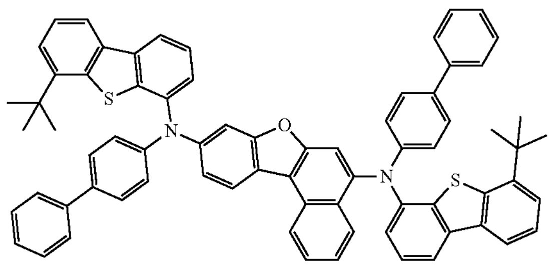
D1-8
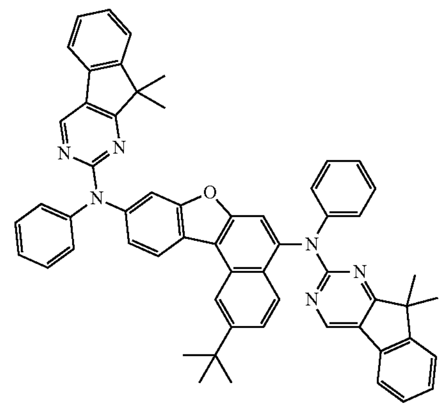
D1-9
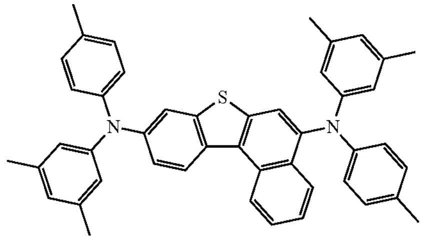
D1-10
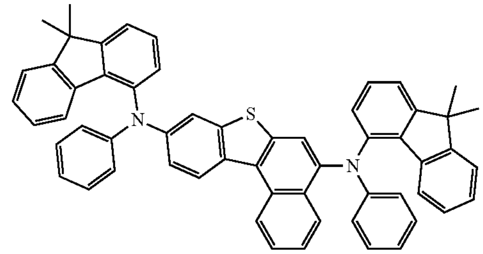
D1-11
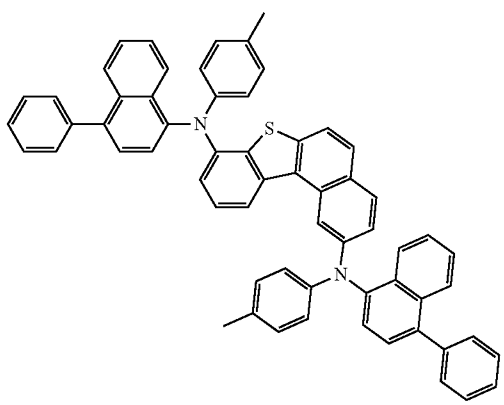
D1-12
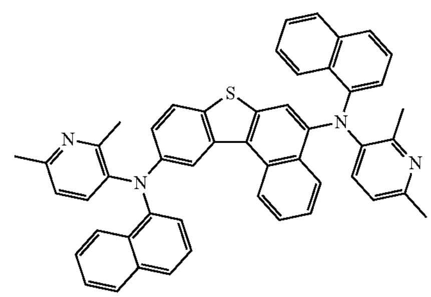
D1-13
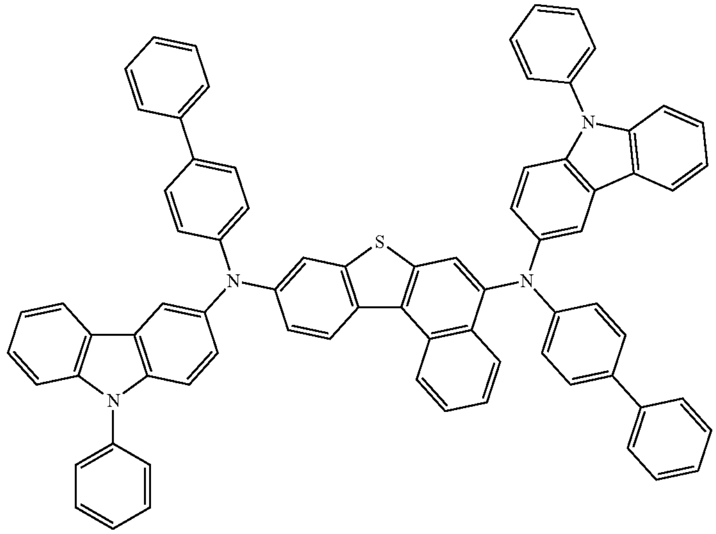

-continued
D1-14
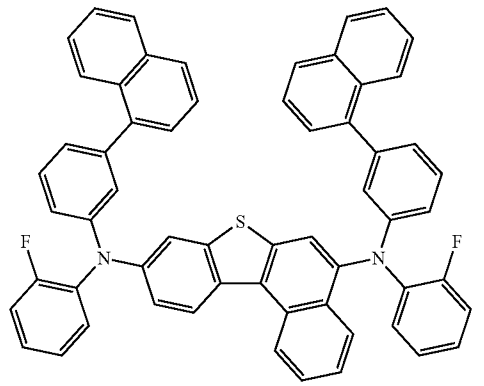
D1-15
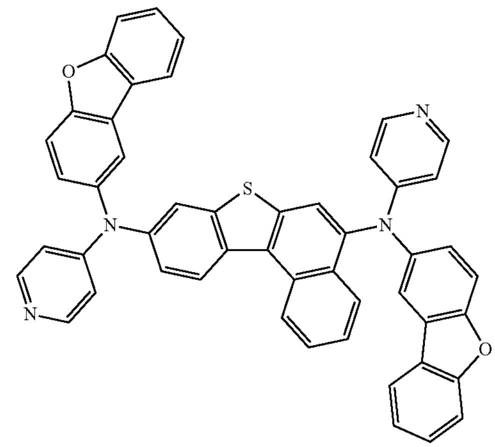
D1-16
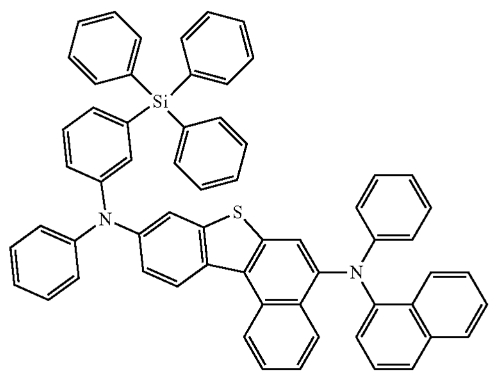
D1-17
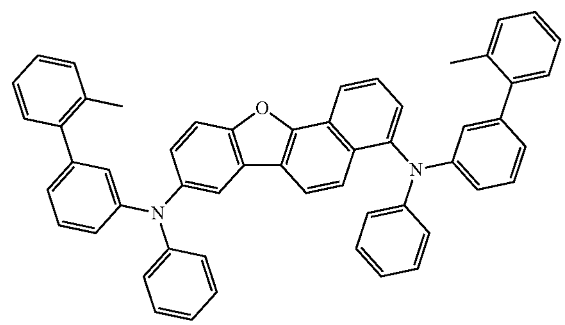
D1-18
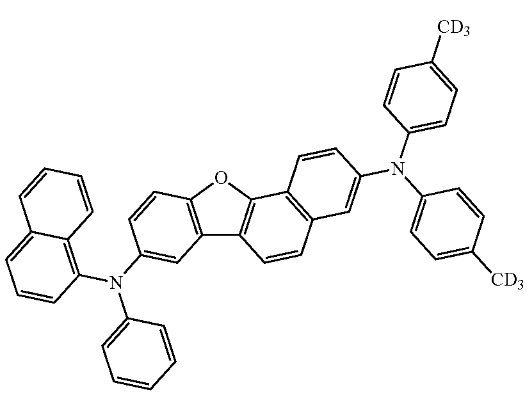
D1-19
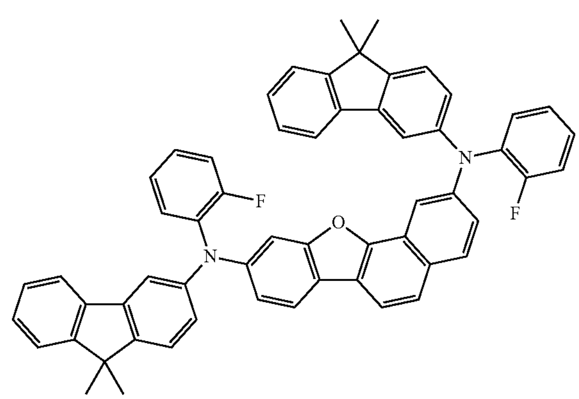

-continued
D1-20
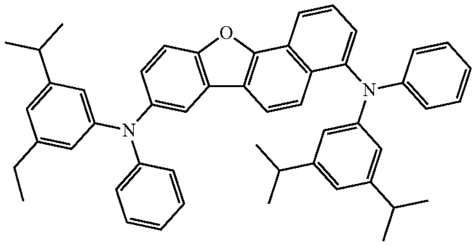
D1-21
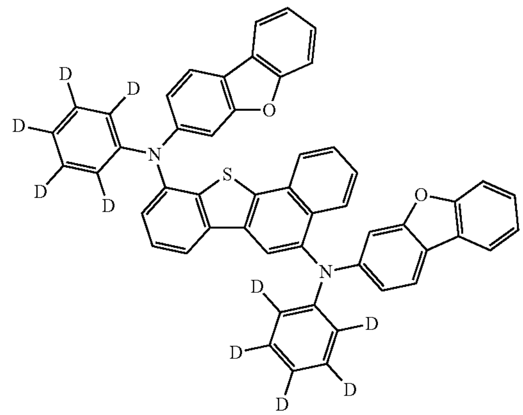
D1-22
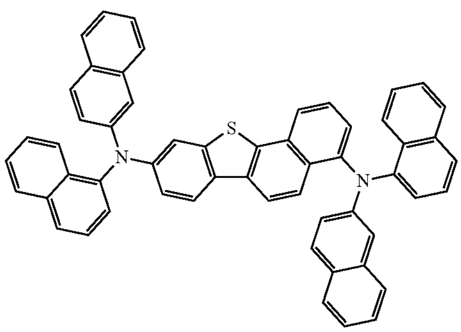
D1-23
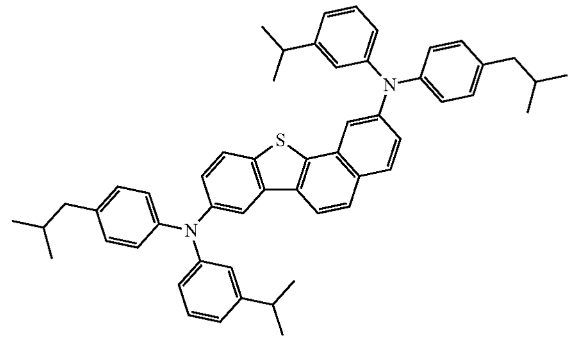
D1-24
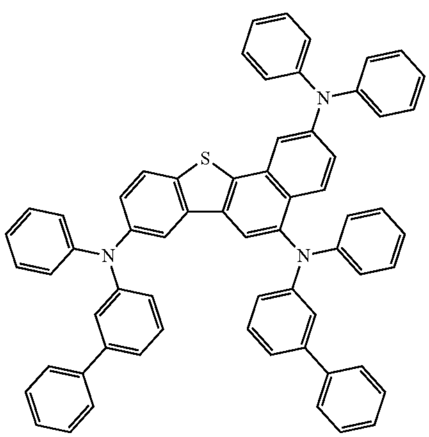
D1-25
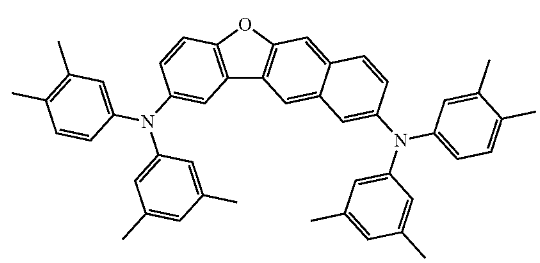
D1-26
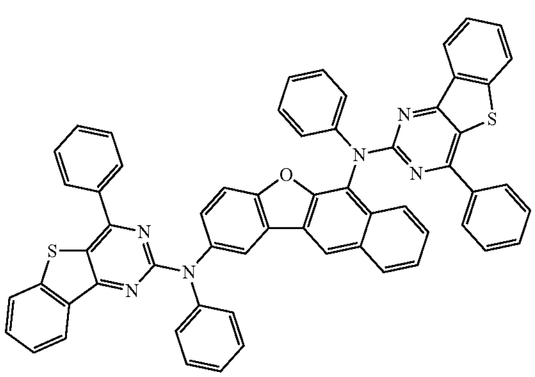
D1-27
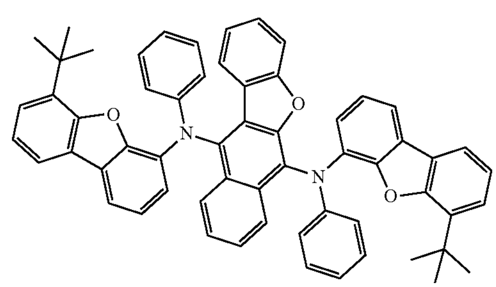

-continued
D1-28
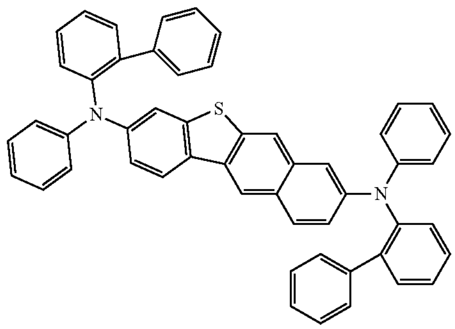
D1-29
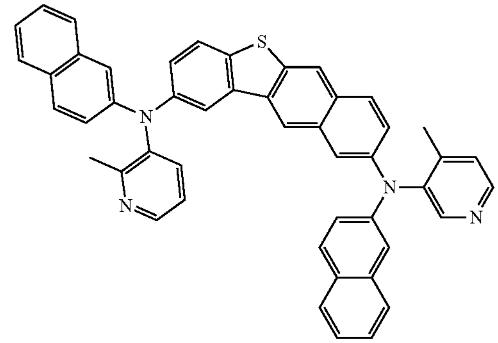
D1-30
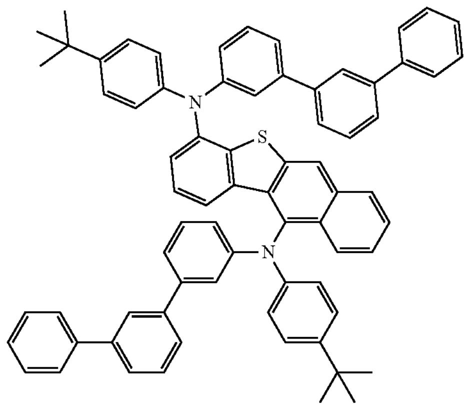
D1-31
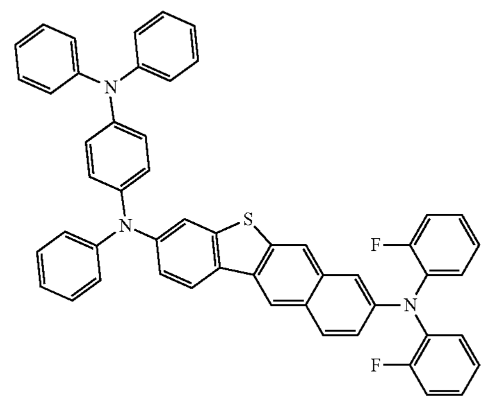
D1-32
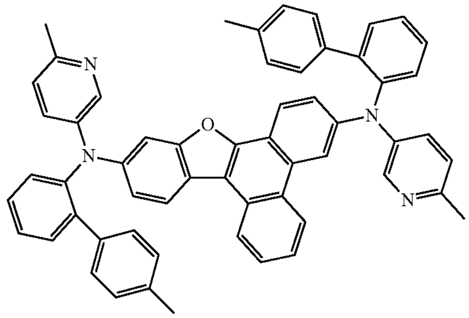
D1-33
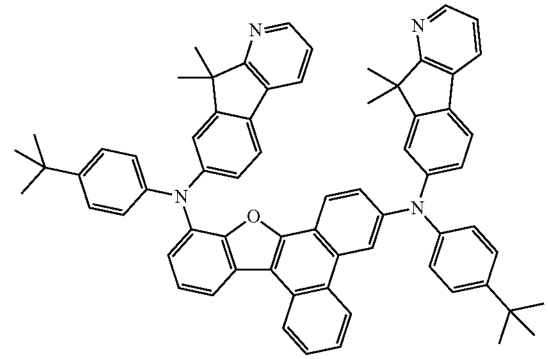
D1-34
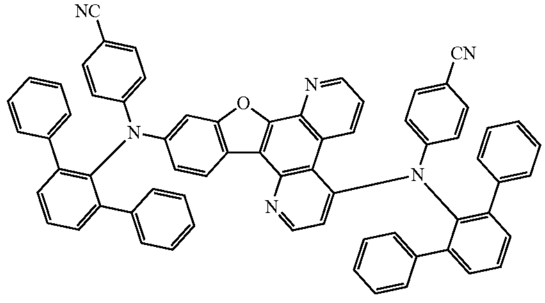
D1-35
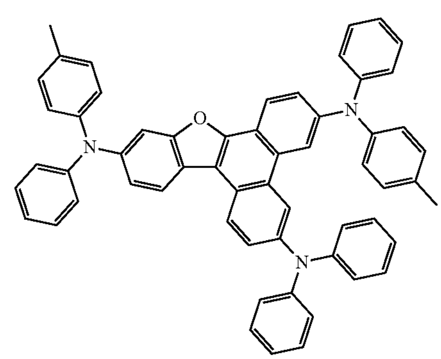

-continued
D1-36
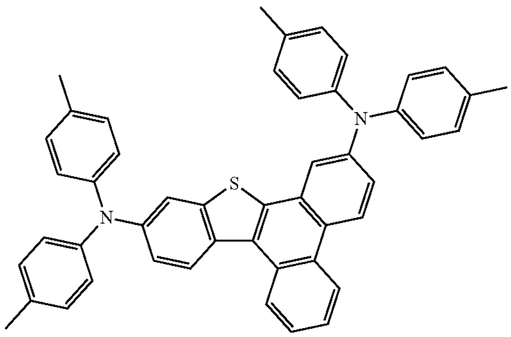
D1-37
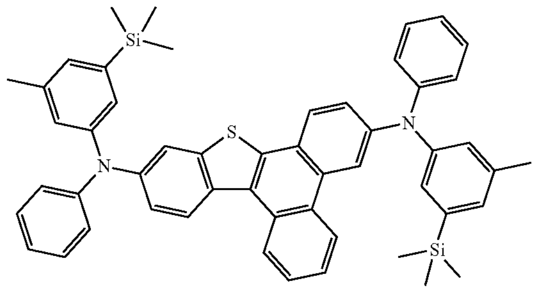
D1-38
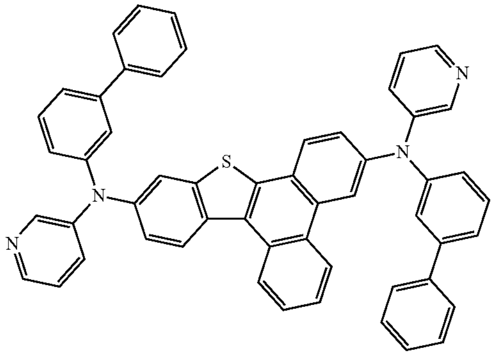
D1-39
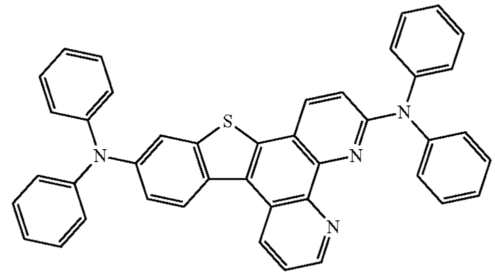
D1-40
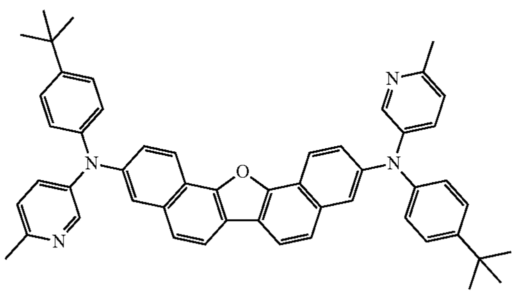
D1-41
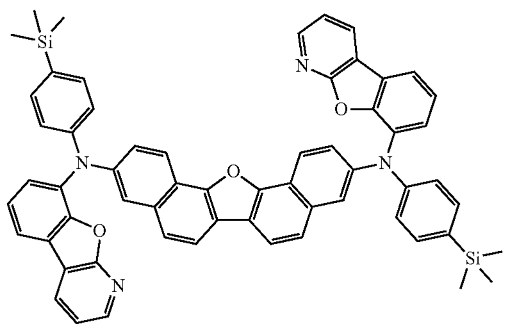
D1-42
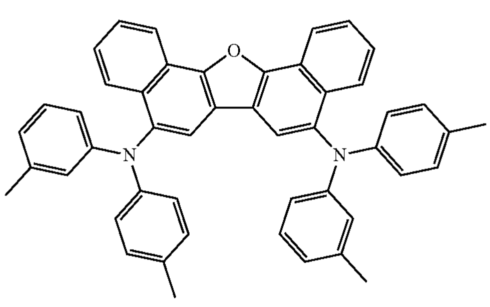
D1-43
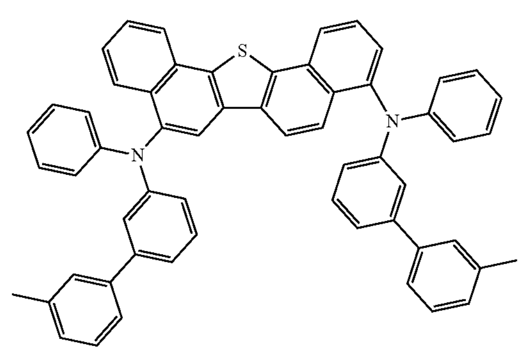

-continued
D1-44
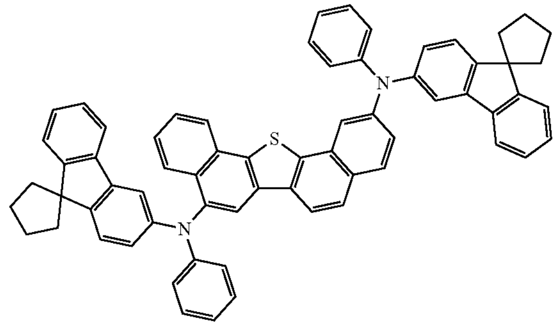
D1-45
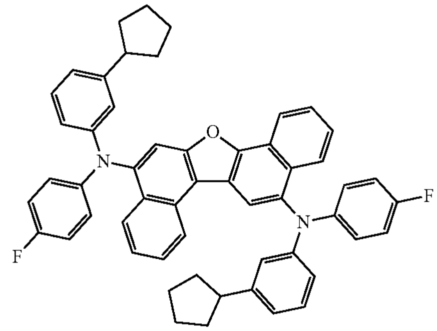
D1-46
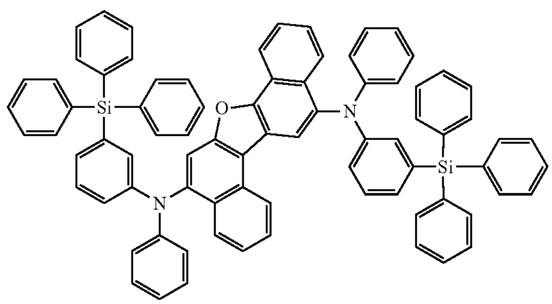
D1-47
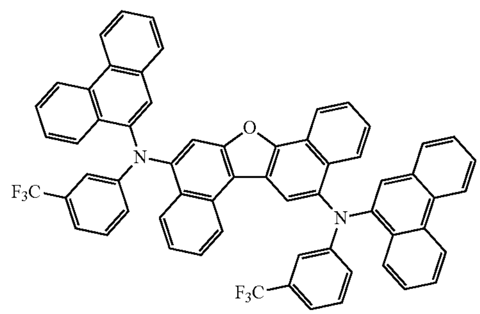
D1-48
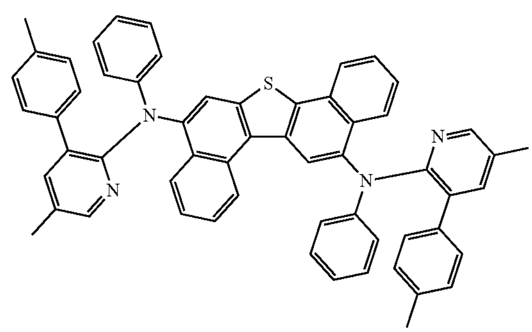
D1-49
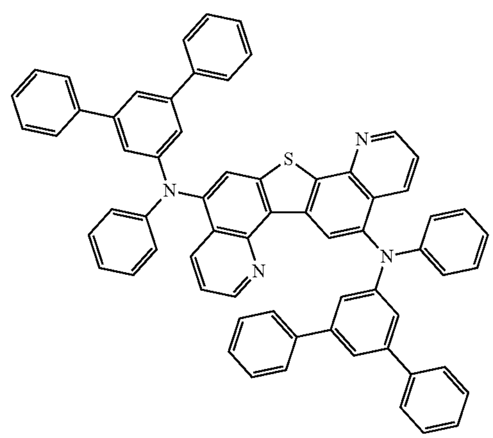
D1-50
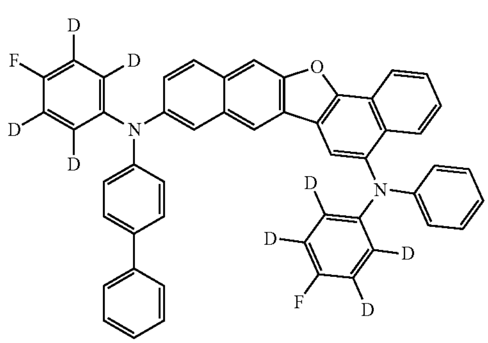
D1-51
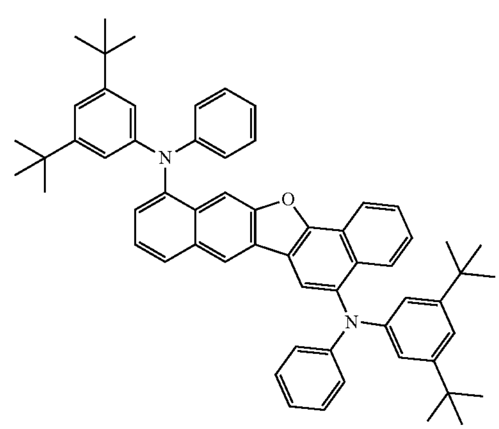

-continued
D1-52
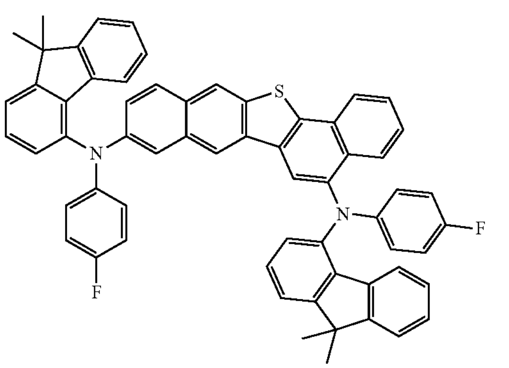
D1-53
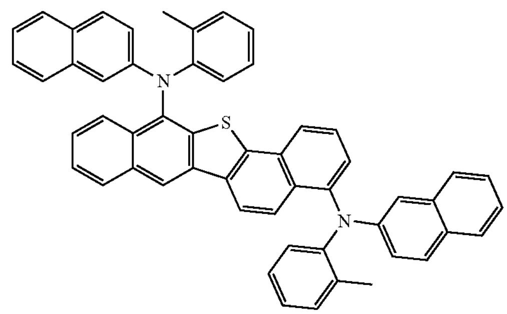
D1-54
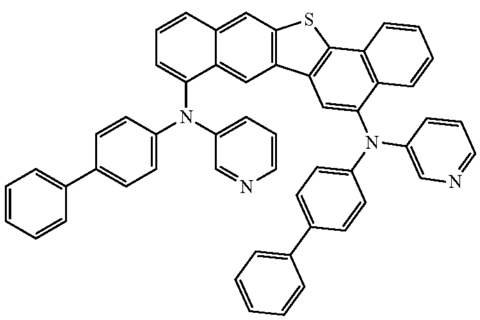
D1-55
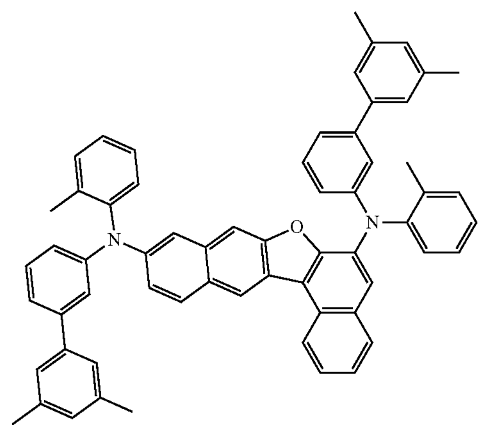
D1-56
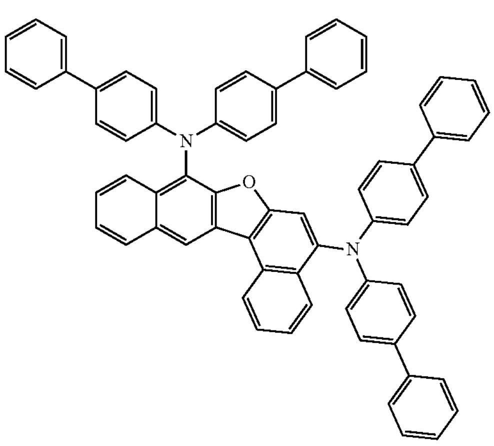
D1-57
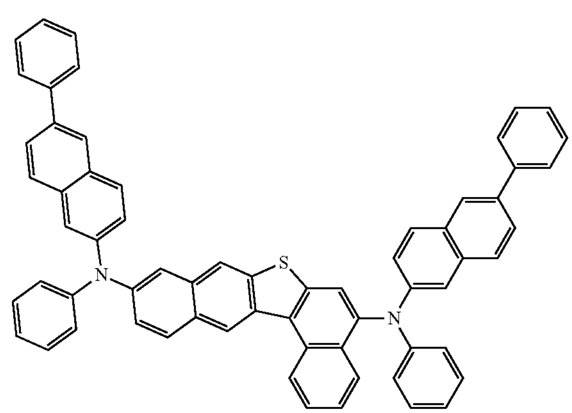

-continued
D1-58
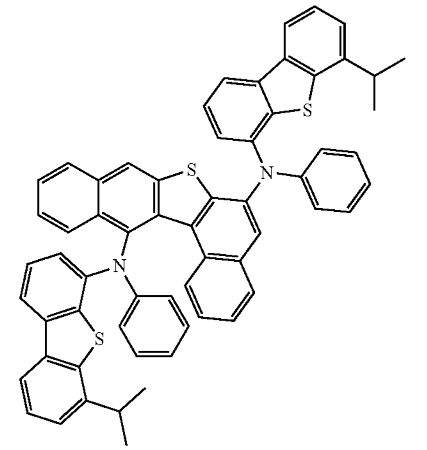
D1-59
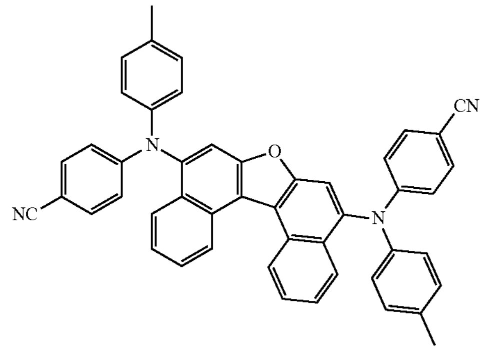
D1-60
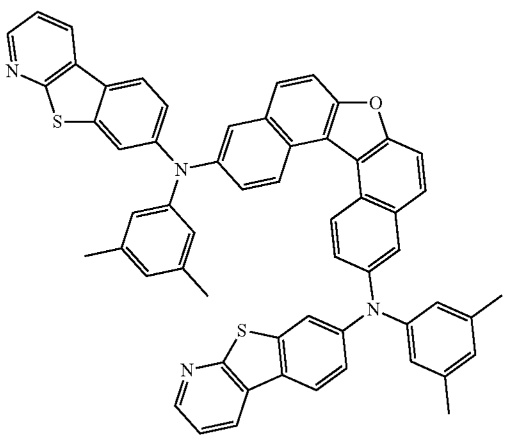
D1-61
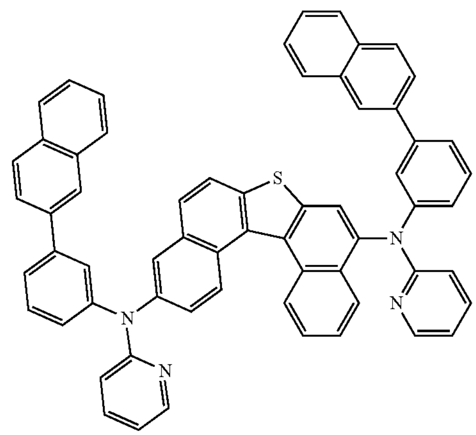
D1-62
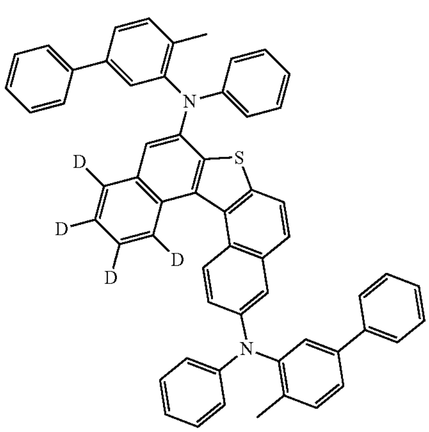
D1-63
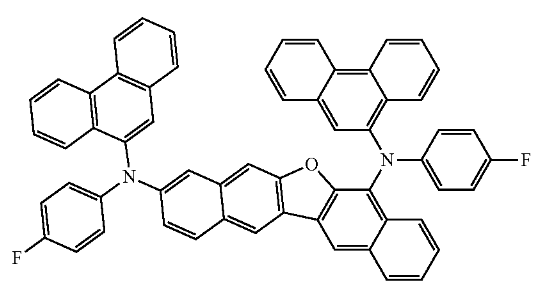

-continued
D1-64
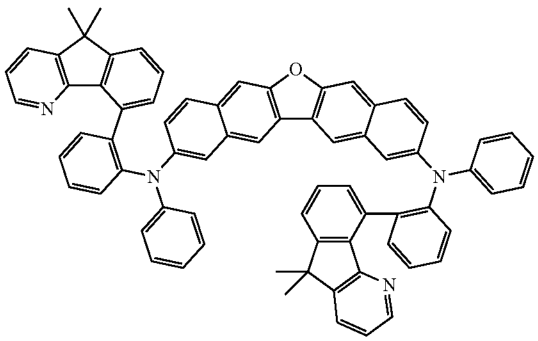
D1-65
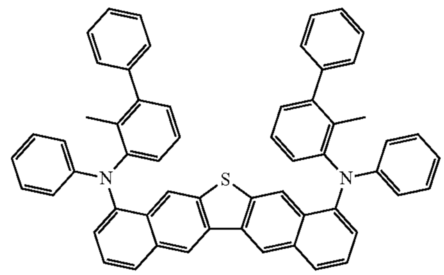
D1-66
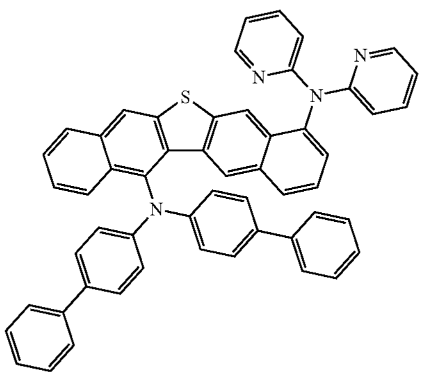
D1-67
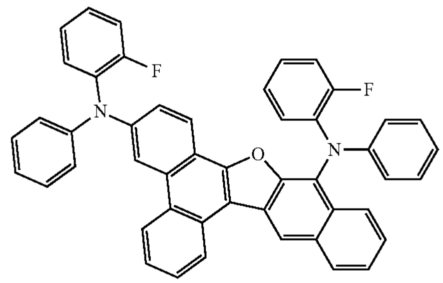
D1-68
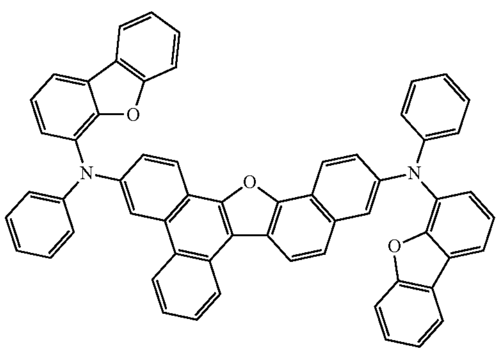
D1-69
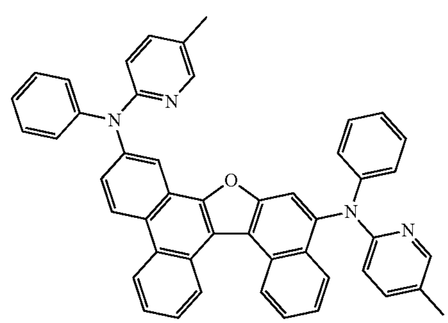
D1-70
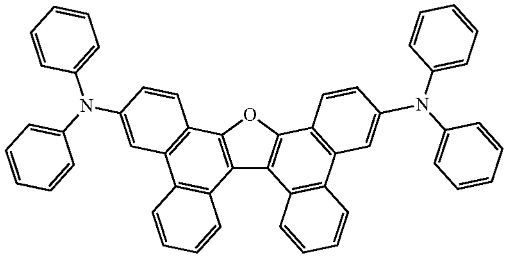
D1-71
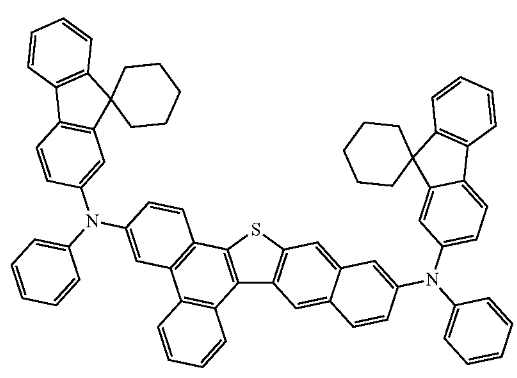

-continued
D1-72
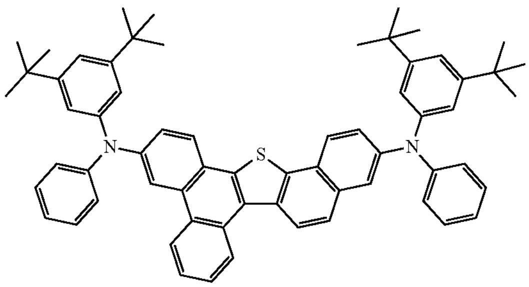
D1-73
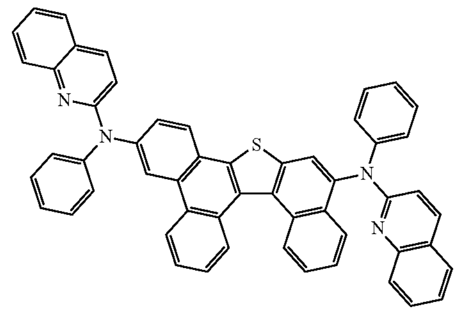
D1-74
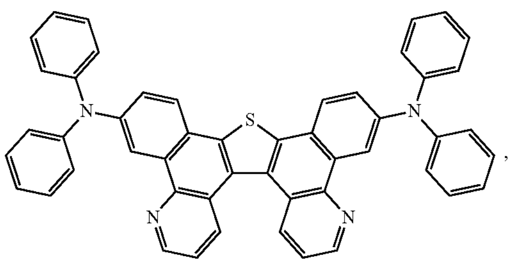
D2-1
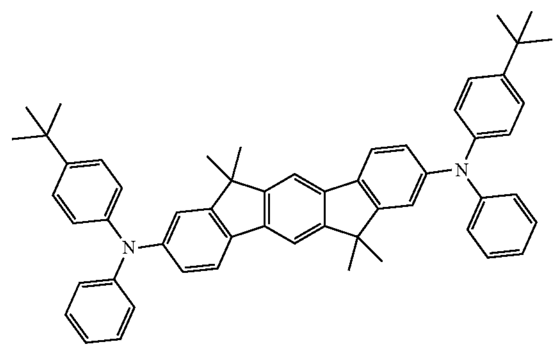
D2-2
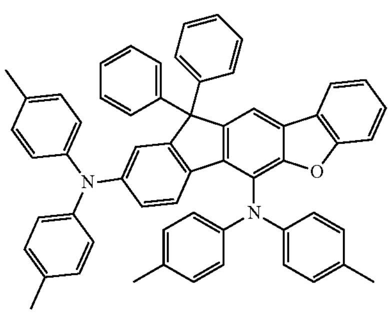
D2-3
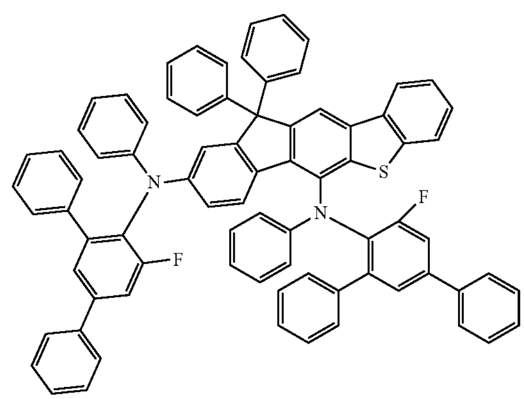
D2-4
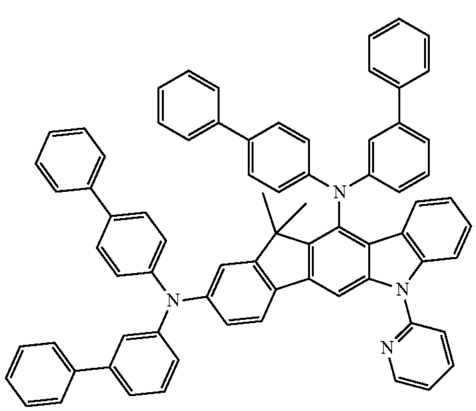
D2-5
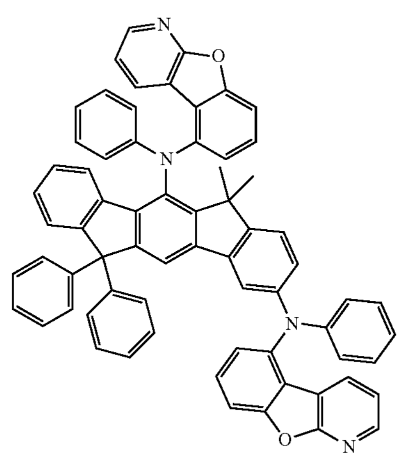

-continued
D2-6
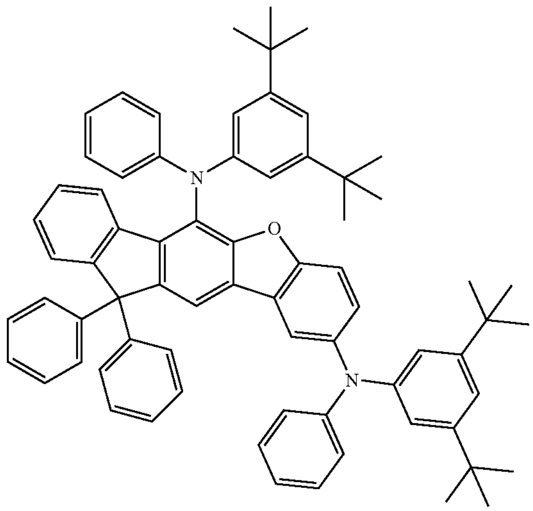
D2-7
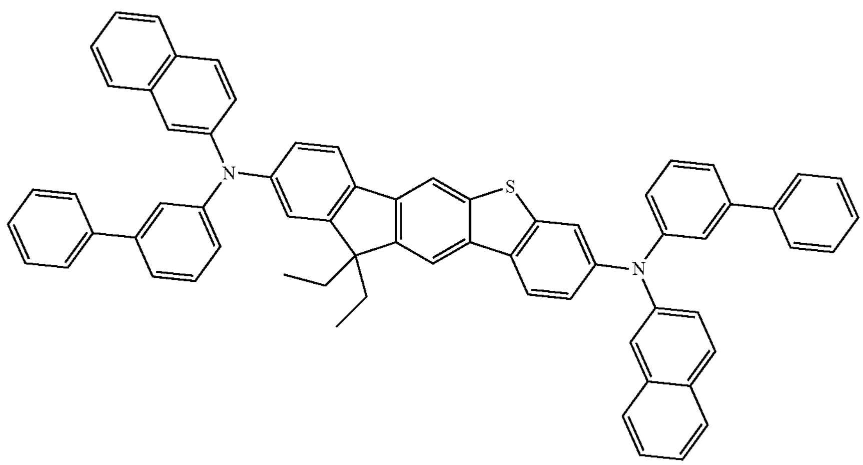
D2-8
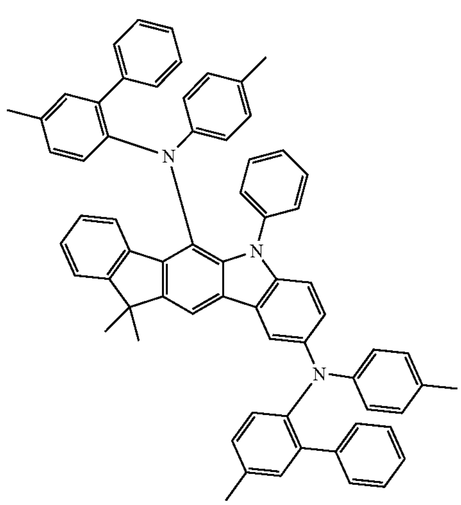
D2-9
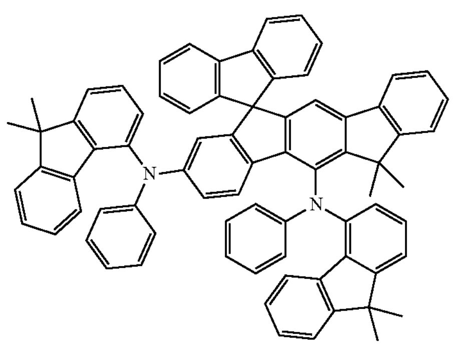

-continued
D2-10
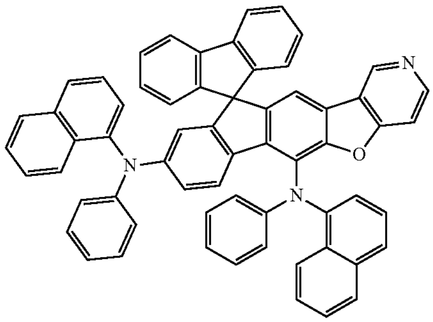
D2-11
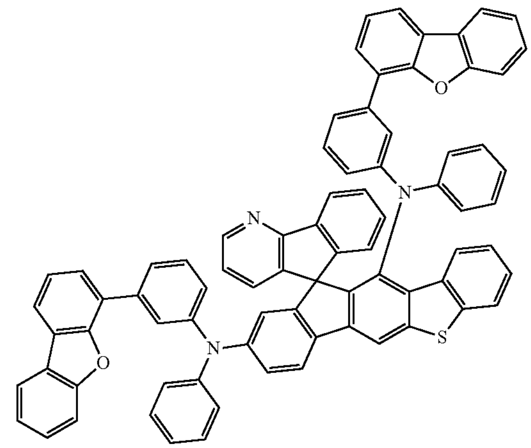
D2-12
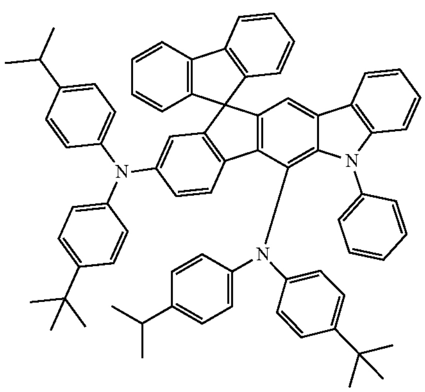
D2-13
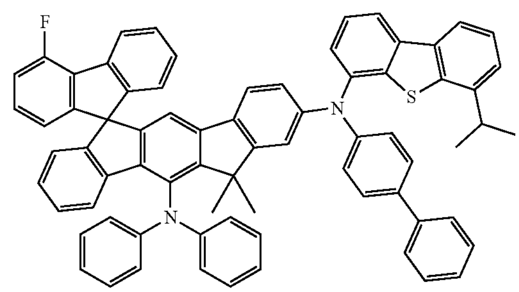
D2-14
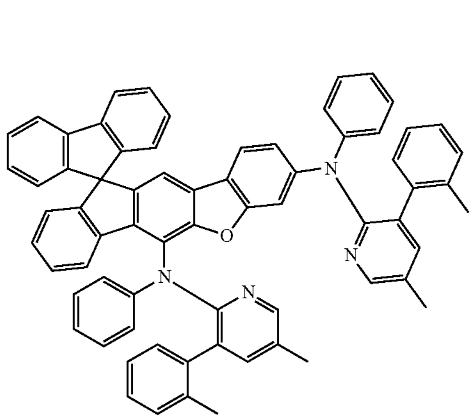
D2-15
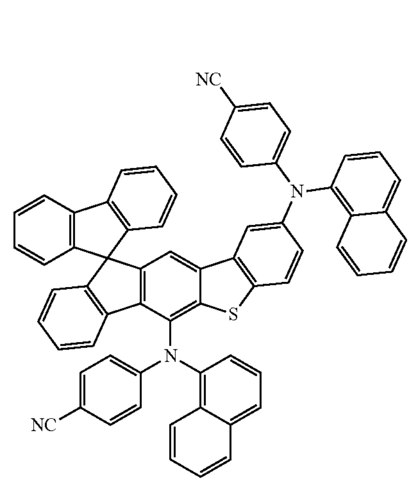

-continued
D2-16
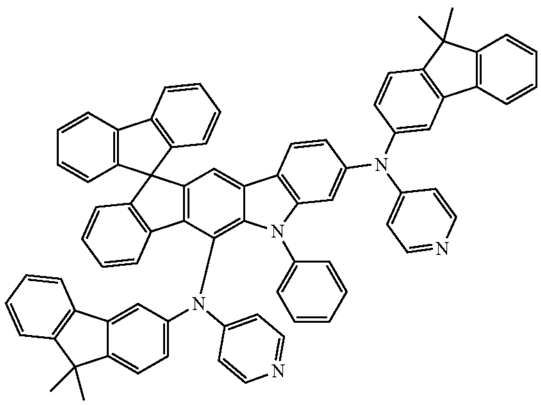
D2-17
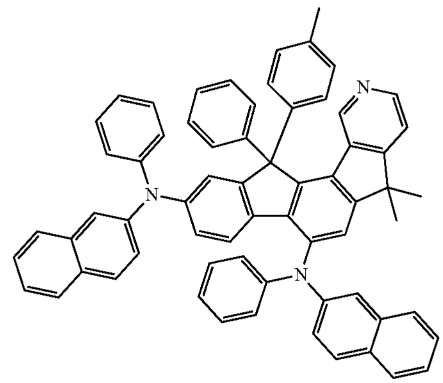
D2-18
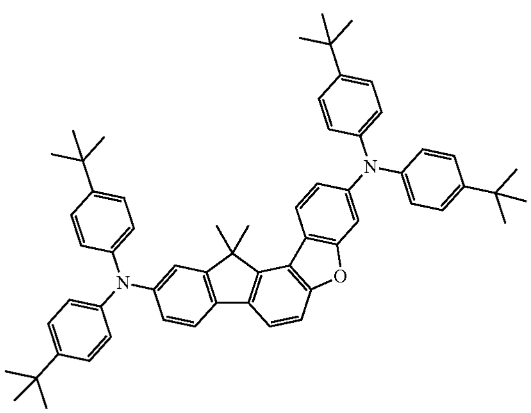
D2-19
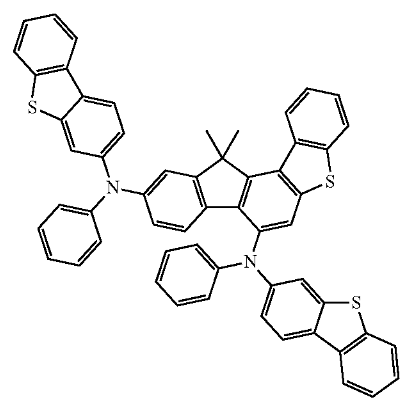
D2-20
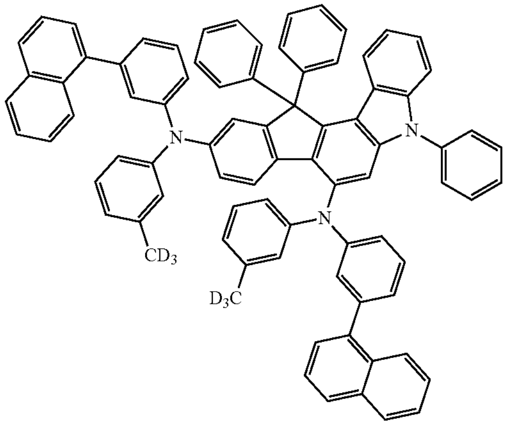
D2-21
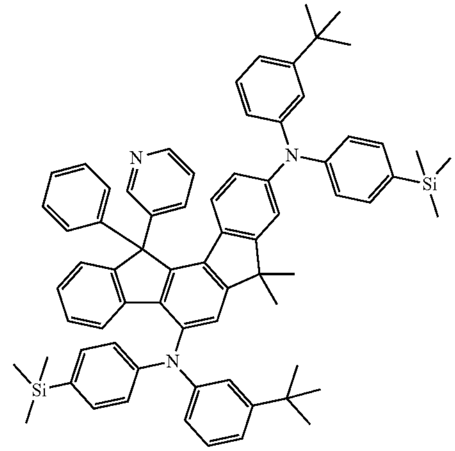

-continued
D2-22
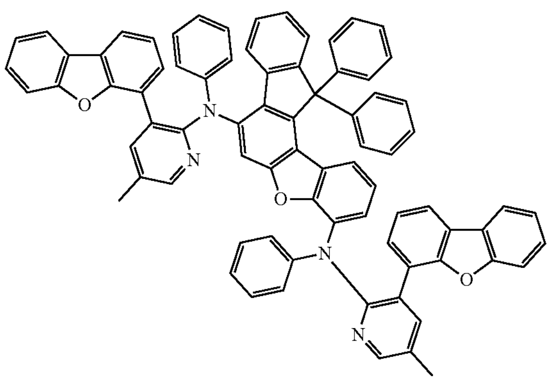
D2-23
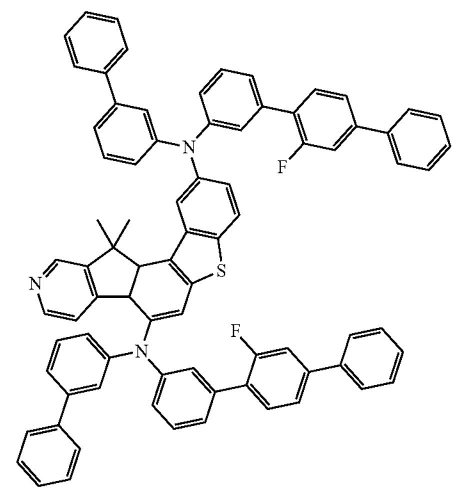
D2-24
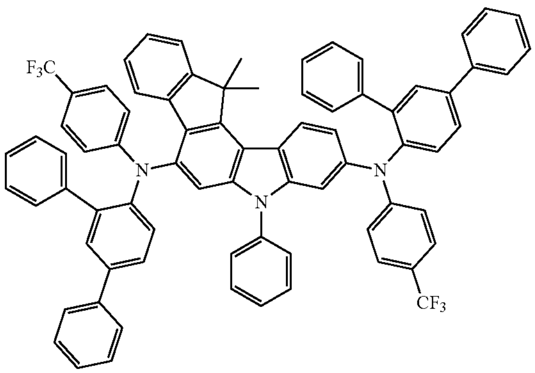
D2-25
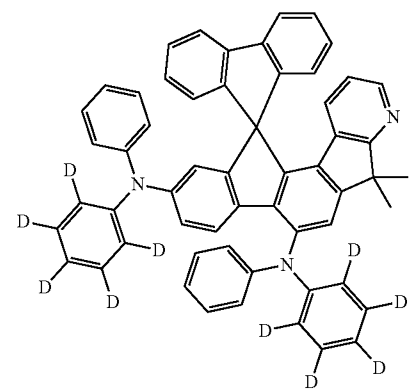
D2-26
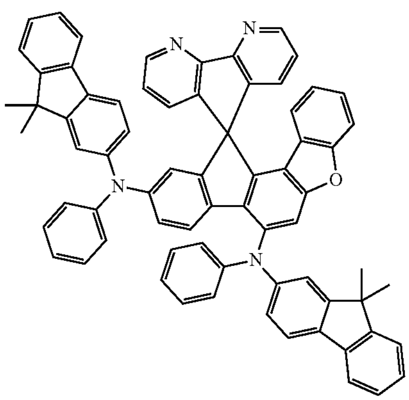
D2-27
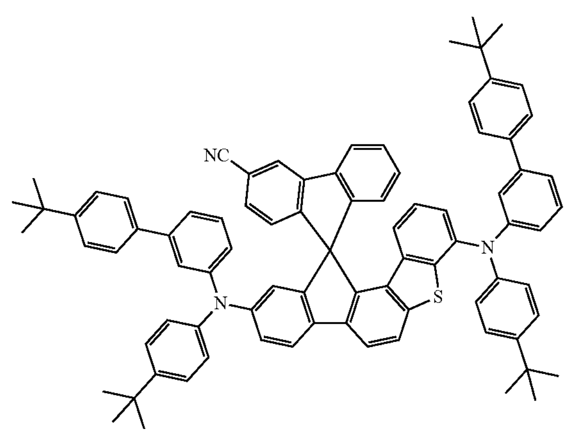

-continued
D2-28
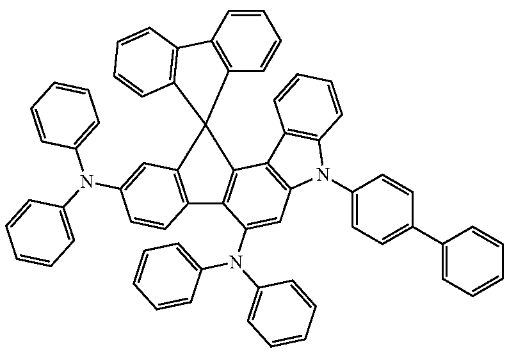
D2-29
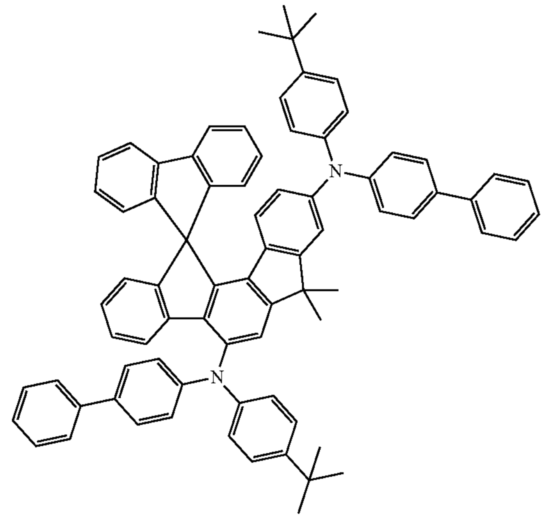
D2-30
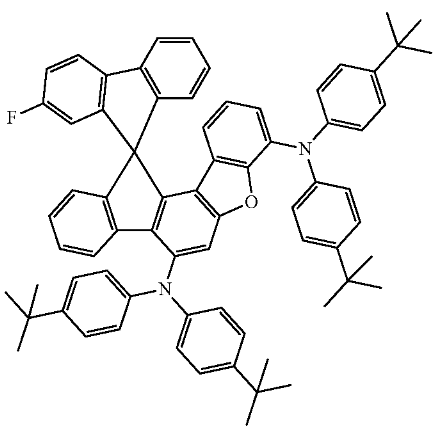
D2-31
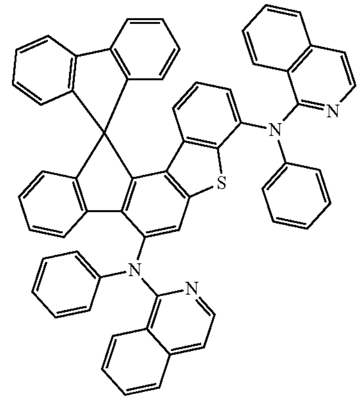
D2-32
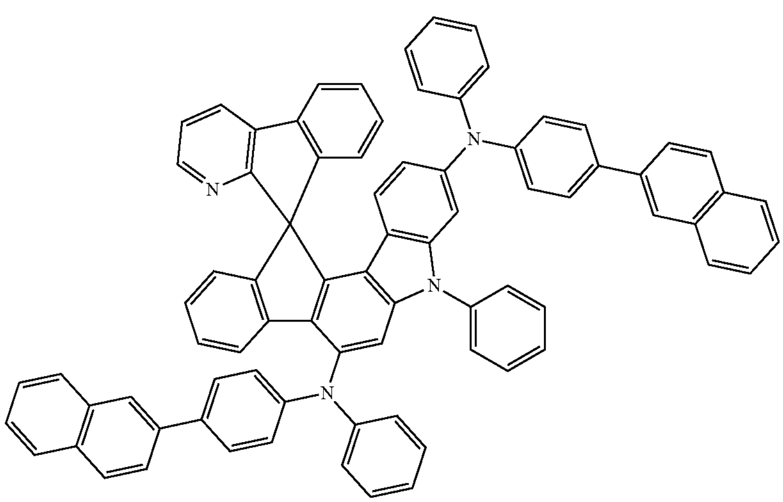

-continued
D2-33
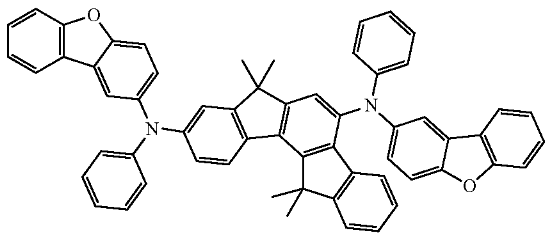
D2-34
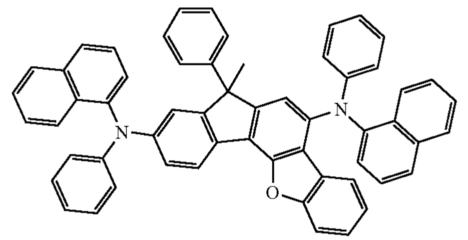
D2-35
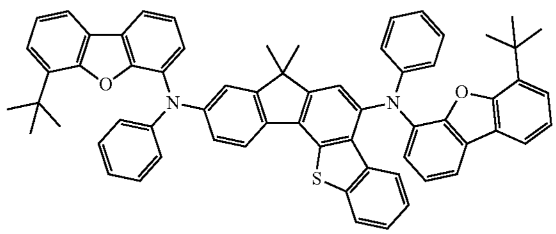
D2-36
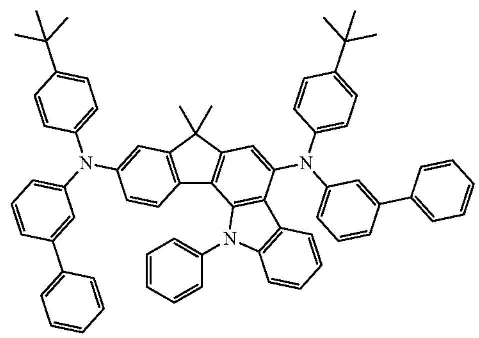
D-37
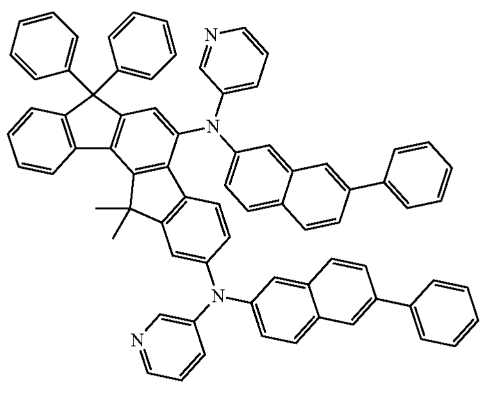
D-38
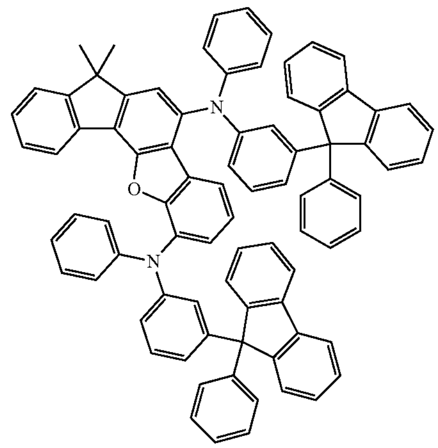
D-39
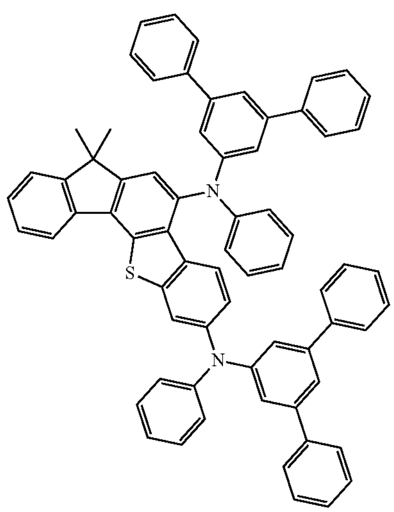
D-40
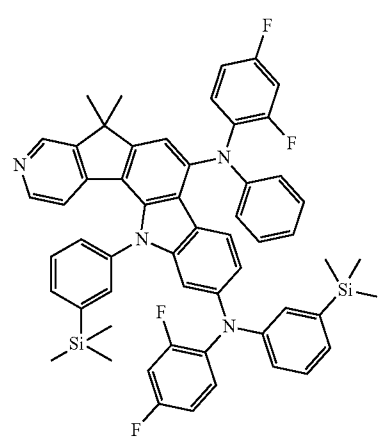

-continued
D2-41
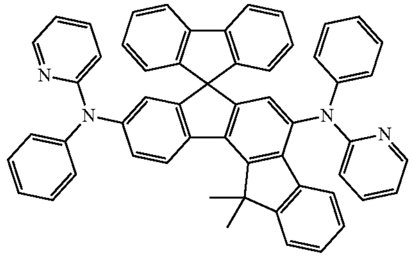
D2-42
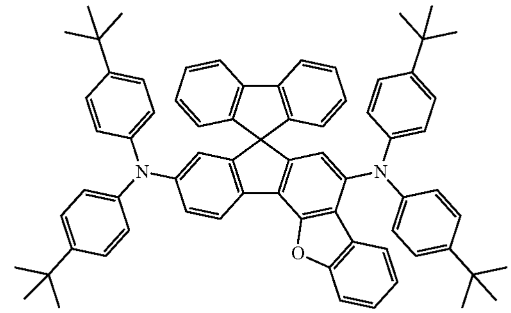
D2-43
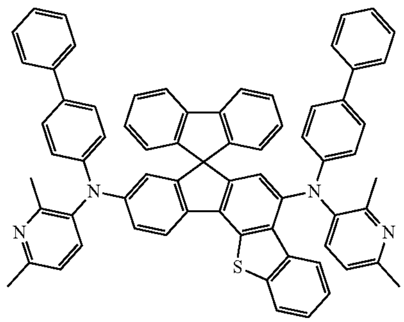
D2-44
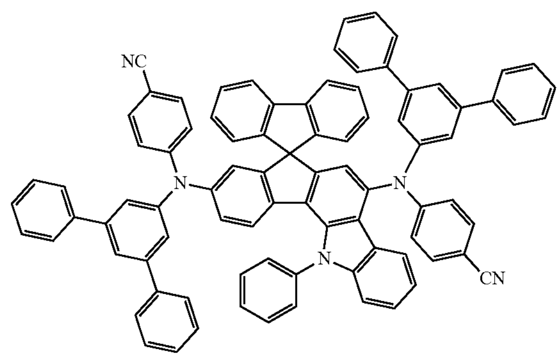
D2-45
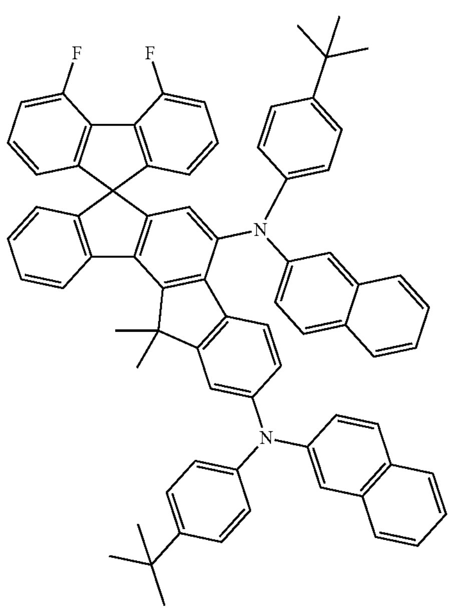

-continued
D2-46
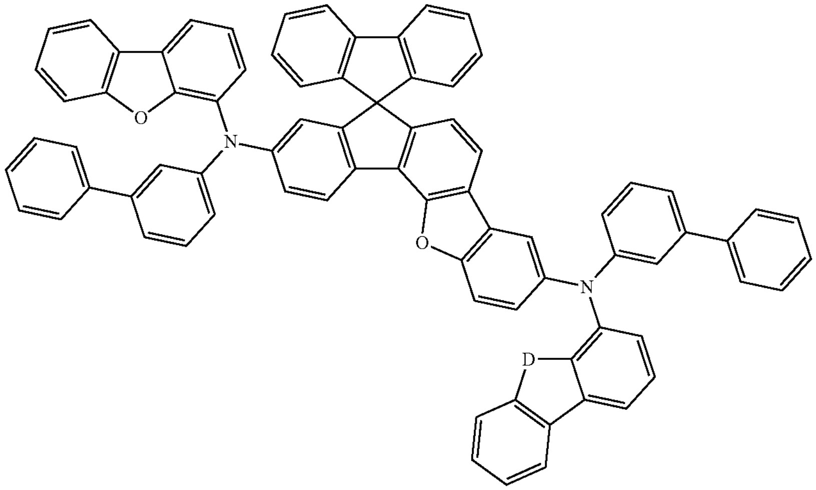
D2-47
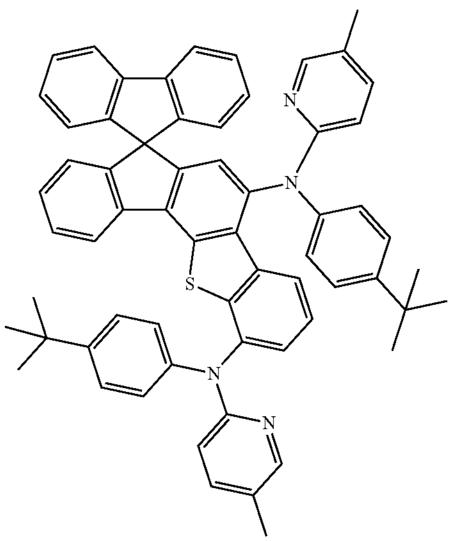
D2-48
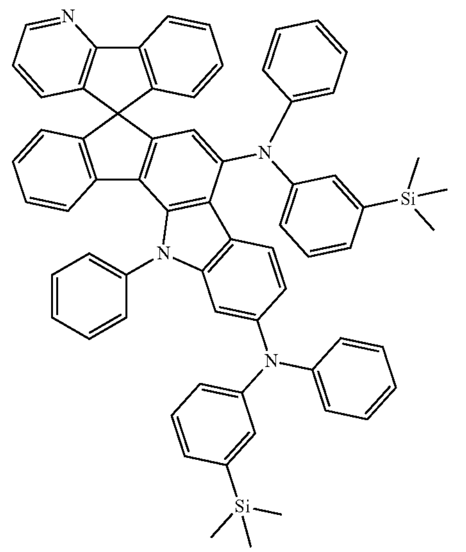
D2-49
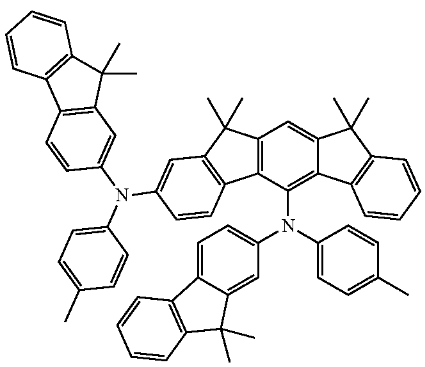
D2-50
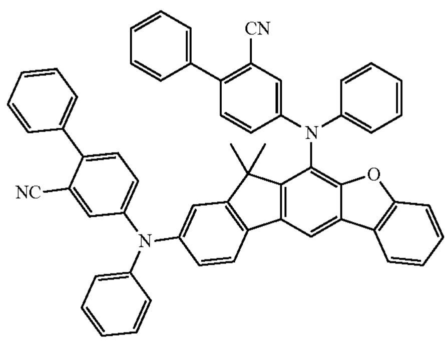

-continued
D2-51
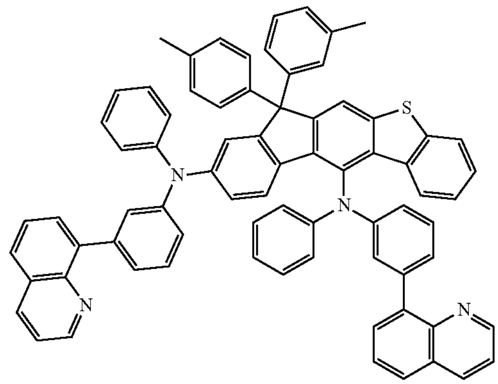
D2-52
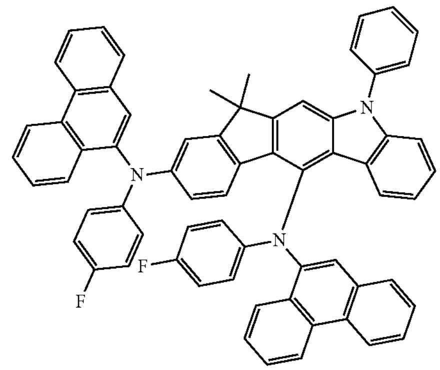
D2-53
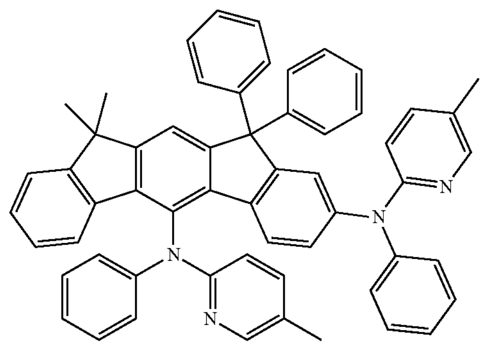
D2-54
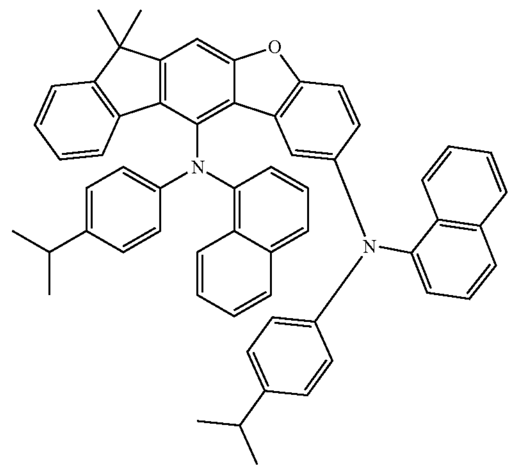
D2-55
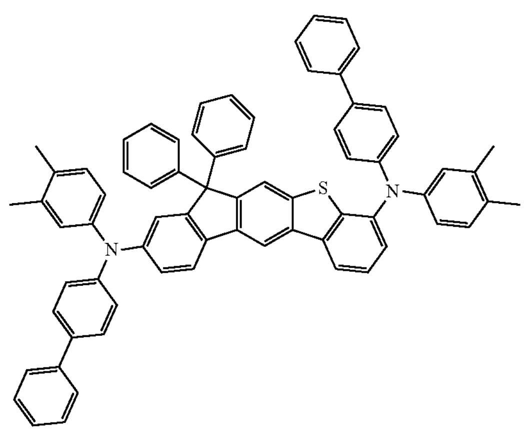
D2-56
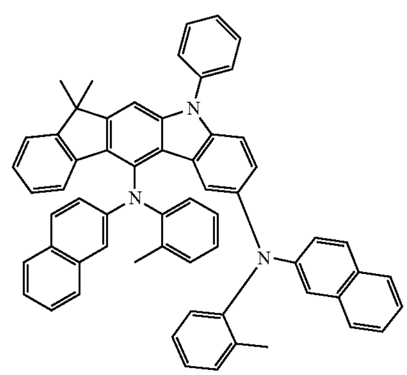

-continued
D2-57
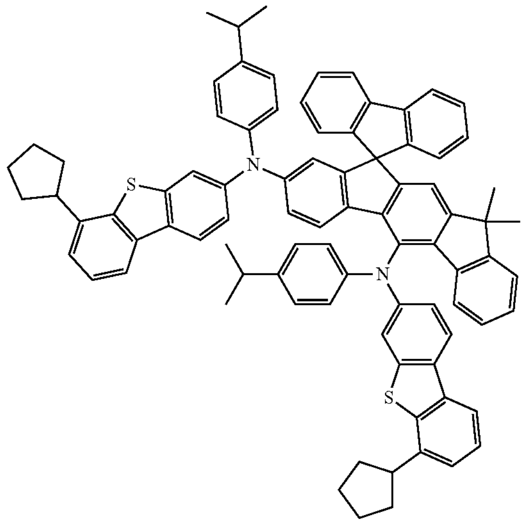
D2-58
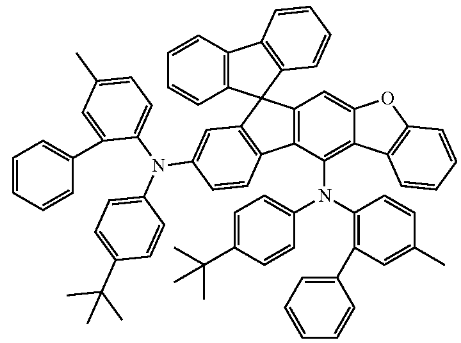
D2-59
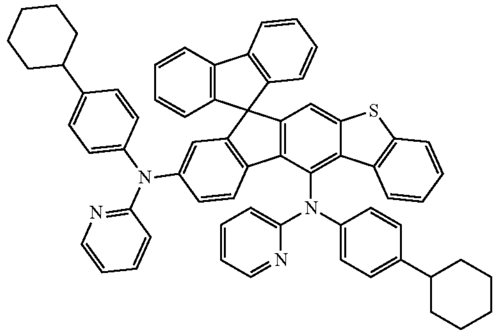
D2-60
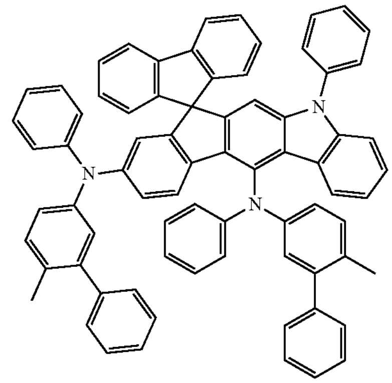
D2-61
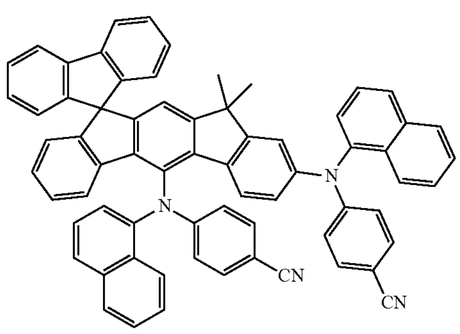
D2-62
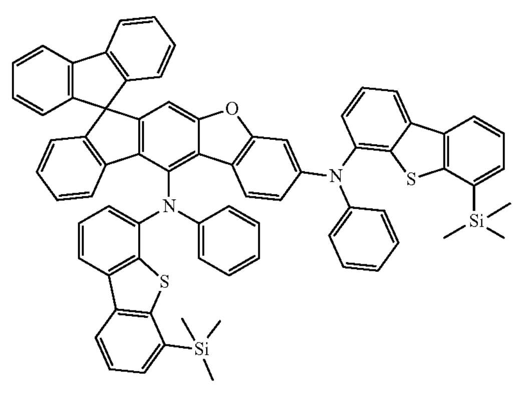

-continued
D2-63
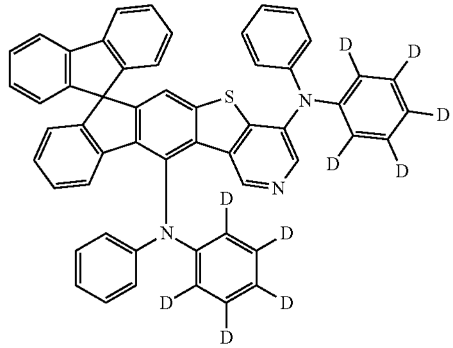
D2-64
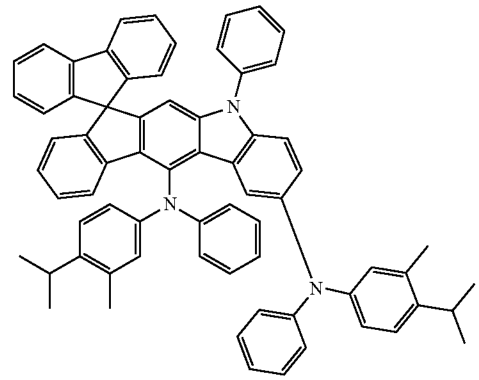
D2-65
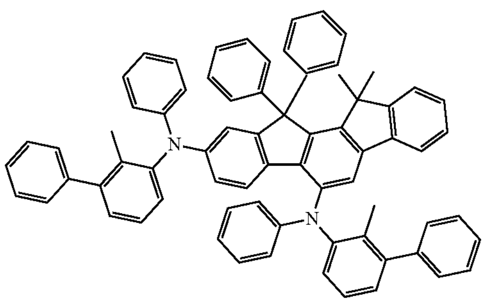
D2-66
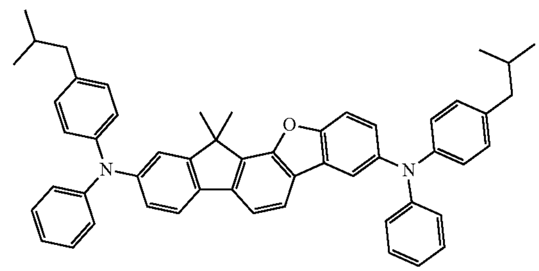
D2-67
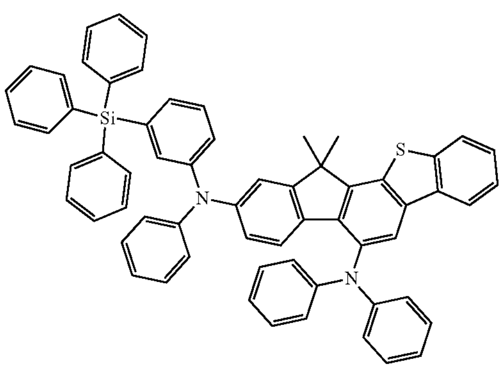
D2-68
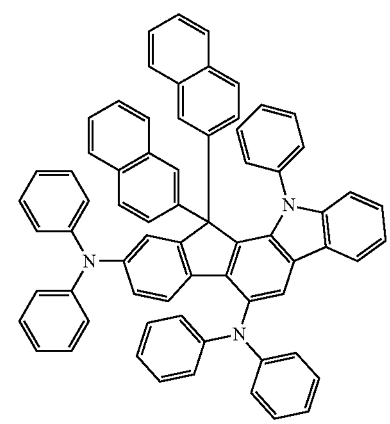
D2-69
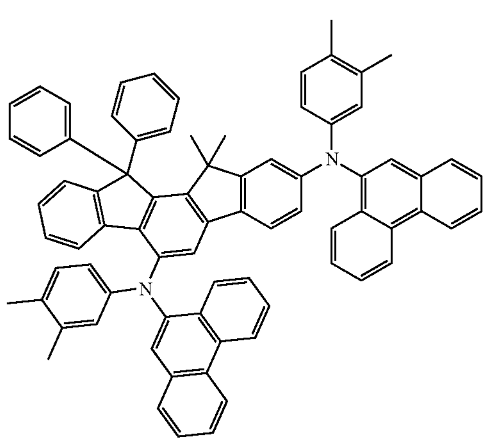
D2-70
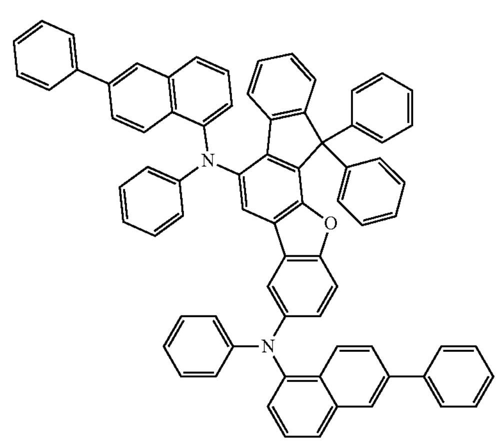

-continued
D2-71
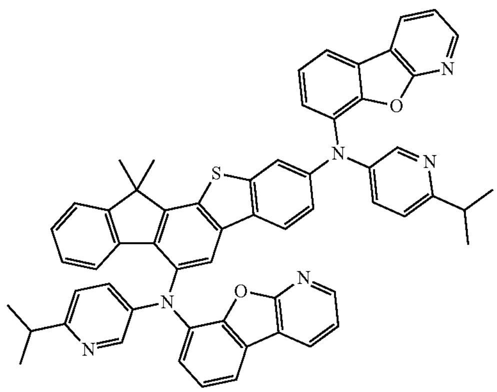
D2-72
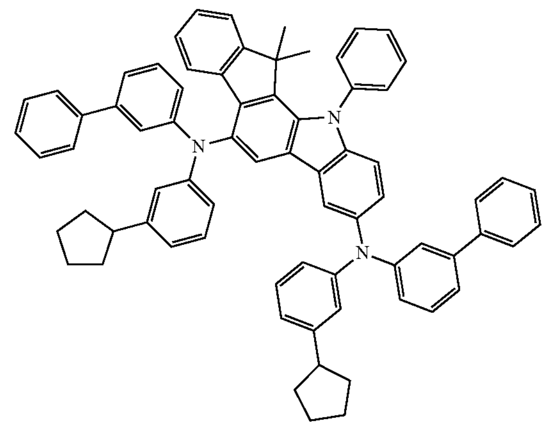
D2-73
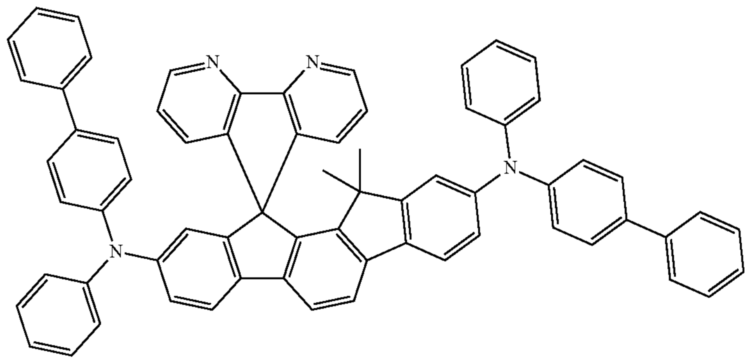
D2-74
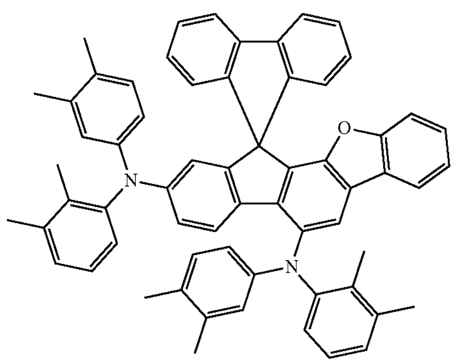
D2-75
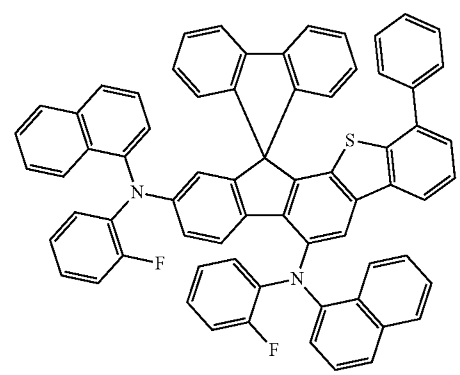
D2-76
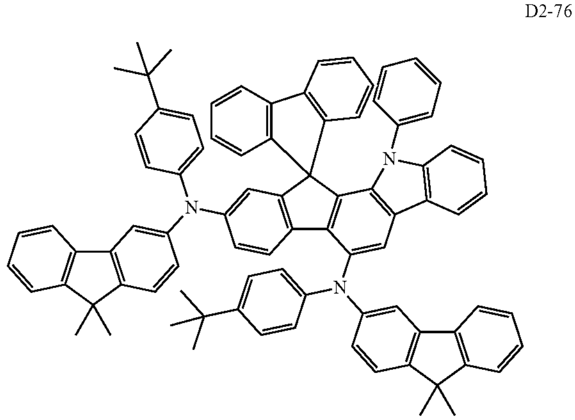
D2-77
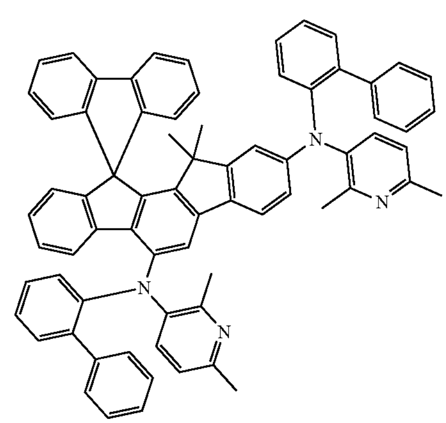

-continued
D2-78
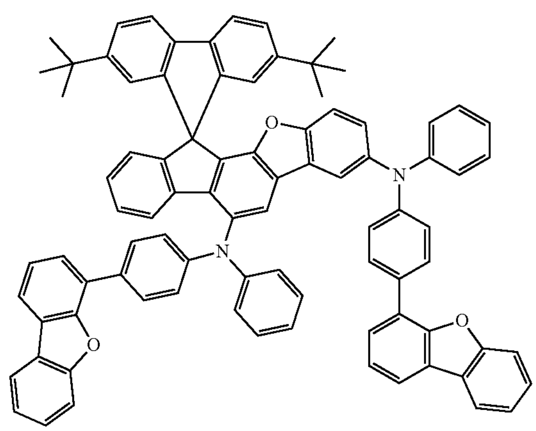
D2-79
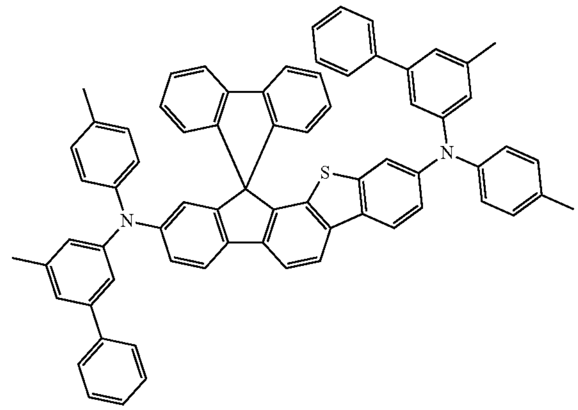
D2-80
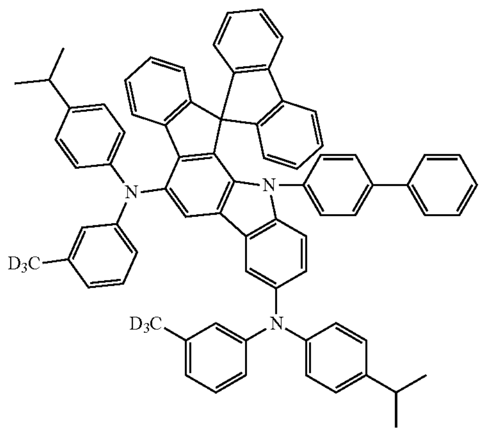
D2-81
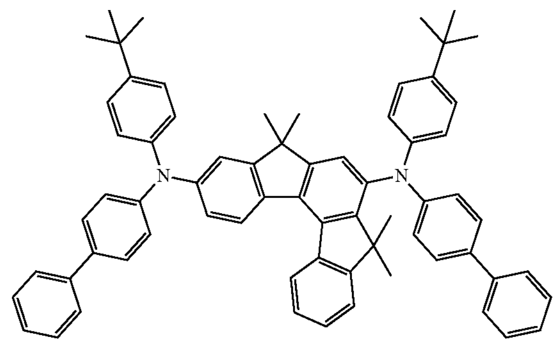
D2-82
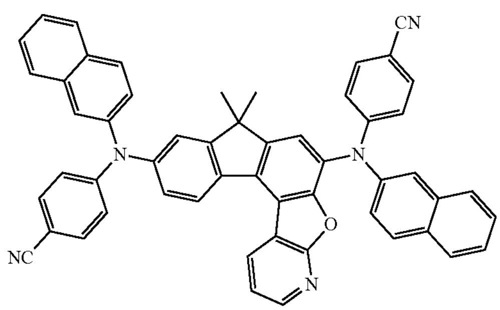
D2-83
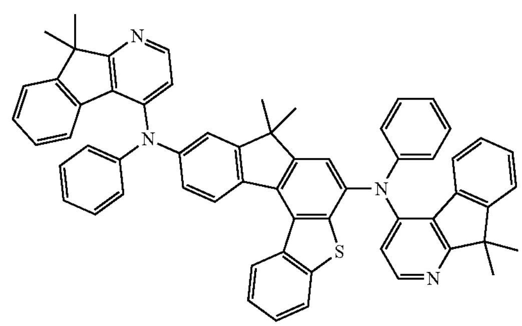
D2-84
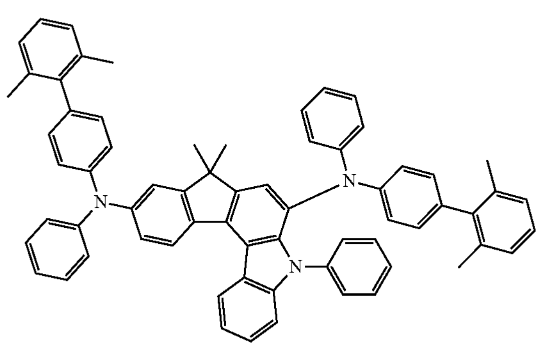
D2-85
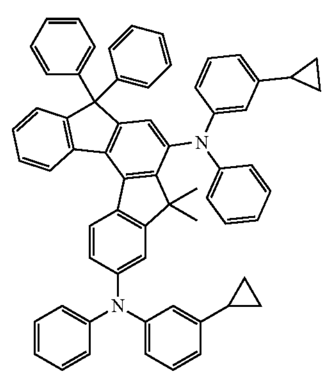

-continued
D2-86
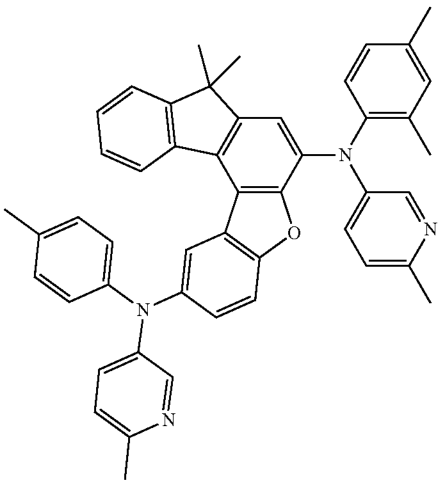
D2-87
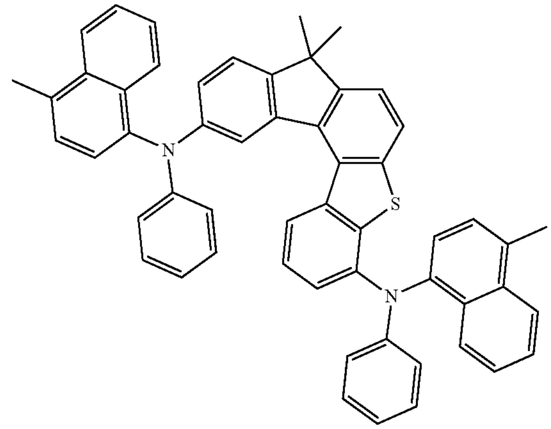
D2-88
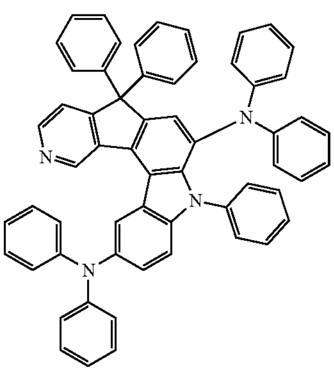
D2-89
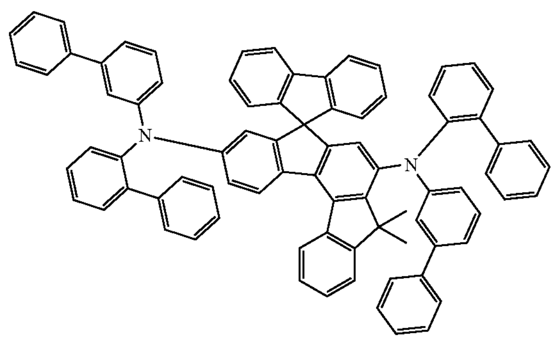
D2-90
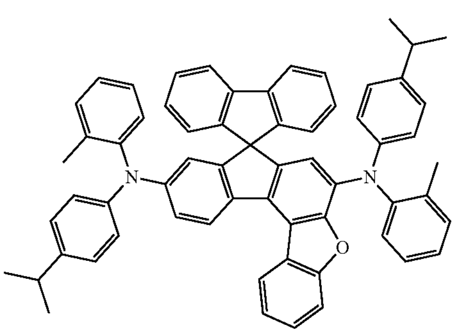
D2-91
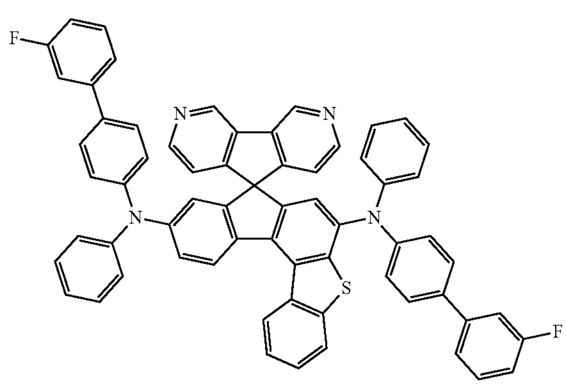

-continued
D2-92
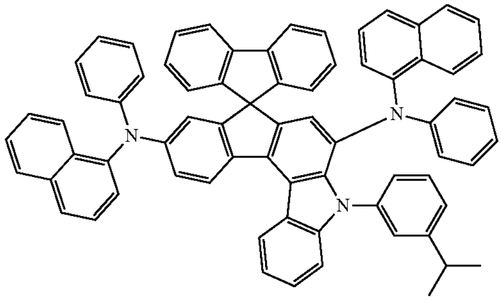
D2-93
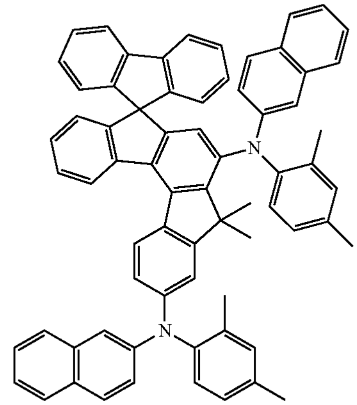
D2-94
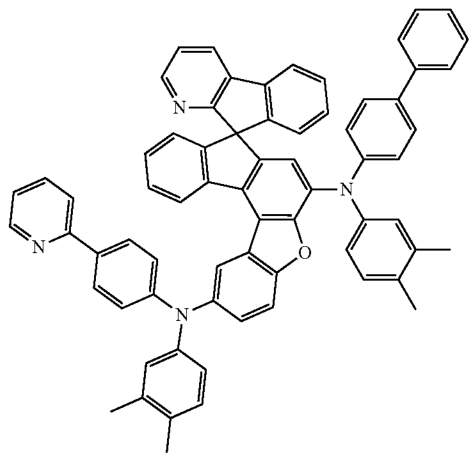
D2-95
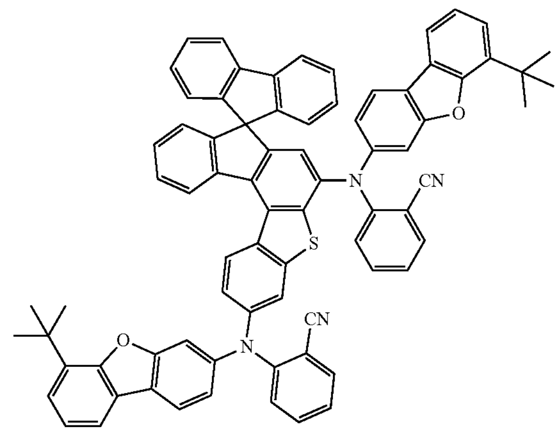
D2-96
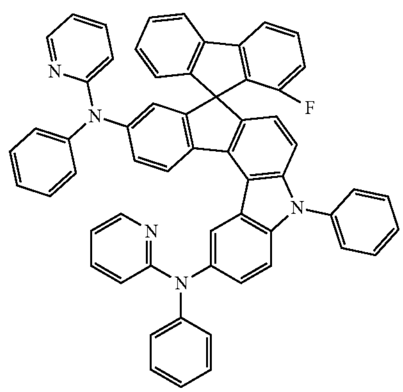
D2-97
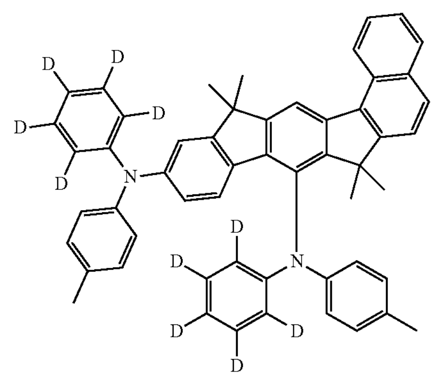
D2-98
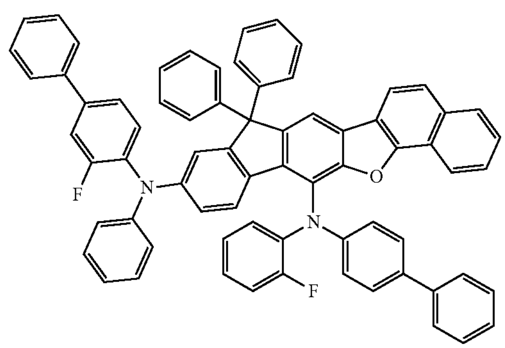
D2-99
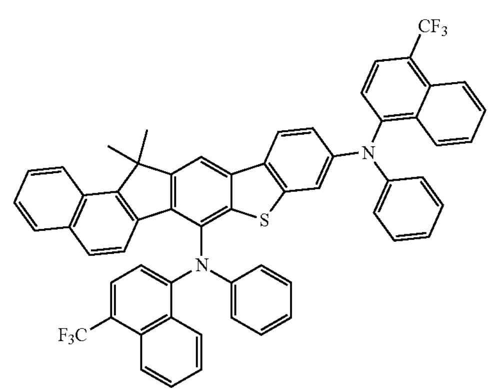

-continued
D2-100
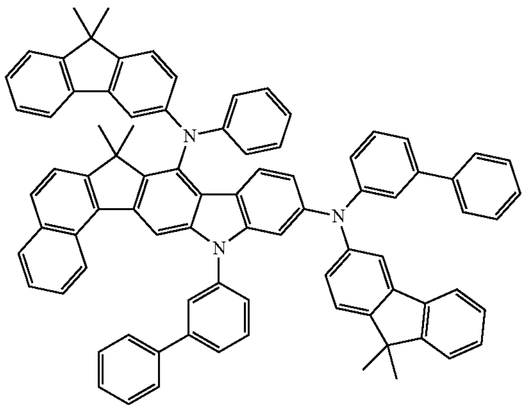
D2-101
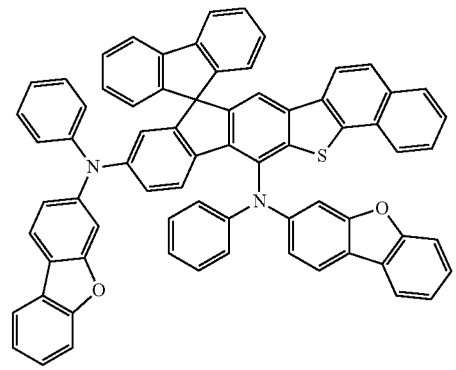
D2-102
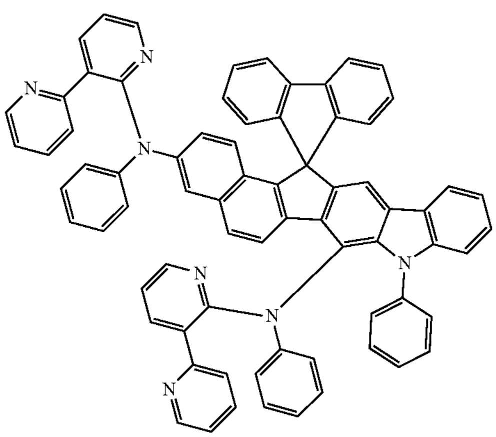
D2-103
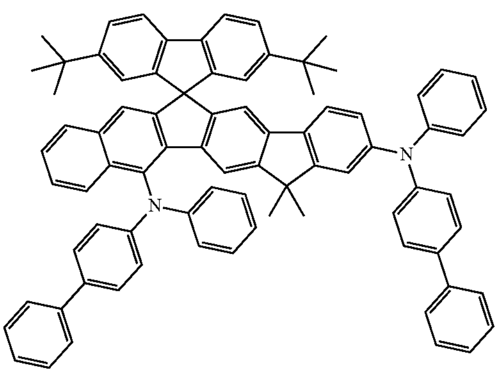
D2-104
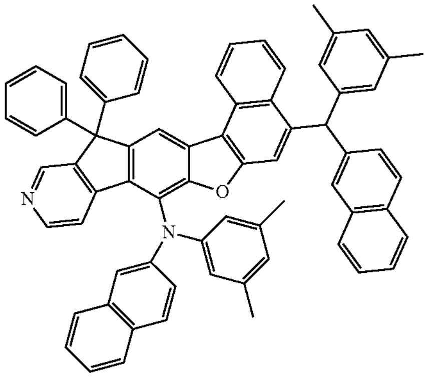
D2-105
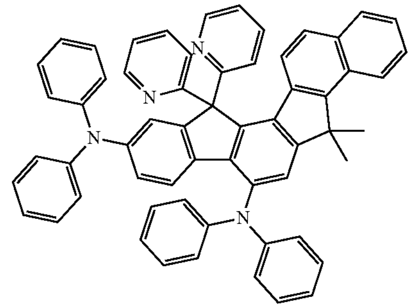

-continued
D2-106
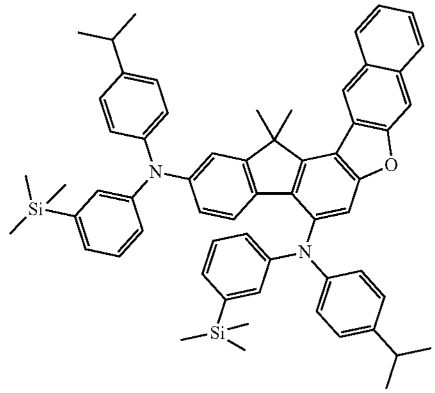
D2-107
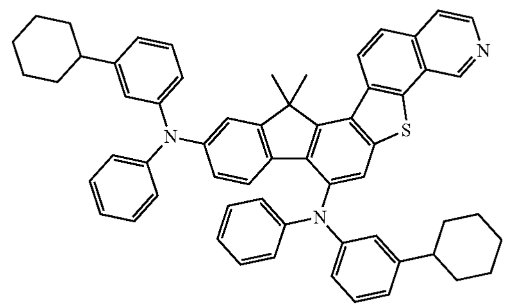
D2-108
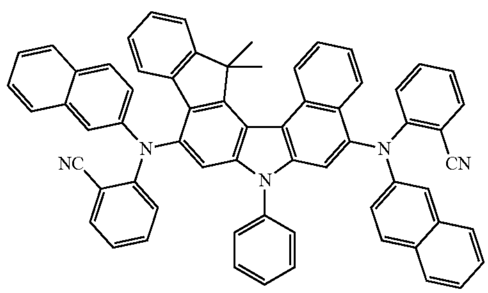
D2-109
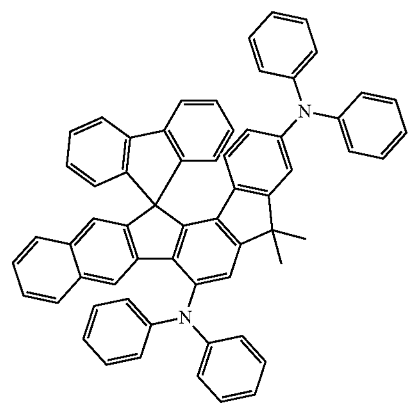
D2-110
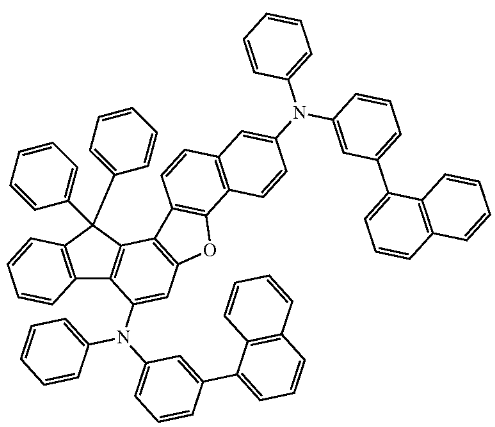
D2-111
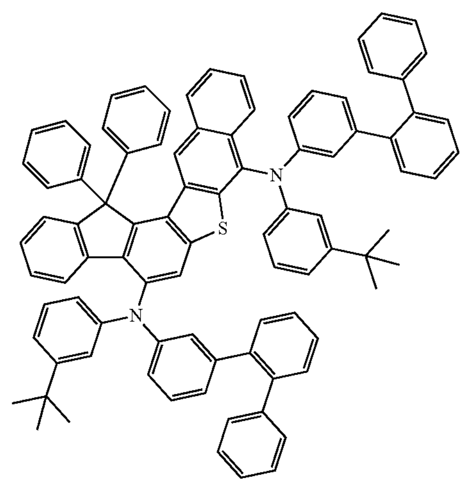

-continued
D2-112
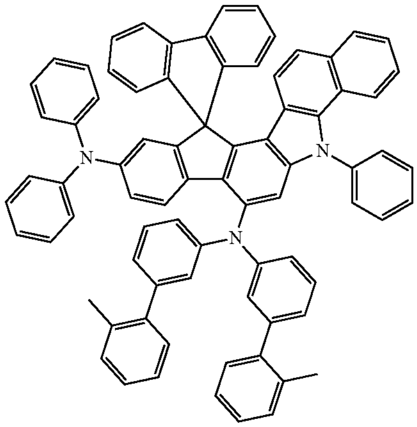
D2-113
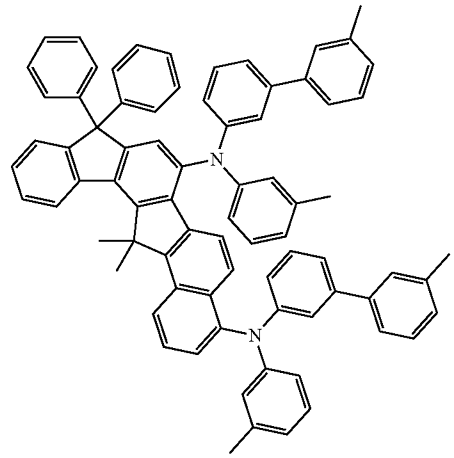
D2-114
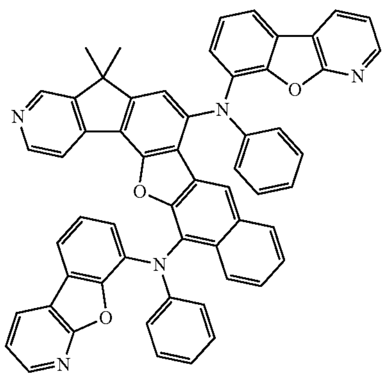
D2-115
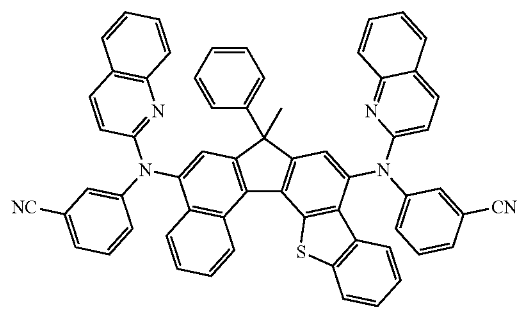
D2-116
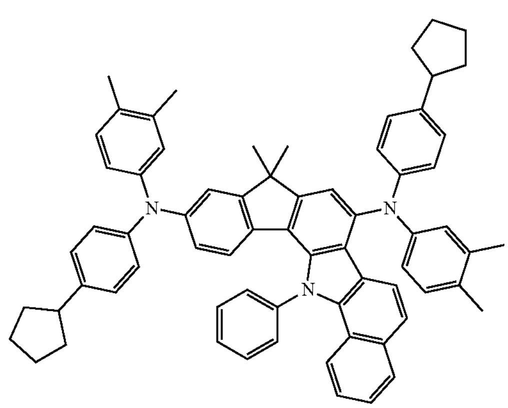
D2-117
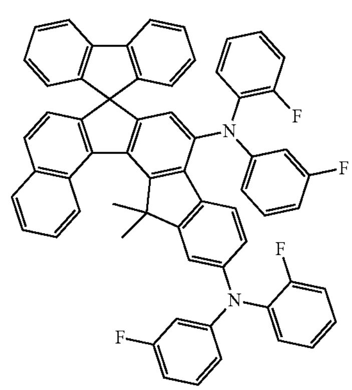

-continued
D2-118
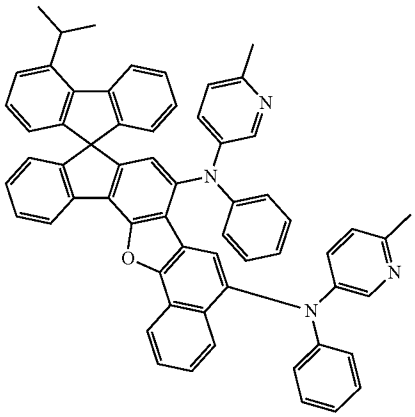
D2-119
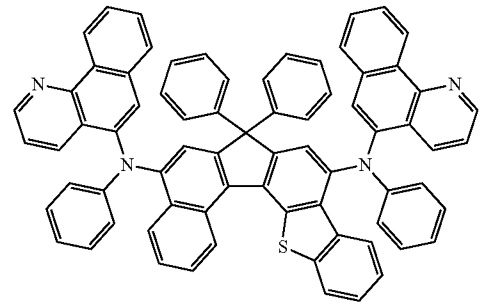
D2-20
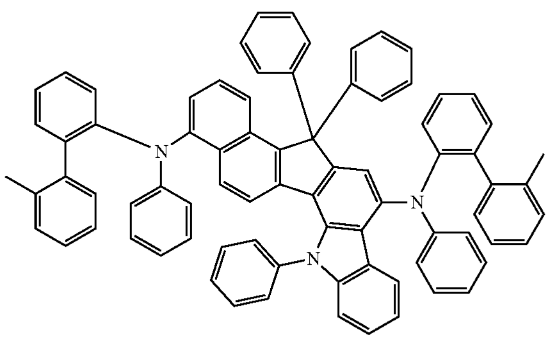
D2-21
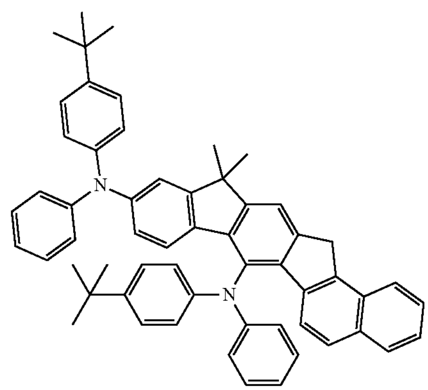
D2-22
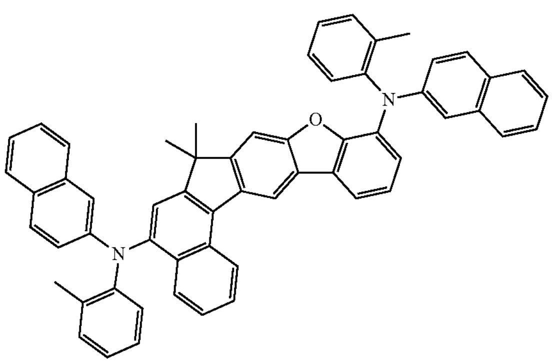
D2-23
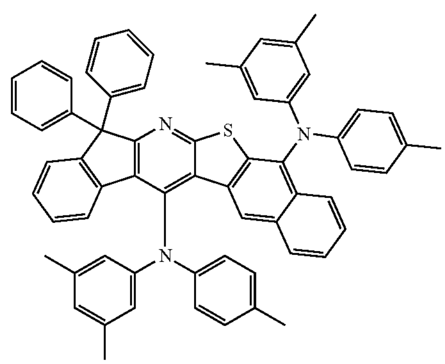
D2-24
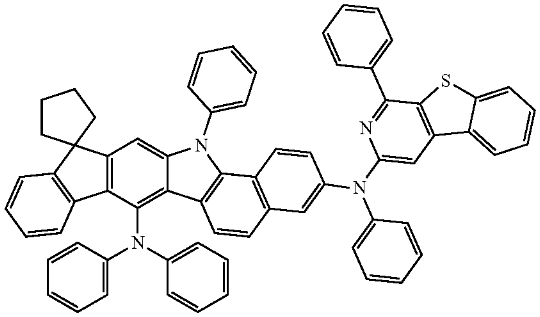
D2-25
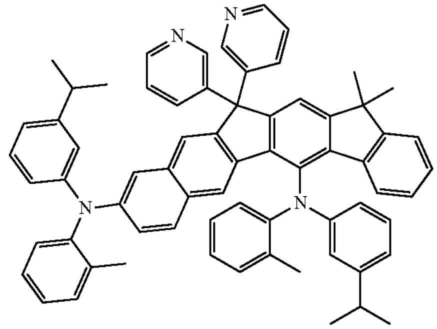

-continued
D2-26
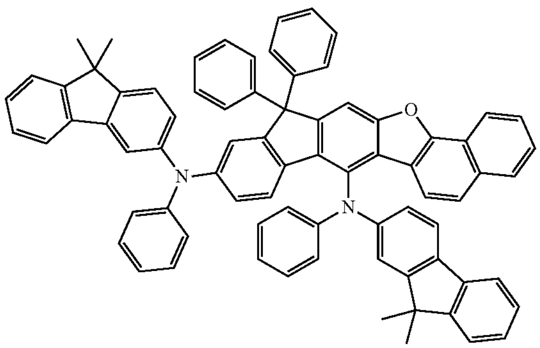
D2-27
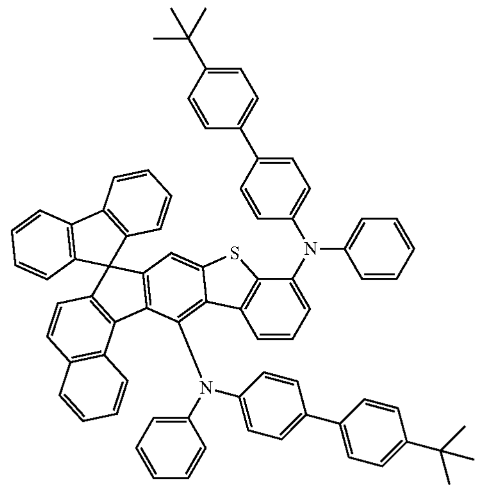
D2-128
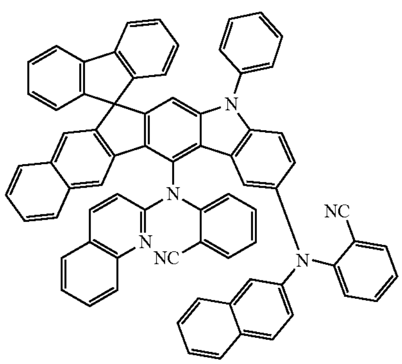
D2-129
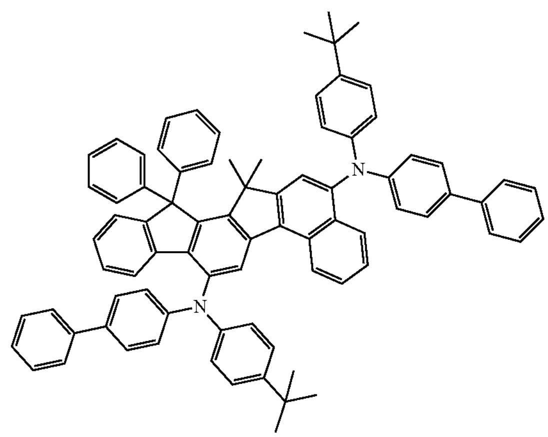
D2-130
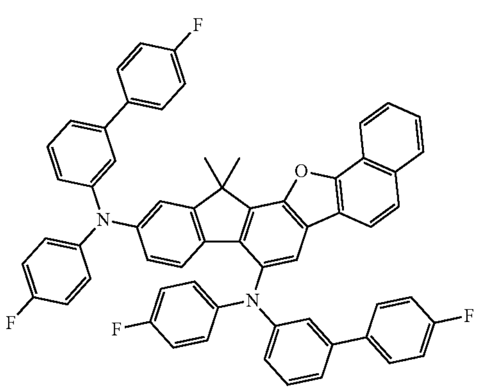
D2-131
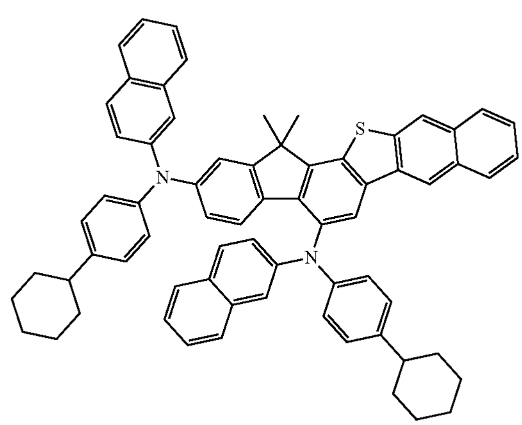

-continued
D2-132
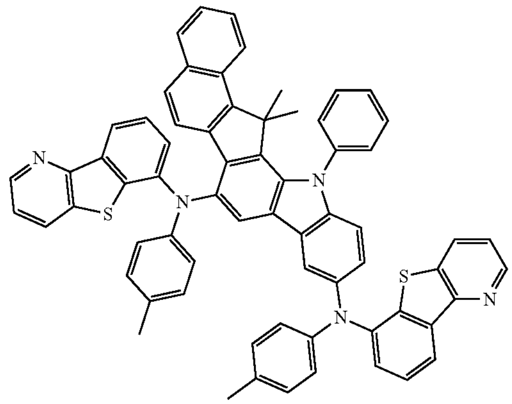
D2-133
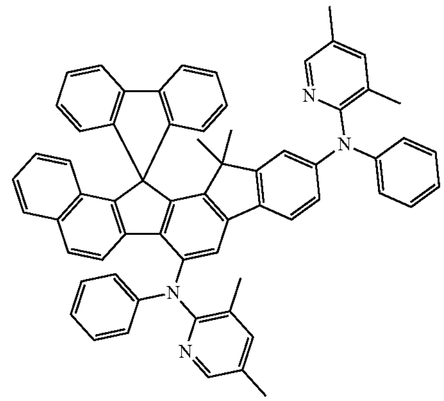
D2-134
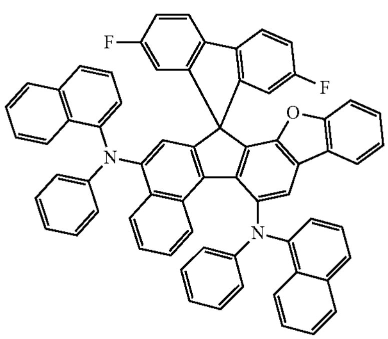
D2-135
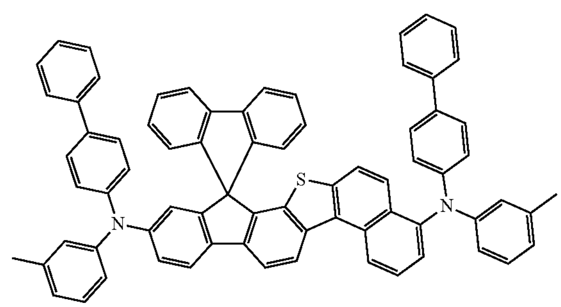
D2-136
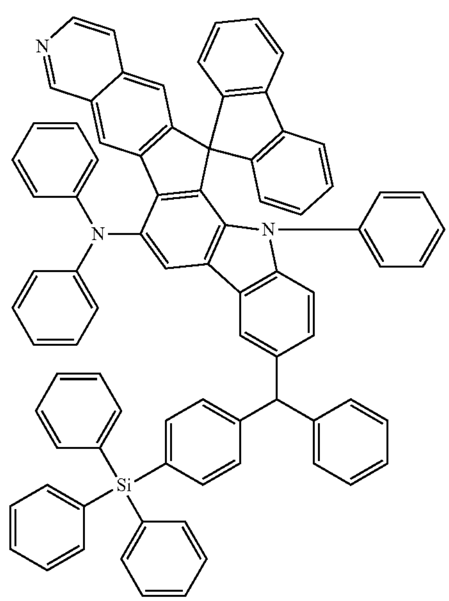
D2-137
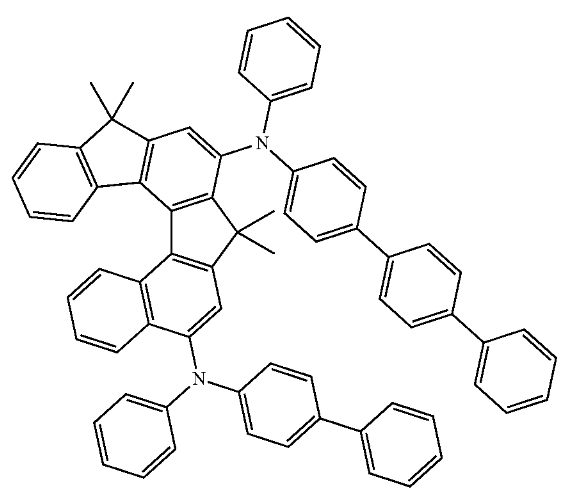

-continued
D2-138
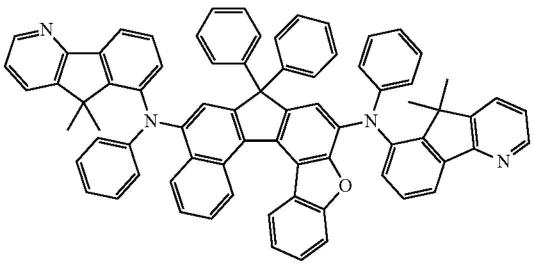
D2-139
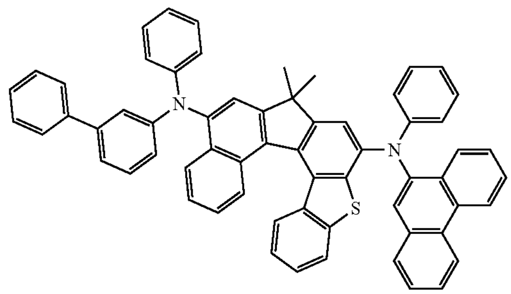
D2-140
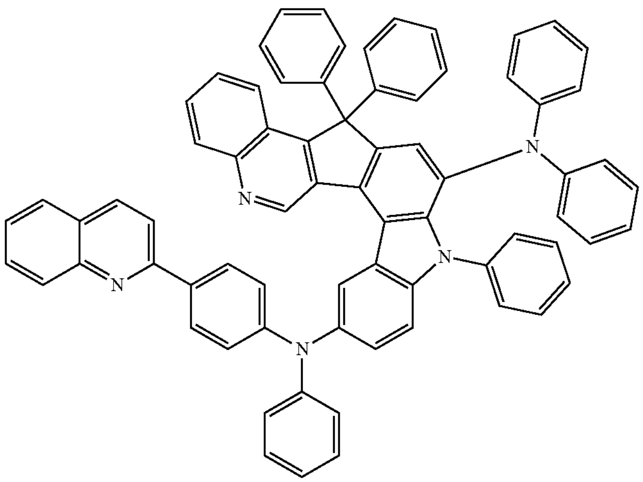
D2-141
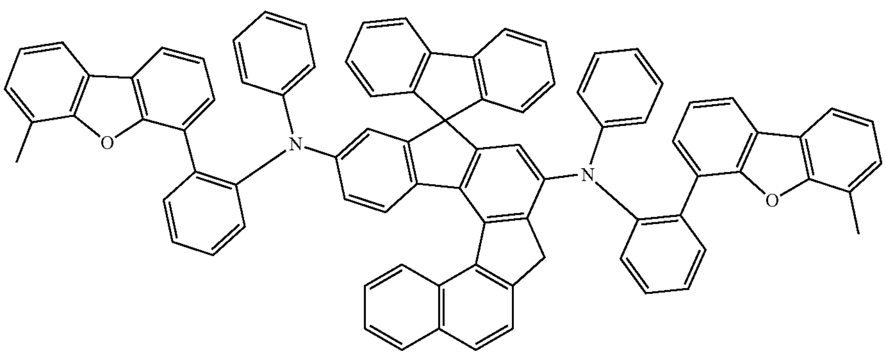
D2-142
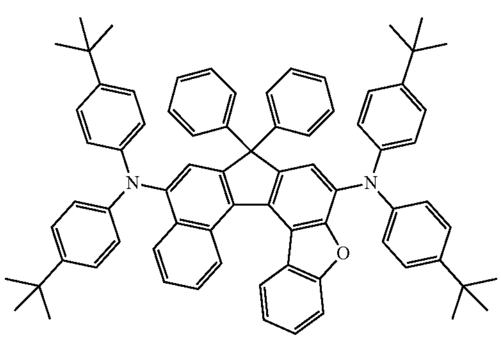
D2-143
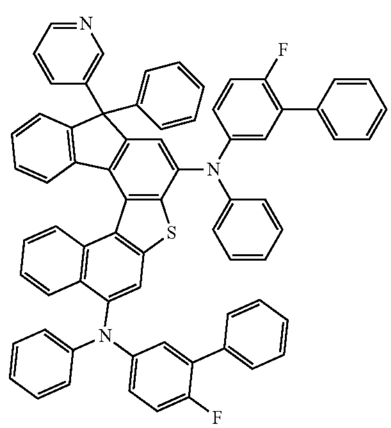

-continued
D2-144
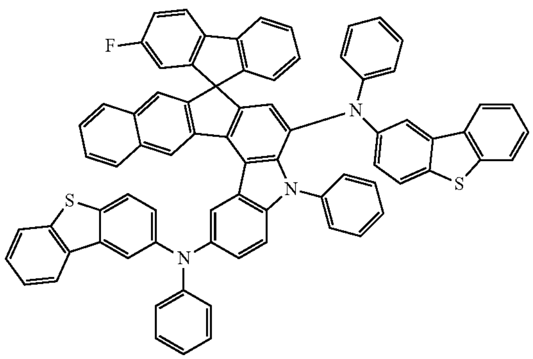
D2-145
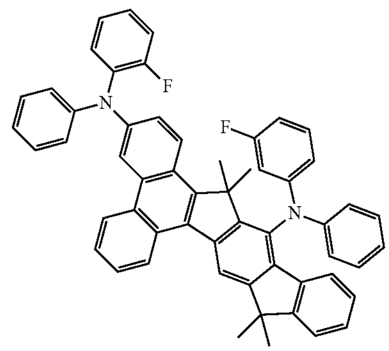
D2-146
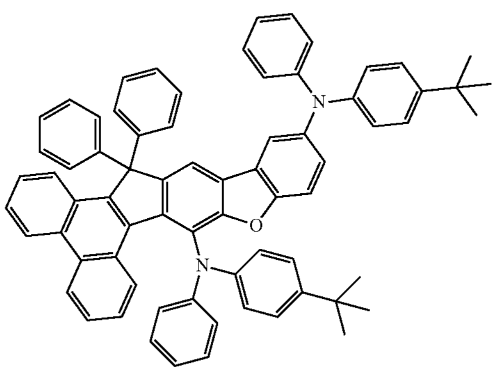
D2-147
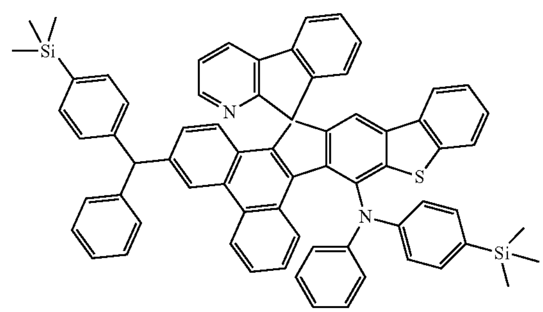
D2-148
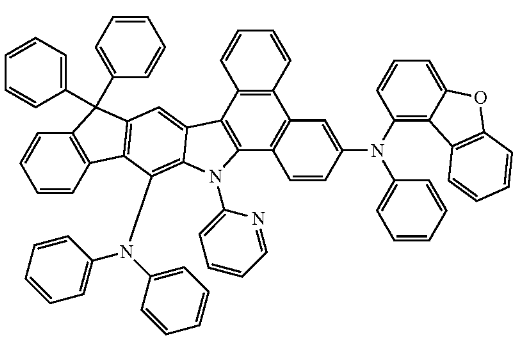
D2-149
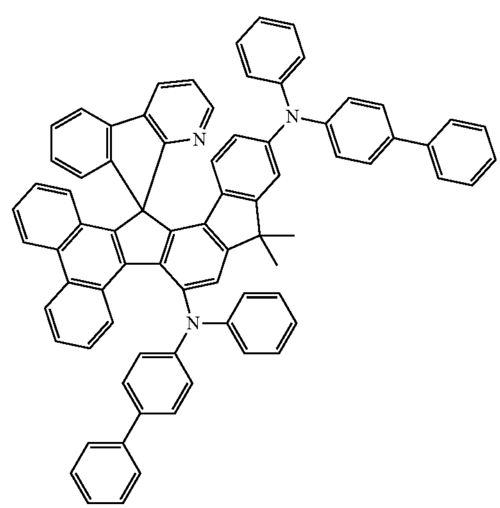

-continued
D2=150
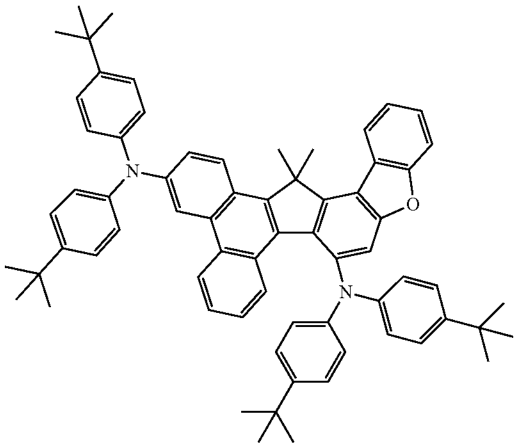
D2-151
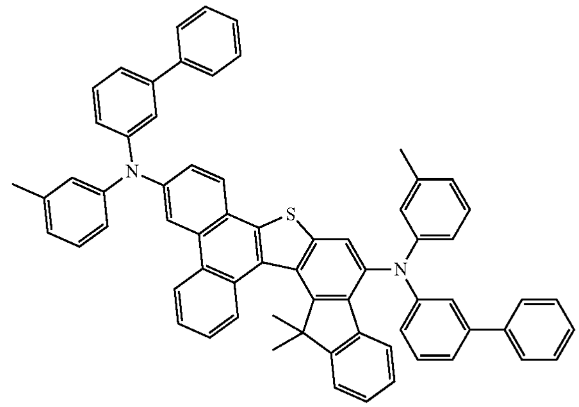
D2-152
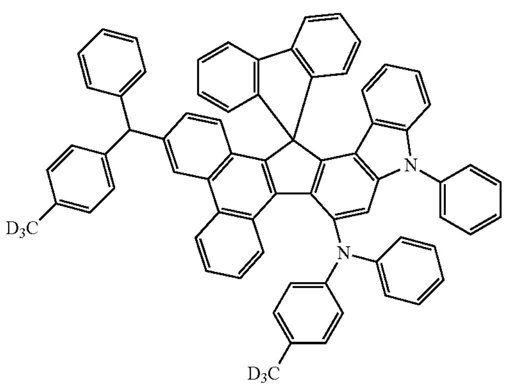
D2-153
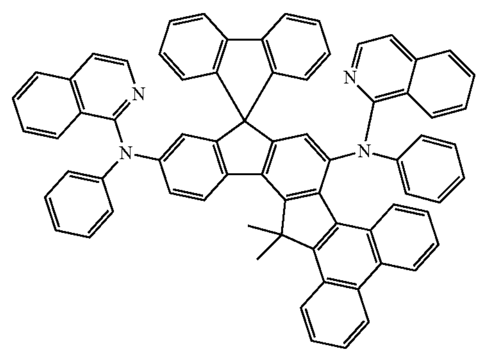
D2-154
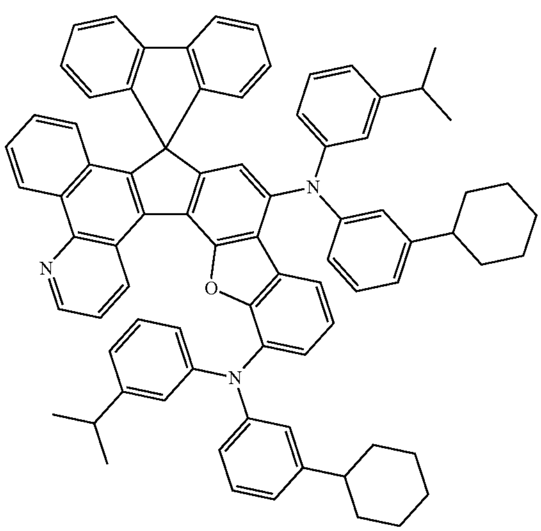

-continued
D2-155
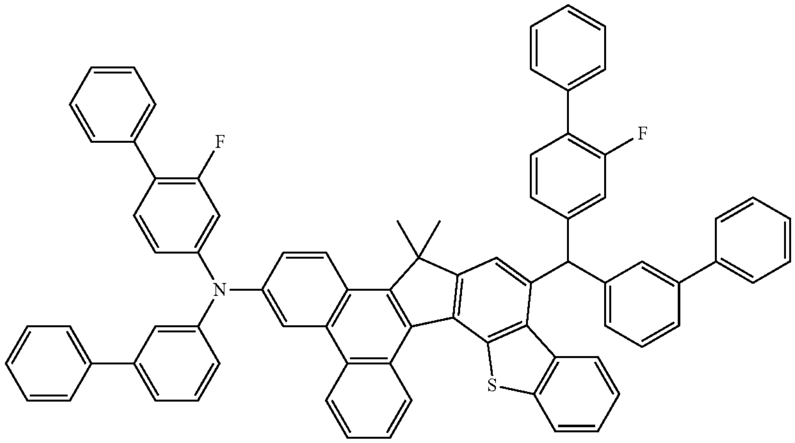
D2-156
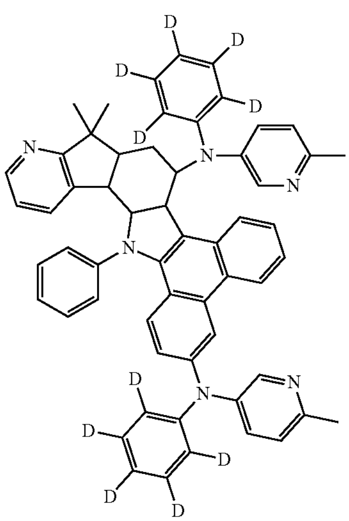
D2-157
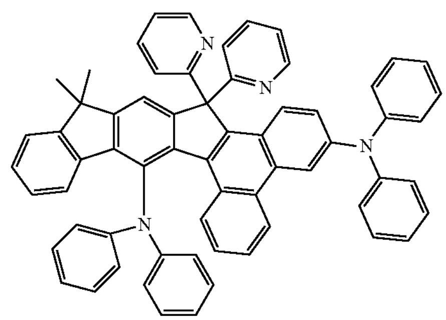
D2-158
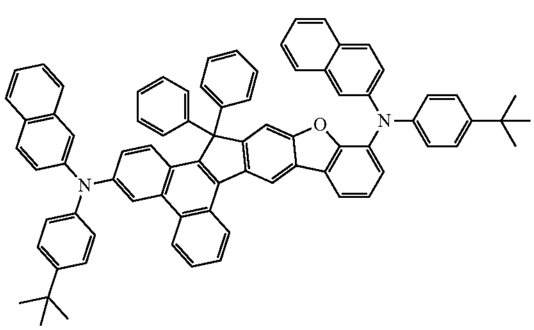
D2-159
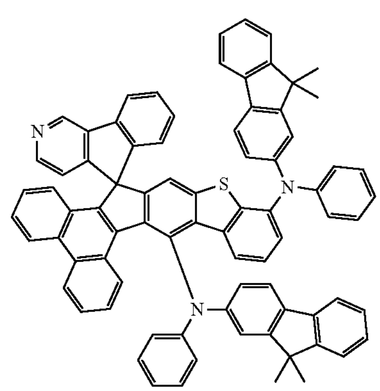

-continued
D2-160
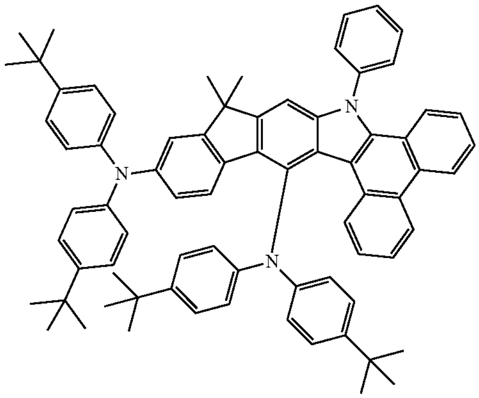
D2-161
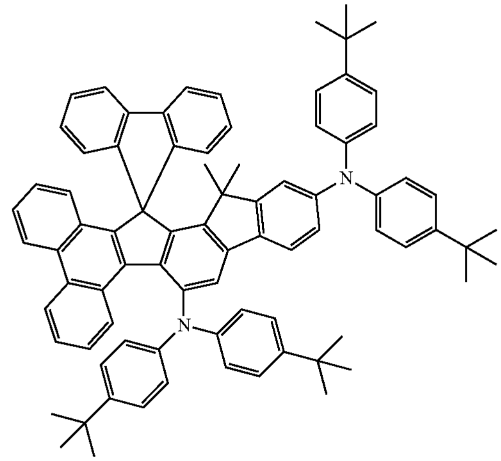
D2-162
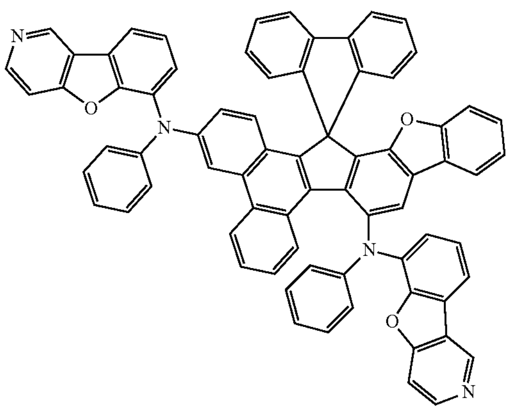
D2-163
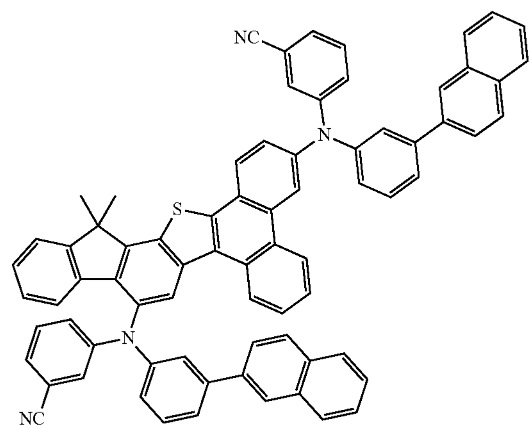
D2-164
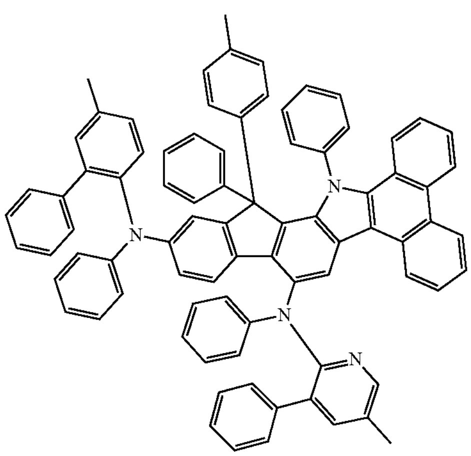
D2-165
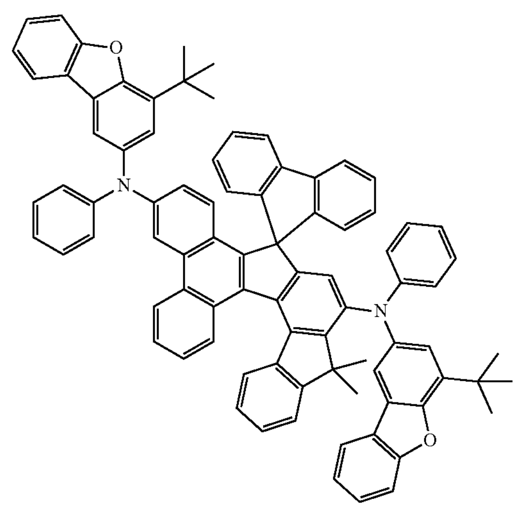

-continued
D2-166
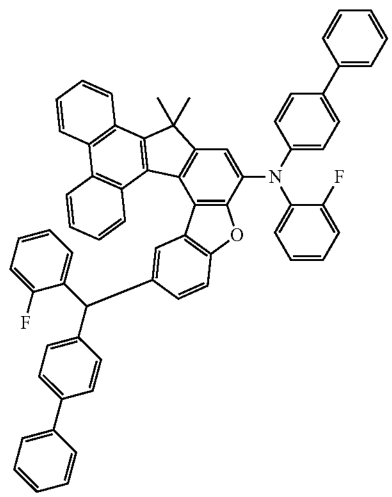
D2-167
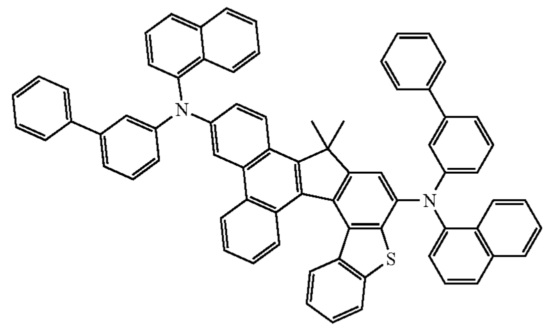
D2-168
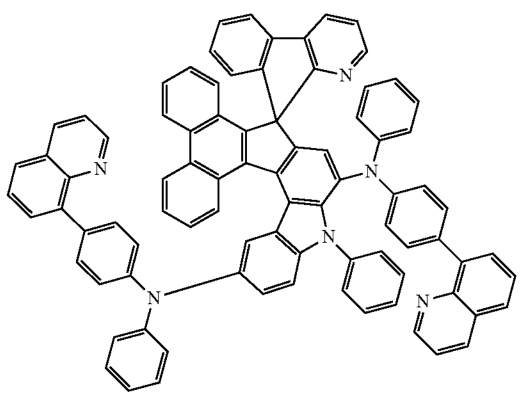
D2-169
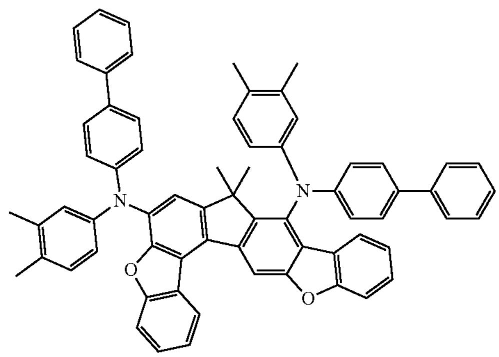
D2-170
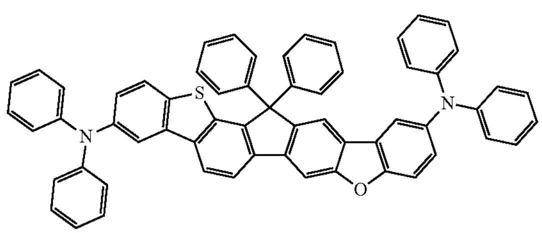
D2-171
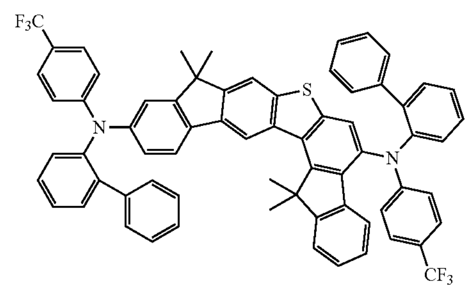
D2-172
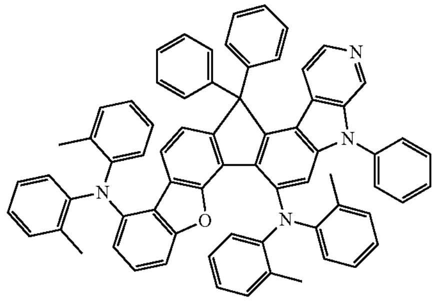
D2-173
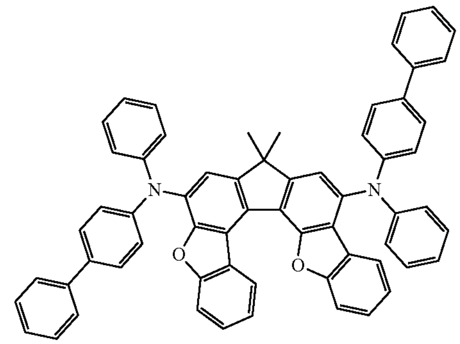

-continued
D2-174
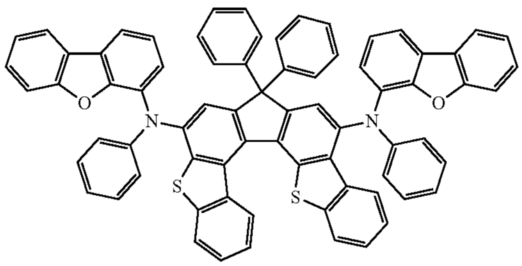
D2-175
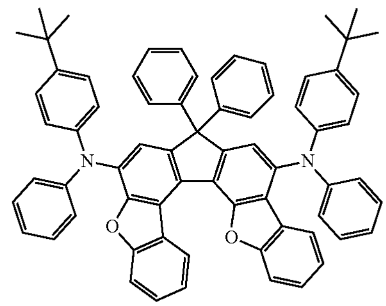
D2-176
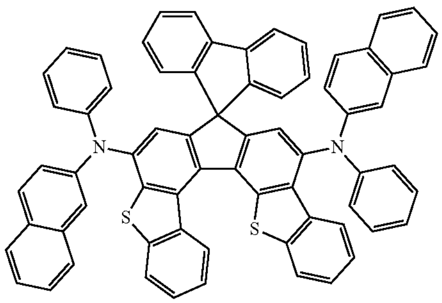
D2-177
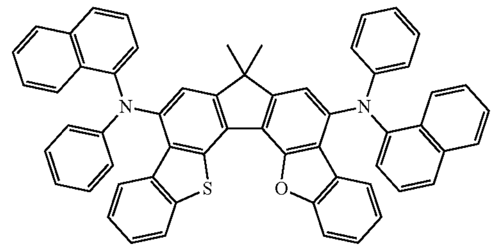
D2-178
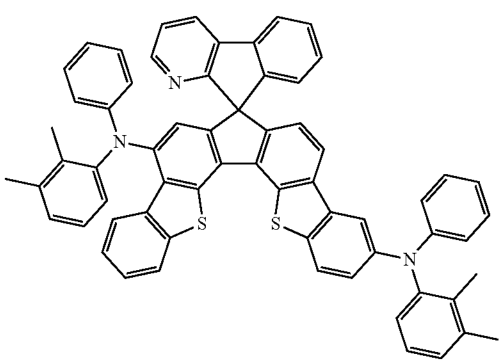
D2-179
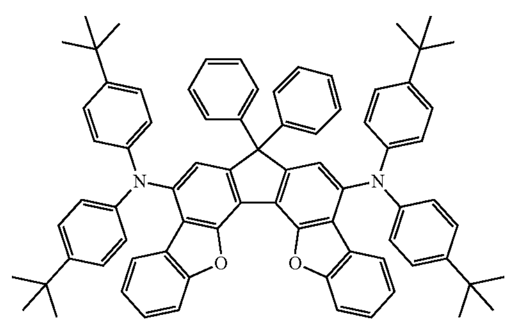
D2-180
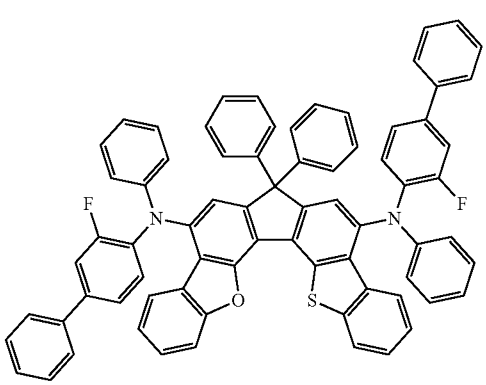
D2-181
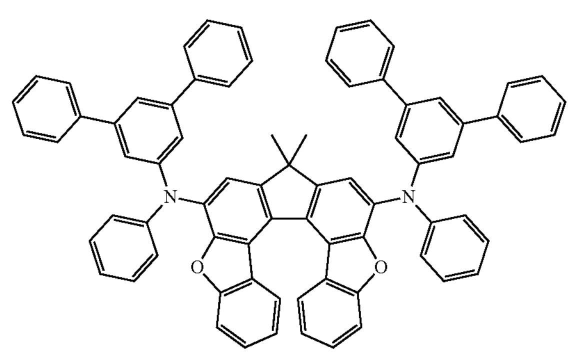

-continued
D2-182
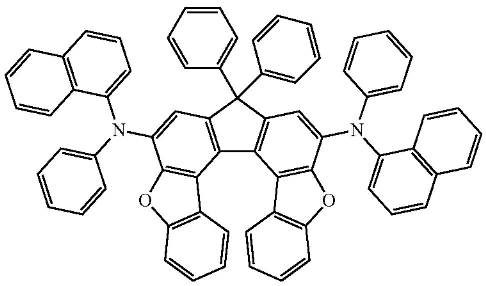
D2-183
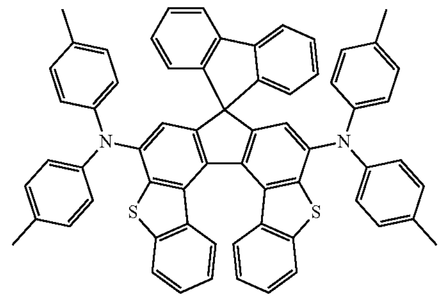
D2-184
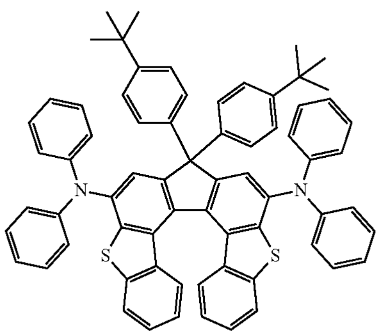
D2-185
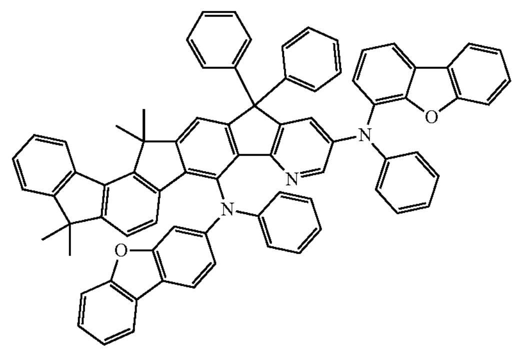
D2-186
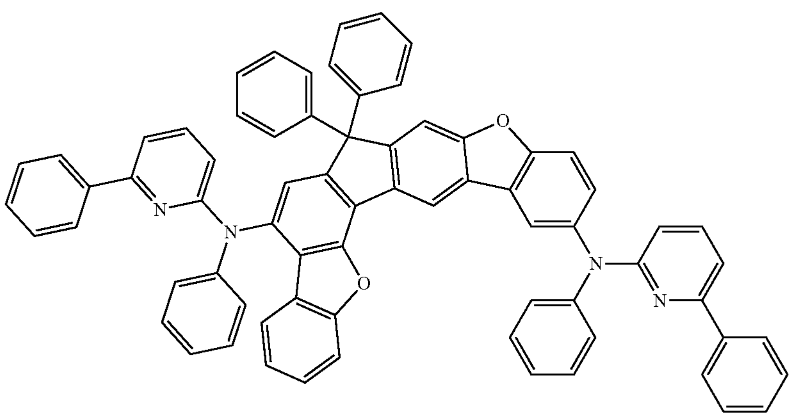
D2-187
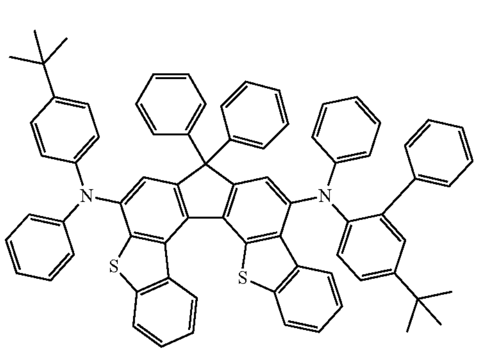
D2-188
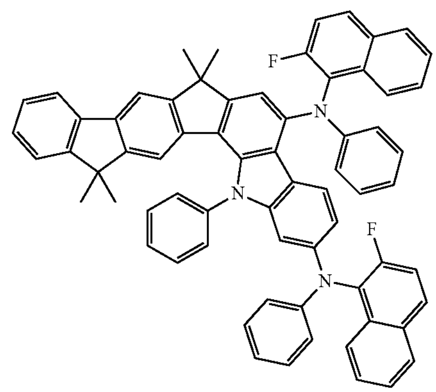

-continued
D2-189
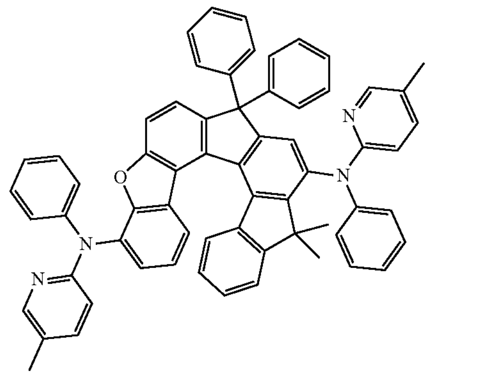
D2-190
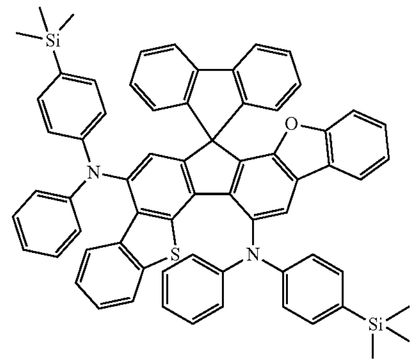
D2-191
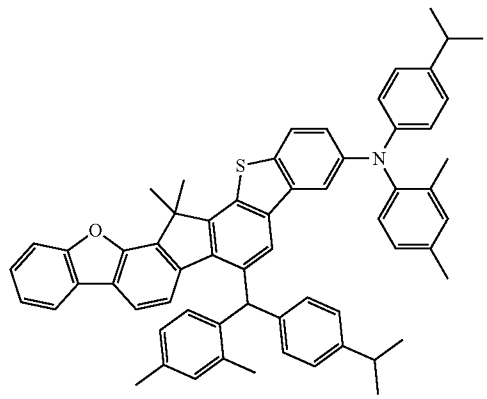
D2-192
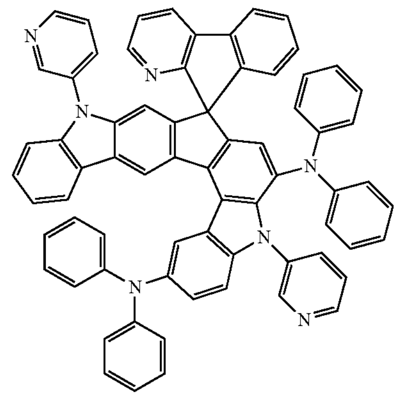
D2-193
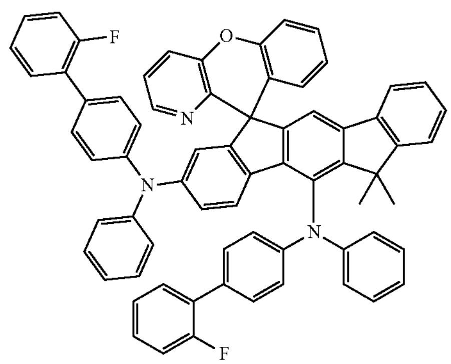
D2-194
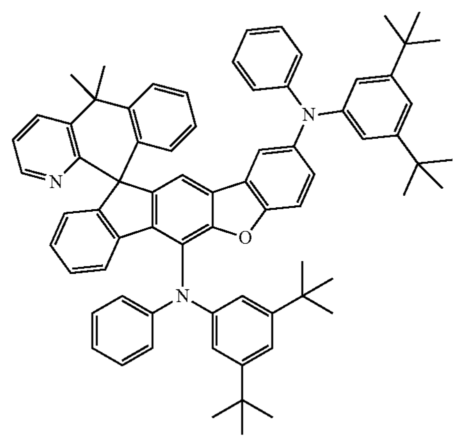
D2-195
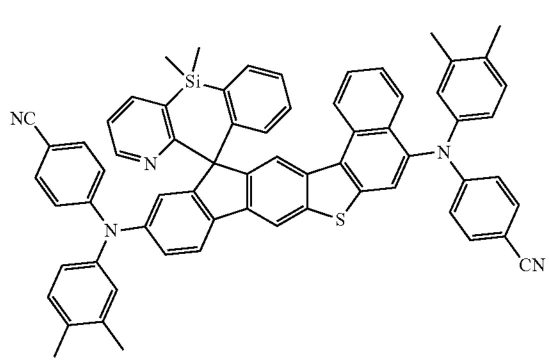
D2-196
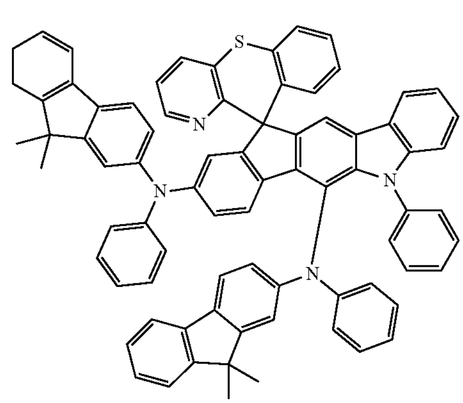

-continued
D2-197
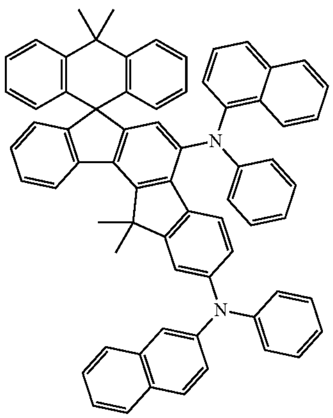
D2-198
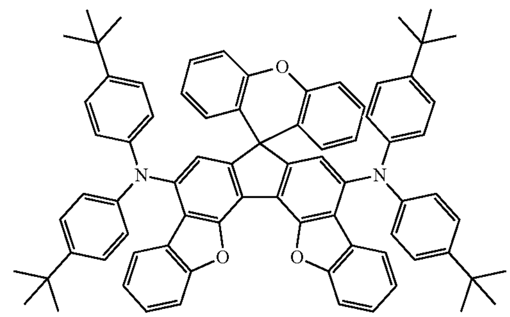
D2-199
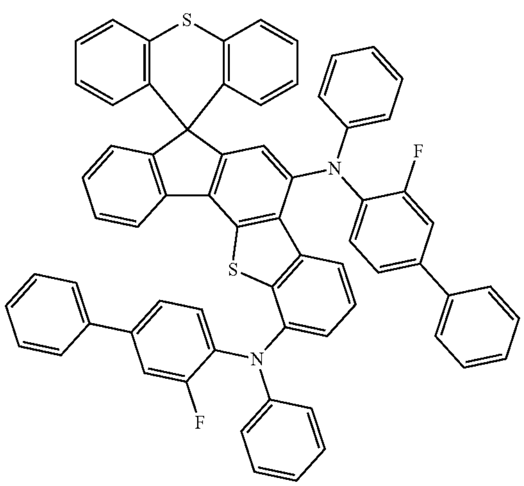
D2-200
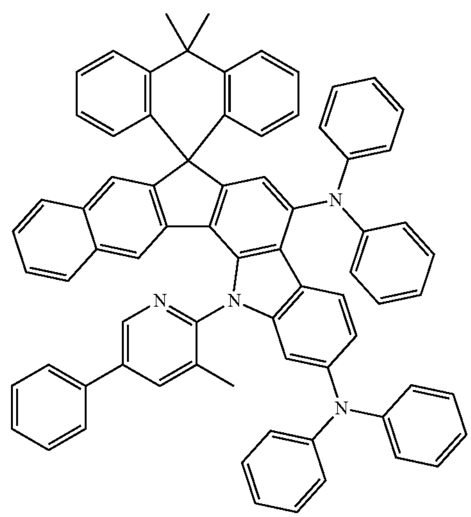
D2-201
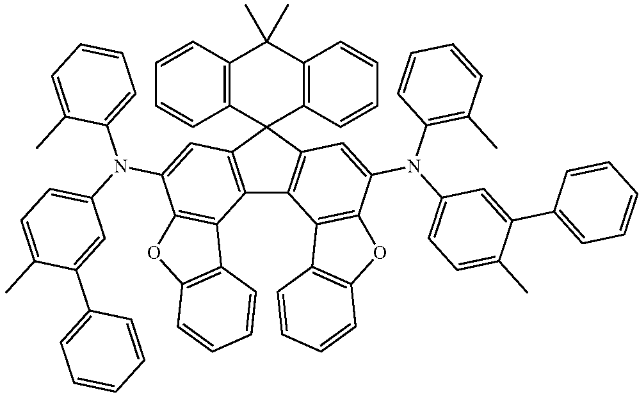

-continued
D2-202
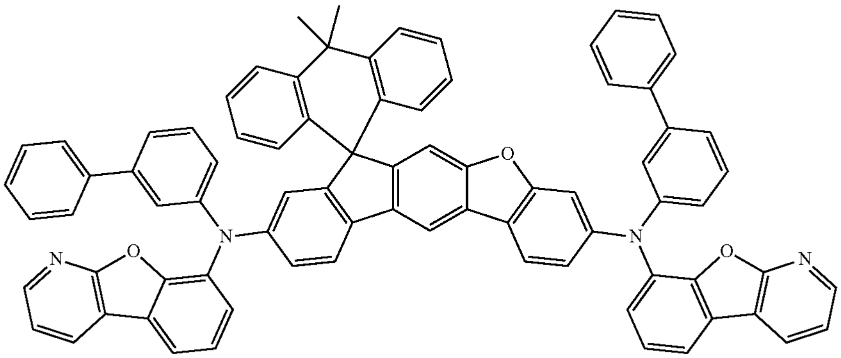
D2-203
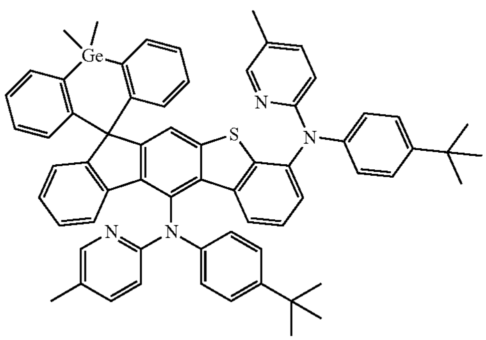
D2-204
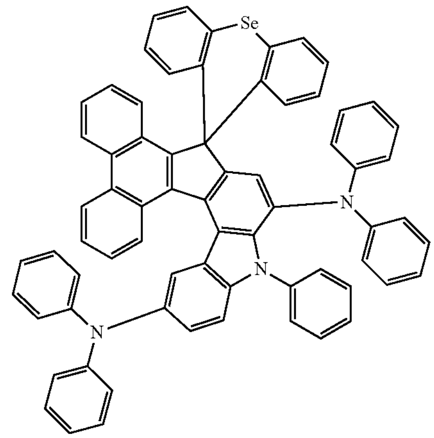
D2-205
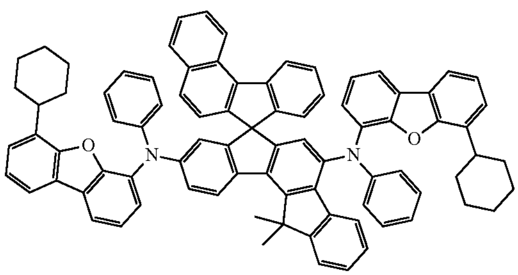
D2-206
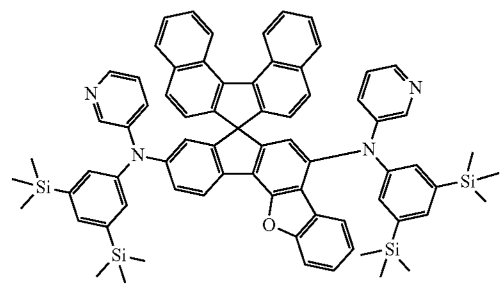
D2-207
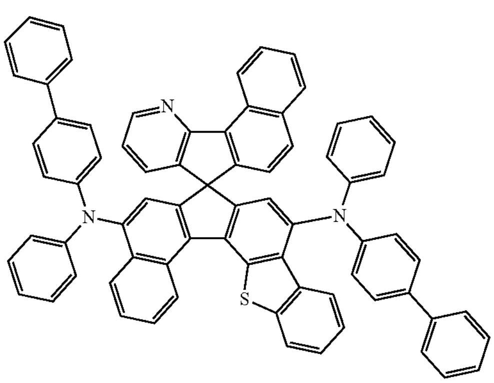
D2-208
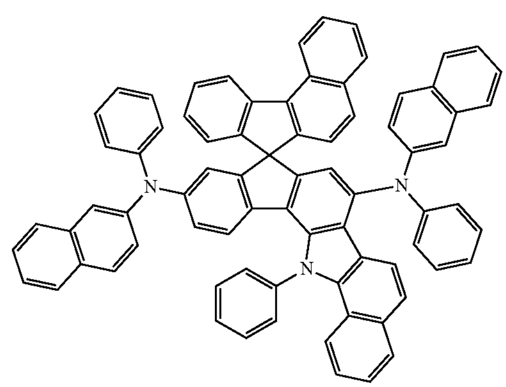

-continued

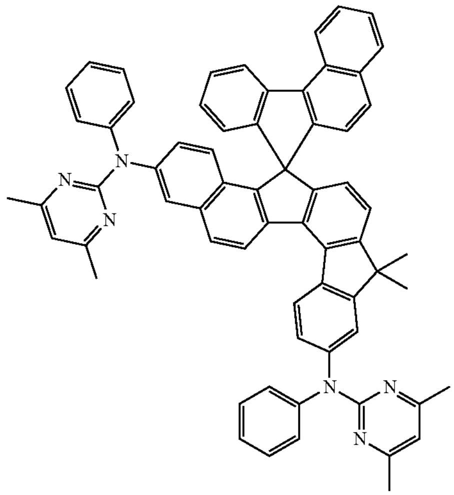

D2-209

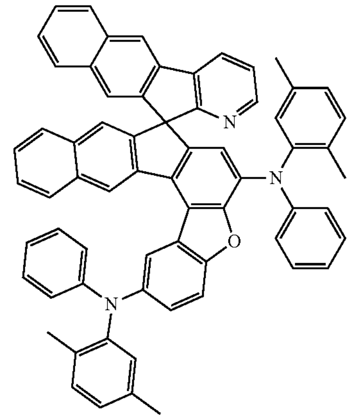

D2-210

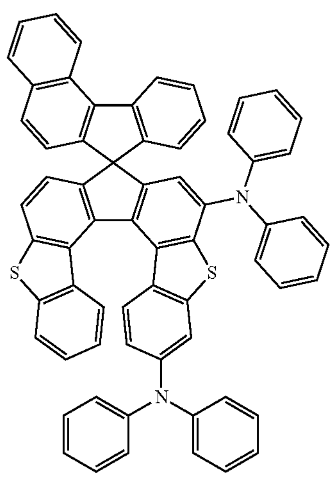

D2-211

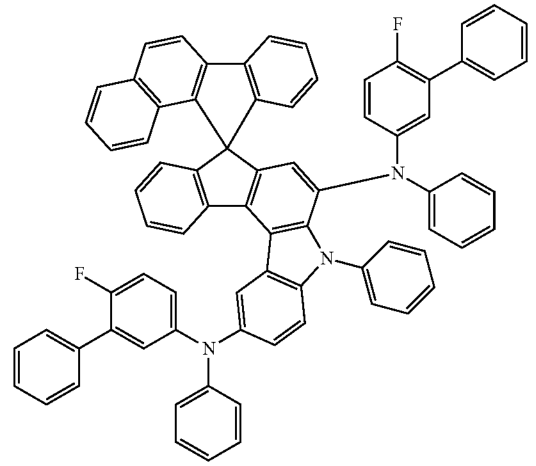

D2-212

Compounds that have an anthracene as a core and a symmetric structure may have poor film-forming properties. When the first compound represented by Formula 1 has an asymmetric structure, the first compound may be suitable for forming a film thereof.

The first compound represented by Formula 1 may include, for example, a condensed cyclic substituent, as represented by Formula 1-1'. When a condensed cyclic substituent is included in the first compound represented by Formula 1, the compound may have high electron mobility and high hole mobility. Accordingly, an organic light-emitting device including the first compound represented by Formula 1 (e.g., Formula 1-1') may have a lower driving voltage and higher efficiency than the case in which the first compound is not included.

1-1′

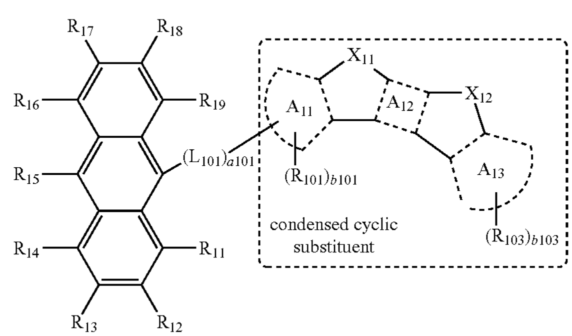

In Formula 1-1', $R_{11}$ to $R_{19}$, $L_{101}$, $a_{101}$, $A_{11}$ to $A_{13}$, $X_{11}$, $X_{12}$, $R_{102}$, and $b_{102}$ may each independently be the same as described herein in connection with Formulae 1 and 1A.

The second compound represented by Formula 2 has a condensed cyclic core, as represented by Formula 2'. Due to the inclusion of the condensed cyclic core, the second compound represented by Formula 2 may be less likely to experience molecular association (e.g., intermolecular interactions). Accordingly, an organic light-emitting device including the second compound may have improved efficiency. Due to the inclusion of the condensed cyclic core, the second compound represented by Formula 2 may have high thermal stability. Accordingly, an organic light-emitting device including the second compound may have improved lifespan characteristics.

Formula 2'

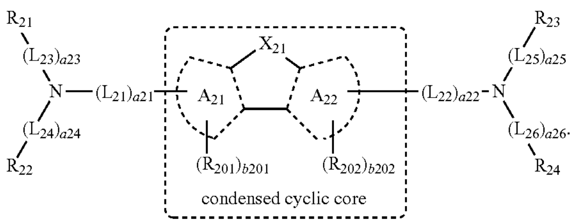

In Formula 2', $R_{21}$ to $R_{24}$, $L_{21}$ to $L_{26}$, a21 to a26, $A_{21}$, $A_{22}$, $X_{21}$, $R_{201}$, $R_{202}$, b201, and b202 may each independently be the same as described herein in connection with Formulae 2 and 2A.

Accordingly, an organic light-emitting device including the first material represented by Formula 1 and the second material represented by Formula 2 may have high efficiency and a long lifespan.

The first compound represented by Formula 1 and the second compound represented by Formula 2 may be synthesized using organic synthetic methods available in the art.

Description of FIG. 1

FIG. 1 is a schematic view of an organic light-emitting device 10 according to an embodiment of the present disclosure. The organic light-emitting device 10 includes a first electrode 110, an organic layer 150, and a second electrode 190.

Hereinafter, the structure of the organic light-emitting device 10 according to an embodiment of the present disclosure and a method of manufacturing the organic light-emitting device 10 will be described in connection with FIG. 1.

First Electrode 110

In FIG. 1, a substrate may be under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by depositing and/or sputtering a material for forming the first electrode 110 on the substrate. When the first electrode 110 is an anode, the material for forming the first electrode may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and combinations thereof, but embodiments of the present disclosure are not limited thereto. In one or more embodiments, when the first electrode 110 is a semi-transmissive electrode or a reflective electrode, the material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), and combinations thereof, but embodiments of the present disclosure are not limited thereto. As used herein, the terms "combination", "combination thereof", and "combinations thereof" may refer to a chemical combination (e.g., an alloy or chemical compound), a mixture, or a laminated structure of components.

The first electrode 110 may have a single-layer structure, or a multi-layer structure including two or more layers. For example, the first electrode 110 may have a three-layered structure of ITO/Ag/ITO, but embodiments of the structure of the first electrode 110 are not limited thereto.

Organic Layer 150

The organic layer 150 is on the first electrode 110. The organic layer 150 may include an emission layer.

The organic layer 150 may further include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer (HIL), a hole transport layer (HTL), an emission auxiliary layer, and an electron blocking layer (EBL).

For example, the hole transport region may have a single-layer structure including a single layer including a plurality of different materials, or a multi-layer structure having a structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein layers of each structure are sequentially stacked on the first electrode 110 in each stated order, but embodiments of the structure of the hole transport region are not limited thereto.

The hole transport region may include at least one selected from m-MTDATA, TDATA, 2-TNATA, NPB (NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

-continued
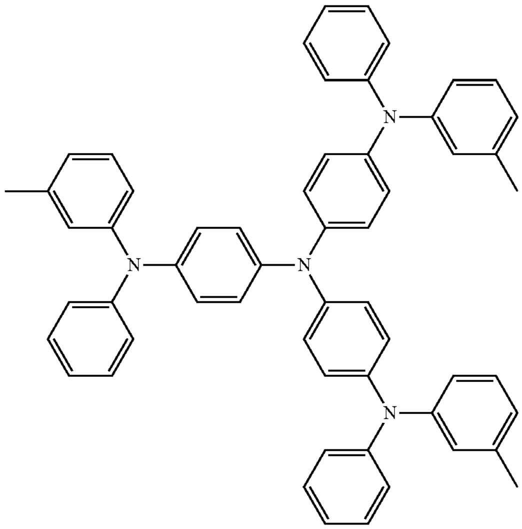
m-MTDATA
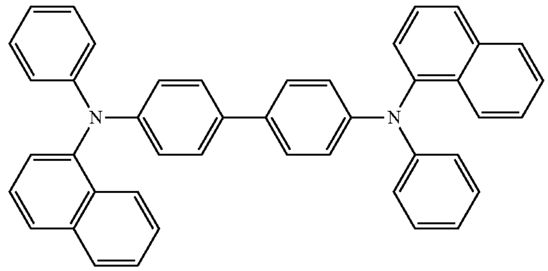
NPB
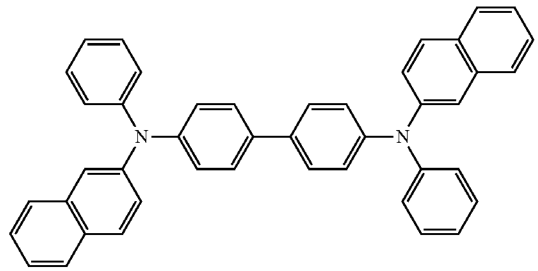
β-NPB
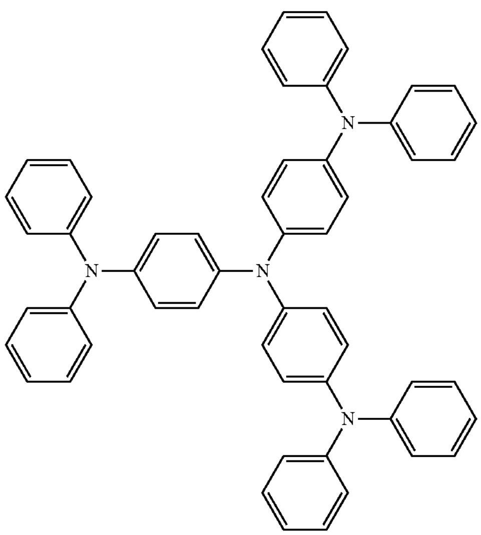
TDATA
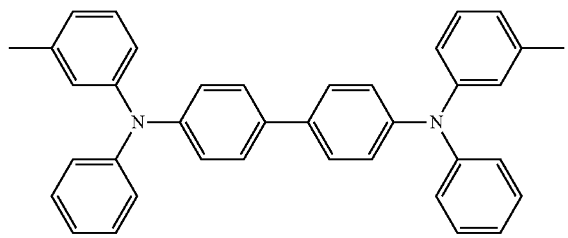
TPD
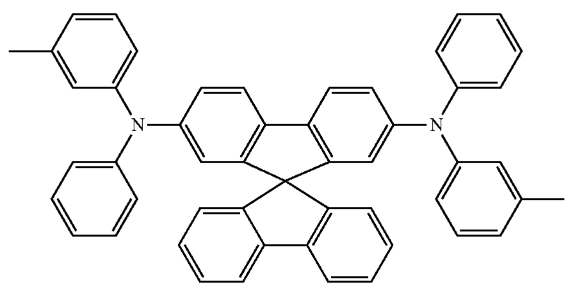
Spiro-TPD
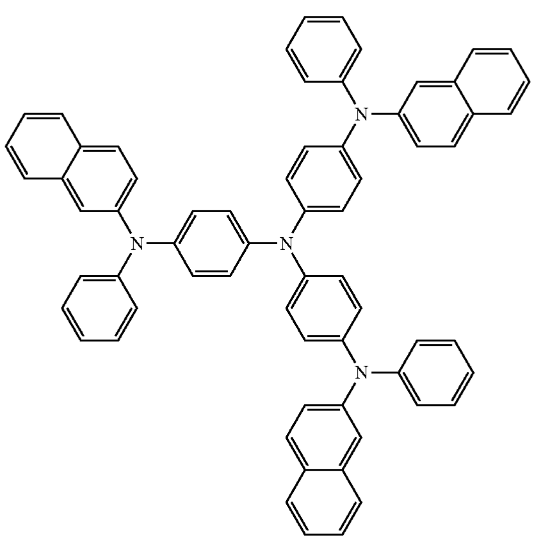
2-TNATA
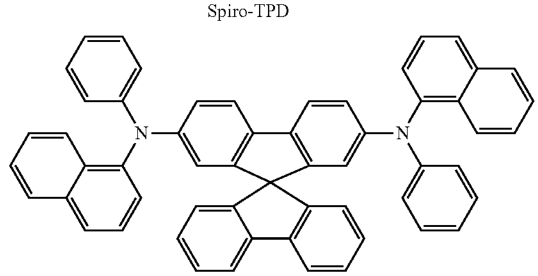
Spiro-NPD
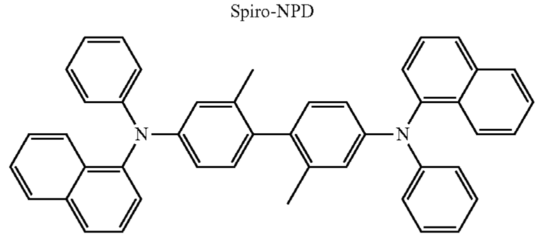
methylated NPB -continued

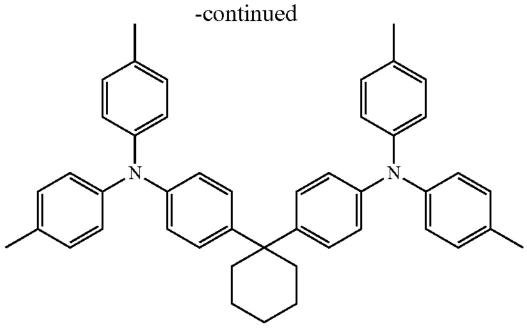

TAPC

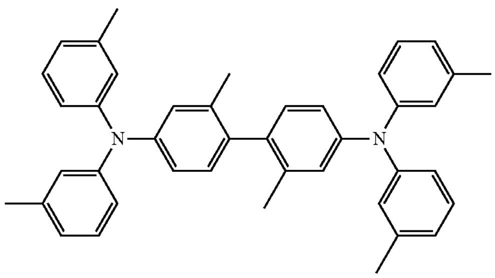

,

HMTPD

Formula 201

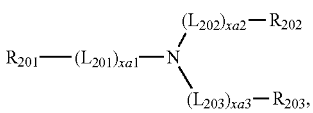

Formula 202

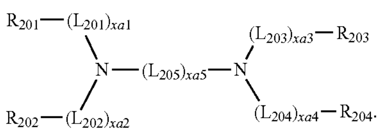

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, $R_{201}$ and $R_{202}$ in Formula 202 may optionally be linked (e.g., coupled) via a single bond, a dimethyl-methylene group, or a diphenyl-methylene group, and $R_{203}$ and $R_{204}$ may optionally be linked (e.g., coupled) via a single bond, a dimethyl-methylene group, or a diphenyl-methylene group.

In one embodiment, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be selected from 0, 1, and 2.

In one or more embodiments, xa5 may be selected from 1, 2, 3, and 4.

In one or more embodiments, $R_{201}$ to $R_{204}$ and $Q_{201}$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be the same as described above.

In one or more embodiments, at least one selected from $R_{201}$ to $R_{203}$ in Formula 201 may be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked (e.g., coupled) via a single bond, and/or ii) $R_{203}$ and $R_{204}$ may be linked (e.g., coupled) via a single bond.

In one or more embodiments, at least one selected from $R_{201}$ to $R_{204}$ in Formula 202 may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

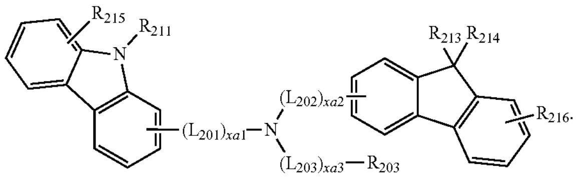

In one or more embodiments, the compound represented by Formula 201 may be represented by Formula 201A(1), but embodiments of the present disclosure are not limited thereto:

Formula 201A(1)

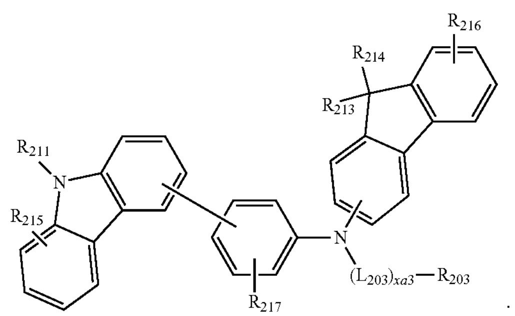

In one or more embodiments, the compound represented by Formula 201 may be represented by Formula 201A-1, but embodiments of the present disclosure are not limited thereto:

Formula 201A-1

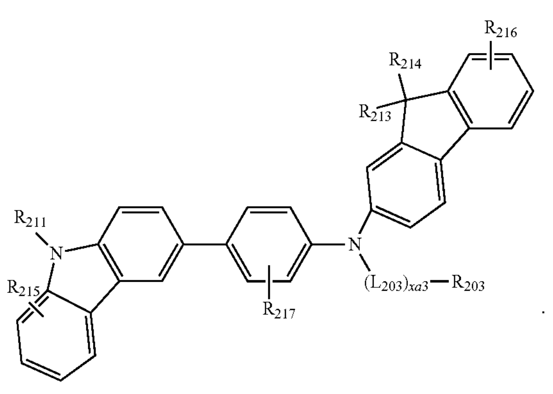

The compound represented by Formula 202 may be represented by Formula 202A:

Formula 202A

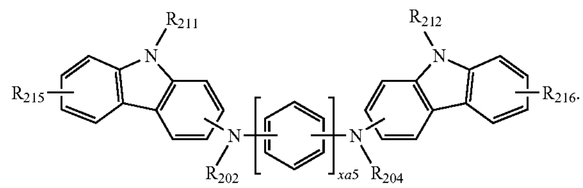

In one or more embodiments, the compound represented by Formula 202 may be represented by Formula 202A-1:

Formula 202A-1

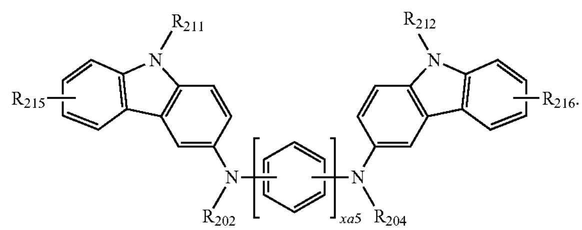

In Formulae 201A, 201A(1), 201A-1, 202A, and 202A-1, $L_{201}$ to $L_{203}$, xa1 to xa3, xa5, and $R_{202}$ to $R_{204}$ may each independently be the same as described above, $R_{211}$ and $R_{212}$ may each independently be the same as described herein in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

HT1
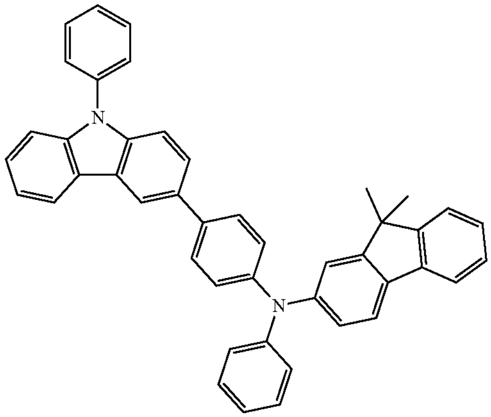
HT2
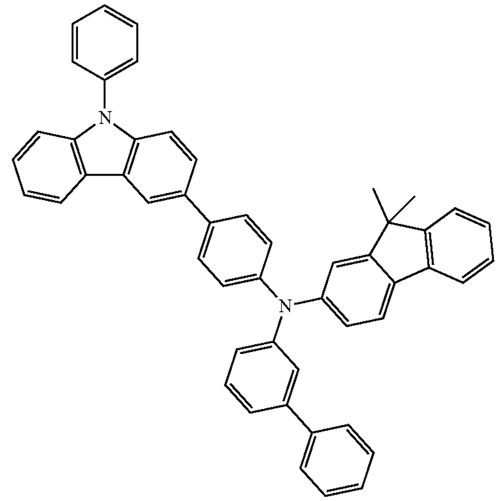
HT3
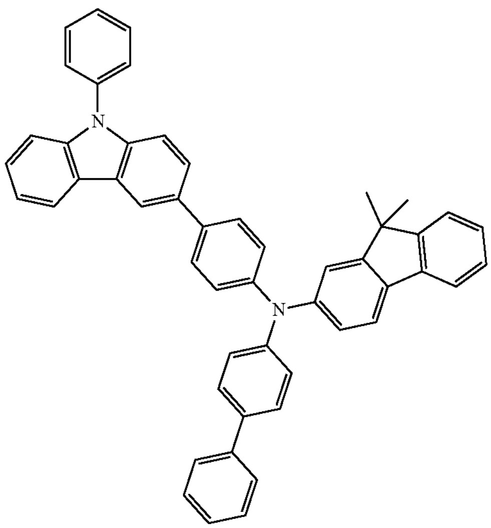
HT4
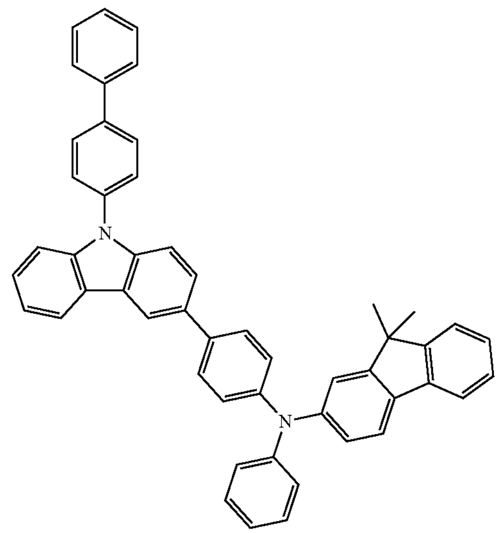
HT5
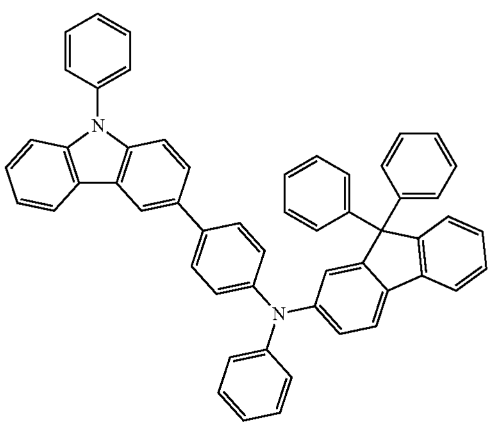
HT6
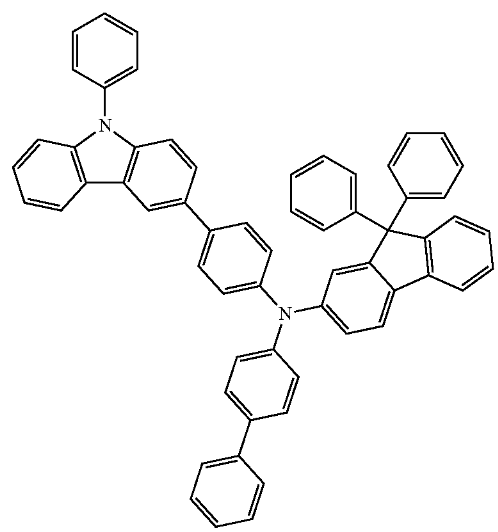

-continued
HT7
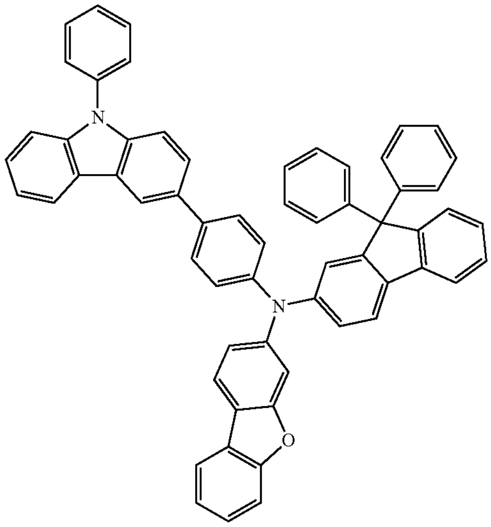
HT8
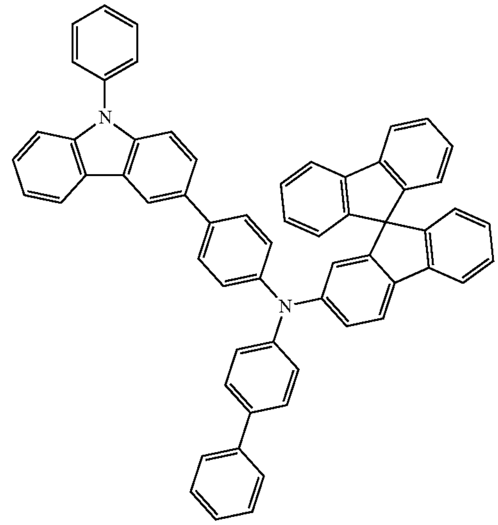
HT9
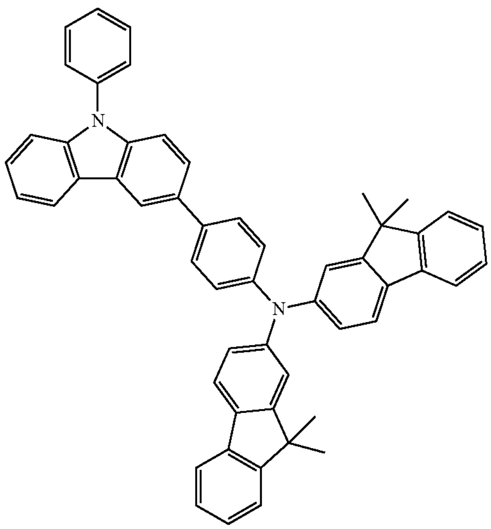
HT10
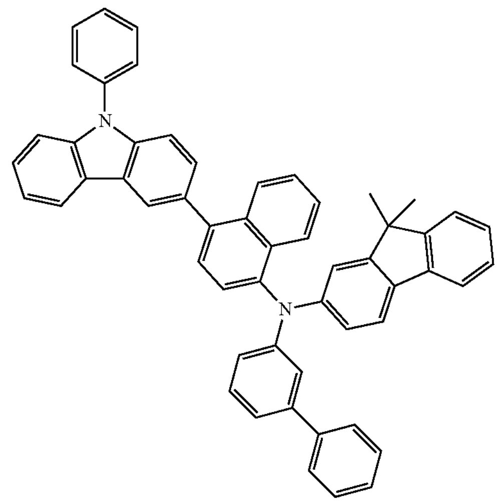
HT11
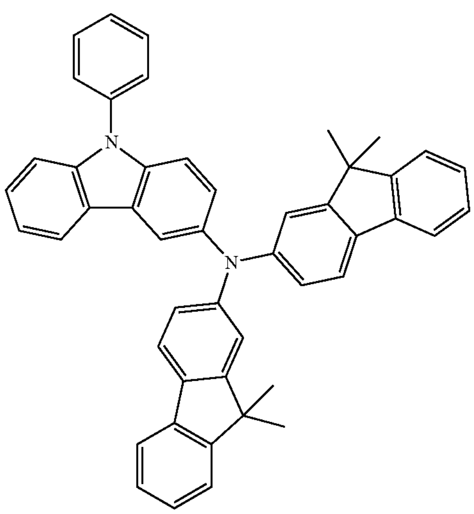
HT12
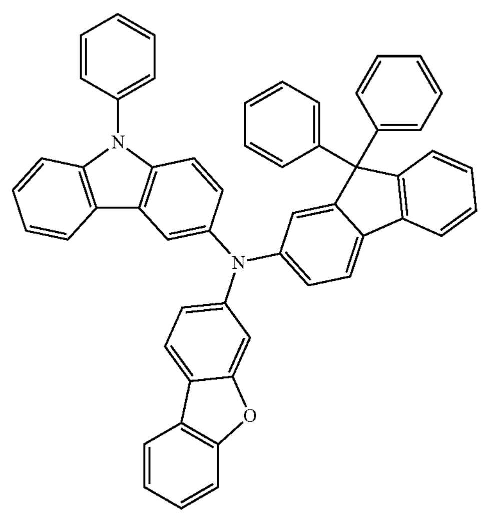

-continued
HT13
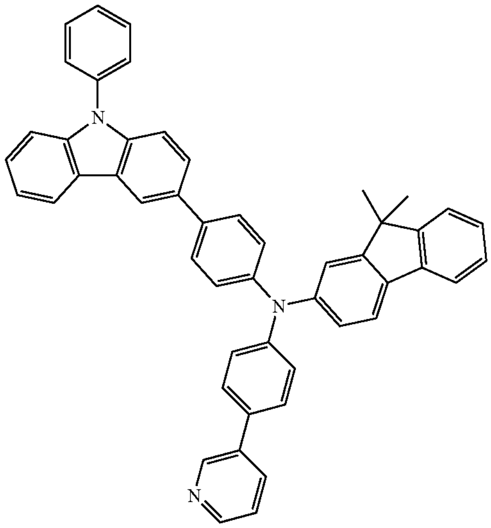
HT14
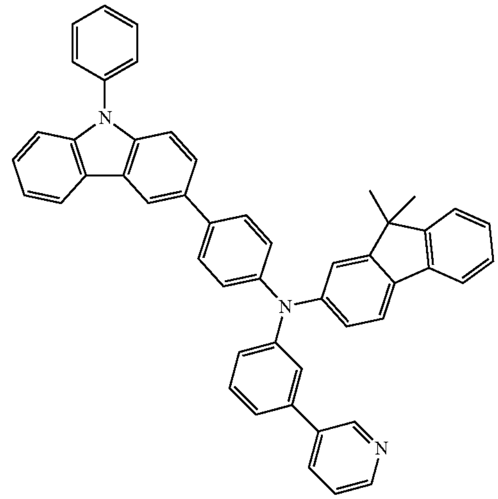
HT15
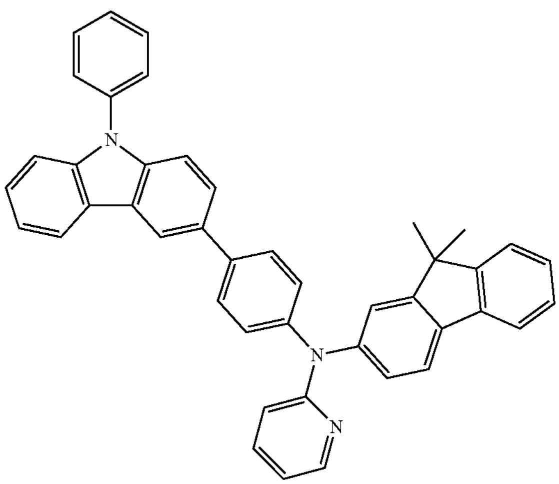
HT16
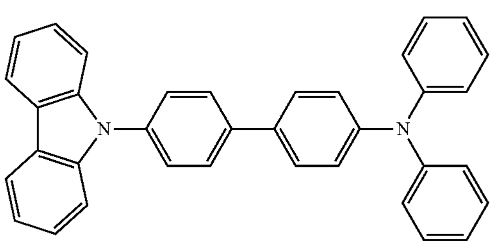
HT17
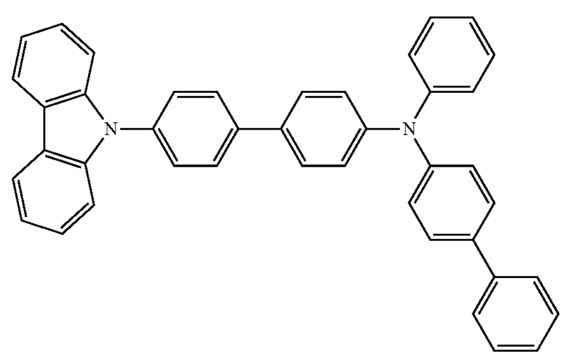

-continued
HT18
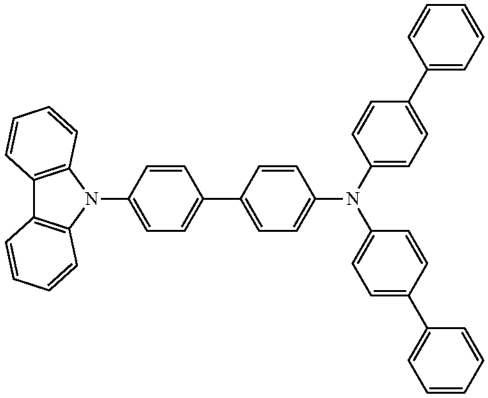
HT19
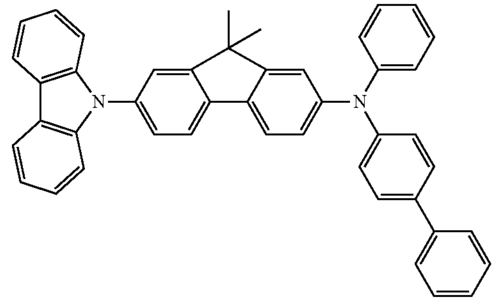
HT20
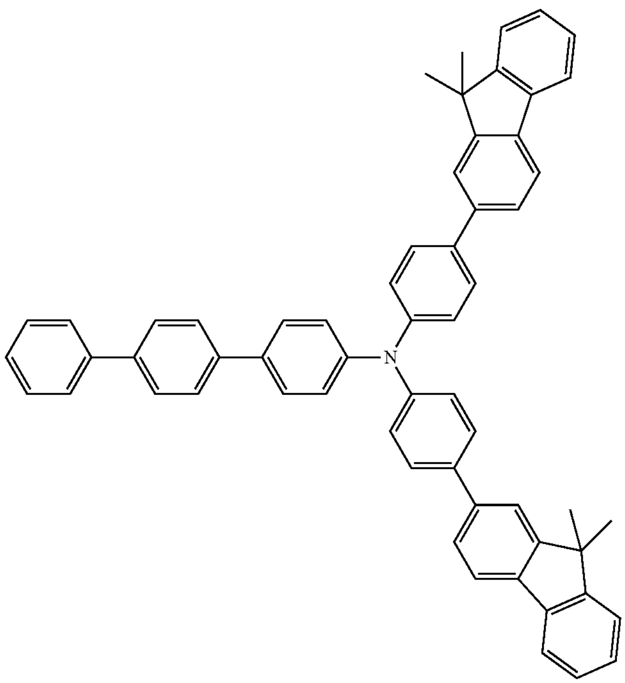
HT21
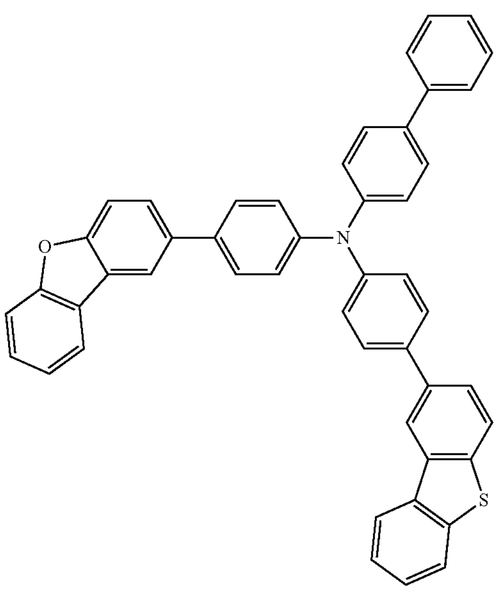

-continued
HT22
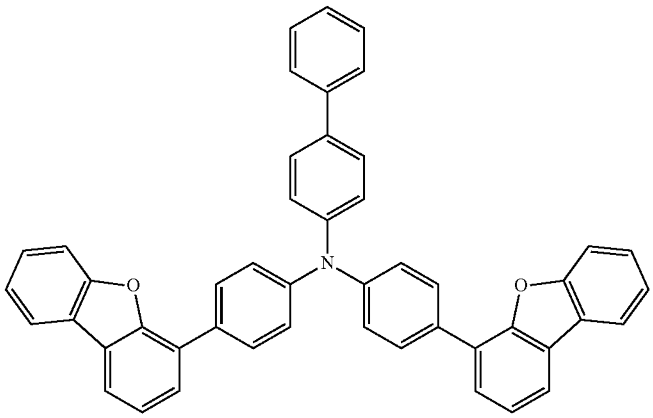
HT23
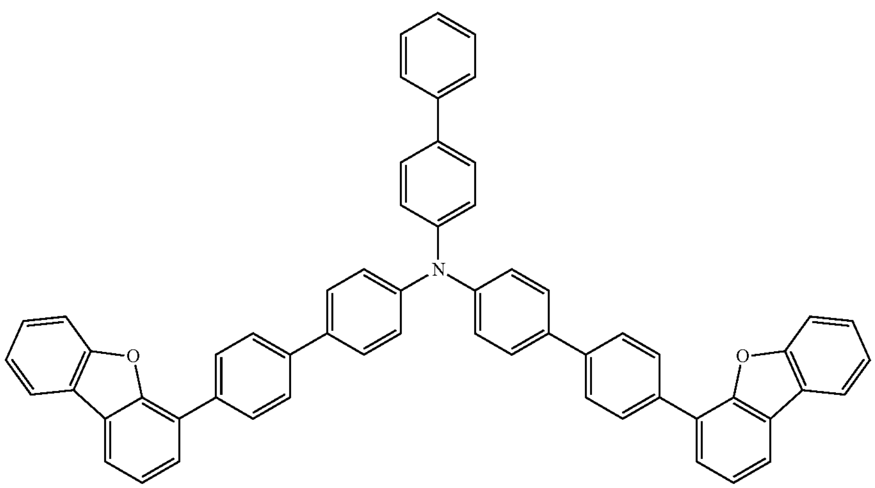
HT24
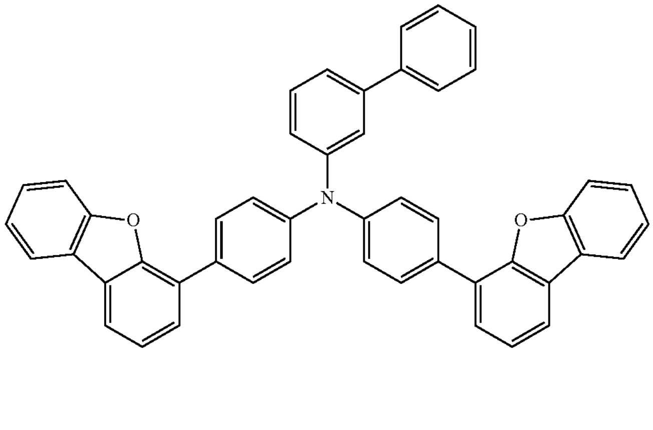

-continued
HT25
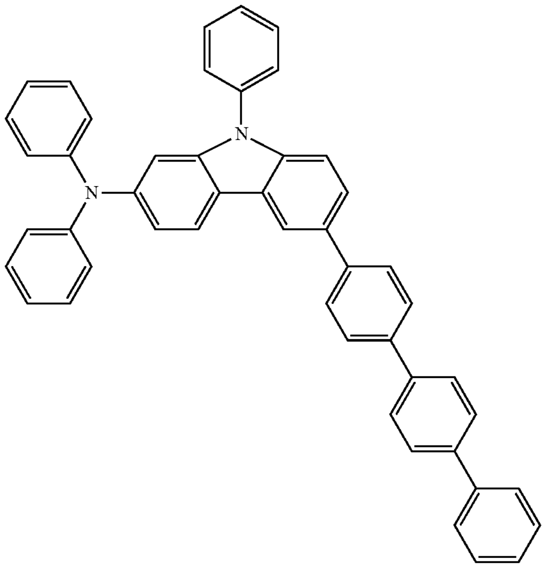
HT26
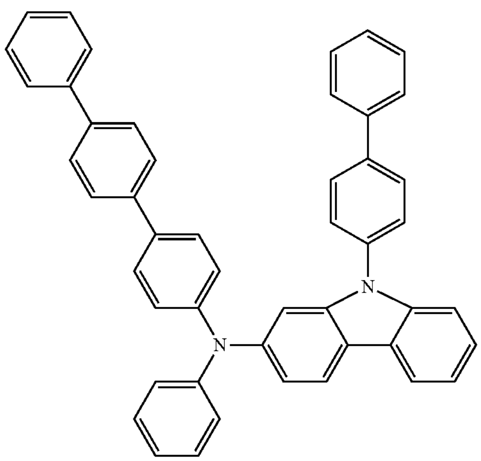
HT27
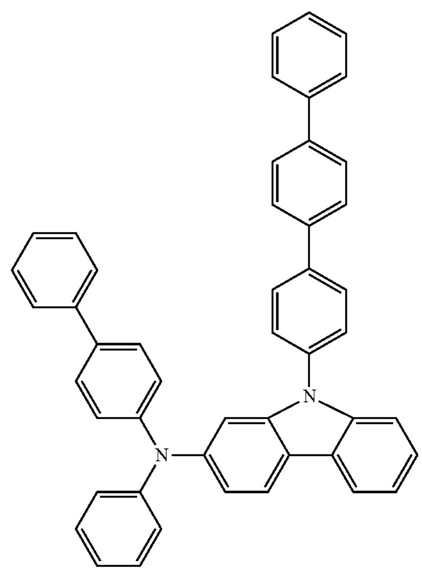
HT28
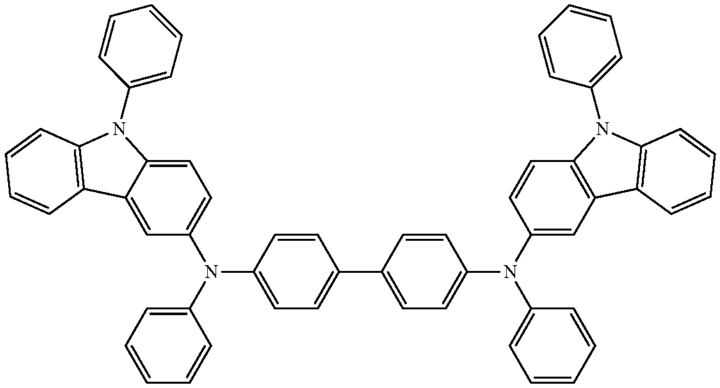

-continued
HT29
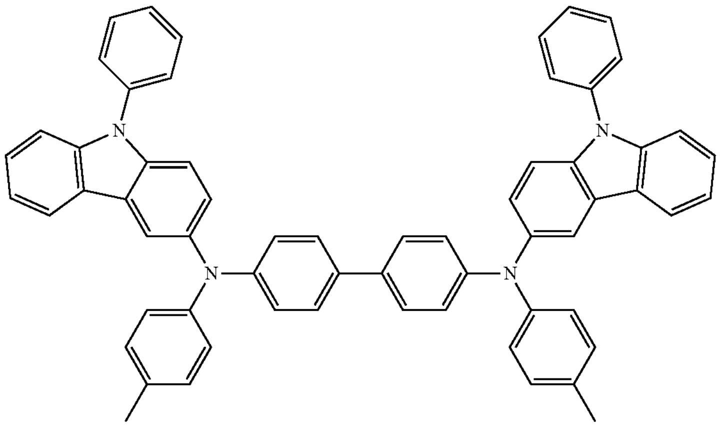
HT30
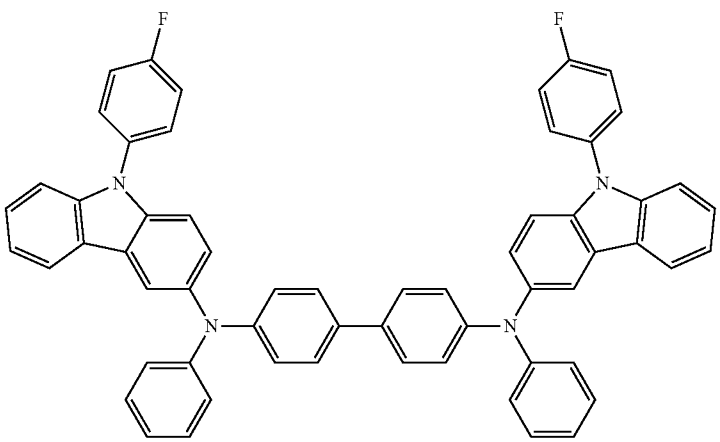
HT31
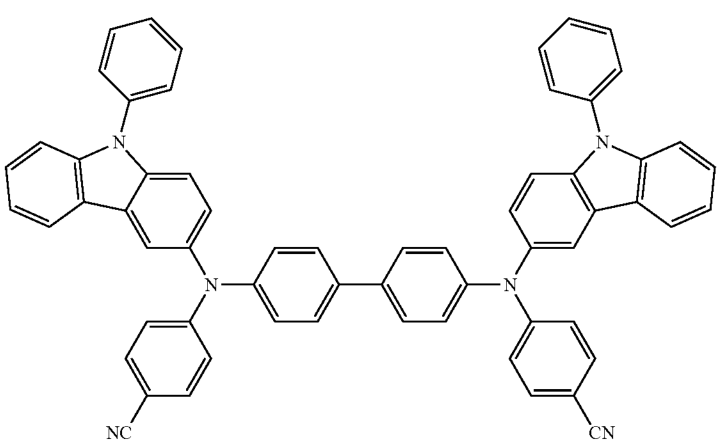

-continued
HT32
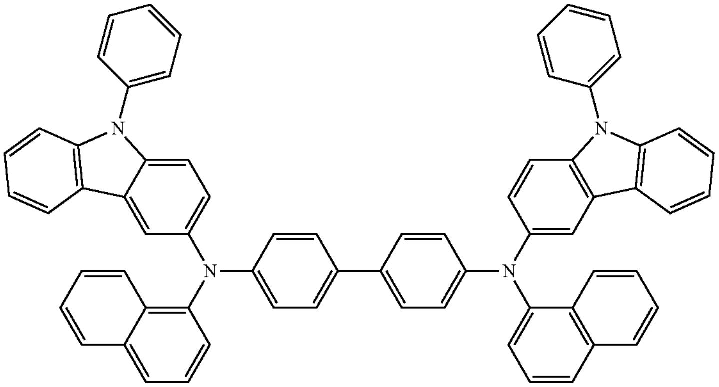
HT33
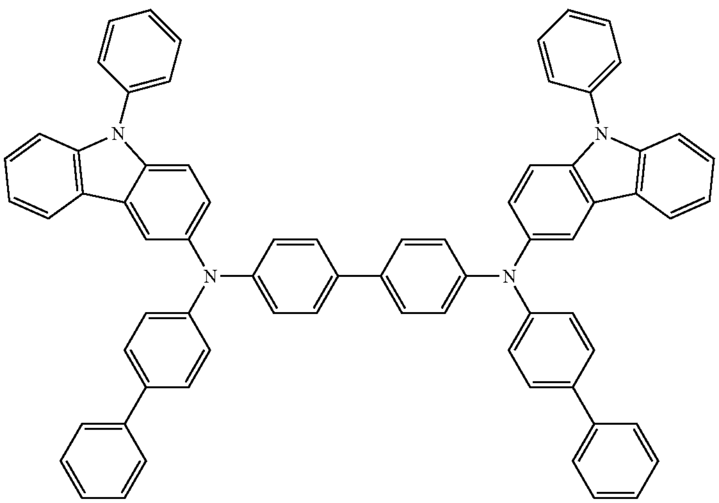
HT34
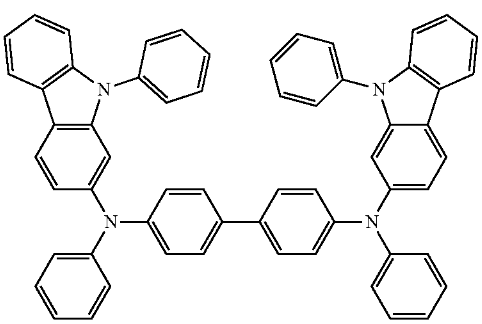
HT35
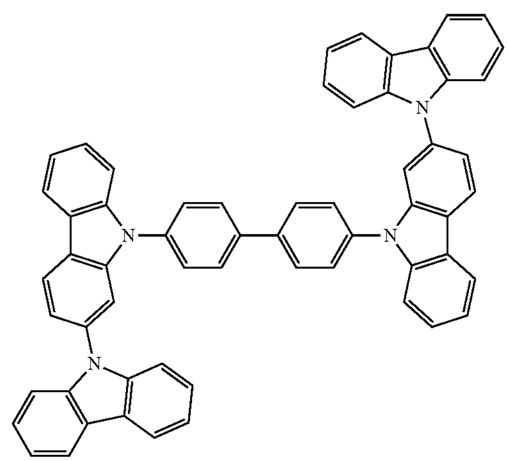

-continued

HT36

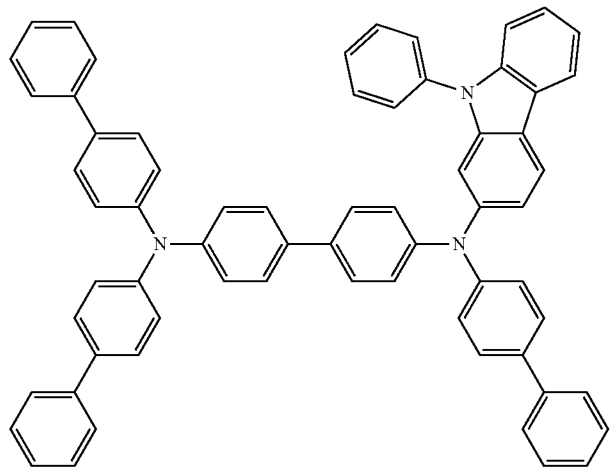

HT37

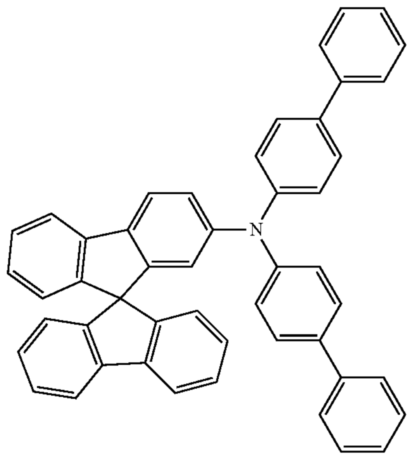

HT38

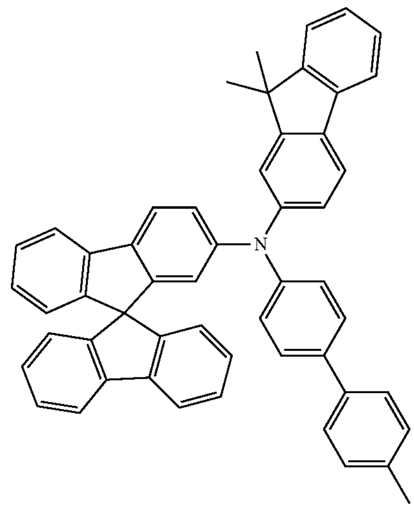

HT39

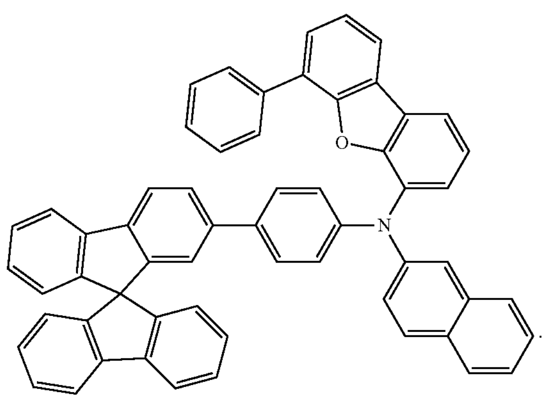

The thickness of the hole transport region may be about 100 Å to about 10,000 Å, and in some embodiments, about 100 Å to about 1,000 Å. When the hole transport region includes at least one selected from a hole injection layer and a hole transport layer, the thickness of the hole injection layer may be about 100 Å to about 9,000 Å, and in some embodiments, about 100 Å to about 1,000 Å. The thickness of the hole transport layer may be about 50 Å to about 2,000 Å, and in some embodiments, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer (e.g., by adjusting the optical resonance distance to match the wavelength of light emitted from the emission layer), and the electron blocking layer may block or reduce the flow of electrons from an electron transport region. The emission auxiliary layer and the electron blocking layer may each include the same materials described above.

[p-Dopant]

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

According to an embodiment of the present disclosure, the p-dopant may have a lowest unoccupied molecular orbital (LUMO) energy level of −3.5 eV or less, but embodiments of the present disclosure are not limited thereto.

The p-dopant may include at least one selected from a quinone derivative, a metal oxide, and a cyano group-containing compound, but embodiments of the present disclosure are not limited thereto.

For example, the p-dopant may include at least one selected from the group consisting of:

a quinone derivative (such as tetracyanoquinodimethane (TCNQ) and/or 2,3,5,6-tetrafluoro-7,7,8,8-tetracyanoquinodimethane (F4-TCNQ));

a metal oxide (such as tungsten oxide and/or molybdenum oxide);

1,4,5,8,9,11-hexaazatriphenylene-hexacarbonitrile (HAT-CN); and a compound represented by Formula 221, but embodiments of the present disclosure are not limited thereto:

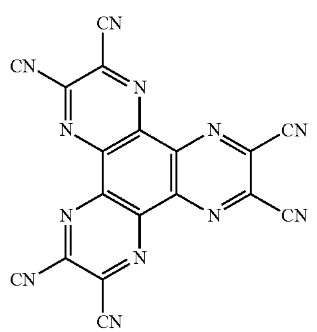

HAT-CN

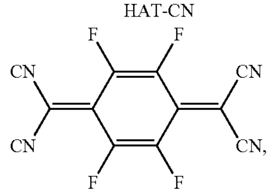

FA-TCNQ

Formula 221

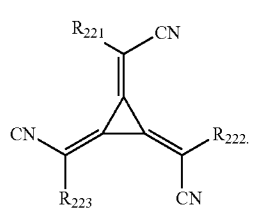

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that at least one selected from $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, and/or a blue emission layer, according to a sub pixel. In one or more embodiments, the emission layer may have a stacked structure of two or more layers selected from a red emission layer, a green emission layer, and a blue emission layer, in which the two or more layers may contact each other or may be separated from each other. In one or more embodiments, the emission layer may include two or more materials selected from a red-light emission material, a green-light emission material, and a blue-light emission material, in which the two or more materials are mixed with each other in a single layer to thereby emit white light.

In one embodiment, the emission layer of the organic light-emitting device 10 may be a first-color-light emitting-emission layer;

the organic layer may further include at least one second-color-light emitting-emission layer;

the first-color-light and the second-color-light may be identical to or different from each other; and the first-color-light and the second-color-light may be emitted as a mixed color-light.

As used herein, the expression "the first-color-light and the second-color-light are different from each other" refers to that the maximum emission wavelength of the first-color-light is different from the maximum emission wavelength of the second-color-light.

In one or more embodiments, the mixed color-light may be white light, but embodiments of the present disclosure are not limited thereto.

In one embodiment, the emission layer of the organic light-emitting device 10 may be a first-color-light emitting-emission layer;

the organic layer may further include at least one second-color-light emitting-emission layer and at least one third-color-light emitting-emission layer;

the first-color-light, the second-color-light, and the third-color-light may be identical to or different from each other; and the first-color-light, the second-color-light, and the third-color-light may be emitted as a mixed color-light.

As used herein, the expression "the first-color-light, the second-color-light, and the third-color-light are different from each other" refers to that the maximum emission wavelength of the first-color-light, the maximum emission wavelength of the second-color-light, and the maximum emission wavelength of the third-color-light are different from each other.

In one or more embodiments, the mixed color-light may be white light, but embodiments of the present disclosure are not limited thereto.

The emission layer may include a host and/or a dopant. The dopant may include at least one selected from a phosphorescent dopant and a fluorescent dopant.

The amount of the dopant in the emission layer may be about 0.01 to about 15 parts by weight based on 100 parts by weight of the host, but embodiments of the present disclosure are not limited thereto.

The thickness of the emission layer may be about 100 Å to about 1,000 Å, and in some embodiments, about 200 Å to about 600 Å. When the thickness of the emission layer is within these ranges, excellent light-emission characteristics may be obtained without a substantial increase in driving voltage.

Host in Emission Layer

The host may include the first compound represented by Formula 1.

[Fluorescent Dopant in Emission Layer]

The fluorescent dopant may include the second compound represented by Formula 2.

[Electron Transport Region in Organic Layer 150]

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer (ETL), and an electron injection layer, but embodiments of the present disclosure are not limited thereto.

For example, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein the layers of each of these structures are sequentially stacked in each stated order on an emission layer. However, embodiments of the structure of the electron transport layer are not limited thereto.

The electron transport region (for example, a buffer layer, a hole blocking layer, an electron control layer, and/or an electron transport layer in the electron transport region) may include a metal-free compound containing at least one 7 electron-depleted nitrogen-containing ring.

As used herein, "π electron-depleted nitrogen-containing ring" refers to a $C_1$-$C_{60}$ heterocyclic group having at least one *—N═*' moiety as a ring-forming moiety.

For example, the "π electron-depleted nitrogen-containing ring" may be selected from i) a 5-membered to 7-membered heteromonocyclic group having at least one *—N═*' moiety, ii) a heteropolycyclic group in which two or more 5-membered to 7-membered hetero monocyclic groups each having at least one *—N═*' moiety are condensed (e.g., fused) with each other, and iii) a heteropolycyclic group in which one or more 5-membered to 7-membered heteromonocyclic groups, each having at least one *—N═*' moiety, are condensed with at least one $C_5$-$C_{60}$ carbocyclic group.

Non-limiting examples of the π electron-depleted nitrogen-containing ring may include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole, but embodiments of the present disclosure are not limited thereto.

For example, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be selected from 1, 2, and 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{601}(Q_{602})(Q_{603})$, $—C(═O)(Q_{601})$, $—S(═O)_2(Q_{601})$, and $—P(═O)(Q_{601})(Q_{602})$, $Q_{601}$ to $Q_{603}$ may each independently be selected from a $C_1$-$C_{10}$ alkyl group, a $C_1$-$C_{10}$ alkoxy group, a phenyl group, a biphenyl group, a terphenyl group, and a naphthyl group, and xe21 may be an integer selected from 1 to 5.

In one embodiment, at least one selected from the xe11 $Ar_{601}$(s) and/or at least one selected from the xe21 $R_{601}$(s) may include a π electron-depleted nitrogen-containing ring as described above.

In one embodiment, ring $Ar_{601}$ in Formula 601 may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(s) may be linked (e.g., coupled) via a single bond.

In one or more embodiments, $Ar_{601}$ in Formula 601 may be an anthracene group.

In one or more embodiments, the compound represented by Formula 601 may be represented by Formula 601-1:

Formula 601-1

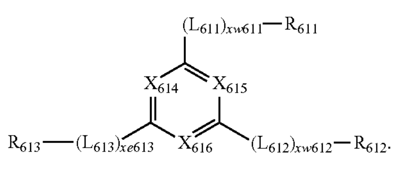

In Formula 601-1, $X_{614}$ may be selected from N and C($R_{614}$), $X_{615}$ may be selected from N and C($R_{615}$), $X_{616}$ may be selected from N and C($R_{616}$), and at least one selected from $X_{614}$ to $X_{616}$ may be N, $L_{611}$ to $L_{613}$ may each independently be the same as described herein in connection with $L_{601}$, xe611 to xe613 may each independently be the same as described herein in connection with xe1, $R_{611}$ to $R_{613}$ may each independently be understood the same as described herein in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be selected from 0, 1, and 2.

In one or more embodiments, $R_{601}$ and $R_{611}$ to $R_{613}$ in Formulae 601 and 601-1 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(═O)$_2$($Q_{601}$) and —P(═O)($Q_{601}$)($Q_{602}$), wherein $Q_{601}$ and $Q_{602}$ may each independently be the same as described above.

The electron transport region may include at least one compound selected from Compounds ET1 to ET36, but embodiments of the material to be included in the electron transport region are not limited thereto:

ET1
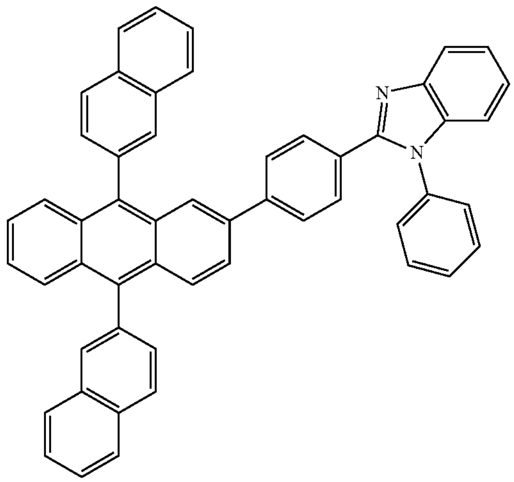
ET2
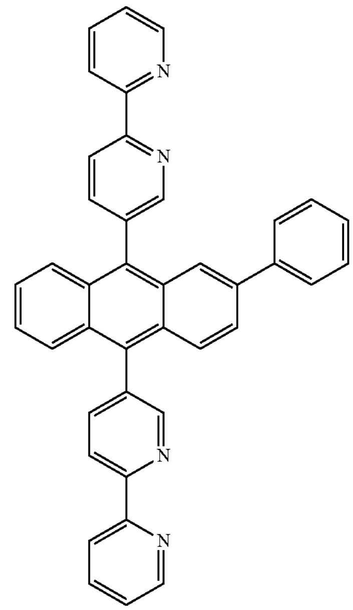
ET3
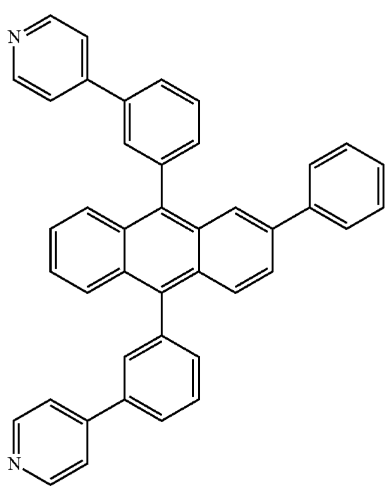
ET4
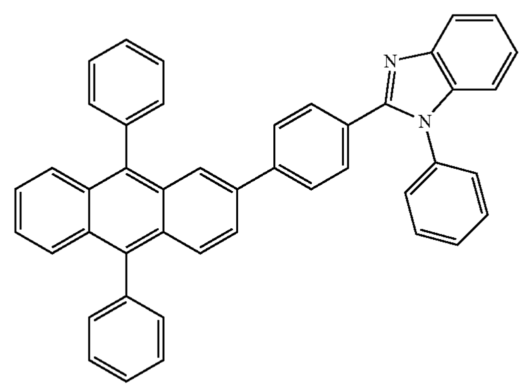
ET5
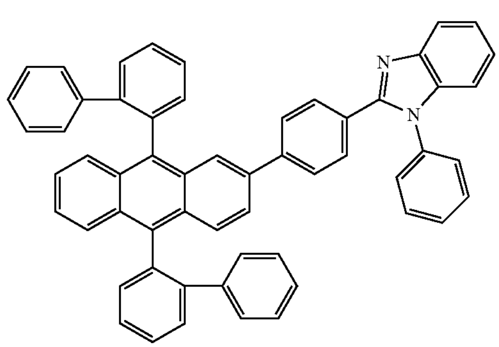
ET6
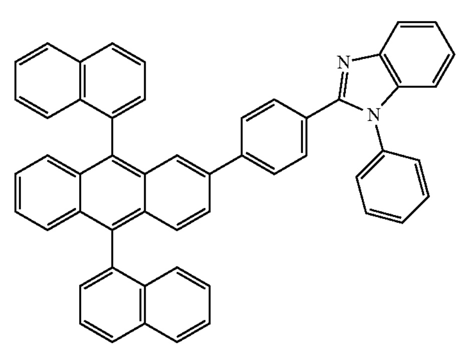

-continued
ET7
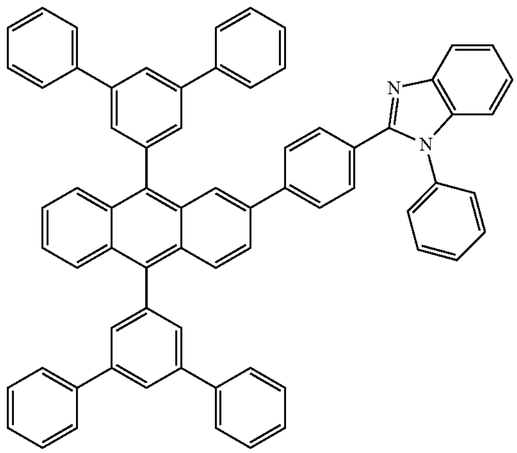
ET8
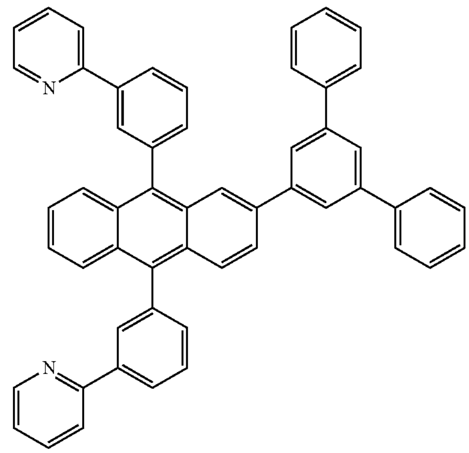
ET9
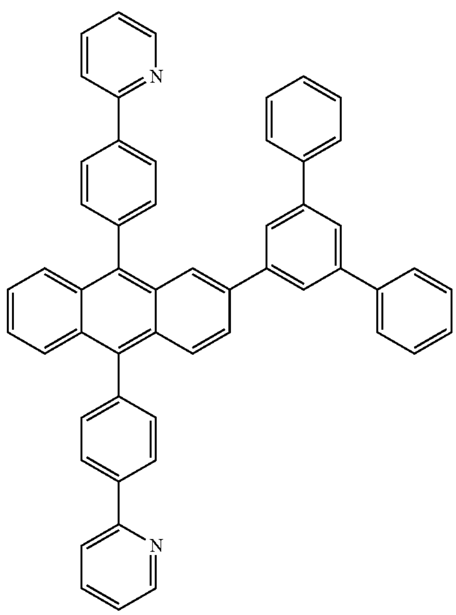
ET10
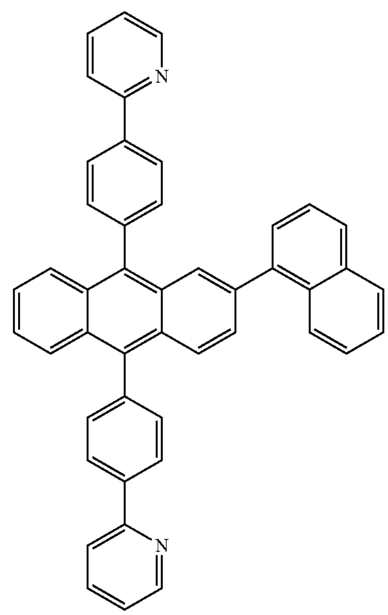
ET11
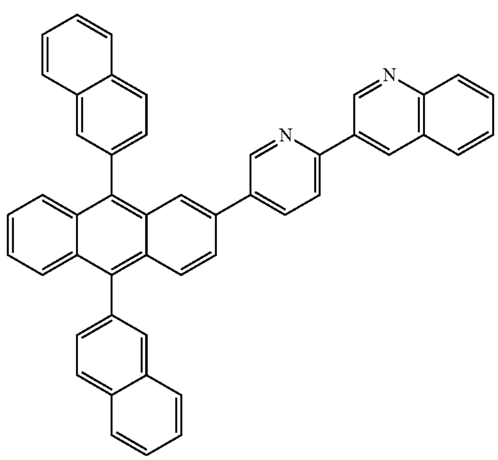
ET12
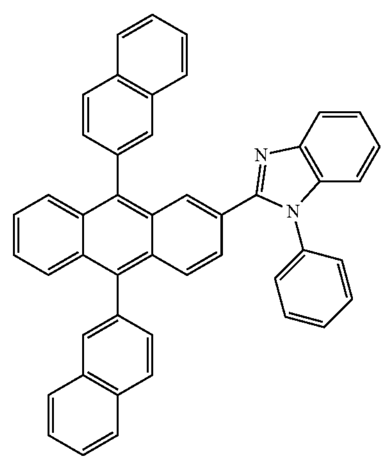

-continued
ET13
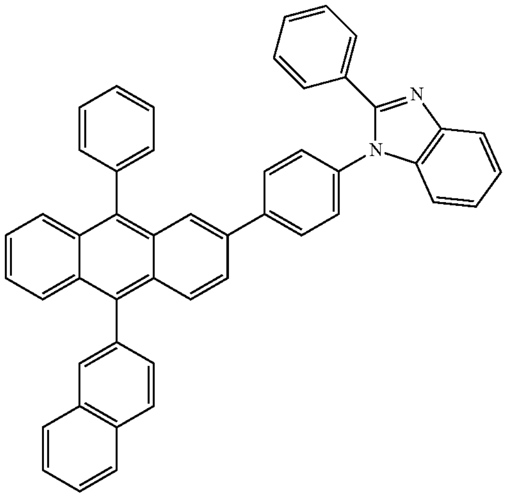
ET14
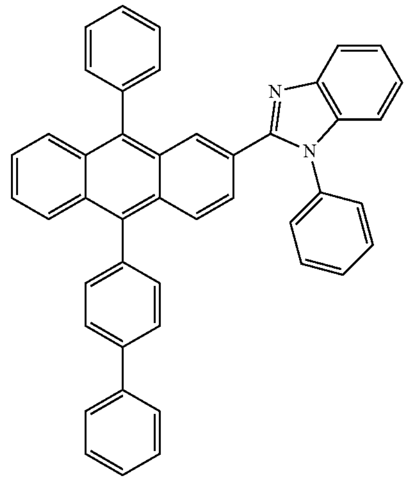
ET15
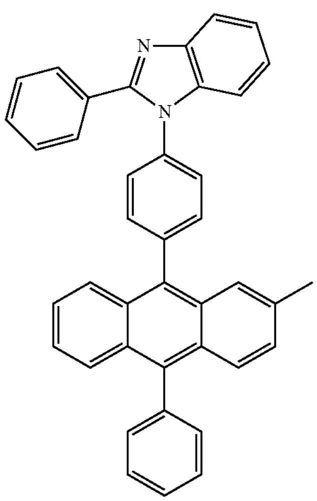
ET16
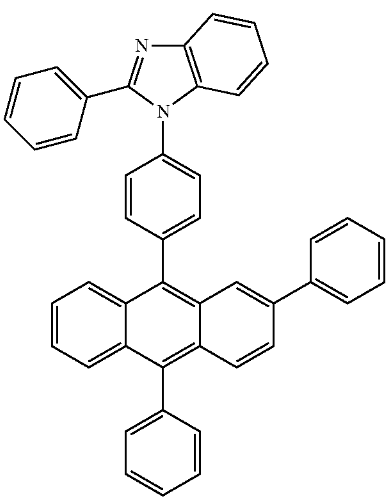
ET17
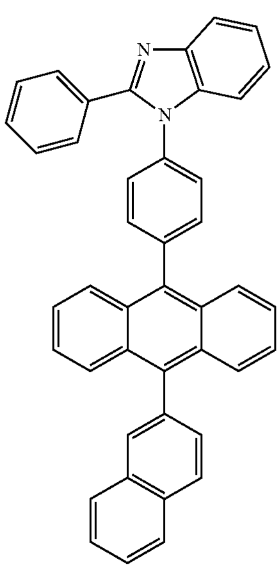
ET18
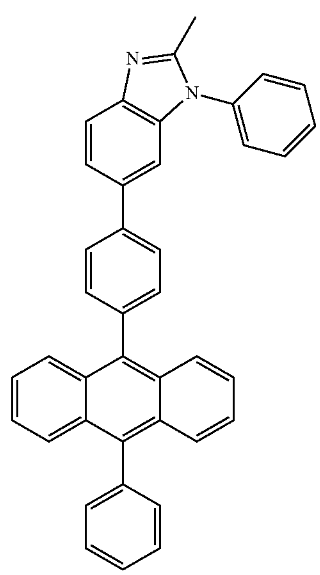

-continued
ET19
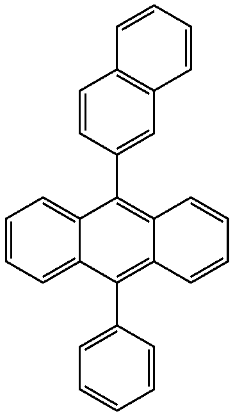
ET20
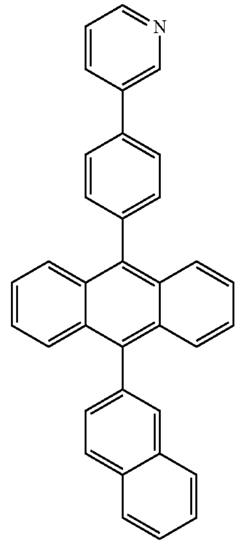
ET21
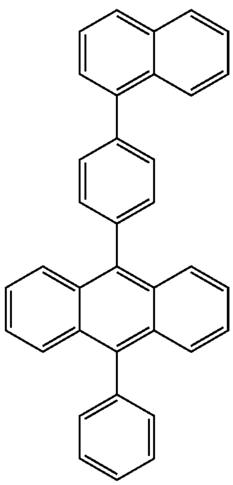
ET22
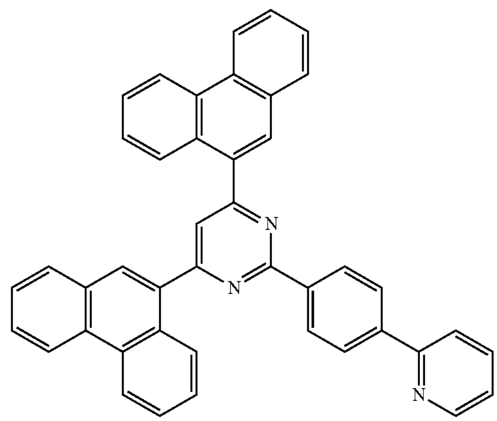
ET23
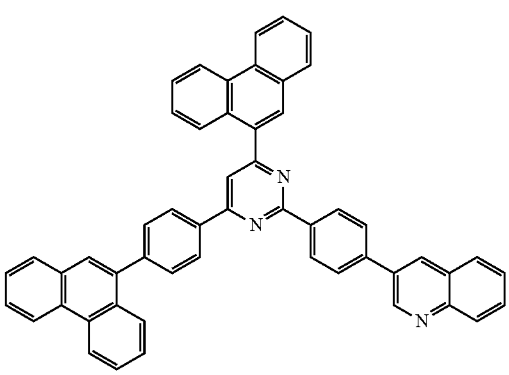
ET24
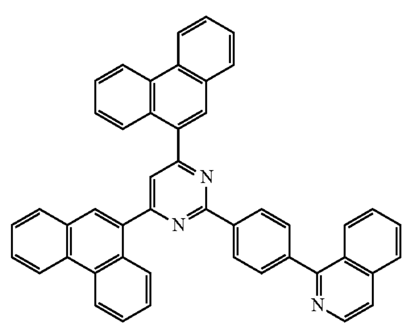

-continued
ET25
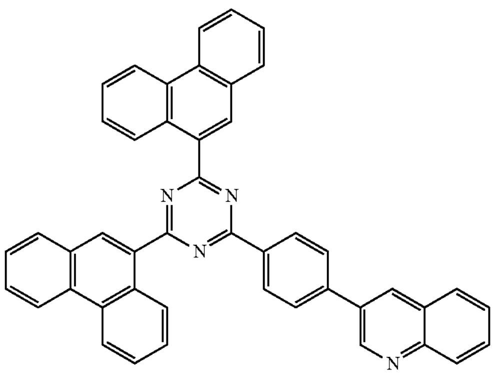
ET26
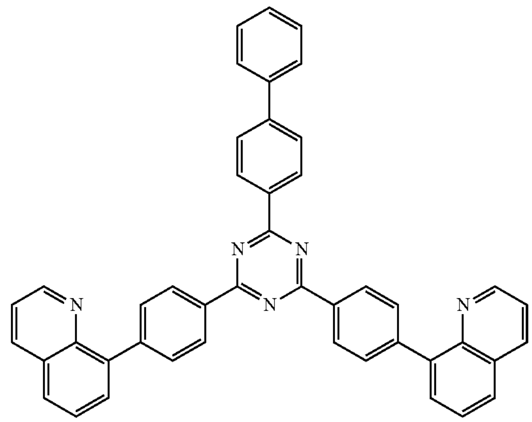
ET27
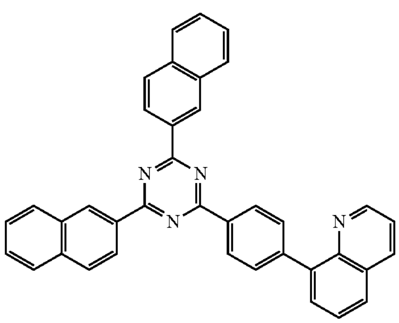
ET28
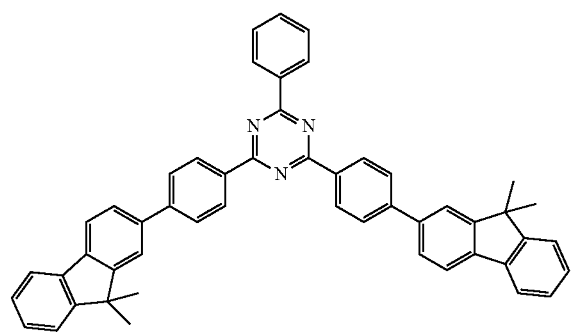
ET29
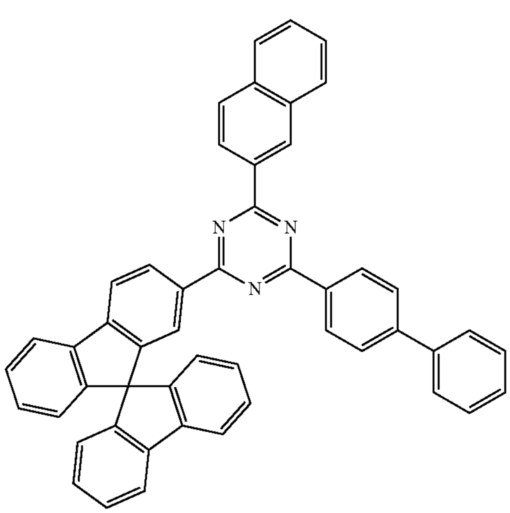
ET30
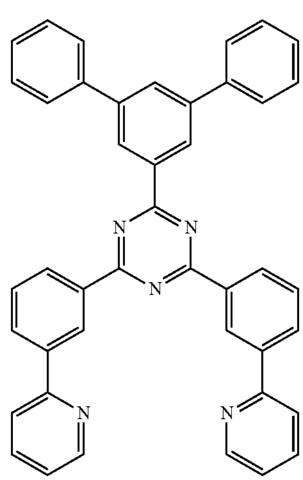

-continued
ET31
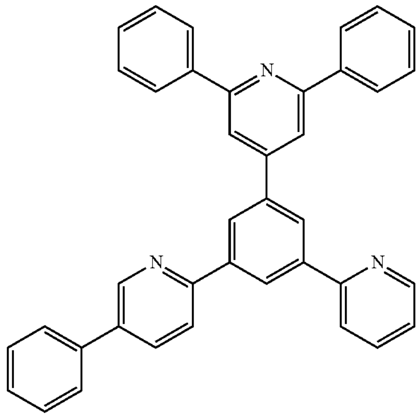
ET32
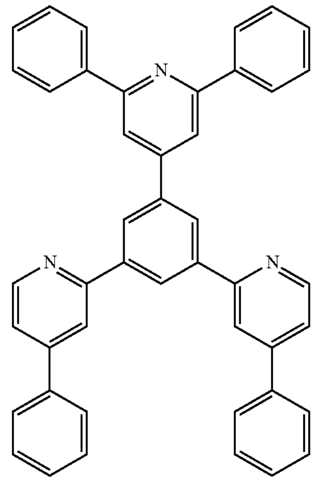
ET33
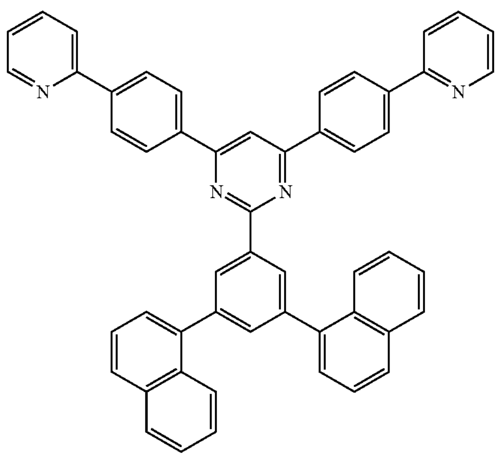
ET34
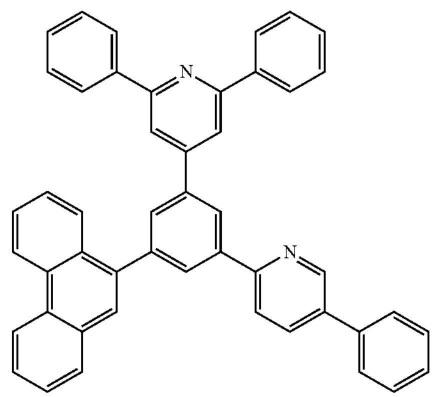
ET35
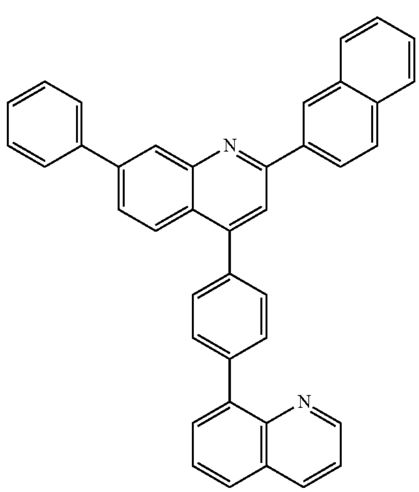
ET36
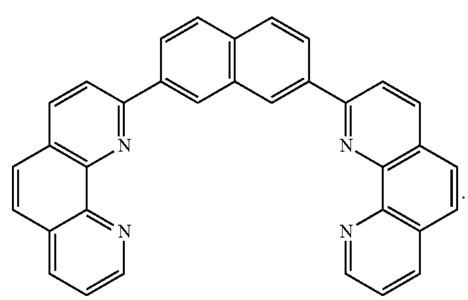
In one or more embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, Balq, 3-(biphenyl-4-yl)-5-(4-tert-butylphenyl)-4-phenyl-4H-1,2,4-triazole (TAZ), and NTAZ.

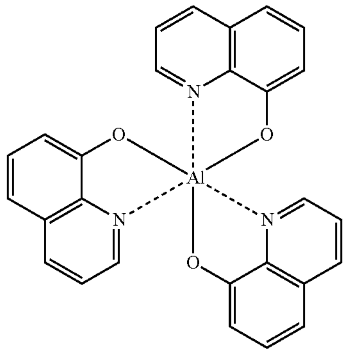

Alq3

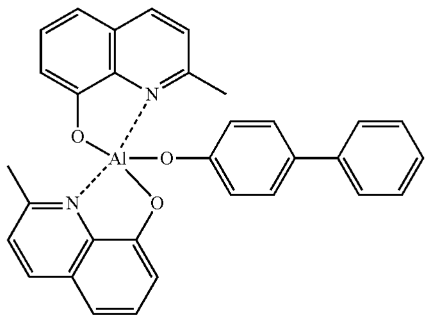

BAlq

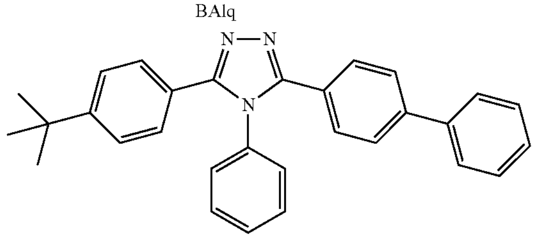

TAZ

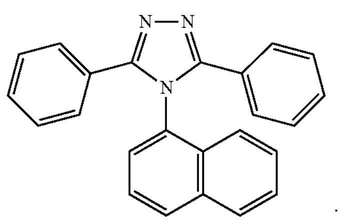

NTAZ

The thicknesses of the buffer layer, the hole blocking layer, and/or the electron control layer may each independently be about 20 Å to about 1,000 Å, and in some embodiments, about 30 Å to about 300 Å. When the thicknesses of the buffer layer, the hole blocking layer, and the electron control layer are each within these ranges, the electron blocking layer may have excellent electron blocking characteristics and/or electron control characteristics without a substantial increase in driving voltage.

The thickness of the electron transport layer may be about 100 Å to about 1,000 Å, and in some embodiments, about 150 Å to about 500 Å. When the thickness of the electron transport layer is within these ranges, the electron transport layer may have satisfactory electron transport characteristics without a substantial increase in driving voltage.

The electron transport region (for example, the electron transport layer in the electron transport region) may further include, in addition to the materials described above, a metal-containing material.

The metal-containing material may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, sodium (Na), potassium (K), rubidium (Rb), and cesium (Cs). In one or more embodiments, the alkali metal may be selected from Li, Na, and Cs. In one or more embodiments, the alkali metal may be selected from Li and Cs, but embodiments of the present disclosure are not limited thereto.

The alkali earth metal may be selected from magnesium (Mg), calcium (Ca), strontium (Sr), and barium (Ba).

The rare earth metal may be selected from scandium (Sc), yttrium (Y), cerium (Ce), ytterbium (Yb), gadolinium (Gd), and terbium (Tb).

The alkali metal compound, the alkaline earth metal compound, and the rare earth metal compound may be selected from oxides and halides (for example, fluorides, chlorides, bromides, and/or iodines) of the alkali metals, the alkaline earth metals, and the rare earth metals.

The alkali metal compound may be selected from alkali metal oxides (such as $Li_2O$, $Cs_2O$, and/or $K_2O$) and alkali metal halides (such as LiF, NaF, CsF, KF, LiI, NaI, CsI, and/or KI). In one embodiment, the alkali metal compound may be selected from LiF, $Li_2O$, NaF, LiI, NaI, CsI, and KI, but embodiments of the present disclosure are not limited thereto.

The alkaline earth metal compound may be selected from alkaline earth metal compounds (such as BaO, SrO, CaO, $Ba_xSr_{1-x}O(0<x<1)$, and/or $Ba_xCa_{1-x}O(0<x<1)$). In one embodiment, the alkaline earth metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex may include a metal ion selected from a Li ion, a Na ion, a K ion, a Rb ion, and a Cs ion, and the alkaline earth metal complex may include a metal ion selected from a Be ion, a Mg ion, a Ca ion, a Sr ion, and a Ba ion. Each ligand coordinated with the metal ion of the alkali metal complex or the alkaline earth-metal complex may independently be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) and/or Compound ET-D2.

ET-D1

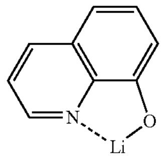

ET-D2

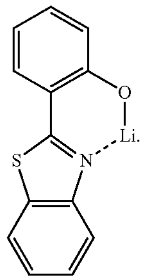

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include a reducing dopant.

The reducing dopant may include at least one selected from an alkali metal, an alkaline earth metal, a rare earth based metal, an alkali metal compound, an alkaline earth metal compound, a rare earth based metal compound, an alkali metal complex, an alkaline earth metal complex, and a rare earth based metal complex.

The alkali metal, the alkaline earth metal, and the rare earth based metal may each be the same as the alkali metals, alkaline earth metals, and rare earth based metals described above, but embodiments of the present disclosure are not limited thereto.

The alkali metal compound, the alkaline earth metal compound, and the rare earth based metal compound may each be the same as the alkali metal compounds, alkaline earth metal compounds, and rare earth based metal compounds described above, respectively, but embodiments of the present disclosure are not limited thereto.

The alkali metal complex, the alkaline earth metal complex, and the rare earth metal complex may each include an alkali metal ion, an alkaline earth metal ion, or a rare earth metal ion as described above, respectively, and each metal-coordinated ligand of the alkali metal complex, the alkaline earth metal complex, and the rare earth metal complex may independently be selected from hydroxyquinoline, hydroxyisoquinoline, hydroxybenzoquinoline, hydroxyacridine, hydroxyphenanthridine, hydroxyphenyl oxazole, hydroxyphenyl thiazole, hydroxydiphenyl oxadiazole, hydroxydiphenyl thiadiazole, hydroxyphenyl pyridine, hydroxyphenyl benzimidazole, hydroxyphenyl benzothiazole, bipyridine, phenanthroline, and cyclopentadiene, but embodiments of the present disclosure are not limited thereto.

The electron injection layer may include only the reducing dopant described above, or may include the reducing dopant and an organic material. When the electron injection layer includes the reducing dopant and an organic material, the reducing dopant may be homogeneously or non-homogeneously dispersed in a matrix of the organic material.

The thickness of the electron injection layer may be about 1 Å to about 100 Å, and in some embodiments, about 3 Å to about 90 Å. When the thickness of the electron injection layer is within these ranges, the electron injection layer may have satisfactory electron injection characteristics without a substantial increase in driving voltage.

Second Electrode 190

The second electrode 190 may be on the organic layer 150. The second electrode 190 may be a cathode (which is an electron injection electrode), and in this regard, a material for forming the second electrode 190 may be selected from a metal, an alloy, an electrically conductive compound, and mixtures thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layer structure, or a multi-layer structure including two or more layers.

Figure 2:
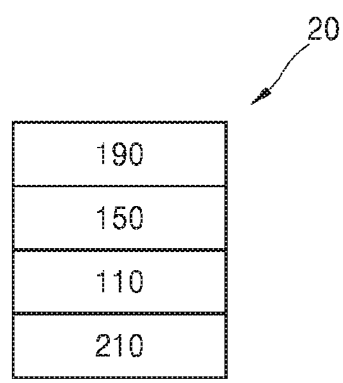
FIG. 2 is a schematic cross-sectional view of an organic light-emitting device according to an embodiment of the present disclosure.
Figure 3:
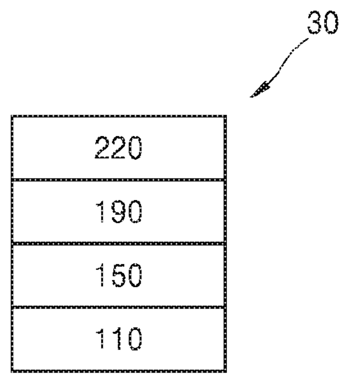
FIG. 3 is a schematic view of an organic light-emitting device according to an embodiment of the present disclosure.
Figure 4:
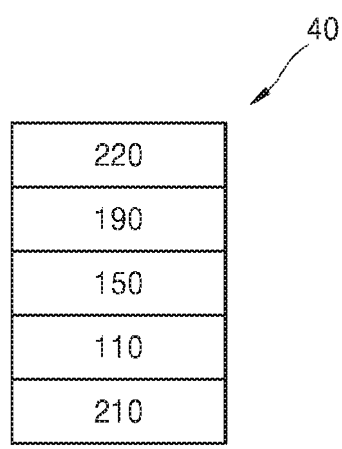
FIG. 4 is a schematic view of an organic light-emitting device according to an embodiment of the present disclosure.

Description of FIGS. 2 to 4

The organic light-emitting device 20 of FIG. 2 includes a first capping layer 210, a first electrode 110, an organic layer 150, and a second electrode 190 sequentially stacked in this stated order. The organic light-emitting device 30 of FIG. 3 includes a first electrode 110, an organic layer 150, a second electrode 190, and a second capping layer 220 sequentially stacked in this stated order. The organic light-emitting device 40 of FIG. 4 includes a first capping layer 210, a first electrode 110, an organic layer 150, a second electrode 190, and a second capping layer 220 sequentially stacked in this stated order.

In FIGS. 2 to 4, the first electrode 110, the organic layer 150, and the second electrode 190 may each be the same as described herein in connection with FIG. 1.

In the organic layer 150 of each of the organic light-emitting devices 20 and 40, light generated in the emission layer may pass through the first electrode 110 (which may be a semi-transmissive electrode or a transmissive electrode) and the first capping layer 210 toward the outside. In the organic layer 150 of each of the organic light-emitting devices 30 and 40, light generated in the emission layer may pass through the second electrode 190 (which may be a semi-transmissive electrode or a transmissive electrode) and the second capping layer 220 toward the outside.

The first capping layer 210 and the second capping layer 220 may increase the external luminescent efficiency of the device according to the principle of constructive interference.

The first capping layer 210 and the second capping layer 220 may each independently be selected from a capping layer including an organic material, an inorganic capping layer including an inorganic material, and a composite capping layer including an organic material and an inorganic material.

At least one selected from the first capping layer 210 and the second capping layer 220 may include at least one material selected from carbocyclic compounds, heterocyclic compounds, amine-based compounds, porphyrin derivatives, phthalocyanine derivatives, naphthalocyanine derivatives, alkali metal-based complexes, and alkaline earth metal-based complexes. The carbocyclic compound, the heterocyclic compound, and the amine-based compound may each be optionally substituted with a substituent containing at least one element selected from O, nitrogen (N), S, selenium (Se), silicon (Si), fluorine (F), chlorine (Cl), bromine (Br), and iodine (I). In one embodiment, at least one selected from the first capping layer 210 and the second capping layer 220 may include an amine-based compound.

In one embodiment, at least one selected from the first capping layer 210 and the second capping layer 220 may include the compound represented by Formula 201 and/or the compound represented by Formula 202.

In one or more embodiments, at least one selected from the first capping layer 210 and the second capping layer 220 may include a compound selected from Compounds HT28 to HT33 and Compounds CP1 to CP5, but embodiments of the present disclosure are not limited thereto.

CP1

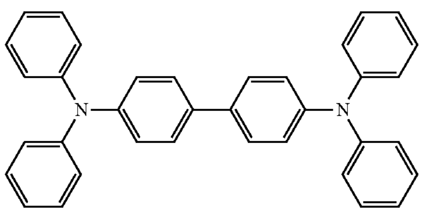

CP2

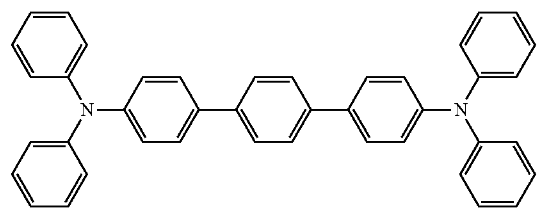

CP3

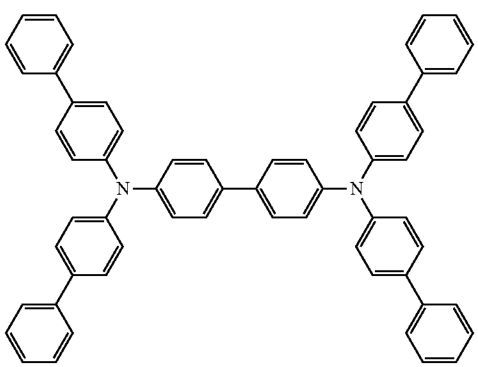

CP4

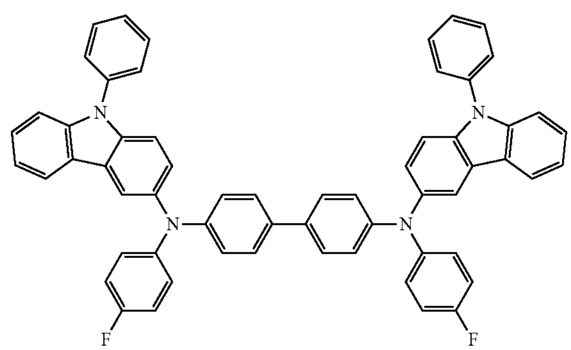

CP5

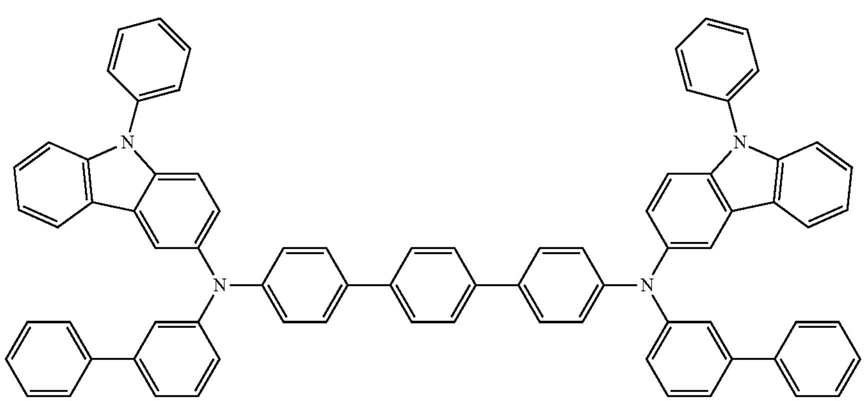

Hereinbefore, the organic light-emitting device according to an embodiment of the present disclosure has been described in connection with FIGS. 1 to 4. However, embodiments of the present disclosure are not limited thereto.

The layers constituting the hole transport region, the emission layer, and the layers constituting the electron transport region may be formed in a specific region using one or more suitable methods selected from vacuum deposition, spin coating, casting, a Langmuir-Blodgett (LB) method, ink-jet printing, laser-printing, and laser-induced thermal imaging.

When the layers constituting the hole transport region, the emission layer, and the layers constituting the electron transport region are each formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, depending on the compound to be included in each layer, and the structure of each layer to be formed.

When the layers constituting the hole transport region, the emission layer, and the layers constituting the electron transport region are each formed by spin coating, the spin coating may be performed at a coating speed of about 2,000 rpm to about 5,000 rpm and at a heat treatment temperature of about 80° C. to 200° C., depending on the compound to be included in each layer, and the structure of each layer to be formed.

General Definitions of Substituents

The term "$C_1$-$C_{60}$ alkyl group", as used herein, refers to a linear or branched aliphatic hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group", as used herein, refers to a divalent group having substantially the same structure as the $C_1$-$C_{60}$ alkyl group.

The term "$C_2$-$C_{60}$ alkenyl group", as used herein, refers to a hydrocarbon group having at least one carbon double bond in the body (e.g., middle) or at the terminus of the $C_2$-$C_{60}$ alkyl group, and non-limiting examples thereof may include an ethenyl group, a propenyl group, and a butenyl group. The term "$C_2$-$C_{60}$ alkenylene group", as used herein, refers to a divalent group having substantially the same structure as the $C_2$-$C_{60}$ alkenyl group.

The term "$C_2$-$C_{60}$ alkynyl group", as used herein, refers to a hydrocarbon group having at least one carbon triple bond in the body (e.g., middle) or at the terminus of the $C_2$-$C_{60}$ alkyl group, and non-limiting examples thereof may include an ethynyl group and a propynyl group. The term "$C_2$-$C_{60}$ alkynylene group", as used herein, refers to a divalent group having substantially the same structure as the $C_2$-$C_{60}$ alkynyl group.

The term "$C_1$-$C_{60}$ alkoxy group", as used herein, refers to a monovalent group represented by —O-$A_{101}$ (wherein $A_{101}$ is a $C_1$-$C_{60}$ alkyl group), and non-limiting examples thereof may include a methoxy group, an ethoxy group, and an isopropyloxy group.

The term "$C_3$-$C_{10}$ cycloalkyl group", as used herein, refers to a monovalent hydrocarbon monocyclic group having 3 to 10 carbon atoms, and non-limiting examples thereof may include a cyclopropyl group, a cyclobutyl group, a cyclopentyl group, a cyclohexyl group, and a cycloheptyl group. The term "$C_3$-$C_{10}$ cycloalkylene group", as used herein, refers to a divalent group having substantially the same structure as the $C_3$-$C_{10}$ cycloalkyl group.

The term "$C_1$-$C_{10}$ heterocycloalkyl group", as used herein, refers to a monovalent monocyclic group having at least one heteroatom selected from N, O, Si, P, and S as a ring-forming atom and 1 to 10 carbon atoms, and non-limiting examples thereof may include a 1,2,3,4-oxatriazolidinyl group, a tetrahydrofuranyl group, and a tetrahydrothiophenyl group. The term "$C_1$-$C_{10}$ heterocycloalkylene group", as used herein, refers to a divalent group having substantially the same structure as the $C_1$-$C_{10}$ heterocycloalkyl group.

The term "$C_3$-$C_{10}$ cycloalkenyl group", as used herein, refers to a monovalent monocyclic group that has 3 to 10 carbon atoms and at least one double bond in the ring thereof and does not have aromaticity (e.g., is non-aromatic), and non-limiting examples thereof may include a cyclopentenyl group, a cyclohexenyl group, and a cycloheptenyl group. The term "$C_3$-$C_{10}$ cycloalkenylene group", as used herein, refers to a divalent group having substantially the same structure as the $C_3$-$C_{10}$ cycloalkenyl group.

The term "$C_1$-$C_{10}$ heterocycloalkenyl group", as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 4,5-dihydro-1,2,3,4-oxatriazolyl group, a 2,3-hydrofuranyl group, and a 2,3-hydrothiophenyl group. The term "$C_1$-$C_{10}$ heterocycloalkenylene group", as used herein, refers to a divalent group having substantially the same structure as the $C_1$-$C_{10}$ heterocycloalkenyl group.

The term "$C_6$-$C_{60}$ aryl group", as used herein, refers to a monovalent group having a carbocyclic aromatic system having 6 to 60 carbon atoms, and the term "$C_6$-$C_{60}$ arylene group", as used herein, refers to a divalent group having a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused (e.g., condensed) to each other.

The term "$C_1$-$C_{60}$ heteroaryl group", as used herein, refers to a monovalent group having a carbocyclic aromatic system that has at least one heteroatom selected from N, O, Si, P, and S as a ring-forming atom in addition to 1 to 60 carbon atoms. The term "$C_1$-$C_{60}$ heteroarylene group", as used herein, refers to a divalent group having a carbocyclic aromatic system that has at least one heteroatom selected from N, O, Si, P, and S as a ring-forming atom in addition to 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused (e.g., condensed) to each other.

The term "$C_6$-$C_{60}$ aryloxy group", as used herein, indicates —O-$A_{102}$ (wherein $A_{102}$ is a $C_6$-$C_{60}$ aryl group), and the term "$C_6$-$C_{60}$ arylthio group", as used herein, indicates —S-$A_{103}$ (wherein $A_{103}$ is a $C_6$-$C_{60}$ aryl group).

The term "monovalent non-aromatic condensed polycyclic group", as used herein, refers to a monovalent group that has two or more rings condensed with each other, only carbon atoms as ring forming atoms (for example, 8 to 60 carbon atoms), and non-aromaticity in the entire molecular structure. A non-limiting example of a monovalent non-aromatic condensed polycyclic group may be a fluorenyl group. The term "divalent non-aromatic condensed polycyclic group", as used herein, refers to a divalent group having substantially the same structure as the monovalent non-aromatic condensed polycyclic group.

The term "monovalent non-aromatic condensed heteropolycyclic group", as used herein, refers to a monovalent group that has two or more rings condensed to each other, at least one heteroatom selected from N, O, Si, P, and S in addition to carbon atoms (for example, 1 to 60 carbon atoms) as ring forming atoms, and non-aromaticity in the entire molecular structure. A non-limiting example of a monovalent non-aromatic condensed heteropolycyclic group may be a carbazolyl group The term "divalent non-aromatic condensed heteropolycyclic group", as used herein, refers to a divalent group having substantially the same structure as the monovalent non-aromatic condensed heteropolycyclic group.

The term "$C_5$-$C_{60}$ carbocyclic group", as used herein, refers to a monocyclic or polycyclic group having 5 to 60 carbon atoms in which a ring-forming atom is a carbon atom only (e.g., a monocyclic or polycyclic group including 5 to 60 carbon atoms as ring-forming atoms). The term "$C_5$-$C_{60}$ carbocyclic group", as used herein, may refer to an aromatic carbocyclic group or a non-aromatic carbocyclic group. The $C_5$-$C_{60}$ carbocyclic group may be a ring (such as a benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group", as used herein, refers to a group having substantially the same structure as the $C_5$-$C_{60}$ carbocyclic group, except that at least one heteroatom selected from N, O, Si, P, and S is used in addition to 1 to 60 carbon atoms 1 to 60) as a ring-forming atom.

The term "$C_6$-$C_{20}$ arene group", as used herein, refers to a monocarbocyclic aromatic group or a polycarbocyclic aromatic group having 6 to 20 carbon atoms in which a ring-forming atom is a carbon atom only (e.g., a monocarbocyclic or a polycarbocyclic group including 6 to 60 carbon atoms as ring-forming atoms). The $C_6$-$C_{20}$ arene group may be a ring (such as a benzene), a monovalent group (such as a phenyl group), or a divalent group (such as a phenylene group). In one or more embodiments, depending on the number of substituents connected to the $C_6$-$C_{20}$ arene group, the $C_6$-$C_{20}$ arene group may be a trivalent group or a quadrivalent group.

The term "$C_1$-$C_{20}$ heteroarene group", as used herein, refers to a group having substantially the same structure as the $C_6$-$C_{20}$ arene group, except that at least one heteroatom selected from N, O, Si, P, and S is used in addition to carbon (e.g., 1 to 20 carbon atoms) as a ring-forming atom.

At least one substituent of the substituted $C_5$-$C_{60}$ carbocyclic group, substituted $C_1$-$C_{60}$ heterocyclic group, substituted $C_6$-$C_{20}$ arene group, substituted $C_1$-$C_{20}$ heteroarene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph", as used herein, refers to a phenyl group, the term "Me", as used herein, refers to a methyl group, the term "Et", as used herein, refers to an ethyl group, the term "ter-Bu" or "$Bu^t$", as used herein, refers to a tert-butyl, and the term "OMe", as used herein, refers to a methoxy group. The term "$D_5$-Ph", as used herein, refers to a substituent having the following structure:

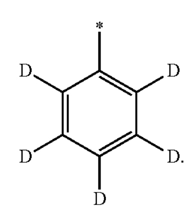

$D_5$—Ph

The term "biphenyl group", as used herein, refers to "a phenyl group substituted with a phenyl group". In other words, a "biphenyl group" is a substituted phenyl group having a $C_6$-$C_{60}$ aryl group as a substituent. The terms "2-biPh", "3-biPh", and "4-biPh", as used herein, respectively refer to the following structures:

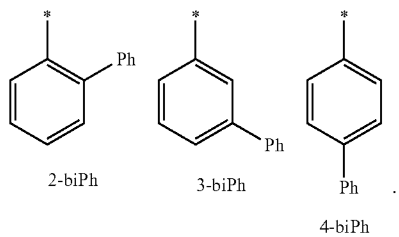

The term "terphenyl group", as used herein, refers to "a phenyl group substituted with a biphenyl group." In other words, a "terphenyl group" is a substituted phenyl group having a $C_6$-$C_{60}$ aryl group substituted with a $C_6$-$C_{60}$ aryl group as a substituent.

The terms "2-Me-1-Py", "3-Me-1-Py", "4-Me-1-Py", "5-Me-1-Py", "1-Me-2-Py", "3-Me-2-Py", "4-Me-2-Py", "5-Me-2-Py", "1-Me-3-Py", "2-Me-3-Py", "4-Me-3-Py", and "5-Me-3-Py", as used herein, respectively refer to the following structures:

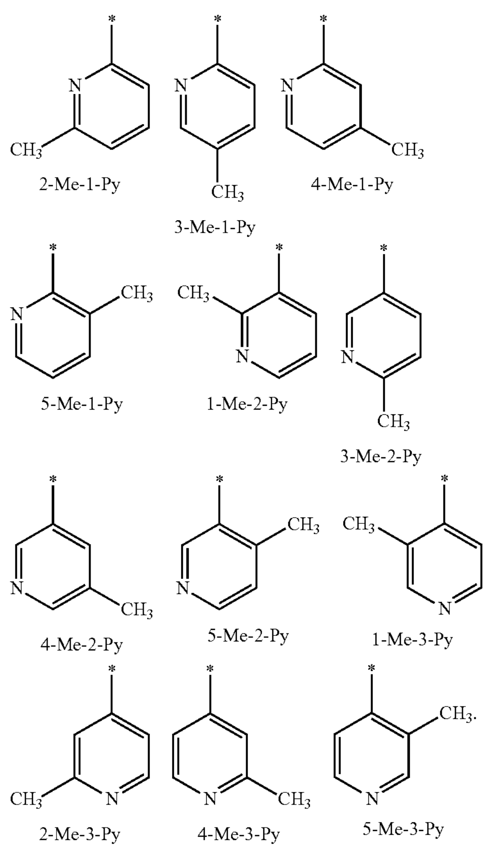

Symbols * and *' used herein, unless defined otherwise, refer to a binding site to a neighboring atom in a corresponding formula.

Hereinafter, a compound according to an embodiment of the present disclosure and an organic light-emitting device according to an embodiment of the present disclosure will be described in more detail with reference to Examples.

EXAMPLE

Example 1-1

An anode was manufactured by cutting a Corning 15 $\Omega/cm^2$ (1,200 Å) ITO glass substrate to a size of 50 mm×50 mm×0.7 mm, ultrasonically cleaning the glass substrate using isopropyl alcohol and pure water for 5 minutes each, irradiating the substrate with UV light for 30 minutes, and cleaning by exposure to ozone. Then, the anode was loaded into a vacuum deposition apparatus.

Compound HT28 was deposited on the anode to form a hole injection layer having a thickness of 300 Å, Compound HT3 was deposited on the hole injection layer to form a hole transport layer having a thickness of 400 Å, and Compound H1 (host) and Compound D1-1 (dopant) were co-deposited on the hole transport layer at a weight ratio of 95:5 to form an emission layer having a thickness of 300 Å.

Compound ET1 was deposited on the emission layer to form an electron transport layer having a thickness of 300 Å, LiF was deposited on the electron transport layer to form an electron injection layer having a thickness of 5 Å, and Al was deposited on the electron injection layer to form a cathode having a thickness of 2,000 Å, thereby completing the manufacture of an organic light-emitting device.

Examples 1-2 to 1-25 and Comparative Examples 1-1 to 1-4

Additional organic light-emitting devices were manufactured in substantially the same manner as in Example 1-1, except that the hosts and dopants shown in Table 1 were used in forming each emission layer.

TABLE 1

| | Host | Dopant |
|---|---|---|
| Example 1-1 | H1 | D1-1 |
| Example 1-2 | H12 | D1-1 |
| Example 1-3 | H28 | D1-1 |
| Example 1-4 | H49 | D1-1 |
| Example 1-5 | H54 | D1-1 |
| Example 1-6 | H69 | D1-1 |
| Example 1-7 | H100 | D1-1 |
| Example 1-8 | H133 | D1-1 |
| Example 1-9 | H138 | D1-1 |
| Example 1-10 | H155 | D1-1 |
| Example 1-11 | H1 | D1-9 |
| Example 1-12 | H1 | D1-21 |
| Example 1-13 | H1 | D1-40 |
| Example 1-14 | H1 | D1-56 |
| Example 1-15 | H1 | D1-72 |
| Example 1-16 | H1 | D2-2 |
| Example 1-17 | H1 | D2-10 |
| Example 1-18 | H1 | D2-27 |
| Example 1-19 | H1 | D2-55 |
| Example 1-20 | H1 | D2-126 |
| Example 1-21 | H1 | D2-134 |
| Example 1-22 | H1 | D2-173 |
| Example 1-23 | H1 | D2-179 |
| Example 1-24 | H1 | D2-201 |
| Example 1-25 | H1 | D2-205 |
| Comparative Example 1-1 | ADN | BD1 |
| Comparative Example 1-2 | ADN | D1 |
| Comparative Example 1-3 | H1 | BD1 |
| Comparative Example 1-4 | H1 | BD2 |

H1
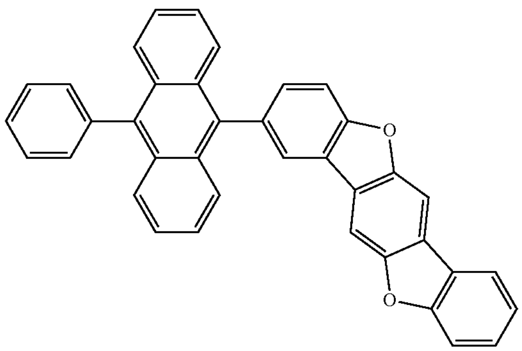
H12
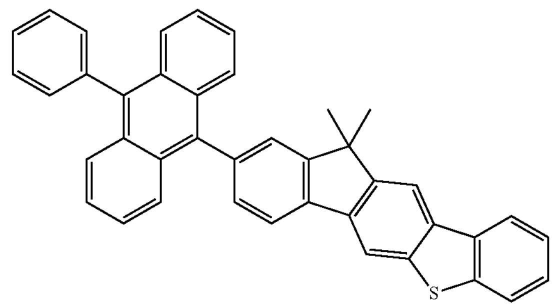
H28
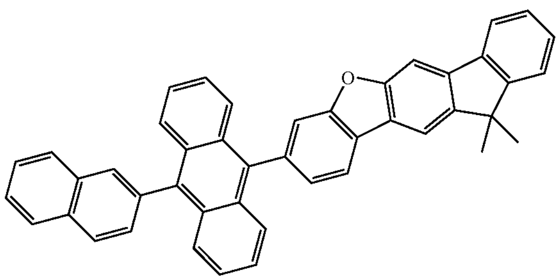
H49
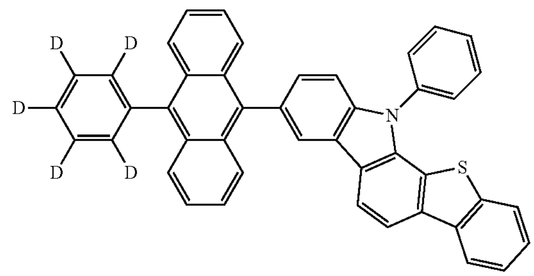
H54
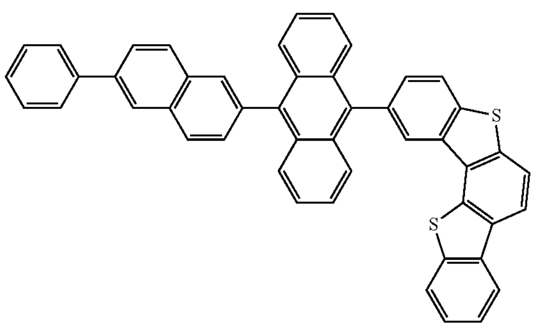
H69
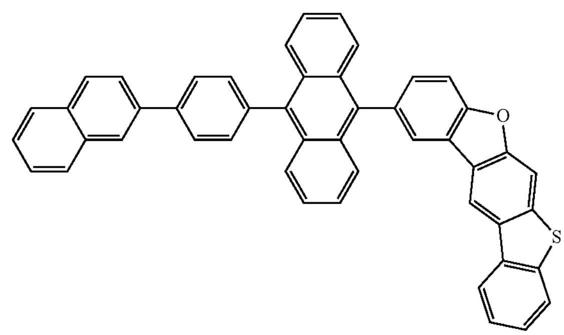
H100
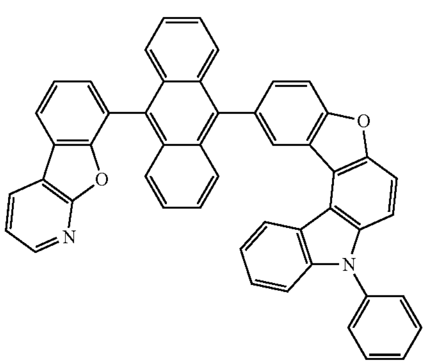
H133
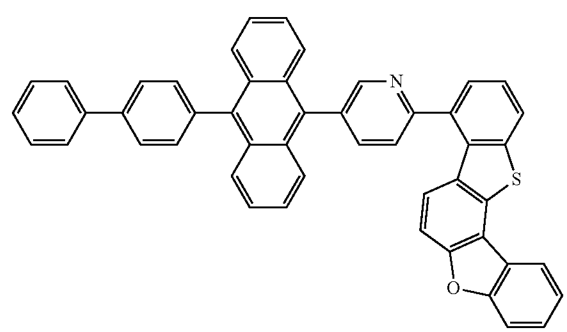

-continued
H138
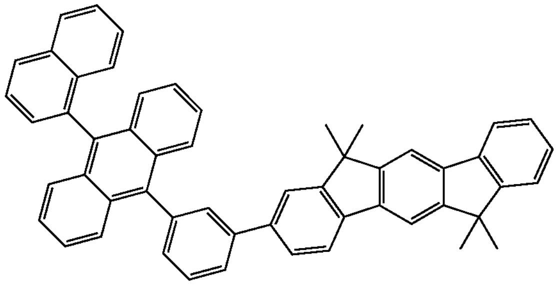
H155
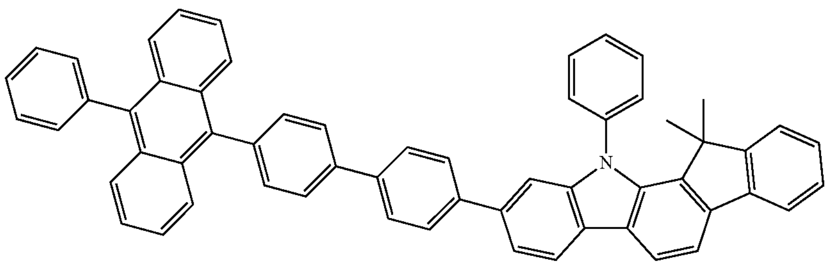
D1-1
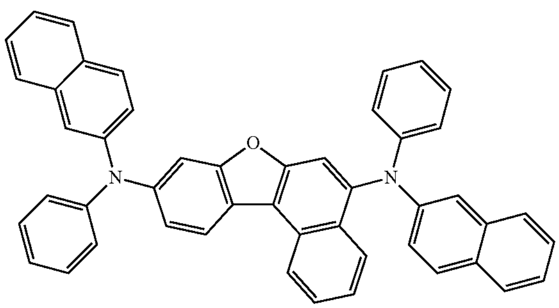
D1-9
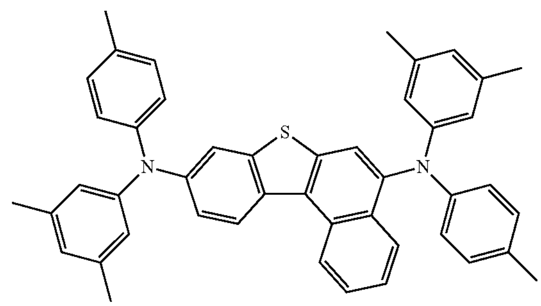
D1-21
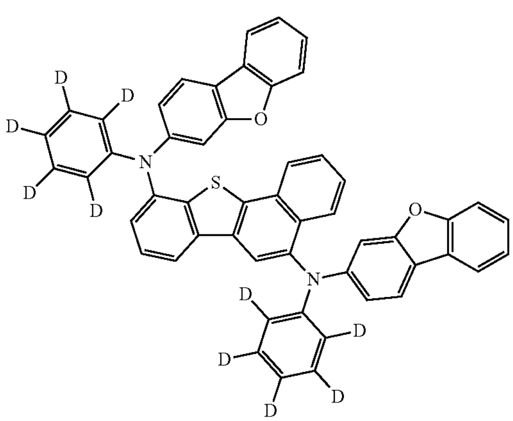
D1-40
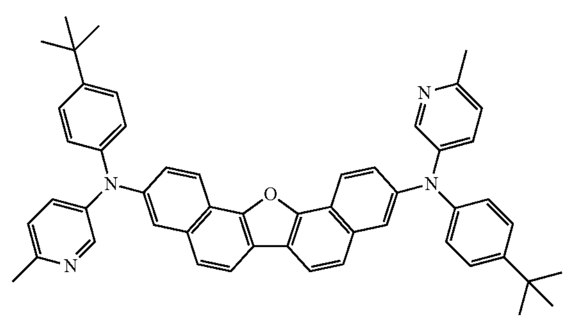

-continued
D1-56
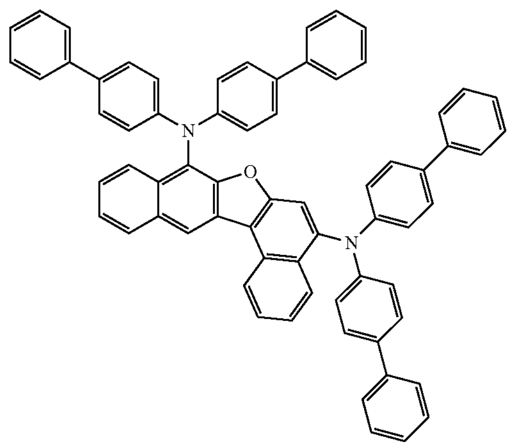
D1-72
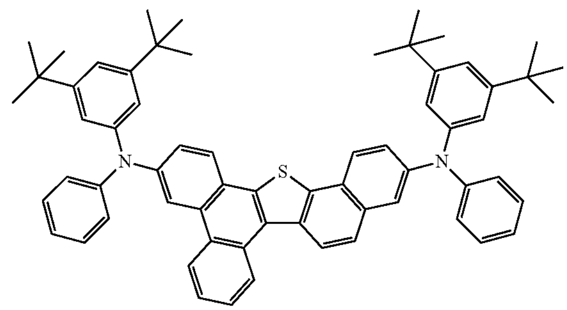
D2-2
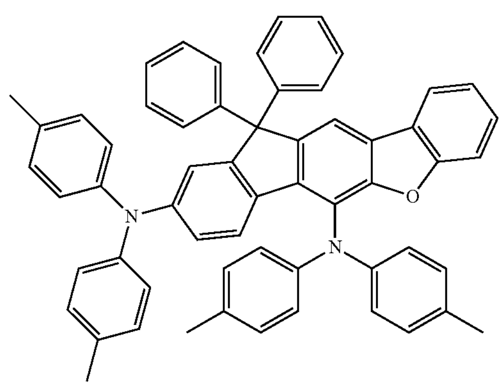
D2-10
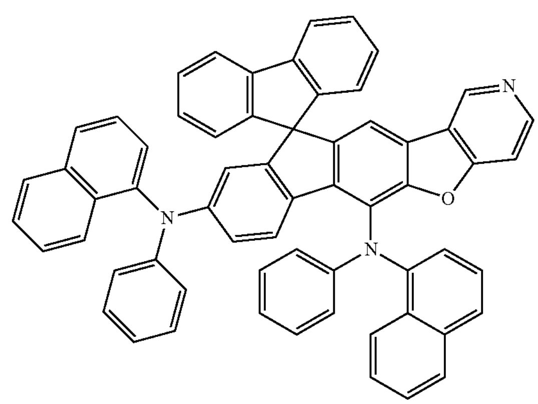
D2-27
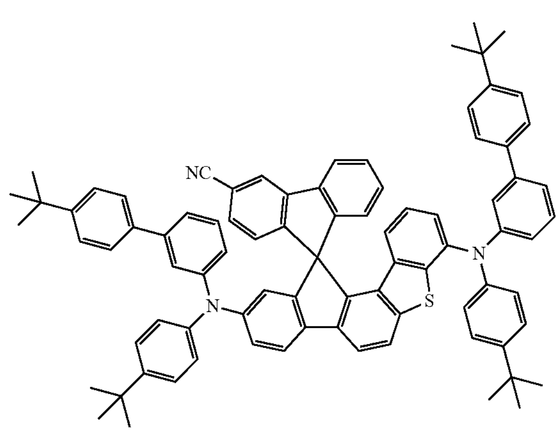
D2-55
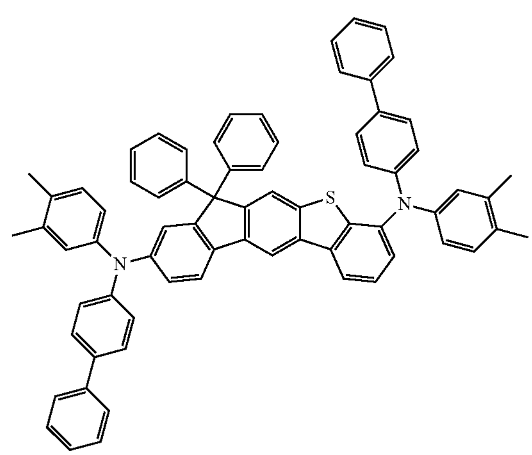

-continued
D2-126
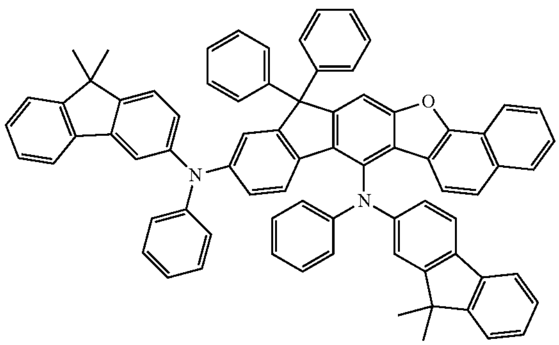
D2-134
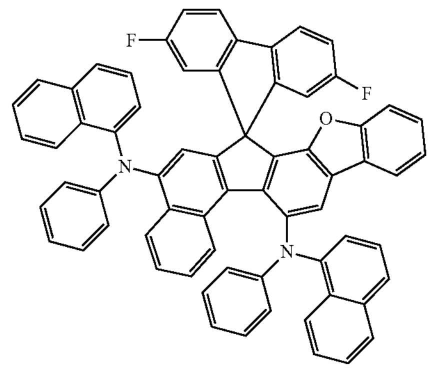
D2-173
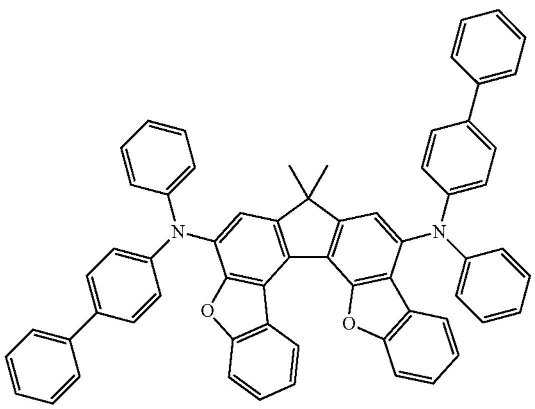
D2-179
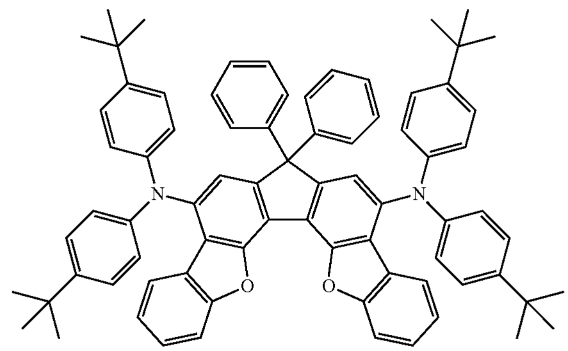
D2-201
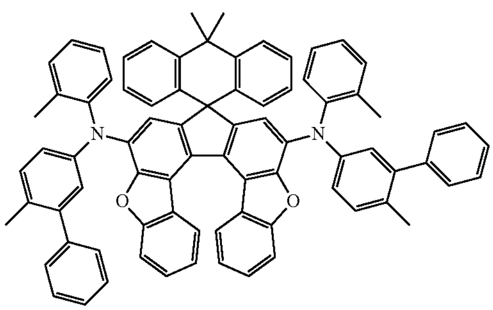
D2-205
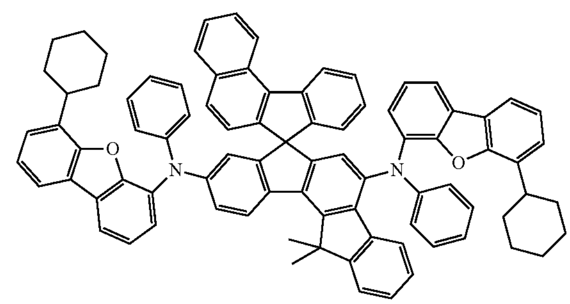
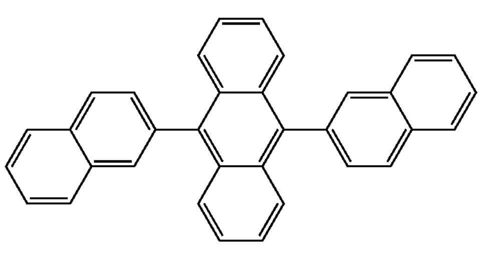
ADN
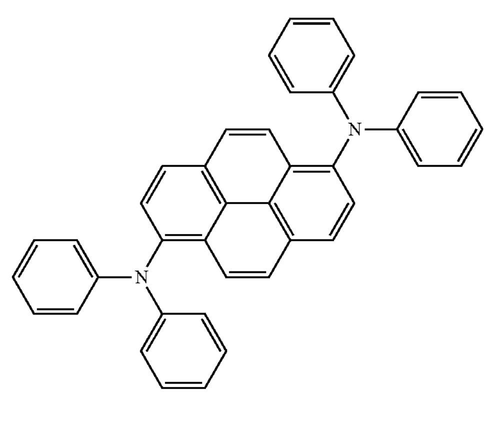
BD1

-continued

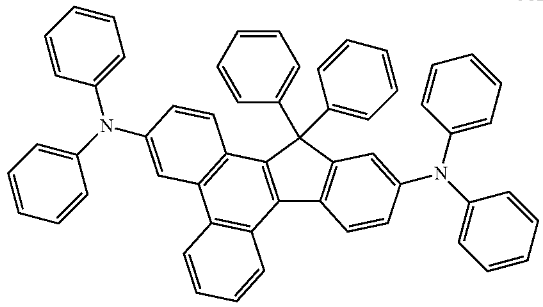

BD2

Example 2-1

An anode was manufactured by cutting a Corning 15 Ω/cm[2] (1200 Å) ITO glass substrate to a size of 50 mm×50 mm×0.7 mm, ultrasonically cleaning the glass substrate using isopropyl alcohol and pure water for 5 minutes each, irradiating the substrate with UV light for 30 minutes, and cleaning by exposure to ozone. Then, the anode was loaded into a vacuum deposition apparatus.

Compound HT3 and Compound F4-TCNQ were co-deposited on the glass substrate at a weight ratio of 95:5 to form a hole injection layer having a thickness of 100 Å, and Compound HT3 was deposited on the hole injection layer to form a hole transport layer having a thickness of 600 Å.

Subsequently, Compound H1 (host) and D1-1 (dopant) were co-deposited on the hole transport layer at a weight ratio of 95:5 to form an emission layer having a thickness of 300 Å.

Compound ET1 and LiQ were co-deposited on the emission layer at a weight ratio of 50:50 to form an electron transport layer having a thickness of 300 Å, and LiF was deposited on the electron transport layer to form an electron injection layer having a thickness of 10 Å, thereby completing the formation of an electron transport region. Al was vacuum deposited to form a cathode having a thickness of 2,000 Å, thereby completing the manufacture of an organic light-emitting device.

Examples 2-2 to 2-16 and Comparative Examples 2-1 to 2-4

Additional organic light-emitting devices were manufactured in substantially the same manner as in Example 2-1, except that the hosts and dopants shown in Table 2 were used in forming each emission layer.

TABLE 2

| | Host | Dopant |
|---|---|---|
| Example 2-1 | H1 | D1-1 |
| Example 2-2 | H1 | D1-9 |
| Example 2-3 | H1 | D1-21 |
| Example 2-4 | H1 | D1-40 |
| Example 2-5 | H1 | D1-56 |
| Example 2-6 | H1 | D1-72 |
| Example 2-7 | H1 | D2-2 |
| Example 2-8 | H1 | D2-10 |
| Example 2-9 | H1 | D2-27 |
| Example 2-10 | H1 | D2-55 |
| Example 2-11 | H1 | D2-126 |
| Example 2-12 | H1 | D2-134 |

TABLE 2-continued

| | Host | Dopant |
|---|---|---|
| Example 2-13 | H1 | D2-173 |
| Example 2-14 | H1 | D2-179 |
| Example 2-15 | H1 | D2-201 |
| Example 2-16 | H1 | D2-205 |
| Comparative Example 2-1 | ADN | BD1 |
| Comparative Example 2-2 | ADN | D1 |
| Comparative Example 2-3 | H1 | BD1 |
| Comparative Example 2-4 | H1 | BD2 |

H1

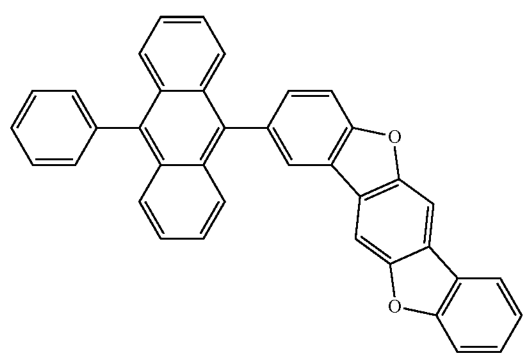

D1-1

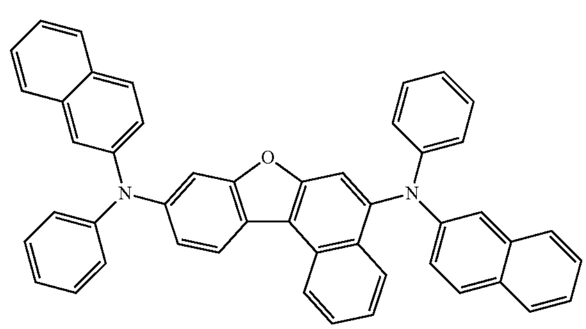

-continued
D1-9
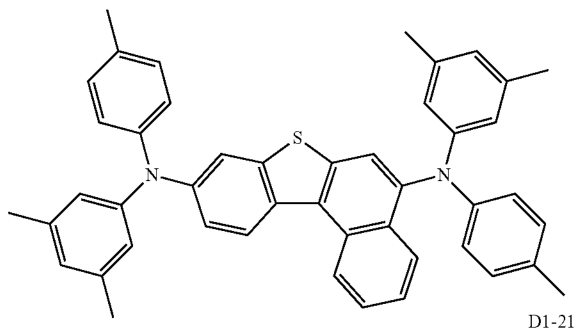
D1-21
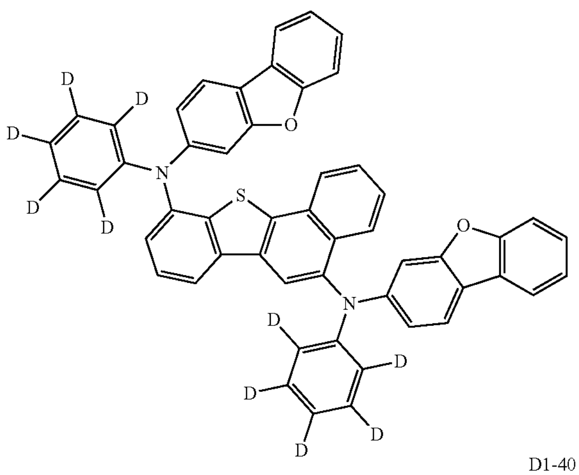
D1-40
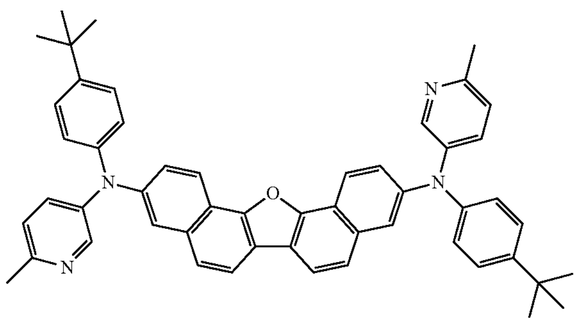
D1-56
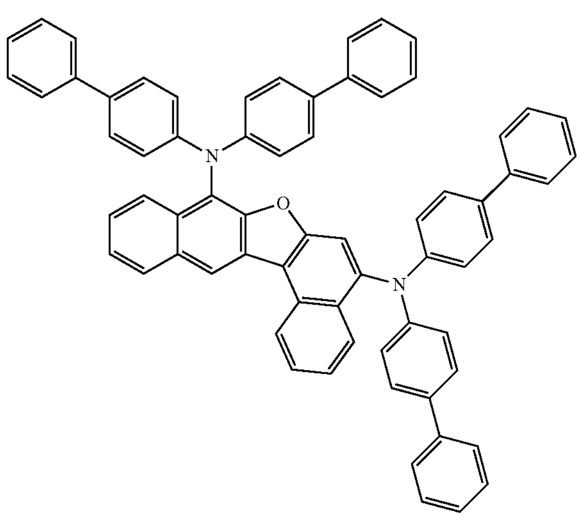
-continued
D1-72
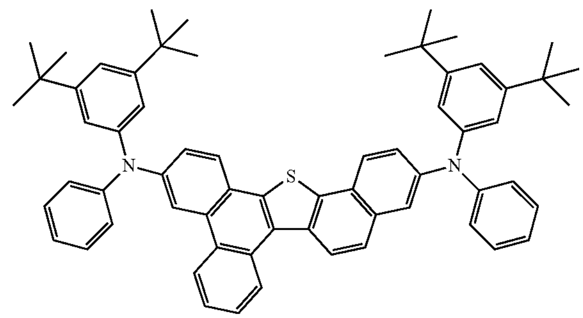
D2-2
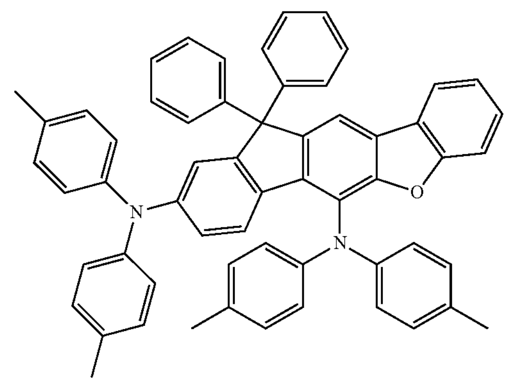
D2-10
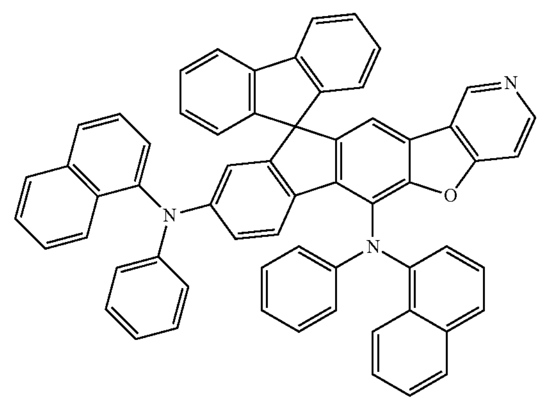
D2-27
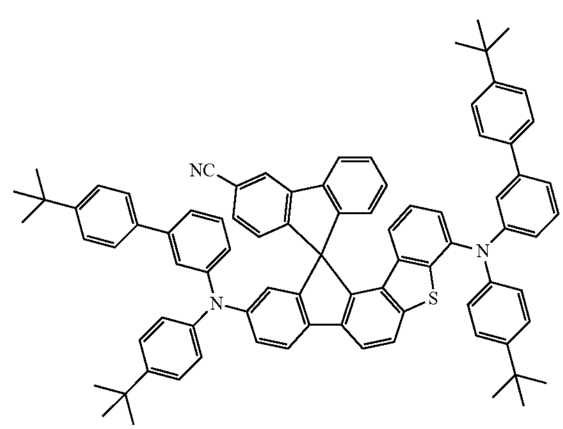

-continued
D2-55
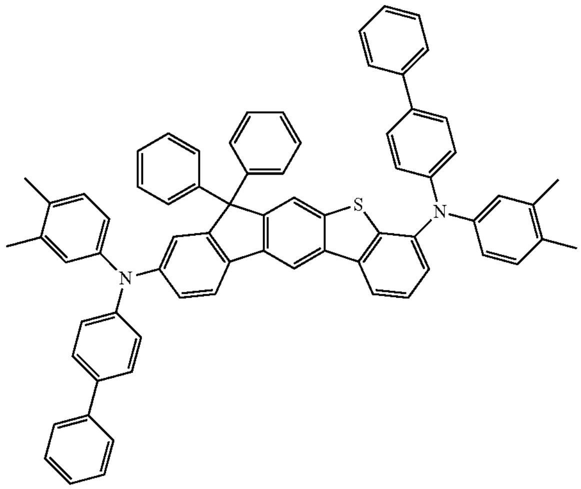
D2-126
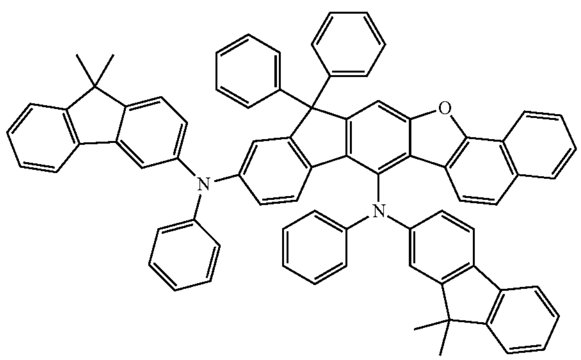
D2-134
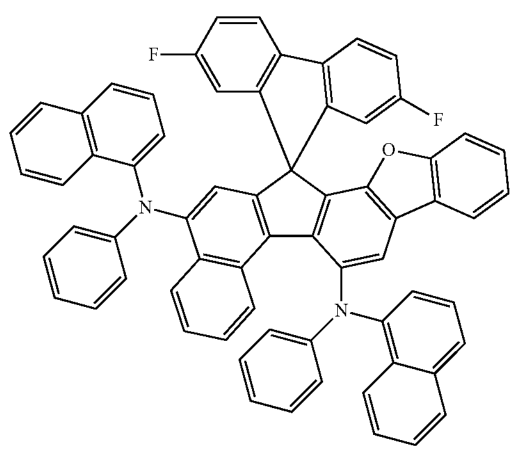
-continued
D2-173
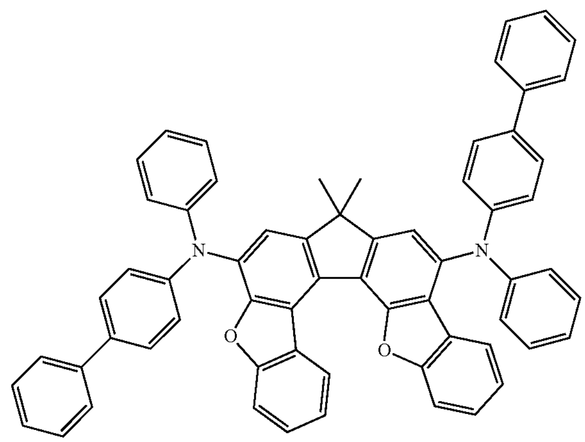
D2-179
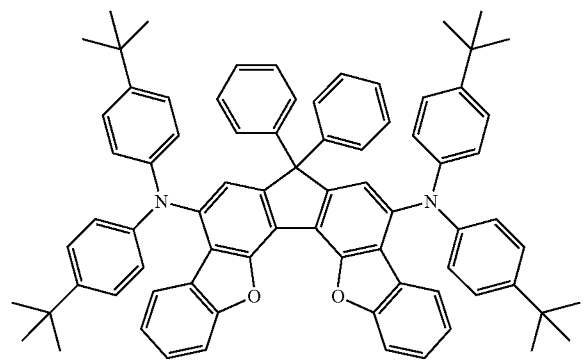
D2-201
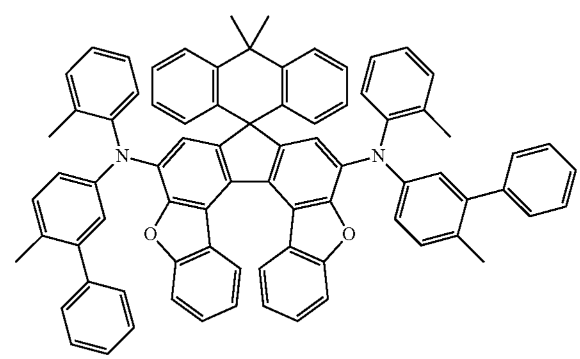
D2-205
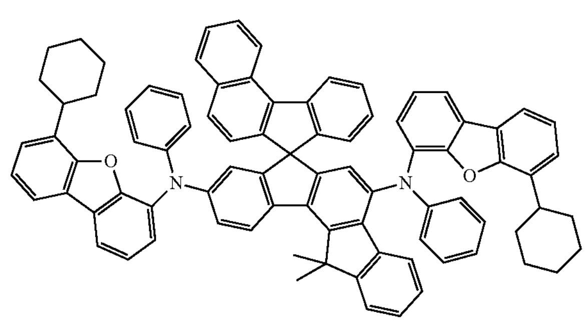

-continued

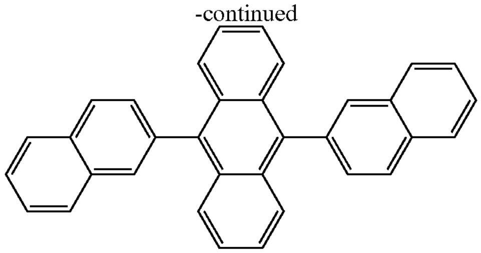

ADN

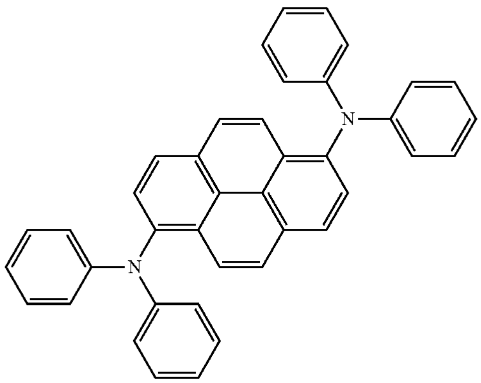

BD1

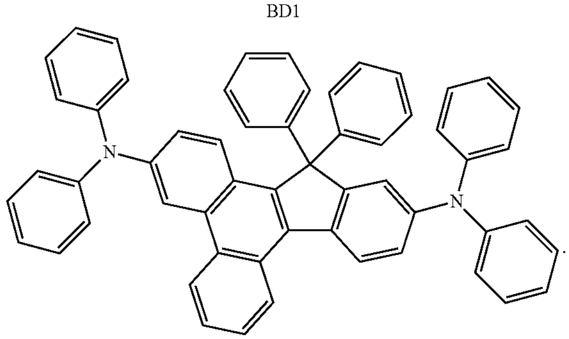

BD2

Evaluation Example

The efficiency (at a current density at 10 mA/cm$^2$) and lifespan ($T_{90}$ at a current density at 10 mA/cm$^2$) of each organic light-emitting device manufactured according to Examples 1-1 to 1-25, Examples 2-1 to 2-16, Comparative Examples 1-1 to 1-4, and Comparative Examples 2-1 to 2-4 were evaluated using a Keithley 2400 and a Minolta Cs-1000A. The lifespan refers to the amount of time elapsed when the luminance of the device was decreased to 90% of the initial luminance. The results are shown in Tables 3 and 4.

TABLE 3

| | Host | Dopant | Efficiency (cd/A) | Lifespan (Hours) |
|---|---|---|---|---|
| Example 1-1 | H1 | D1-1 | 5.2 | 110 |
| Example 1-2 | H12 | D1-1 | 5.5 | 120 |
| Example 1-3 | H28 | D1-1 | 5.4 | 110 |
| Example 1-4 | H49 | D1-1 | 5.5 | 130 |
| Example 1-5 | H54 | D1-1 | 5.3 | 130 |
| Example 1-6 | H69 | D1-1 | 5.3 | 125 |
| Example 1-7 | H100 | D1-1 | 5.4 | 110 |
| Example 1-8 | H133 | D1-1 | 5.2 | 115 |
| Example 1-9 | H138 | D1-1 | 5.5 | 125 |
| Example 1-10 | H155 | D1-1 | 5.5 | 120 |
| Example 1-11 | H1 | D1-9 | 5.5 | 120 |
| Example 1-12 | H1 | D1-21 | 5.4 | 125 |
| Example 1-13 | H1 | D1-40 | 5.4 | 105 |
| Example 1-14 | H1 | D1-56 | 5.3 | 110 |
| Example 1-15 | H1 | D1-72 | 5.4 | 110 |
| Example 1-16 | H1 | D2-2 | 5.4 | 130 |
| Example 1-17 | H1 | D2-10 | 5.2 | 120 |
| Example 1-18 | H1 | D2-27 | 5.3 | 120 |
| Example 1-19 | H1 | D2-55 | 5.3 | 120 |
| Example 1-20 | H1 | D2-126 | 5.2 | 130 |
| Example 1-21 | H1 | D2-134 | 5.4 | 125 |
| Example 1-22 | H1 | D2-173 | 5.4 | 110 |
| Example 1-23 | H1 | D2-179 | 5.5 | 110 |
| Example 1-24 | H1 | D2-201 | 5.5 | 120 |
| Example 1-25 | H1 | D2-205 | 5.4 | 120 |
| Comparative Example 1-1 | ADN | BD1 | 4.5 | 35 |
| Comparative Example 1-2 | ADN | D1 | 4.7 | 60 |
| Comparative Example 1-3 | H1 | BD1 | 4.6 | 80 |
| Comparative Example 1-4 | H1 | BD2 | 4.8 | 60 |

TABLE 4

| | Host | Dopant | Efficiency (cd/A) | Lifespan (Hours) |
|---|---|---|---|---|
| Example 2-1 | H1 | D1-1 | 5.5 | 130 |
| Example 2-2 | H1 | D1-9 | 5.7 | 120 |
| Example 2-3 | H1 | D1-21 | 5.7 | 130 |
| Example 2-4 | H1 | D1-40 | 5.4 | 130 |
| Example 2-5 | H1 | D1-56 | 5.5 | 135 |
| Example 2-6 | H1 | D1-72 | 5.6 | 140 |
| Example 2-7 | H1 | D2-2 | 5.6 | 140 |
| Example 2-8 | H1 | D2-10 | 5.5 | 125 |
| Example 2-9 | H1 | D2-27 | 5.7 | 130 |
| Example 2-10 | H1 | D2-55 | 5.4 | 130 |
| Example 2-11 | H1 | D2-126 | 5.5 | 125 |
| Example 2-12 | H1 | D2-134 | 5.6 | 140 |
| Example 2-13 | H1 | D2-173 | 5.6 | 130 |
| Example 2-14 | H1 | D2-179 | 5.7 | 135 |
| Example 2-15 | H1 | D2-201 | 5.5 | 140 |
| Example 2-16 | H1 | D2-205 | 5.5 | 125 |
| Comparative Example 2-1 | ADN | BD1 | 4.6 | 50 |
| Comparative Example 2-2 | ADN | D1 | 4.8 | 80 |
| Comparative Example 2-3 | H1 | BD1 | 4.8 | 100 |
| Comparative Example 2-4 | H1 | BD2 | 4.9 | 90 |

From Table 3, it is seen that the organic light-emitting devices of Examples 1-1 to 1-25 have better characteristics (e.g., increased efficiencies and longer lifespans) than the organic light-emitting devices of Comparative Examples 1-1 to 1-4.

From Table 4, it is seen that the organic light-emitting devices of Examples 2-1 to 2-16 have better characteristics (e.g., increased efficiencies and longer lifespans) than the organic light-emitting devices of Comparative Examples 2-1 to 2-4.

An organic light-emitting device according to an embodiment of the present disclosure may have improved efficiency and lifespan characteristics.

It should be understood that the embodiments described herein should be considered in a descriptive sense only and not for purposes of limitation. Descriptions of features or aspects within each embodiment should typically be considered as being available for other similar features or aspects in other embodiments.

As used herein, expressions such as “at least one of”, “one of”, and “selected from”, when preceding a list of elements, modify the entire list of elements and do not modify the individual elements of the list. Further, the use of “may” when describing embodiments of the present disclosure refers to “one or more embodiments of the present disclosure”.

In addition, as used herein, the terms “use”, “using”, and “used” may be considered synonymous with the terms “utilize”, “utilizing”, and “utilized”, respectively.

As used herein, the terms “substantially”, “about”, and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the drawings, it will be understood by those of ordinary skill in the art that various changes in form and details may be made therein without departing from the spirit and scope as defined by the following claims and equivalents thereof.

What is claimed is:

1. An organic light-emitting device comprising:

a first electrode;

a second electrode; and an organic layer between the first electrode and the second electrode and comprising an emission layer, wherein the organic layer comprises a first compound represented by Formula 1and a second compound represented by Formula 2:

Formula 1

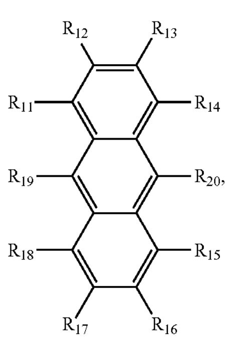

-continued

Formula 2

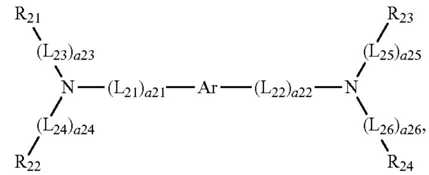

Formula 1A

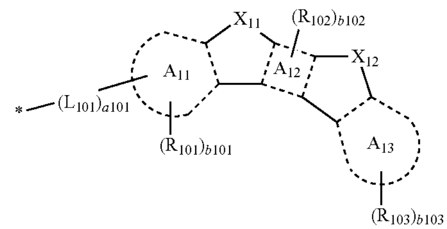

Formula 1B

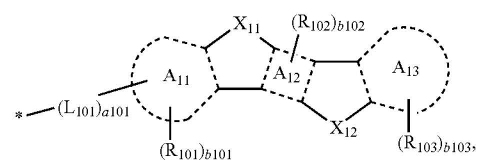

Formula 1C

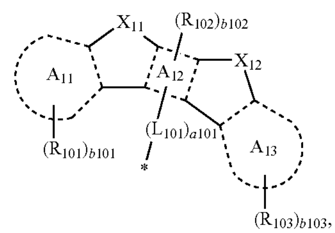

Formula 1E $$*—(L_{102})_{a102}—R_{108},$$

Formula 2B

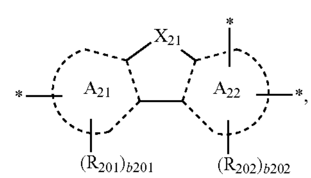

Formula 2C

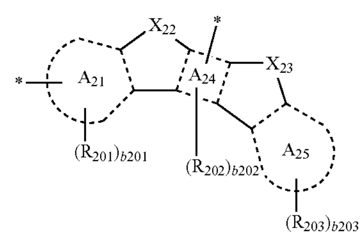

Formula 2D

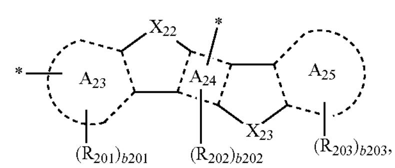

wherein, in Formulae 1, 2, 1A to 1C and 1E, and 2B to 2D, $R_{11}$ to $R_{20}$ are each independently selected from hydrogen, deuterium, —F, —Cl, —Br, —I, a group represented by one of Formulae 1A to 1C and 1E, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, provided that at least one selected from $R_{11}$ to $R_{20}$ is selected from groups represented by Formulae 1A to 1C;

$X_{11}$ is selected from oxygen, sulfur, $N(R_{104})$, and $C(R_{104})(R_{105})$;

$X_{12}$ is selected from oxygen, sulfur, $N(R_{106})$, and $C(R_{106})(R_{107})$;

$A_{11}$ to $A_{13}$ are each independently selected from a $C_5$-$C_{20}$ carbocyclic group and a $C_1$-$C_{20}$ heterocyclic group;

$L_{101}$ and $L_{102}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{6o}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a101 and a102 are each independently selected from 0, 1, 2, and 3;

$R_{101}$ to $R_{108}$ are each independently selected from hydrogen, deuterium,—F, —Cl, —Br, —I, a hydroxyl group, a cyano group, a nitro group, an am amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$ and —$P(=O)(Q_1)(Q_2)$;

$R_{104}$ and $R_{105}$ are optionally linked to form a saturated or unsaturated ring, and $R_{106}$ and $R_{107}$ are optionally linked to form a saturated or unsaturated ring;

b101 to b103 are each independently selected from 1, 2, 3, 4, 5, 6, 7, 8, 9, and 10;

Ar is selected from groups represented by Formulae 2B to 2D;

$X_{21}$ is selected from oxygen and sulfur;

$X_{22}$ is selected from oxygen, sulfur, $N(R_{204})$, and $C(R_{204})(R_{205})$;

$X_{23}$ is selected from oxygen, sulfur, $N(R_{206})$, and $C(R_{206})(R_{207})$;

$A_{21}$ and $A_{22}$ are each independently selected from a $C_6$-$C_{20}$ arene group and a $C_1$-$C_{20}$hetero arene group, provided that $A_{21}$ and $A_{22}$ are not both benzene;

$A_{23}$ to $A_{25}$ are each independently selected from a $C_5$-$C_{20}$ carbocyclic group and a $C_1$-$C_{20}$ heterocyclic group;

$L_{21}$ to $L_{26}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 to a26 are each independently selected from 0, 1, 2, and 3;

$R_{21}$ to $R_{24}$ are each independently selected from a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group;

$R_{21}$ and $R_{22}$ are optionally linked to form a saturated or unsaturated ring, and $R_{23}$ and $R_{24}$ are optionally linked to form a saturated or unsaturated ring;

$R_{201}$ to $R_{207}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$ and —$P(=O)(Q_1)(Q_2)$;

$R_{204}$ and $R_{205}$ are optionally linked to form a saturated or unsaturated ring, and $R_{206}$ and $R_{207}$ are optionally linked to form a saturated or unsaturated ring;

b201 to b203 are each independently selected from 1, 2, 3, 4, 5, 6, 7, 8, 9, and 10;

$Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and

* indicates a binding site to a neighboring atom.

2. The organic light-emitting device of claim 1, wherein:

$R_{11}$ to $R_{20}$ are each independently selected from hydrogen, deuterium, —F, —Cl, —Br, —I, a group represented by one of Formulae 1A to 1C and 1E, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$), wherein $Q_1$ to $Q_3$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

3. The organic light-emitting device of claim 1, wherein:

$A_{11}$ to $A_{13}$ are each independently selected from a benzene group, a naphthalene group, a phenanthrene group, an anthracene group, a triphenylene group, a pyrene group, a chrysene group, a furan group, a thiophene group, a pyrrole group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, a phenanthroline group, a benzofuran group, a benzothiophene group, an indene group, an indole group, a furopyridine group, a thienopyridine group, a cyclopentapyridine group, a pyrrolopyridine group, a dibenzofuran group, a dibenzothiophene group, a fluorene group, a carbazole group, a benzofuropyrrole group, a benzothienopyrrole group, an indenopyrrole group, an indolopyrrole group, a benzofurothiophene group, a benzothienothiophene group, an indenothiophene group, an indolothiophene group, a benzofurofuran group, a benzothienofuran group, an indenofuran group, an indolofuran group, a benzofurothiophene group, a benzothienothiophene group, an indenothiophene group, an indolothiophene group, a benzofuropyridine group, a benzothienopyridine group, an indenopyridine group, an indolopyridine group, a benzofuropyrimidine group, a benzothienopyrimidine group, an indenopyrimidine group, an indolopyrimidine group, a benzofuroindole group, a benzothienoindole group, an indenoindole group, an indoloindole group, a benzofurobenzofuran group, a benzothienobenzofuran group, an indenobenzofuran group, an indolobenzofuran group, a benzofurobenzothiophene group, a benzothienobenzothiophene group, an indenobenzothiophene group, an indolobenzothiophene group, a benzofuroquinoline group, a benzothienoquinoline group, an indenoquinoline group, an indoloquinoline group, a benzonaphthofuran group, a benzonaphthothiophene group, a benzofluorene group, a benzocarbazole group, a dinaphthofuran group, a dinaphthothiophene group, a dibenzofluorene group, a dibenzocarbazole group, a benzoxazole group, a benzothiazole group, a benzimidazole group, a naphthofuran, a naphthothiophene, a cyclopentanaphthalene group, a spiro-bifluorene group, and a spiro-fluorene-indene group.

4. The organic light-emitting device of claim 1, wherein:

$R_{101}$ to $R_{107}$ are each independently selected from hydrogen, deuterium, —F, —Cl, —Br, —I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), and —Si($Q_1$)($Q_2$)($Q_3$);

$Q_1$ to $Q_3$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and $R_{104}$ and $R_{105}$ are optionally linked to form a saturated or unsaturated ring, and $R_{106}$ and $R_{107}$ are optionally linked to form a saturated or unsaturated ring.

5. The organic light-emitting device of claim 1, wherein:

$R_{108}$ is selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and —Si($Q_{31}$)($Q_{32}$)($Q_{33}$); and —N($Q_1$)($Q_2$) and —Si($Q_1$)($Q_2$)($Q_3$), wherein $Q_1$ to $Q_3$ and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

6. The organic light-emitting device of claim 1, wherein:

$R_{108}$ is selected from groups represented by Formulae 5-1 to 5-128:

5-1

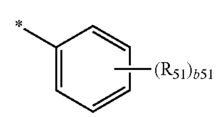

5-2

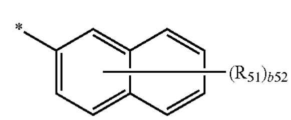

5-3

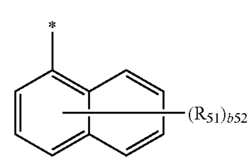

-continued
5-4
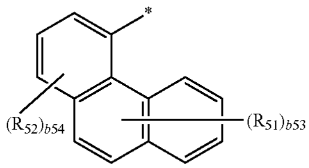
5-5
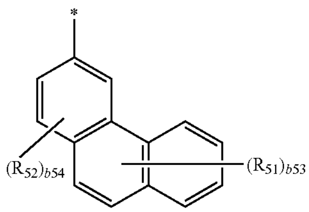
5-6
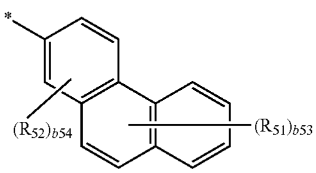
5-7
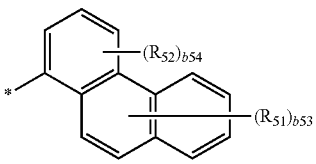
5-8
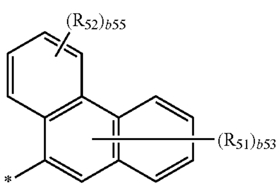
5-9
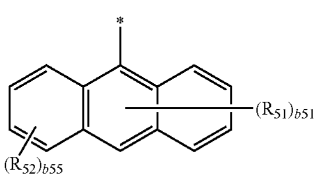
5-10
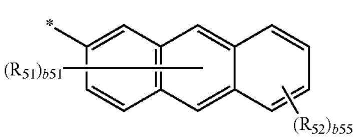
5-11
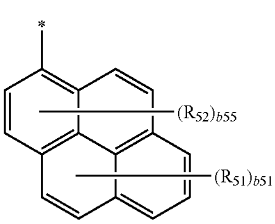
-continued
5-12
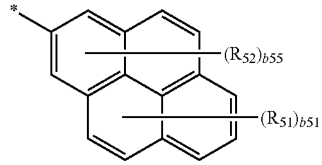
5-13
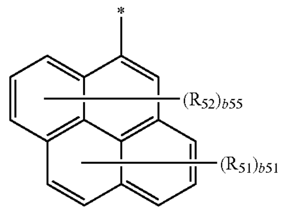
5-14
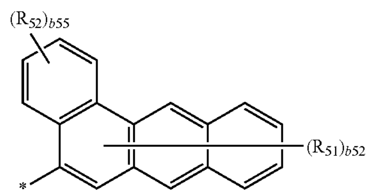
5-15
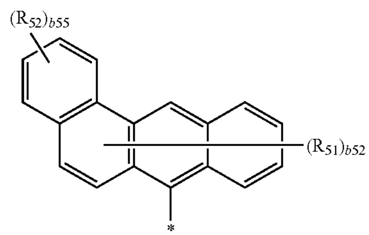
5-16
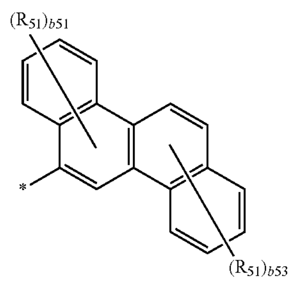
5-17
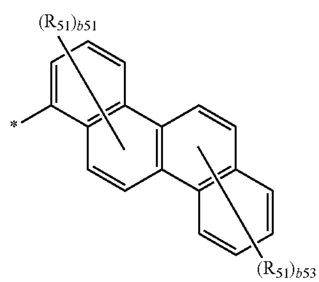
5-18
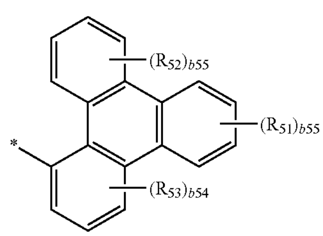

-continued
5-19
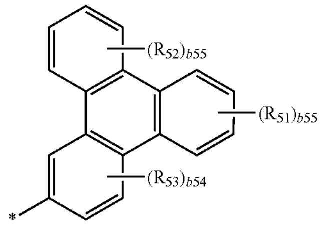
5-20
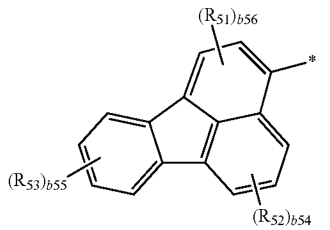
5-21
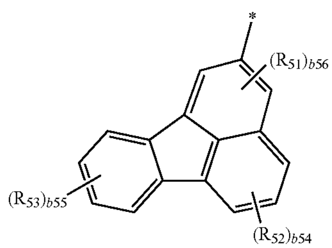
5-22
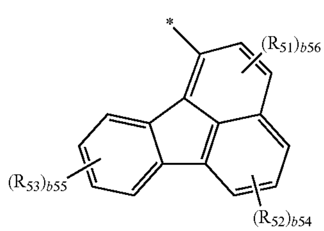
5-23
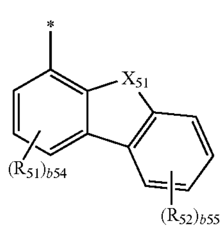
5-24
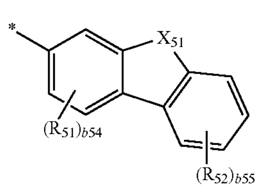
5-25
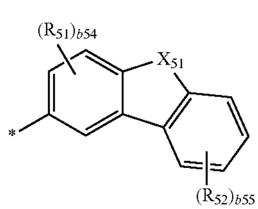
-continued
5-26
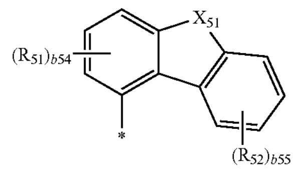
5-27
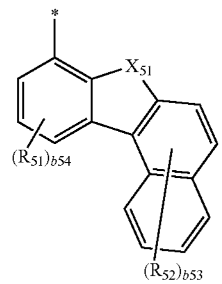
5-28
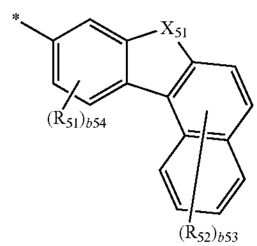
5-29
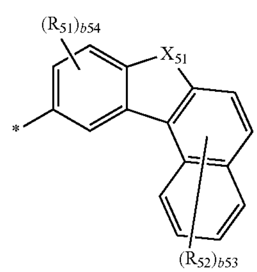
5-30
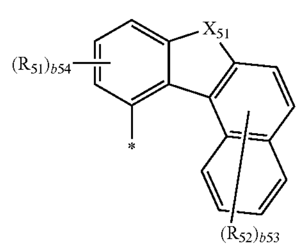
5-31
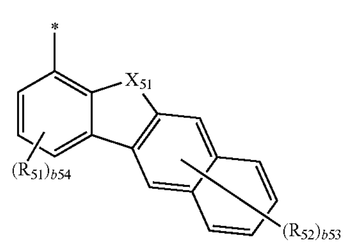

-continued
5-32
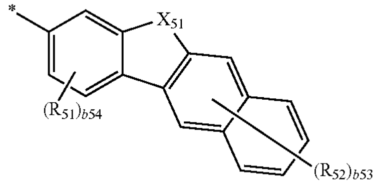
5-33
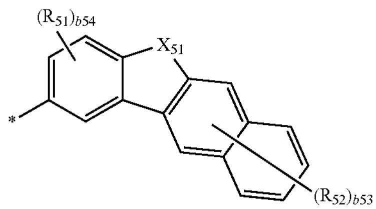
5-34
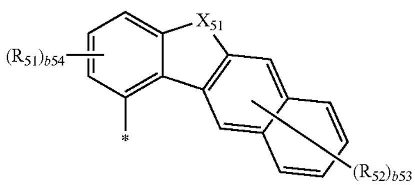
5-35
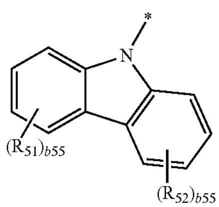
5-36
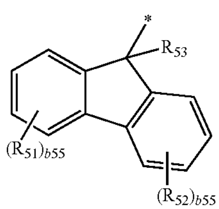
5-37
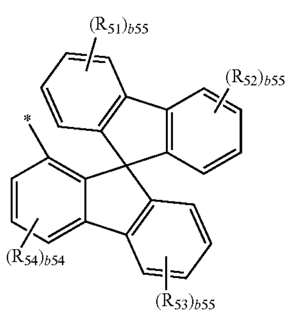
5-38
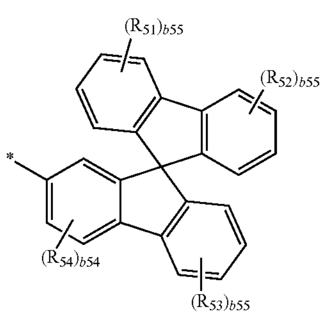
-continued
5-39
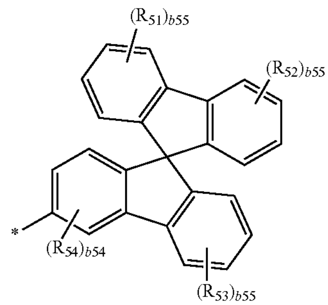
5-40
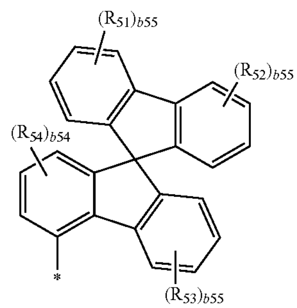
5-41
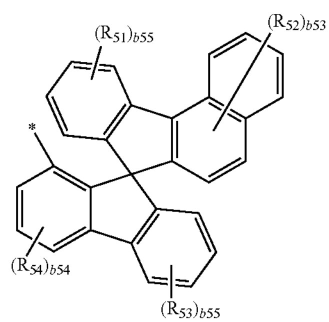
5-42
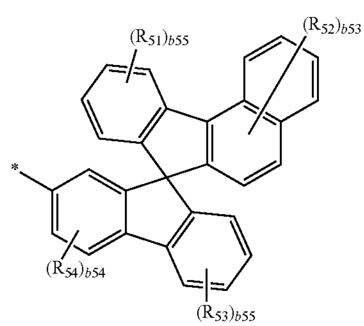
5-43
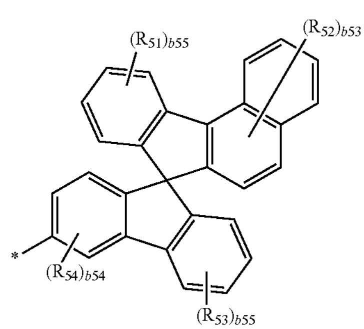

-continued
5-44
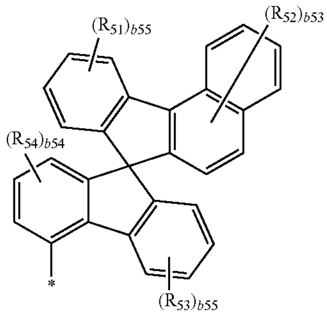
5-45
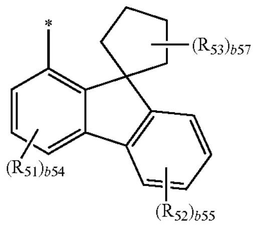
5-46
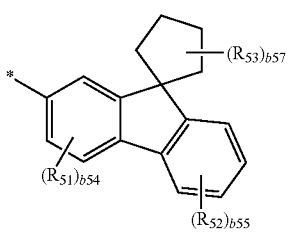
5-47
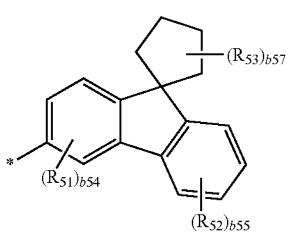
5-48
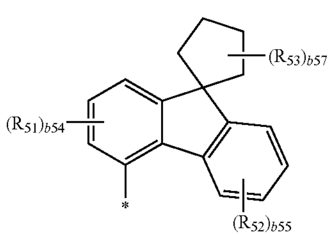
5-49
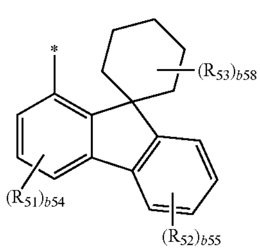
-continued
5-50
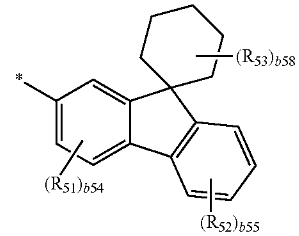
5-51
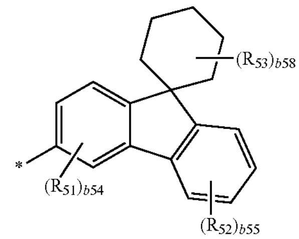
5-52
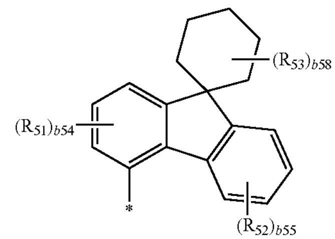
5-53
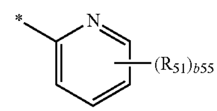
5-54
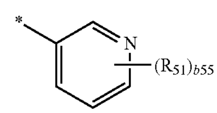
5-55
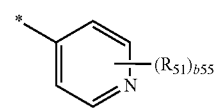
5-56
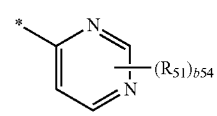
5-57
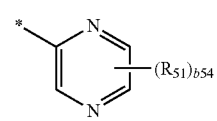
5-58
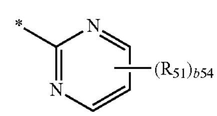
5-59
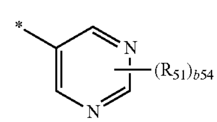

-continued
5-60
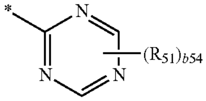
5-61
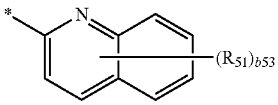
5-62
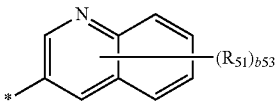
5-63
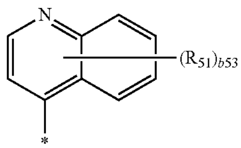
5-64
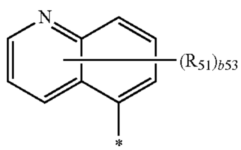
5-65
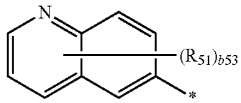
5-66
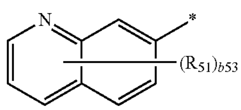
5-67
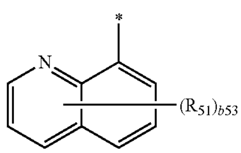
5-68
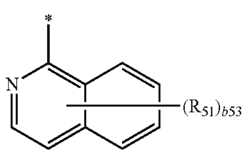
5-69
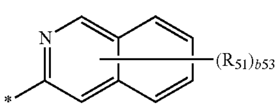
5-70
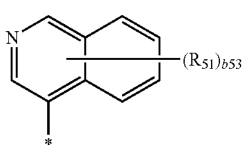
5-71
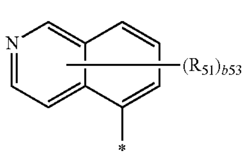
-continued
5-72
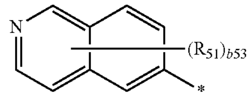
5-73
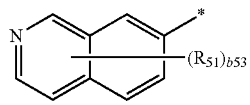
5-74
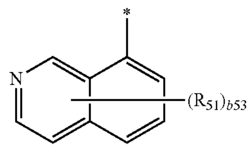
5-75
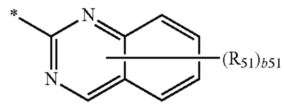
5-76
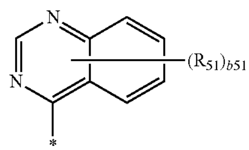
5-77
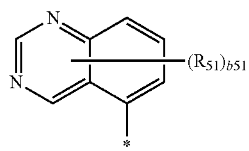
5-78
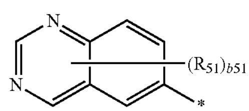
5-79
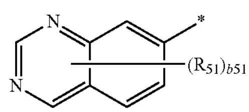
5-80
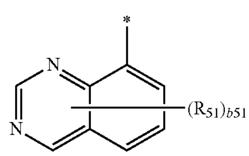
5-81
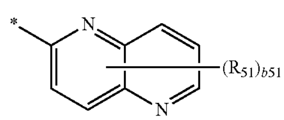
5-82
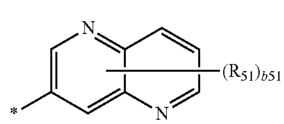
5-83
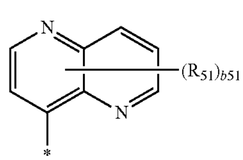

5-84
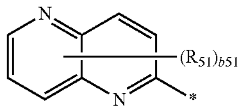
5-85
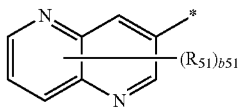
5-86
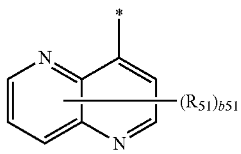
5-87
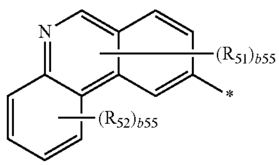
5-88
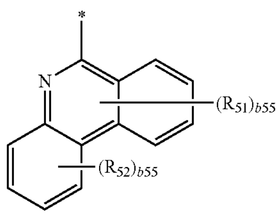
5-89
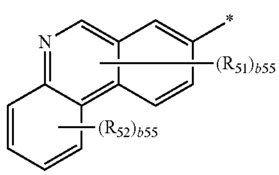
5-90
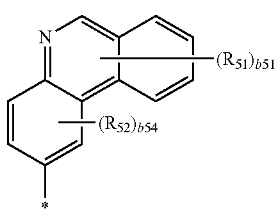
5-91
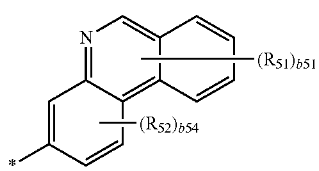
5-92
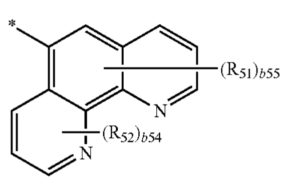
5-93
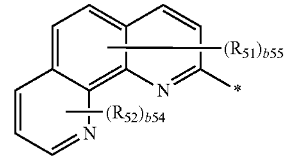
5-94
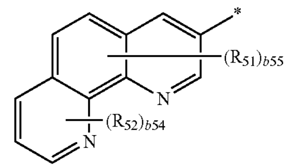
5-95
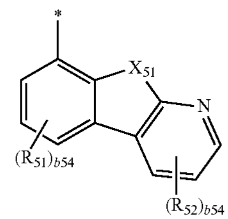
5-96
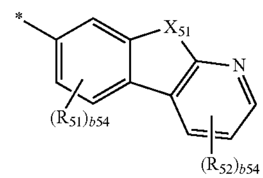
5-97
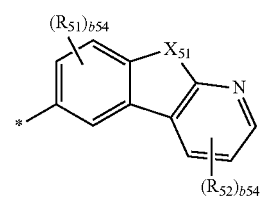
5-98
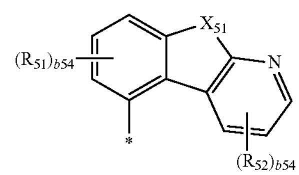
5-99
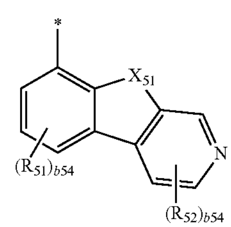
5-100
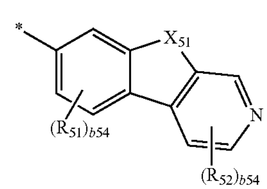

-continued
5-101
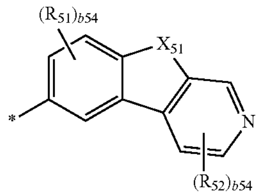
5-102
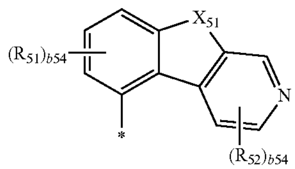
5-103
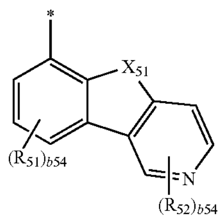
5-104
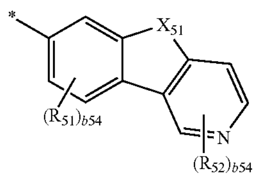
5-105
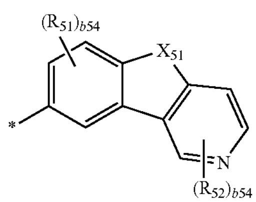
5-106
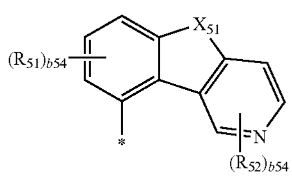
5-107
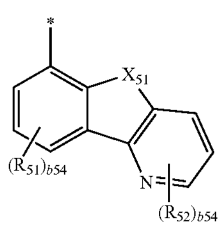
5-108
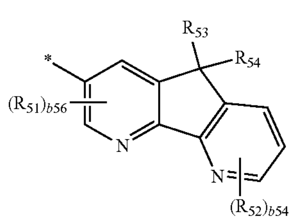
-continued
5-109
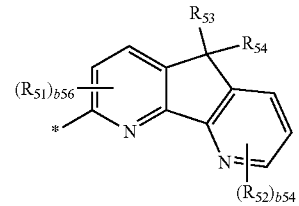
5-110
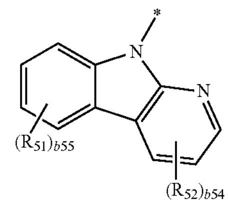
5-111
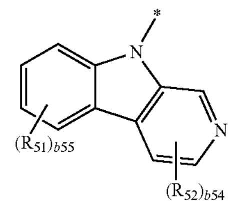
5-112
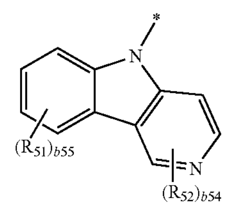
5-113
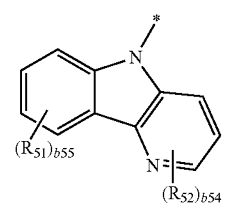
5-114
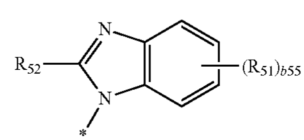
5-115
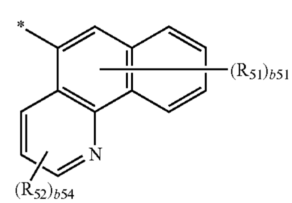
5-116
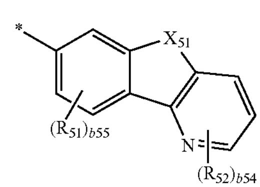

-continued 5-117

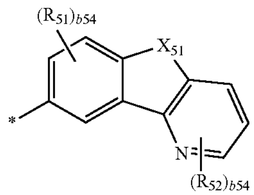

5-118

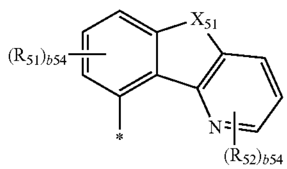

5-119

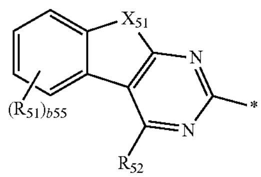

5-120

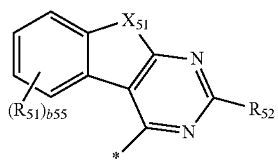

5-121

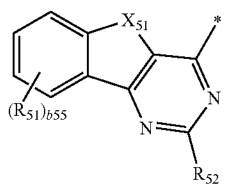

5-122

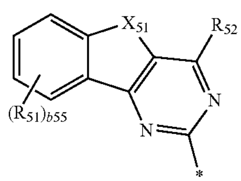

5-123

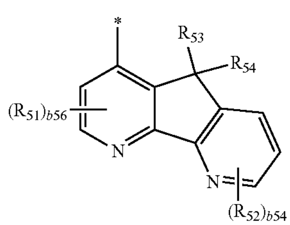

5-124

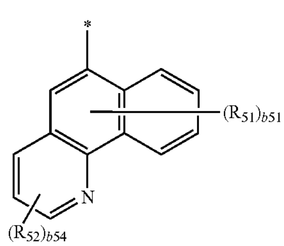

-continued 5-125

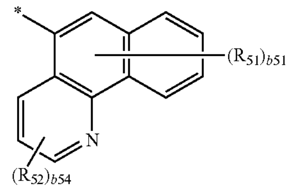

5-126

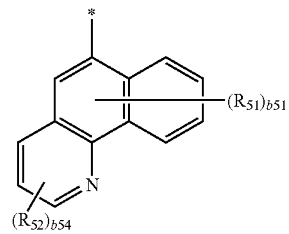

5-127

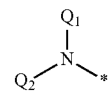

5-128

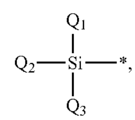

wherein, in Formulae 5-1 to 5-128, $X_{51}$ is selected from , S, $N(R_{53})$, and $C(R_{53})(R_{54})$;

$R_{51}$ to $R_{54}$ are each independently selected from hydrogen, deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tent-butyl group, an n-pentyl group, an iso-pentyl group, a sec-pentyl group, a tent-pentyl group, neo-pentyl group, $—CDH_2$, $—CD_2H$, $—CD_3$, $—CFH_2$, $—CF_2H$, $—CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-PH, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_5$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —N($Q_{31}$)($Q_{32}$), and—-Si($Q_{31}$)($Q_{32}$)($Q_{33}$);

$Q_1$ to $Q_3$ and $Q_{31}$ to $Q_{33}$ are each independently selected from a methyl group, an ethyl group, an n-propyl group, an iso-propyl group, an n-butyl group, an isobutyl group, a sec-butyl group, a tent-butyl group, an n-pentyl group, an iso-pentyl group, a sec-pentyl group, a tert-pentyl group, a neo-pentyl group, a phenyl group, a biphenyl group, a terphenyl group and a naphthyl group;

b51 is selected from 1, 2, 3, 4, and 5;

b52 is selected from 1, 2, 3, 4, 5, 6, and 7;

b53 is selected from 1, 2, 3, 4, 5, and 6;

b54 is selected from 1, 2, and 3;

b55 is selected from 1, 2, 3, and 4;

b56 is selected from 1 and 2;

b57 is selected from 1, 2, 3, 4, 5, 6, 7, and 8;

b58 is selected from 1, 2, 3, 4, 5, 6, 7, 8, 9, and 10; and

* indicates a binding site to a neighboring atom.

7. The organic light-emitting device of claim 1, wherein:

$A_{21}$ and $A_{22}$ are each independently selected from a benzene group, a naphthalene group, a phenanthrene group, an anthracene group, a triphenylene group, a pyrene group, a chrysene group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, and a phenanthroline group.

8. The organic light-emitting device of claim 1, wherein:

$A_{23}$ to $A_{25}$ are each independently selected from a benzene group, a naphthalene group, a phenanthrene group, an anthracene group, a triphenylene group, a pyrene group, a chrysene group, a furan group, a thiophene group, a pyrrole group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, a phenanthroline group, a benzofuran group, a benzothiophene group, an indene group, an indole group, a furopyridine group, a thienopyridine group, a cyclopentapyridine group, a pyrrolopyridine group, a dibenzofuran group, a dibenzothiophene group, a fluorene group, a carbazole group, a benzofuropyrrole group, a benzothienopyrrole group, an indenopyrrole group, an indolopyrrole group, a benzofurothiophene group, a benzothienothiophene group, an indenothiophene group, an indolothiophene group, a benzofurofuran group, a benzothienofuran group, an indenofuran group, an indolofuran group, a benzofurothiophene group, a benzothienothiophene group, an indenothiophene group, an indolothiophene group, a benzofuropyridine group, a benzothienopyridine group, an indenopyridine group, an indolopyridine group, a benzofuropyrimidine group, a benzothienopyrimidine group, an indenopyrimidine group, an indolopyrimidine group, a benzofuroindole group, a benzothienoindole group, an indenoindole group, an indoloindole group, a benzofurobenzofuran group, a benzothienobenzofuran group, an indenobenzofuran group, an indolobenzofuran group, a benzofurobenzothiophene group, a benzothienobenzothiophene group, an indenobenzothiophene group, an indolobenzothiophene group, a benzofuroquinoline group, a benzothienoquinoline group, an indenoquinoline group, an indoloquinoline group, a benzonaphthofuran group, a benzonaphthothiophene group, a benzofluorene group, a benzocarbazole group, a dinaphthofuran group, a dinaphthothiophene group, a dibenzofluorene group, a dibenzocarbazole group, a benzoxazole group, a benzothiazole group, a benzimidazole group, a naphthofuran, a naphthothiophene, a cyclopentanaphthalene group, a spiro-bifluorene group, and a spiro-fluorene-indene group.

9. The organic light-emitting device of claim 1, wherein:

$L_{101}$, $L_{102}$, and $L_{21}$ to $L_{26}$ are each independently selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a benzoisoquinolinylene group, a naphthyridinylene group, a quinoxalinylene group, a quinazolinylene group, a cinnolinylene group, a phenanthridinylene group, a phenanthrolinylene group, a carbazolylene group, a benzimidazolylene group, a benzofuranylene group, a benzothiophenylene group, a triazinylene group, a dibenzofuranylene group, and a dibenzothiophenylene group, each substituted with at least one selected from deuterium, —F, —Cl, —Br, —I, a cyano group, a $C_1$-$C_{20}$ alkyl group, a $C_1$-$C_{20}$ alkoxy group, a cyclopropyl group, a cyclobutyl group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —$Si(Q_{31})(Q_{32})(Q_{33})$, —$N(Q_{31})(Q_{32})$,—$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ are each independently selected from hydrogen, a $C_1$-$C_{20}$ alkyl group, a phenyl group, a naphthyl group, a biphenyl group, and a terphenyl group.

10. The organic light-emitting device of claim 1, wherein:

$R_{21}$ to $R_{24}$ are each independently selected from the group consisting of:

a phenyl group, a biphenyl group, terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, and a diazafluorenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with deuterium, a $C_1$-$C_{20}$ alkyl group substituted with —F, a $C_1$-$C_{20}$ alkoxy group, a $C_3$-$C_{10}$ cycloalkyl group, a phenyl group, a phenyl group substituted with deuterium, a phenyl group substituted with a methyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a spiro-cyclopentane-fluorenyl group, a spiro-cyclohexane-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a tetraphenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyridinyl group substituted with deuterium, a pyridinyl group substituted with a methyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a benzoisoquinolinyl group, a carbazolyl group, a benzocarbazolyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a benzonaphthofuranyl group, a dibenzothiophenyl group, a benzonaphthothiophenyl group, a benzocarbazolyl group, a dibenzocarbazolyl group, a thiadiazolyl group, an imidazopyridinyl group, an imidazopyrimidinyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$; and —$N(Q_1)(Q_2)$ and —$Si(Q_1)(Q_2)(Q_3)$, wherein $Q_1$ to $Q_3$ and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

11. The organic light-emitting device of claim 1, wherein $R_{21}$ to $R_{24}$ are each independently selected from groups represented by Formulae 5-1 to 5-128:

5-1

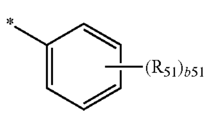

5-2

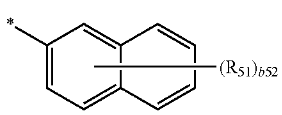

5-3

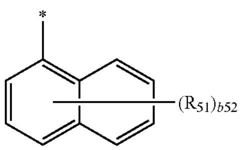

5-4

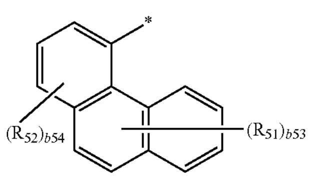

-continued 5-5

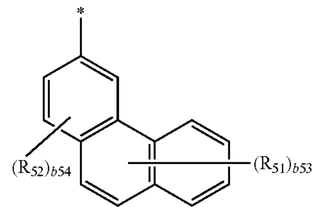

5-6

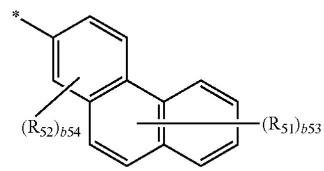

5-7

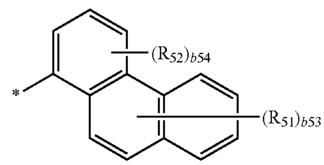

5-8

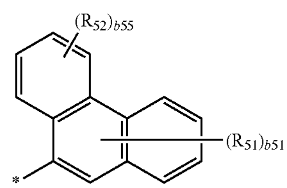

5-9

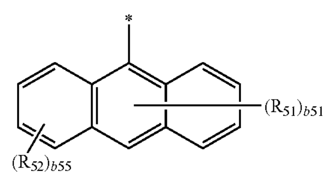

5-10

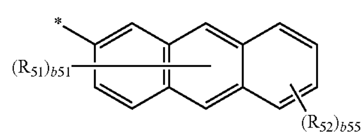

5-11

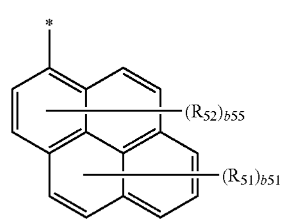

5-12

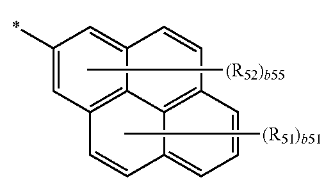

-continued
5-13
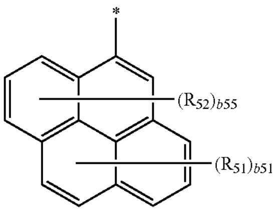
5-14
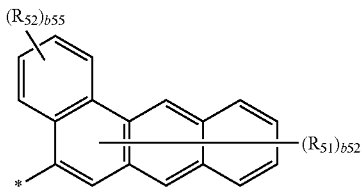
5-15
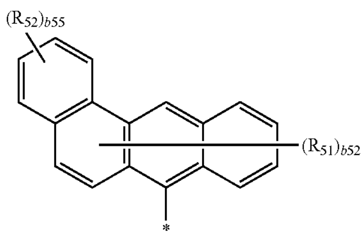
5-16
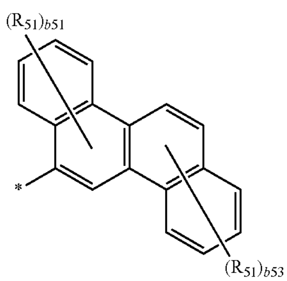
5-17
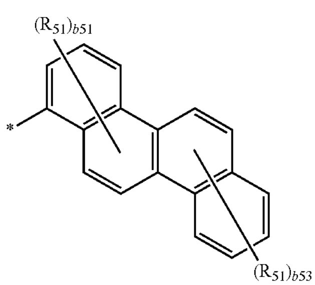
5-18
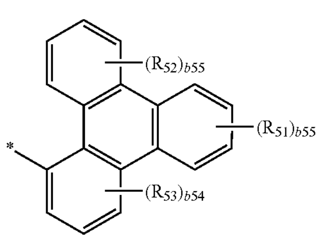
-continued
5-19
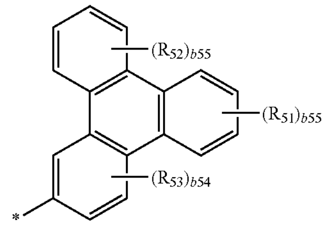
5-20
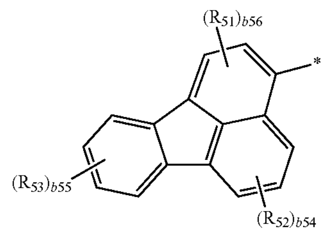
5-21
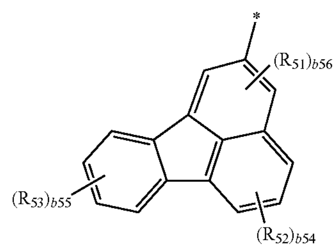
5-22
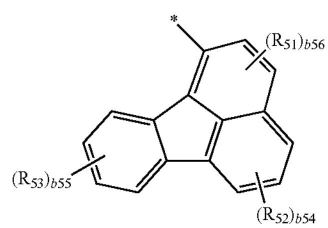
5-23
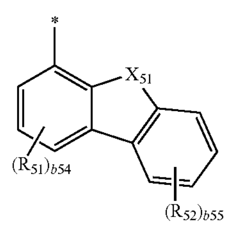
5-24
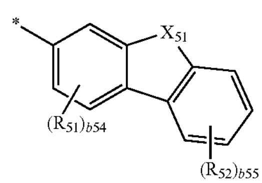
5-25
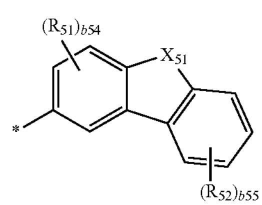

-continued
5-26
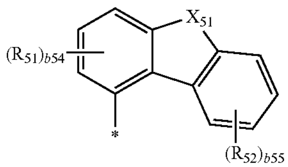
5-27
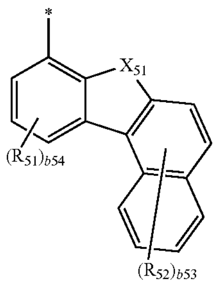
5-28
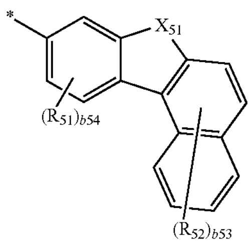
5-29
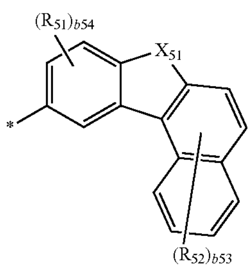
5-30
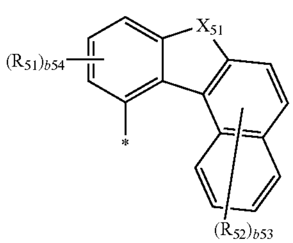
5-31
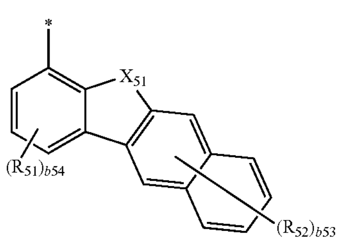
-continued
5-32
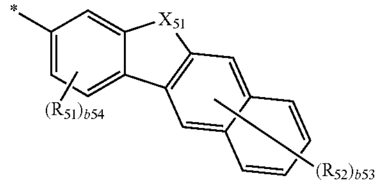
5-33
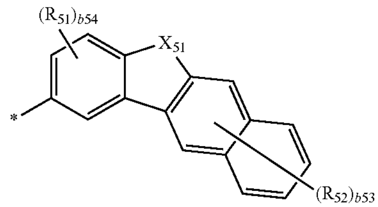
5-34
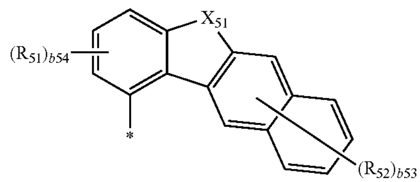
5-35
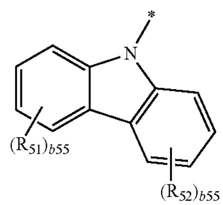
5-36
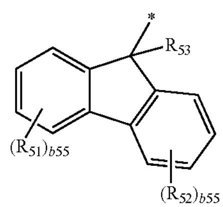
5-37
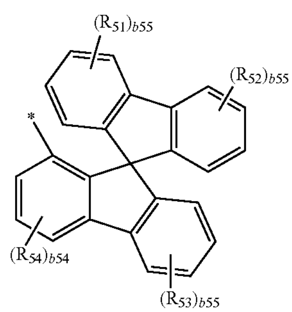
5-38
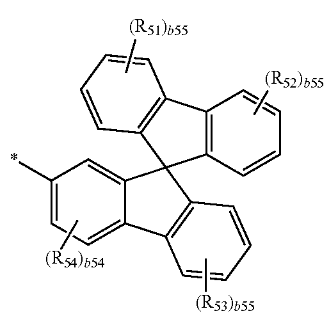

-continued
5-39
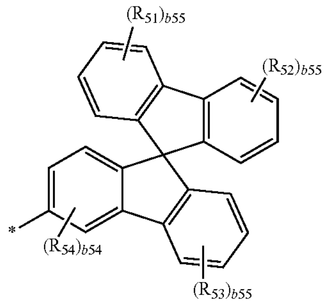
5-40
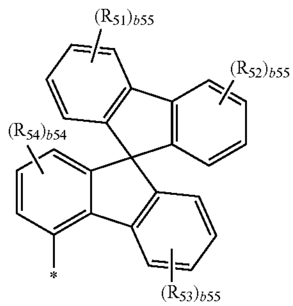
5-41
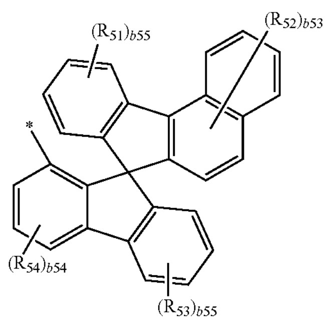
5-42
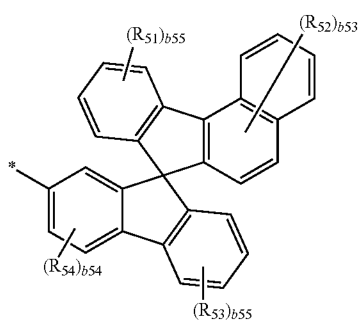
5-43
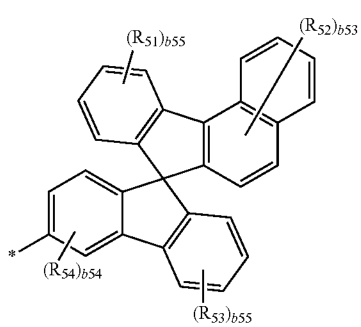
-continued
5-44
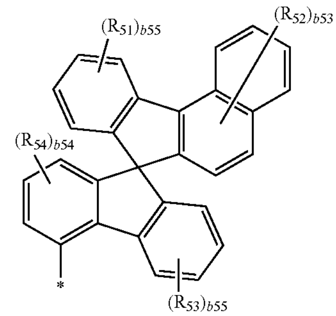
5-45
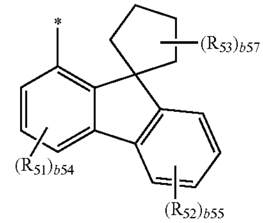
5-46
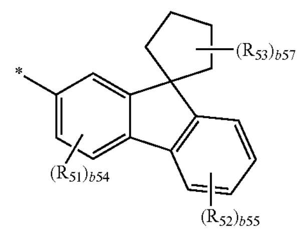
5-47
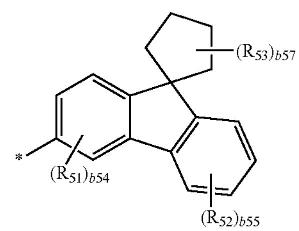
5-48
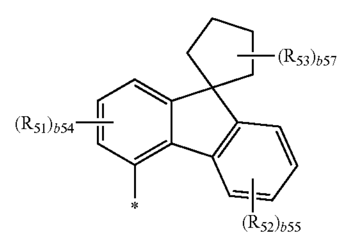
5-49
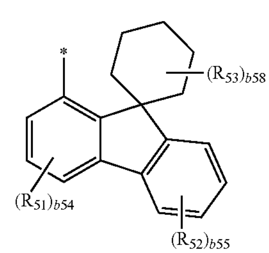

-continued
5-50
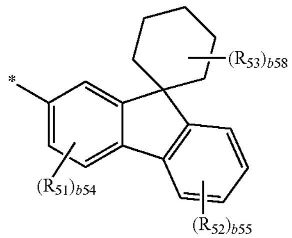
5-51
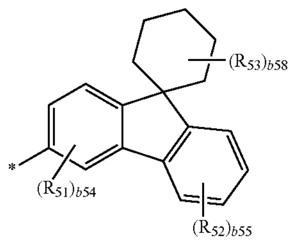
5-52
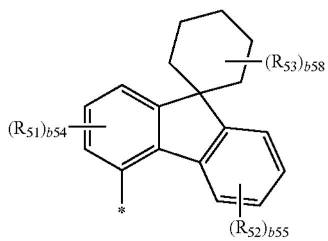
5-53
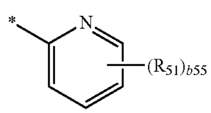
5-54
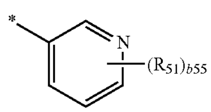
5-55
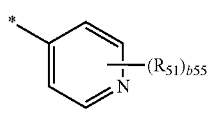
5-56
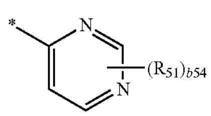
5-57
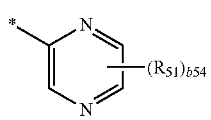
5-58
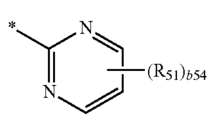
5-59
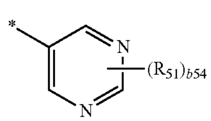
-continued
5-60
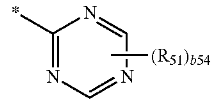
5-61
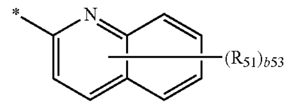
5-62
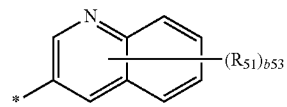
5-63
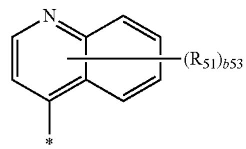
5-64
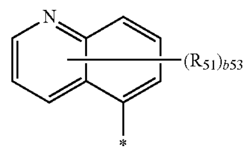
5-65
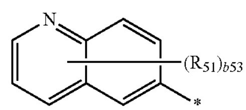
5-66
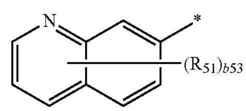
5-67
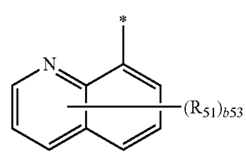
5-68
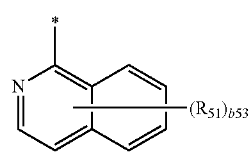
5-69
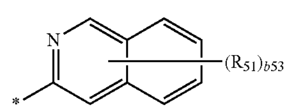
5-70
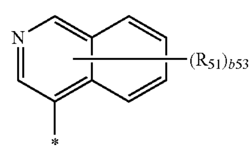
5-71
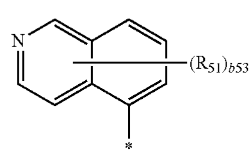

-continued
5-72
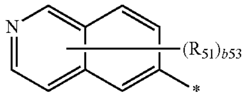
5-73
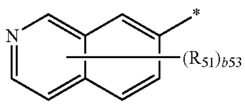
5-74
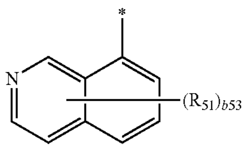
5-75
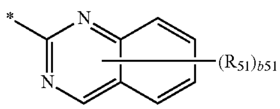
5-76
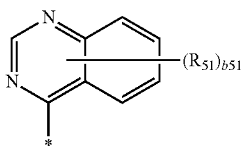
5-77
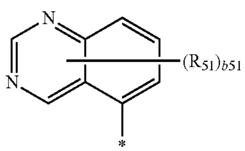
5-78
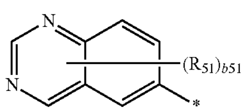
5-79
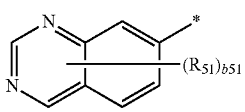
5-80
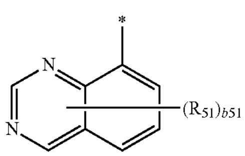
5-81
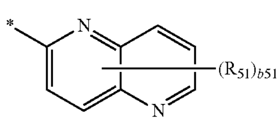
5-82
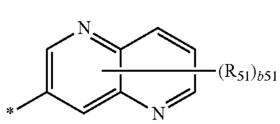
5-83
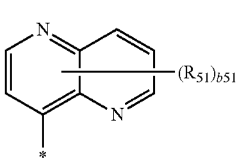
-continued
5-84
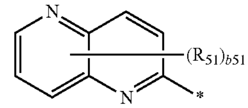
5-85
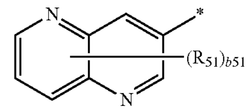
5-86
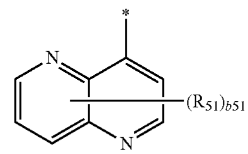
5-87
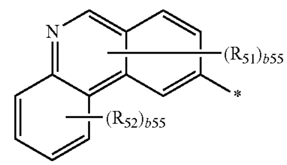
5-88
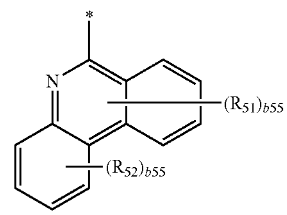
5-89
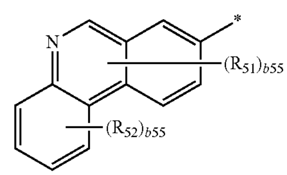
5-90
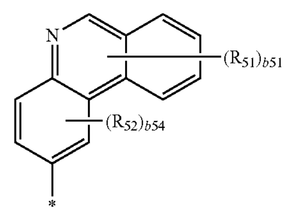
5-91
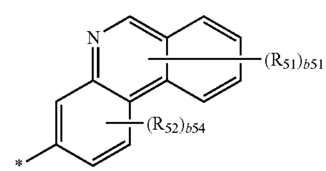
5-92
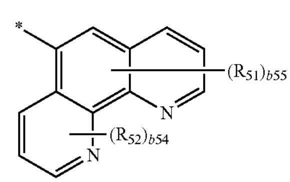

-continued
5-93
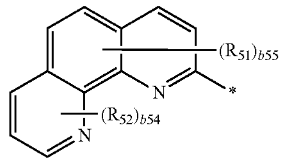
5-94
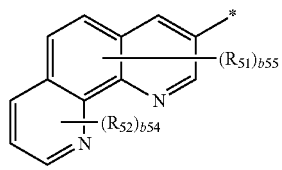
5-95
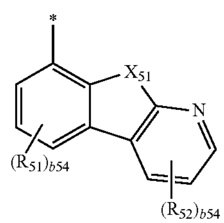
5-96
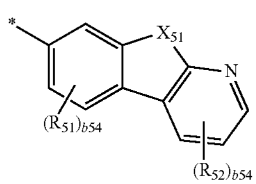
5-97
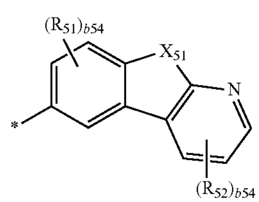
5-98
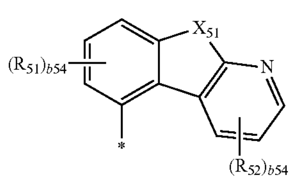
5-99
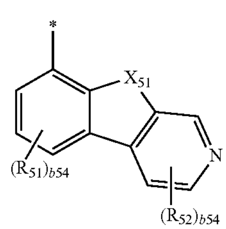
5-100
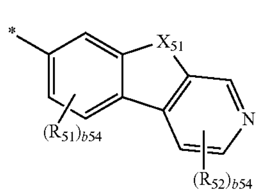
-continued
5-101
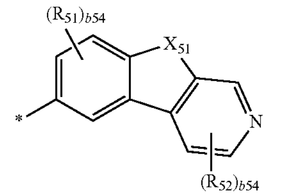
5-102
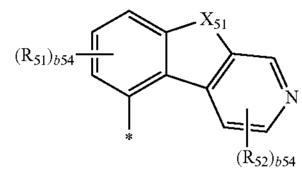
5-103
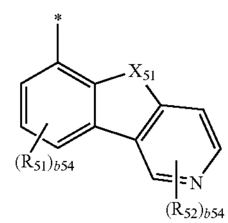
5-104
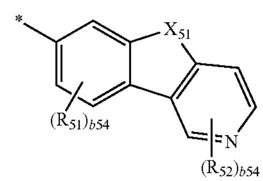
5-105
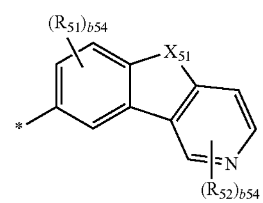
5-106
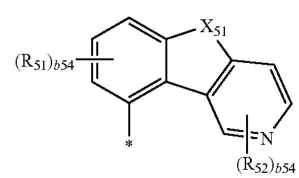
5-107
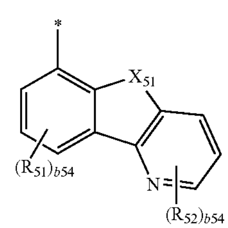
5-108
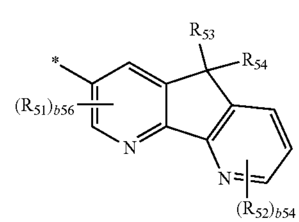

-continued
5-109
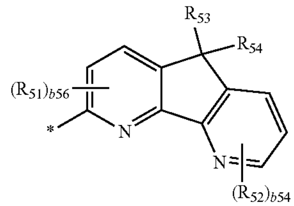
5-110
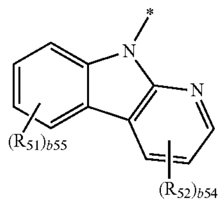
5-111
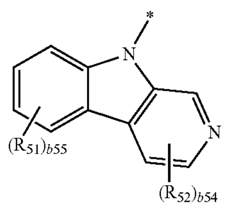
5-112
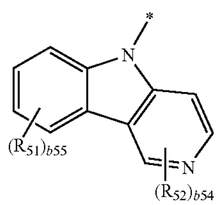
5-113
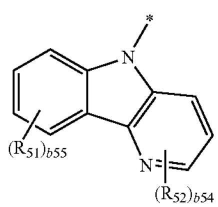
5-114
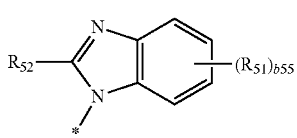
5-115
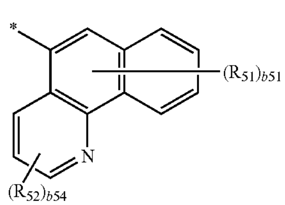
5-116
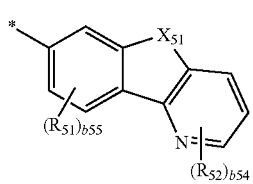
-continued
5-117
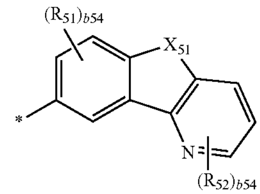
5-118
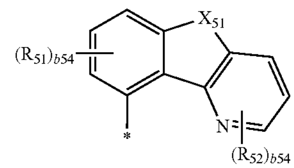
5-119
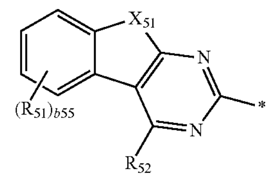
5-120
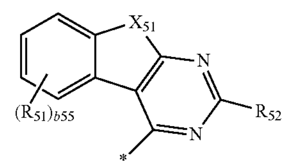
5-121
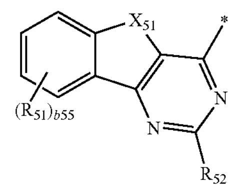
5-122
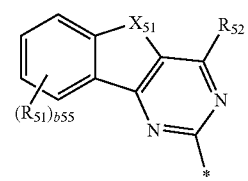
5-123
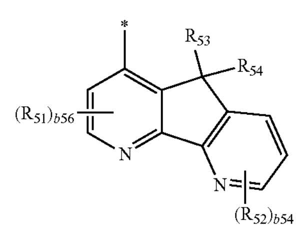
5-124
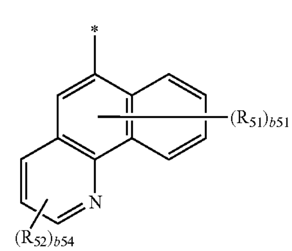

-continued 5-125

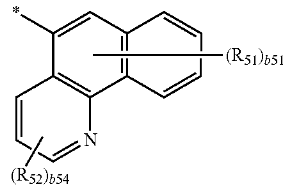

5-126

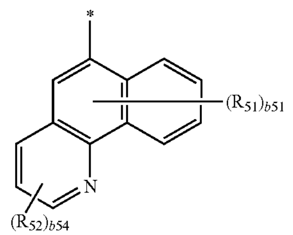

5-127

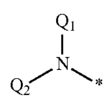

5-128

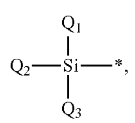

wherein, in Formulae 5-1 to 5-128, $X_{51}$ is selected from O, S, $N(R_{53})$, and $C(R_{53})(R_{54})$;

$R_{51}$ to $R_{54}$ are each independently selected from hydrogen, deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an iso-butyl group, a sec-butyl group, a tent-butyl group, an n-pentyl group, an iso-pentyl group, a sec-pentyl group, a tent-pentyl group, a neo-pentyl group, —$CDH_2$, —$CD_2H$, —$CD_3$, —$CFH_2$, —$CF_2H$, —$CF_3$, a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a sec-pentoxy group, a tert-pentoxy group, a neo-pentoxy group, a cyclopropyl group, a cyclobutyl group, a cyclopentyl group, a cyclohexyl group, a phenyl group, $D_5$-Ph, 2-Me-Ph, 3-Me-Ph, 4-Me-Ph, a biphenyl group, a terphenyl group, a naphthyl group, a fluorenyl group, a spiro-bifluorenyl group, a spiro-benzofluorene-fluorenyl group, a benzofluorenyl group, a dibenzofluorenyl group, a phenanthrenyl group, an anthracenyl group, a fluoranthenyl group, a triphenylenyl group, a pyrenyl group, a tetraphenyl group, a chrysenyl group, a pyridinyl group, $D_5$-Py, 2-Me-1-Py, 3-Me-1-Py, 4-Me-1-Py, 5-Me-1-Py, 1-Me-2-Py, 3-Me-2-Py, 4-Me-2-Py, 5-Me-2-Py, 1-Me-3-Py, 2-Me-3-Py, 4-Me-3-Py, 5-Me-3-Py, a pyrimidinyl group, a quinolinyl group, an isoquinolinyl group, a benzoquinolinyl group, a benzoisoquinolinyl group, a carbazolyl group, a benzocarbazolyl group, a naphthyridinyl group, a quinoxalinyl group, a quinazolinyl group, a phenanthridinyl group, a phenanthrolinyl group, a benzimidazolyl group, a triazinyl group, a dibenzofuranyl group, a benzonaphthofuranyl group, a dibenzothiophenyl group, a benzonaphthothiophenyl group, a benzofuropyridinyl group, a benzofuropyrimidinyl group, a benzothienopyridinyl group, a benzothienopyrimidinyl group, an indenopyridinyl group, an indenopyrimidinyl group, an indolopyridinyl group, an indolopyrimidinyl group, a diazafluorenyl group, —$N(Q_{31})(Q_{32})$, and —$Si(Q_{31})(Q_{32})(Q_{33})$;

Qi to $Q_3$ and $Q_{31}$ to $Q_{33}$ are each independently selected from a methyl group, an ethyl group, an n-propyl group, an iso-propyl group, an n-butyl group, an iso-butyl group, a sec-butyl group, a tent-butyl group, an n-pentyl group, an iso-pentyl group, a sec-pentyl group, a tert-pentyl group, a neo-pentyl group, a phenyl group, a biphenyl group, a terphenyl group, and a naphthyl group;

b51 is selected from 1, 2, 3, 4, and 5;

b52 is selected from 1, 2, 3, 4, 5, 6, and 7;

b53 is selected from 1, 2, 3, 4, 5, and 6;

b54 is selected from 1, 2, and 3;

b55 is selected from 1, 2, 3 and 4;

b56 is selected from 1 and 2;

b57 is selected from 1, 2, 3, 4, 5, 6, 7, and 8;

b58 is selected from 1, 2, 3, 4, 5, 6, 7, 8, 9, and 10; and

* indicates a binding site to a neighboring atom.

12. The organic light-emitting device of claim 1, wherein:

$R_{201}$ to $R_{207}$ are each independently selected from hydrogen, deuterium, —F, —Cl, —Br,—I, a cyano group, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, and —$Si(Q_1)(Q_2)(Q_3)$;

$Q_1$ to $Q_3$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and $R_{201}$ and $R_{202}$ are optionally linked to form a saturated or unsaturated ring, and $R_{203}$ and $R_{204}$ are optionally linked to form a saturated or unsaturated ring.

13. The organic light-emitting device of claim 1, wherein:

$R_{201}$ to $R_{207}$ are each independently selected from the group consisting of:

hydrogen, deuterium, —F, —Cl, —Br, —I, a cyano group, a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, a pyridinyl group, —$N(Q_1)(Q_2)$, and —$Si(_{Q1})(_{Q2})(_{Q3})$; and a phenyl group, a biphenyl group, a terphenyl group, a naphthyl group, and a pyridinyl group, each substituted with at least one selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, a naphthyl group, and a pyridinyl group;

$Q_1$ to $Q_3$ are each independently selected from a methyl group, an ethyl group, an n-propyl group, an iso-propyl group, and a phenyl group; and $R_{204}$ and $R_{205}$ are optionally linked to form a saturated or unsaturated ring, and $R_{206}$ and $R_{207}$ are optionally linked to form a saturated or unsaturated ring.

14. An organic light-emitting device comprising:

a first electrode;

a second electrode; and an organic layer between the first electrode and the second electrode and comprising an emission layer, wherein the organic layer comprises a first compound selected from Compounds H1 to H185; and a second compound selected from Compounds D1-1 to D1-74 and D2-1to D2-212:

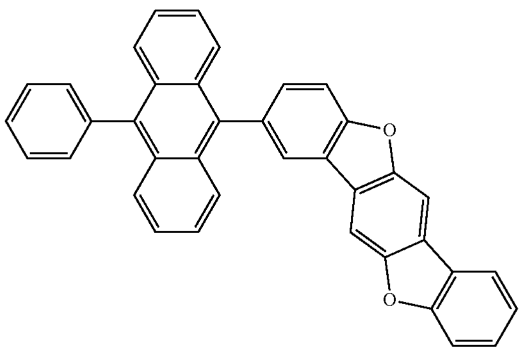
H1

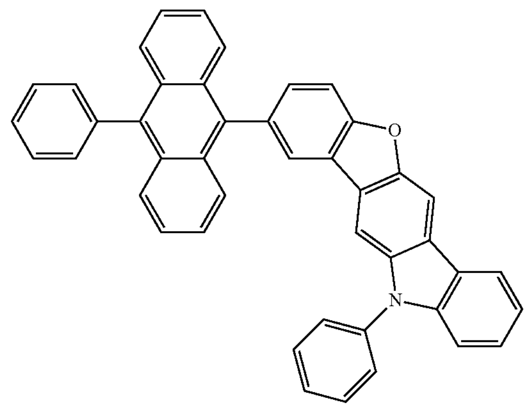
H2

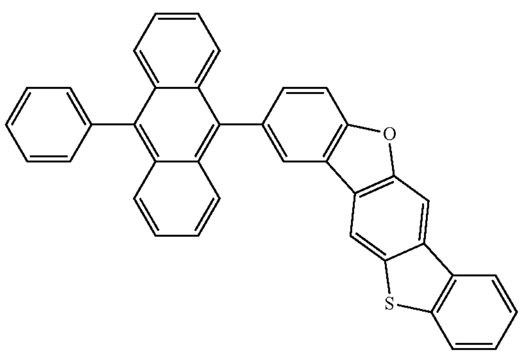
H3

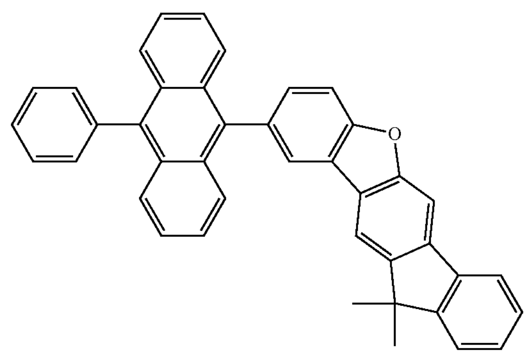
H4

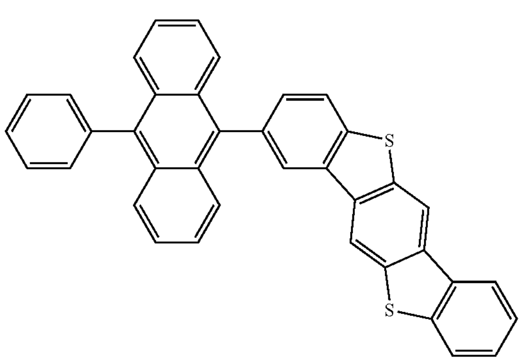
H5

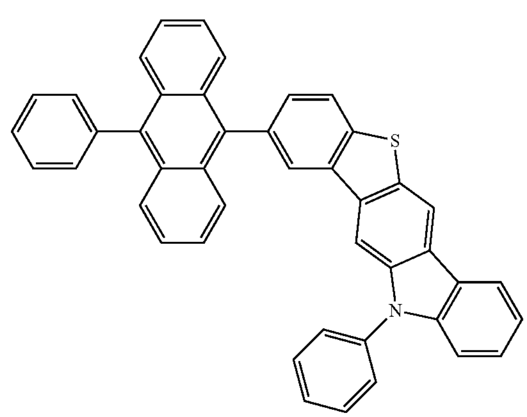
H6

-continued
H7
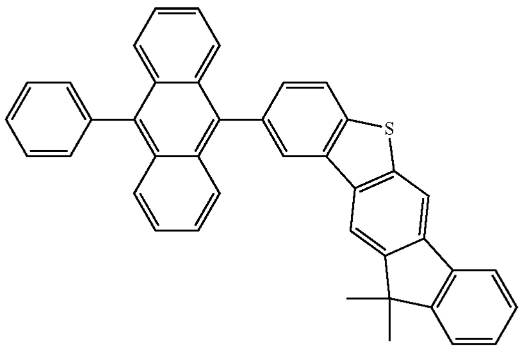
H8
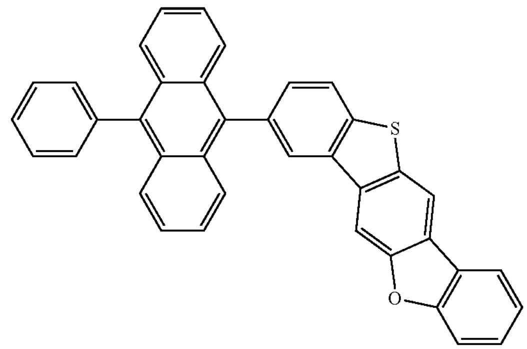
H9
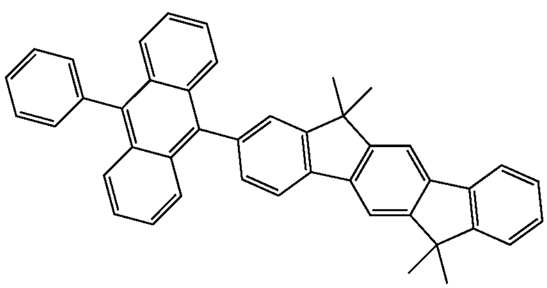
H10
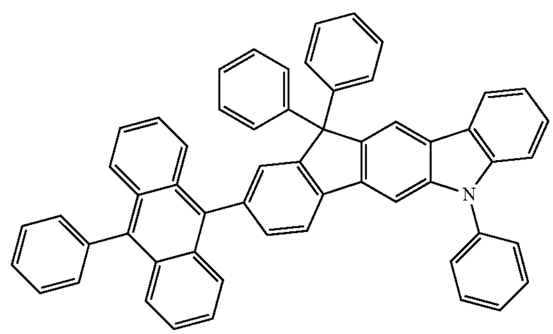
H11
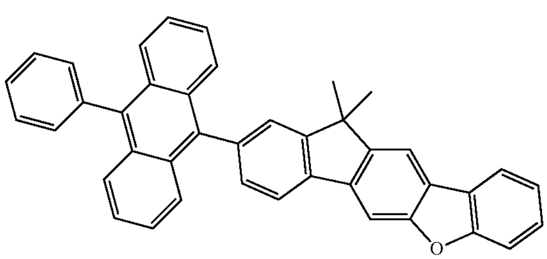
H12
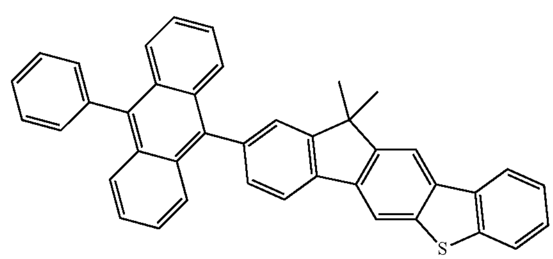
H13
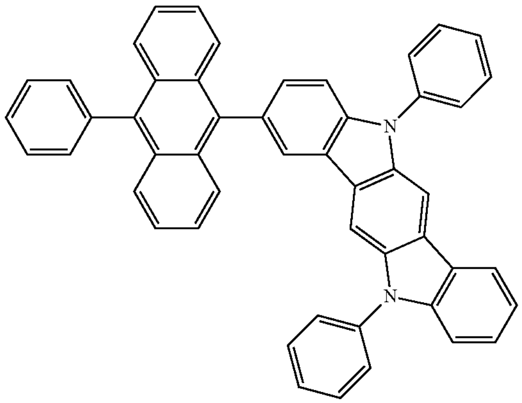
H14
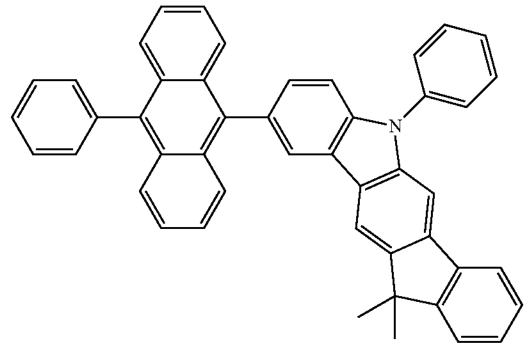

-continued
H15
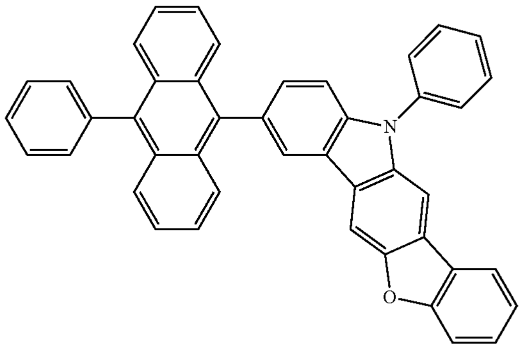
H16
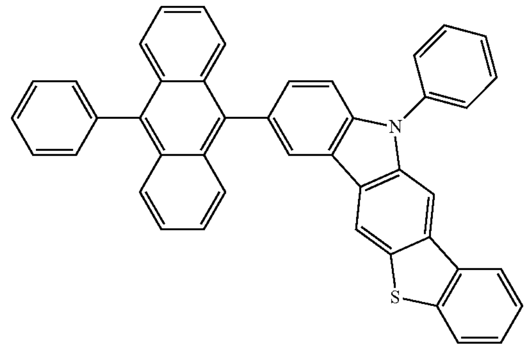
H17
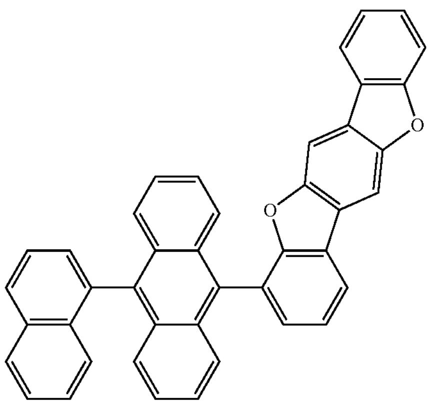
H18
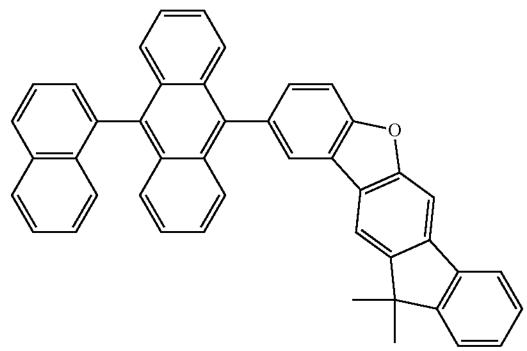
H19
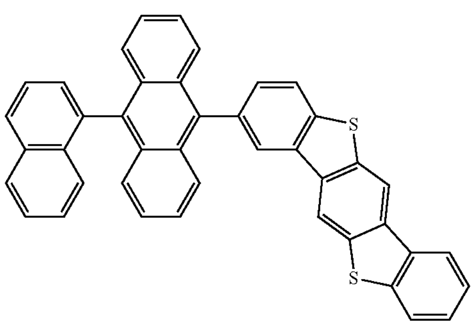
H20
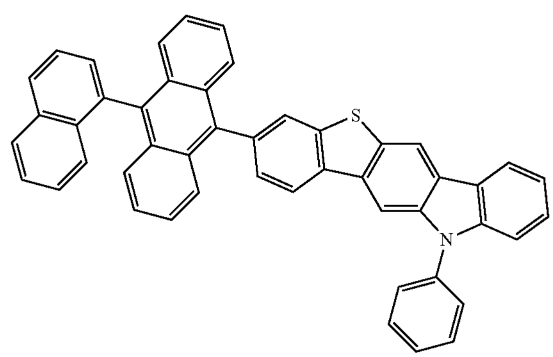
H21
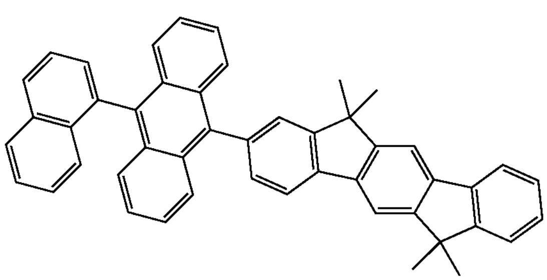
H22
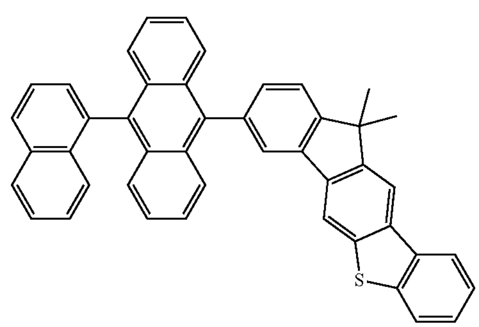

-continued
H23
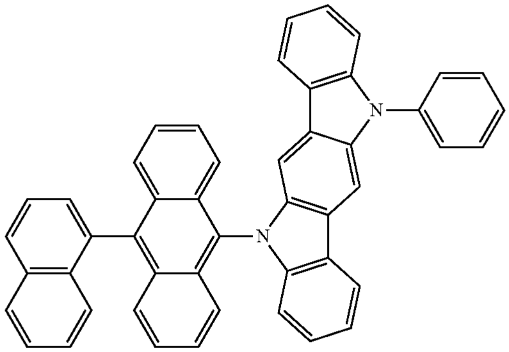
H24
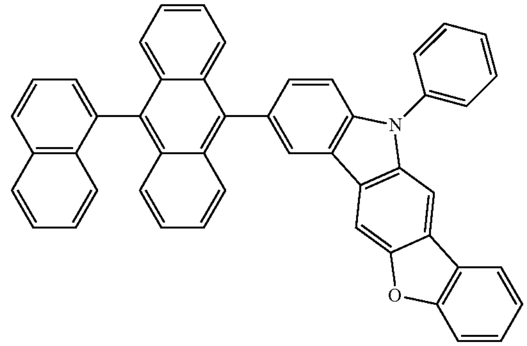
H25
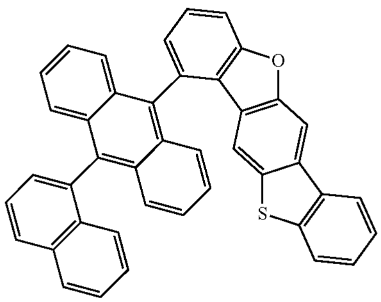
H26
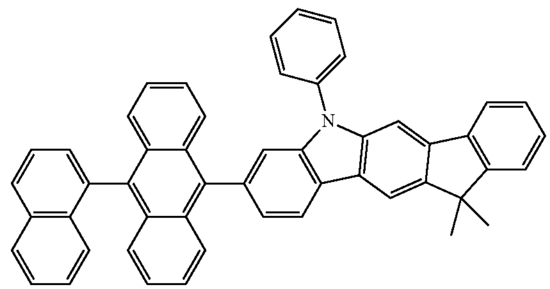
H27
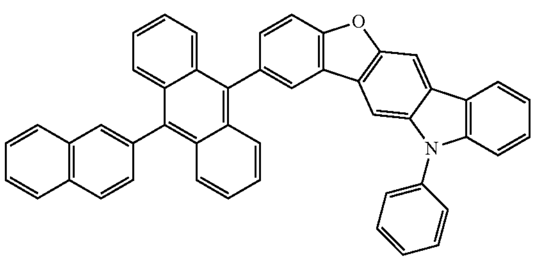
H28
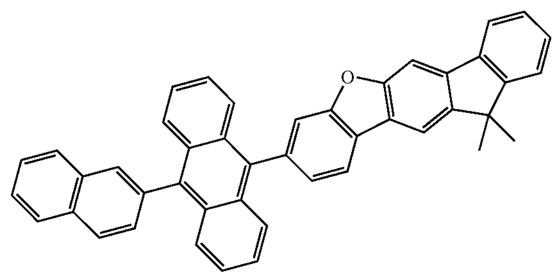
H29
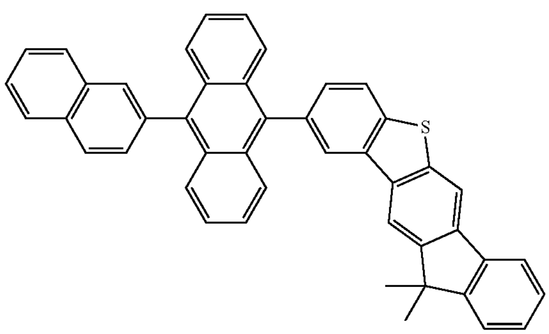
H30
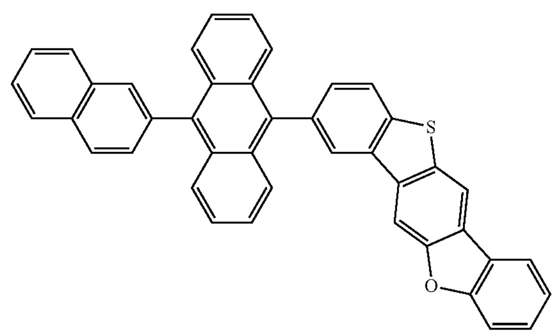
H31
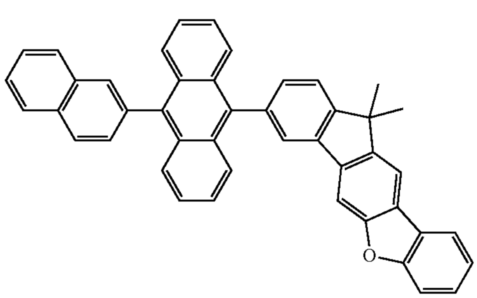
H32
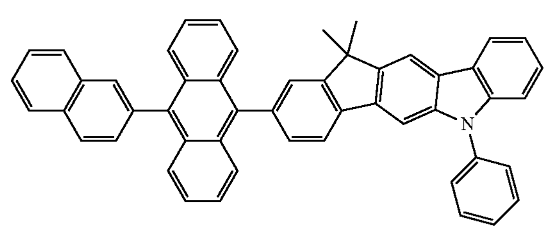

-continued
H33
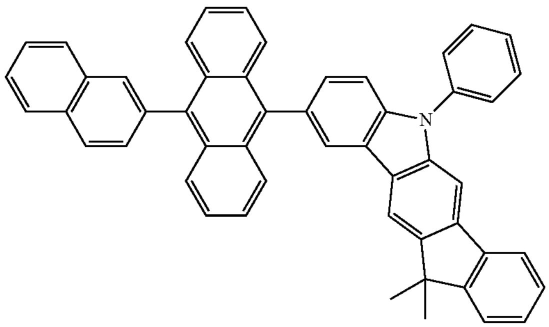
H34
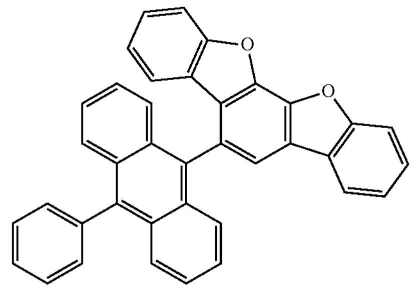
H35
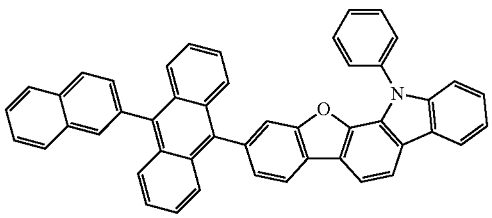
H36
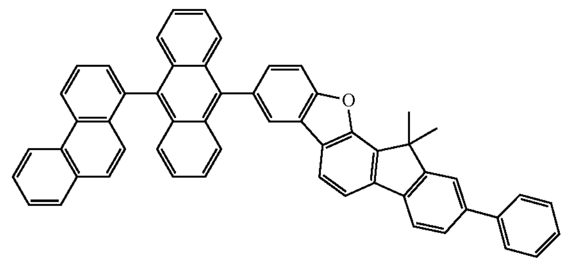
H37
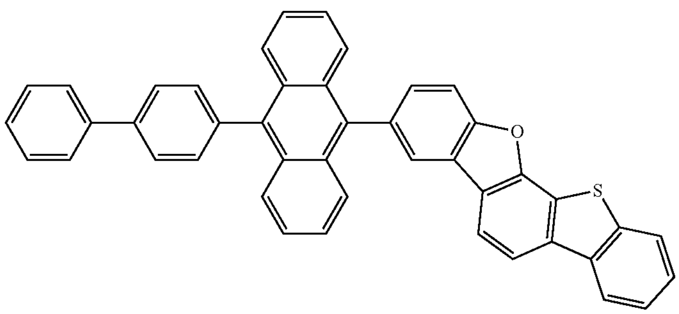
H38
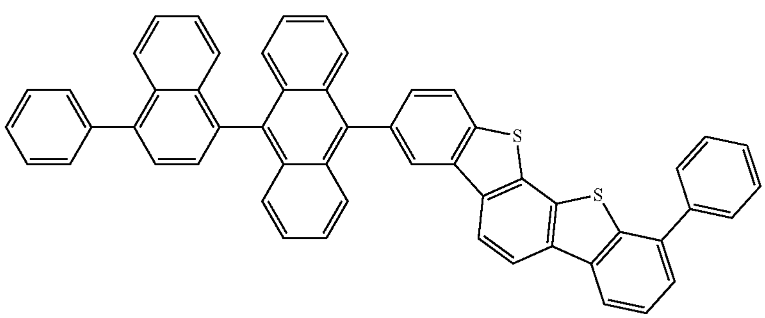
H39
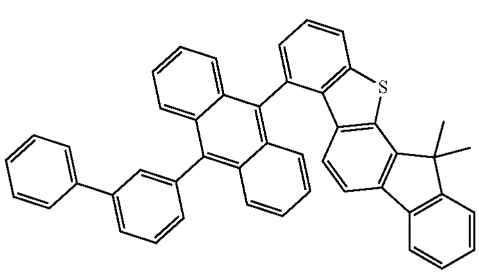
H40
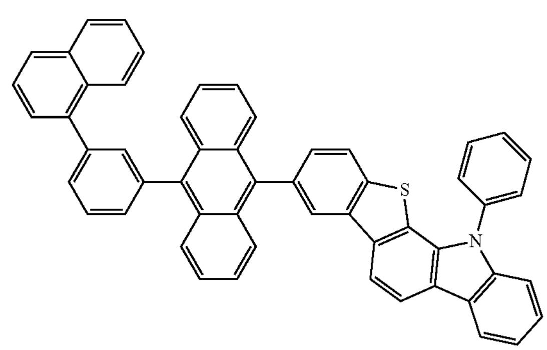

-continued
H41
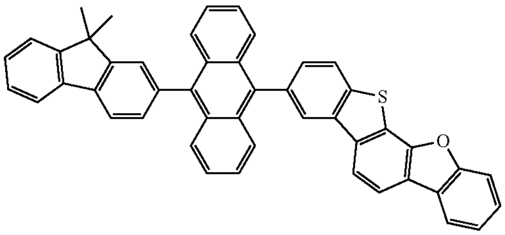
H42
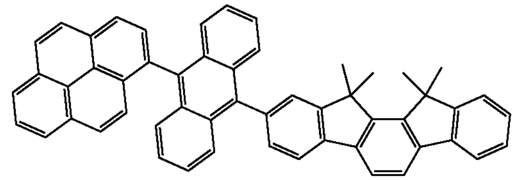
H43
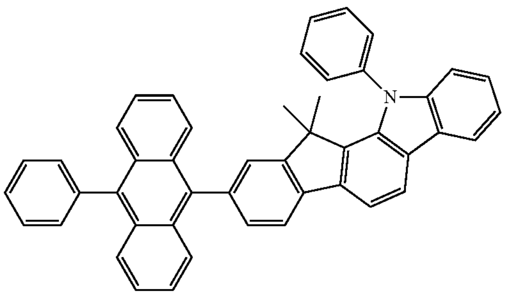
H44
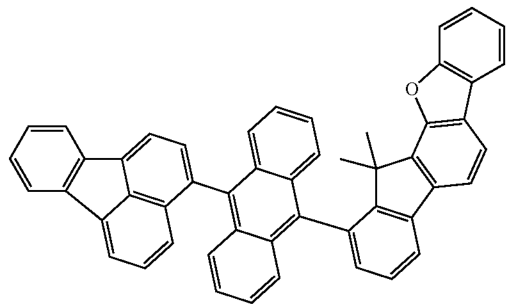
H45
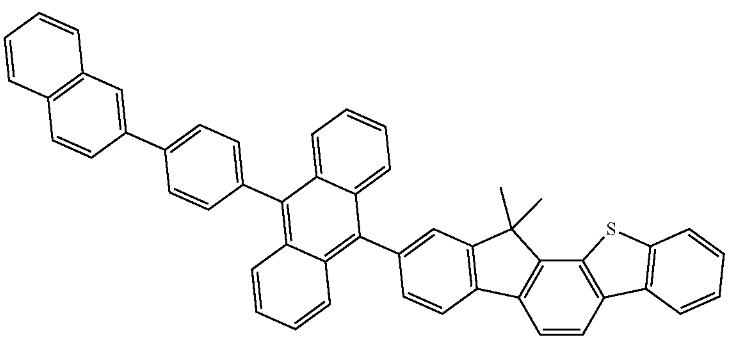
H46
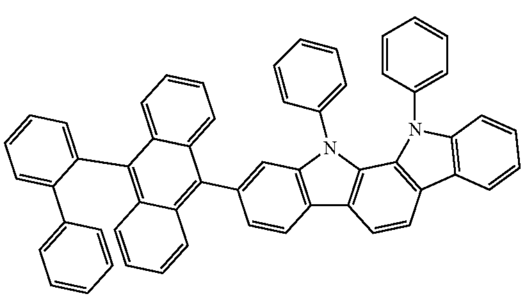
H47
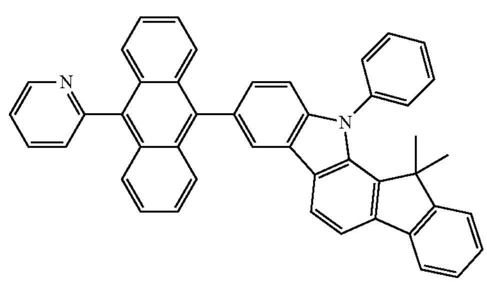
H48
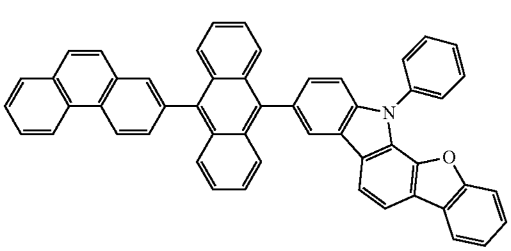
H49
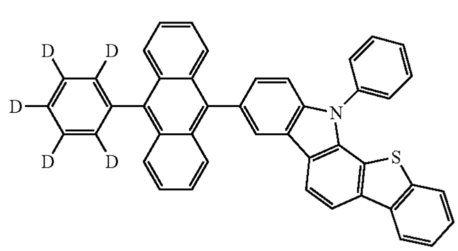

-continued
H50
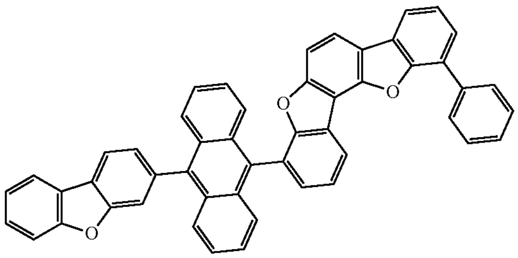
H51
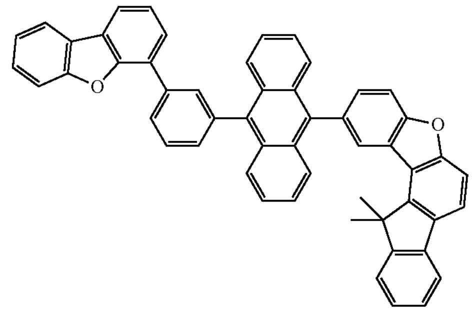
H52
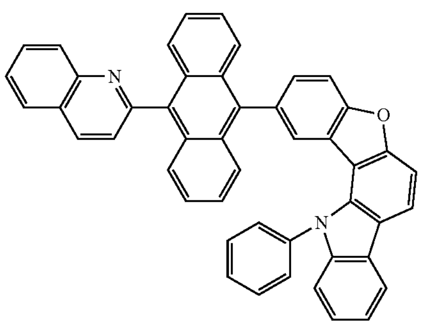
H53
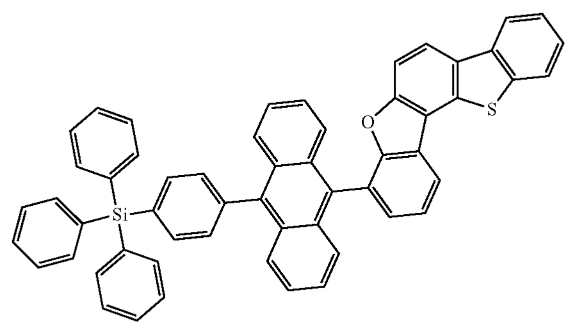
H54
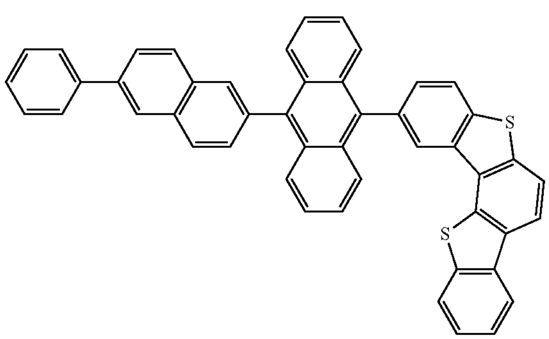
H55
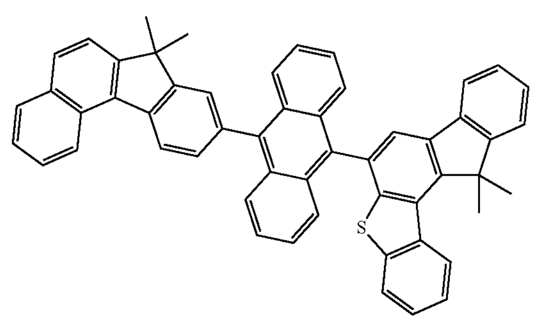
H56
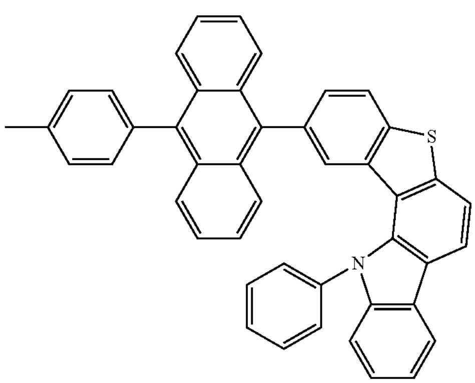
H57
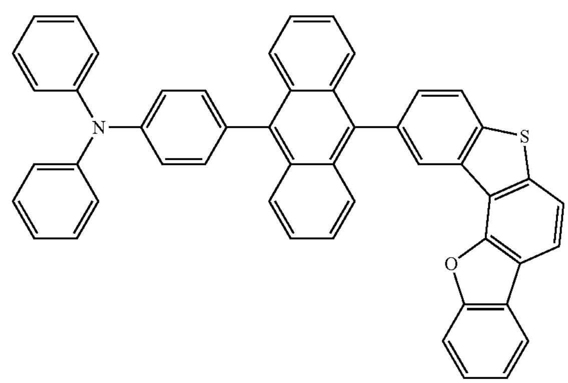

-continued
H58
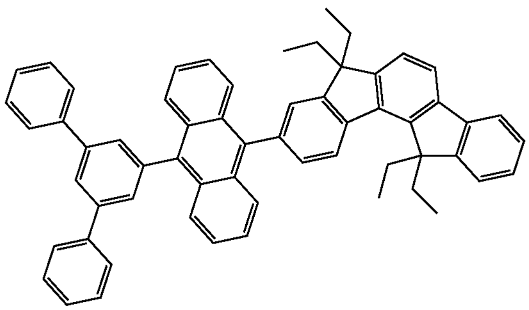
H59
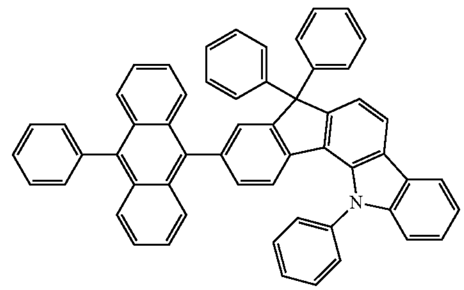
H60
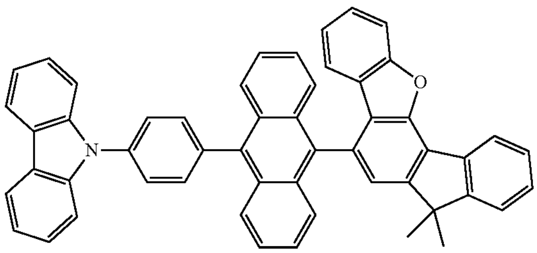
H61
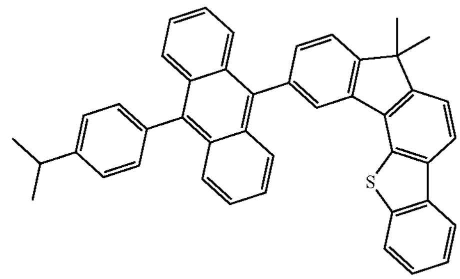
H62
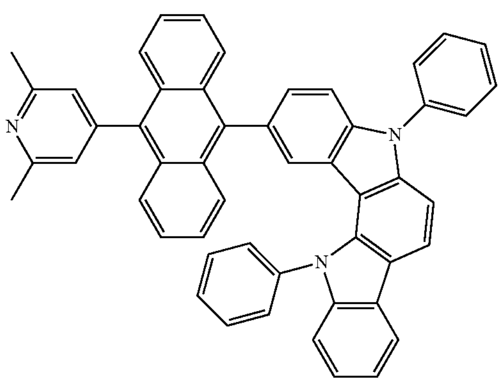
H63
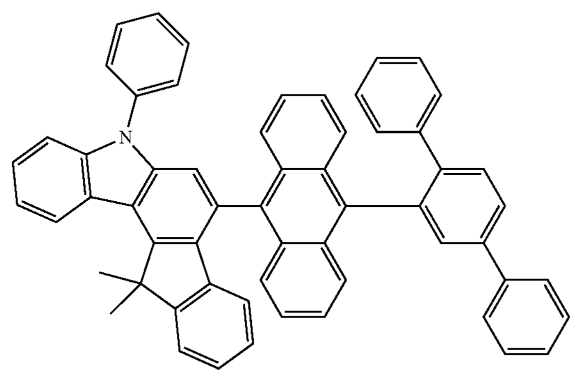
H64
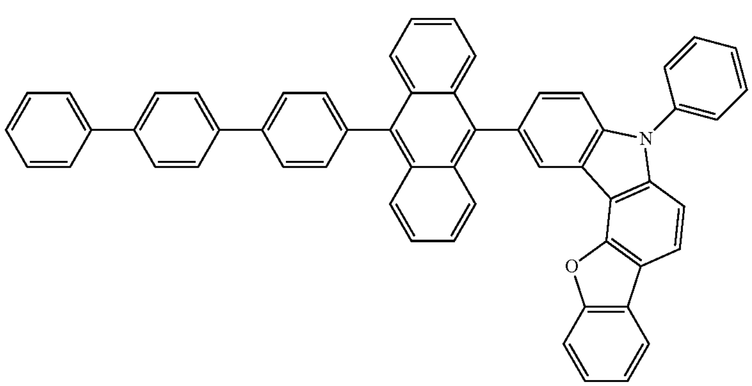

-continued
H65
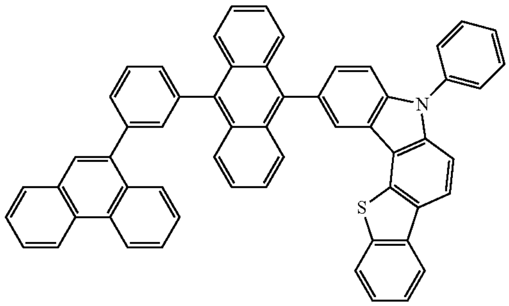
H66
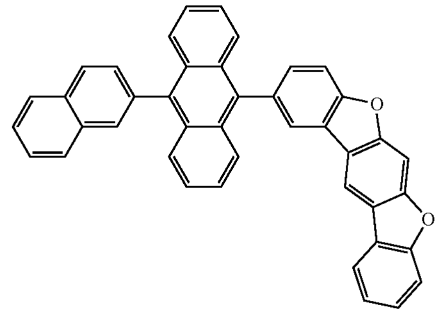
H67
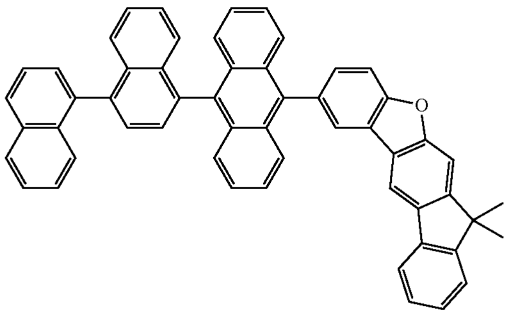
H68
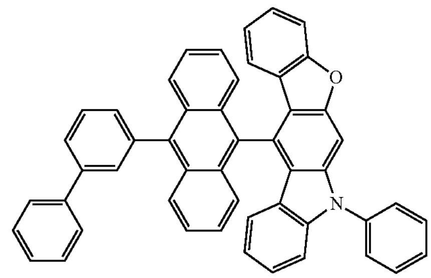
H69
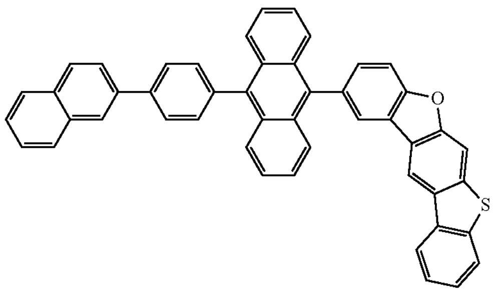
H70
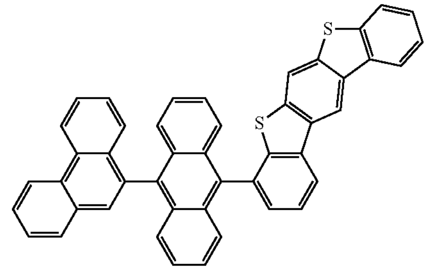
H71
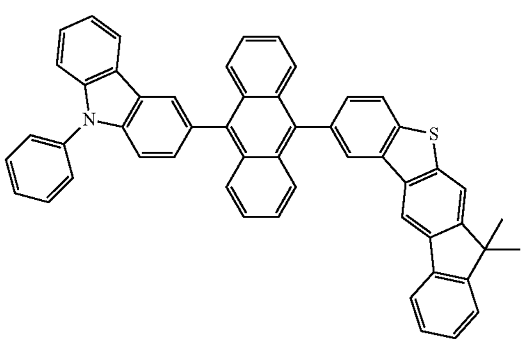
H72
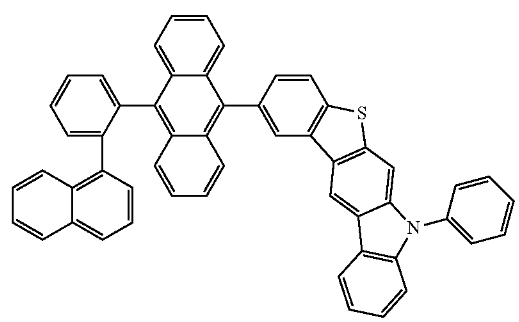
H73
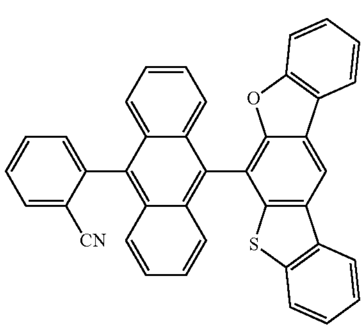
H74
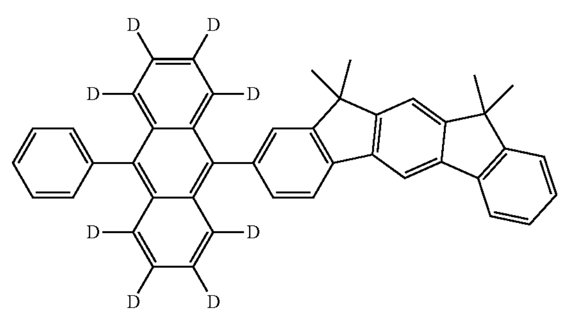

-continued
H75
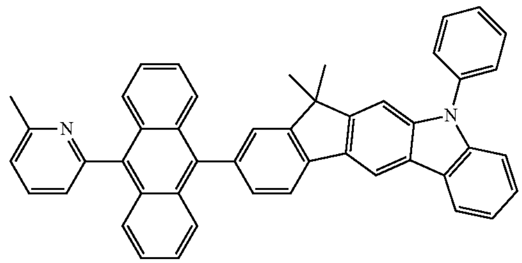
H76
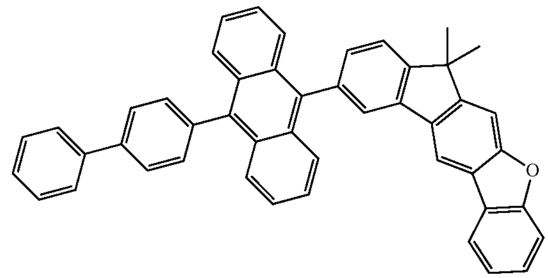
H77
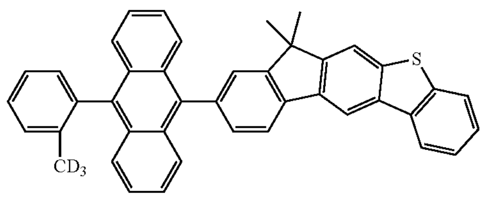
H78
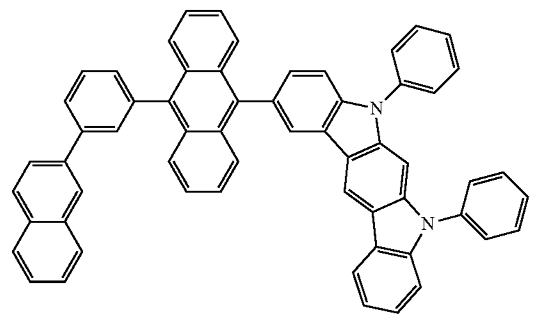
H79
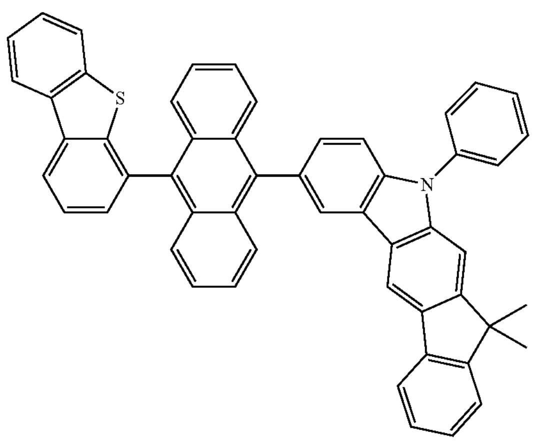
H80
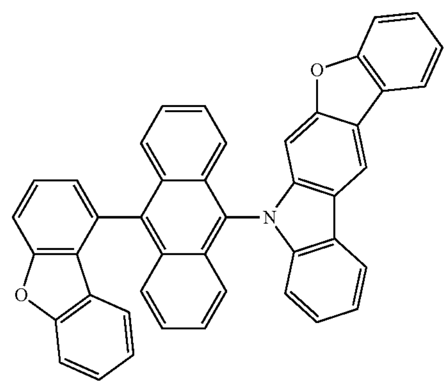
H81
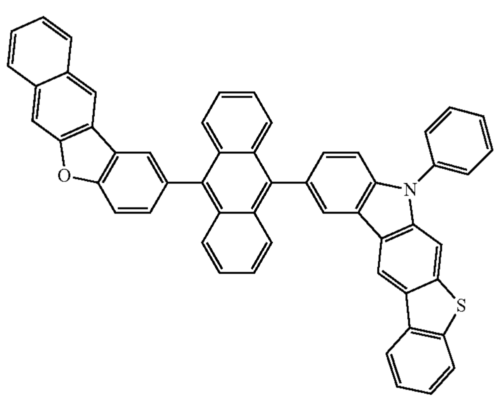
H82
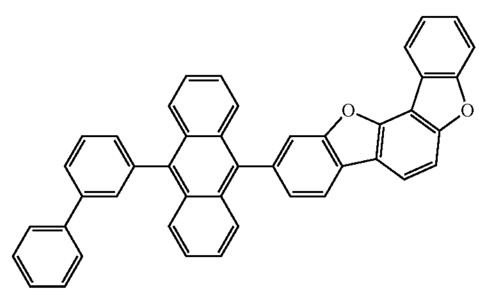

-continued
H83
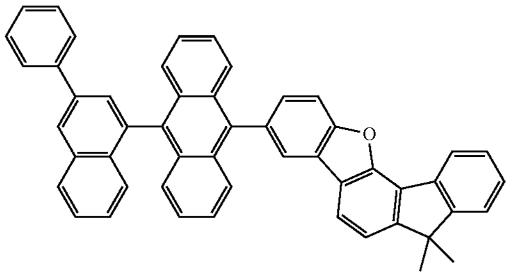
H84
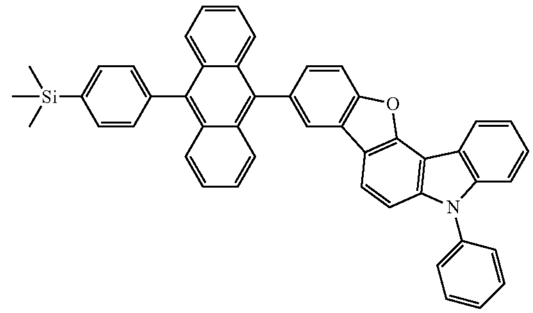
H85
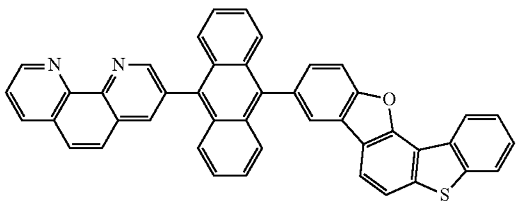
H86
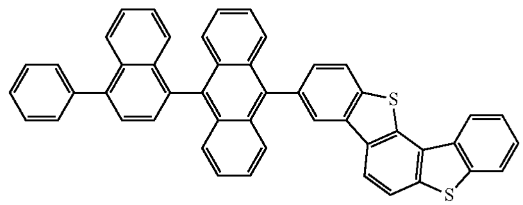
H87
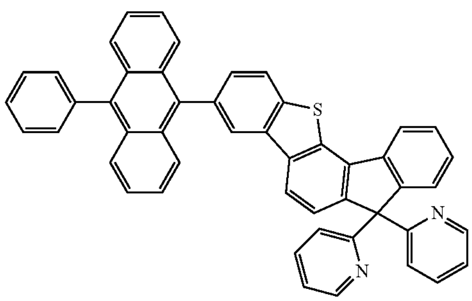
H88
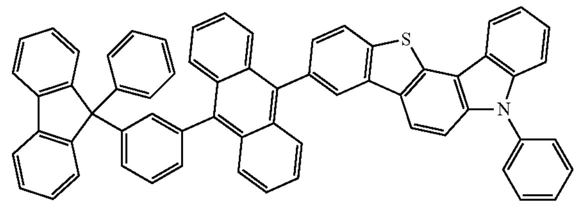
H89
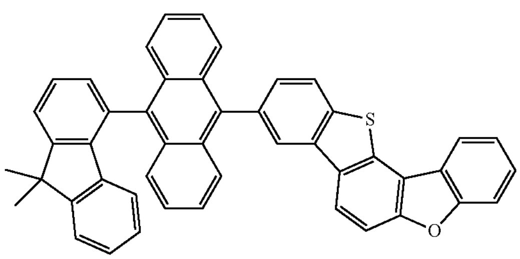
H90
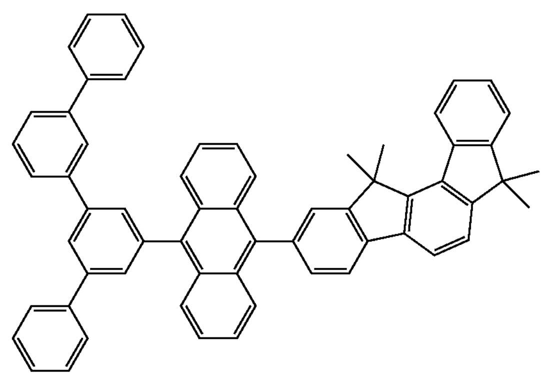
H91
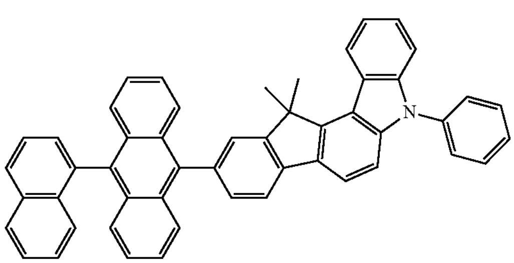
H92
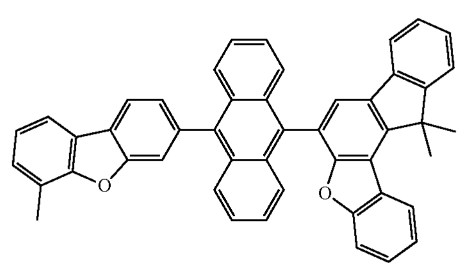

-continued
H93
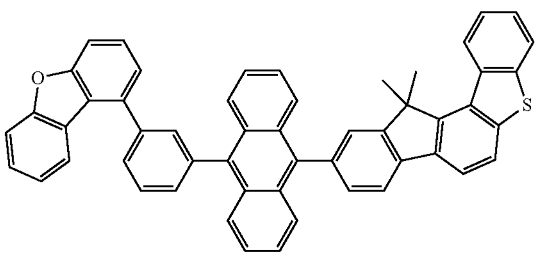
H94
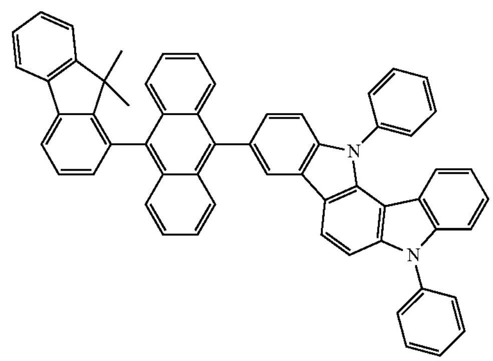
H95
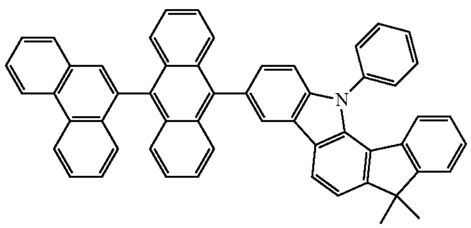
H96
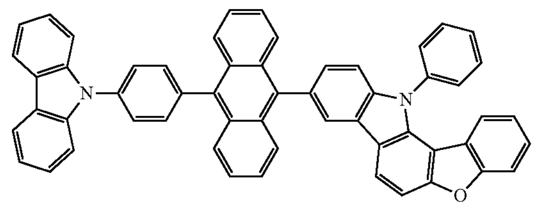
H97
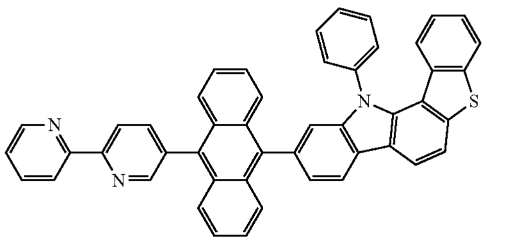
H98
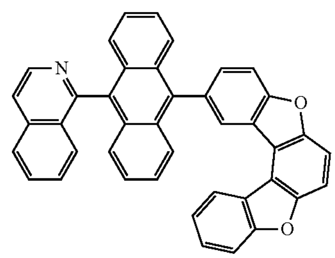
H99
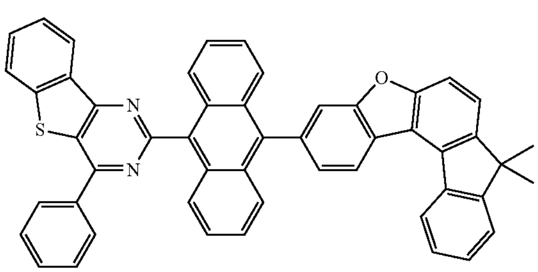
H100
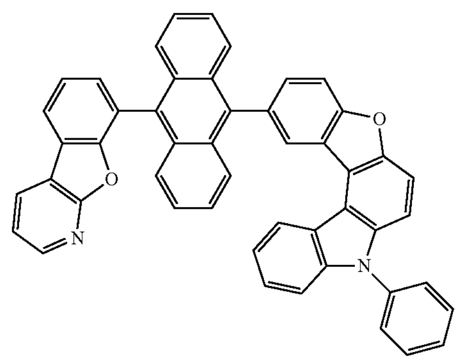
H101
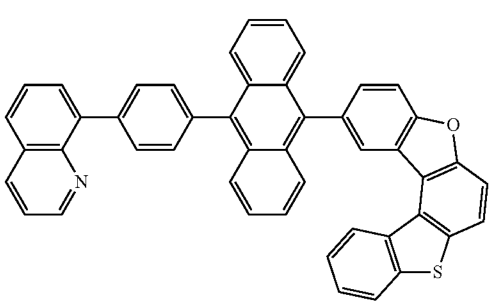
H102
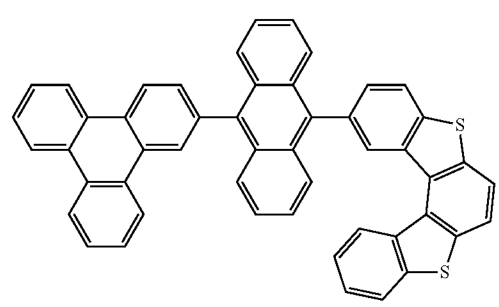

-continued
H103
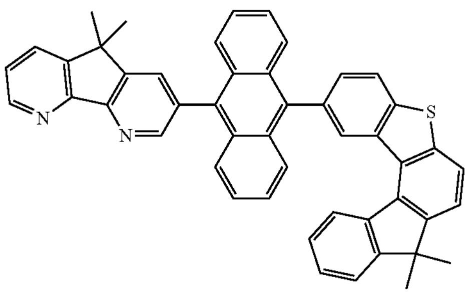
H104
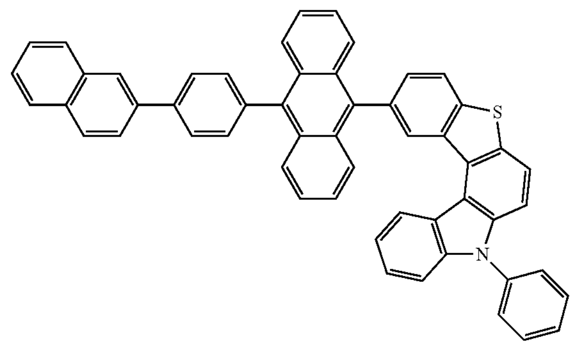
H105
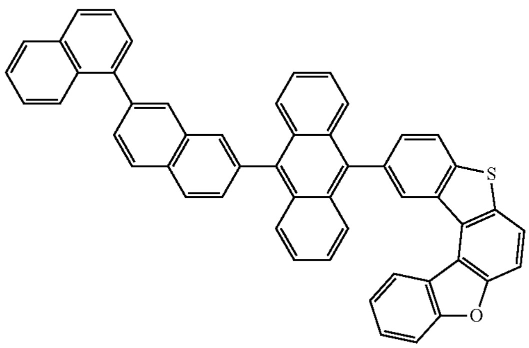
H106
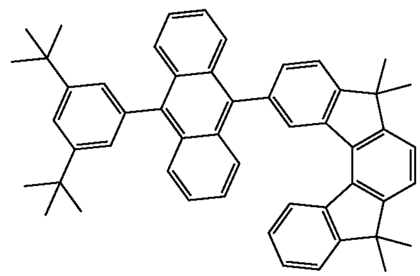
H107
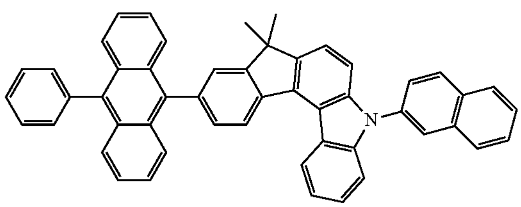
H108
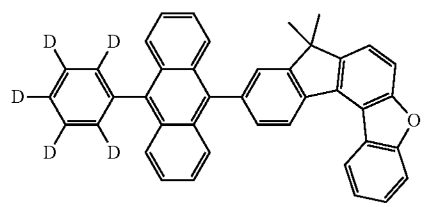
H109
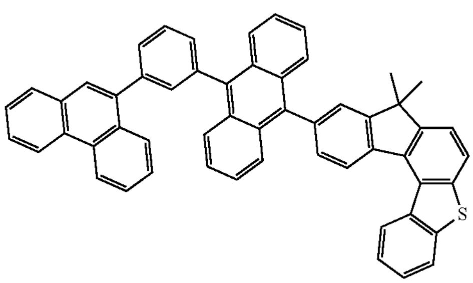
H110
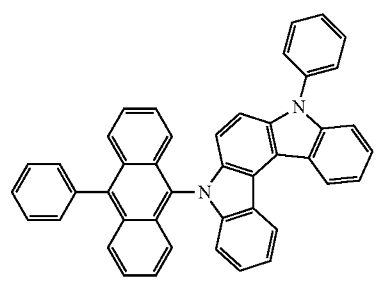
H111
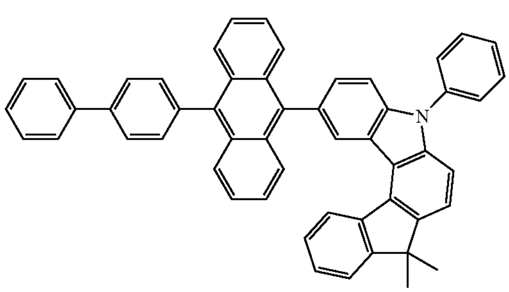
H112
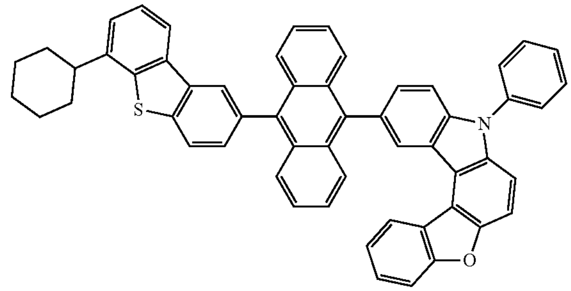

-continued
H113
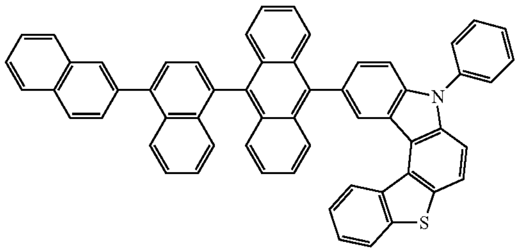
H114
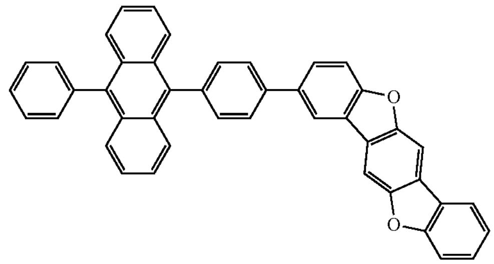
H115
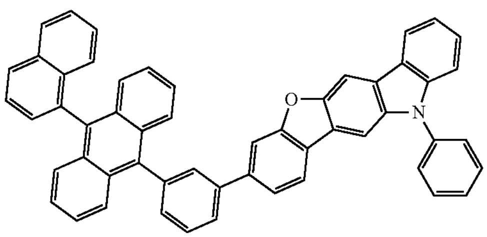
H116
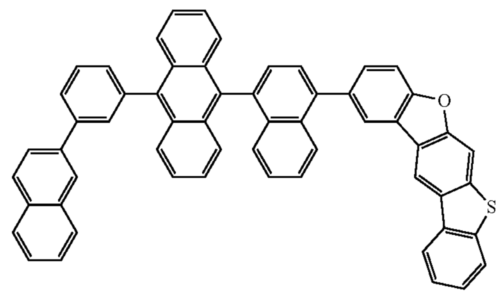
H117
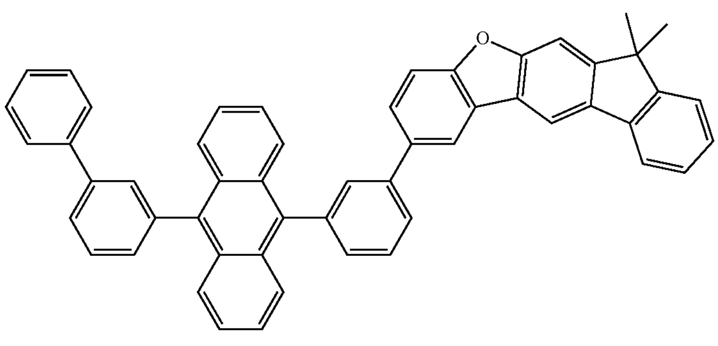
H118
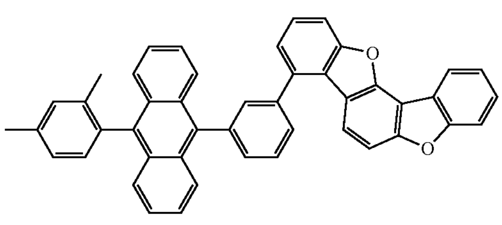
H119
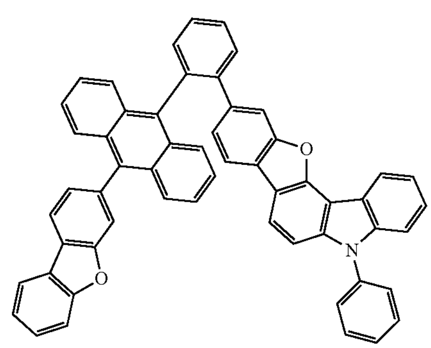

-continued
H120
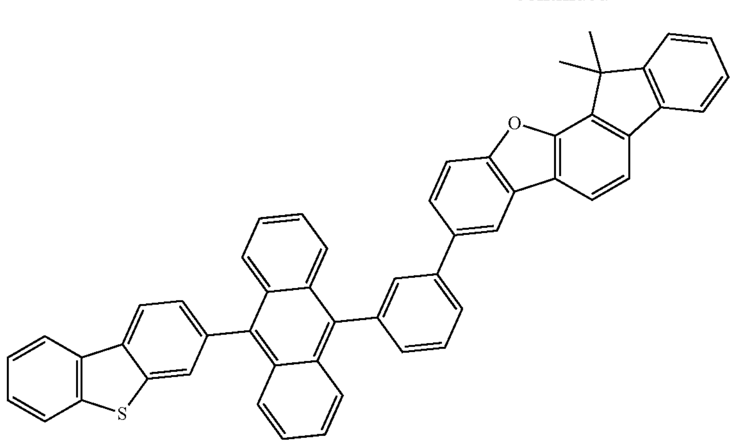
H121
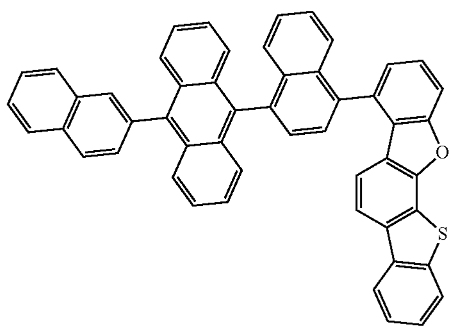
H122
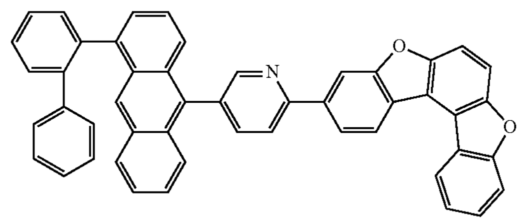
H123
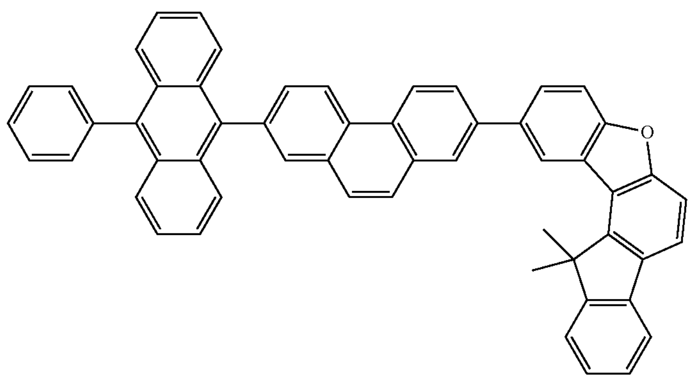
H124
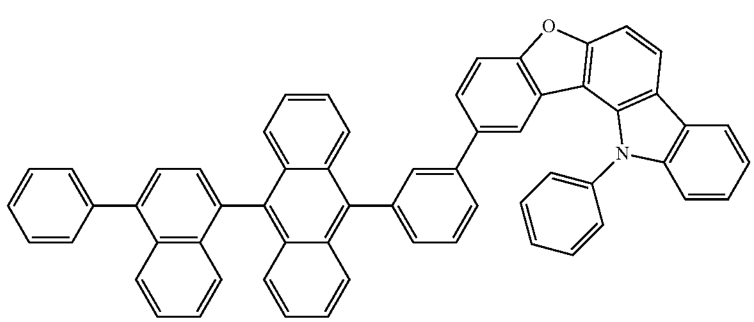

-continued
H125
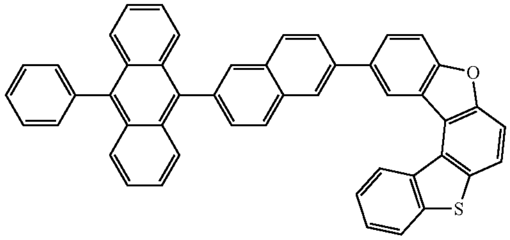
H126
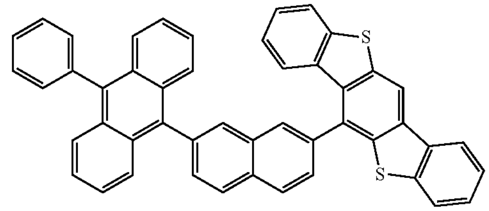
H127
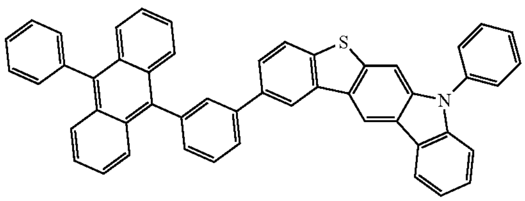
H128
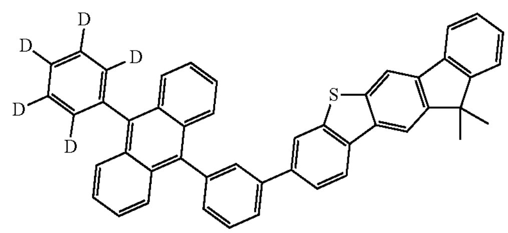
H129
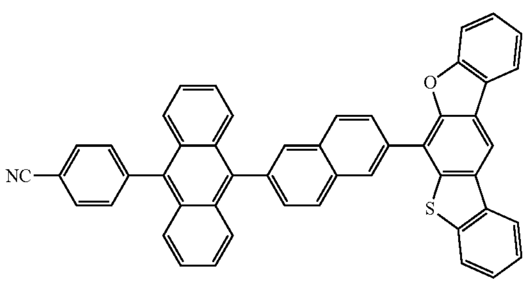
H130
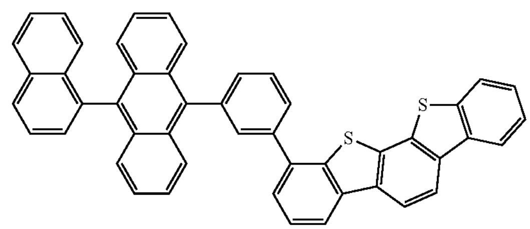
H131
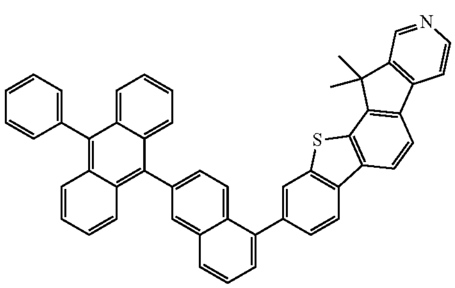
H132
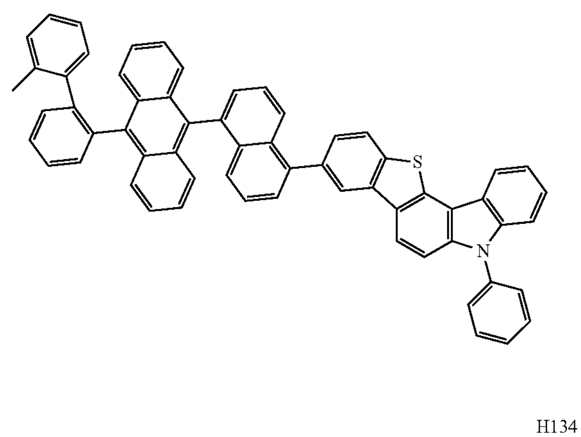
H133
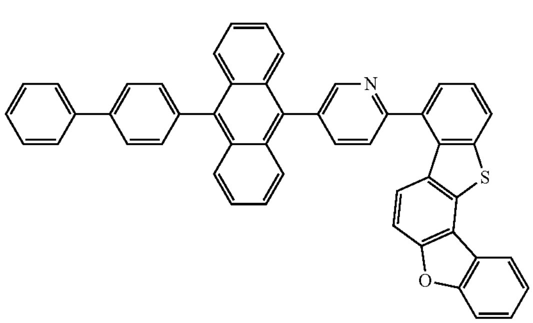
H134
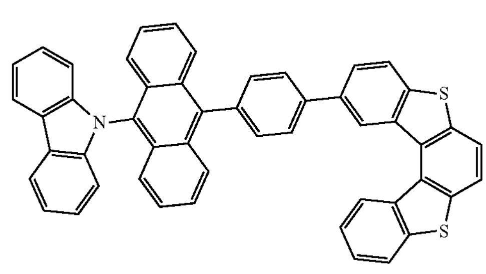

-continued
H135
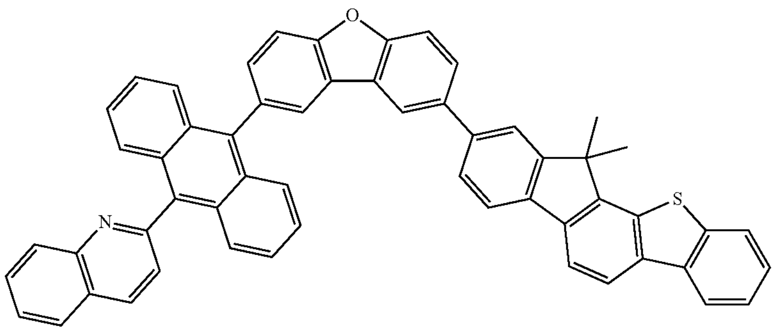
H136
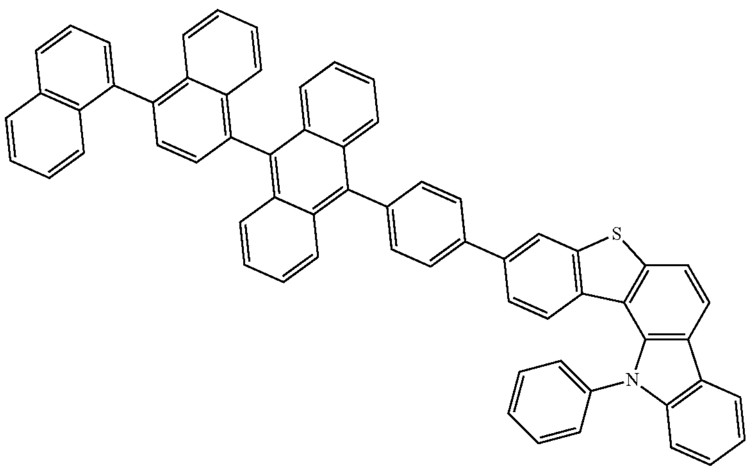
H137
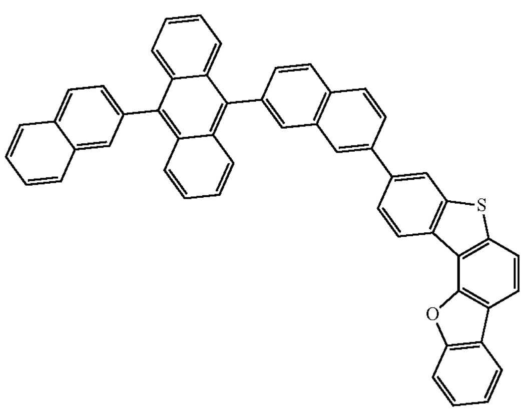
H138
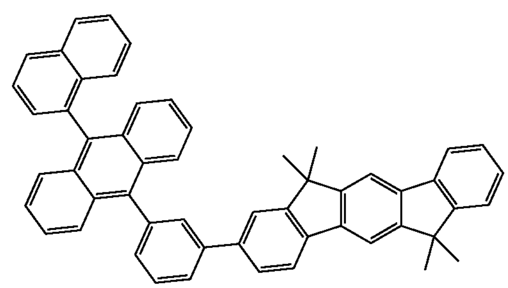
H139
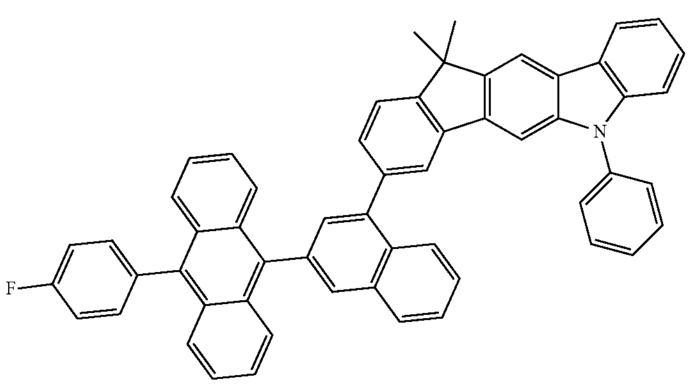

-continued
H140
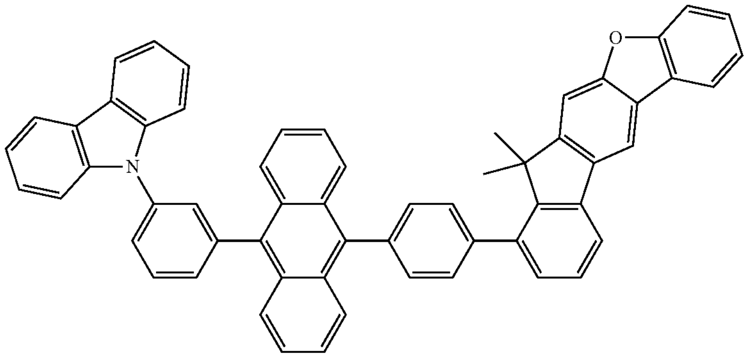
H141
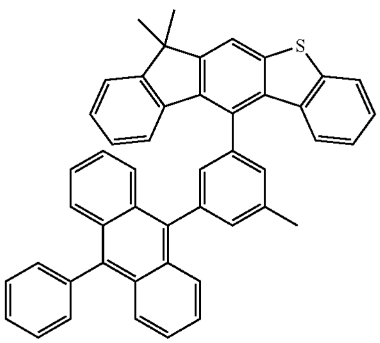
H142
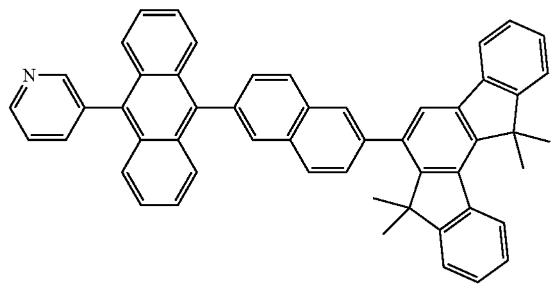
H143
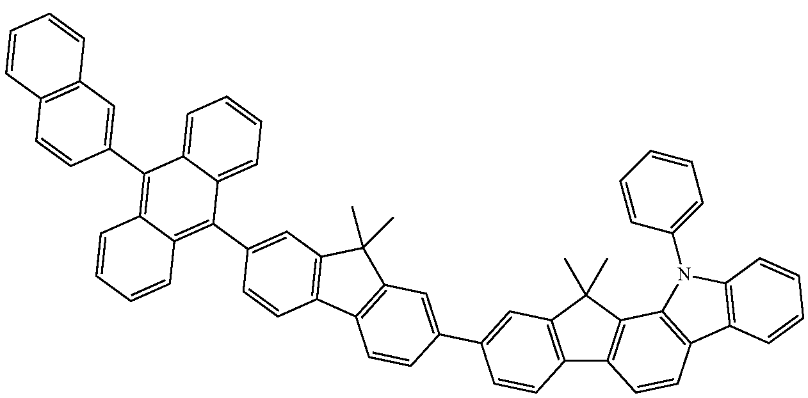
H144
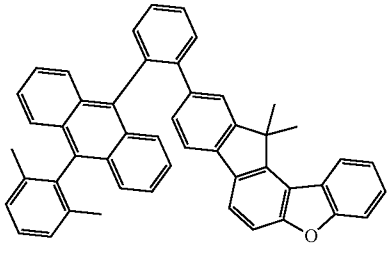
H145
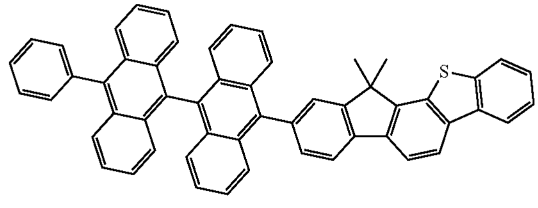

-continued
H146
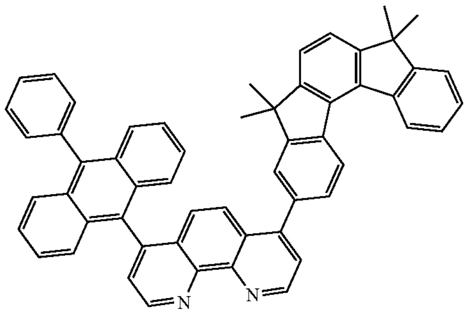
H147
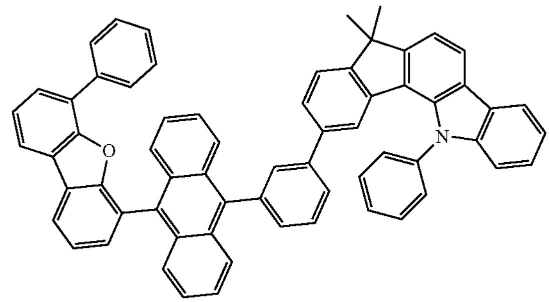
H148
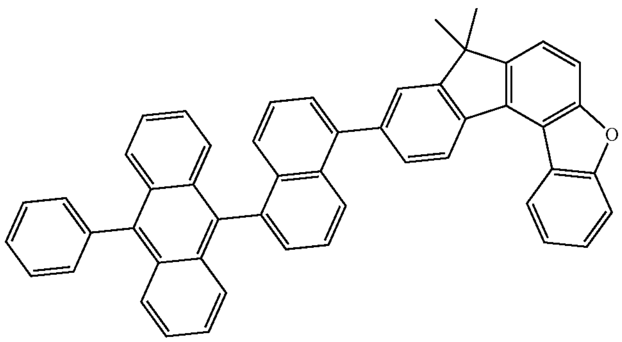
H149
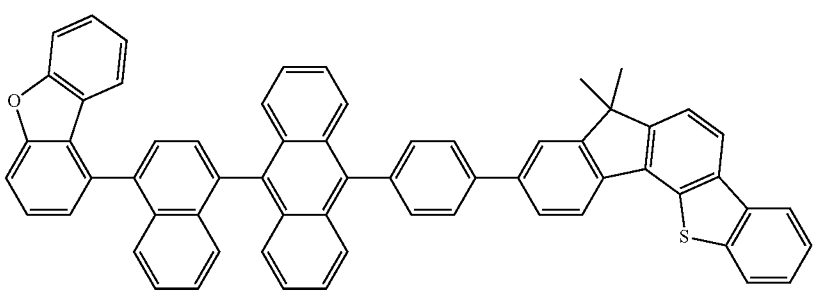
H150
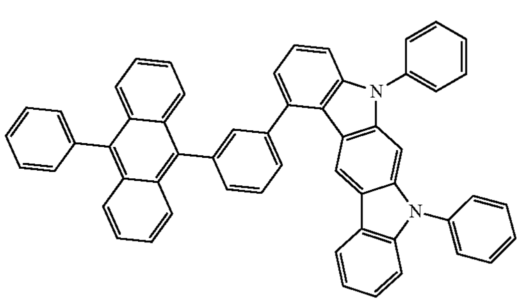
H151
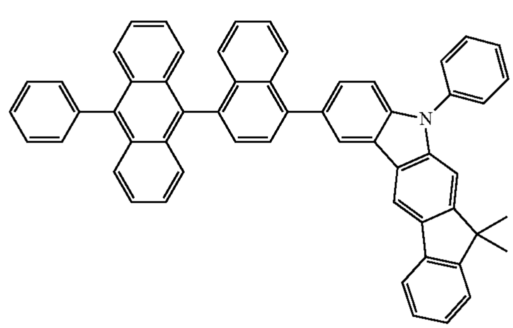

-continued
H152
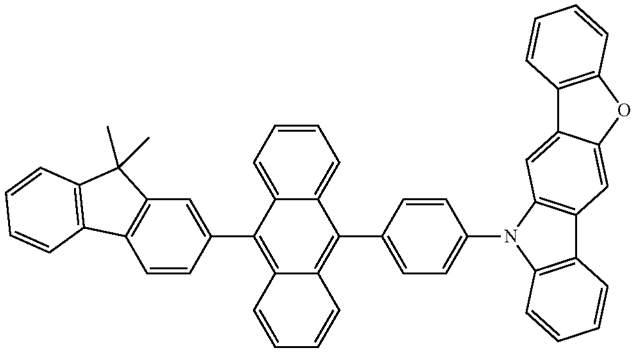
H153
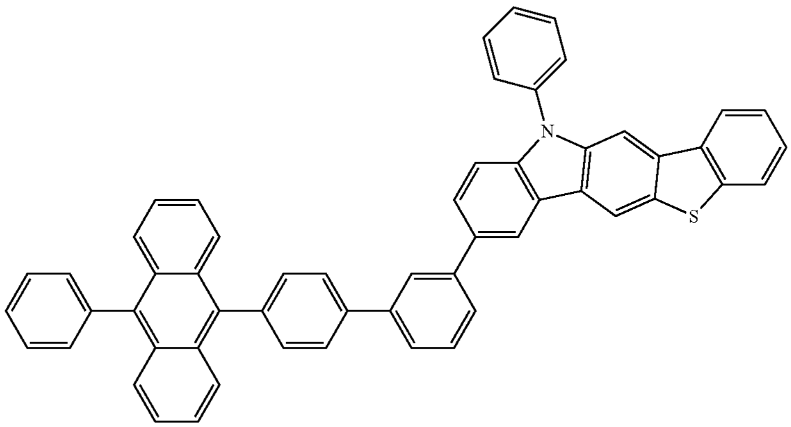
H154
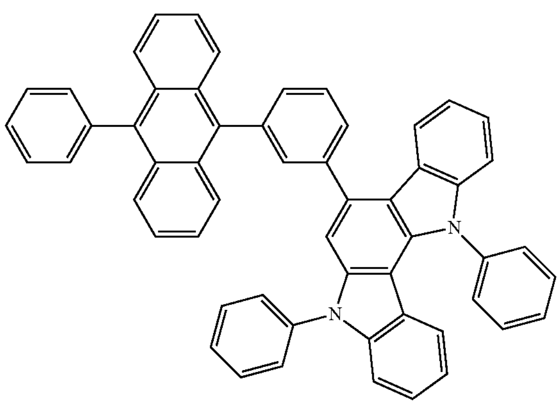
H155
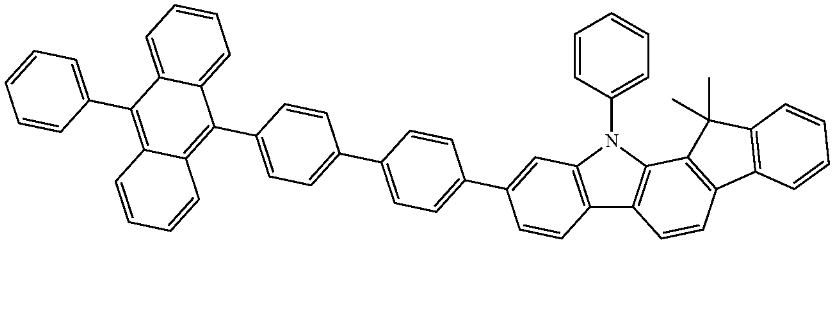

-continued
H156
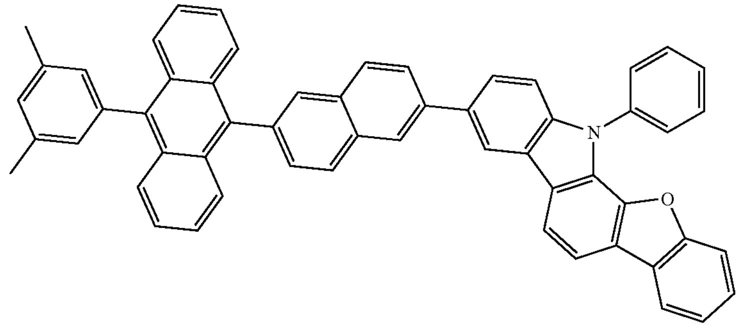
H157
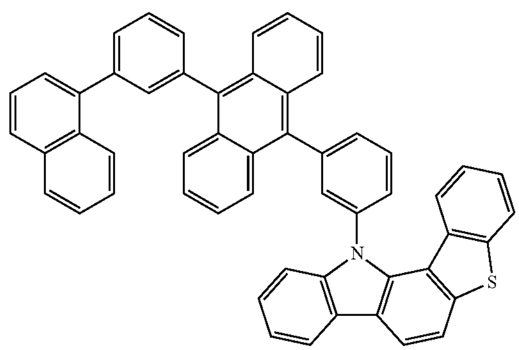
H158
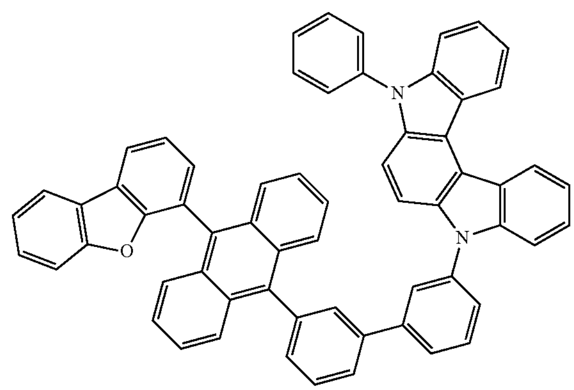
H159
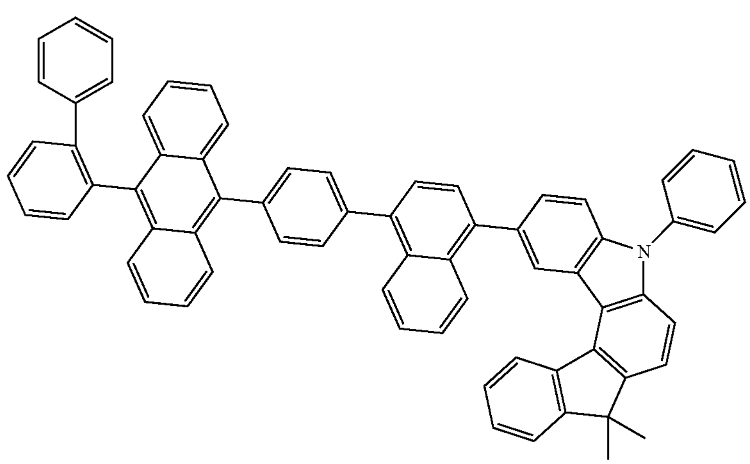

-continued
H160
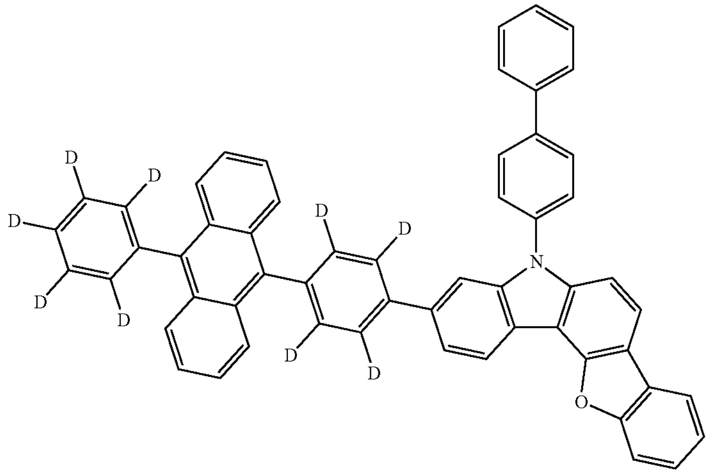
H161
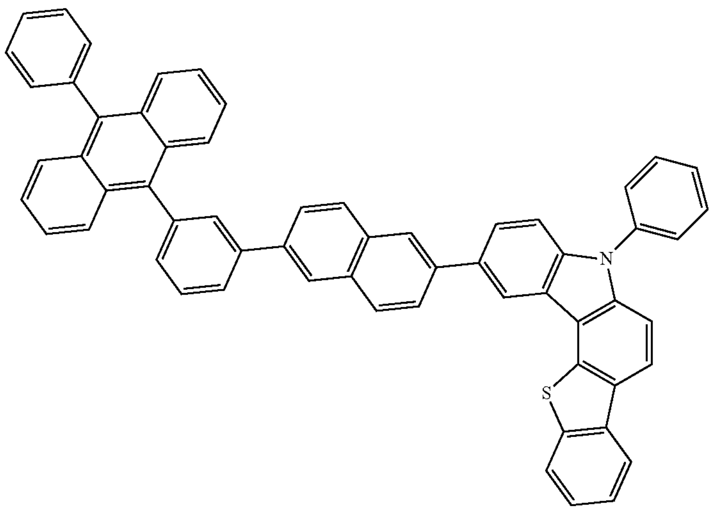
H162
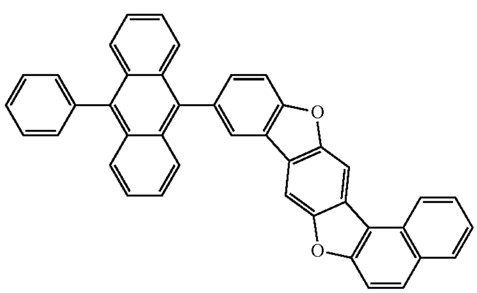
H163
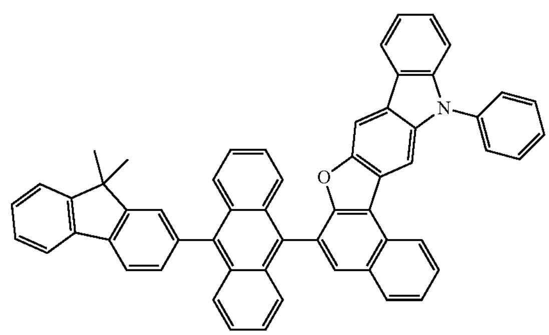
H164
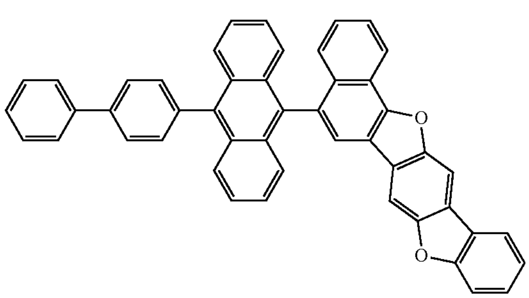
H165
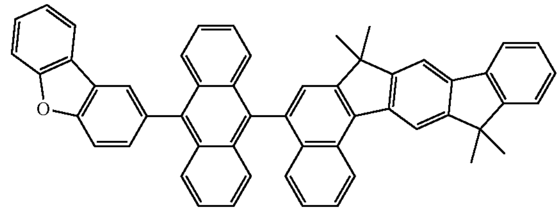

-continued
H166
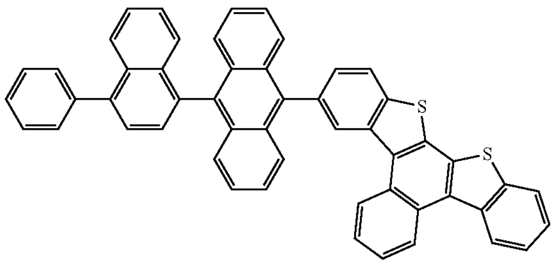
H167
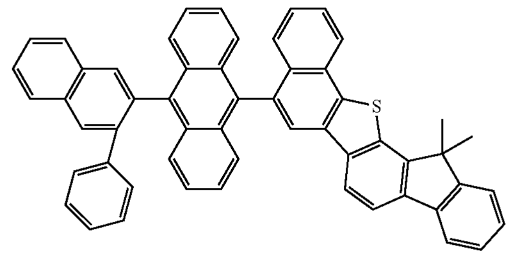
H168
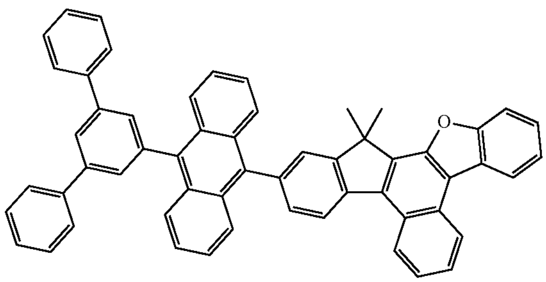
H169
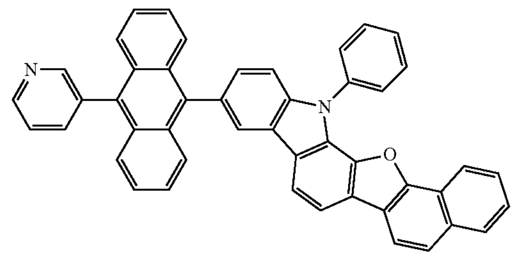
H170
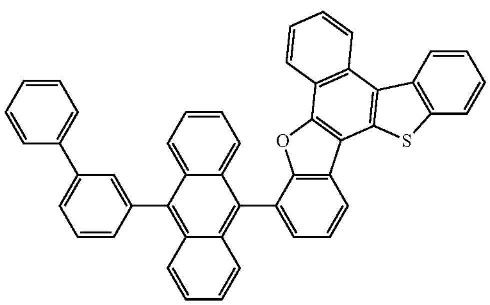
H171
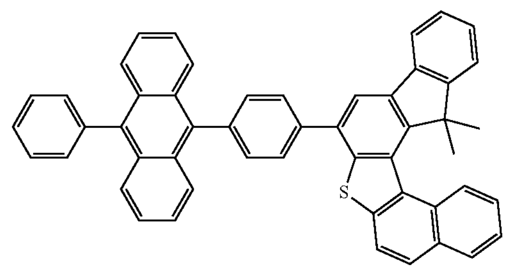
H172
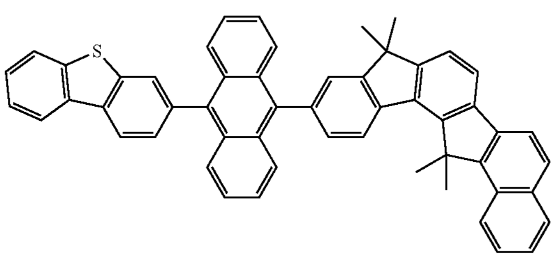
H173
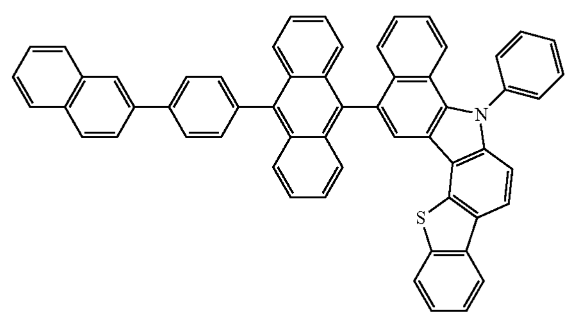
H174
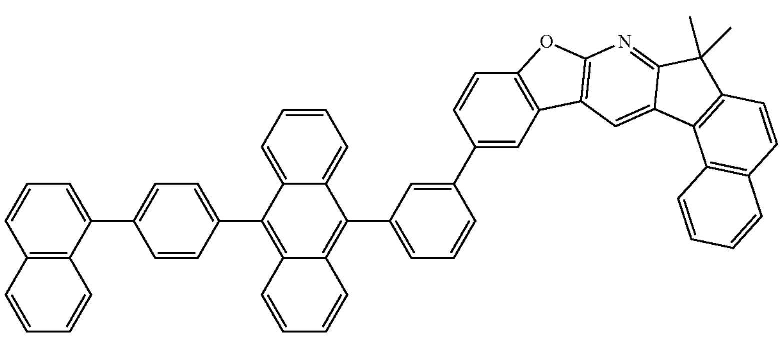

-continued
H175
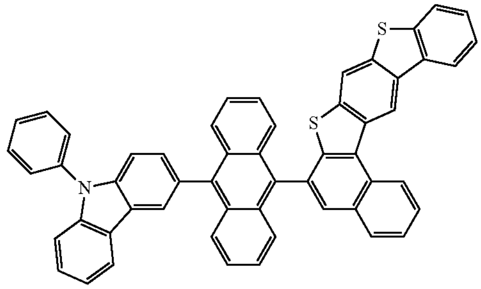
H176
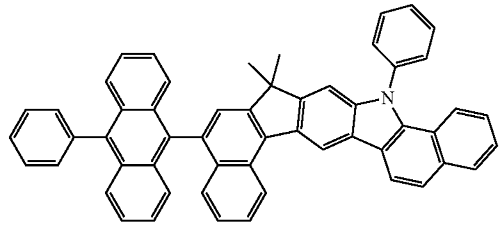
H177
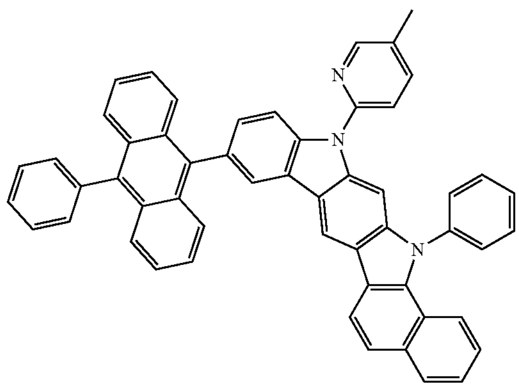
H178
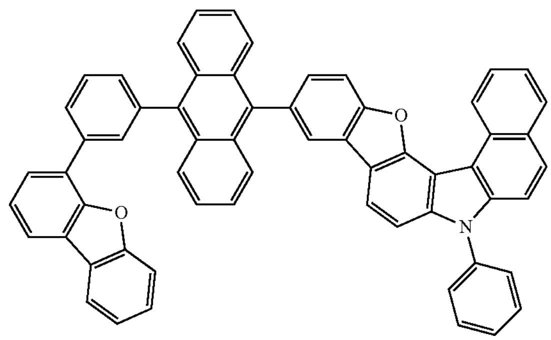
H179
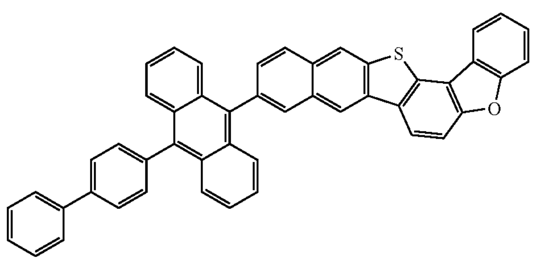
H180
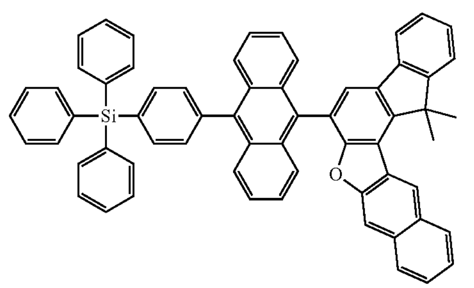
H181
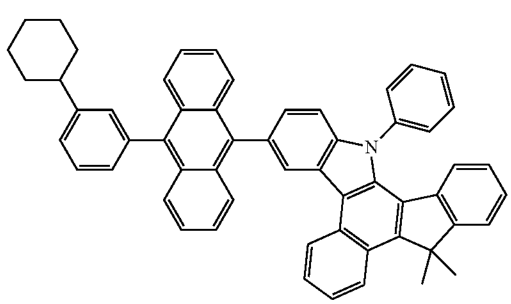
H182
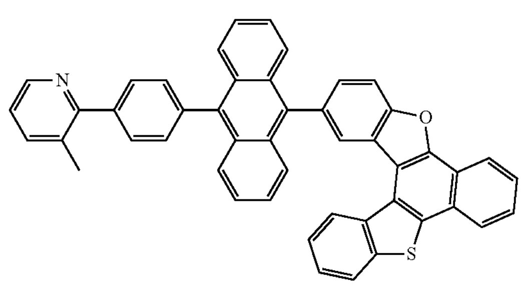

-continued
H183
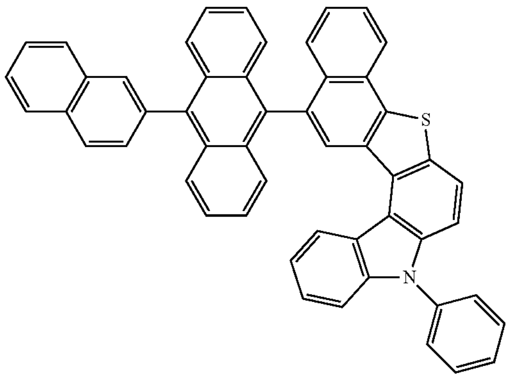
H184
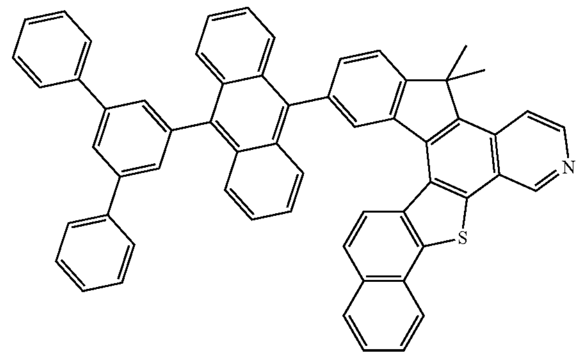
H185
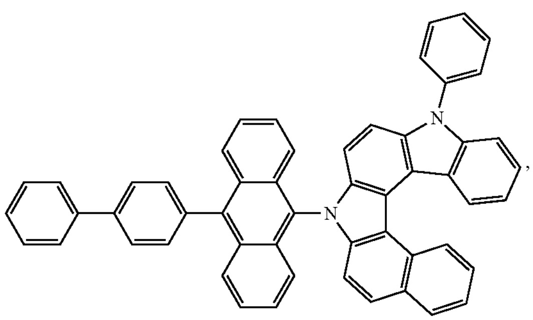
D1-1
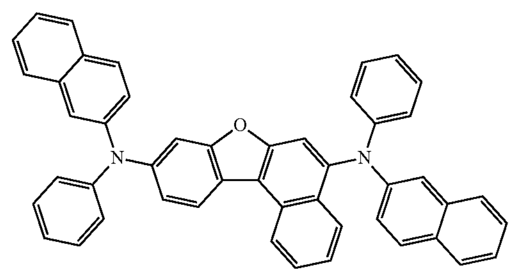
D1-2
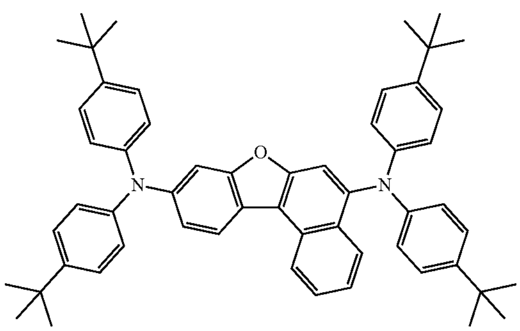
D1-3
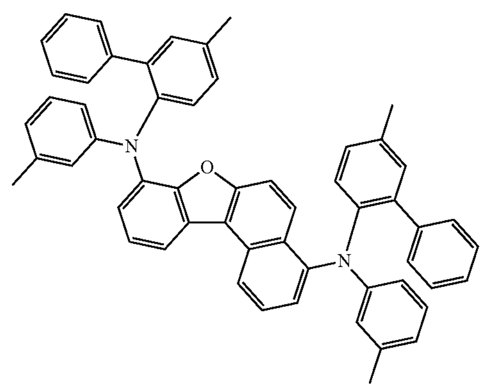
D1-4
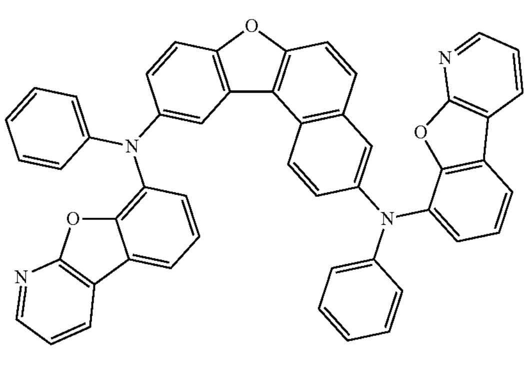
D1-5
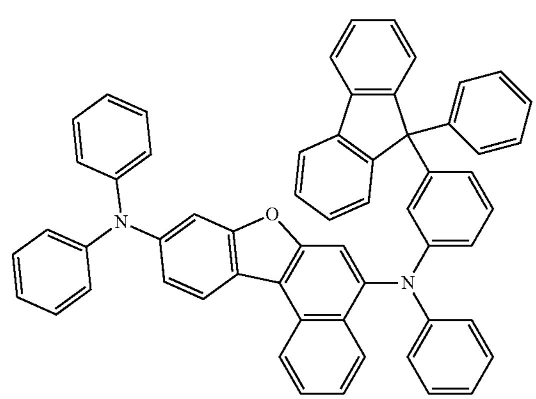

-continued
D1-6
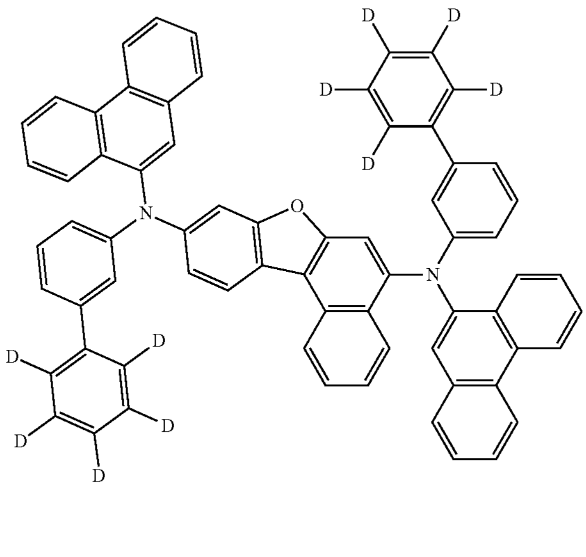
D1-7
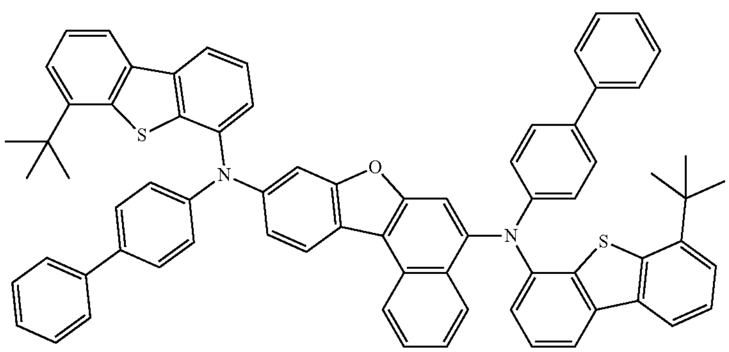
D1-8
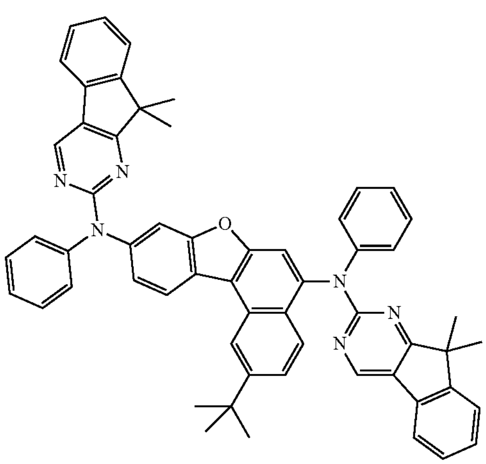
D1-9
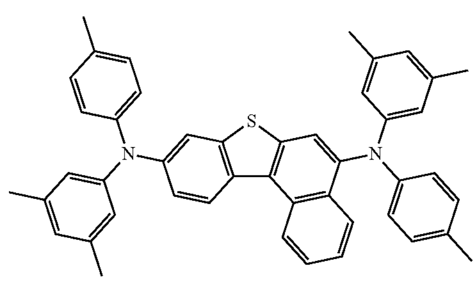

-continued
D1-10
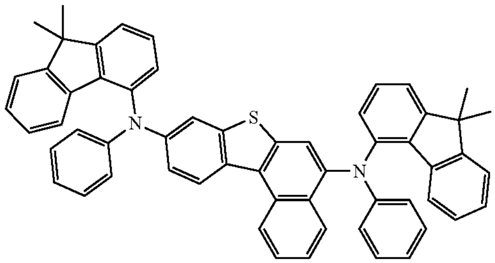
D1-11
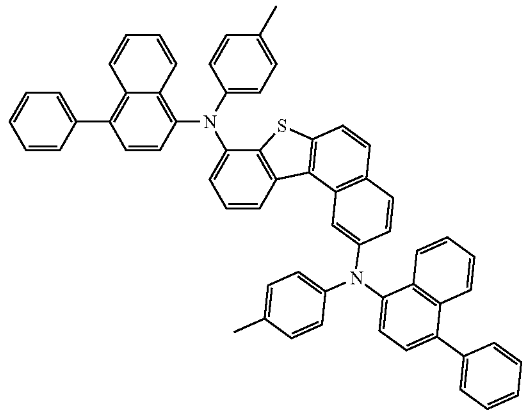
D1-12
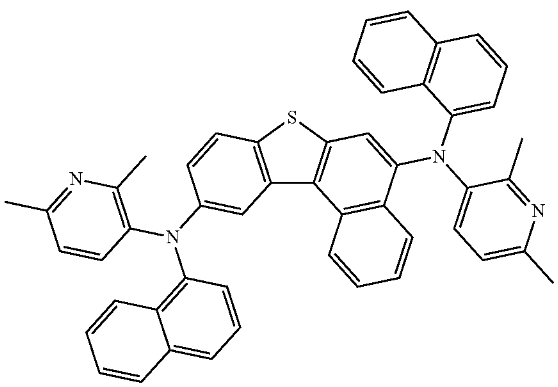
D1-13
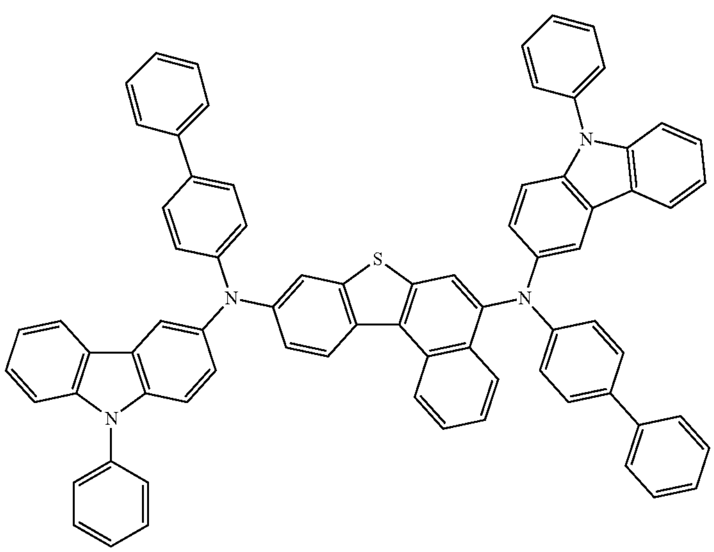

-continued
D1-14
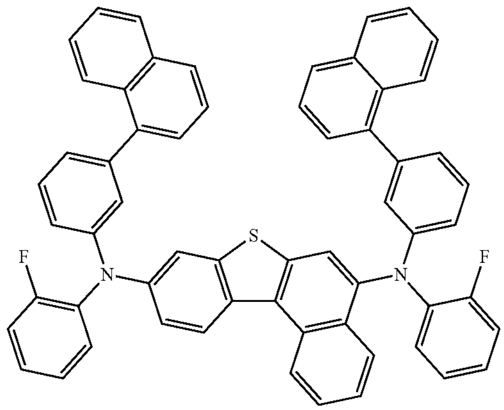
D1-15
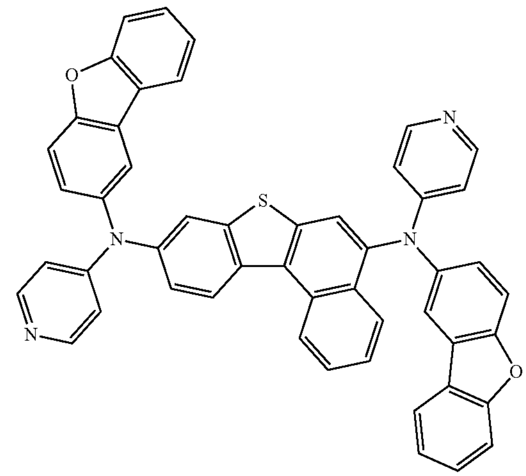
D1-16
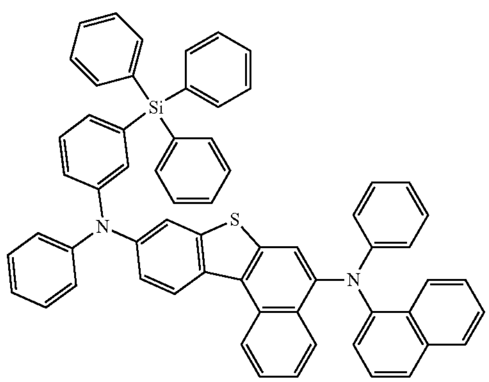
D1-17
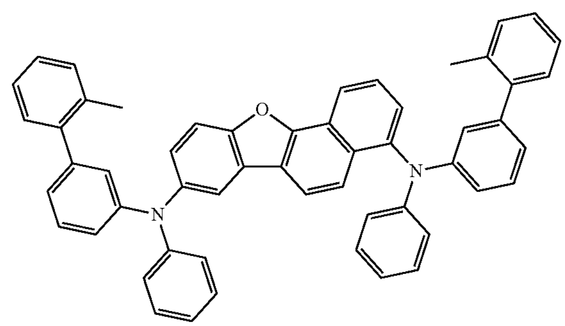
D1-18
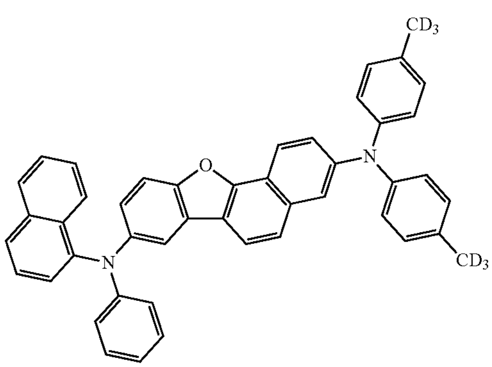
D1-19
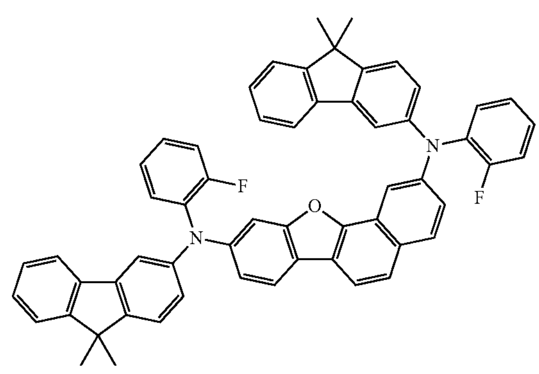

-continued
D1-20
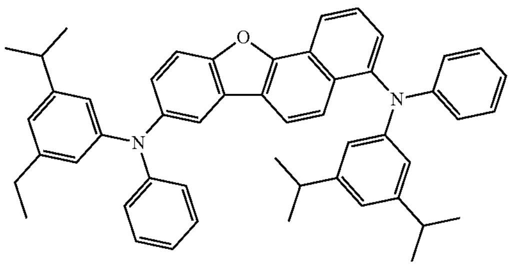
D1-21
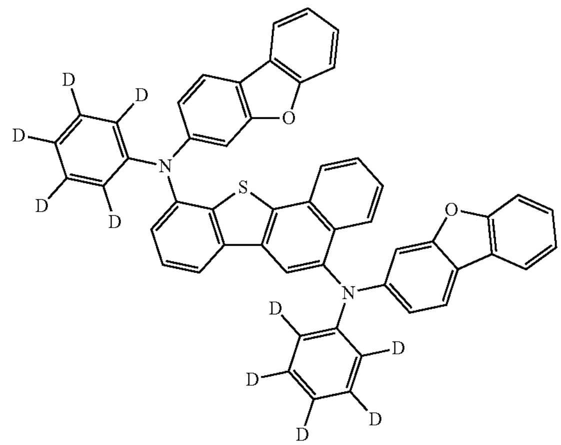
D1-22
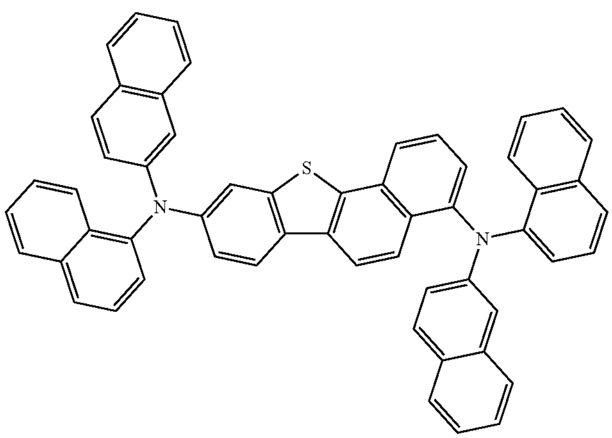
D1-23
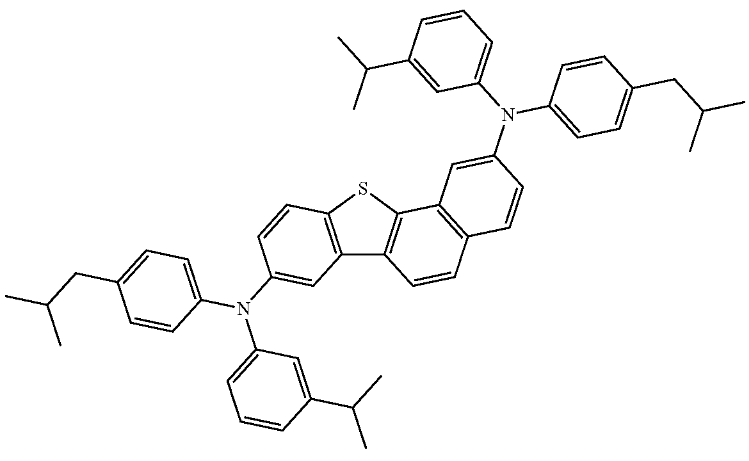

-continued
D1-24
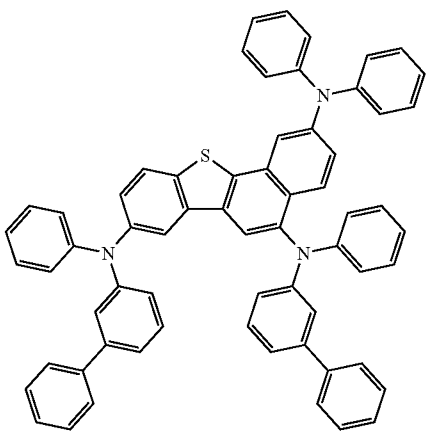
D1-25
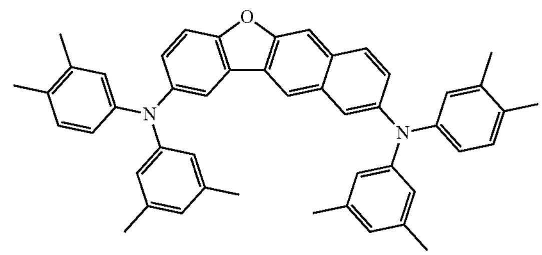
D1-26
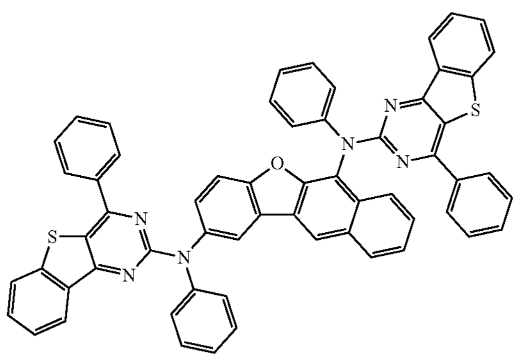
D1-27
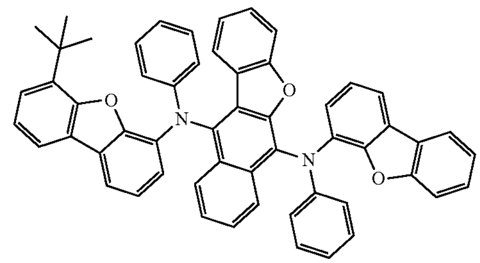
D1-28
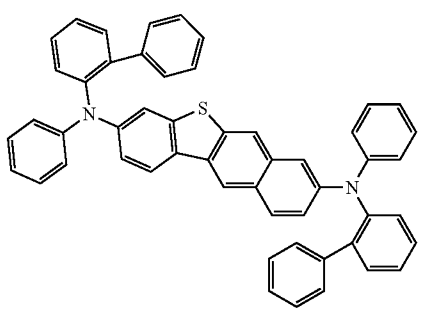
D1-29
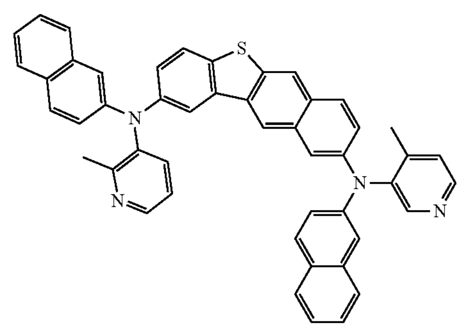
D1-30
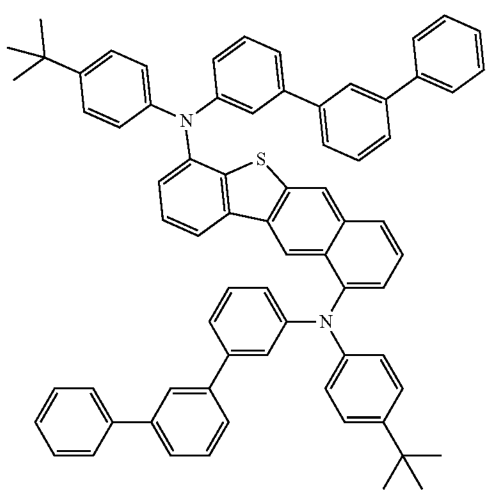
D1-31
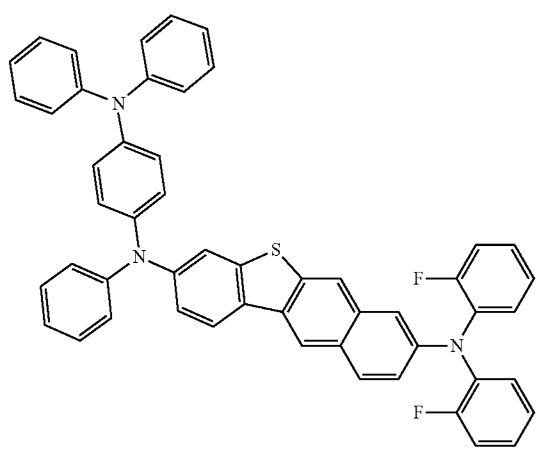

-continued
D1-32
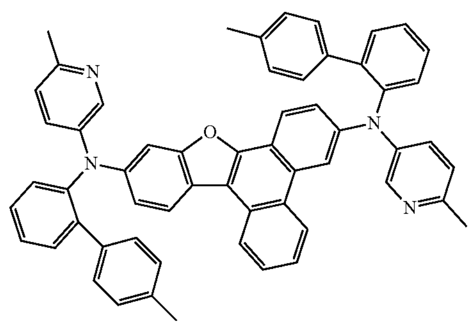
D1-33
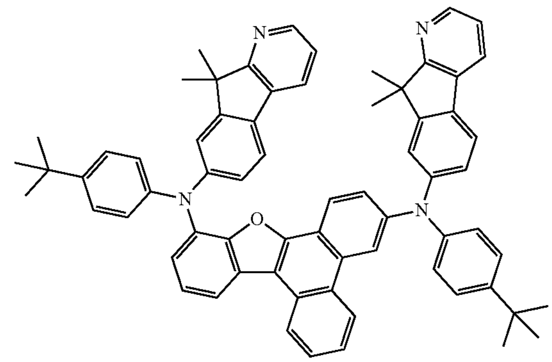
D1-34
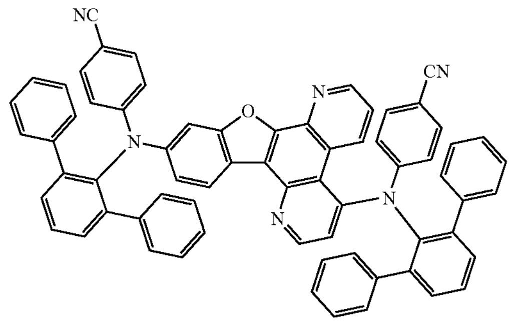
D1-35
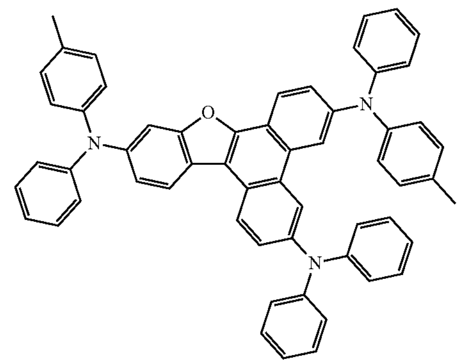
D1-36
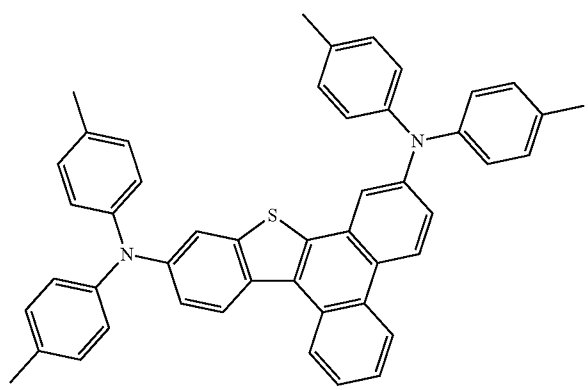
D1-37
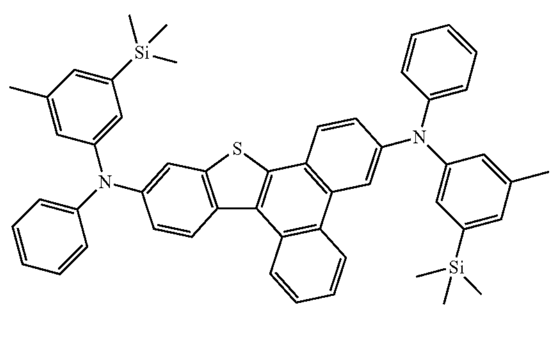
D1-38
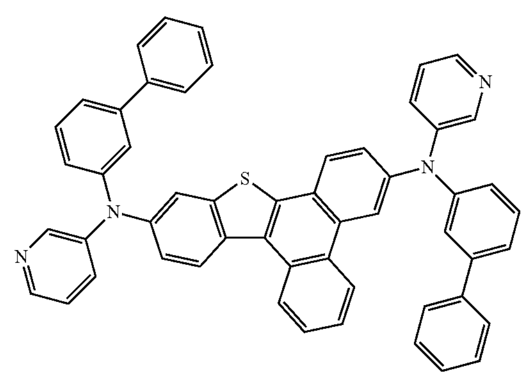

-continued
D1-39
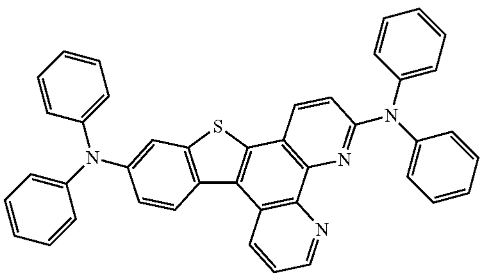
D1-40
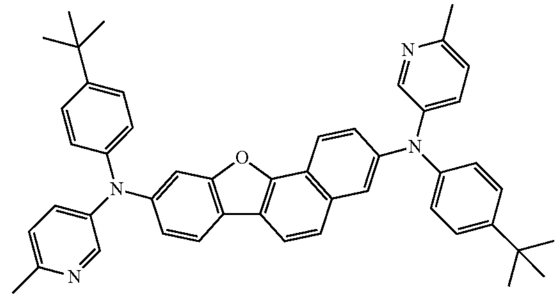
D1-41
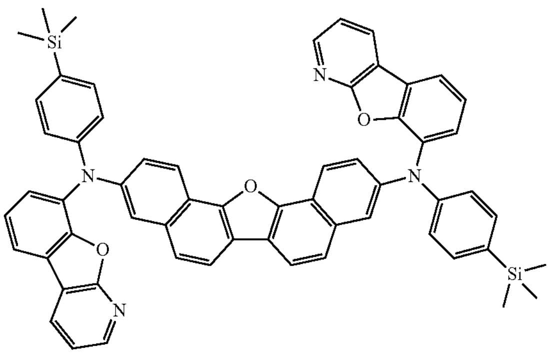
D1-42
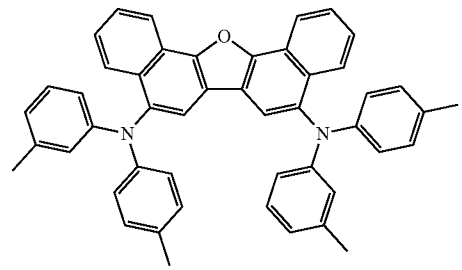
D1-43
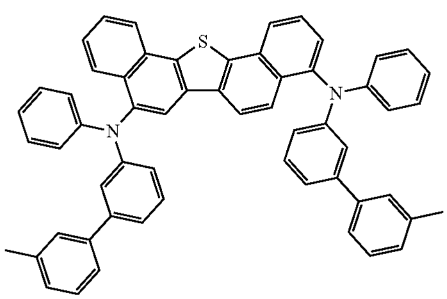
D1-44
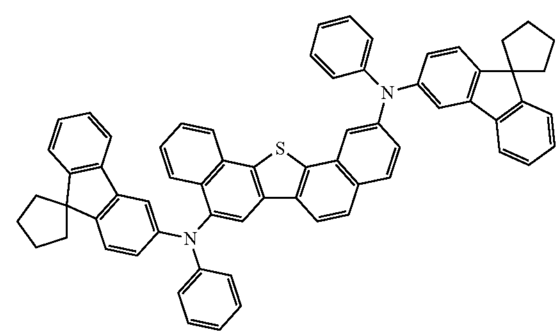
D1-45
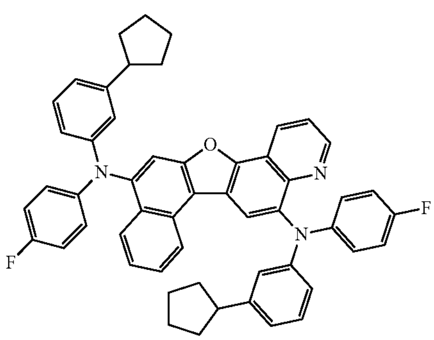
D1-46
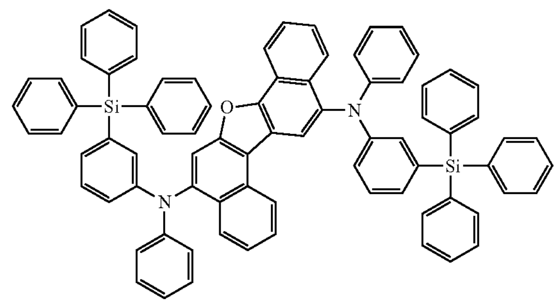

-continued
D1-47
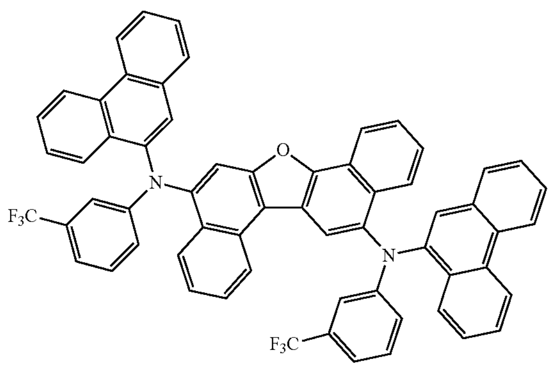
D1-48
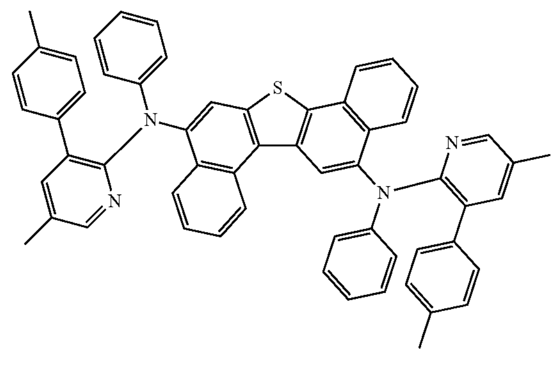
D1-49
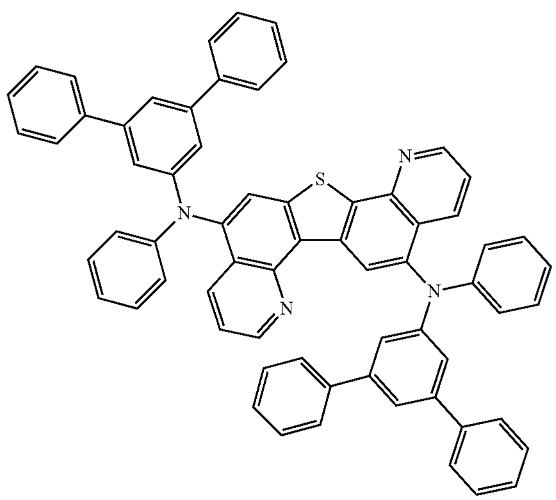
D1-50
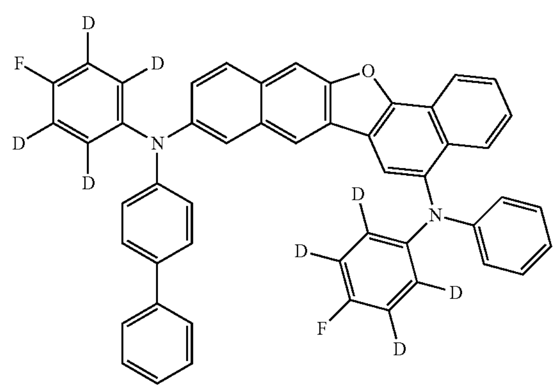
D1-51
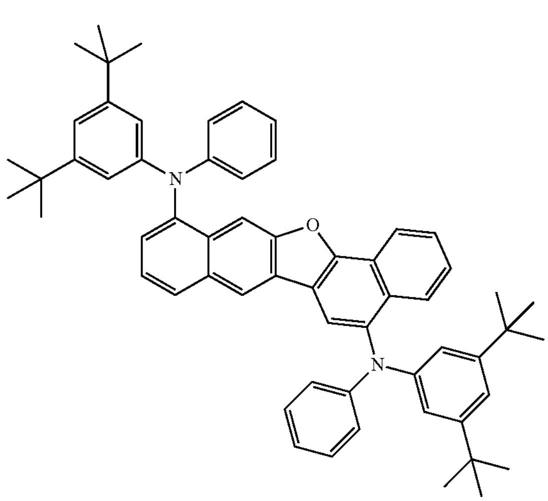
D1-52
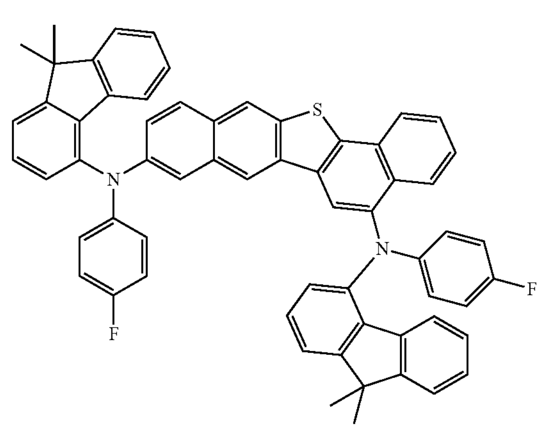

-continued
D1-53
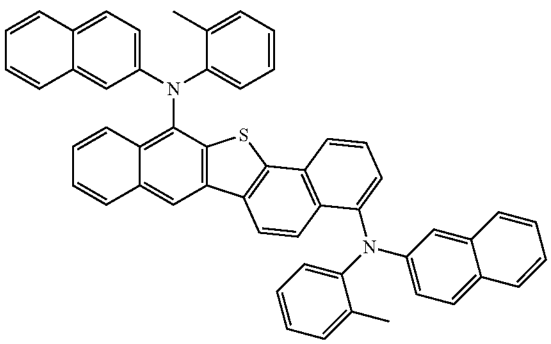
D1-54
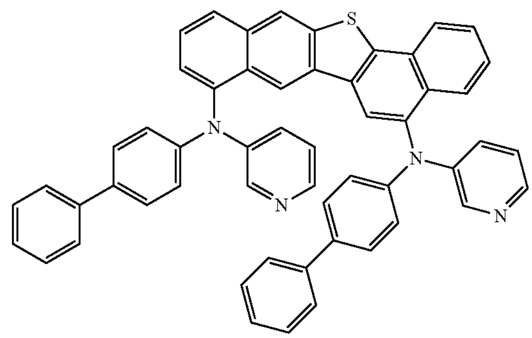
D1-55
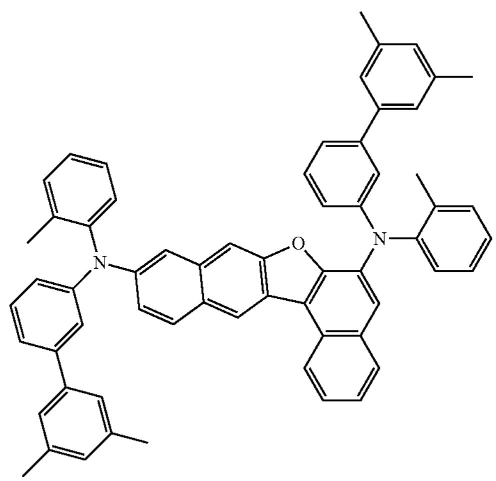
D1-56
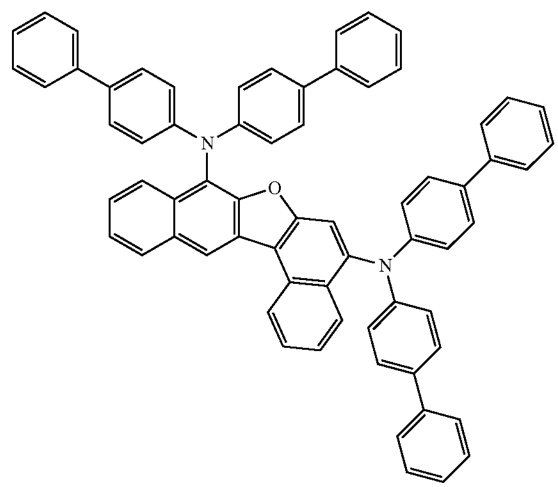
D1-57
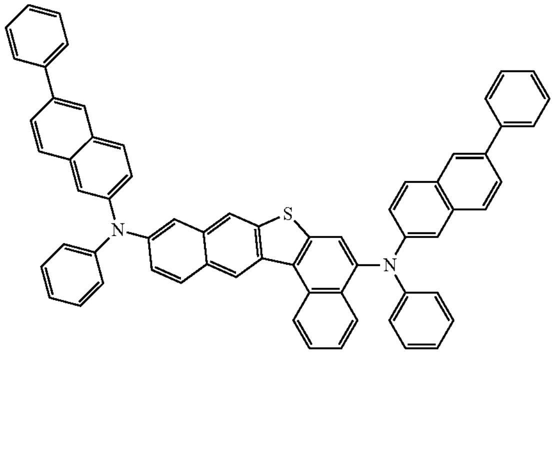
D1-58
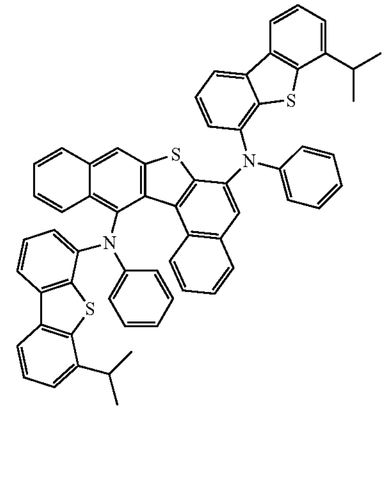

-continued
D1-59
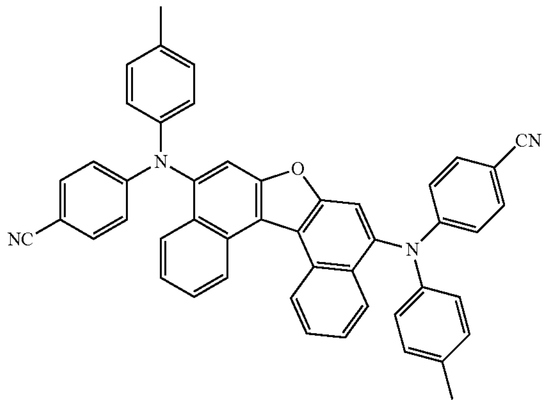
D1-60
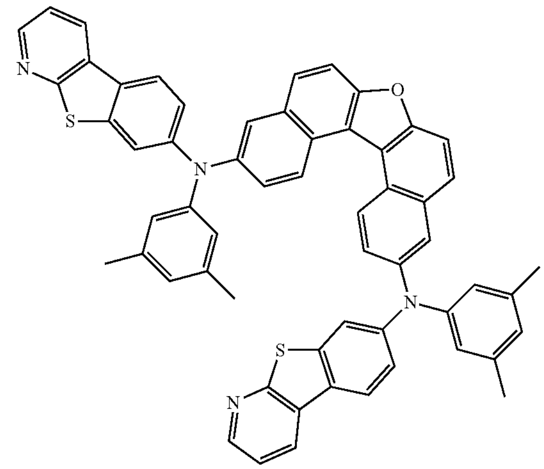
D1-61
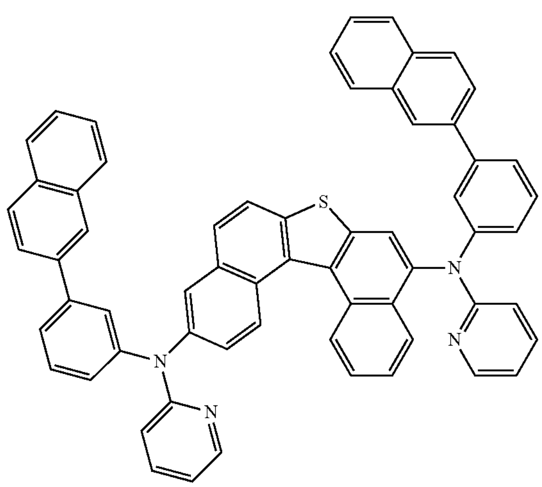
D1-62
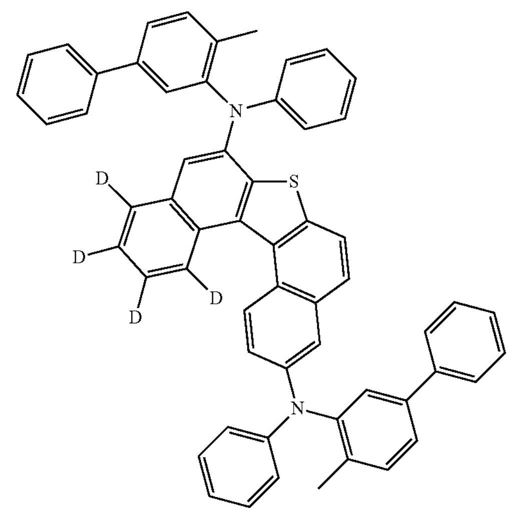
D1-63
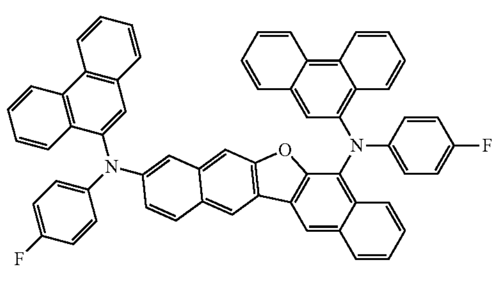
D1-64
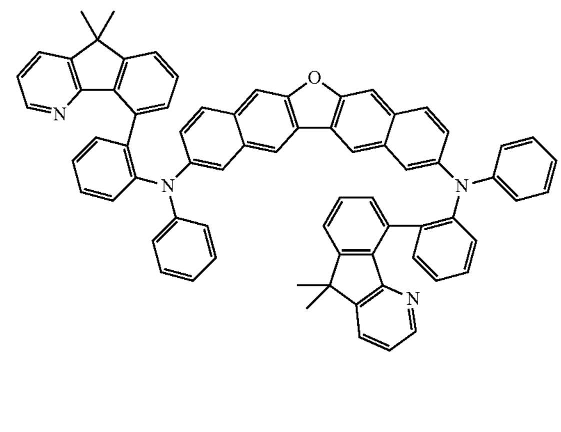

-continued
D1-65
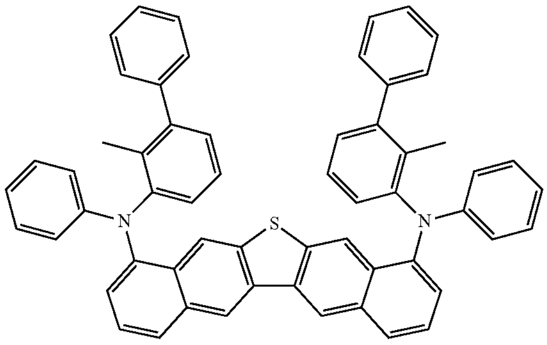
D1-66
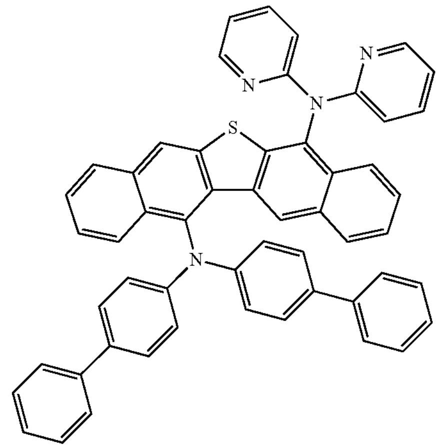
D1-67
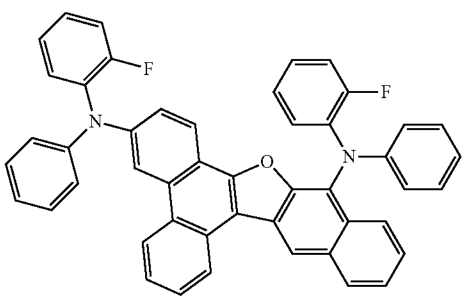
D1-68
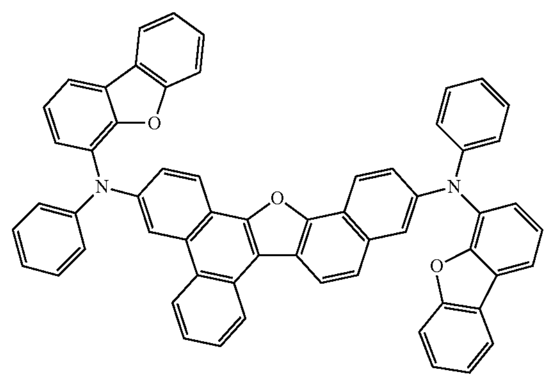
D1-69
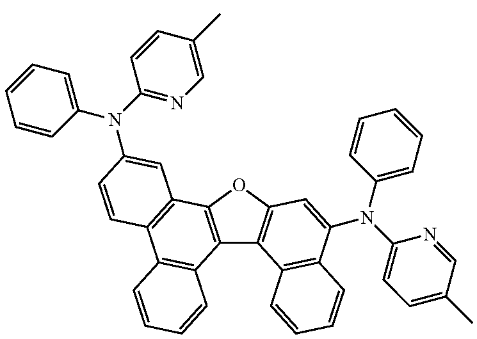
D1-70
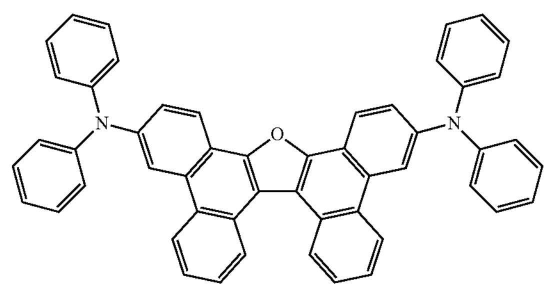
D1-71
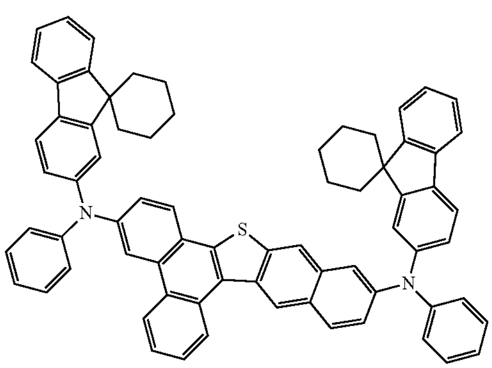
D1-72
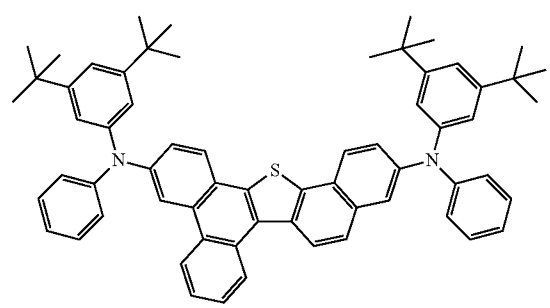

-continued
D1-73
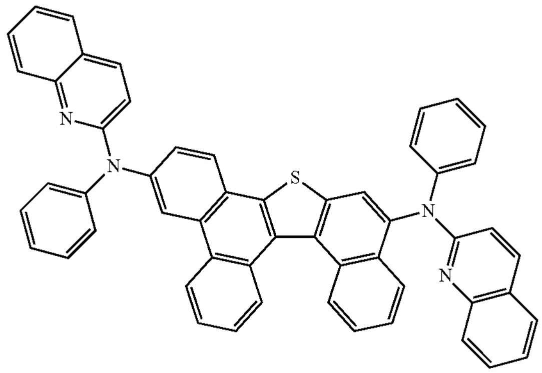
D1-74
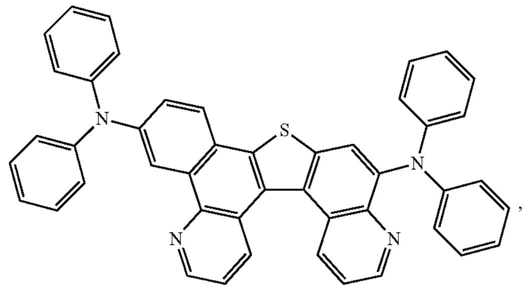
D2-1
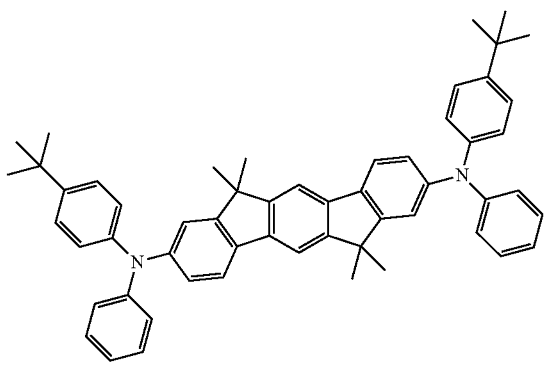
D2-2
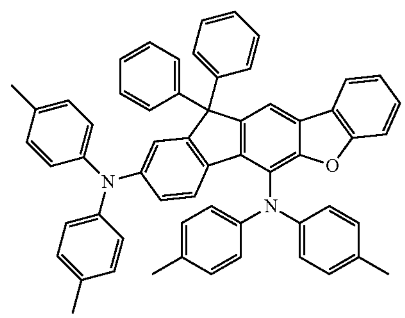
D2-3
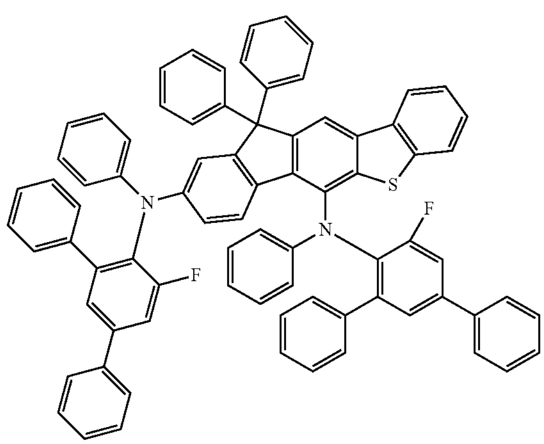
D2-4
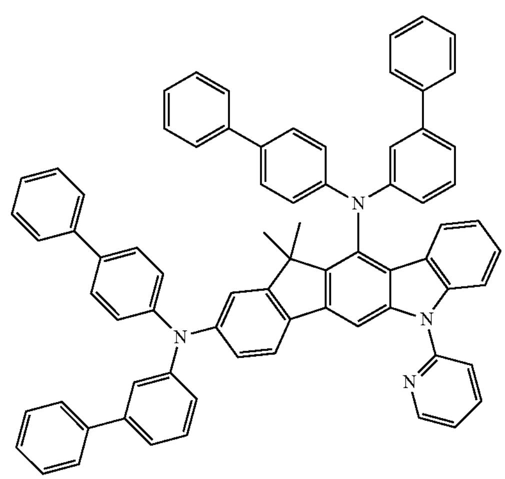

-continued
D2-5
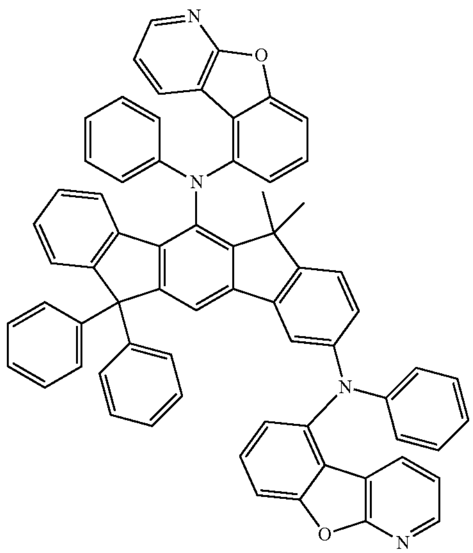
D2-6
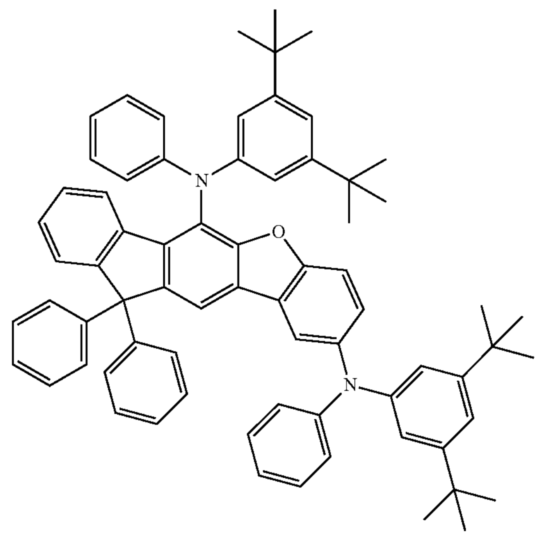
D2-7
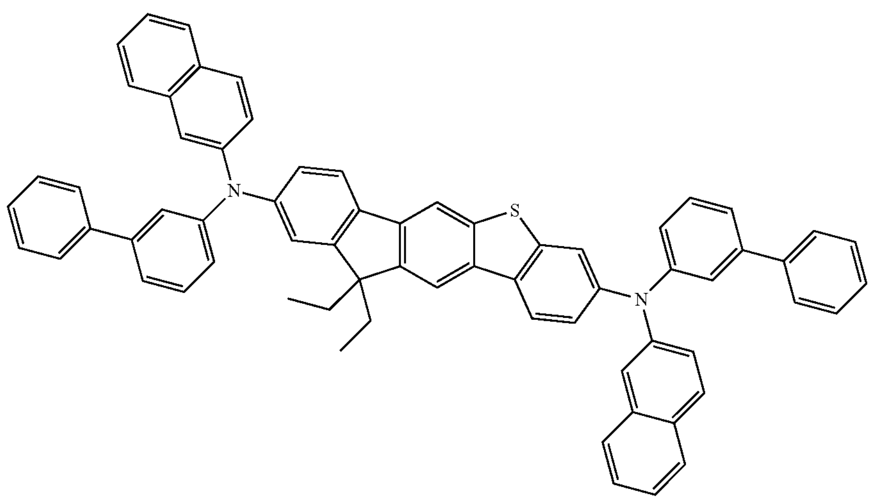
D2-8
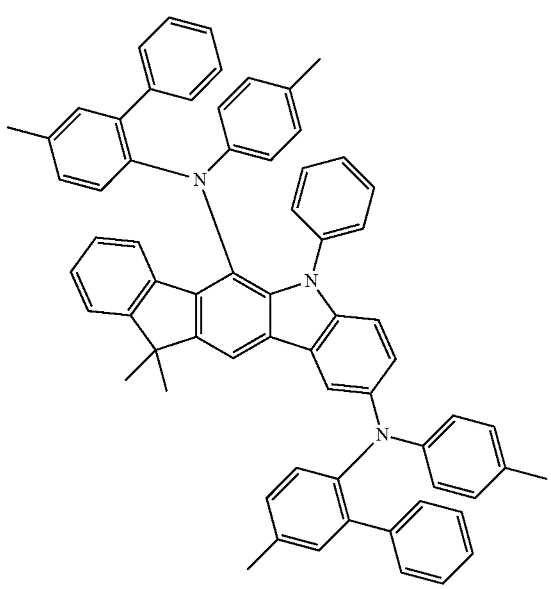
D2-9
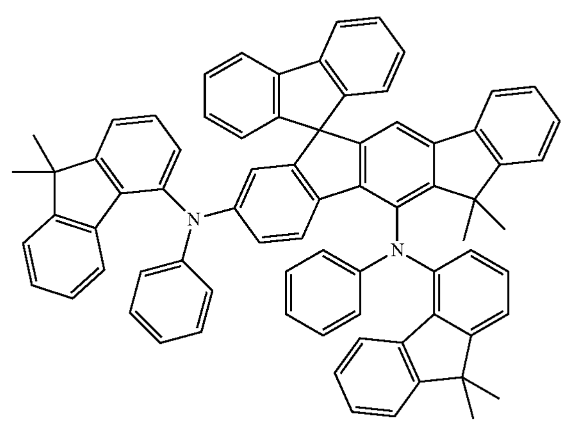

-continued
D2-10
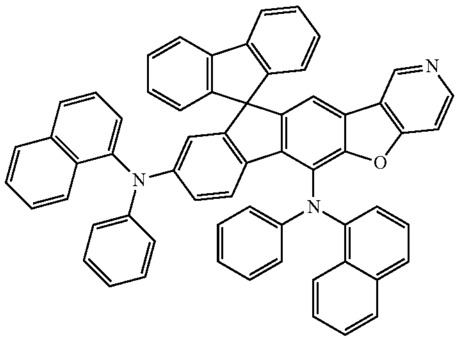
D2-11
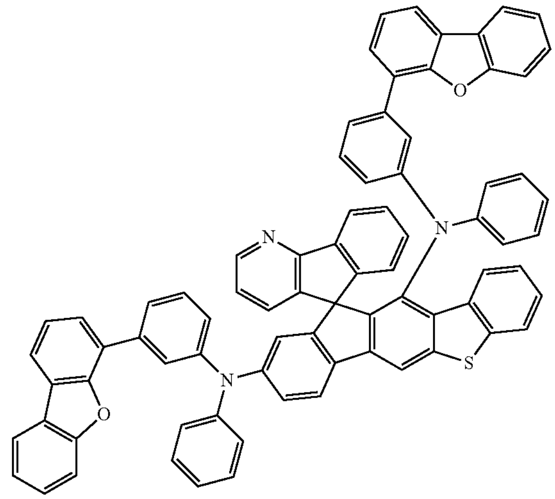
D2-12
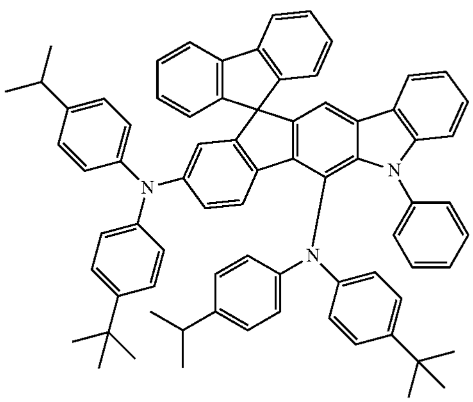
D2-13
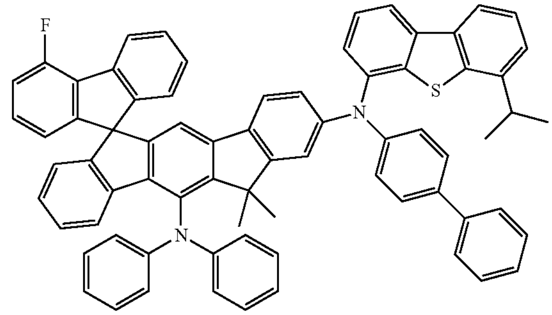
D2-14
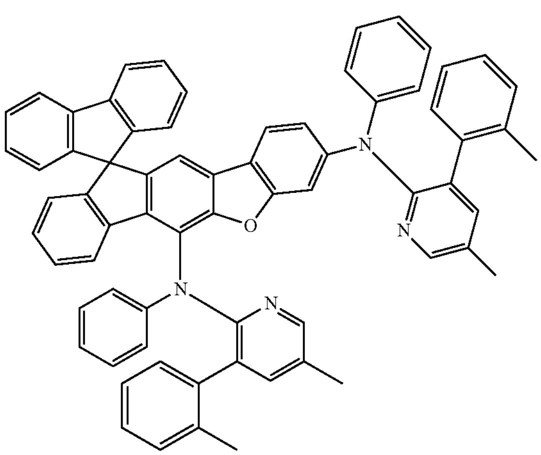
D2-15
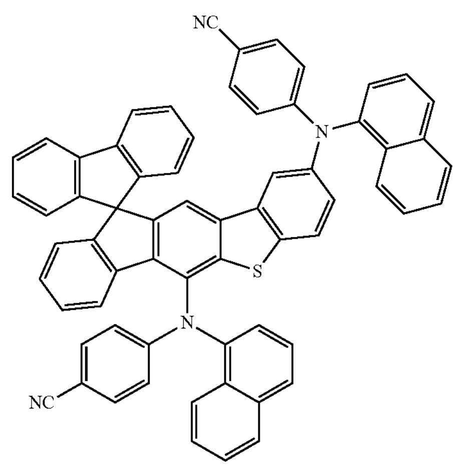

-continued
D2-16
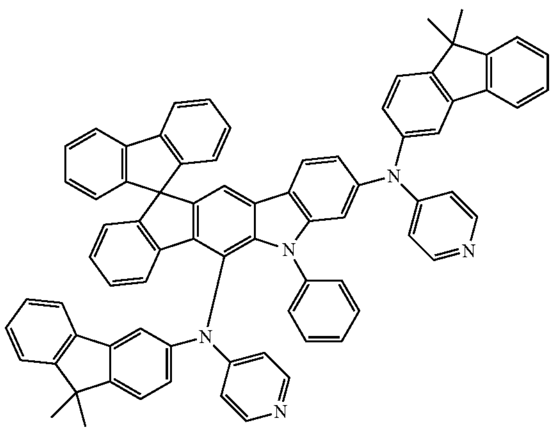
D2-17
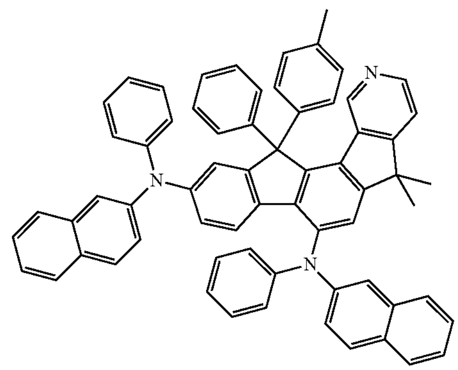
D2-18
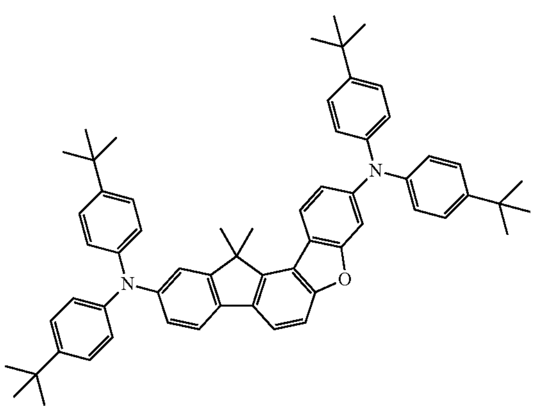
D2-19
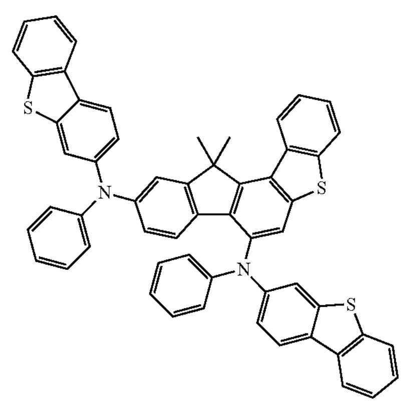
D2-20
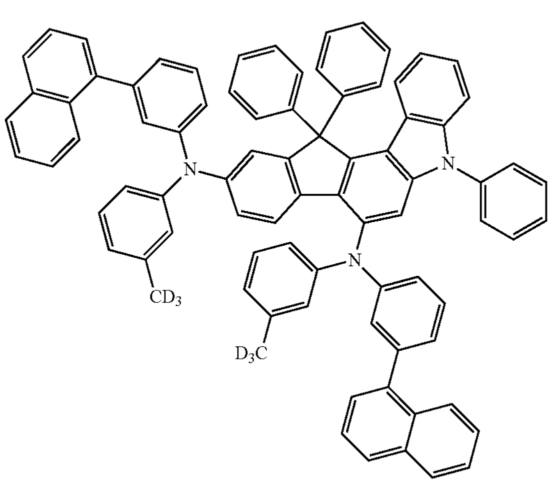
D2-21
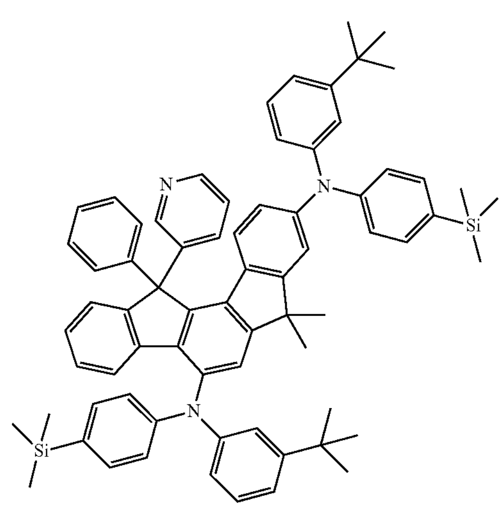

-continued
D2-22
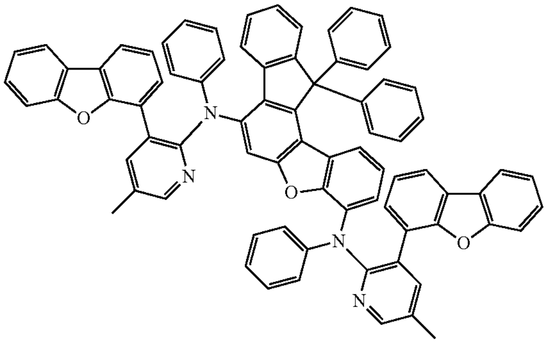
D2-23
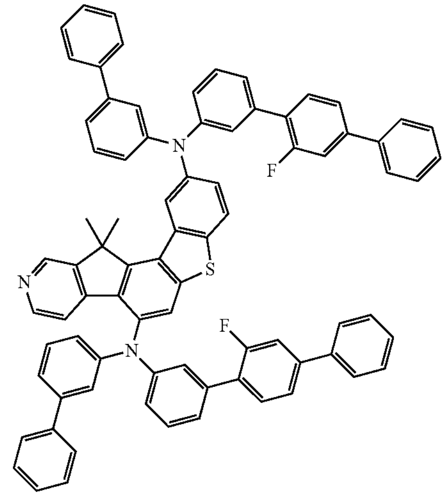
D2-24
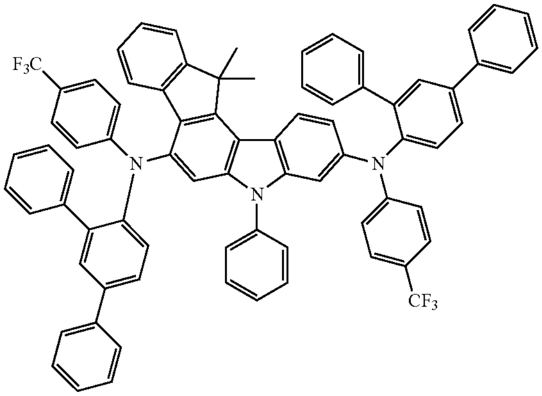
D2-25
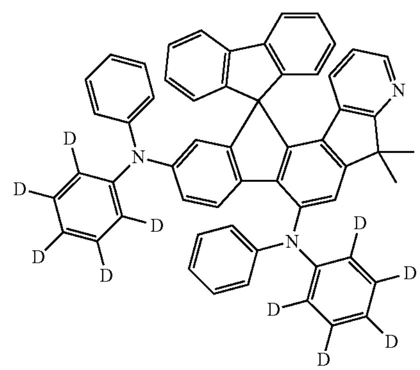
D2-26
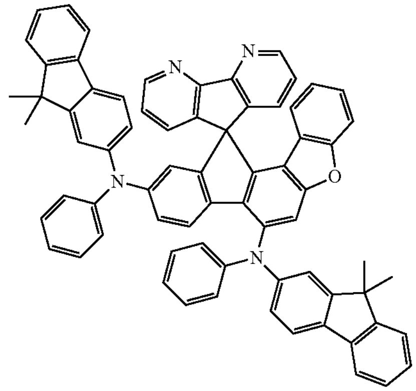
D2-27
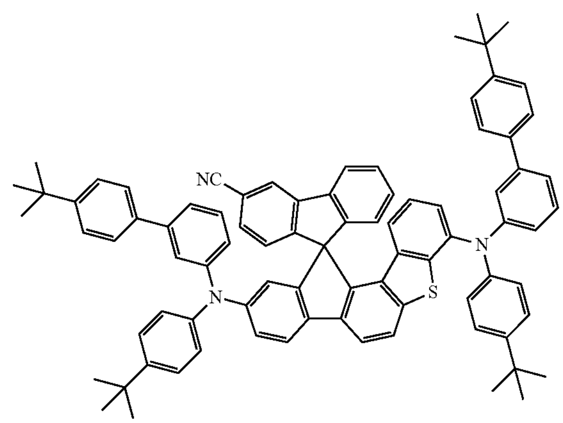

-continued
D2-28
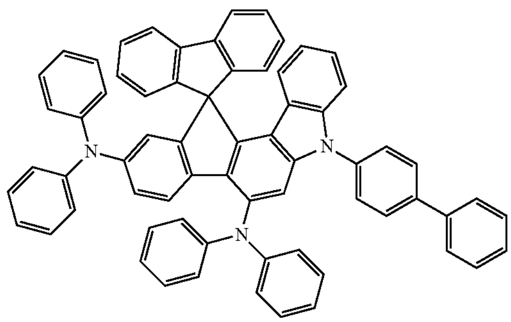
D2-29
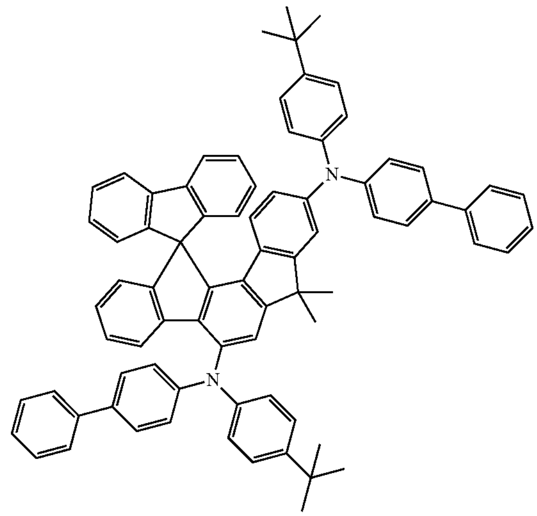
D2-30
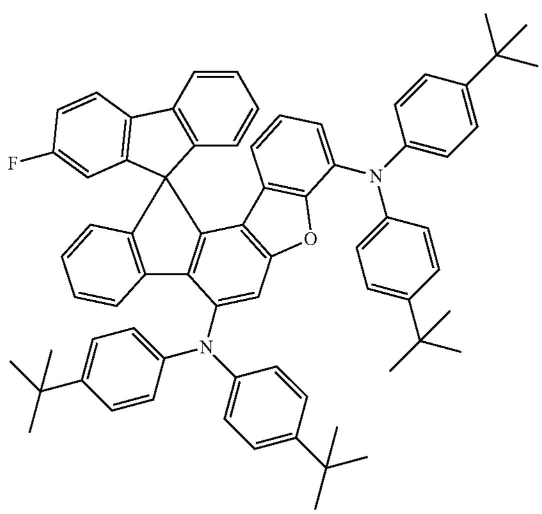
D2-31
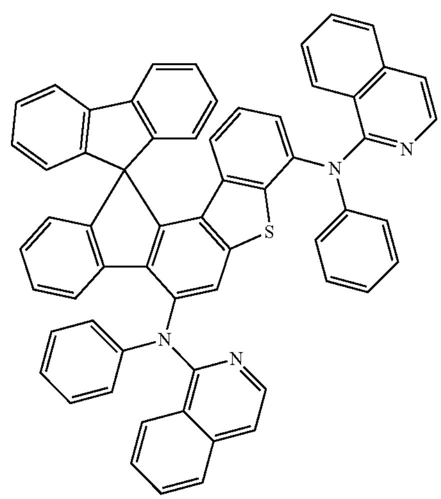
D2-32
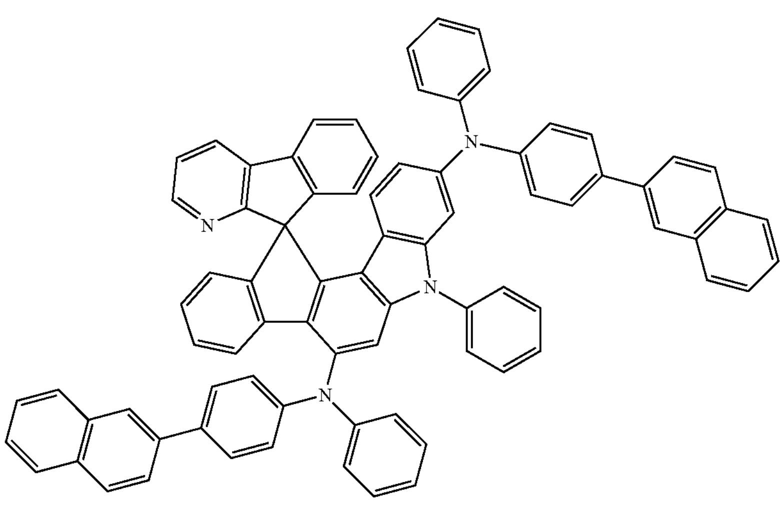

-continued
D2-33
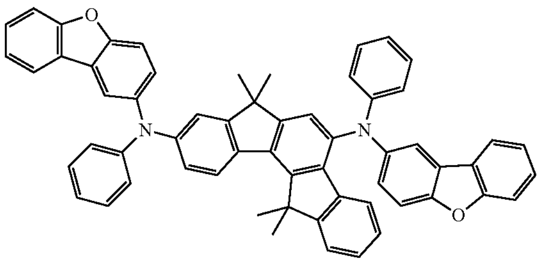
D2-34
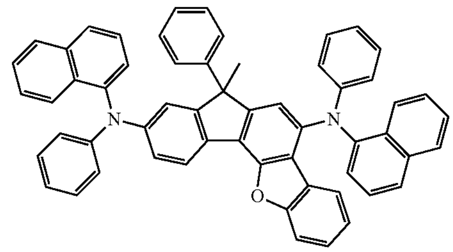
D2-35
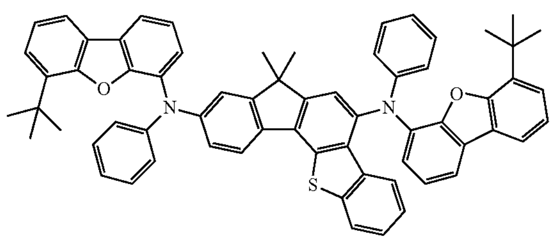
D2-36
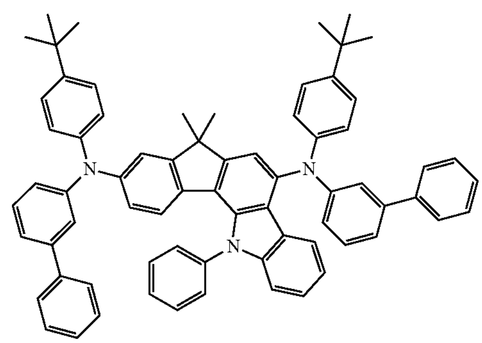
D2-37
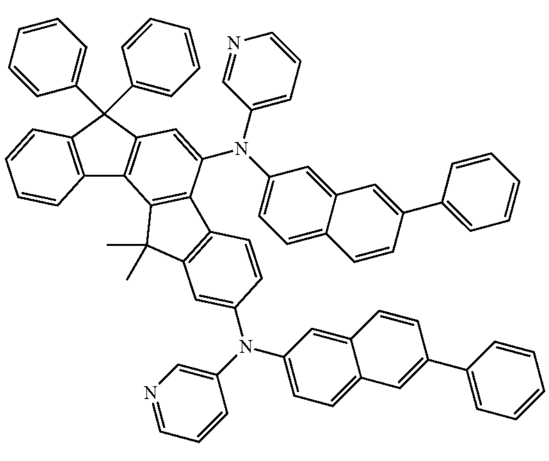
D2-38
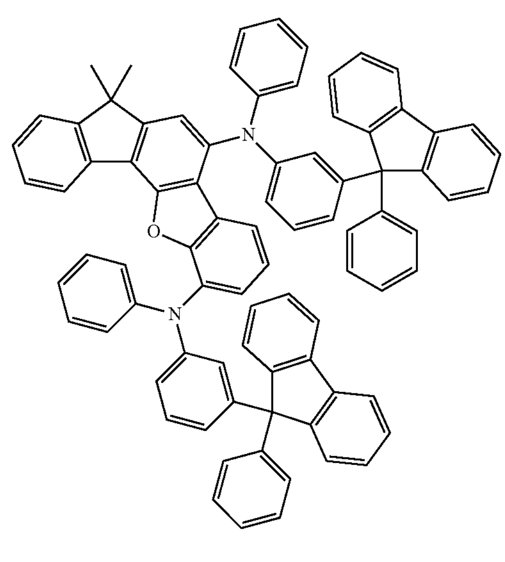

-continued
D2-39
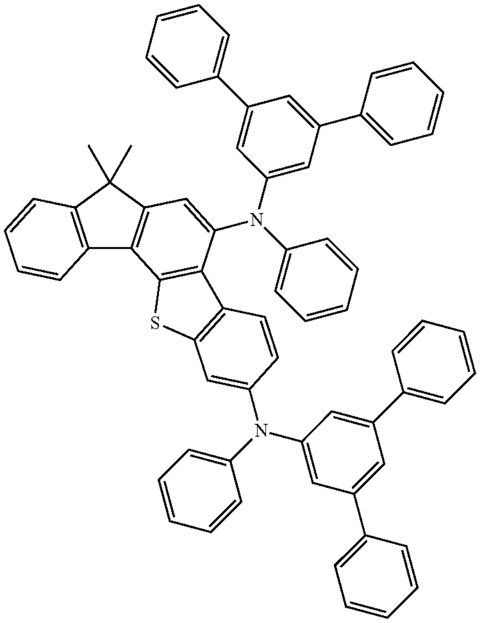
D2-40
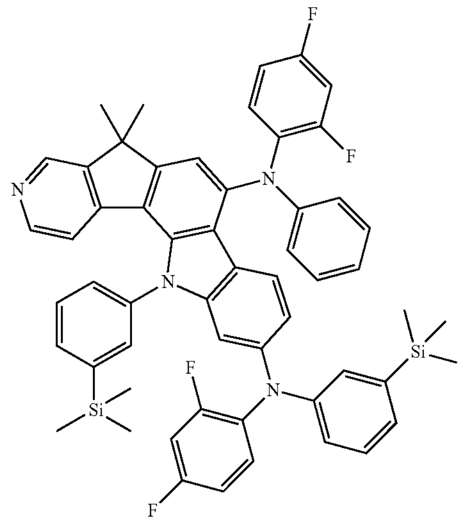
D2-41
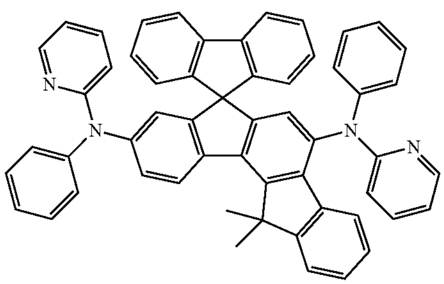
D2-42
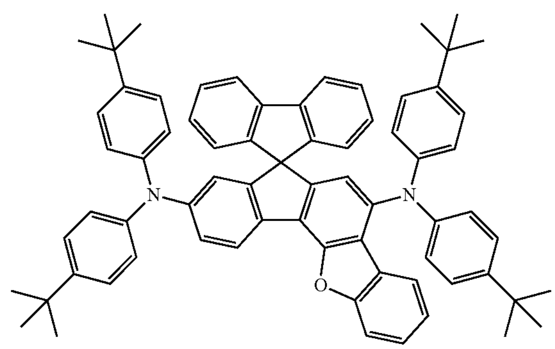
D2-43
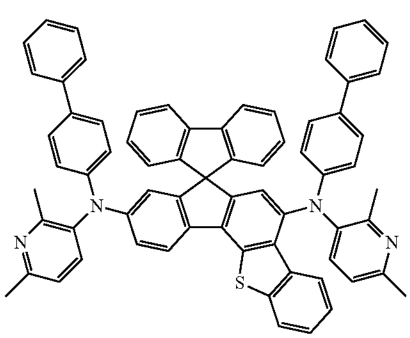
D2-44
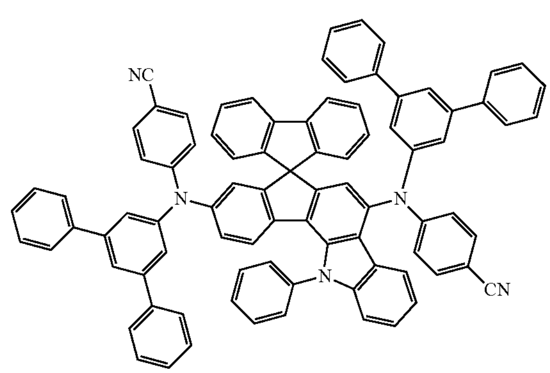

-continued
D2-45
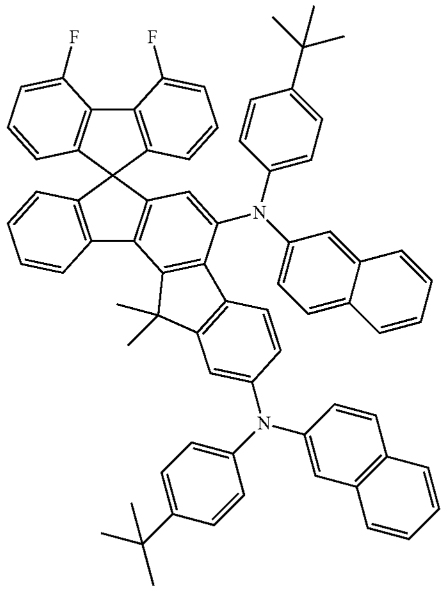
D2-46
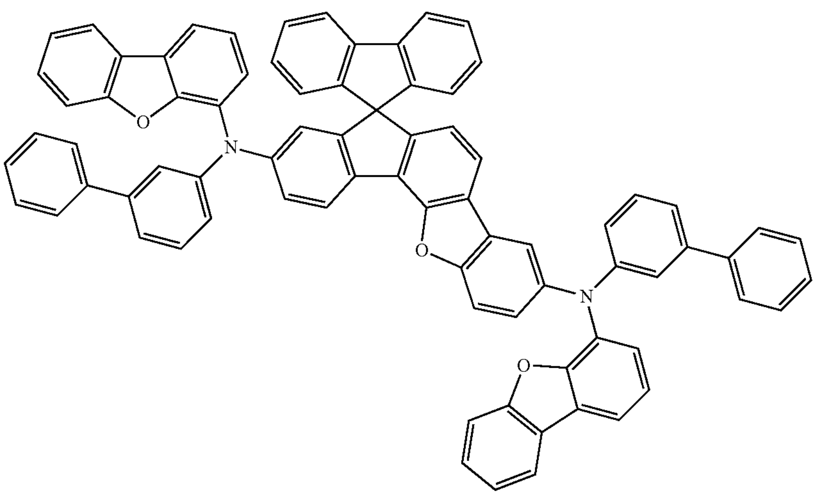
D2-48
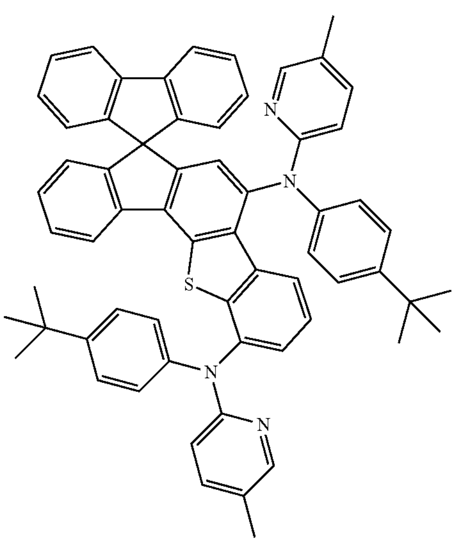
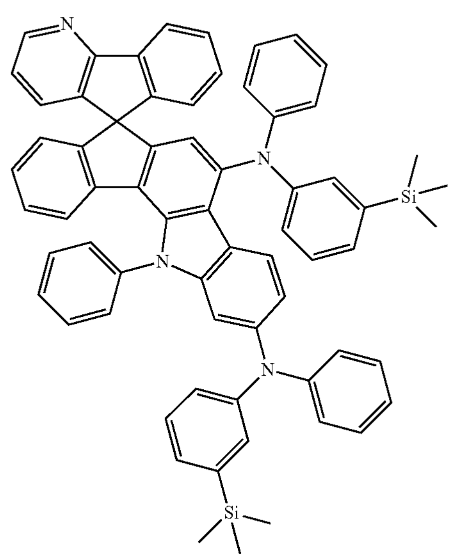

-continued
D2-49
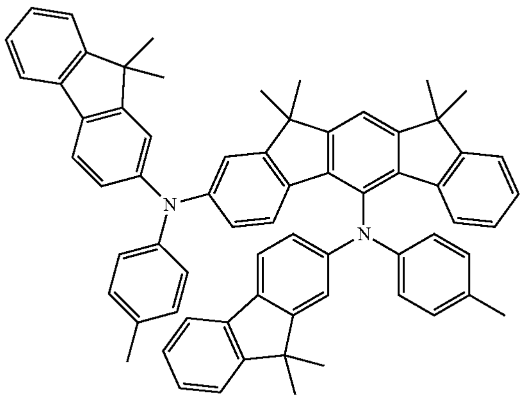
D2-50
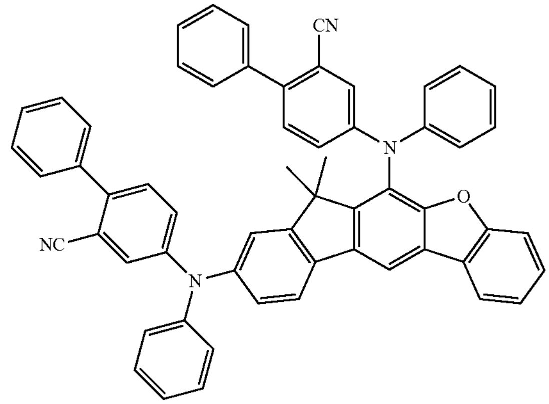
D2-51
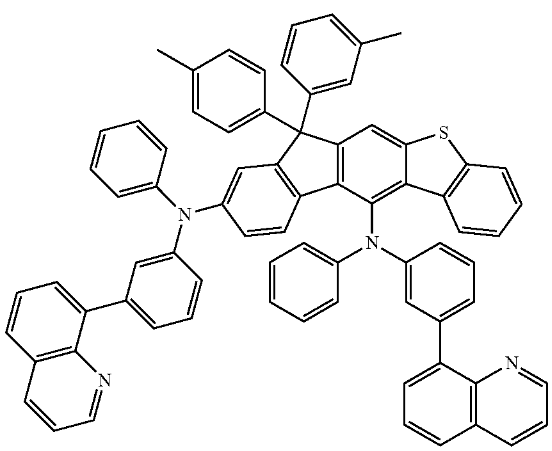
D2-52
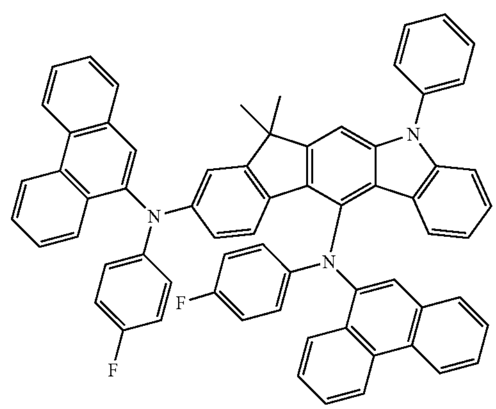
D2-53
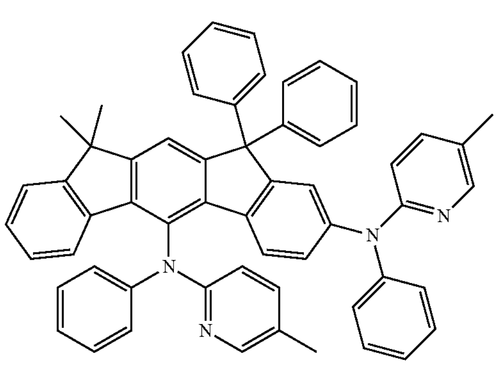
D2-54
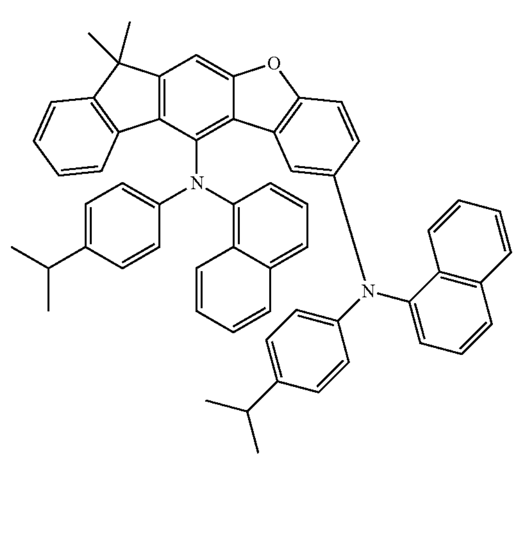

-continued
D2-55
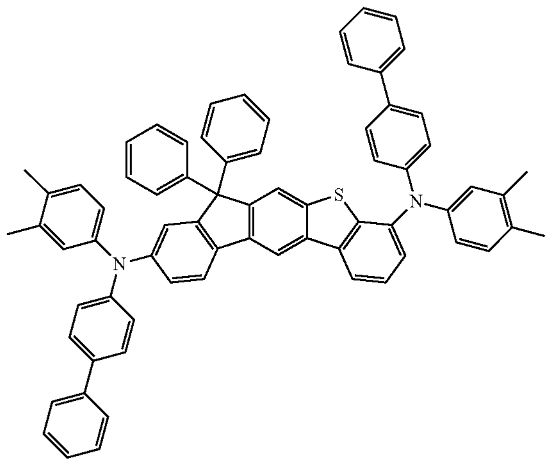
D2-56
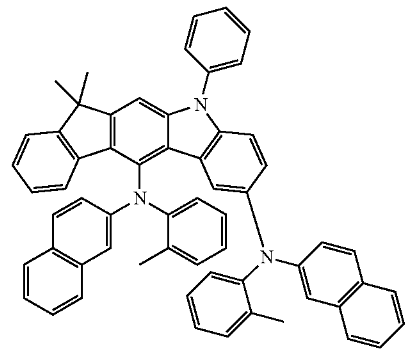
D2-57
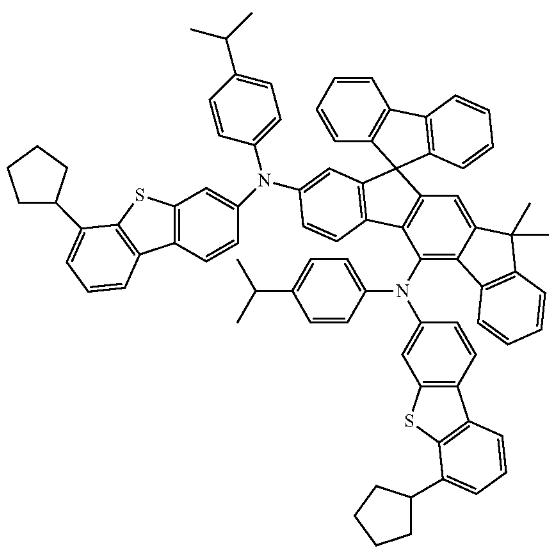
D2-58
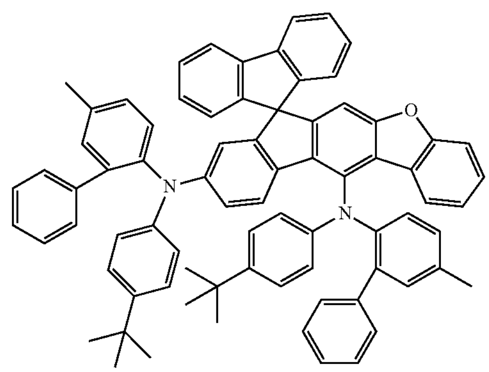
D2-59
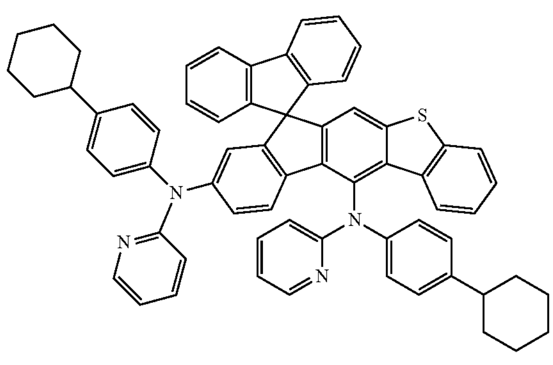
D2-60
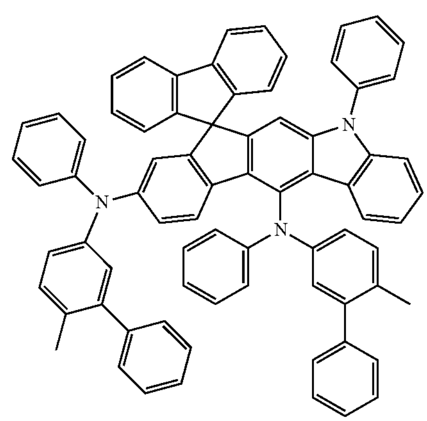

-continued
D2-61
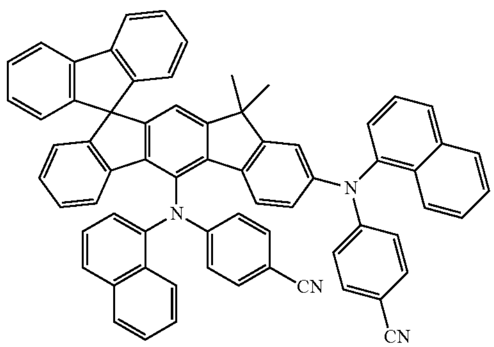
D2-62
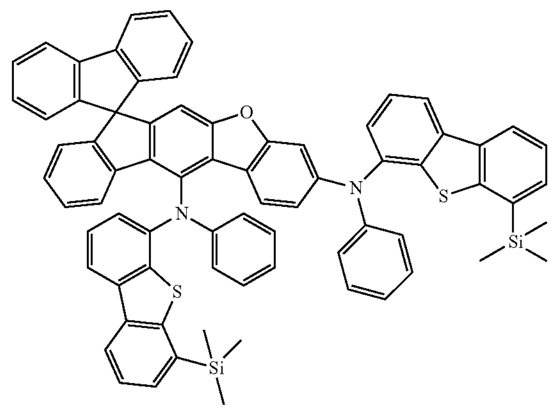
D2-63
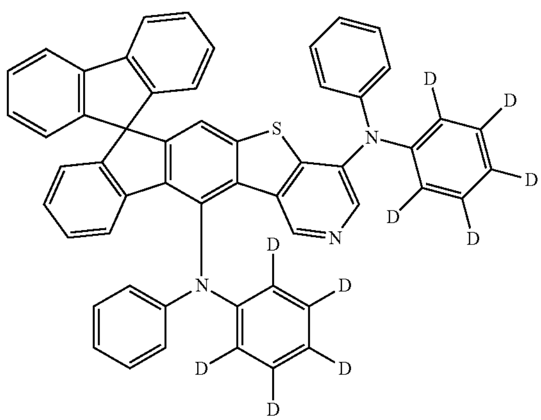
D2-64
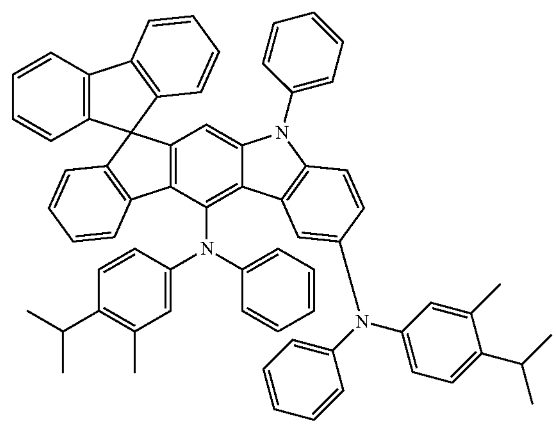
D2-65
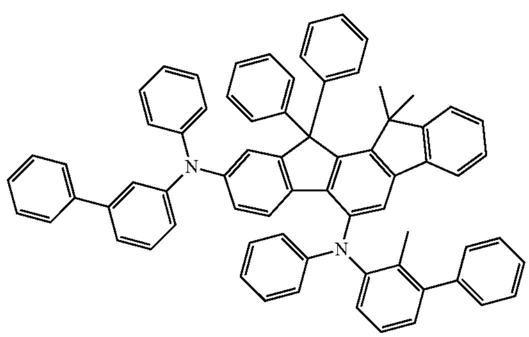
D2-66
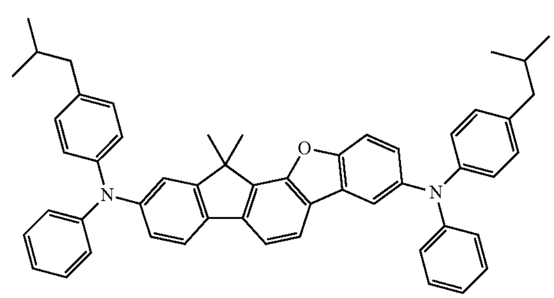

-continued
D2-67
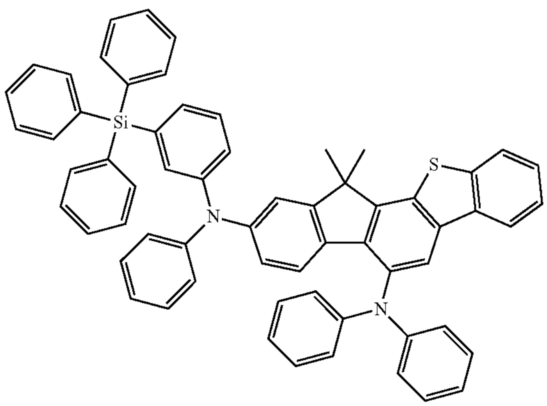
D2-68
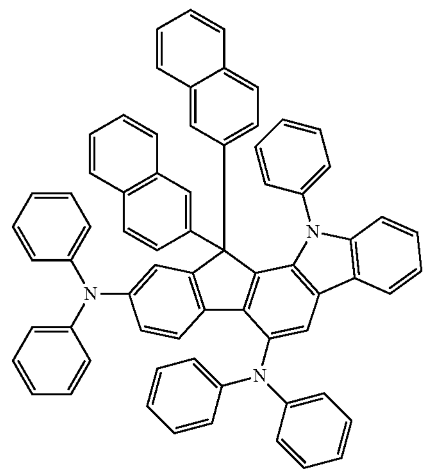
D2-69
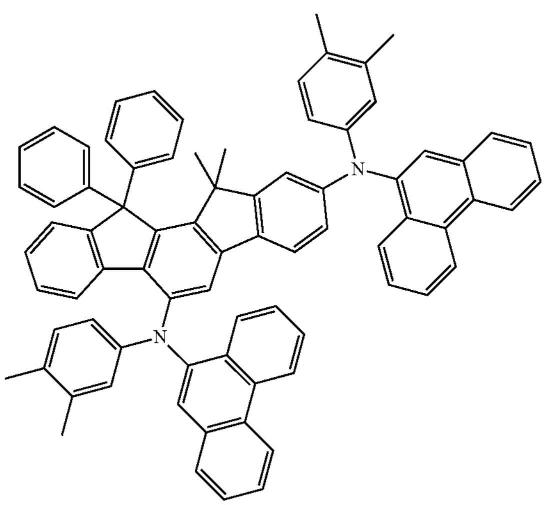
D2-70
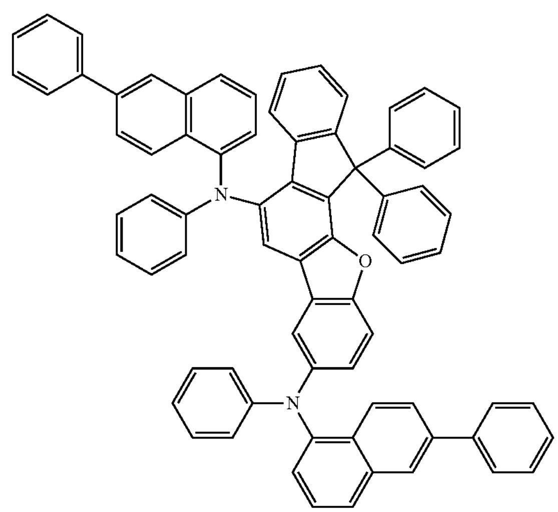
D2-71
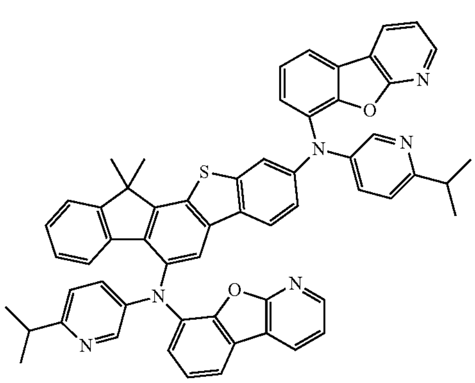
D2-72
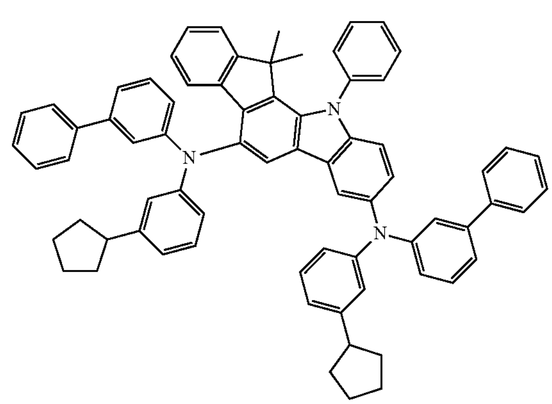

-continued
D2-73
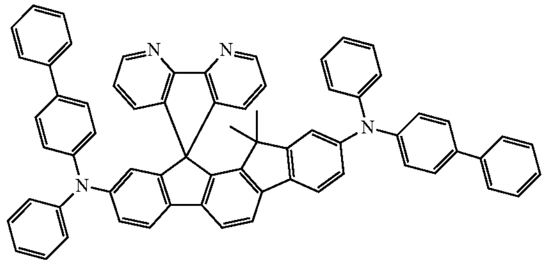
D2-74
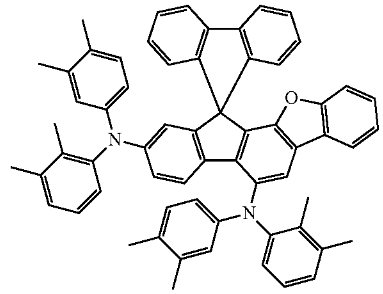
D2-75
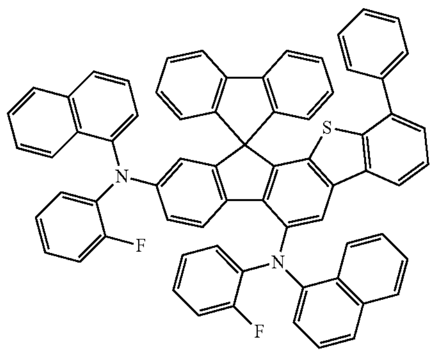
D2-76
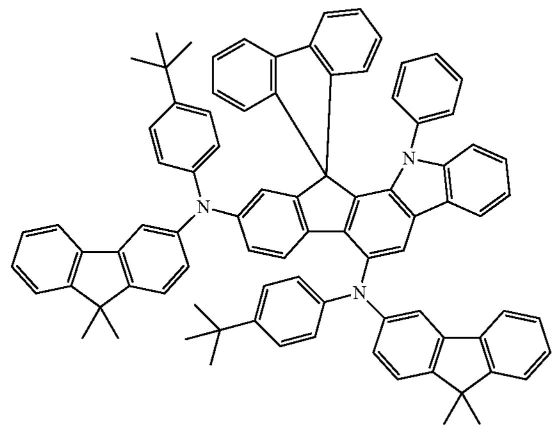
D2-77
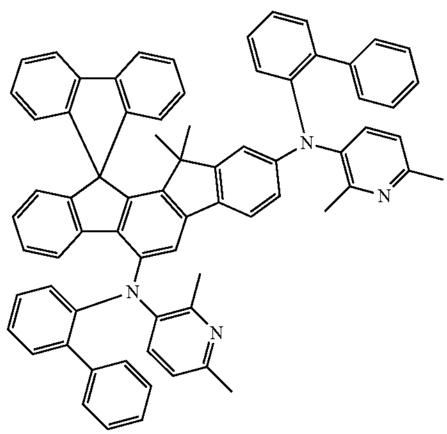
D2-78
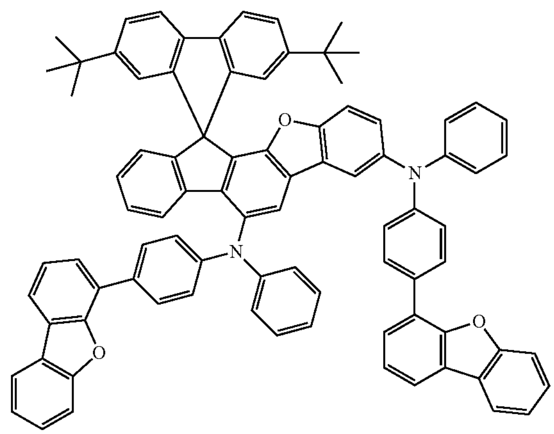
D2-79
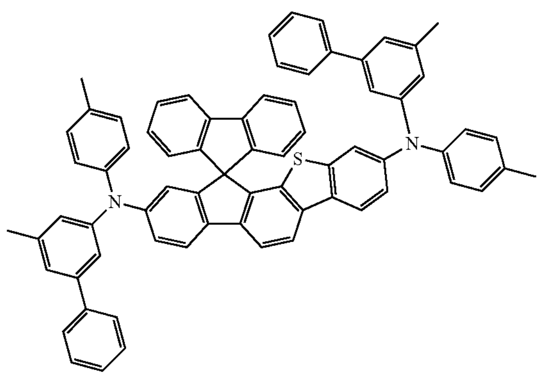
D2-80
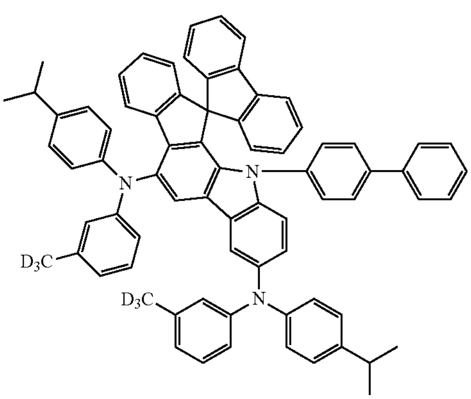

-continued
D2-81
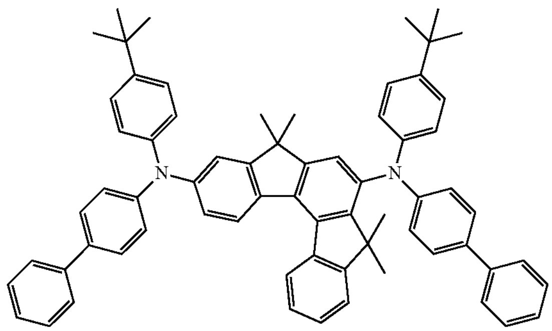
D2-82
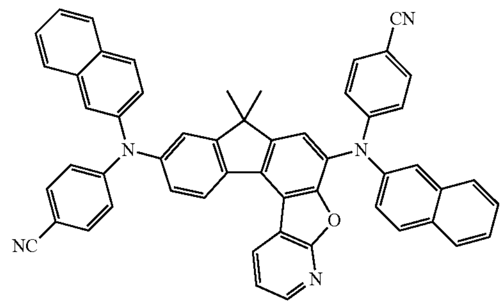
D2-83
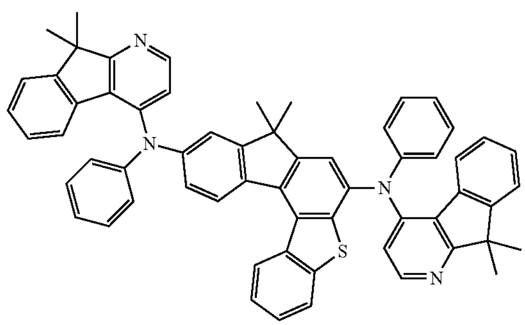
D2-84
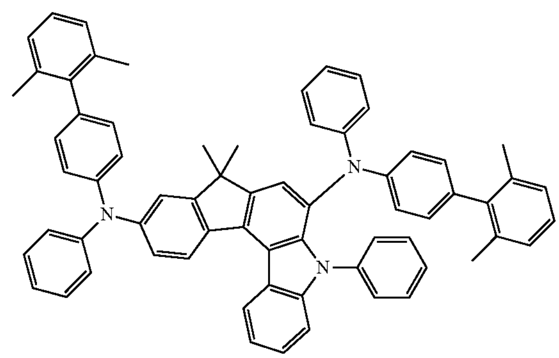
D2-85
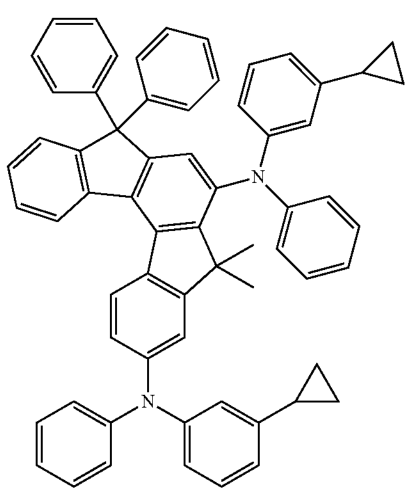
D2-86
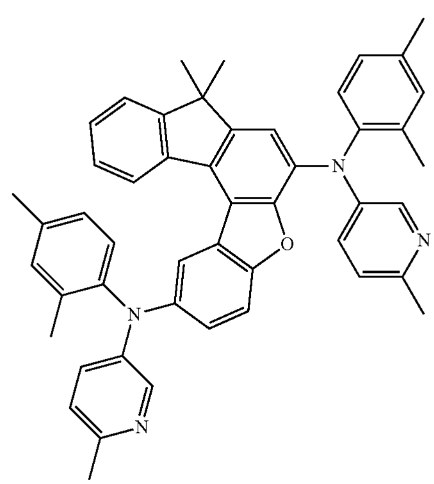

-continued
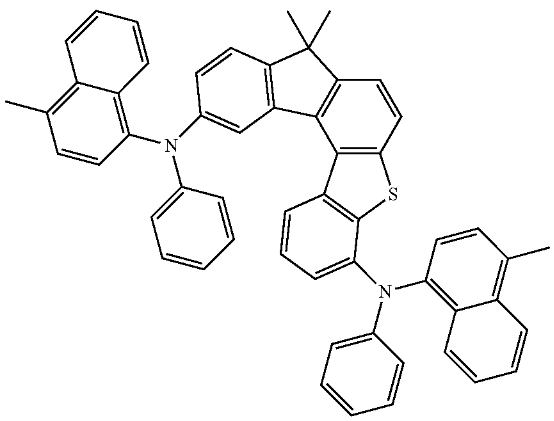
D2-87
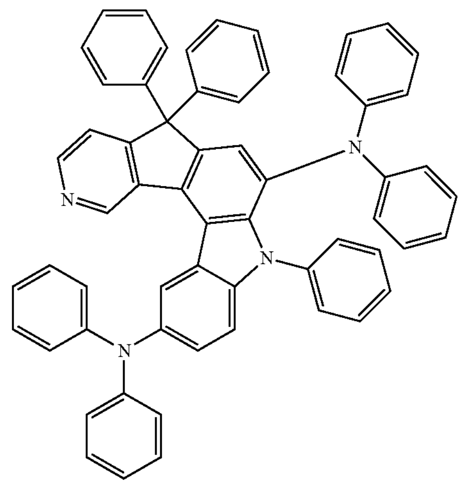
D2-88
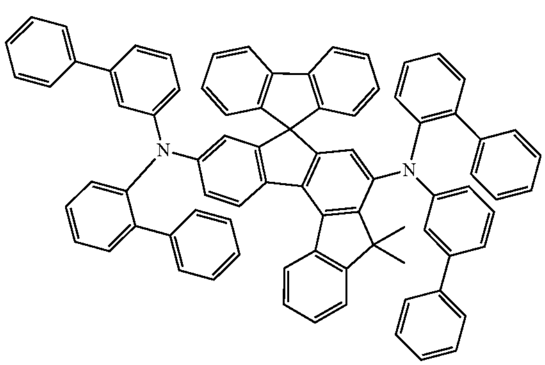
D2-89
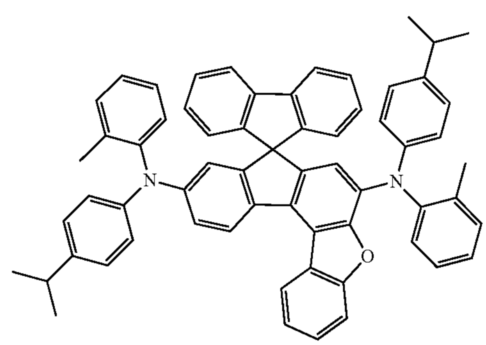
D2-90
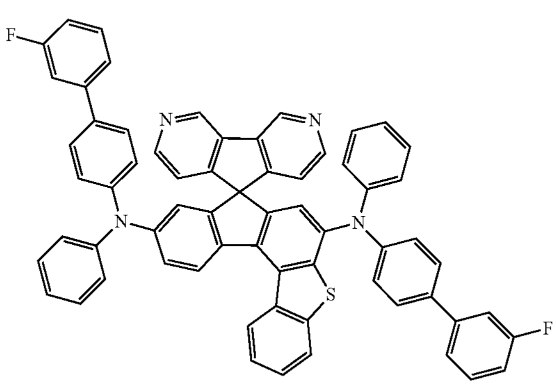
D2-91
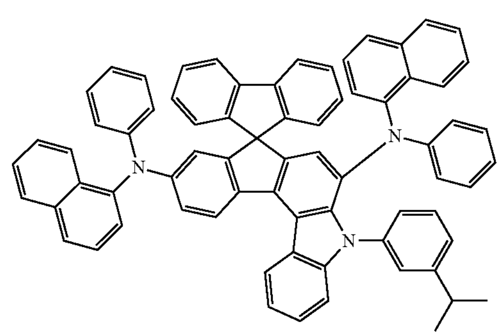
D2-92

-continued
D2-93
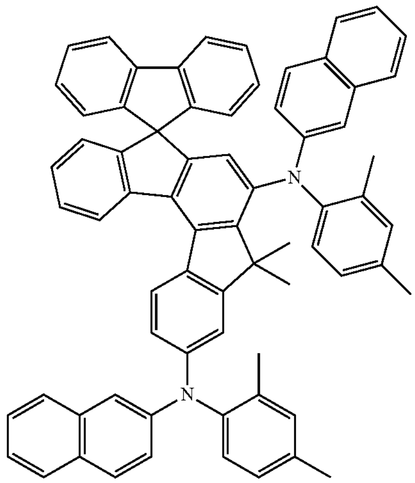
D2-94
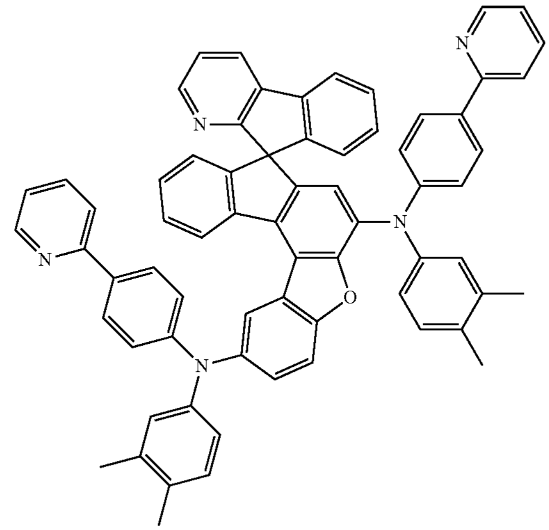
D2-95
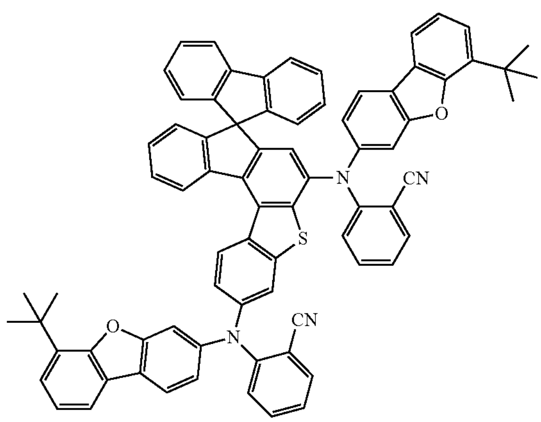
D2-96
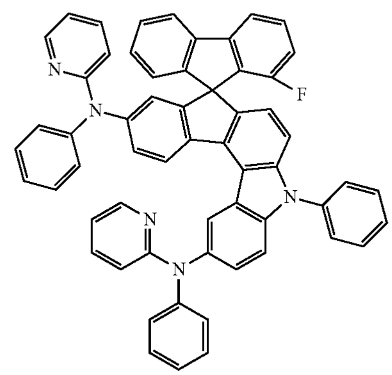
D2-97
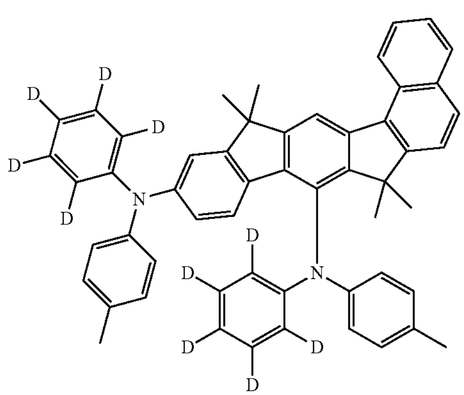
D2-98
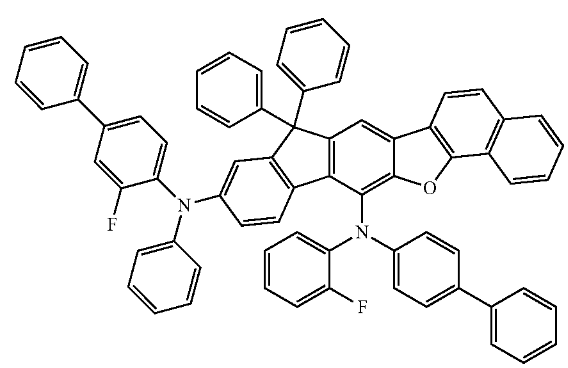

-continued
D2-99
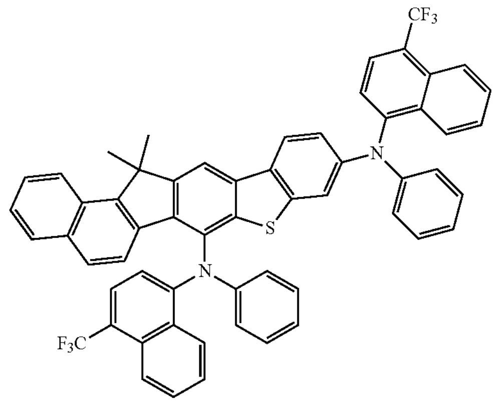
D2-100
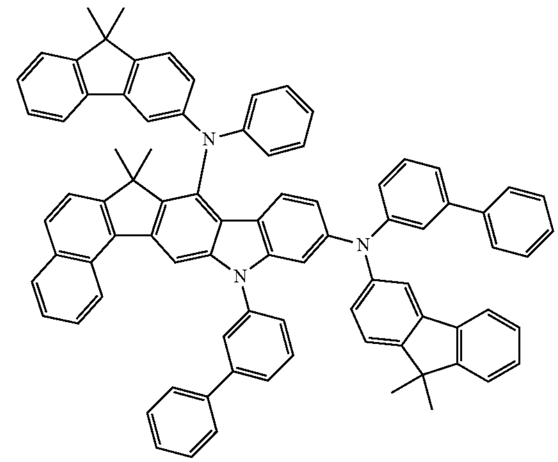
D2-101
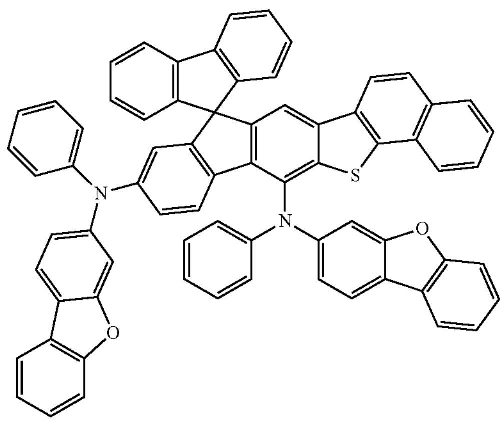
D2-102
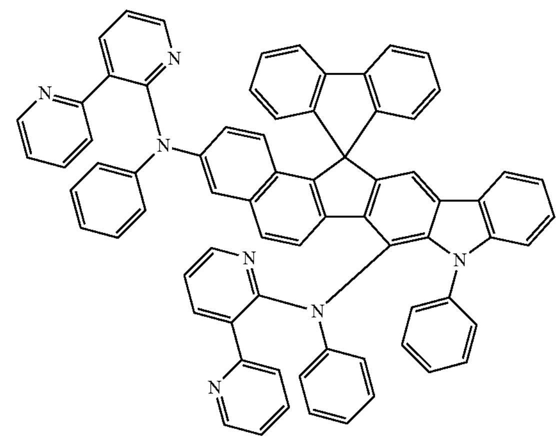
D2-103
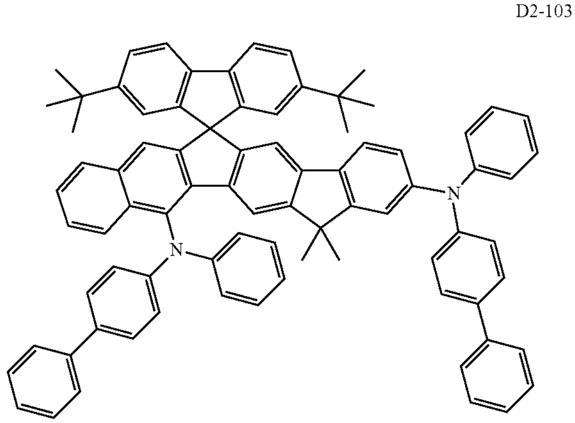
D2-104
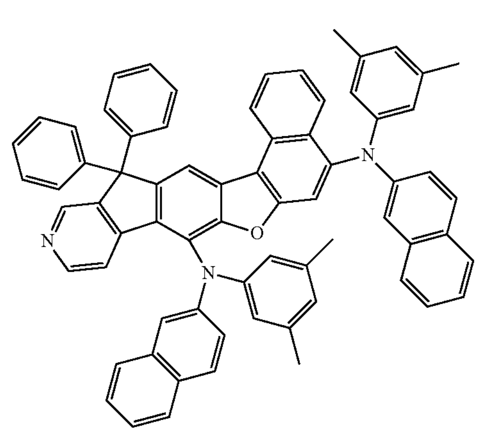

-continued
D2-105
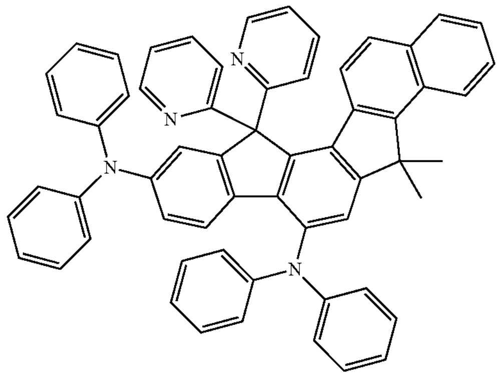
D2-106
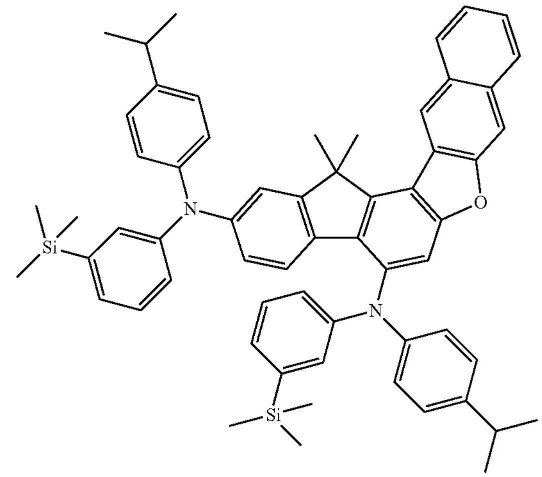
D2-107
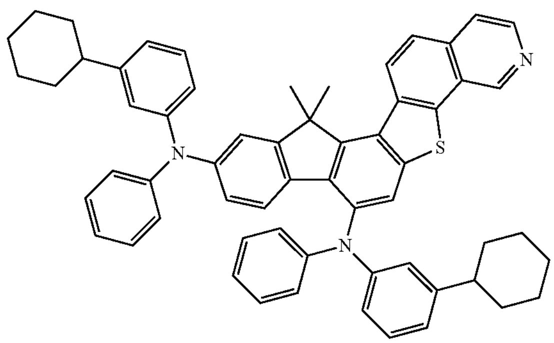
D2-108
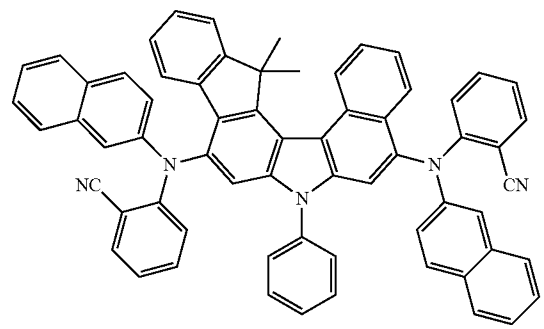
D2-109
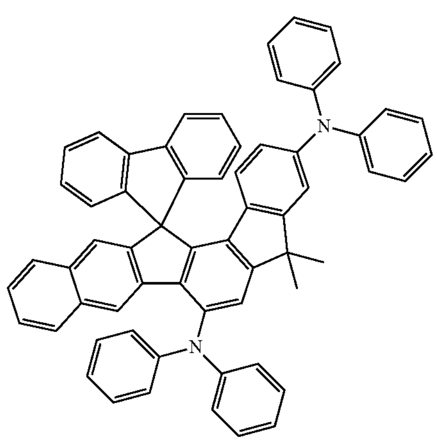
D2-110
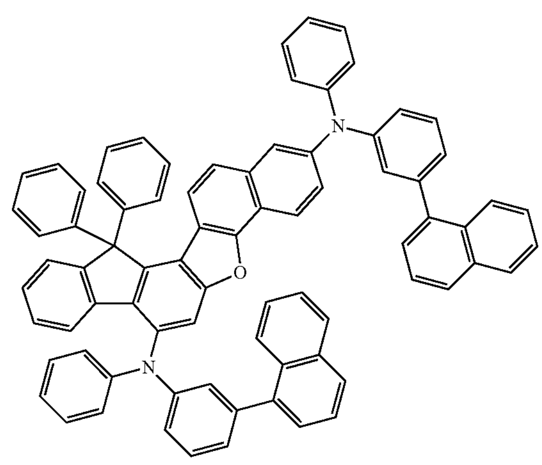

-continued
D2-111
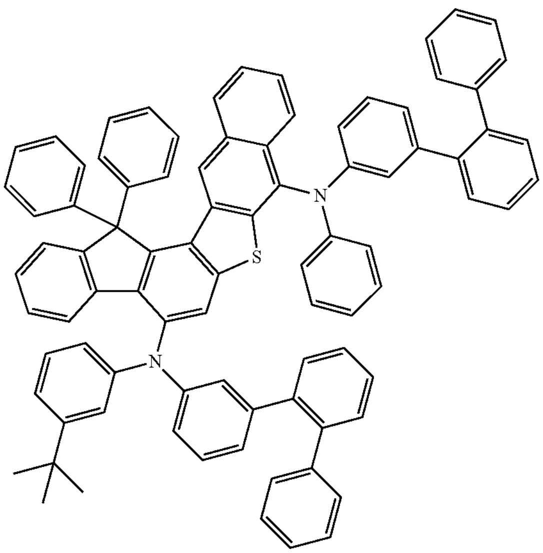
D2-112
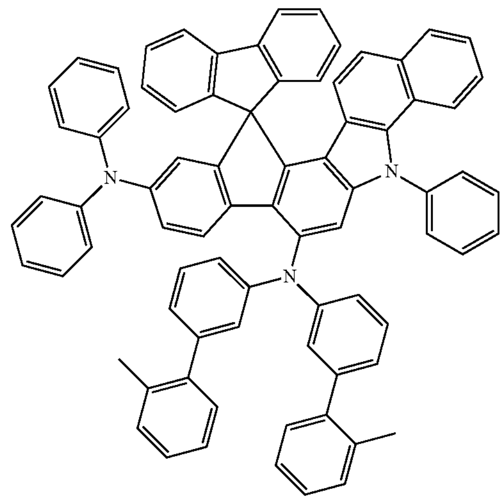
D2-113
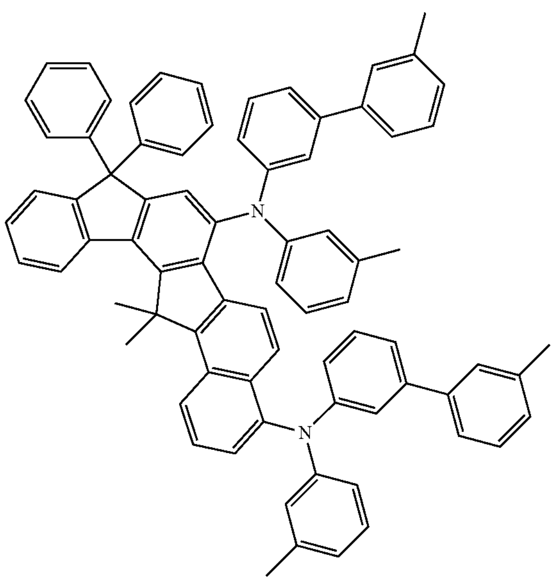
D2-114
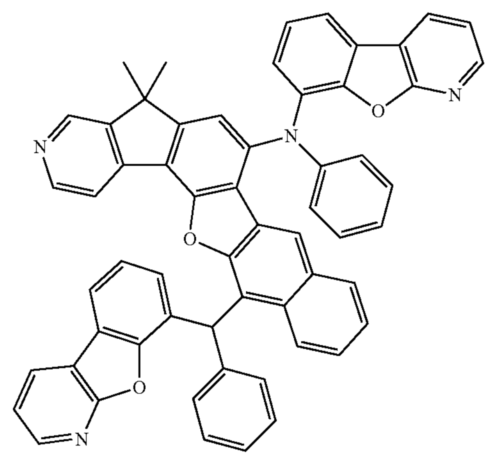
D2-115
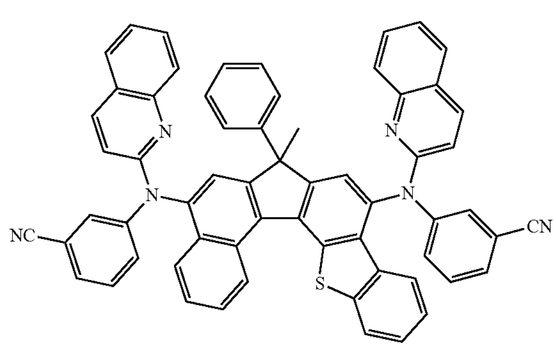
D2-116
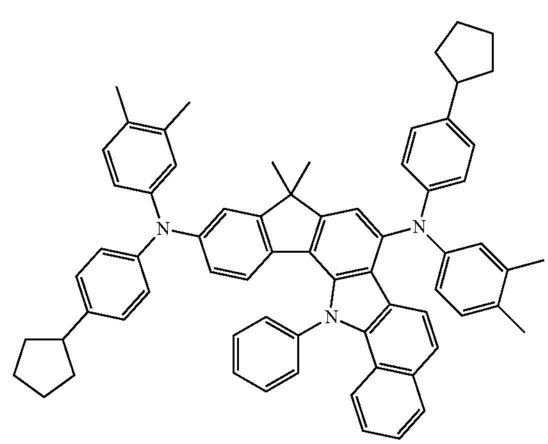

-continued
D2-117
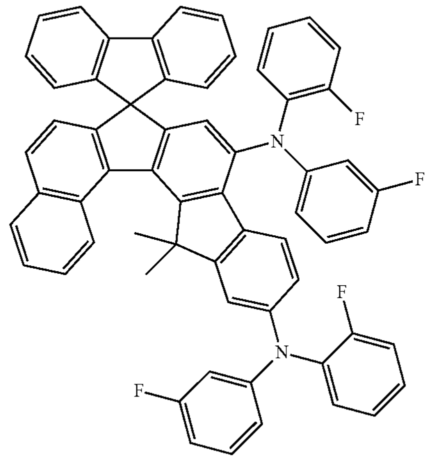
D2-118
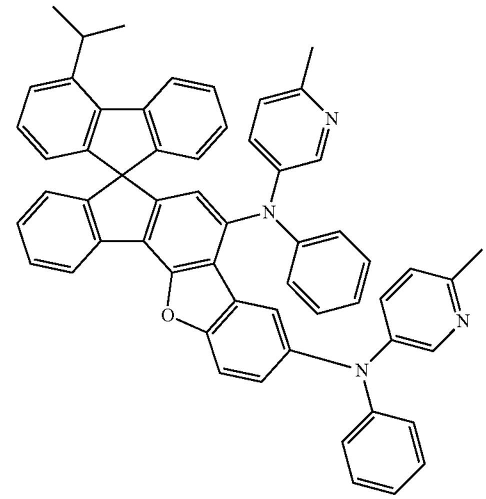
D2-119
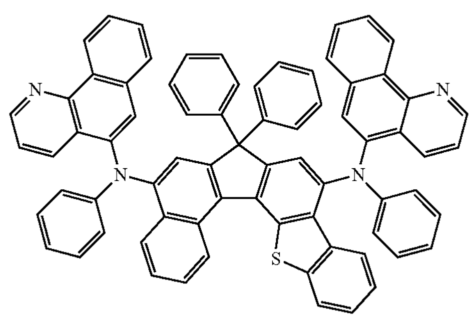
D2-120
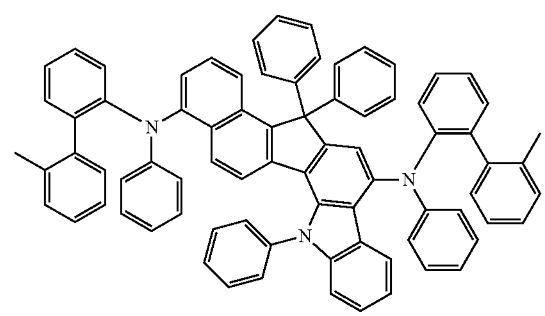
D2-121
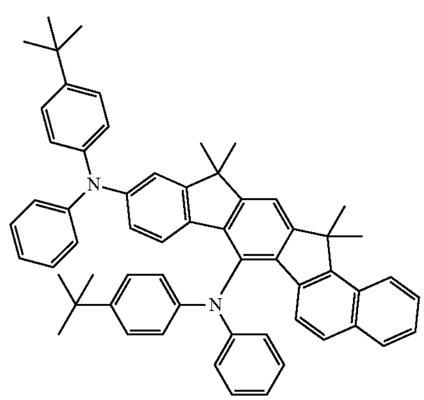
D2-122
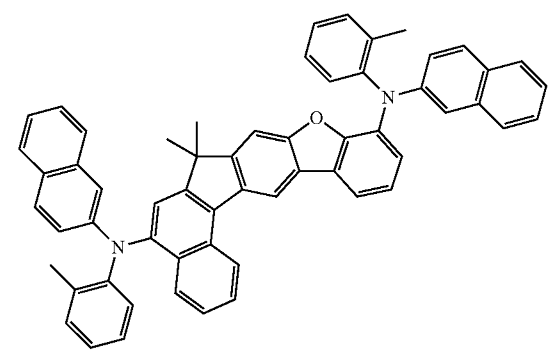
D2-123
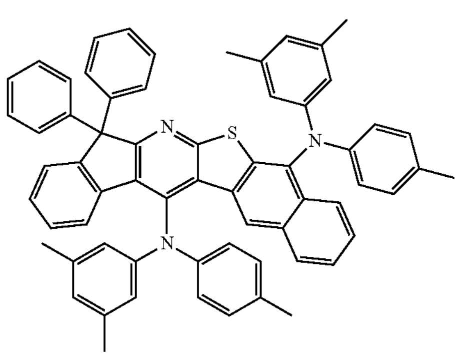
D2-124
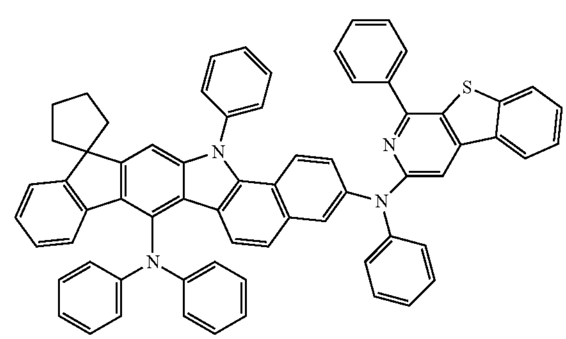

-continued
D2-125
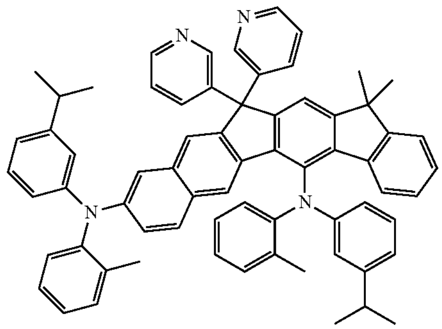
D2-126
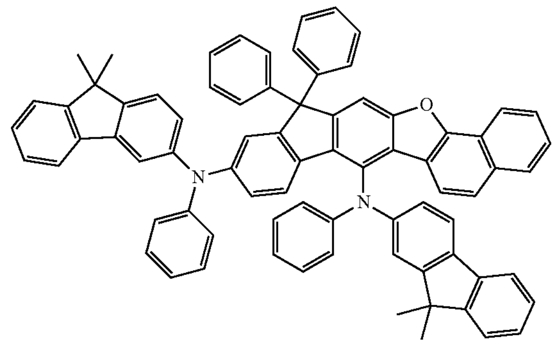
D2-127
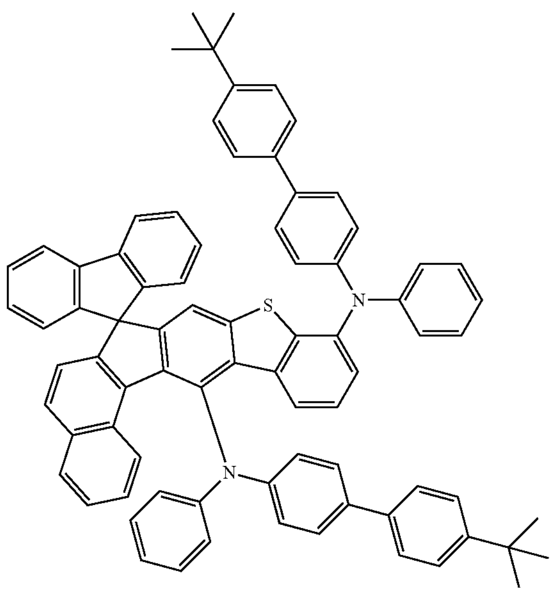
D2-128
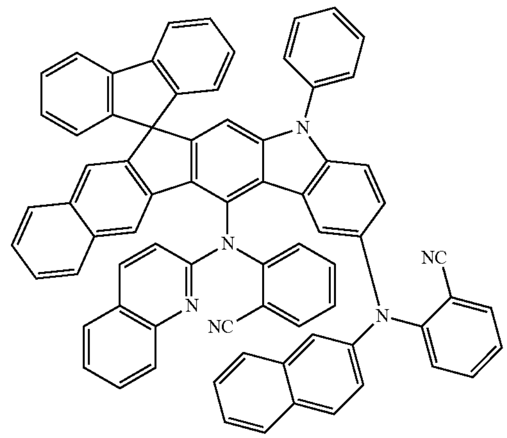
D2-129
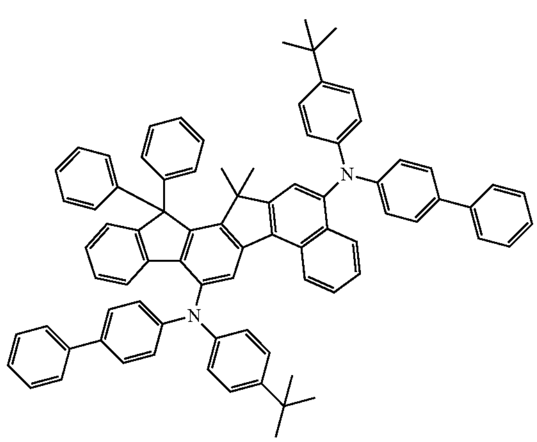
D2-130
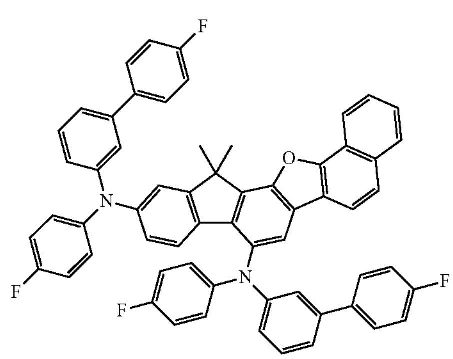

-continued
D2-131
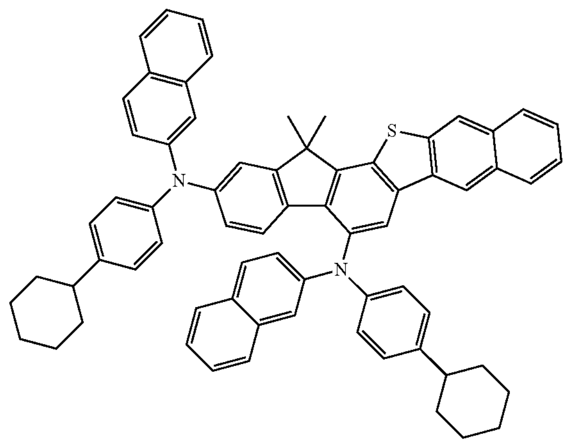
D2-132
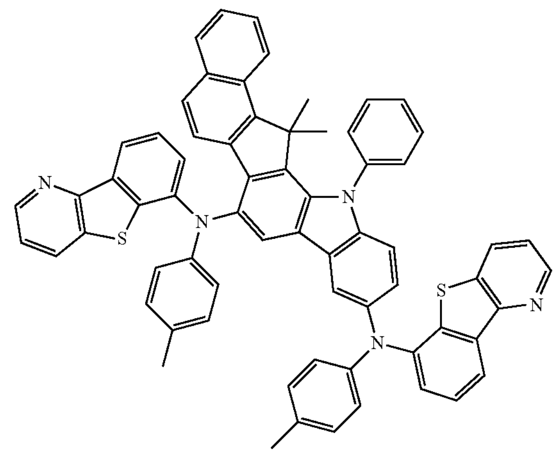
D2-133
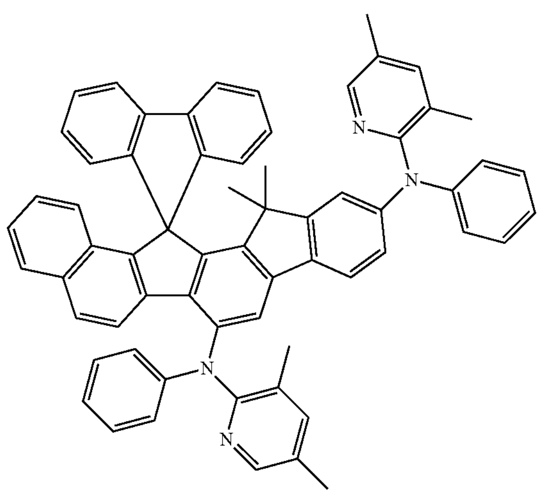
D2-134
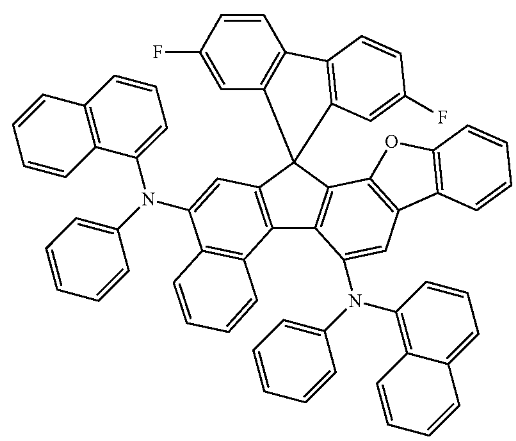
D2-135
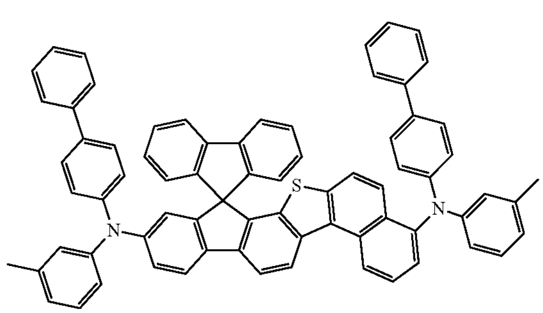
D2-136
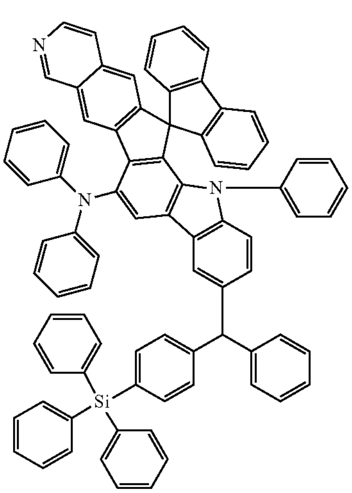

-continued
D2-137
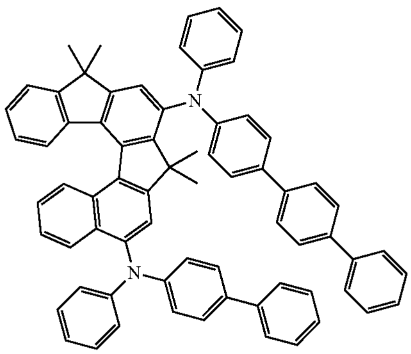
D2-138
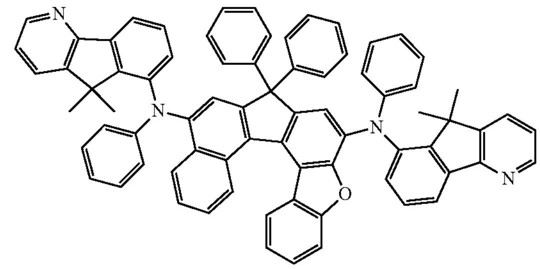
D2-139
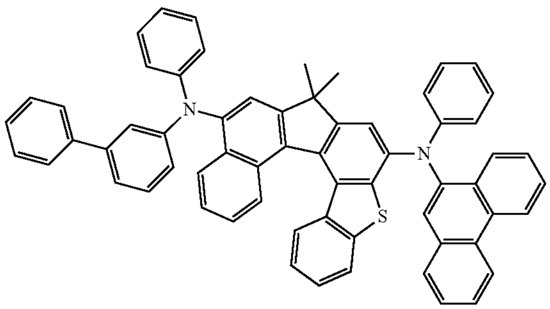
D2-140
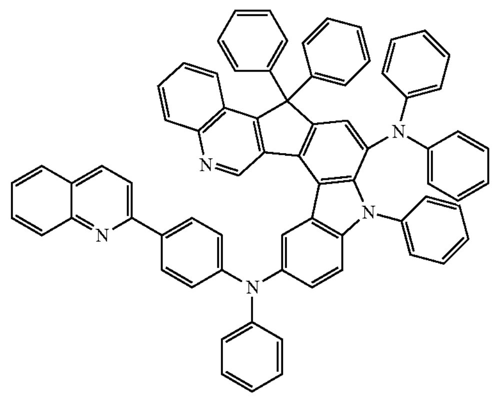
D2-141
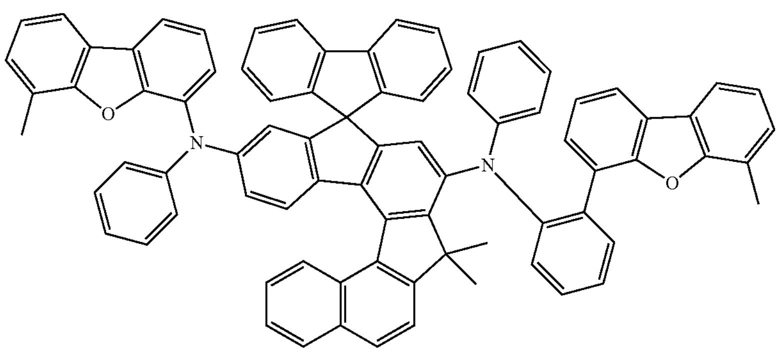
D2-142
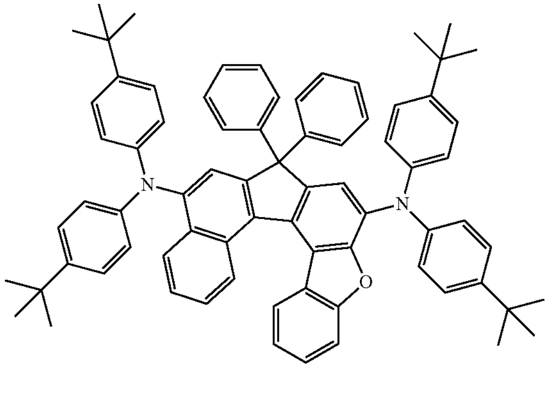
D2-143
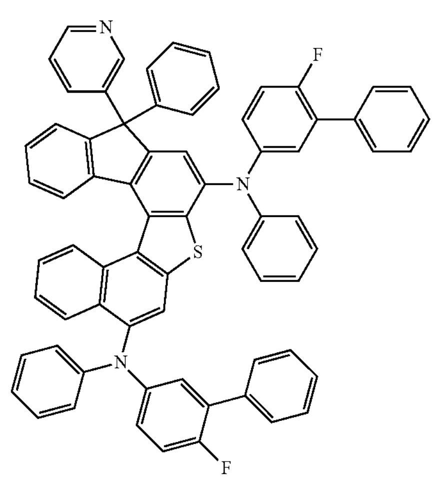

-continued
D2-144
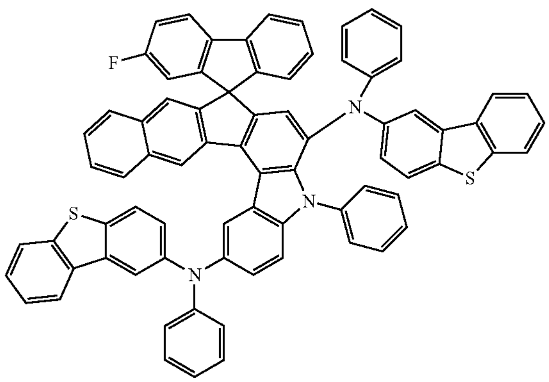
D2-145
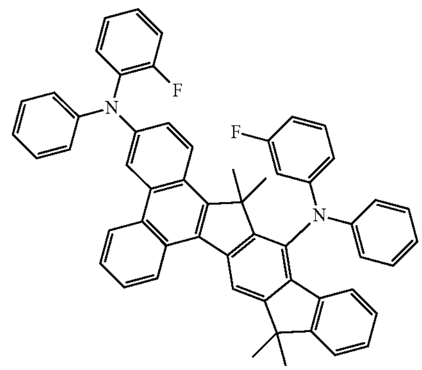
D2-146
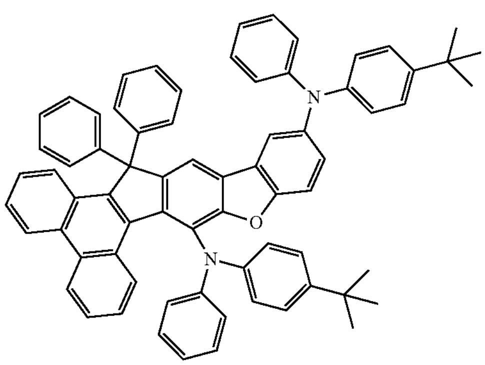
D2-147
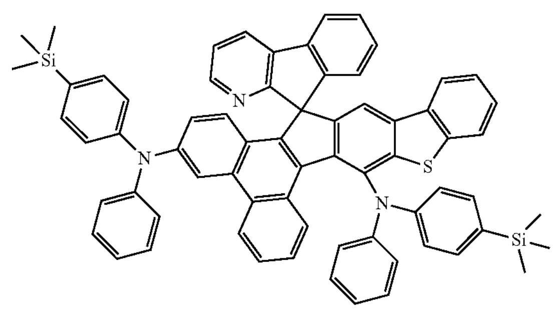
D2-148
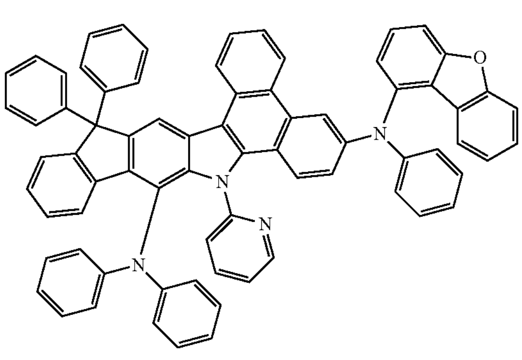
D2-149
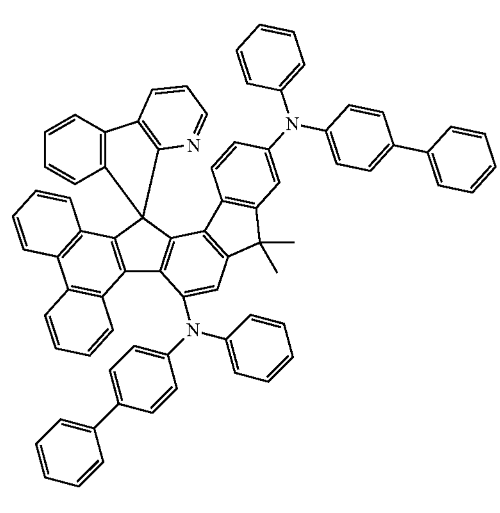

-continued
D2-150
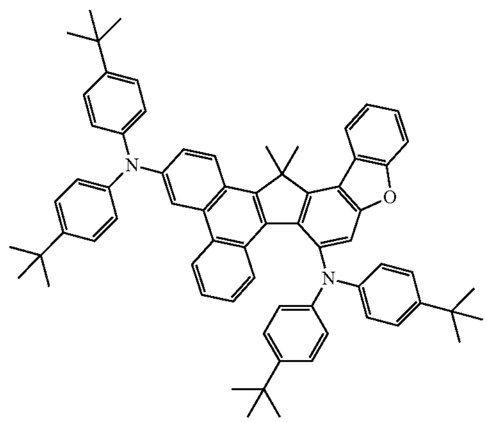
D2-151
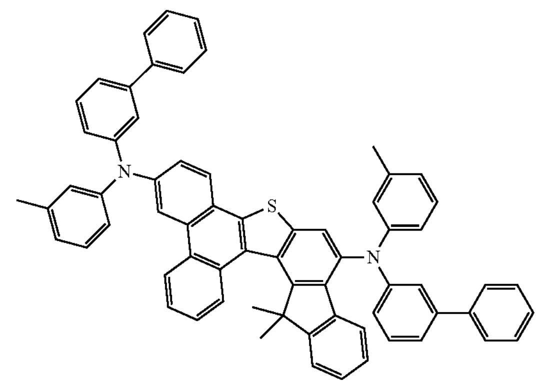
D2-152
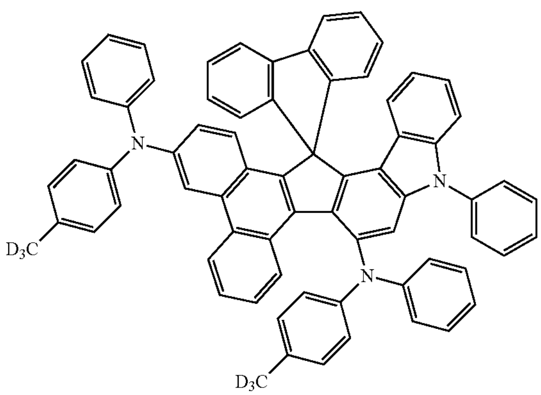
D2-153
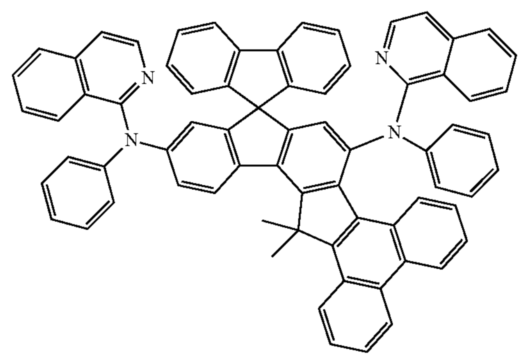
D2-154
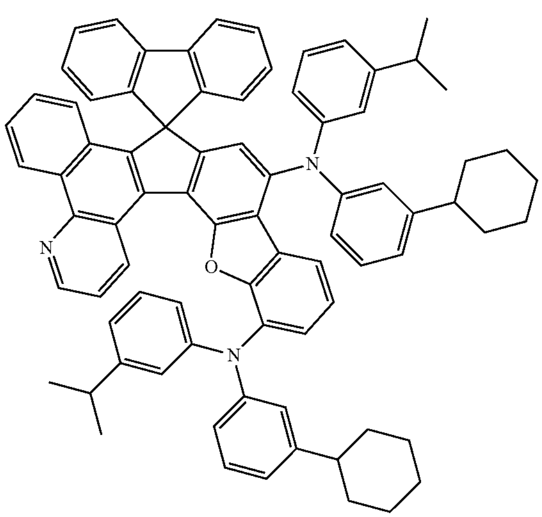

-continued
D2-155
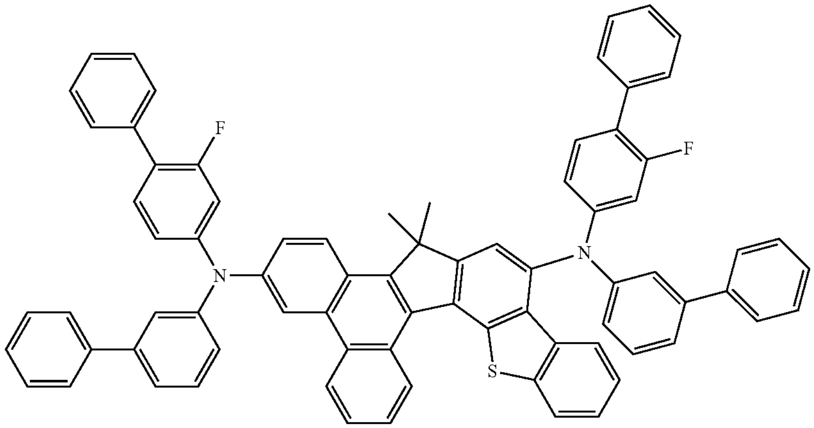
D2-156
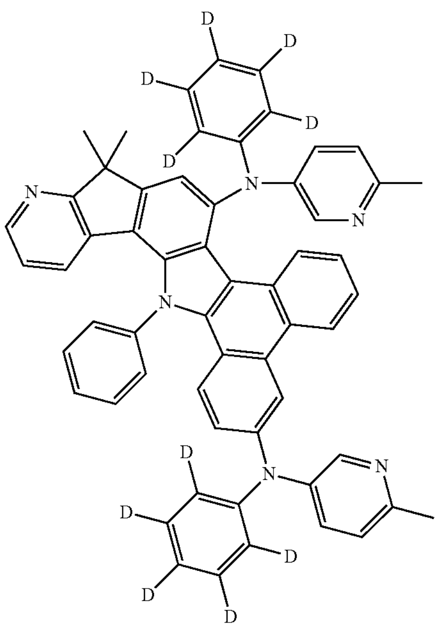
D2-157
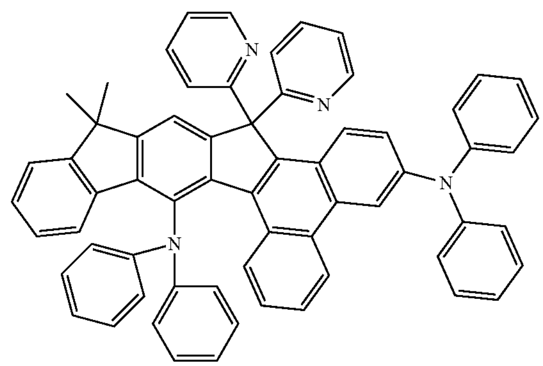
D2-158
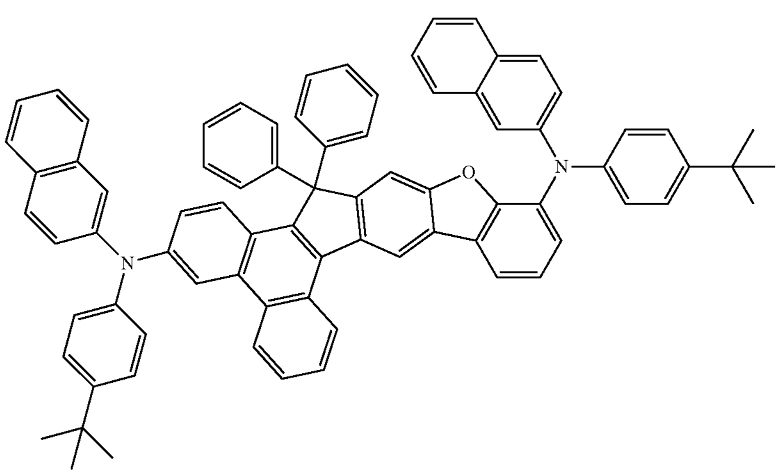

-continued
D2-159
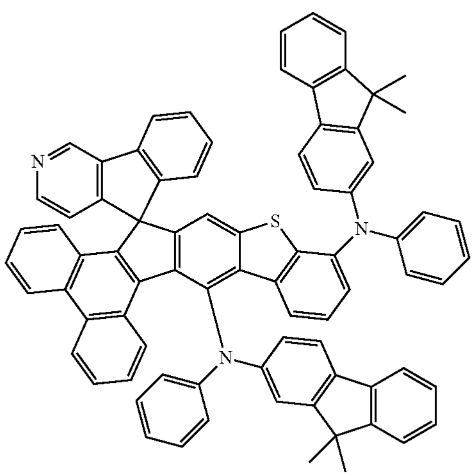
D2-160
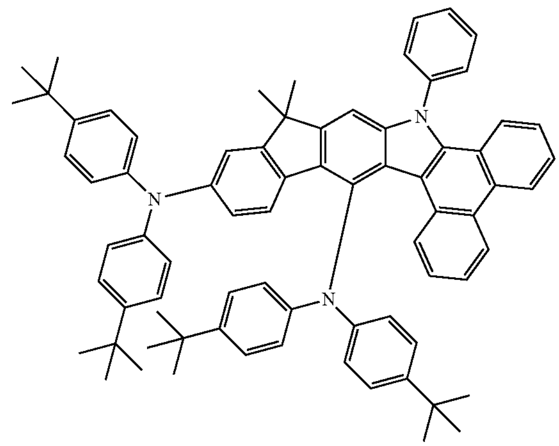
D2-161
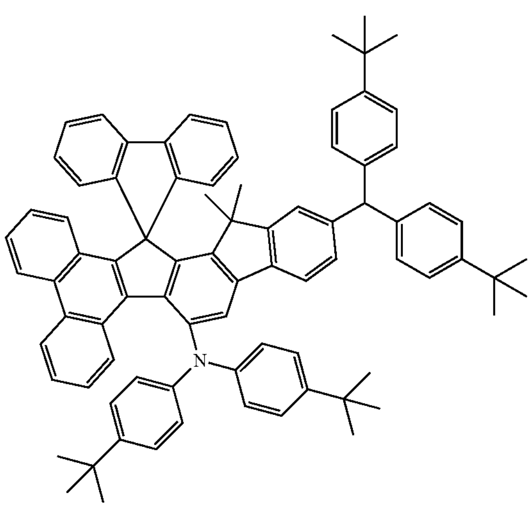
D2-162
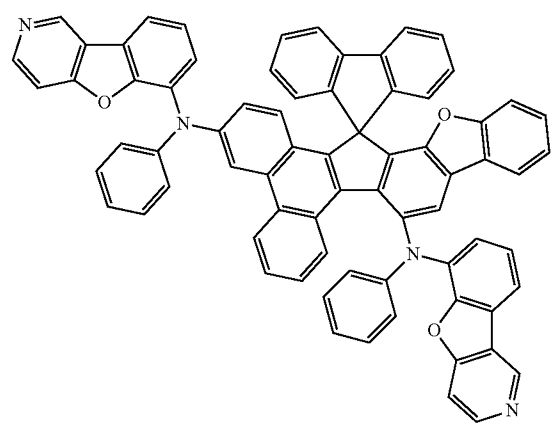
D2-163
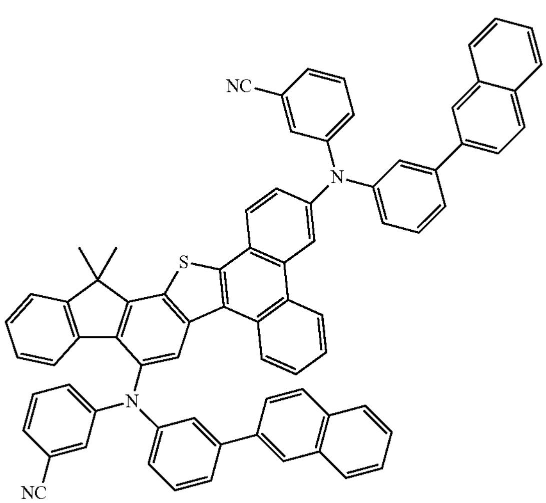
D2-164
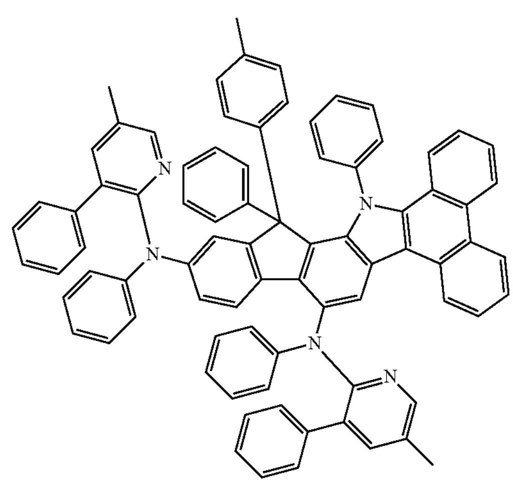

-continued
D2-165
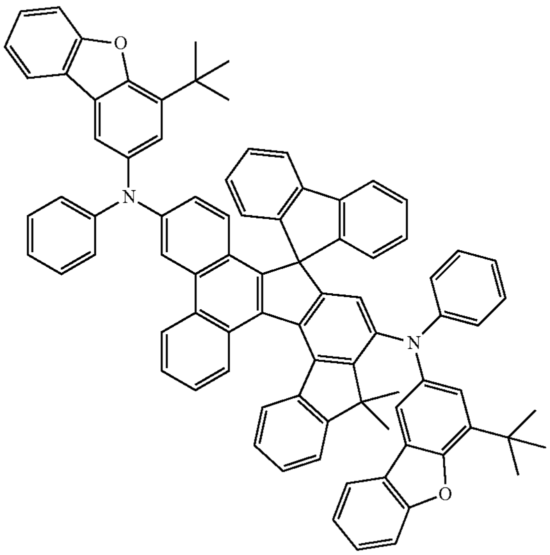
D2-166
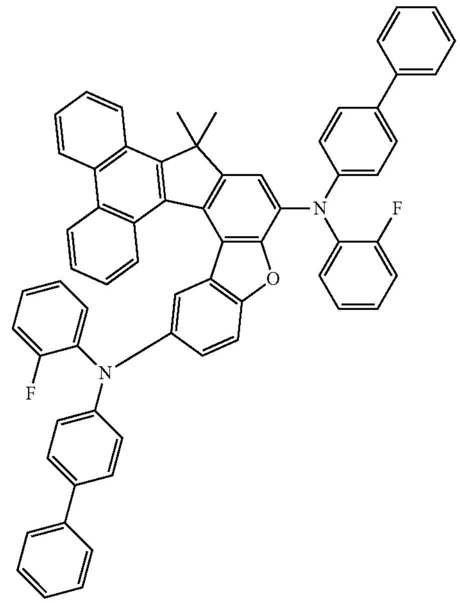
D2-167
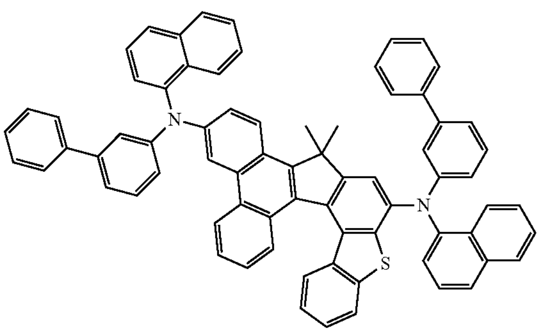
D2-168
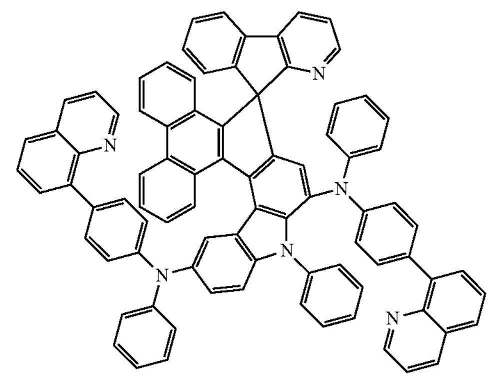
D2-169
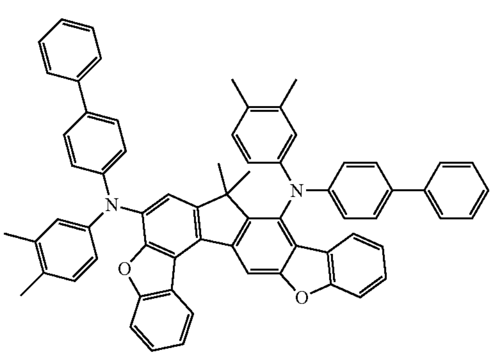
D2-170
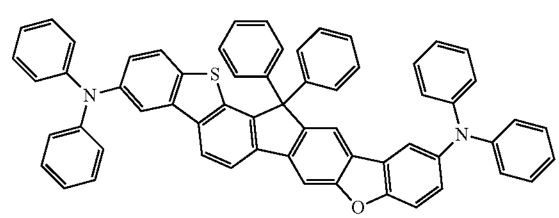

-continued
D2-171
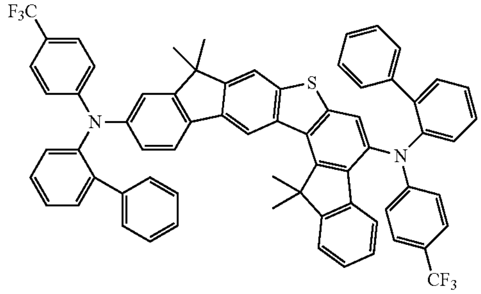
D2-172
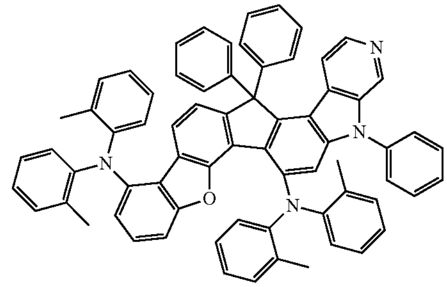
D2-173
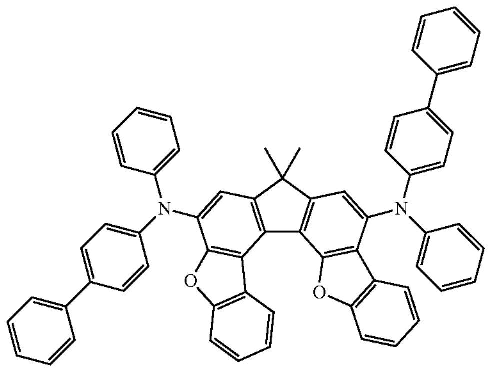
D2-174
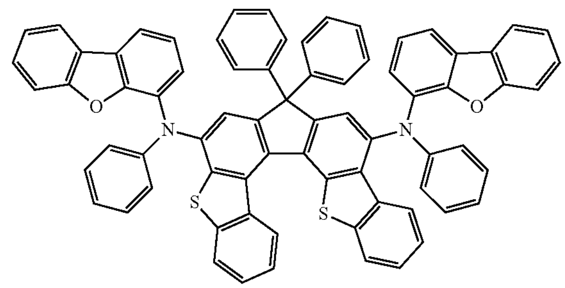
D2-175
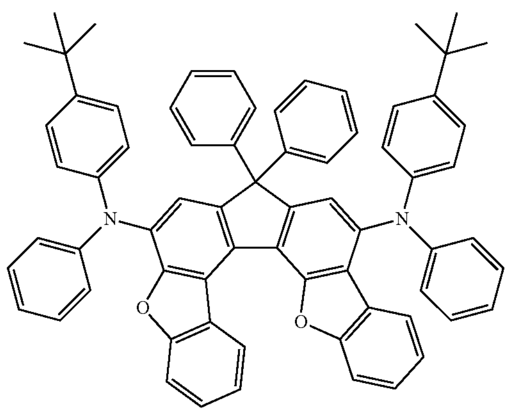
D2-176
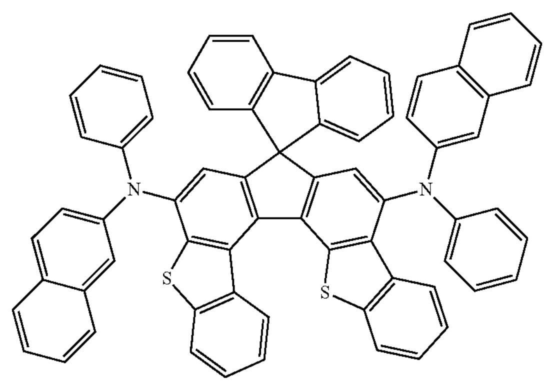
D2-177
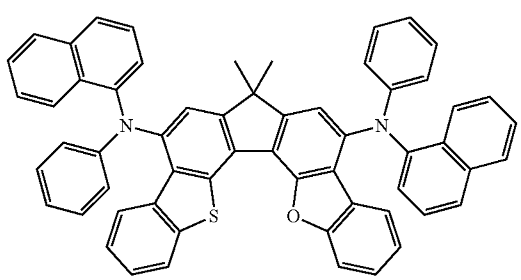
D2-178
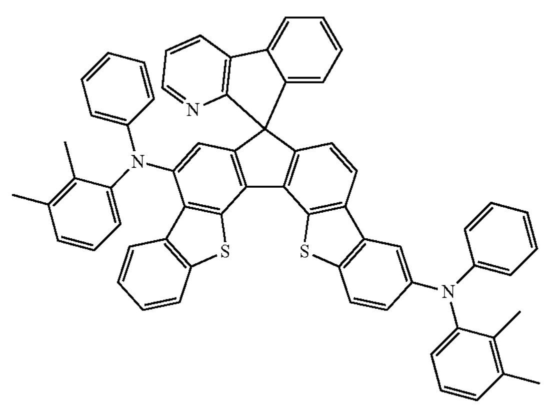

-continued
D2-179
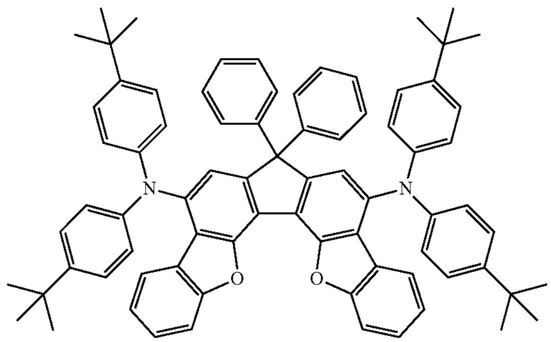
D2-180
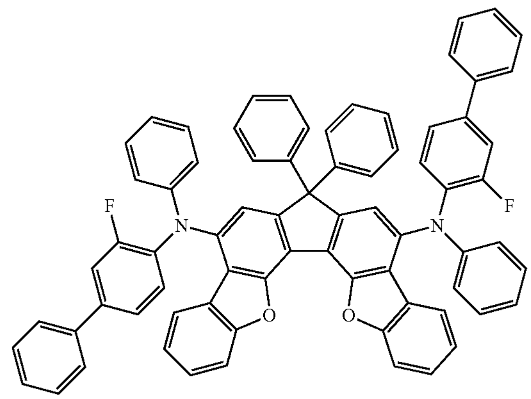
D2-181
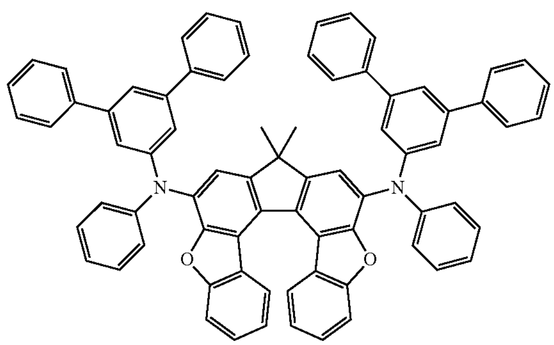
D2-182
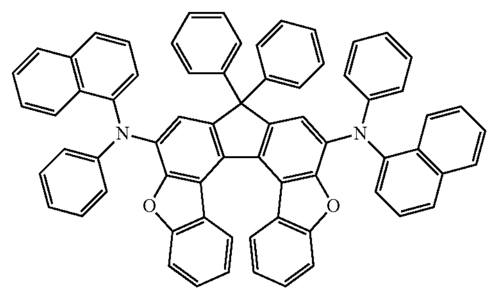
D2-183
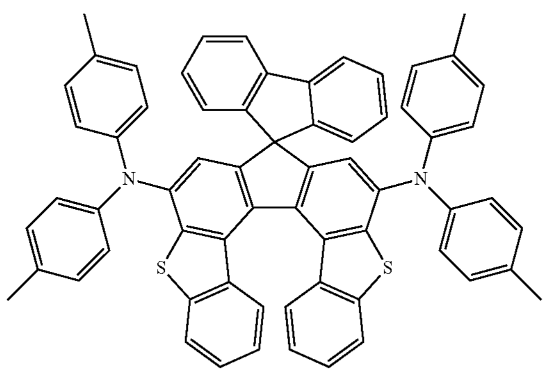
D2-184
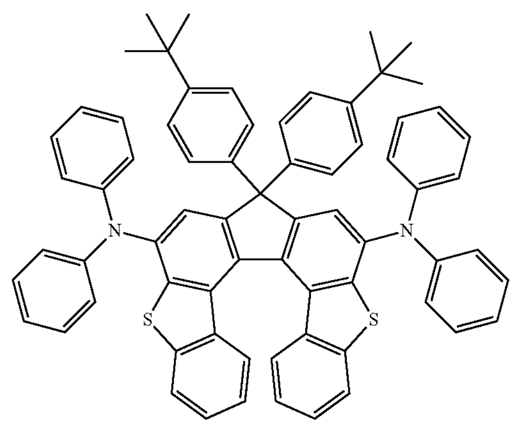
D2-185
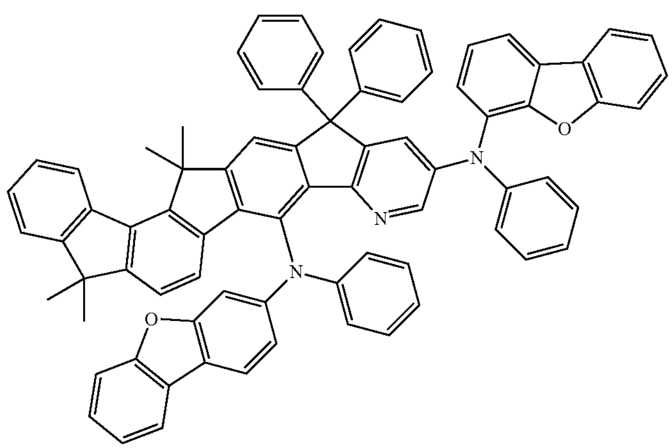

-continued
D2-186
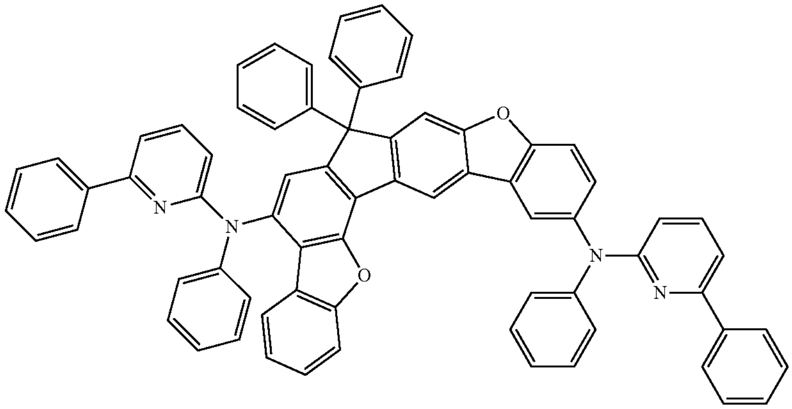
D2-187
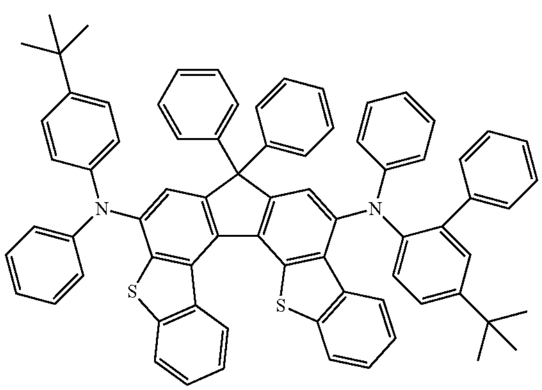
D2-188
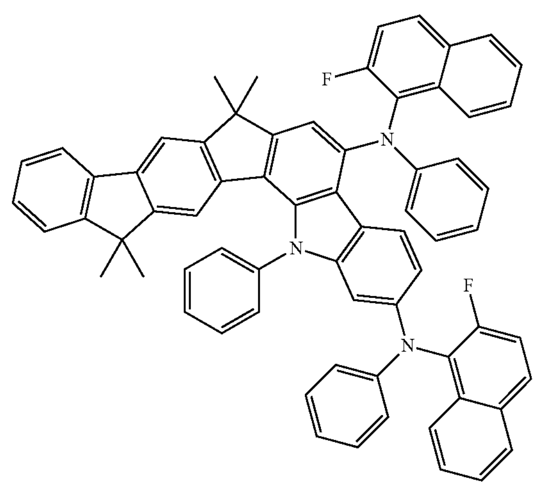
D2-189
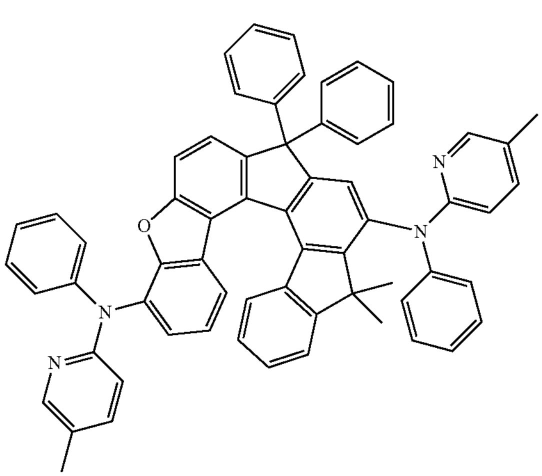
D2-190
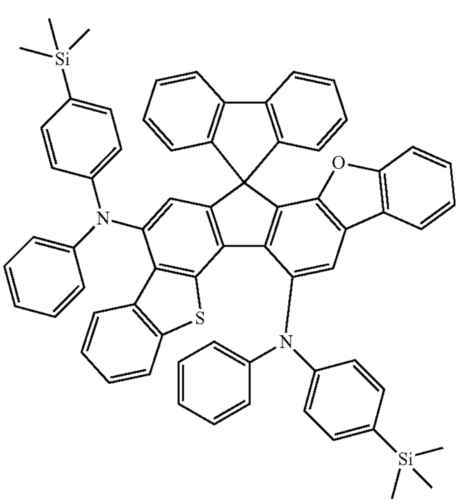

-continued
D2-191
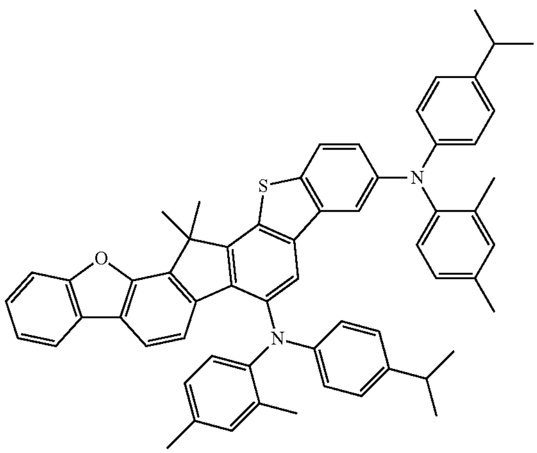
D2-192
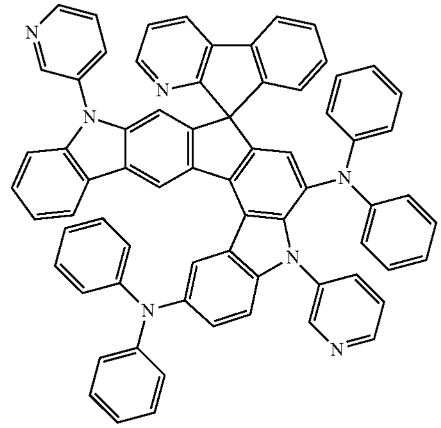
D2-193
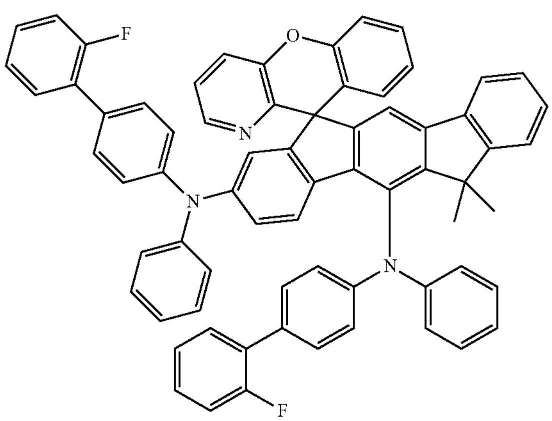
D2-194
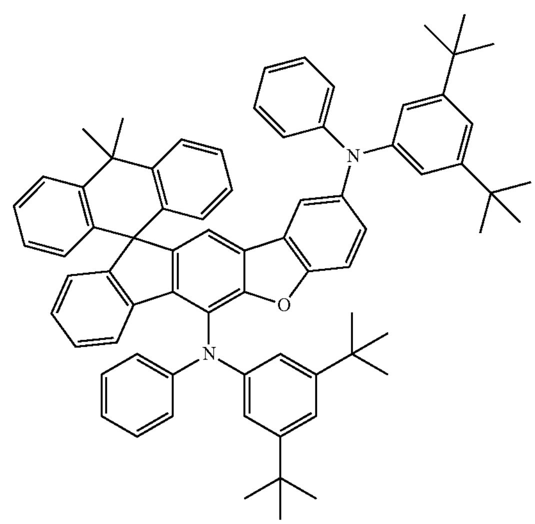
D2-195
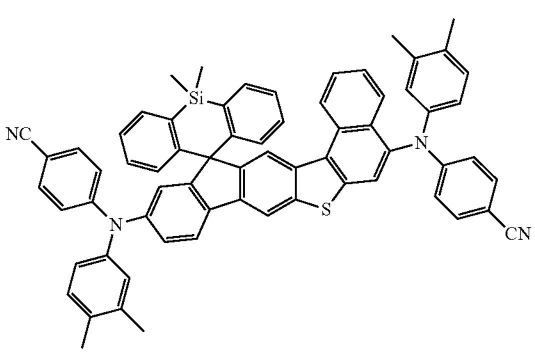
D2-196
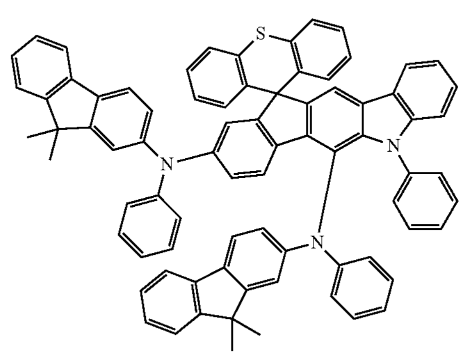

-continued
D2-197
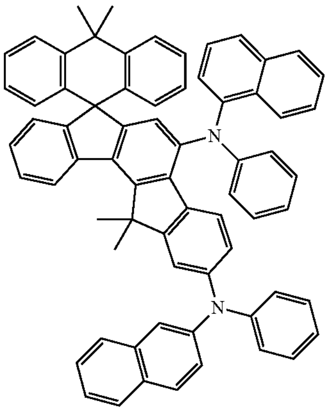
D2-198
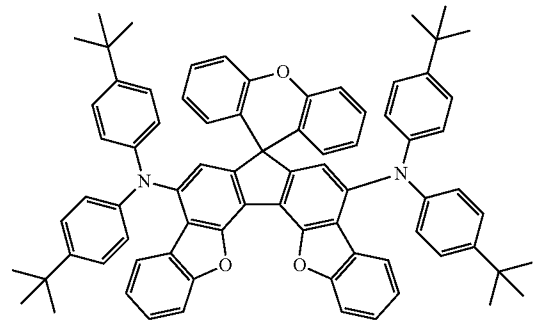
D2-199
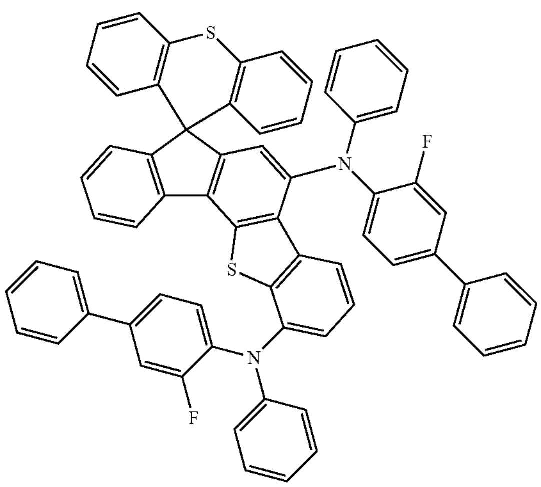
D2-200
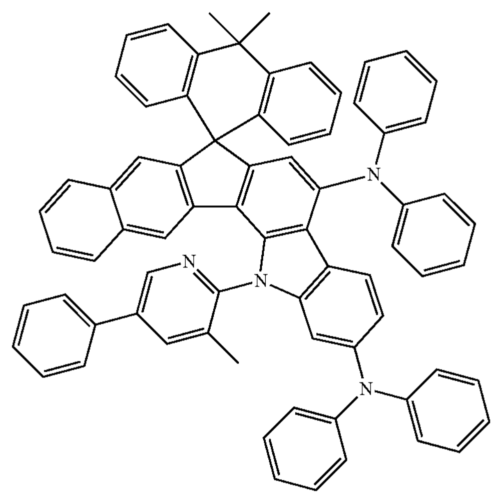
D2-201
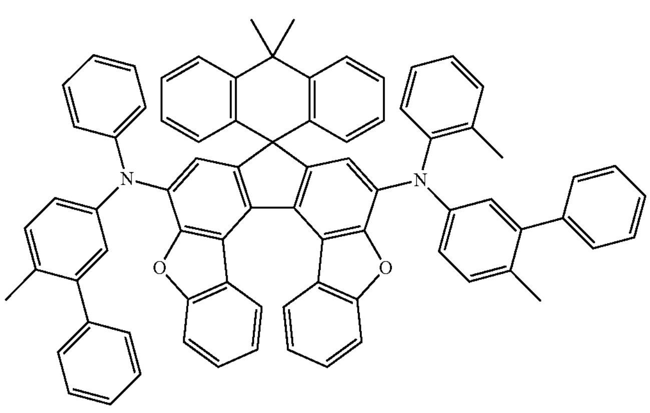

-continued
D2-202
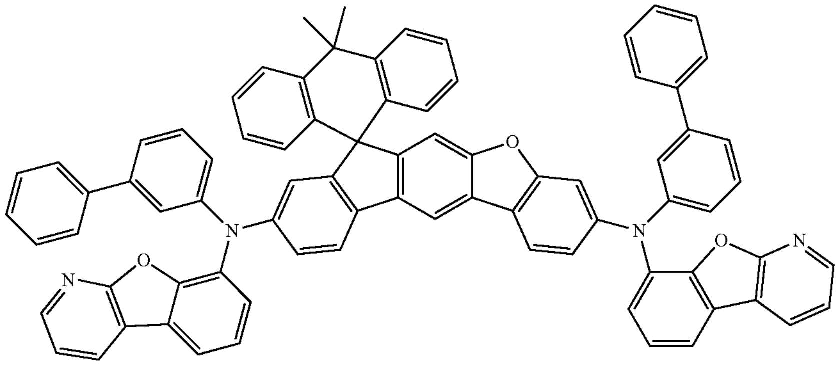
D2-203
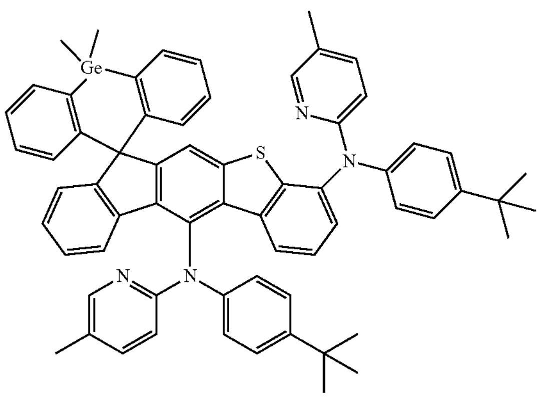
D2-204
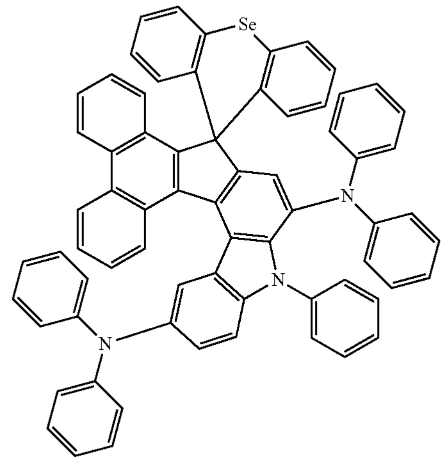
D2-205
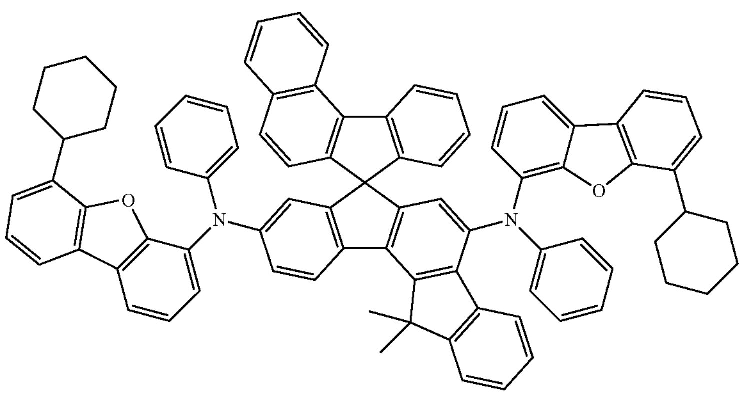
D2-206
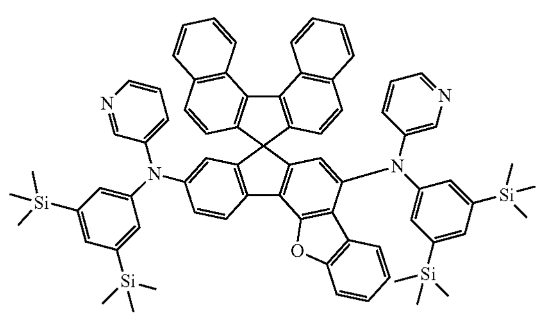
D2-207
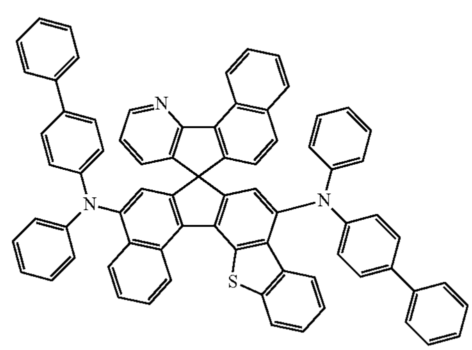

-continued
D2-208
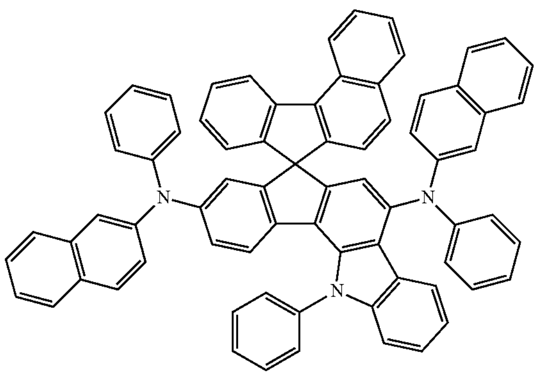
D2-209
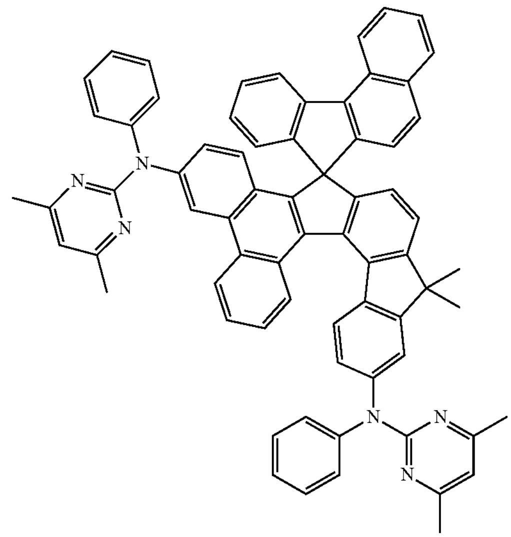
D2-210
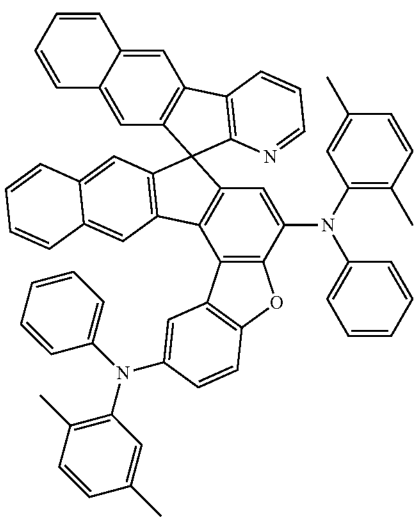
D2-211
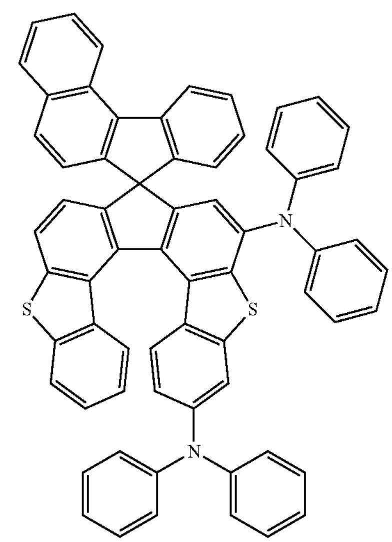
D2-212
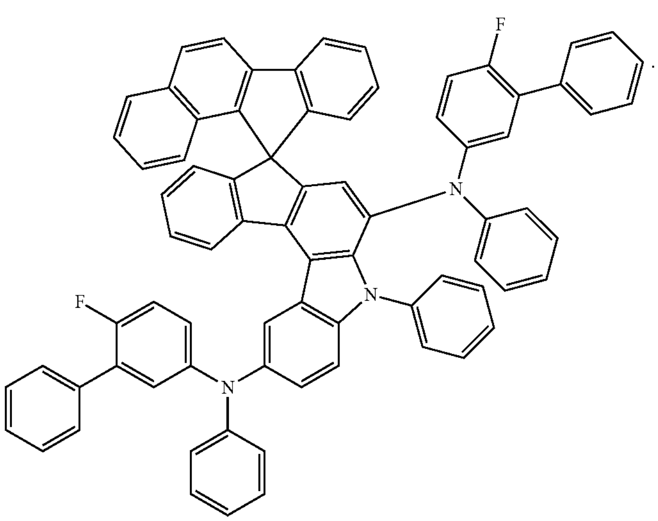

15. The organic light-emitting device of claim 1, wherein the emission layer comprises the first compound represented by Formula 1 and the second compound represented by Formula 2.

16. The organic light-emitting device of claim 1, wherein:

the organic layer further comprises an electron transport region between the emission layer and the second electrode, wherein the electron transport region comprises an alkali metal, an alkaline earth metal, a rare earth based metal, an alkali metal compound, an alkaline earth metal compound, a rare earth based metal compound, an alkali metal complex, an alkaline earth metal complex, a rare earth based metal complex, or a combination thereof.

17. The organic light-emitting device of claim 16, wherein:

the electron transport region comprises an electron transport layer and an electron injection layer; and at least one selected from the electron transport layer and the electron injection layer comprises an alkali metal, an alkaline earth metal, a rare earth based metal, an alkali metal compound, an alkaline earth metal compound, a rare earth based metal compound, an alkali metal complex, an alkaline earth metal complex, a rare earth based metal complex, or a combination thereof.

18. The organic light-emitting device of claim 1, wherein:

the organic layer further comprises a hole transport region between the emission layer and the first electrode, the hole transport region comprises a p-dopant, and the p-dopant has a lowest unoccupied molecular orbital (LUMO) energy level of −3.5 eV or less.

19. The organic light-emitting device of claim 18, wherein the p-dopant comprises a cyano group-containing compound.

20. The organic light-emitting device of claim 1, wherein:

the emission layer comprises a first-color-light emitting-emission layer;

the organic layer further comprises i) at least one second-color-light emitting-emission layer or ii) at least one second-color-light emitting-emission layer and at least one third-color-light emitting-emission layer;

the first-color-light and the second-color-light are identical to or different from each other; or the first-color-light, the second-color-light and the third-color-light are identical to or different from each other; and the first-color-light and the second-color-light are emitted in a mixed color-light; or the first-color-light, the second-color-light, and the third-color-light are emitted in a mixed color-light.

* * * * *